US012666867B2

(12) United States Patent
Ikeda et al.

(10) Patent No.: US 12,666,867 B2
(45) Date of Patent: Jun. 23, 2026

(54) COMPOSITION, POWDER, ORGANIC ELECTROLUMINESCENCE DEVICE, METHOD OF FABRICATING ORGANIC ELECTROLUMINESCENCE DEVICE, AND ELECTRONIC APPARATUS

(71) Applicant: IDEMITSU KOSAN CO., LTD., Tokyo (JP)

(72) Inventors: Takeshi Ikeda, Tokyo (JP); Yongguk Lee, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 1031 days.

(21) Appl. No.: 17/718,847

(22) Filed: Apr. 12, 2022

(65) Prior Publication Data

US 2022/0344594 A1 Oct. 27, 2022

(30) Foreign Application Priority Data

Apr. 13, 2021 (JP) ................................ 2021-067959

(51) Int. Cl.
*H01L 51/50* (2006.01)
*H10K 85/60* (2023.01)
*H10K 50/16* (2023.01)

(52) U.S. Cl.
CPC ....... *H10K 85/654* (2023.02); *H10K 85/6572* (2023.02); *H10K 50/166* (2023.02)

(58) Field of Classification Search
None
See application file for complete search history.

(56) References Cited

U.S. PATENT DOCUMENTS

2015/0102301 A1 4/2015 Cho et al.
2015/0200373 A1 7/2015 Cho et al.
(Continued)

FOREIGN PATENT DOCUMENTS

JP 2016-535942 A 11/2016

*Primary Examiner* — Gregory D Clark
(74) *Attorney, Agent, or Firm* — Foley & Lardner LLP

(57) ABSTRACT

A composition comprising a compound represented by the following formula (1) and a compound represented by the following formula (2), provided that the compound represented by the formula (1) and the compound represented by the formula (2) are different compounds:

(1)

(Continued)

-continued (2)

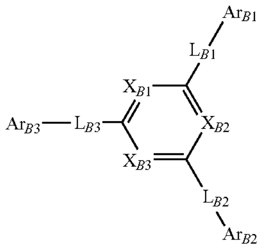

57 Claims, 1 Drawing Sheet

(56) References Cited

U.S. PATENT DOCUMENTS

2015/0318486 A1* 11/2015 Kim .................. H10K 85/6574 257/40
2016/0141505 A1 5/2016 Park et al.
2021/0175428 A1 6/2021 Park et al.

* cited by examiner

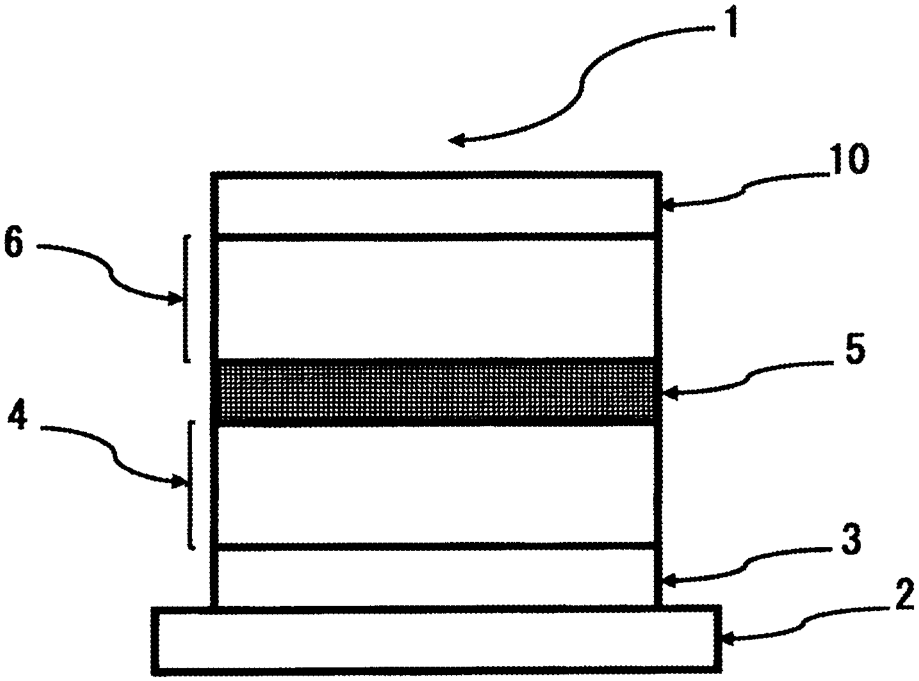
1
10
6
5
4
3
2

COMPOSITION, POWDER, ORGANIC ELECTROLUMINESCENCE DEVICE, METHOD OF FABRICATING ORGANIC ELECTROLUMINESCENCE DEVICE, AND ELECTRONIC APPARATUS

TECHNICAL FIELD

Embodiments described herein generally relate to a composition, a powder, an organic electroluminescence device, a method of fabricating an organic electroluminescence device, and an electronic apparatus.

BACKGROUND ART

When voltage is applied to an organic electroluminescence device (hereinafter, referred to as an organic EL device), holes and electrons are injected into an emitting layer from an anode and a cathode, respectively. Then, thus injected holes and electrons are recombined in the emitting layer, and excitons are formed therein.

Although the improvement of a material used for an organic EL device is progressing gradually in order to raise the device performance, further performance enhancement is required. In addition, an attempt has been made to improve device performance by using two or more materials in a single organic layer in combination. For example, Patent Documents 1 to 3 disclose a technique in which two kinds of materials are used in combination for any of layers in an organic EL device.

RELATED ART DOCUMENTS

Patent Documents

[Patent Document 1] US 2015/0102301 A1

[Patent Document 2] JP 2016-535942A

[Patent Document 3] US 2015/0200373 A1

SUMMARY OF THE INVENTION

However, even when a plurality of materials are used in combination, the advantages of respective materials are not necessarily maintained, and there are cases where the improvement as expected is not observed or the performance is deteriorated on the contrary, and there is still room for improvement in the technique for increasing the performance of an organic EL device by this method.

It is an object of the invention to provide a composition and a powder capable of realizing an organic EL device having a low driving voltage and high efficiency, and to provide an organic EL device having such performance.

According to the invention, the following composition and the like are provided.

A composition comprising a compound represented by the following formula (1) and a compound represented by the following formula (2), provided that the compound represented by the formula (1) and the compound represented by the formula (2) are different compounds:

(1)

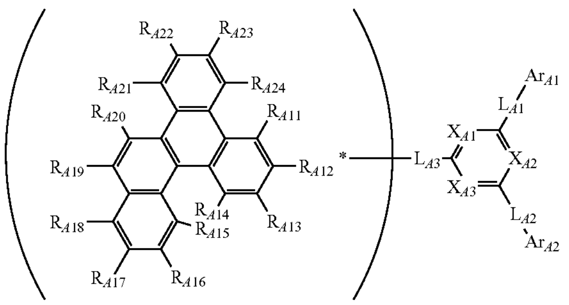

wherein in the formula (1), $X_{A1}$ to $X_{A3}$ are independently N or $CR_{A1}$, provided that at least two of $X_{A1}$ to $X_{A3}$ are N's;

$R_{A1}$ is a hydrogen atom or a substituent R;

$Ar_{A1}$ and $Ar_{A2}$ are independently a substituted or unsubstituted aryl group including 6 to 50 ring carbon atoms, or a substituted or unsubstituted monovalent heterocyclic group including 5 to 50 ring atoms;

$L_{A1}$, $L_{A2}$, and $L_{A3}$ are independently a single bond, a substituted or unsubstituted arylene group including 6 to 50 ring carbon atoms, or a substituted or unsubstituted divalent heterocyclic group including 5 to 50 ring atoms;

one of $R_{A11}$ to $R_{A24}$ is a single bond bonded with $L_{A3}$;

$R_{A11}$ to $R_{A24}$ which are not the single bond bonded with $L_{A3}$ are independently a hydrogen atom or a substituent R;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$ (where $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other), a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more of the substituent R's are present, the two or more of the substituent R's may be the same as or different from each other, and

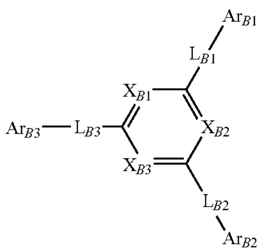
(2)

wherein in the formula (2), $X_{B1}$ to $X_{B3}$ are independently N or $CR_{B1}$; provided that at least one of $X_{B1}$ to $X_{B3}$ is N;

$R_{B1}$ is a hydrogen atom or a substituent R;

$Ar_{B1}$, $Ar_{B2}$, and $Ar_{B3}$ are independently a substituted or unsubstituted aryl group including 6 to 50 ring carbon atoms, or a substituted or unsubstituted monovalent heterocyclic group including 5 to 50 ring atoms;

$L_{B1}$, $L_{B2}$, and $L_{B3}$ are independently a single bond, a substituted or unsubstituted arylene group including 6 to 50 ring carbon atoms, or a substituted or unsubstituted divalent heterocyclic group including 5 to 50 ring atoms;

the substituent R is as defined in the formula (1); and when two or more $R_{B1}$'s are present, the two or more $R_{B1}$'s may be the same as or different from each other.

According to the invention, it is possible to provide a composition and a powder capable of realizing an organic EL device having a low driving voltage and high efficiency, and an organic EL device having such performance.

BRIEF DESCRIPTION OF THE DRAWINGS

The FIGURE is a diagram showing a schematic configuration of an aspect of an organic EL device according to an aspect of the invention.

DEFINITION

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a "ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group" is an "aryl group substituted by a substituent"). In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1A):

- a phenyl group,
- a p-biphenyl group,
- a m-biphenyl group,
- an o-biphenyl group,
- a p-terphenyl-4-yl group,
- a p-terphenyl-3-yl group,
- a p-terphenyl-2-yl group,
- a m-terphenyl-4-yl group,
- a m-terphenyl-3-yl group,
- a m-terphenyl-2-yl group,
- an o-terphenyl-4-yl group,
- an o-terphenyl-3-yl group,
- an o-terphenyl-2-yl group,
- a 1-naphthyl group,
- a 2-naphthyl group,
- an anthryl group,
- a benzanthryl group,
- a phenanthryl group,
- a benzophenanthryl group,
- a phenalenyl group,
- a pyrenyl group,
- a chrysenyl group,
- a benzochrysenyl group,
- a triphenylenyl group,
- a benzotriphenylenyl group,
- a tetracenyl group,
- a pentacenyl group,
- a fluorenyl group,
- a 9,9'-spirobifluorenyl group,
- a benzofluorenyl group,
- a dibenzofluorenyl group,
- a fluoranthenyl group,
- a benzofluoranthenyl group,
- a perylenyl group, and
- a monovalent aryl group derived by removing one hydrogen atom from the ring structures represented by any of the following general formulas (TEMP-1) to (TEMP-15).

(TEMP-1)

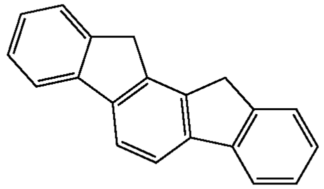

-continued
(TEMP-2)
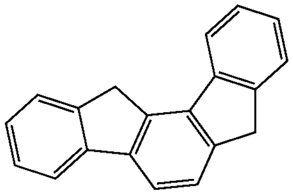
(TEMP-3)
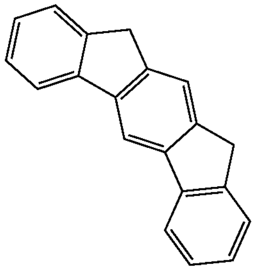
(TEMP-4)
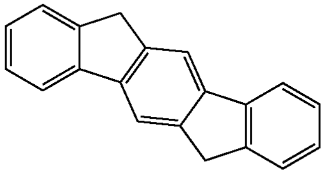
(TEMP-5)
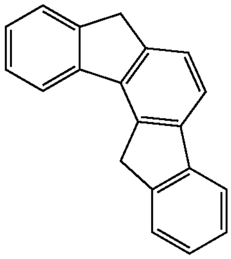
(TEMP-6)
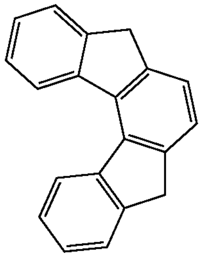
(TEMP-7)
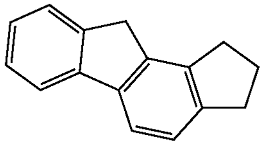
(TEMP-8)
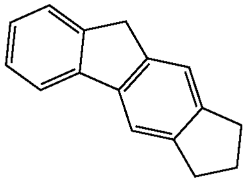
-continued
(TEMP-9)
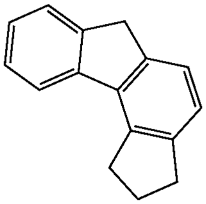
(TEMP-10)
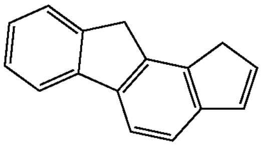
(TEMP-11)
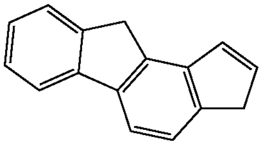
(TEMP-12)
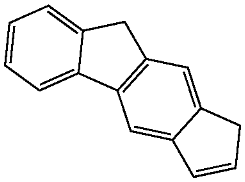
(TEMP-13)
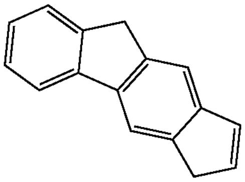
(TEMP-14)
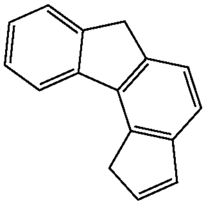
(TEMP-15)
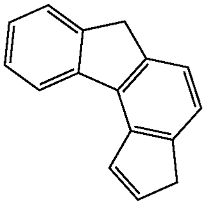
Substituted Aryl Group (Specific Example Group G1B):
- an o-tolyl group,
- a m-tolyl group,
- a p-tolyl group,
- a p-xylyl group,
- a m-xylyl group,
- an o-xylyl group,
- a p-isopropylphenyl group,
- a m-isopropylphenyl group,
- an o-isopropylphenyl group,
- a p-t-butylphenyl group,
- a m-t-butylphenyl group, an o-t-butylphenyl group,
a 3,4,5-trimethylphenyl group,
a 9,9-dimethylfluorenyl group,
a 9,9-diphenylfluorenyl group,
a 9,9-bis(4-methylphenyl)fluorenyl group,
a 9,9-bis(4-isopropylphenyl)fluorenyl group,
a 9,9-bis(4-t-butylphenyl)fluorenyl group,
a cyanophenyl group,
a triphenylsilylphenyl group,
a trimethylsilylphenyl group,
a phenylnaphthyl group,
a naphthylphenyl group, and
a group in which one or more hydrogen atoms of a monovalent group derived from the ring structures represented by any of the general formulas (TEMP-1) to (TEMP-15) are substituted by a substituent.

"Substituted or Unsubstituted Heterocyclic Group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group" is a "heterocyclic group unsubstituted by a substituent", and the substituted heterocyclic group refers to the case where the "substituted or unsubstituted heterocyclic group" is a "heterocyclic group substituted by a substituent"). In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):

a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indoyl group,
an isoindoyl group,
an isodolizinyl group,
a quinolizynyl group,
a quinolyl group,
an isoquinolyl group,
a cinnolyl group,
a phthalazinyl group,
a quinazolinyl group,
a quinoxalinyl group,
a benzinidazolyl group,
an indazolyl group,
a phenanthrolinyl group,
a phenanthridinyl group,
an acridinyl group,
a phenazinyl group,
a carbazolyl group,
a benzocarbazolyl group,
a morpholino group,
a phenoxazinyl group,
a phenothiazinyl group,
a azacarbazolyl group, and
a diazacarbazolyl group.

Unsubstituted Heterocyclic Group Containing an Oxygen Atom (Specific Example Group G2A2):

a furyl group,
an oxazolyl group,
an isoxazolyl group,
an oxadiazolyl group,
a xanthenyl group,
a benzofuranyl group, an isobenzofuranyl group,
a dibenzofuranyl group,
a naphthobenzofurynal group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

Unsubstituted Heterocyclic Group Containing a Sulfur Atom (Specific Example Group G2A3):

a thienyl group,
a thiazolyl group,
an isothiazolyl group,
a thiadiazolyl group,
a benzothiophenyl group (benzothienyl group),
an isobenzothiophenyl group (isobenzothienyl group),
a dibenzothiophenyl group (dibenzothienyl group),
a naphthobenzothiophenyl group (naphthobenzothienyl group),
a benzothiazolyl group,
a benzisothiazolyl group,
a phenothiazinyl group,
a dinaphthothiophenyl group (dinaphthothienyl group),
an azadibenzothiophenyl group (azadibenzothienyl group),
a diazadibenzothiophenyl group (diazadibenzothienyl group),
an azanaphthobenzothiophenyl group (azanaphthobenzothienyl group), and
a diazanaphthobenzothiophenyl group (diazanaphthobenzothienyl group).

Monovalent Heterocyclic Group Derived by Removing One Hydrogen Atom from the Ring Structures Represented by Any of the Following General Formulas (TEMP-16) to (TEMP-33) (Specific Example Group G2A4):

(TEMP-16)

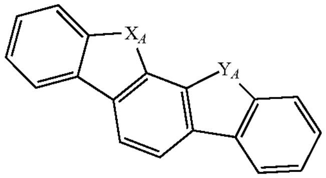

(TEMP-17)

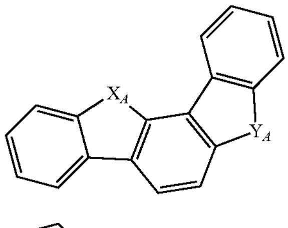

(TEMP-18)

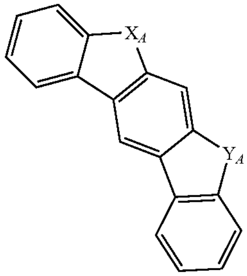

-continued (TEMP-19)

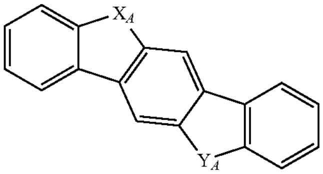

(TEMP-20)

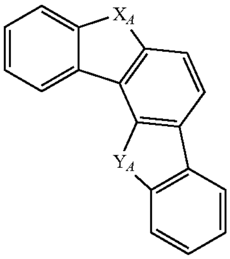

(TEMP-21)

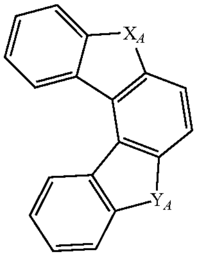

(TEMP-22)

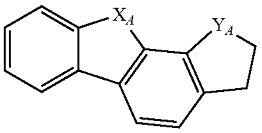

(TEMP-23)

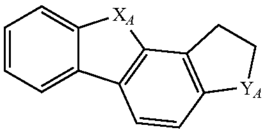

(TEMP-24)

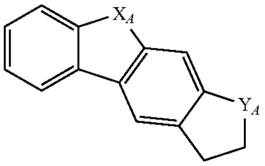

(TEMP-25)

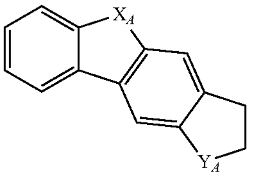

(TEMP-26)

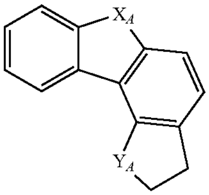

-continued (TEMP-27)

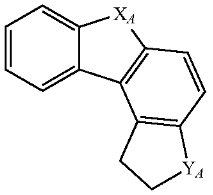

(TEMP-28)

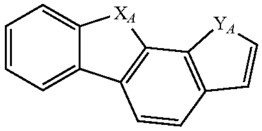

(TEMP-29)

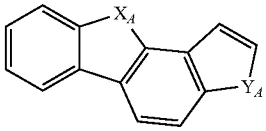

(TEMP-30)

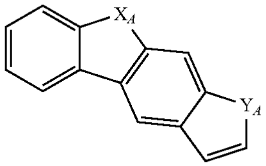

(TEMP-31)

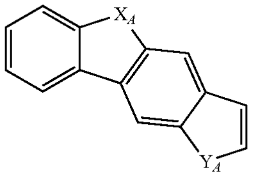

(TEMP-32)

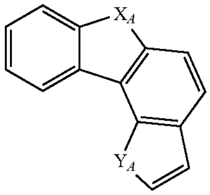

(TEMP-33)

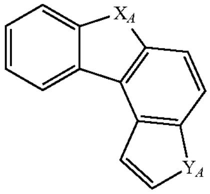

In the general formulas (TEMP-16) to (TEMP-33), $X_A$ and $Y_A$ are independently an oxygen atom, a sulfur atom, NH, or $CH_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or $CH_2$, the monovalent heterocyclic group derived from the ring structures represented by any of the general formulas (TEMP-16) to (TEMP-33) includes a monovalent group derived by removing one hydrogen atom from these NH or $CH_2$.

Substituted Heterocyclic Group Containing a Nitrogen Atom (Specific Example Group G2B1):

a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

Substituted Heterocyclic Group Containing an Oxygen Atom (Specific Example Group G2B2):

a phenyldibenzofuranyl group,
a methyldibenzofuranyl group,
a t-butyldibenzofuranyl group, and
a monovalent residue of spiro[9H-xanthene-9,9'-[9H]fluorene].

Substituted Heterocyclic Group Containing a Sulfur Atom (Specific Example Group G2B3):

a phenyldibenzothiophenyl group,
a methyldibenzothiophenyl group,
a t-butyldibenzothiophenyl group, and
a monovalent residue of spiro[9H-thioxanthene-9,9'-[9H]fluorene].

Group in which One or More Hydrogen Atoms of the Monovalent Heterocyclic Group Derived from the Ring Structures Represented by any of the Following General Formulas (TEMP-16) to (TEMP-33) are Substituted by a Substituent (Specific Example Group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the "substituted or unsubstituted alkyl group" is an "alkyl group unsubstituted by a substituent", and the substituted alkyl group refers to the case where the "substituted or unsubstituted alkyl group" is an "alkyl group substituted by a substituent"). In this specification, in the case where simply referred as an "alkyl group" includes both the "unsubstituted alkyl group" and the "substituted alkyl group."

The "substituted alkyl group" means a group in which one or more hydrogen atoms in the "unsubstituted alkyl group" are substituted by a substituent. Specific examples of the "substituted alkyl group" include groups in which one or more hydrogen atoms in the following "unsubstituted alkyl group" (specific example group G3A) are substituted by a substituent, the following substituted alkyl group (specific example group G3B), and the like. In this specification, the alkyl group in the "unsubstituted alkyl group" means a linear alkyl group. Thus, the "unsubstituted alkyl group" includes a straight-chain "unsubstituted alkyl group" and a branched-chain "unsubstituted alkyl group". It should be noted that the examples of the "unsubstituted alkyl group" and the examples of the "substituted alkyl group" enumerated in this specification are mere examples, and the "substituted alkyl group" described in this specification includes a group in which hydrogen atom of the alkyl group itself in the "substituted alkyl group" of the specific example group G3B is further substituted by a substituent, and a group in which hydrogen atom of a substituent in the "substituted alkyl group" of the specific example group G3B is further substituted by a substituent.

Unsubstituted Alkyl Group (Specific Example Group G3A):
- a methyl group,
- an ethyl group,
- a n-propyl group,
- an isopropyl group,
- a n-butyl group,
- an isobutyl group,
- a s-butyl group, and
- a t-butyl group.

Substituted Alkyl Group (Specific Example Group G3B):
- a heptafluoropropyl group (including isomers),
- a pentafluoroethyl group,
- a 2,2,2-trifluoroethyl group, and
- a trifluoromethyl group.

"Substituted or Unsubstituted Alkenyl Group"

Specific examples of the "substituted or unsubstituted alkenyl group" described in this specification (specific example group G4) include the following unsubstituted alkenyl group (specific example group G4A), the following substituted alkenyl group (specific example group G4B), and the like. (Here, the unsubstituted alkenyl group refers to the case where the "substituted or unsubstituted alkenyl group" is a "alkenyl group unsubstituted by a substituent", and the "substituted alkenyl group" refers to the case where the "substituted or unsubstituted alkenyl group" is a "alkenyl group substituted by a substituent"). In this specification, in the case where simply referred as an "alkenyl group" includes both the "unsubstituted alkenyl group" and the "substituted alkenyl group."

The "substituted alkenyl group" means a group in which one or more hydrogen atoms in the "unsubstituted alkenyl group" are substituted by a substituent. Specific examples of the "substituted alkenyl group" include a group in which the following "unsubstituted alkenyl group" (specific example group G4A) has a substituent, the following substituted alkenyl group (specific example group G4B), and the like. It should be noted that the examples of the "unsubstituted alkenyl group" and the examples of the "substituted alkenyl group" enumerated in this specification are mere examples, and the "substituted alkenyl group" described in this specification includes a group in which a hydrogen atom of the alkenyl group itself in the "substituted alkenyl group" of the specific example group G4B is further substituted by a substituent, and a group in which a hydrogen atom of a substituent in the "substituted alkenyl group" of the specific example group G4B is further substituted by a substituent.

Unsubstituted Alkenyl Group (Specific Example Group G4A):
- a vinyl group,
- an allyl group,
- a 1-butenyl group,
- a 2-butenyl group, and
- a 3-butenyl group.

Substituted Alkenyl Group (Specific Example Group G4B):
- a 1,3-butanedienyl group,
- a 1-methylvinyl group,
- a 1-methylallyl group,
- a 1,1-dimethylallyl group,
- a 2-methylally group, and
- a 1,2-dimethylallyl group.

"Substituted or Unsubstituted Alkynyl Group"

Specific examples of the "substituted or unsubstituted alkynyl group" described in this specification (specific example group G5) include the following unsubstituted alkynyl group (specific example group G5A) and the like. (Here, the unsubstituted alkynyl group refers to the case where the "substituted or unsubstituted alkynyl group" is an "alkynyl group unsubstituted by a substituent"). In this specification, in the case where simply referred as an "alkynyl group" includes both the "unsubstituted alkynyl group" and the "substituted alkynyl group."

The "substituted alkynyl group" means a group in which one or more hydrogen atoms in the "unsubstituted alkynyl group" are substituted by a substituent. Specific examples of the "substituted alkynyl group" include a group in which one or more hydrogen atoms in the following "unsubstituted alkynyl group" (specific example group G5A) are substituted by a substituent, and the like.

Unsubstituted Alkynyl Group (Specific Example Group G5A):
- an ethynyl group.

"Substituted or Unsubstituted Cycloalkyl Group"

Specific examples of the "substituted or unsubstituted cycloalkyl group" described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the "substituted or unsubstituted cycloalkyl group" is a "cycloalkyl group unsubstituted by a substituent", and the substituted cycloalkyl group refers to the case where the "substituted or unsubstituted cycloalkyl group" is a "cycloalkyl group substituted by a substituent"). In this specification, in the case where simply referred as a "cycloalkyl group" includes both the "unsubstituted cycloalkyl group" and the "substituted cycloalkyl group."

The "substituted cycloalkyl group" means a group in which one or more hydrogen atoms in the "unsubstituted cycloalkyl group" are substituted by a substituent. Specific examples of the "substituted cycloalkyl group" include a group in which one or more hydrogen atoms in the following "unsubstituted cycloalkyl group" (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6A):
- a cyclopropyl group,
- a cyclobutyl group,
- a cyclopentyl group,
- a cyclohexyl group,
- a 1-adamantyl group,
- a 2-adamantyl group,
- a 1-norbornyl group, and
- a 2-norbornyl group.

Substituted Cycloalkyl Group (Specific Example Group G6B):

a 4-methylcyclohexyl group.

"Group represented by —Si ($R_{901}$)($R_{902}$)($R_{903}$)"

Specific examples of the group represented by —Si($R_{901}$)($R_{902}$)($R_{903}$) described in this specification (specific example group G7) include:

—Si(G1)(G1)(G1),
—Si(G1)(G2)(G2),
—Si(G1)(G1)(G2),
—Si(G2)(G2)(G2),
—Si(G3)(G3)(G3), and
—Si(G6)(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —Si(G1)(G1)(G1) are the same or different.

Plural G2's in —Si(G1)(G2)(G2) are the same or different.

Plural G1's in —Si(G1)(G1)(G2) are the same or different.

Plural G2's in —Si(G2)(G2)(G2) are be the same or different.

Plural G3's in —Si(G3)(G3)(G3) are the same or different.

Plural G6's in —Si(G6)(G6)(G6) are be the same or different.

"Group Represented by —O—($R_{904}$)"

Specific examples of the group represented by —O—($R_{904}$) in this specification (specific example group G8) include:

—O(G1),
—O(G2),
—O(G3), and
—O(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —S—($R_{905}$)"

Specific examples of the group represented by —S—($R_{905}$) in this specification (specific example group G9) include:

—S(G1),
—S(G2),
—S(G3), and
—S(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —N($R_{906}$)($R_{907}$)"

Specific examples of the group represented by —N($R_{906}$)($R_{907}$) in this specification (specific example group G10) include:

—N(G1)(G1),
—N(G2)(G2),
—N(G1)(G2),
—N(G3)(G3), and
—N(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —N(G1)(G1) are the same or different.

Plural G2's in —N(G2)(G2) are the same or different.

Plural G3's in —N(G3)(G3) are the same or different.

Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

(TEMP-Cz1)

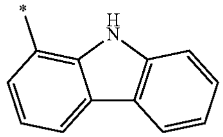

(TEMP-Cz2)

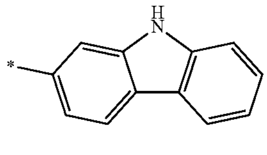

-continued (TEMP-Cz3)

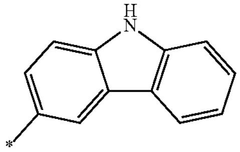

(TEMP-Cz4)

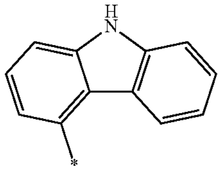

(TEMP-Cz5)

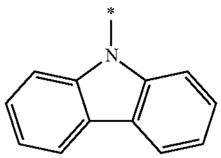

In this specification, the (9-phenyl)carbazolyl group is specifically any of the following groups, unless otherwise specified in this specification.

(TEMP-Cz6)

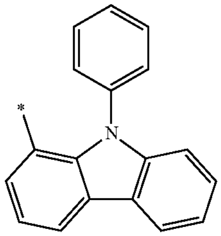

(TEMP-Cz7)

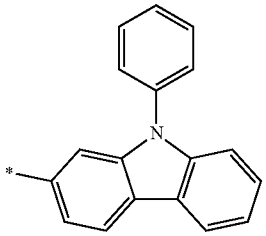

(TEMP-Cz8)

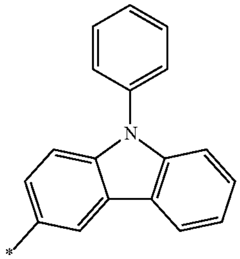

-continued (TEMP-Cz9)

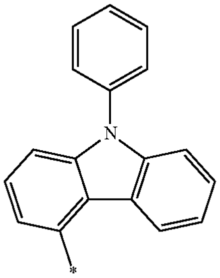

In the general formulas (TEMP-Cz1) to (TEMP-Cz9), * represents a bonding site.

In this specification, the dibenzofuranyl group and the dibenzothiophenyl group are specifically any of the following groups, unless otherwise specified in this specification.

(TEMP-34)

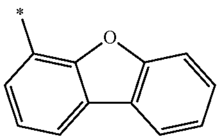

(TEMP-35)

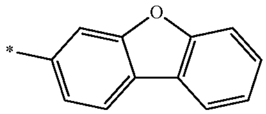

(TEMP-36)

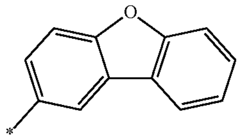

(TEMP-37)

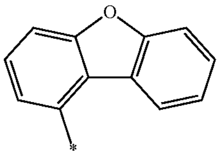

(TEMP-38)

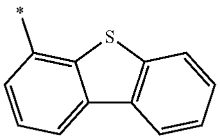

(TEMP-39)

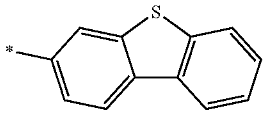

(TEMP-40)

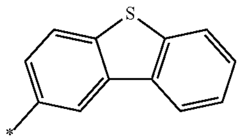

-continued (TEMP-41)

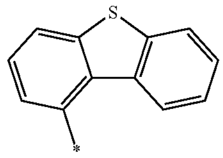

In the general formulas (TEMP-34) to (TEMP-41), * represents a bonding site.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocycle of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocycle of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

(TEMP-42)

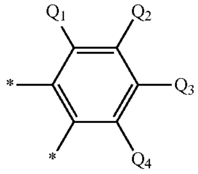

-continued (TEMP-43)

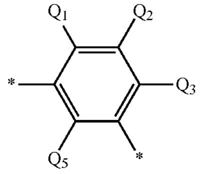

(TEMP-44)

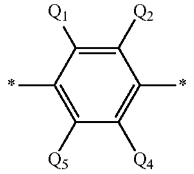

(TEMP-45)

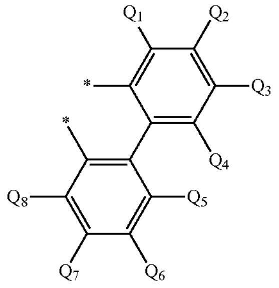

(TEMP-46)

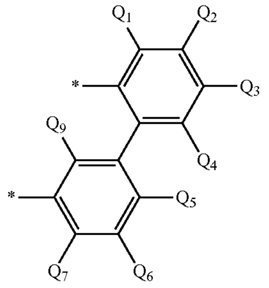

(TEMP-47)

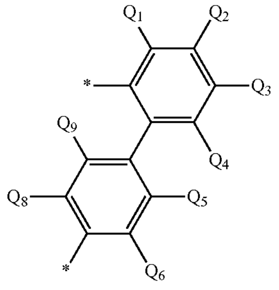

(TEMP-48)

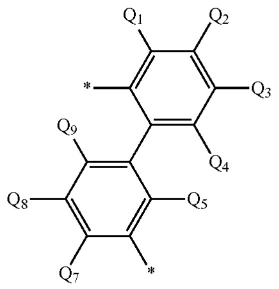

-continued
(TEMP-49)
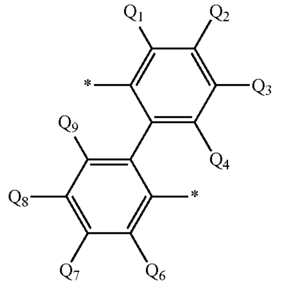
(TEMP-50)
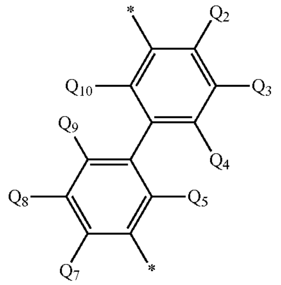
(TEMP-51)
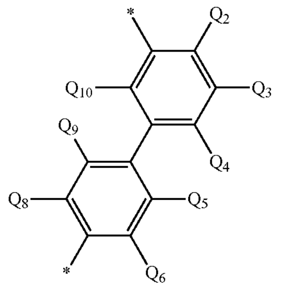
(TEMP-52)
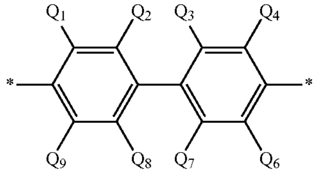
In the general formulas (TEMP-42) to (TEMP-52), $Q_1$ to $Q_{10}$ are independently a hydrogen atom or a substituent.
In the general formulas (TEMP-42) to (TEMP-52), * represents a bonding site.
(TEMP-53)
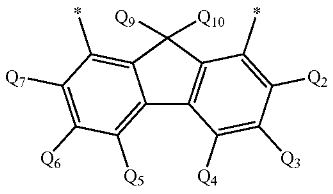
(TEMP-54)
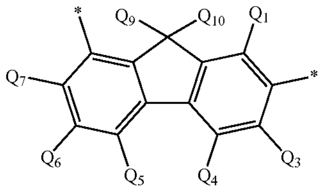
-continued
(TEMP-55)
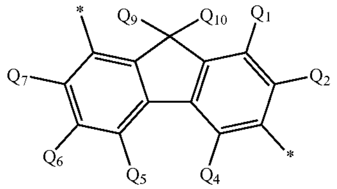
(TEMP-56)
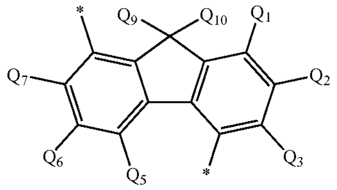
(TEMP-57)
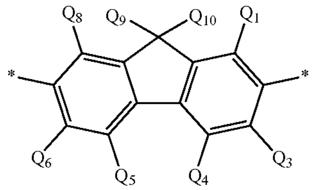
(TEMP-58)
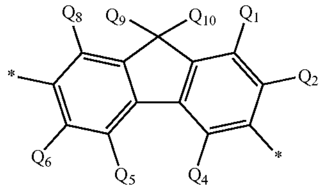
(TEMP-59)
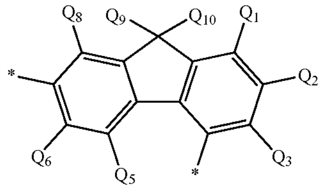
(TEMP-60)
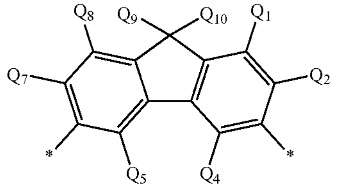
(TEMP-61)
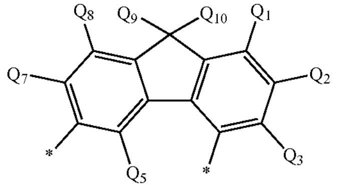
(TEMP-62)
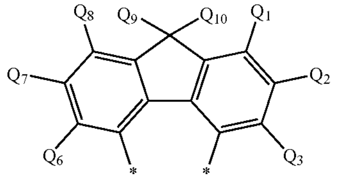
In the general formulas (TEMP-53) to (TEMP-62), $Q_1$ to $Q_{10}$ are independently a hydrogen atom or a substituent.

$Q_9$ and $Q_{10}$ may be bonded with each other via a single bond to form a ring.

In the general formulas (TEMP-53) to (TEMP-62), * represents a bonding site.

(TEMP-63)

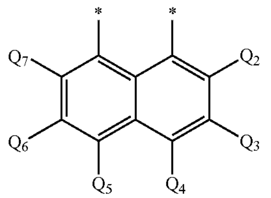

(TEMP-64)

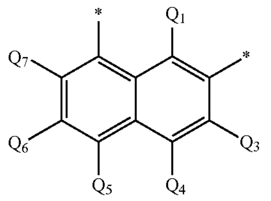

(TEMP-65)

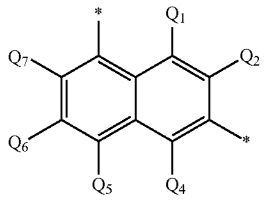

(TEMP-66)

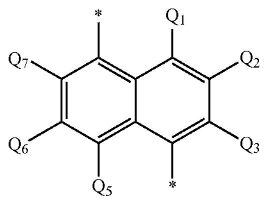

(TEMP-67)

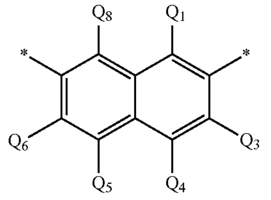

(TEMP-68)

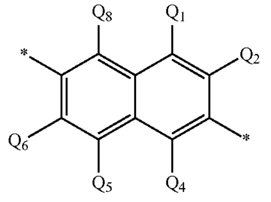

In the general formulas (TEMP-63) to (TEMP-68), $Q_1$ to $Q_8$ are independently a hydrogen atom or a substituent.

In the general formulas (TEMP-63) to (TEMP-68), * represents a bonding site.

The substituted or unsubstituted divalent heterocyclic group described in this specification is preferably any group of the following general formulas (TEMP-69) to (TEMP-102), unless otherwise specified in this specification.

(TEMP-69)

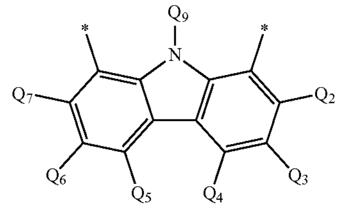

(TEMP-70)

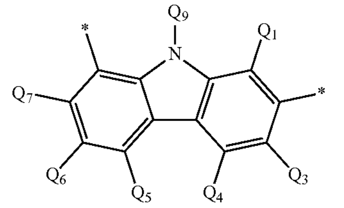

(TEMP-71)

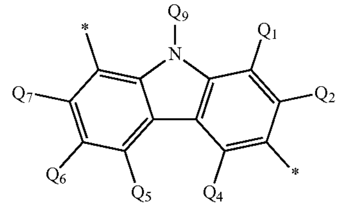

(TEMP-72)

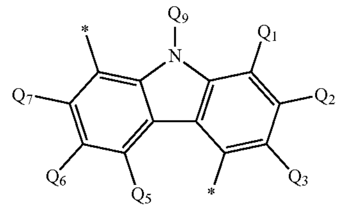

(TEMP-73)

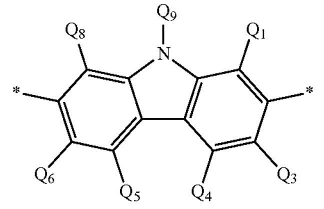

(TEMP-74)

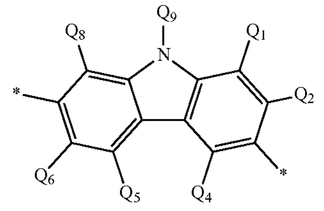

(TEMP-75)

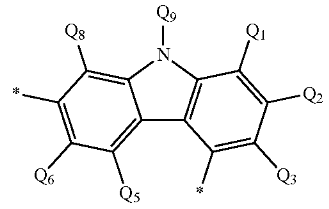

-continued
(TEMP-76)
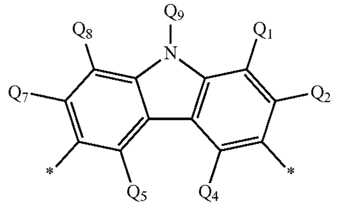
(TEMP-77)
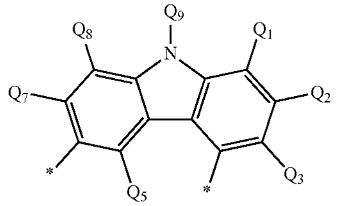
(TEMP-78)
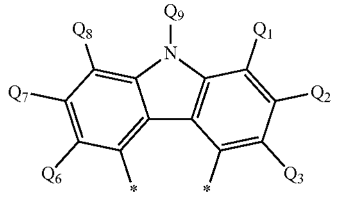
(TEMP-79)
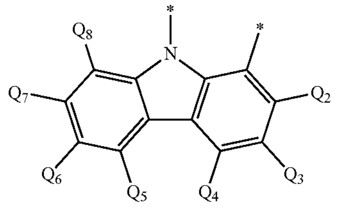
(TEMP-80)
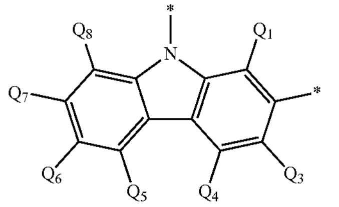
(TEMP-81)
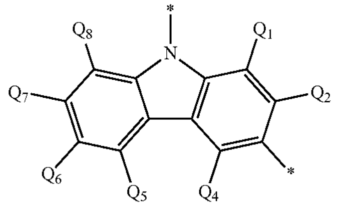
(TEMP-82)
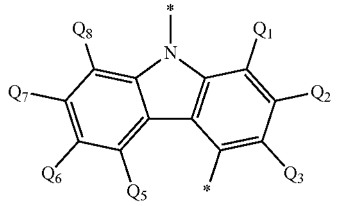
In the general formulas (TEMP-69) to (TEMP-82), $Q_1$ to $Q_9$ are independently a hydrogen atom or a substituent.
(TEMP-83)
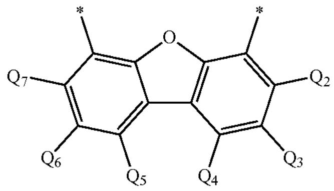
(TEMP-84)
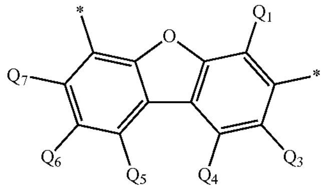
(TEMP-85)
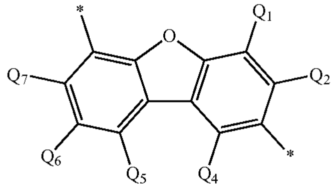
(TEMP-86)
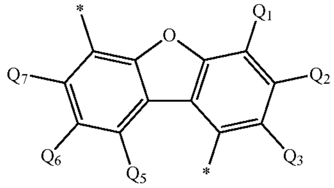
(TEMP-87)
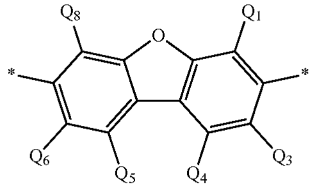
(TEMP-88)
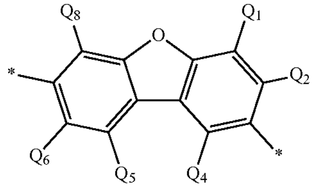
(TEMP-89)
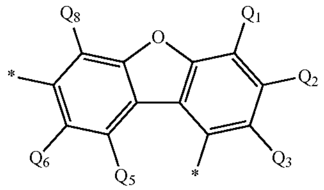
(TEMP-90)
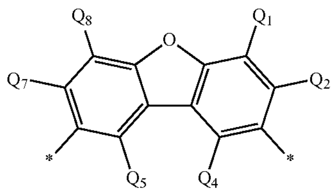

-continued (TEMP-91)

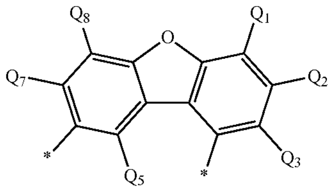

(TEMP-92)

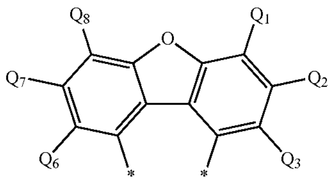

(TEMP-93)

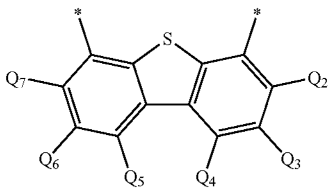

(TEMP-94)

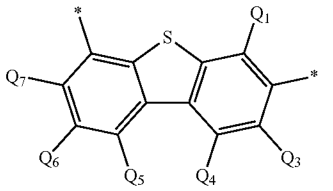

(TEMP-95)

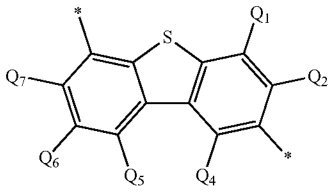

(TEMP-96)

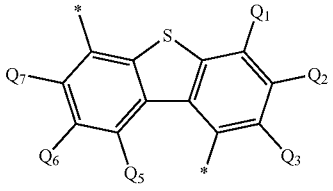

(TEMP-97)

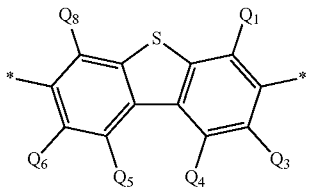

(TEMP-98)

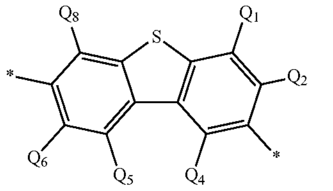

-continued (TEMP-99)

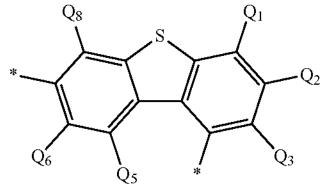

(TEMP-100)

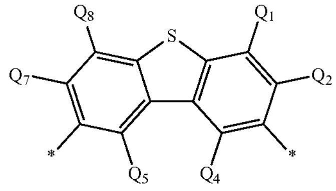

(TEMP-101)

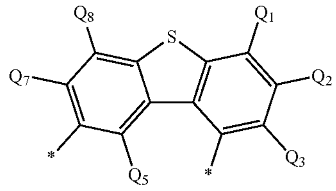

(TEMP-102)

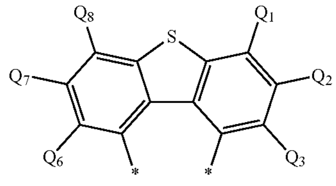

In the general formulas (TEMP-83) to (TEMP-102), $Q_1$ to $Q_8$ are independently a hydrogen atom or a substituent.

The above is the explanation of the "Substituent described in this specification."

"The Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

(TEMP-103)

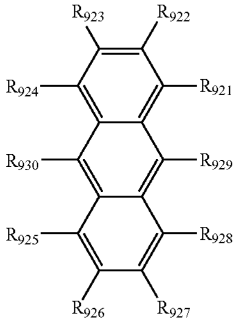

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

(TEMP-104)

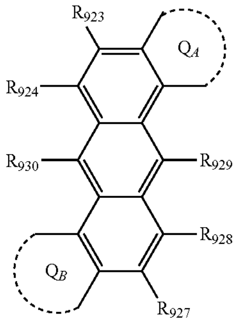

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring $Q_C$ by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring $Q_C$ share $R_{922}$.

(TEMP-105)

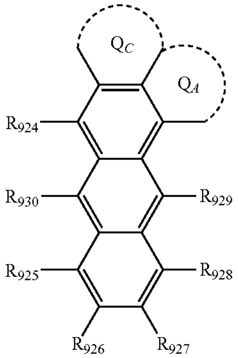

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring $Q_C$ formed in the general formula (TEMP-105) are "fused ring." The ring $Q_A$ and ring $Q_C$ of the general formula (TEMP-105) are fused ring by fusing the ring $Q_A$ and the ring $Q_C$ together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" includes, in addition to an aromatic hydrocarbon ring and an aromatic heterocycle, an aliphatic hydrocarbon ring with an unsaturated bond, i.e., double and/or triple bonds in the ring structure (e.g., cyclohexene, cyclohexadiene, etc.), and a non-aromatic heterocycle with an unsaturated bond (e.g., dihydropyran, imidazoline, pyrazoline, quinolizine, indoline, isoindoline, etc.). The "saturated ring" includes an aliphatic hydrocarbon ring without an unsaturated bond and a non-aromatic heterocycle without ab unsaturated bond.

Specific examples of the aromatic hydrocarbon ring include a structure in which the group listed as a specific example in the specific example group G1 is terminated by a hydrogen atom.

Specific examples of the aromatic heterocycle include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary atoms in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary atoms. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary atom" is preferably at least one atom selected from the group consisting of a carbon atom, a nitrogen atom, an oxygen atom, and a sulfur atom, unless otherwise specified in this specification. In the arbitrary atom (for example, a carbon atom or a nitrogen atom), a bond which does not form a ring may be terminated with a hydrogen atom or the like, or may be substituted with "arbitrary substituent" described below. When an arbitrary atom other than a carbon atom is contained, the ring formed is a heterocycle.

The number of "one or more arbitrary atom(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification.

Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less atoms which is at least one kind selected from a carbon atom, a nitrogen atom, an oxygen atom, and a sulfur atom.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other" (the case where "forming a ring by bonding with each other").

Substituent in the Case of "Substituted or Unsubstituted"

In one embodiment in this specification, the substituent (in this specification, sometimes referred to as an "arbitrary substituent") in the case of "substituted or unsubstituted" is, for example, a group selected from the group consisting of:

an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, an unsubstituted aryl group including 6 to 50 ring carbon atoms, and an unsubstituted heterocyclic group including 5 to 50 ring atoms, wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms.

When two or more $R_{901}$'s are present, the two or more $R_{901}$'s may be the same or different.

When two or more $R_{902}$'s are present, the two or more $R_{902}$'s may be the same or different.

When two or more $R_{903}$'s are present, the two or more $R_{903}$'s may be the same or different.

When two or more $R_{904}$'s are present, the two or more $R_{904}$'s may be the same or different.

When two or more $R_{905}$'s are present, the two or more $R_{905}$'s may be the same or different.

When two or more $R_{906}$'s are present, the two or more $R_{906}$'s may be the same or different.

When two or more $R_{907}$'s are present, the two or more $R_{907}$'s may be the same or different.

In one embodiment, the substituent in the case of "substituted or unsubstituted" is a group selected from the group consisting of:

an alkyl group including 1 to 50 carbon atoms, an aryl group including 6 to 50 ring carbon atoms, and a heterocyclic group including 5 to 50 ring atoms.

In one embodiment, the substituent in the case of "substituted or unsubstituted" is a group selected from the group consisting of:

an alkyl group including 1 to 18 carbon atoms, an aryl group including 6 to 18 ring carbon atoms, and a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit

[Composition]

A composition according to an aspect of the invention contains a compound represented by the formula (1) and a compound represented by the formula (2), provided that the compound represented by the formula (1) and the compound represented by the formula (2) are different compounds.

By containing two components each having a specific structure, the composition according to an aspect of the invention can increase the device performance when it is used for an organic EL device. Specifically, it is possible to realize an organic EL device having a low driving voltage and high efficiency.

Hereinafter, details of each compound will be described.

(Compound Represented by the Formula (1))

A compound represented by the formula (1) is as follows.

(1)

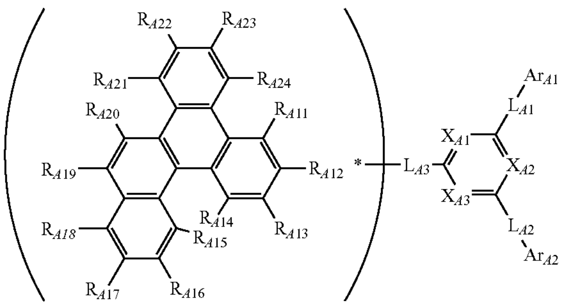

wherein in the formula (1), $X_{A1}$ to $X_{A3}$ are independently N or $CR_{A1}$, provided that at least two of $X_{A1}$ to $X_{A3}$ are N's;

$R_{A1}$ is a hydrogen atom or a substituent R;

$Ar_{A1}$ and $Ar_{A2}$ are independently a substituted or unsubstituted aryl group including 6 to 50 ring carbon atoms, or a substituted or unsubstituted monovalent heterocyclic group including 5 to 50 ring atoms;

$L_{A1}$, $L_{A2}$, and $L_{A3}$ are independently a single bond, a substituted or unsubstituted arylene group including 6 to 50 ring carbon atoms, or a substituted or unsubstituted divalent heterocyclic group including 5 to 50 ring atoms;

one of $R_{A11}$ to $R_{A24}$ is a single bond bonded with $L_{A3}$;

$R_{A11}$ to $R_{A24}$ which are not the single bond bonded with $L_{A3}$ are independently a hydrogen atom or a substituent R;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$ (where $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other), a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more of the substituent R's are present, the two or more of the substituent R's may be the same as or different from each other.

In one embodiment, $Ar_{A1}$ and $Ar_{A2}$ are independently a substituted or unsubstituted aryl group including 6 to 50 ring carbon atoms (e.g., 6 to 30 ring carbon atoms, or 6 to 18 ring carbon atoms).

In one embodiment, $Ar_{A1}$ and $Ar_{A2}$ are independently a substituted or unsubstituted phenyl group, or a substituted or unsubstituted biphenyl group.

In one embodiment, $L_{A1}$ and $L_{A2}$ are single bonds.

In one embodiment, $L_{A3}$ is a single bond, or a substituted or unsubstituted arylene group including 6 to 50 ring carbon atoms (e.g., 6 to 30 ring carbon atoms, or6 to 18 ring carbon atoms).

In one embodiment, $L_{A3}$ is a substituted or unsubstituted phenylene group, or a substituted or unsubstituted biphenylyl group.

In one embodiment, all of $X_{A1}$ to $X_{A3}$ are N's.

In one embodiment, $R_{A19}$ is a single bond bonded with $L_{A3}$.

In one embodiment, the compound represented by the formula (1) is a compound represented by the following formula (1-1).

(1-1)

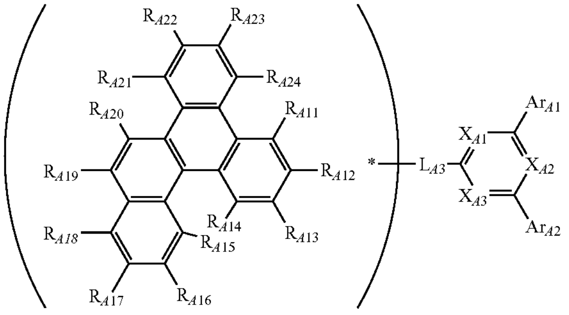

wherein in the formula (1-1), $X_{A1}$ to $X_{A3}$, $Ar_{A1}$, $Ar_{A2}$, $L_{A3}$, and $R_{A11}$ to $R_{A24}$ are as defined in the formula (1).

In one embodiment, the compound represented by the formula (1) is a compound represented by the following formula (1-2).

(1-2)

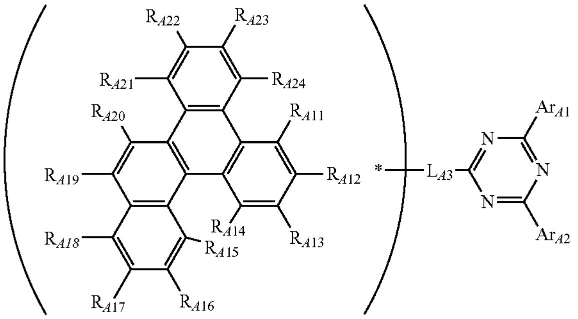

wherein in the formula (1-2), $Ar_{A1}$, $Ar_{A2}$, $L_{A3}$, and $R_{A11}$ to $R_{A24}$ are as defined in the formula (1).

In one embodiment, the compound represented by the formula (1) is a compound represented by the following formula (1-3).

(1-3)

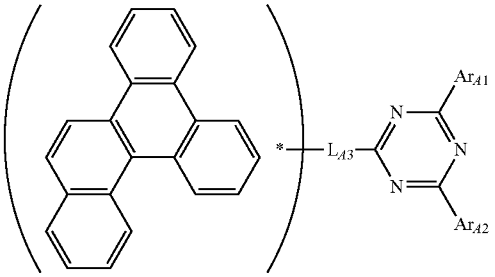

wherein in the formula (1-3), $Ar_{A1}$, $Ar_{A2}$, and $L_{A3}$ are as defined in the formula (1); and $L_{A3}$ is bonded with one of the carbon atoms constituting the benzotriphenylene structure by a single bond.

The compound represented by the formula (1) can be synthesized by using known alternative reactions or raw materials tailored to the target product.

Specific examples of the compound represented by the formula (1) will be described below, but these are merely examples, and the compound represented by the formula (1) is not limited to the following specific examples.

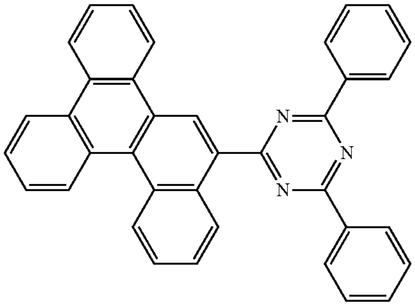

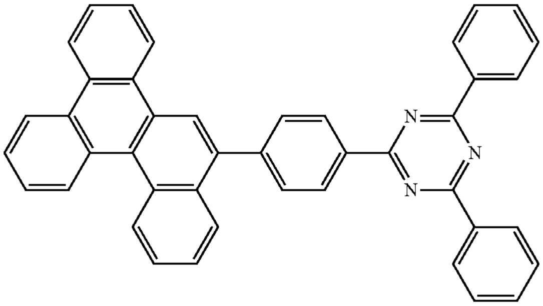

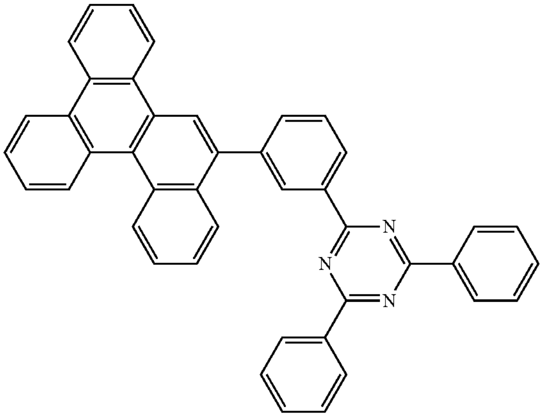

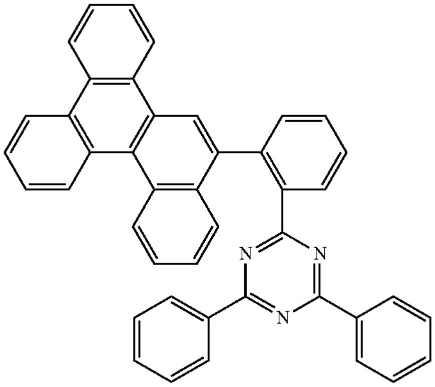

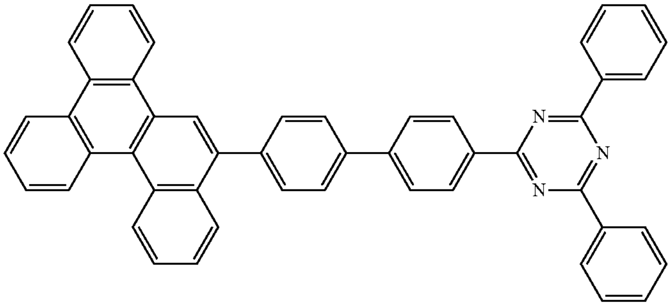

-continued
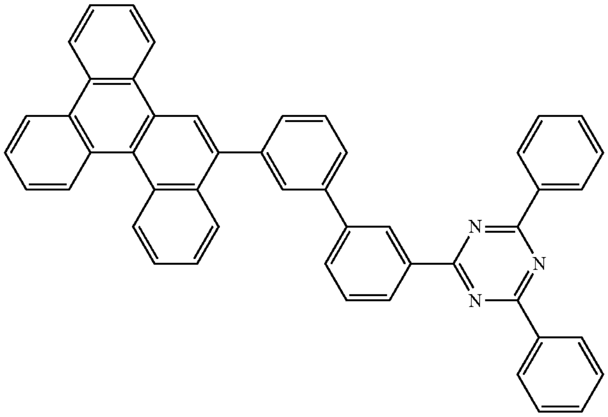
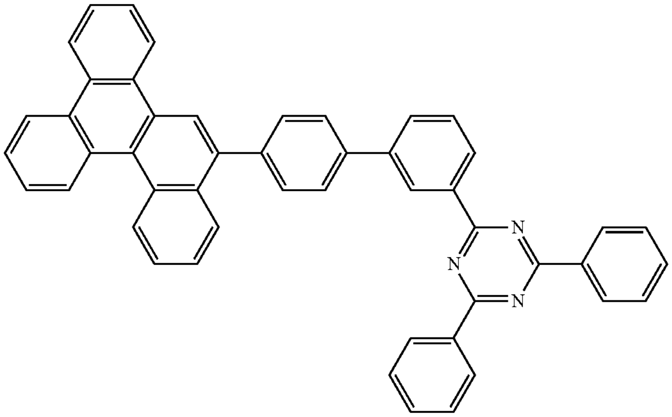
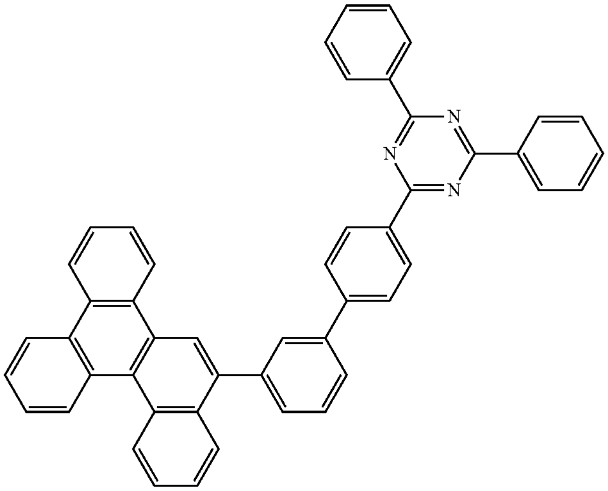

-continued
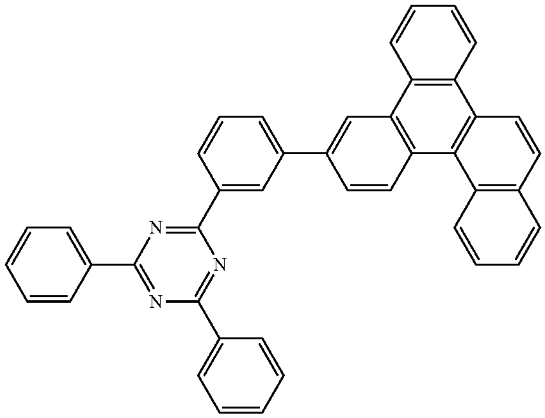
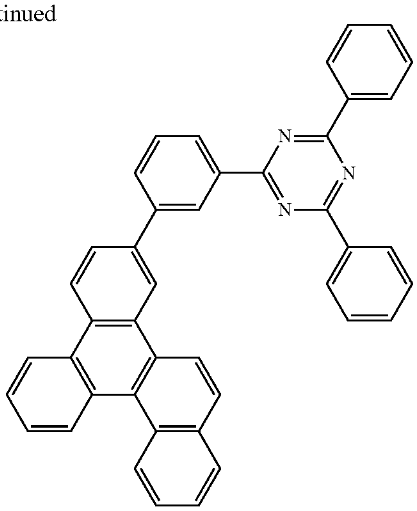
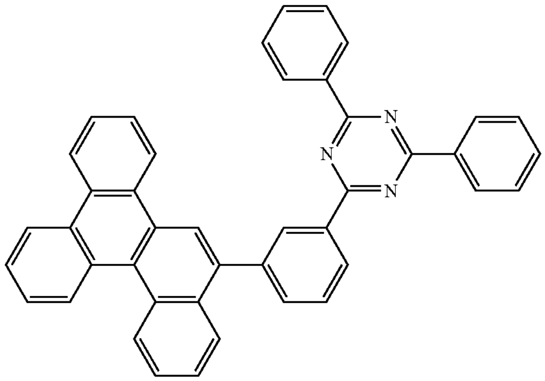
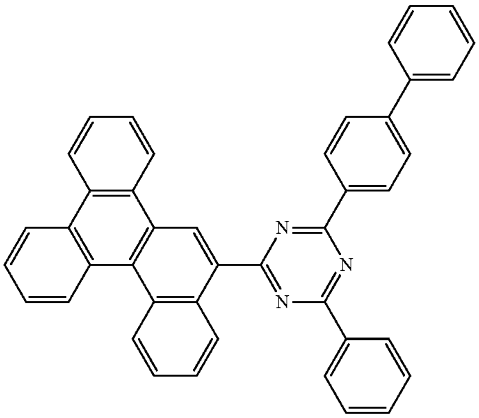
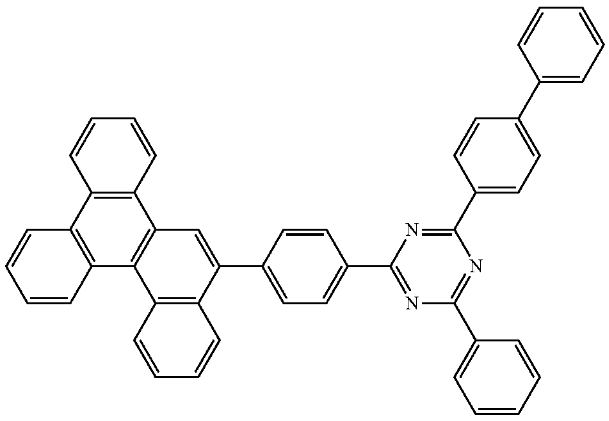

-continued
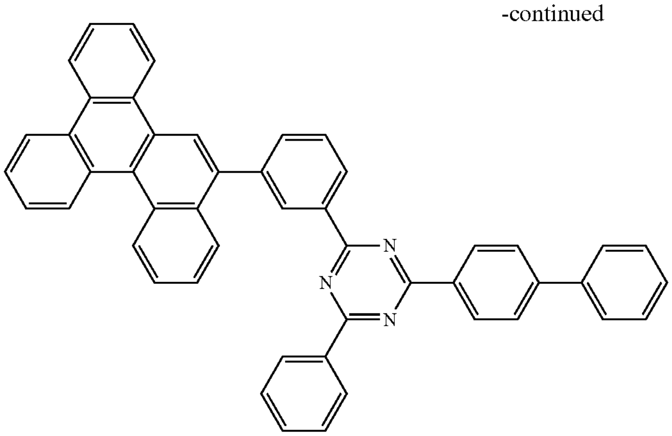
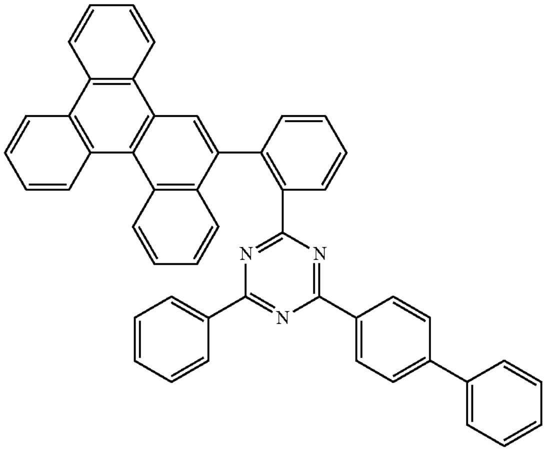
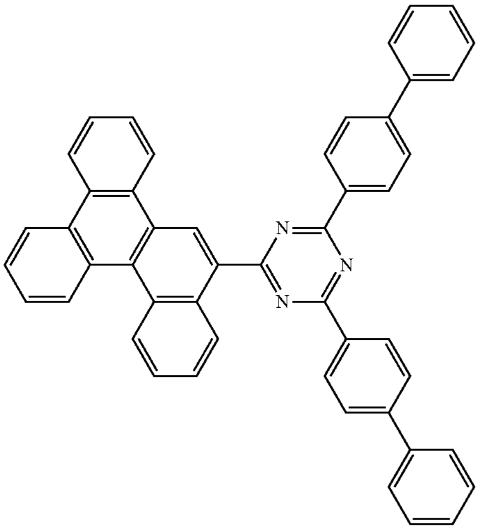
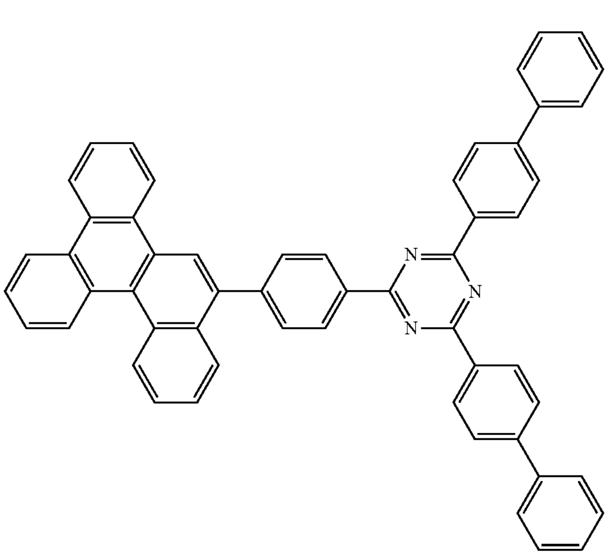

-continued
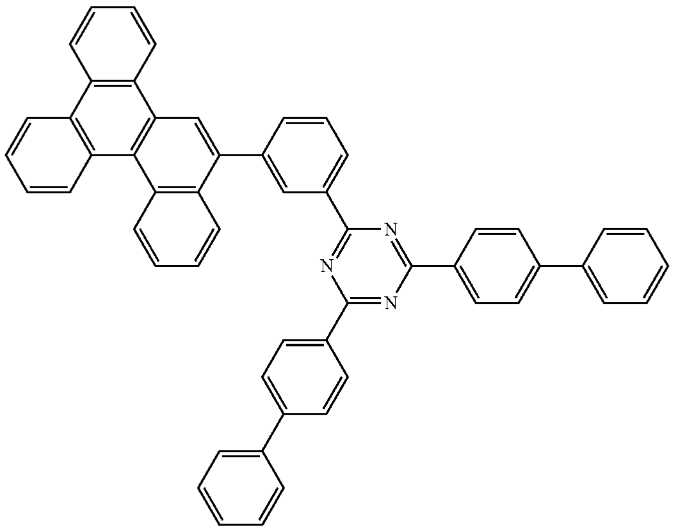
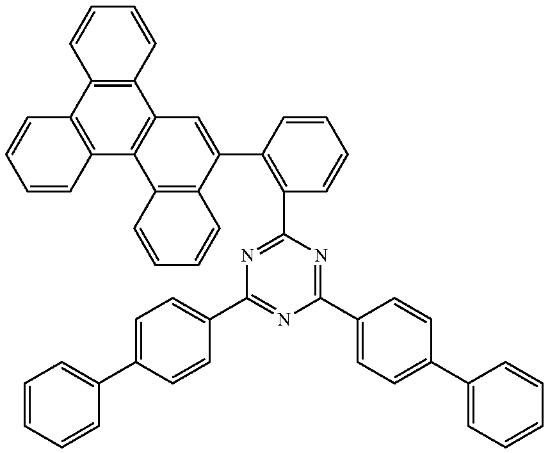
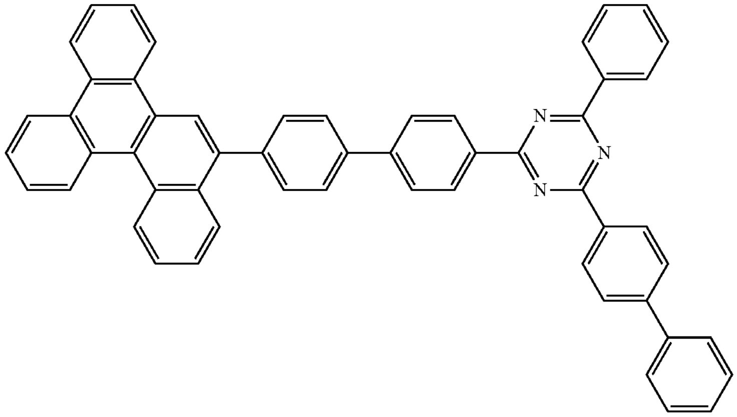

-continued
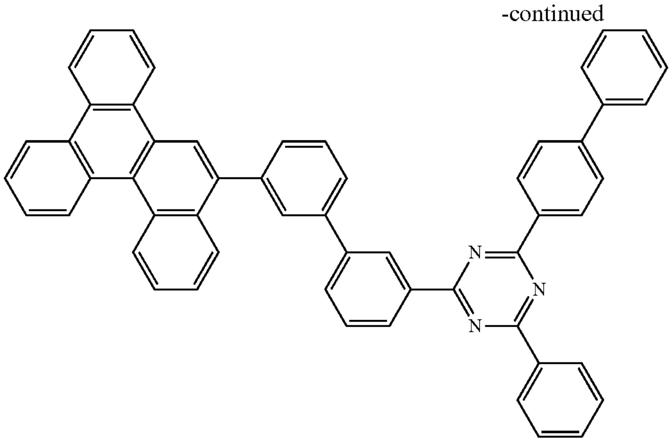
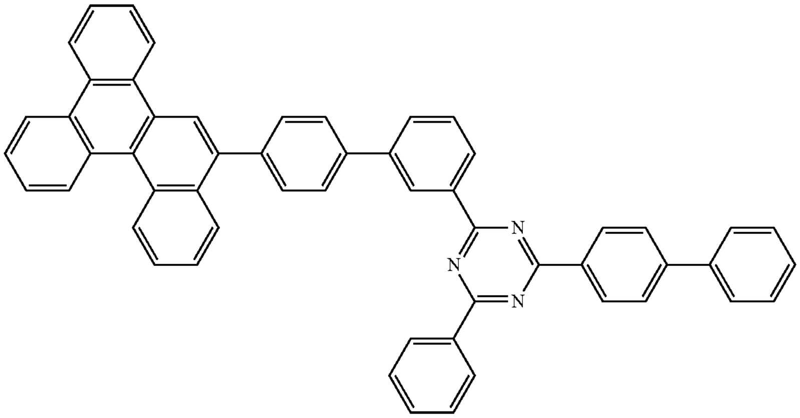
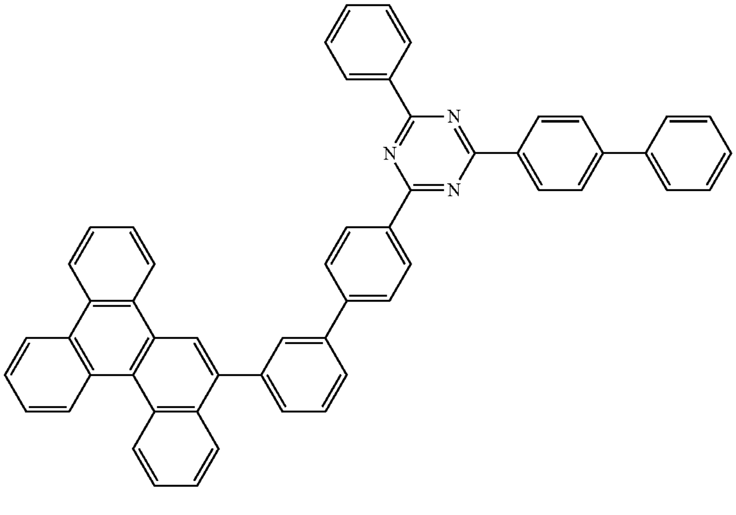

-continued
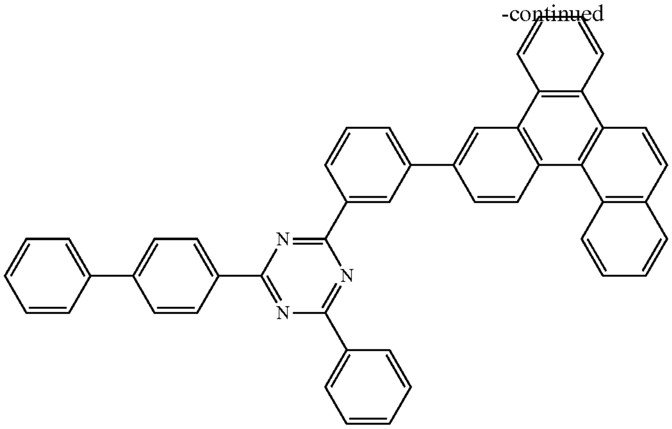
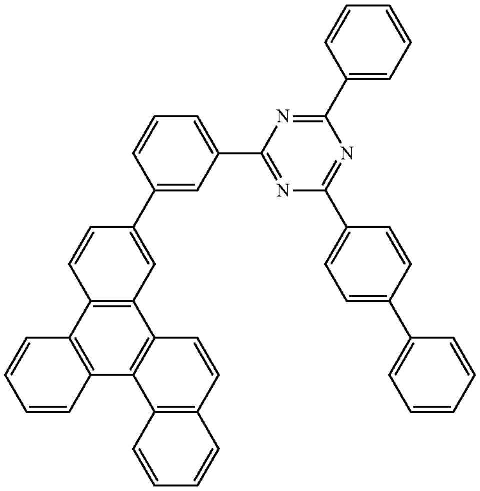
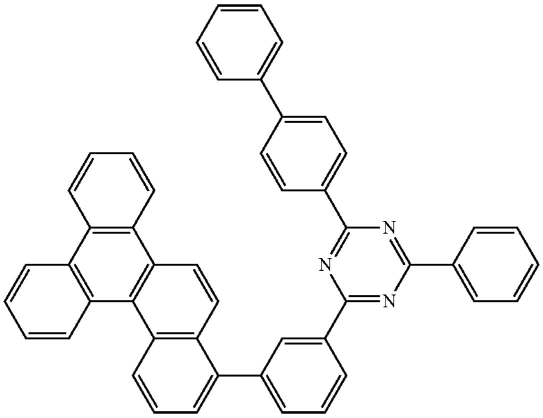
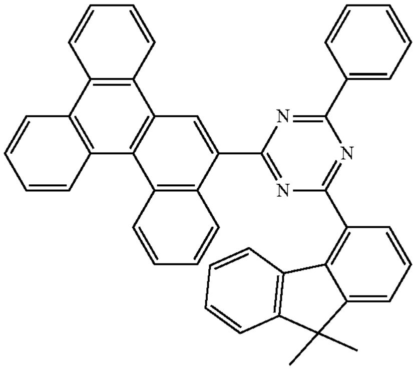
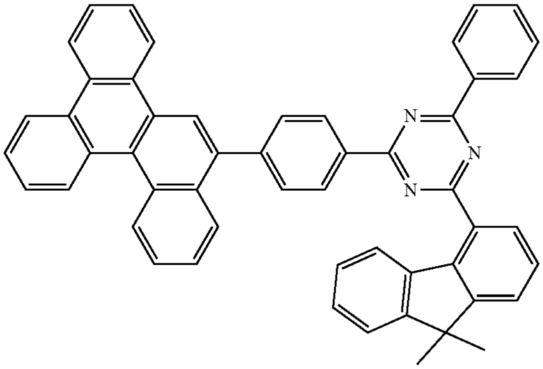
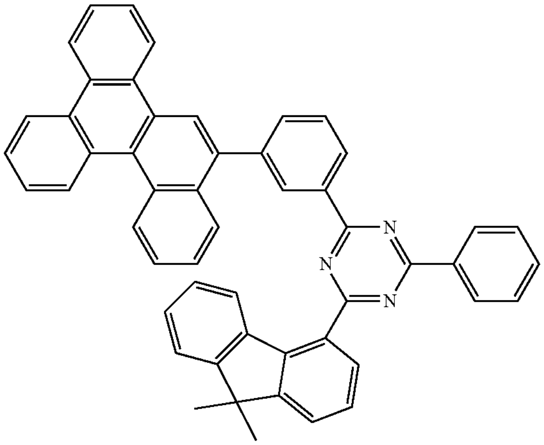
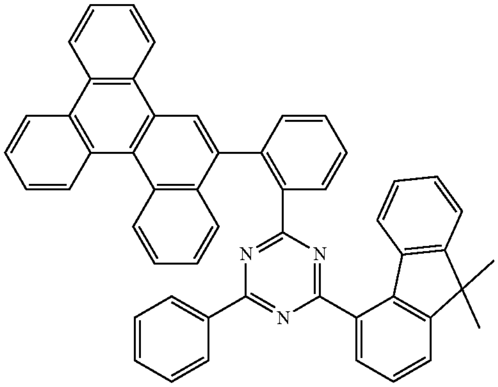

-continued
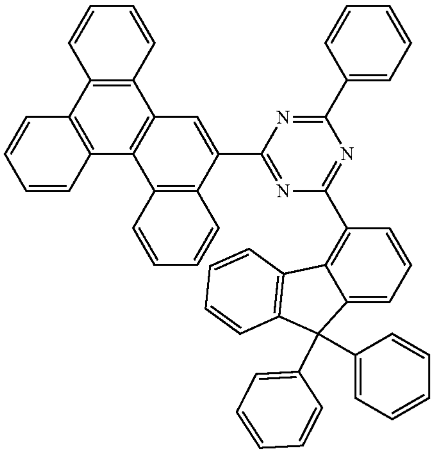
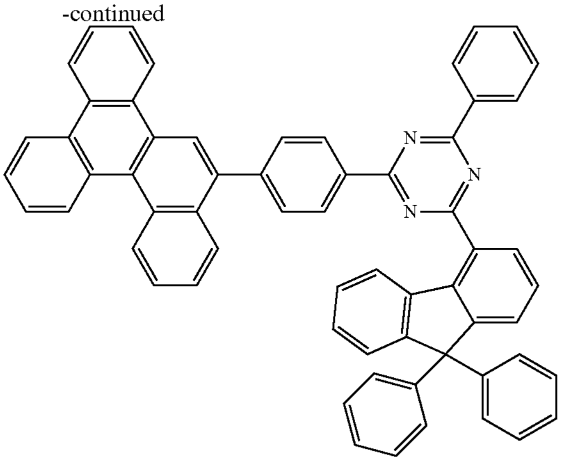
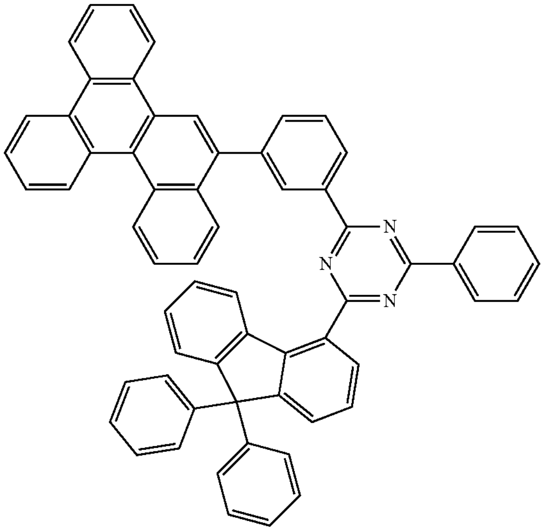
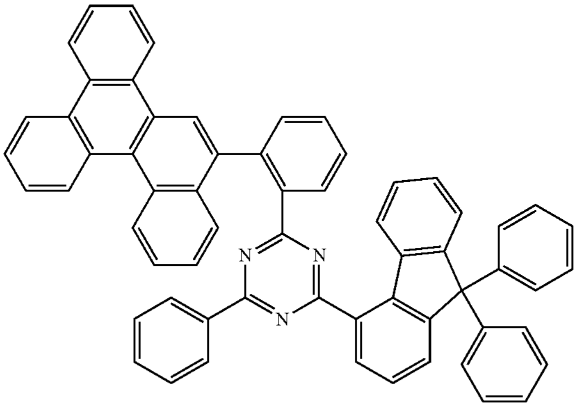
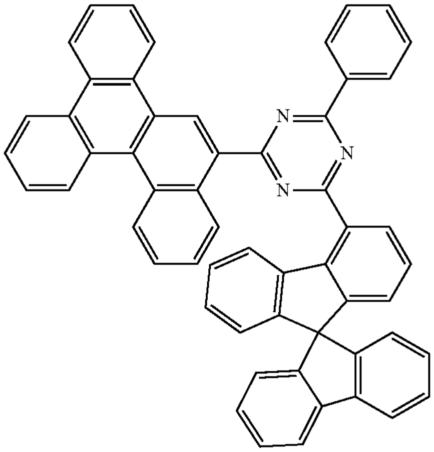
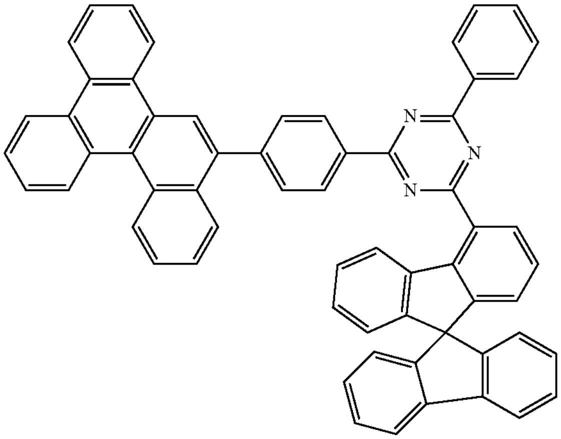

-continued
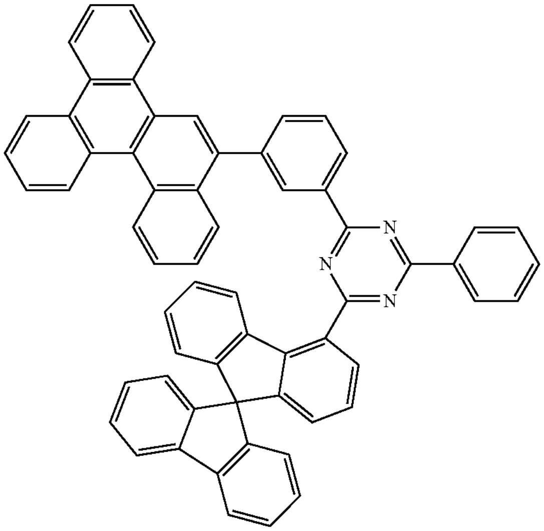
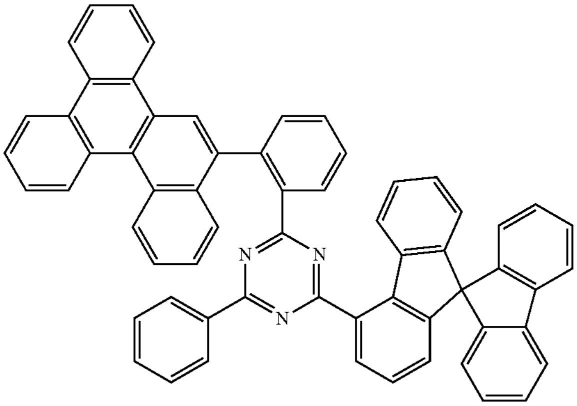
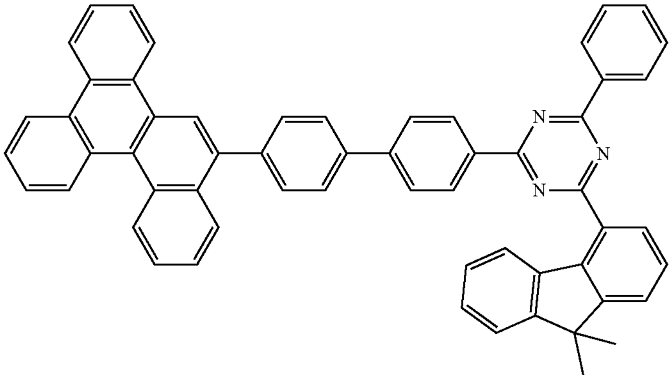
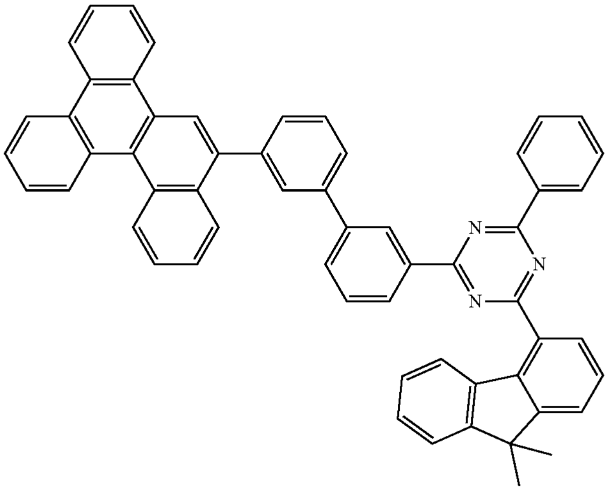

-continued
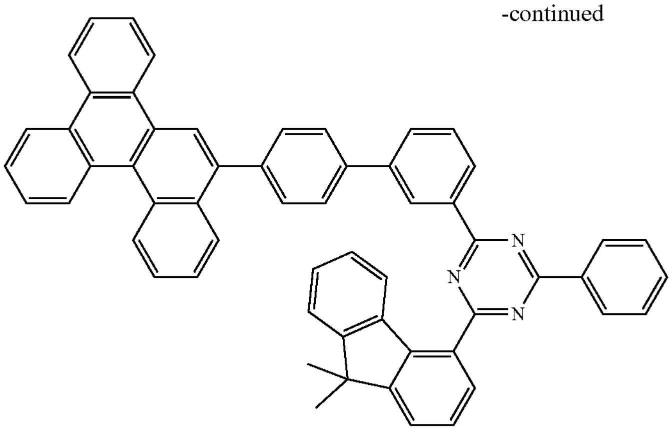
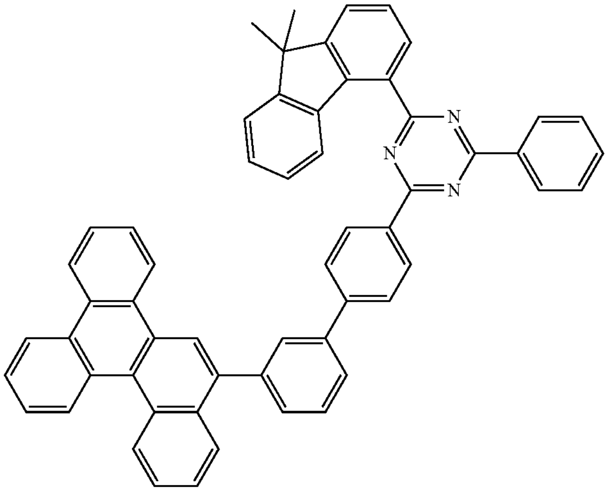
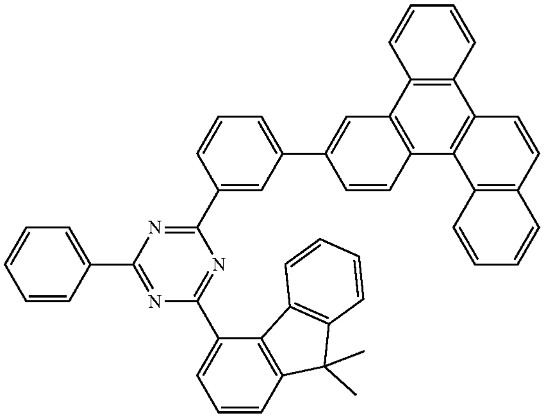
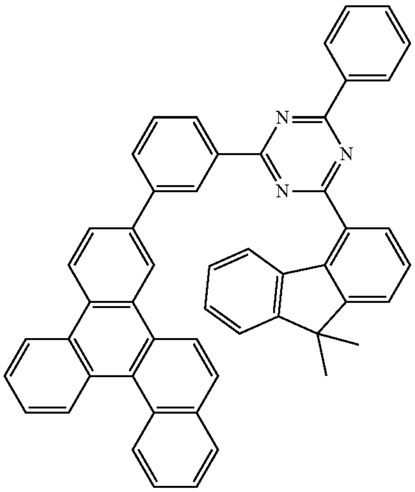

-continued
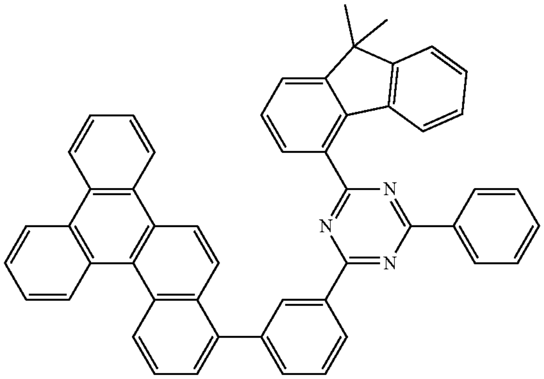
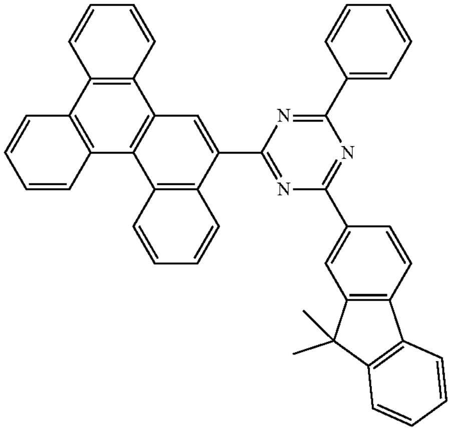
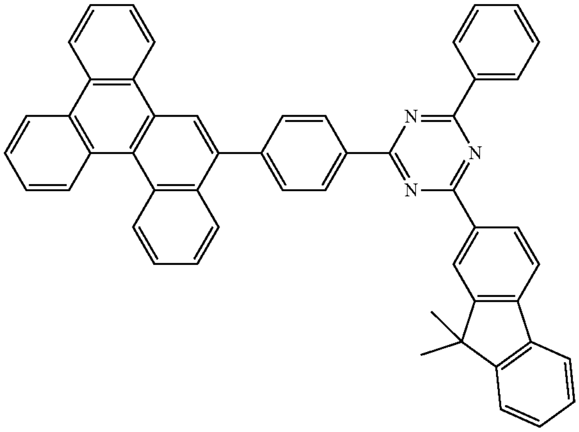
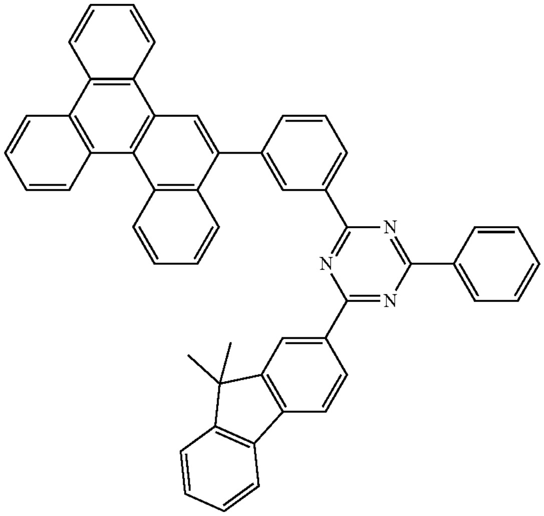
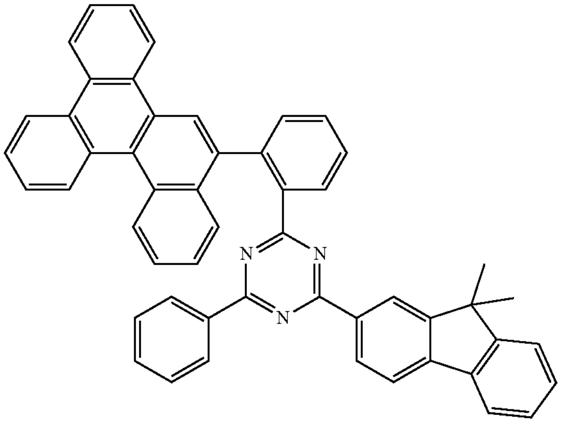
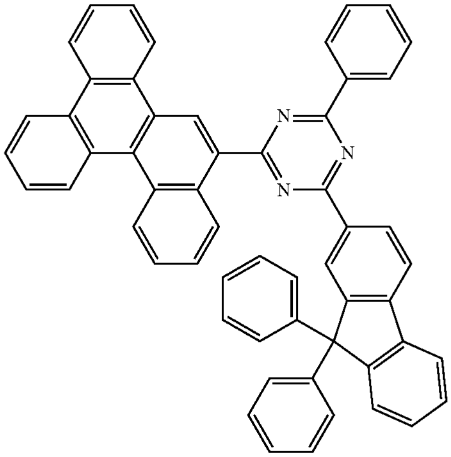

-continued
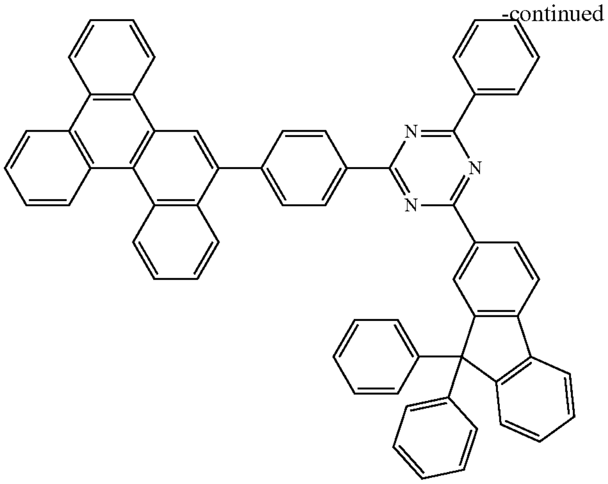
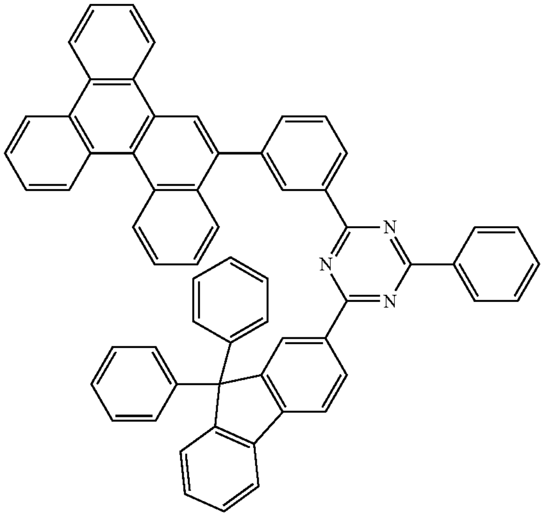
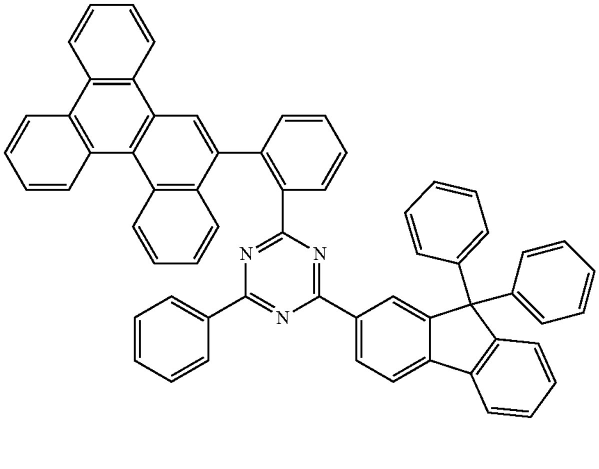
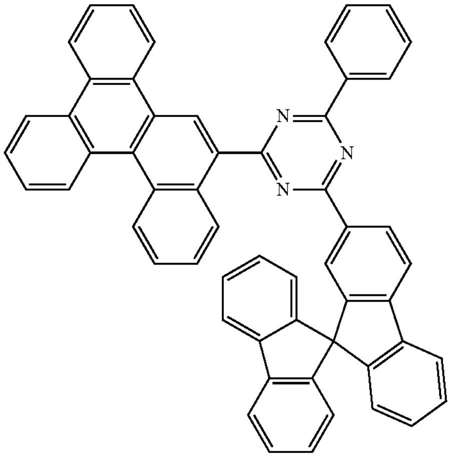

-continued
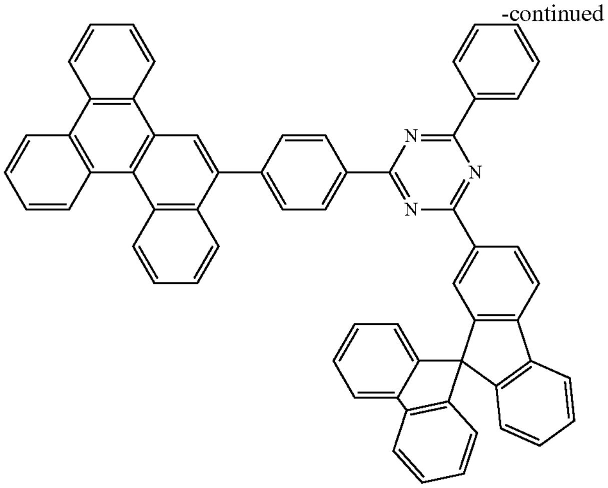
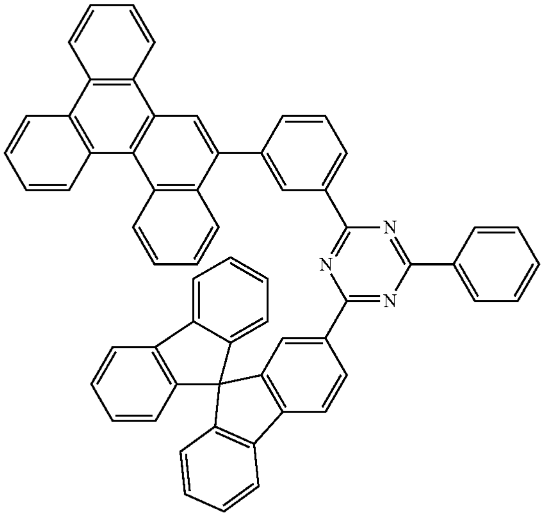
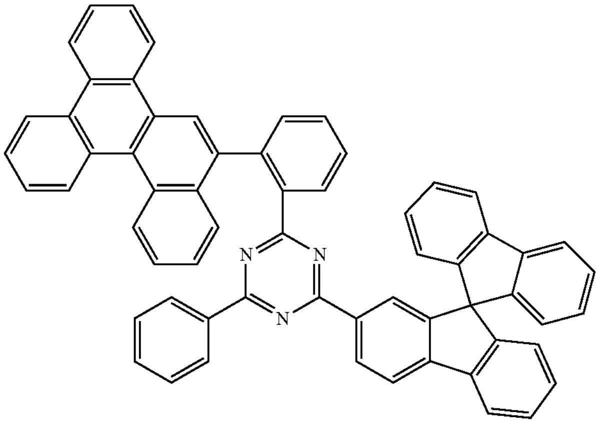

-continued
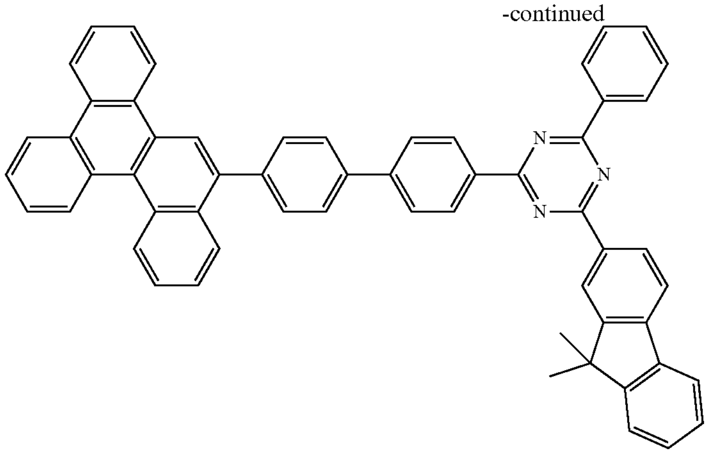
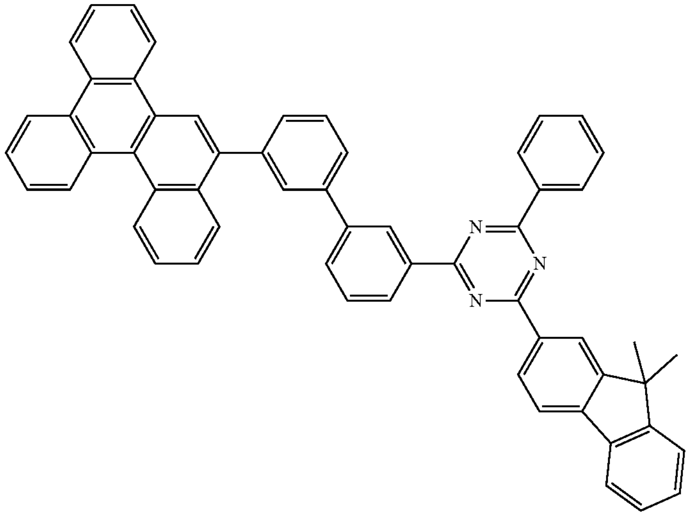
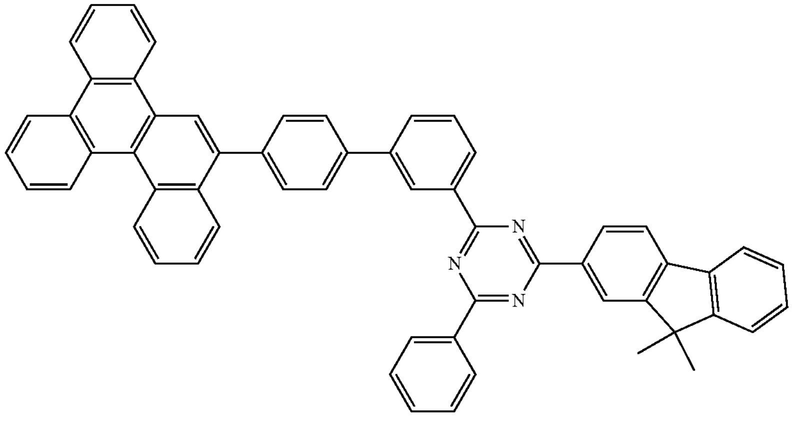

-continued
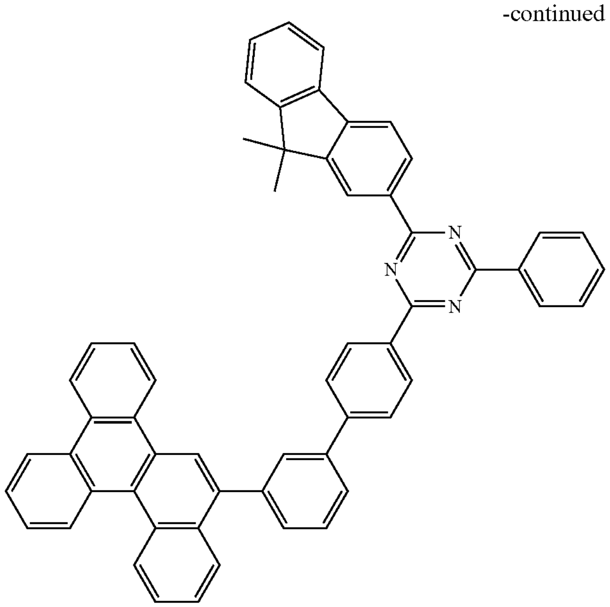
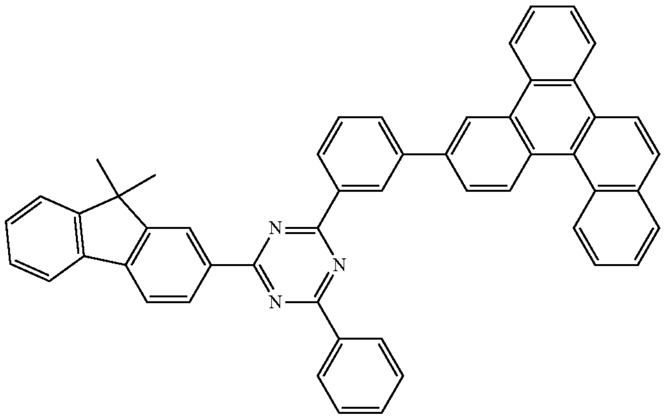
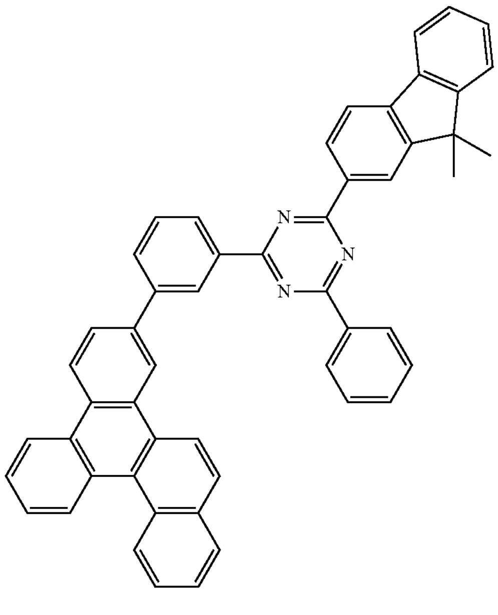
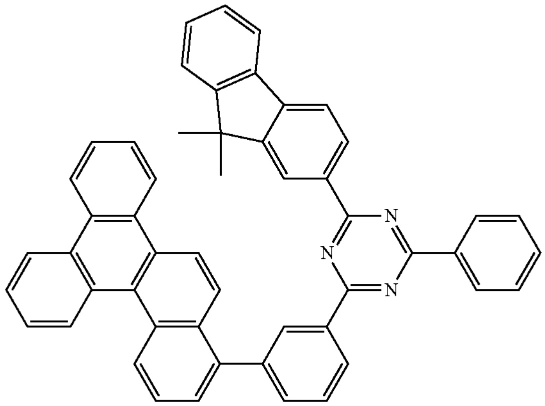

-continued
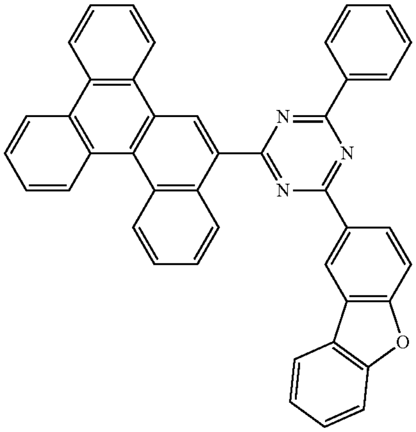
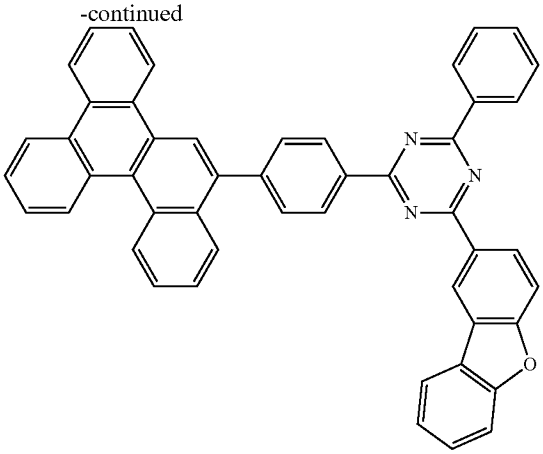
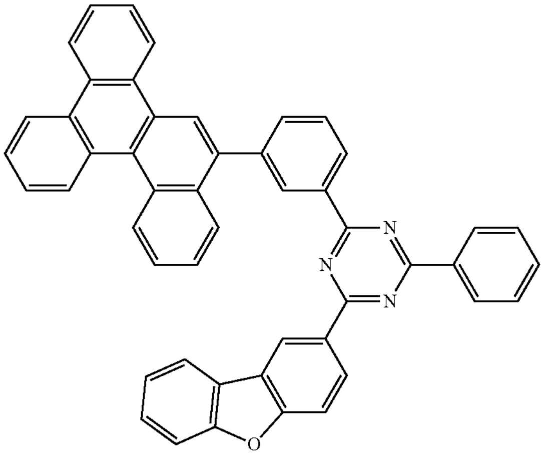
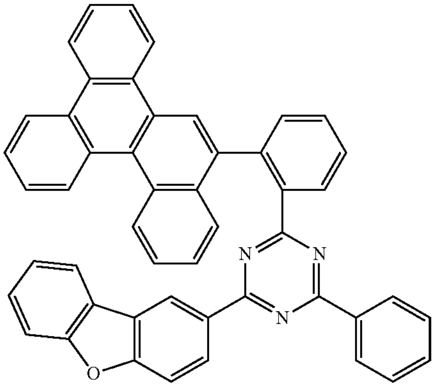
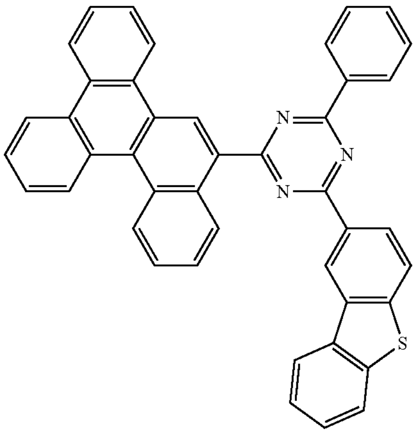
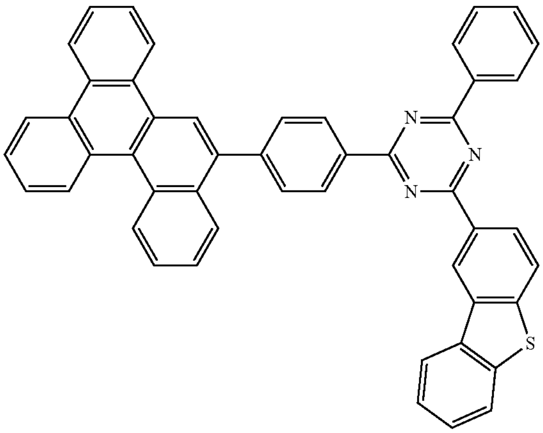

-continued
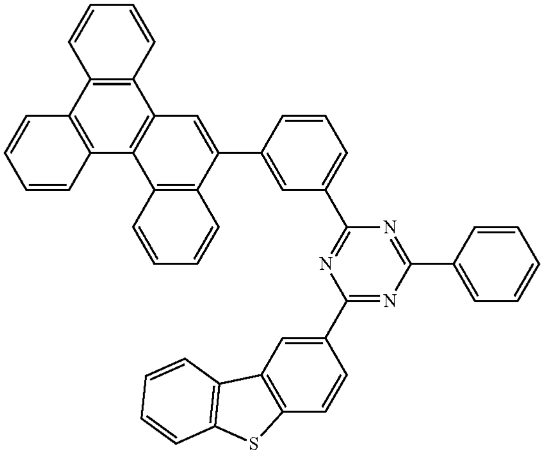
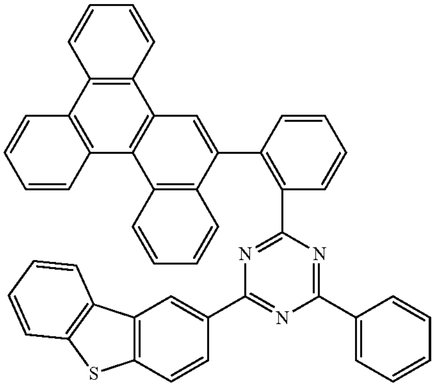
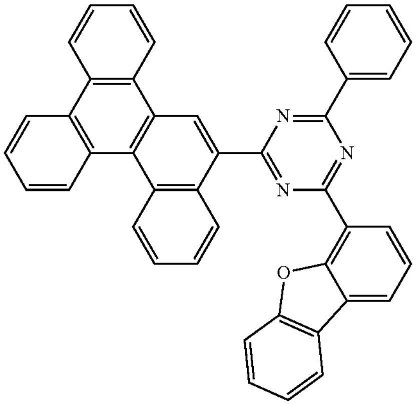
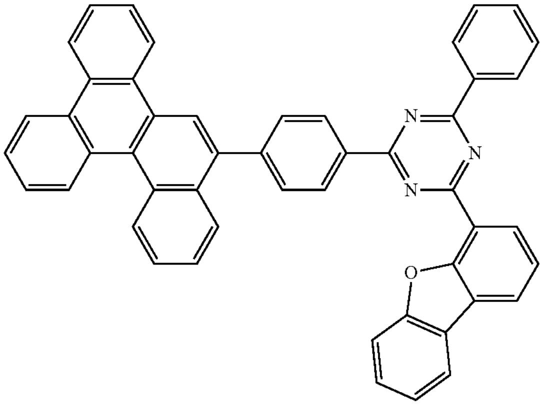
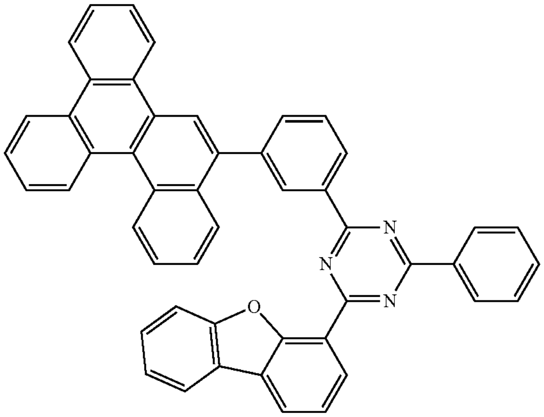
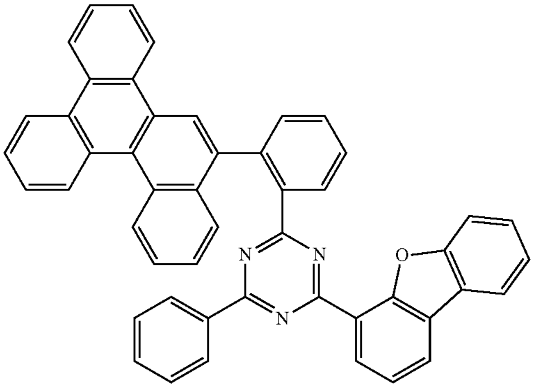
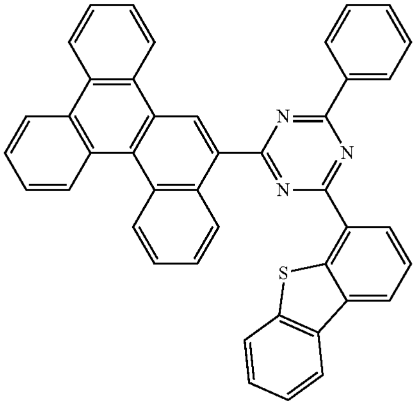
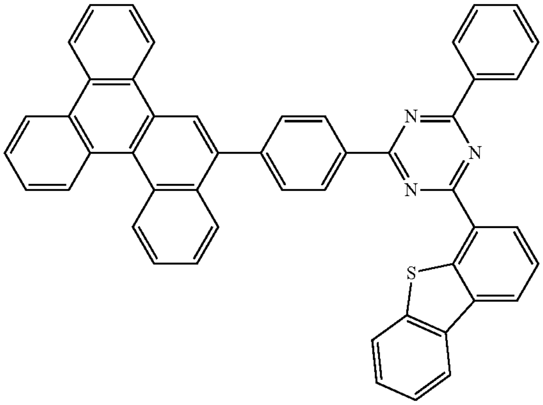

-continued
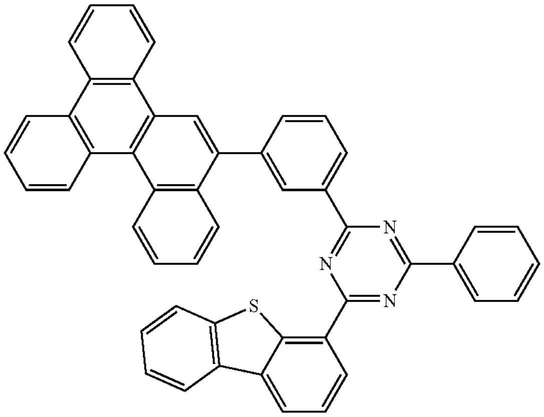
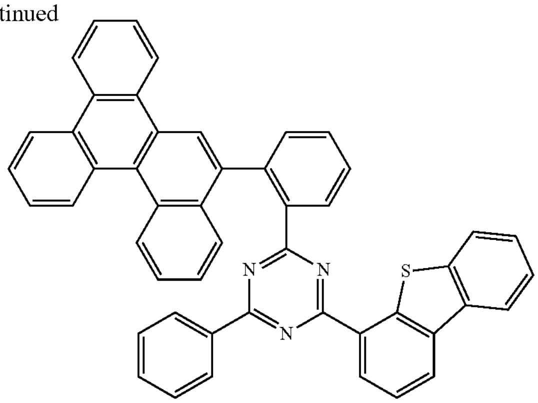
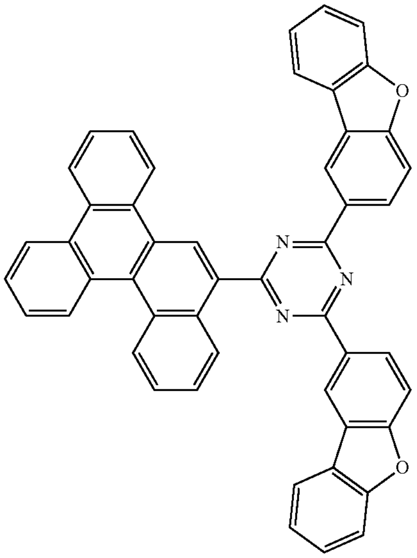
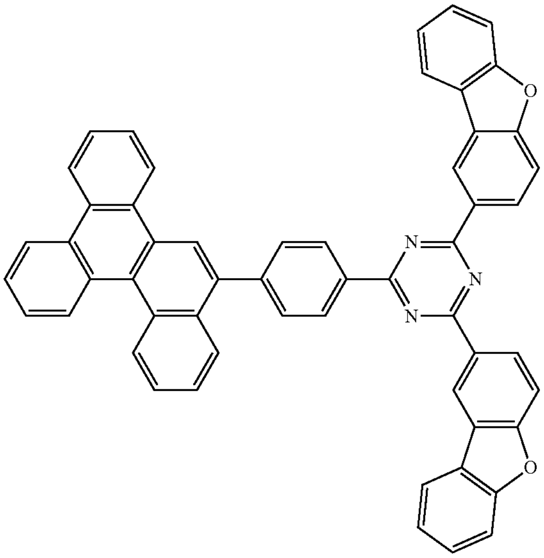
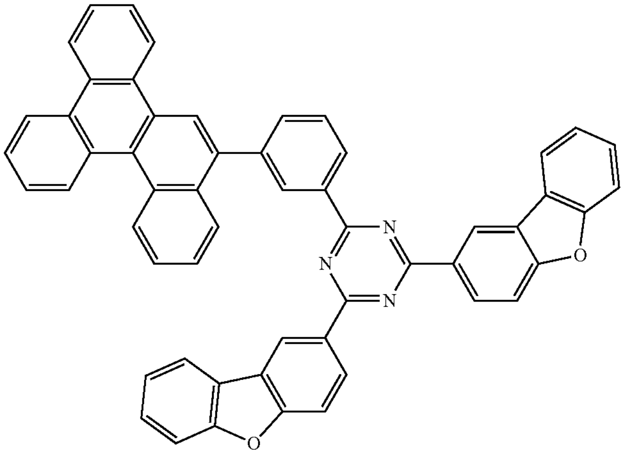

-continued
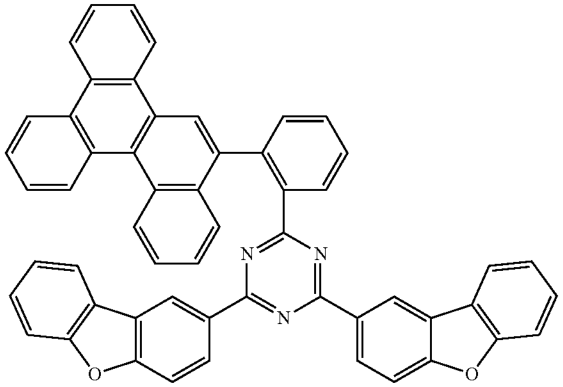
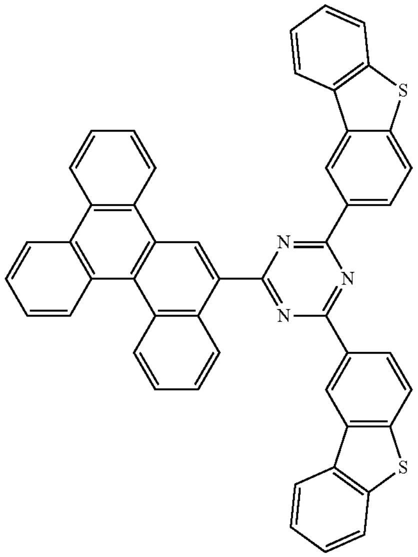
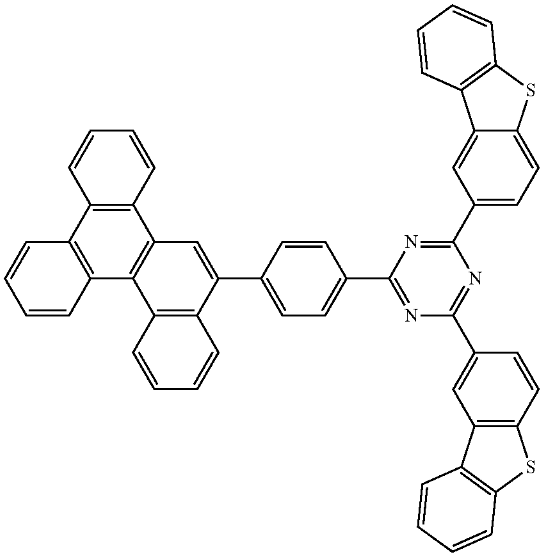
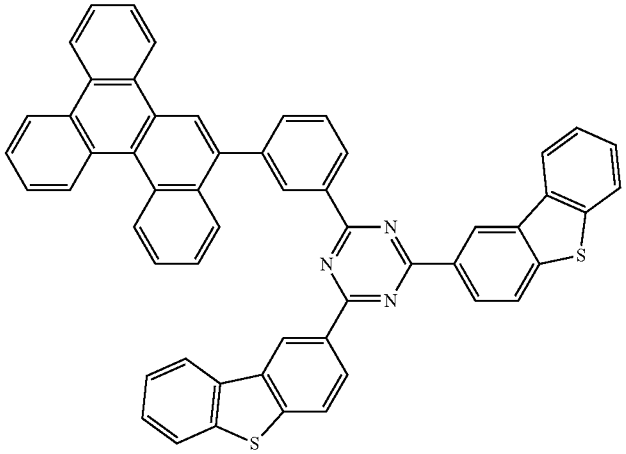

-continued
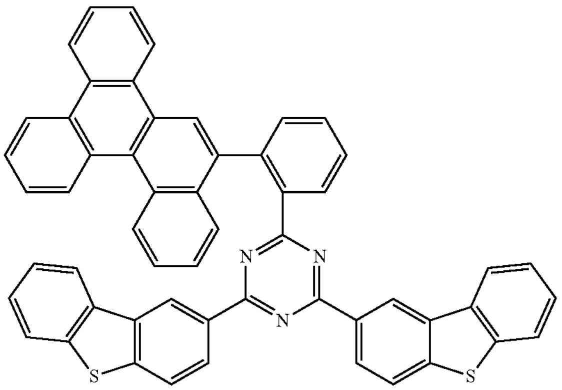
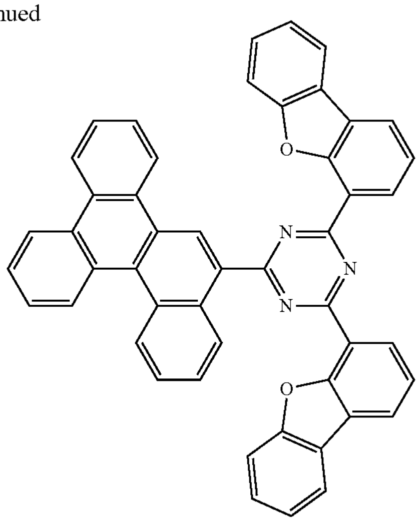
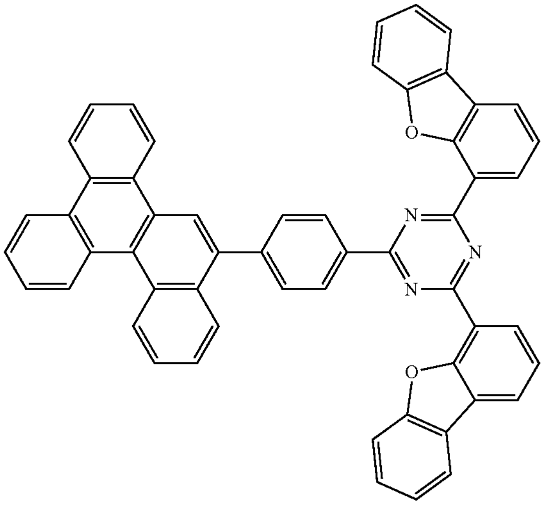
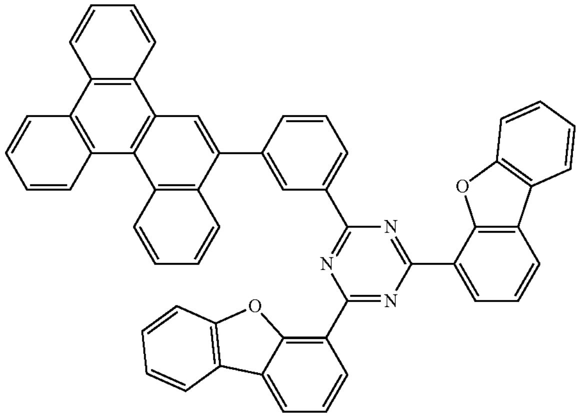
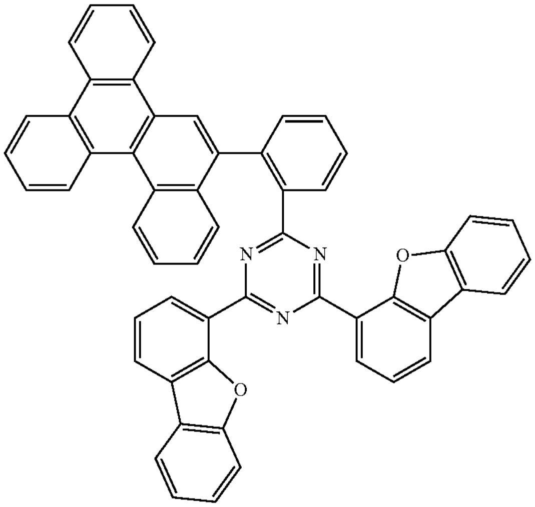
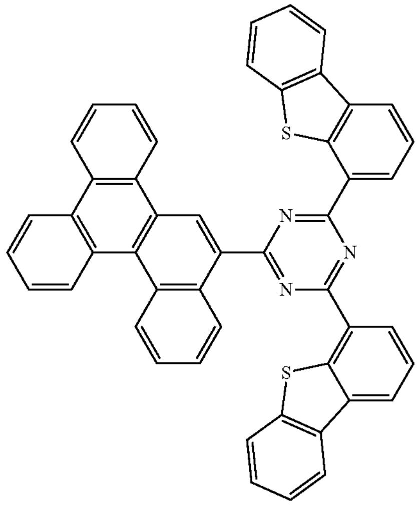

-continued
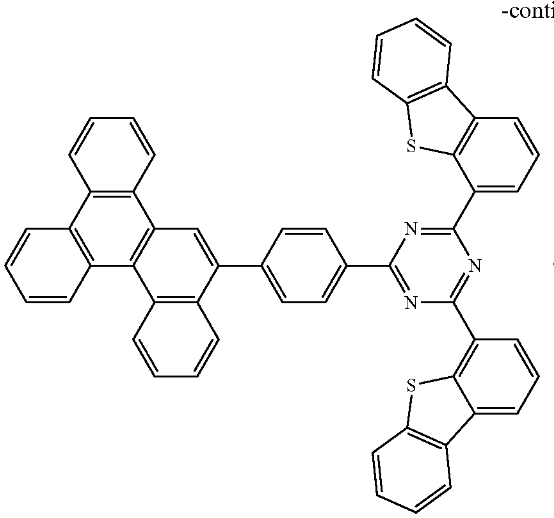
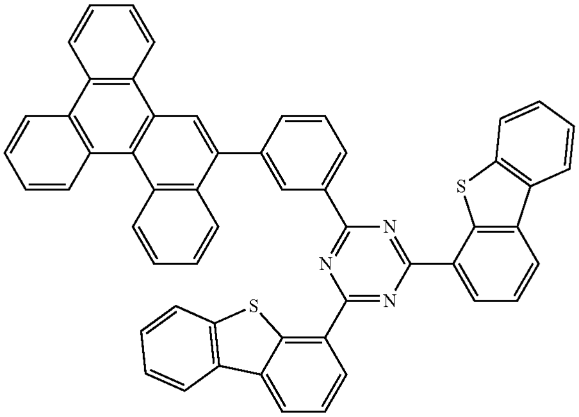
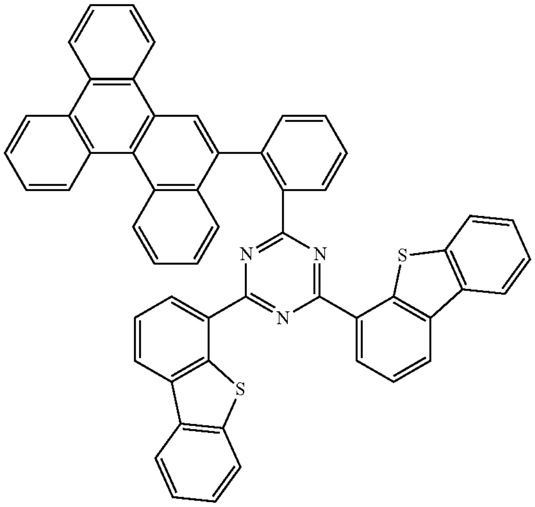
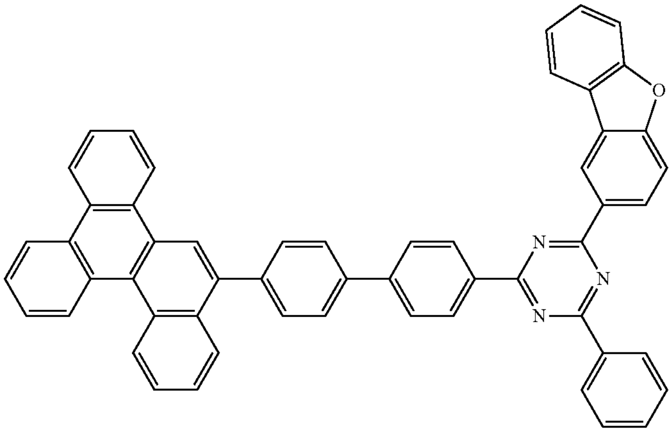

-continued
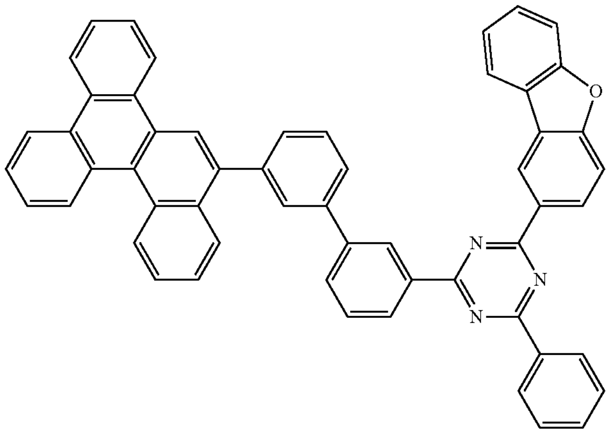
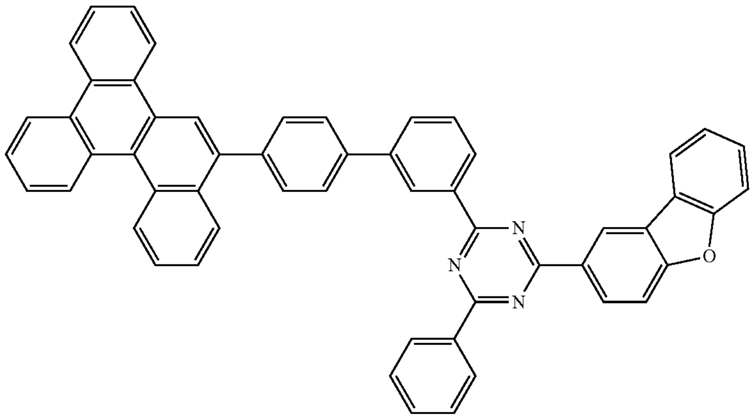
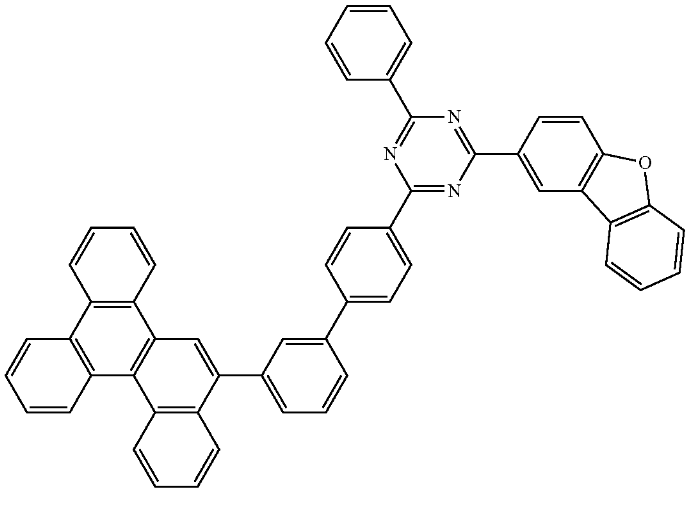

-continued
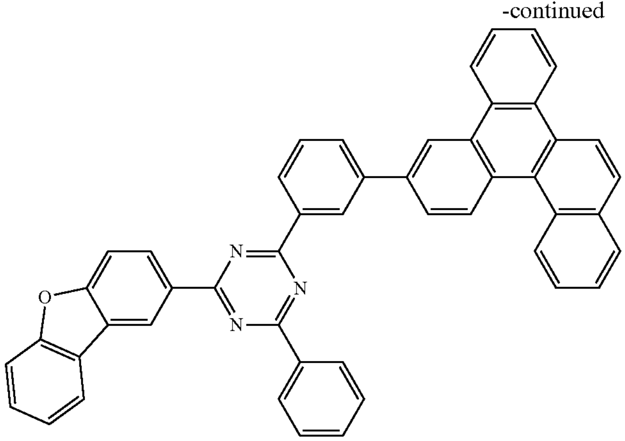
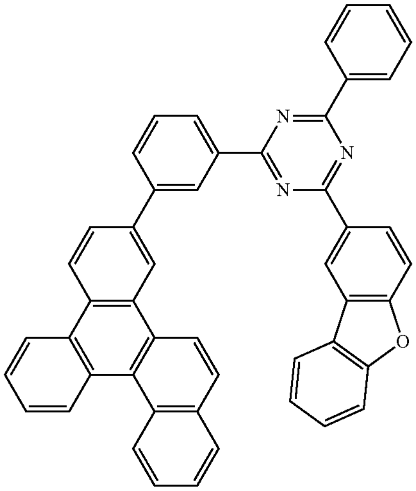
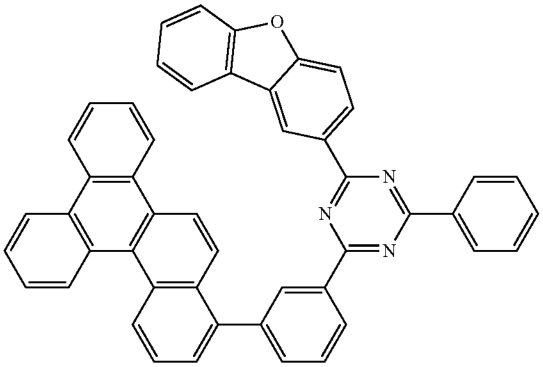
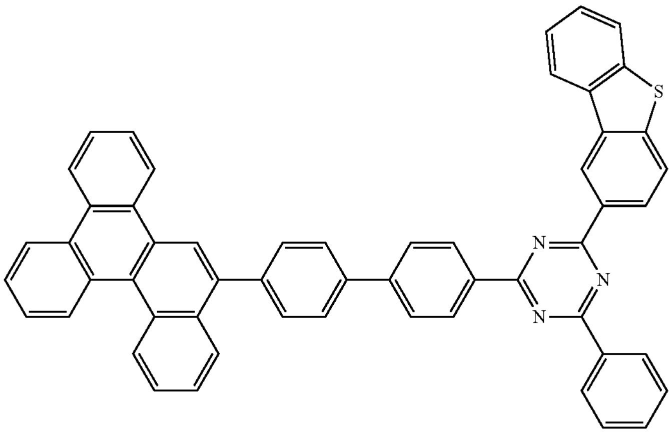

-continued
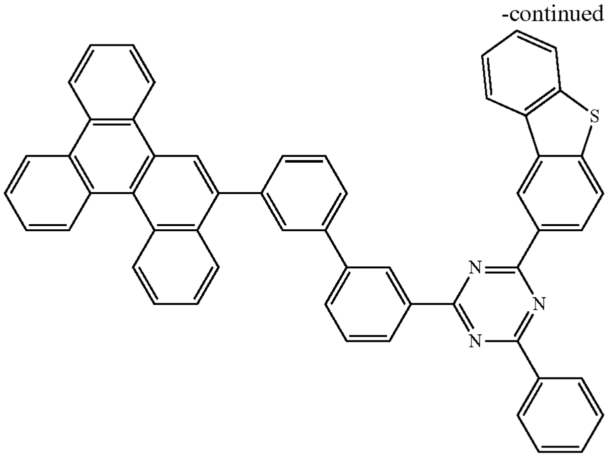
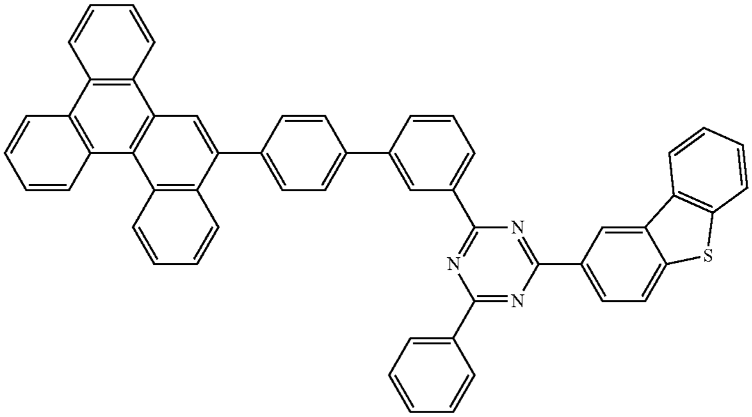
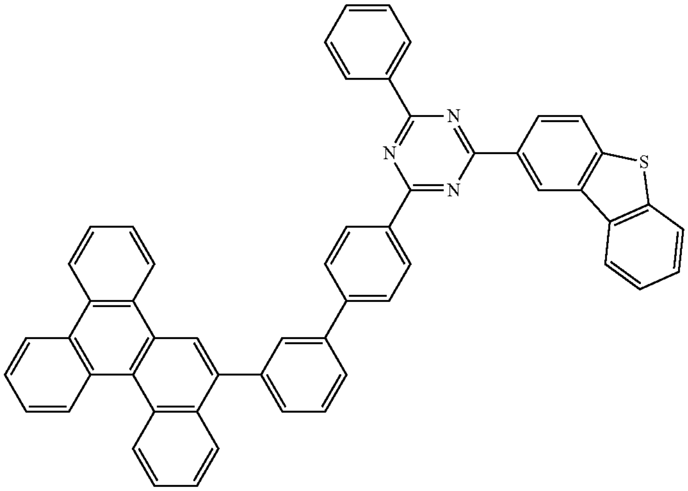

-continued
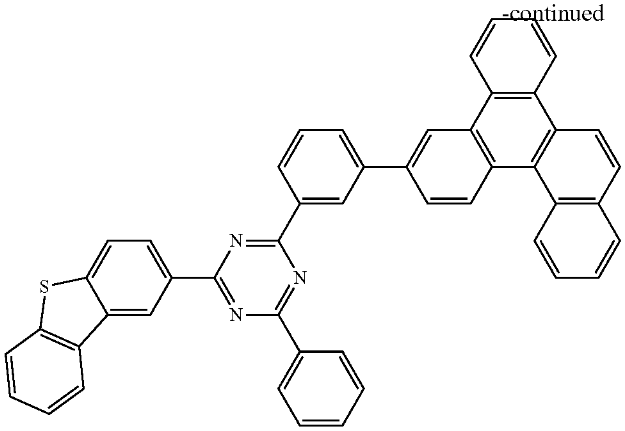
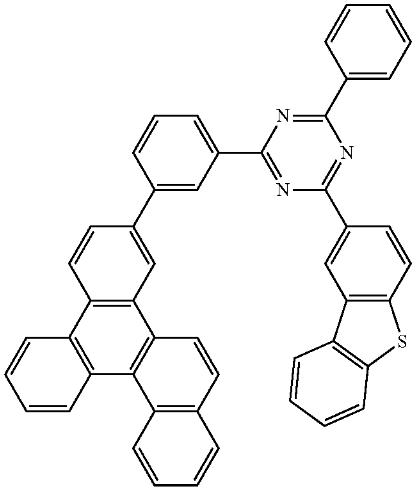
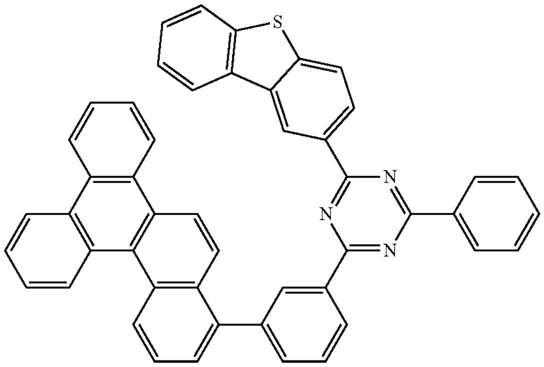
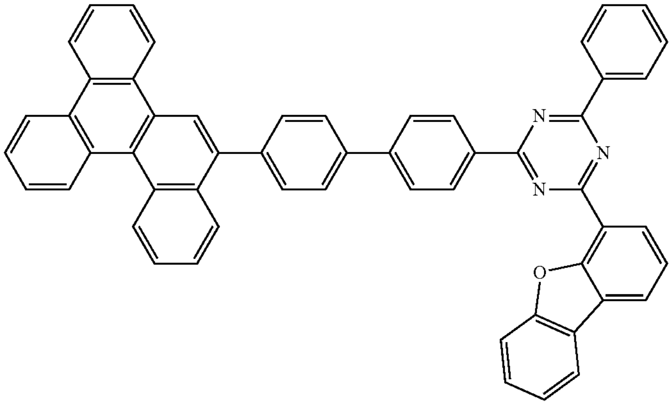
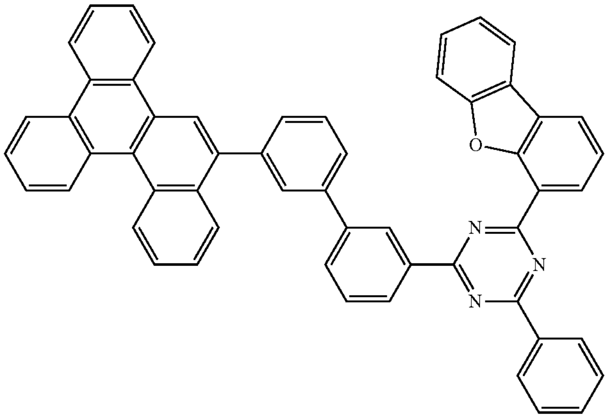

-continued
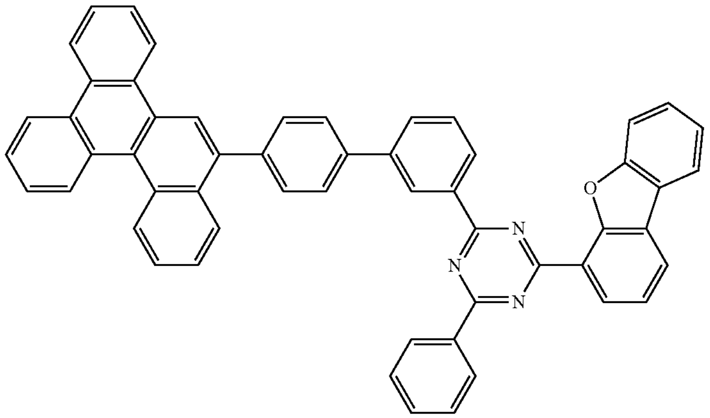
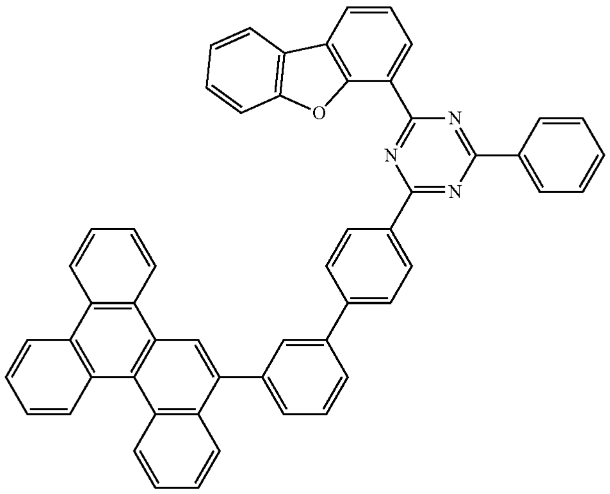
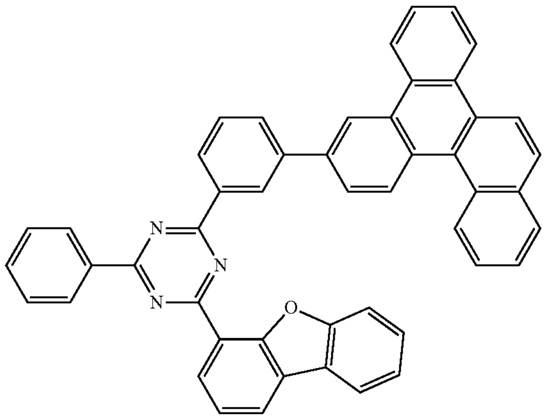
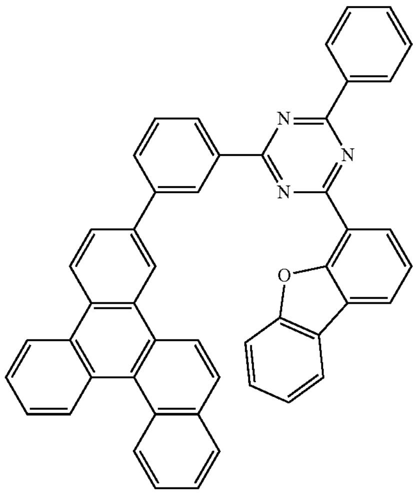
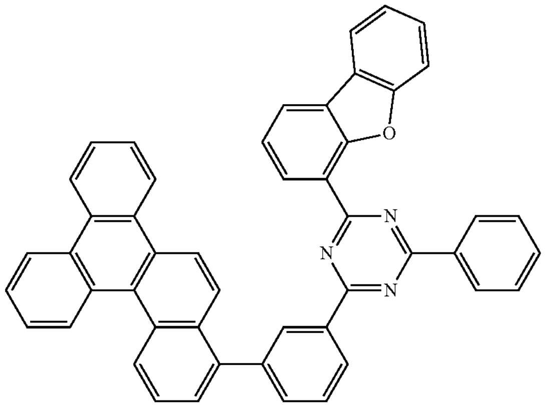

-continued
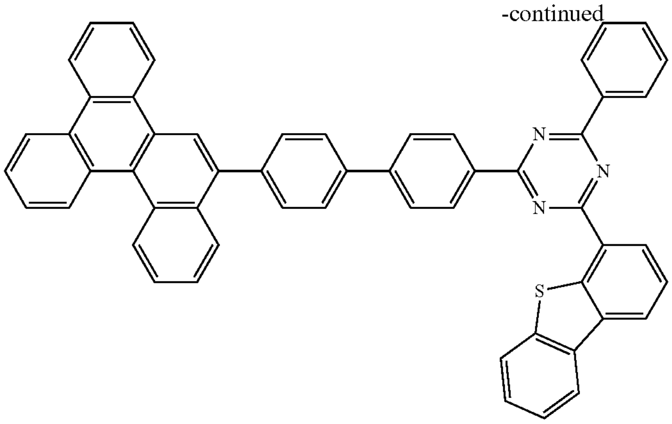
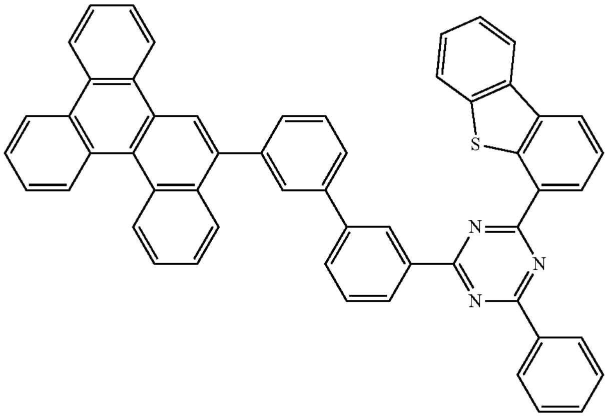
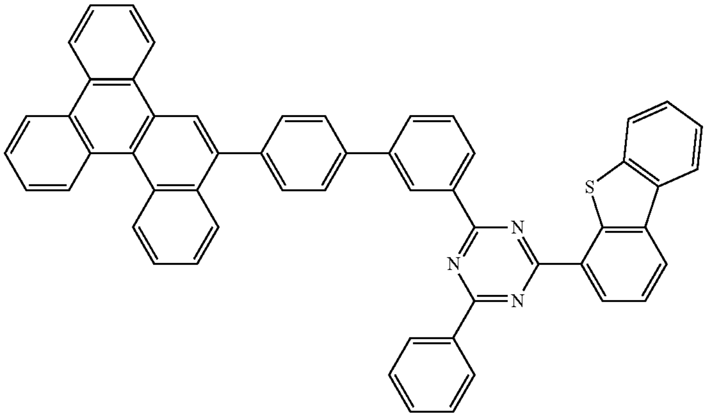
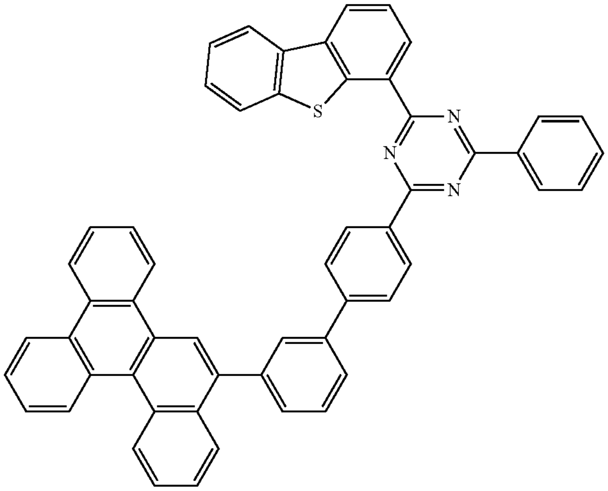
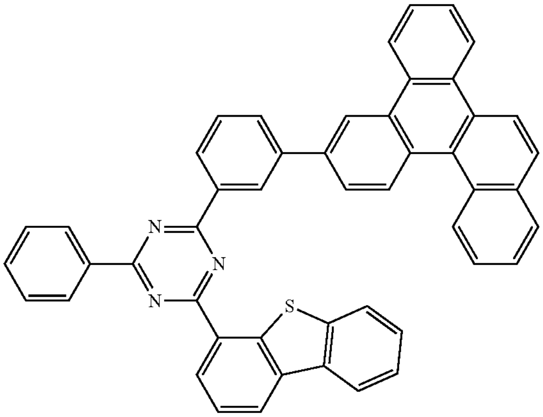

-continued
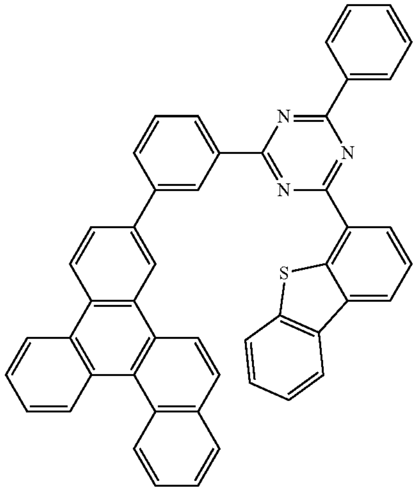
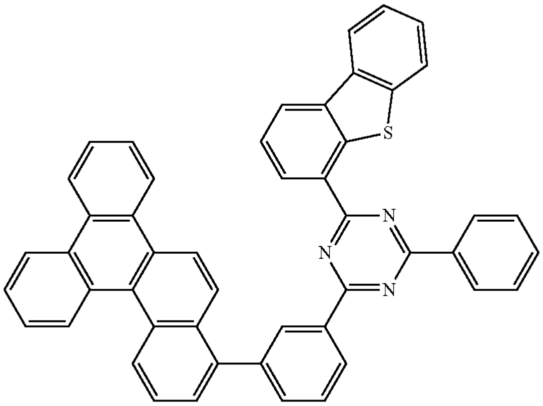
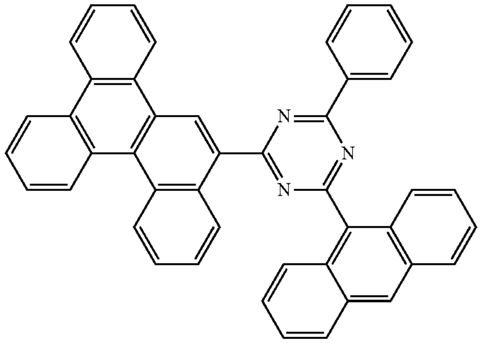
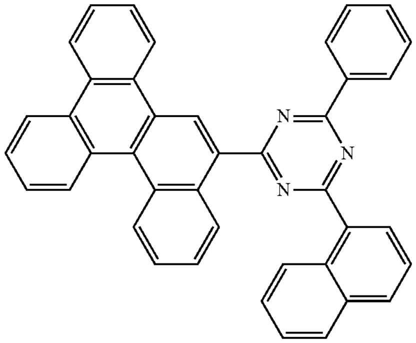
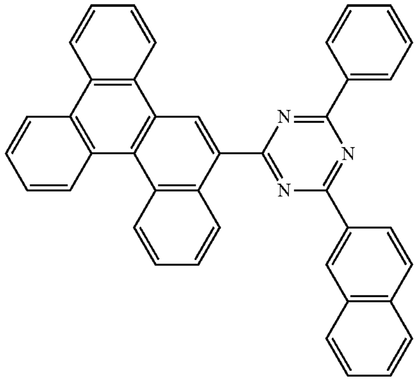
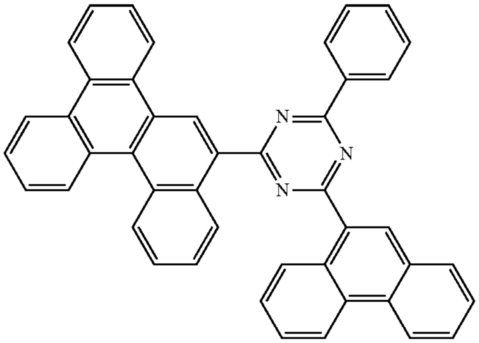
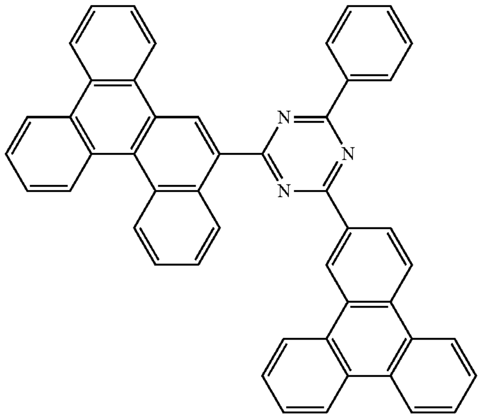
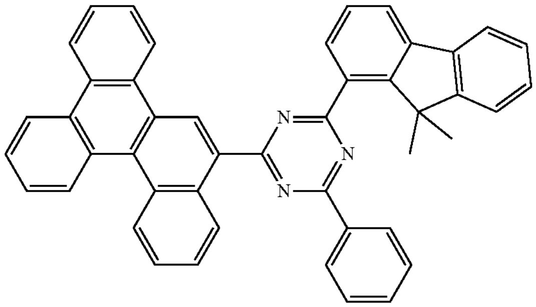

-continued
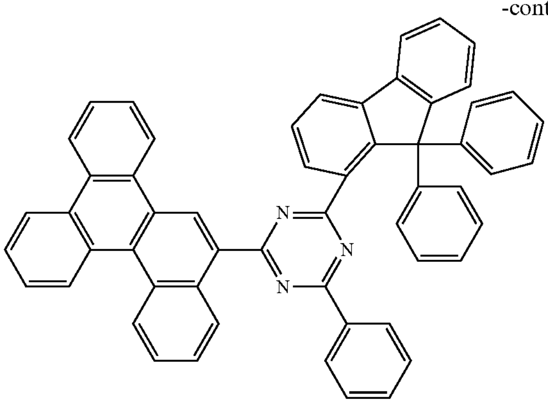
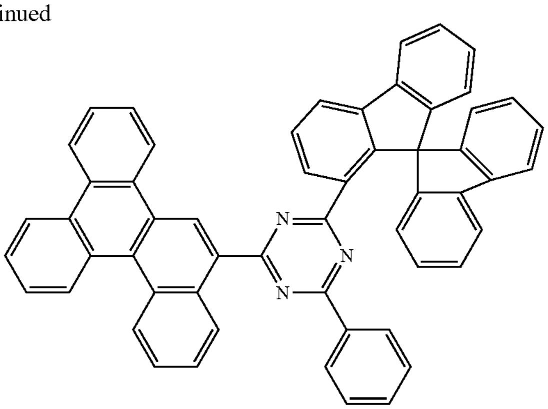
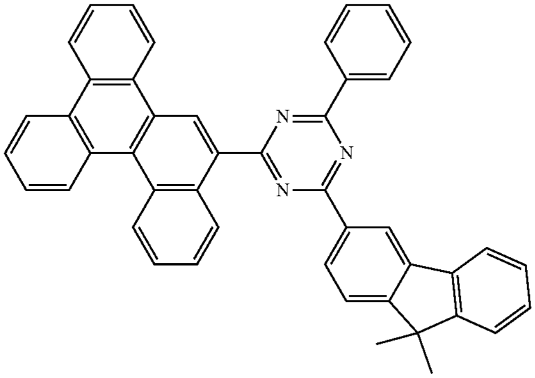
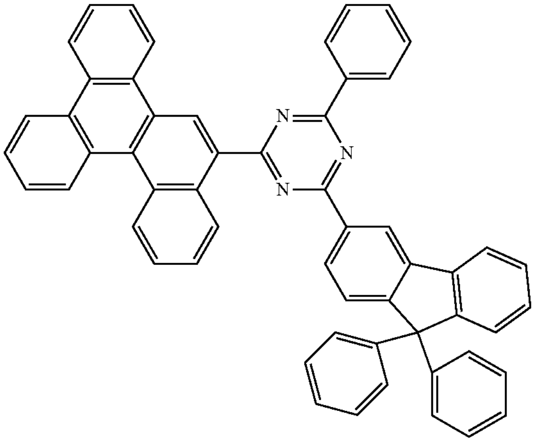
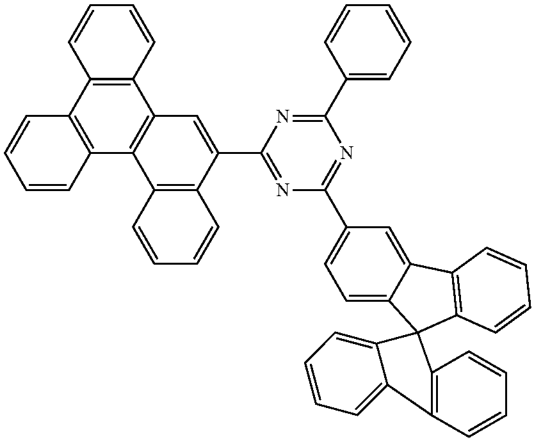
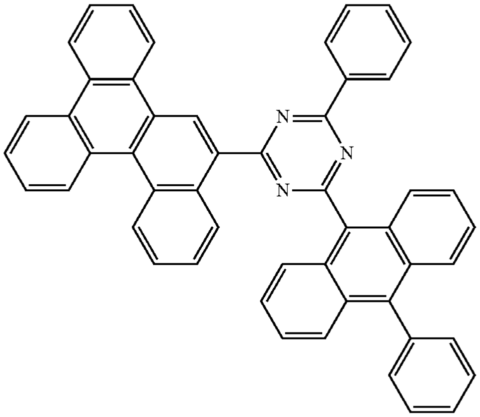
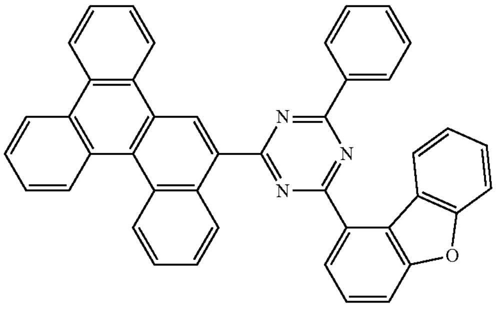
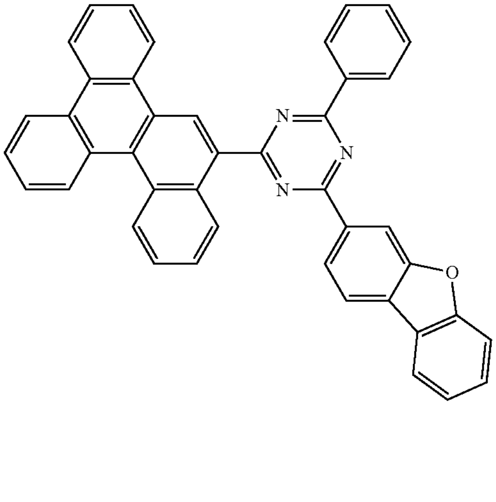

-continued
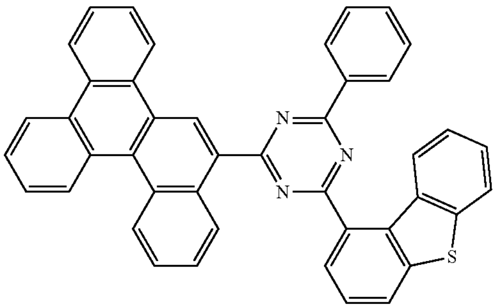
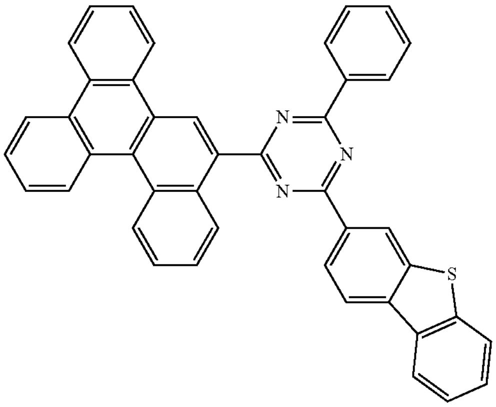
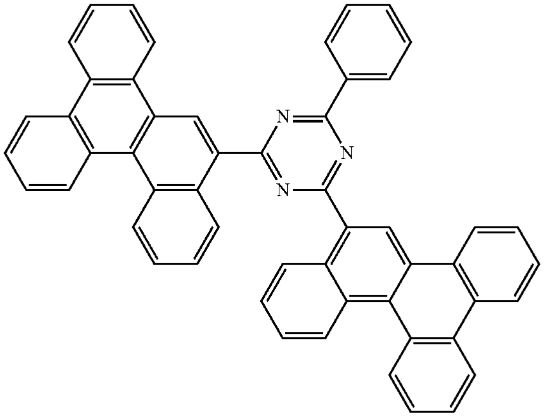
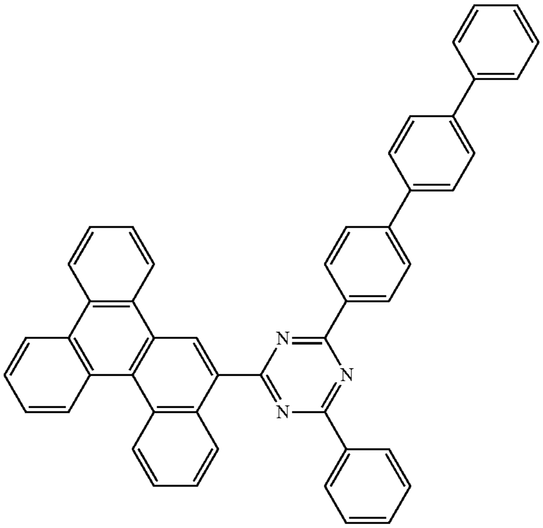
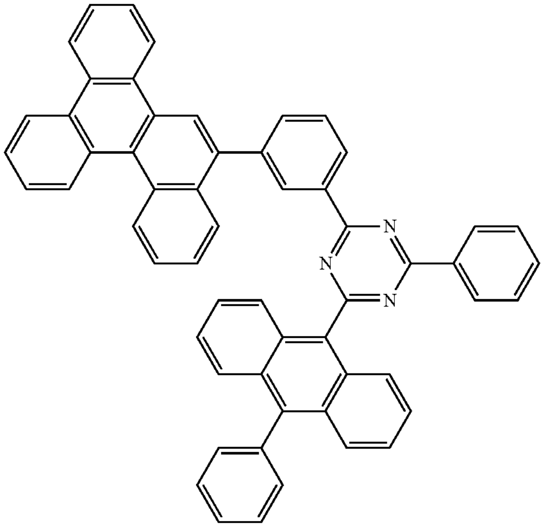
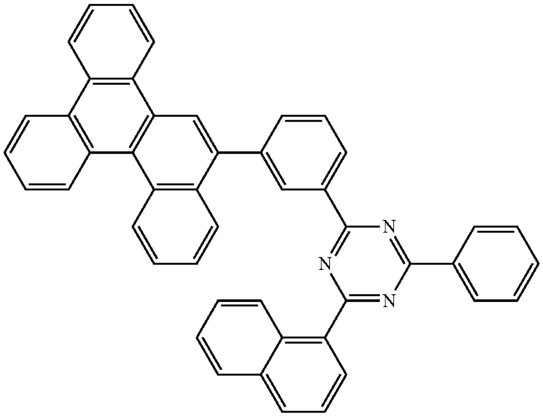

-continued
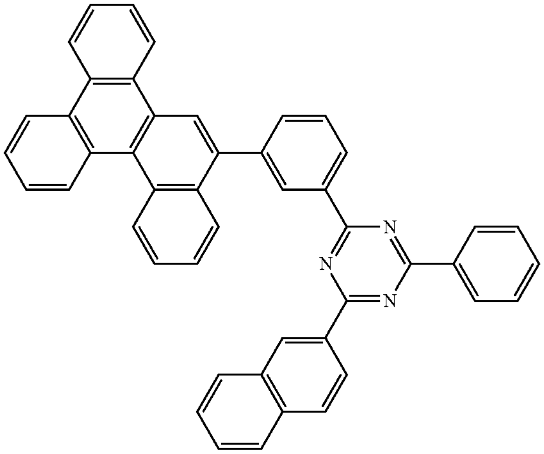
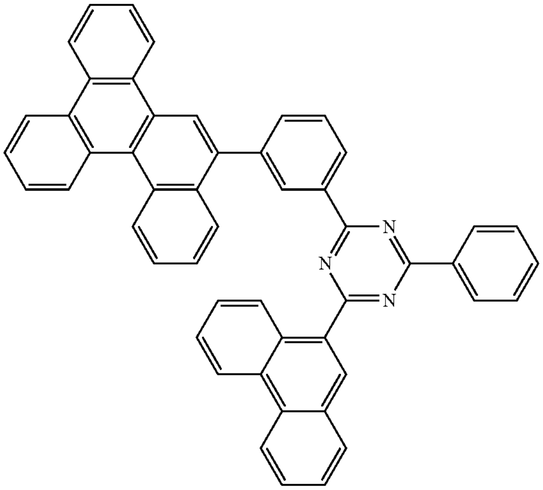
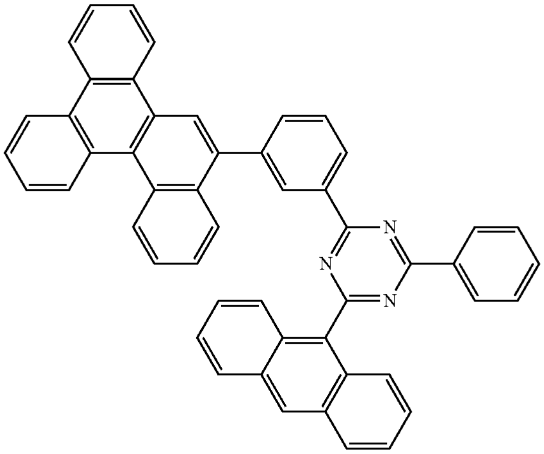
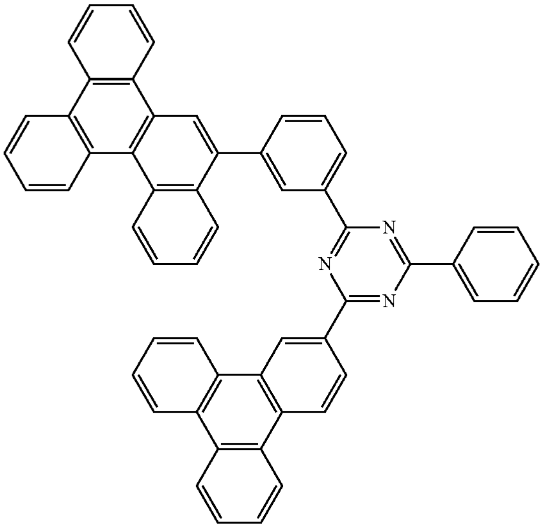
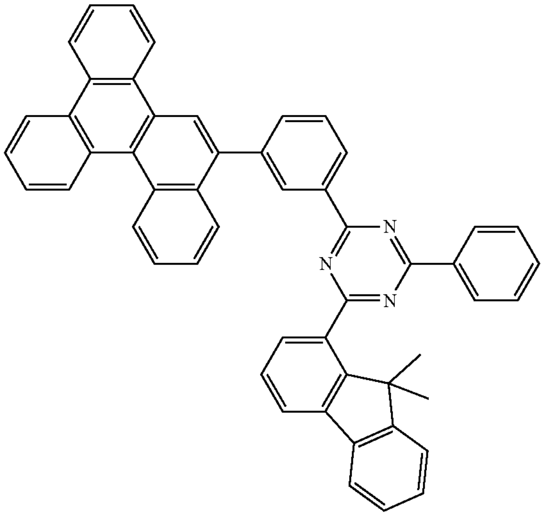
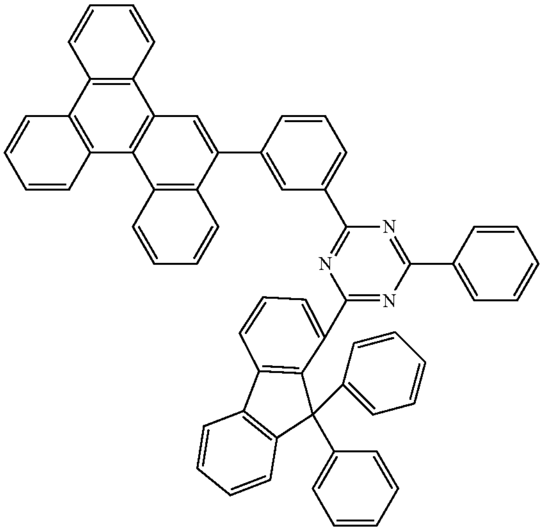

-continued
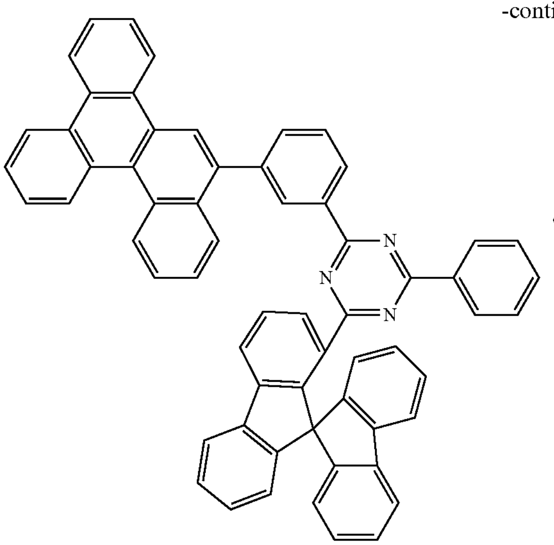
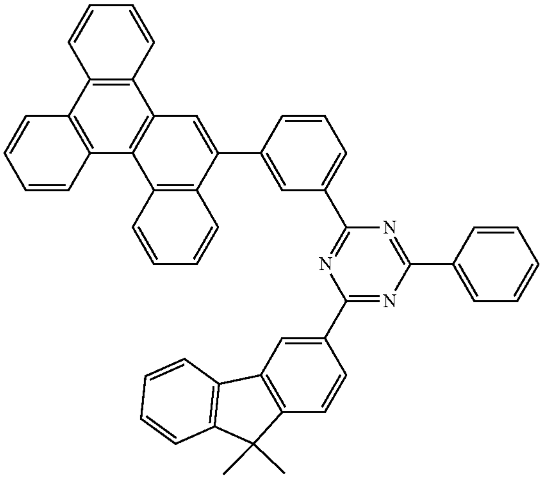
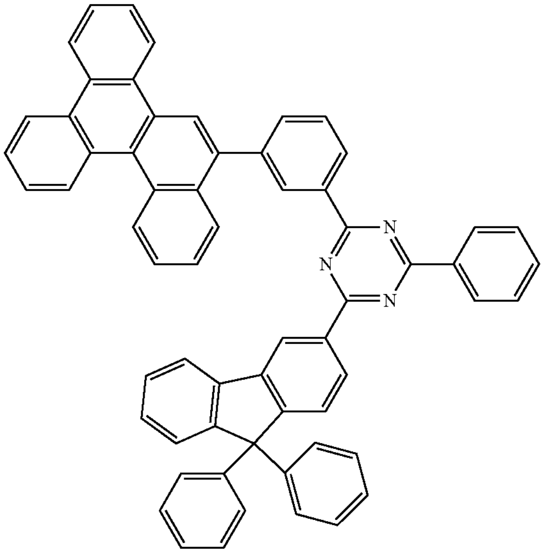
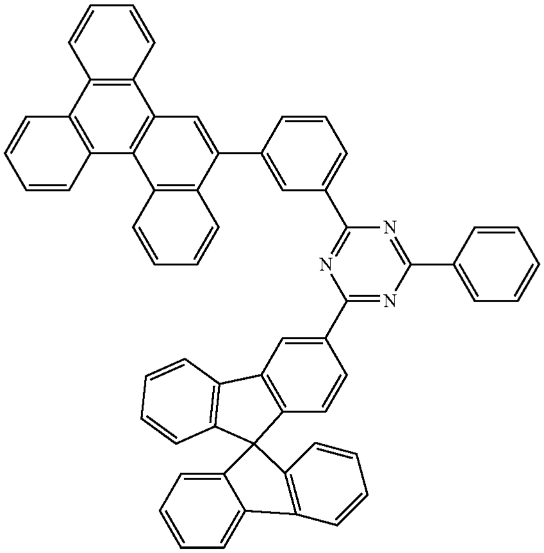
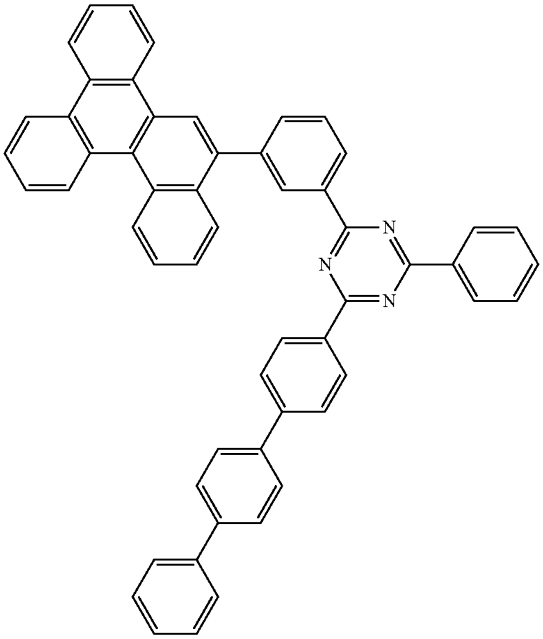

-continued
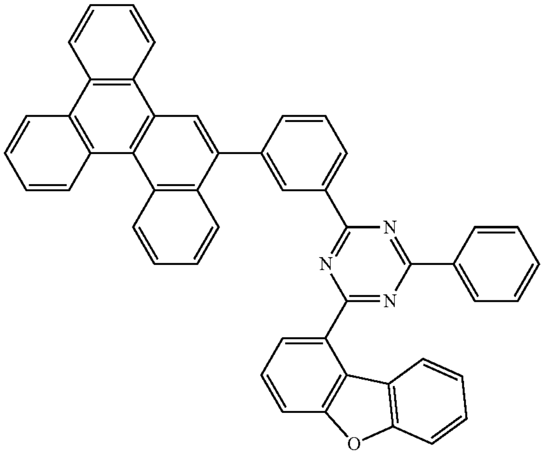
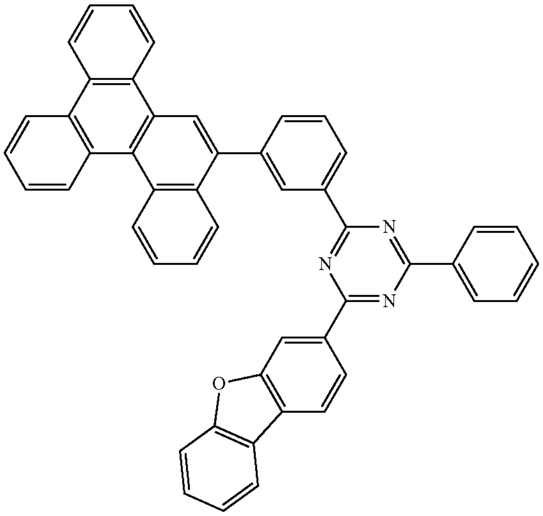
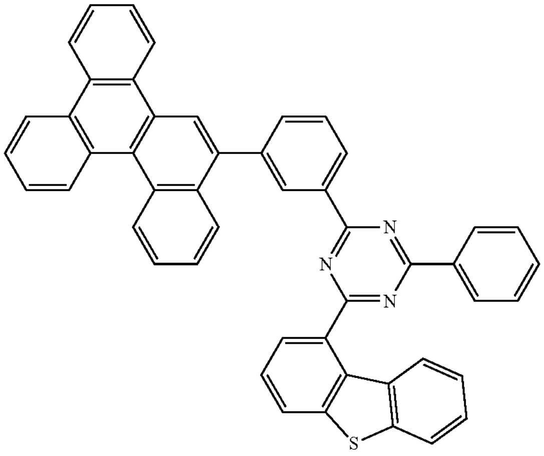
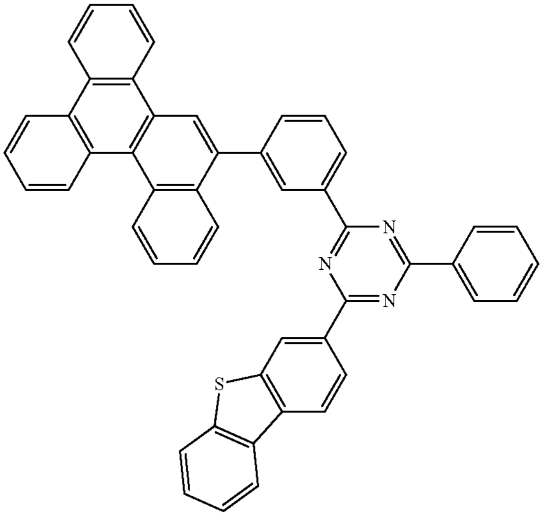
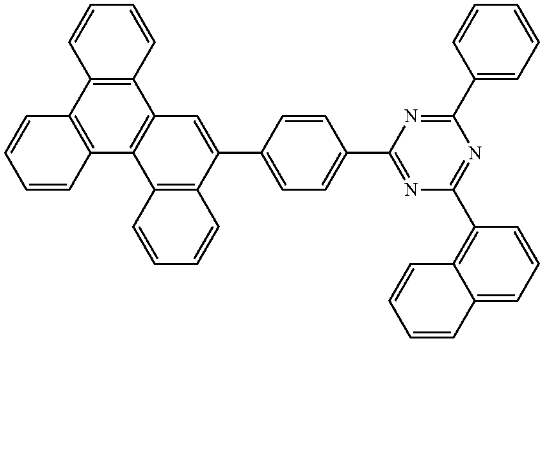
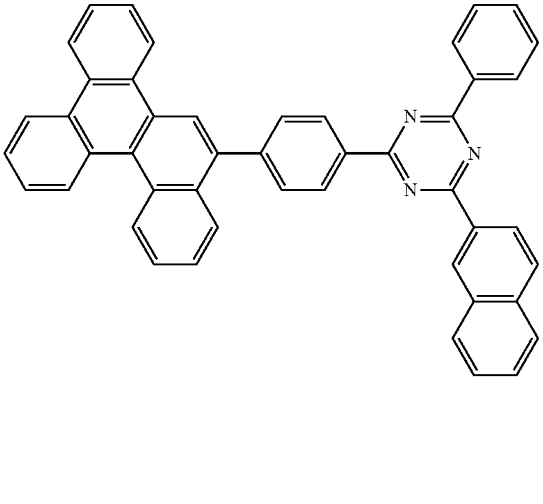

-continued
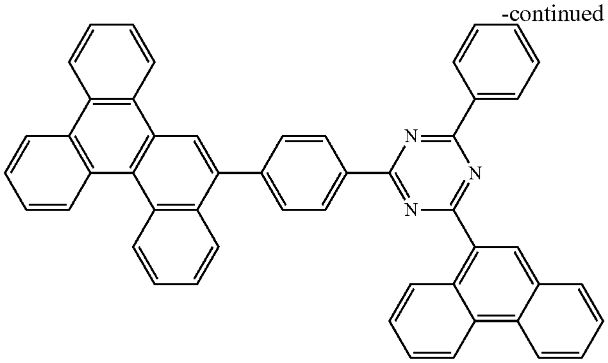
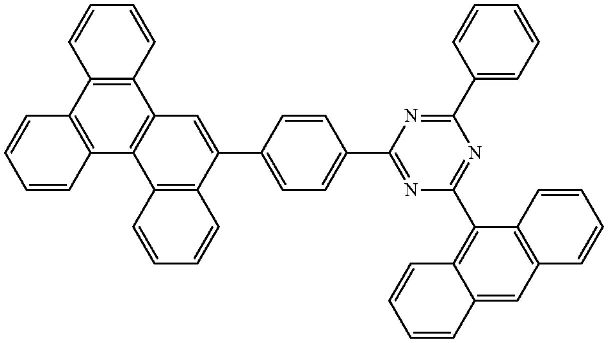
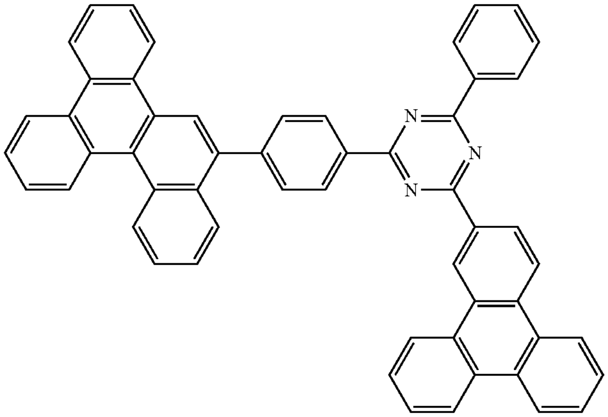
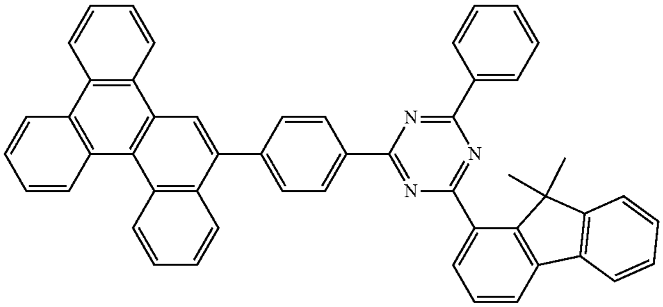

-continued
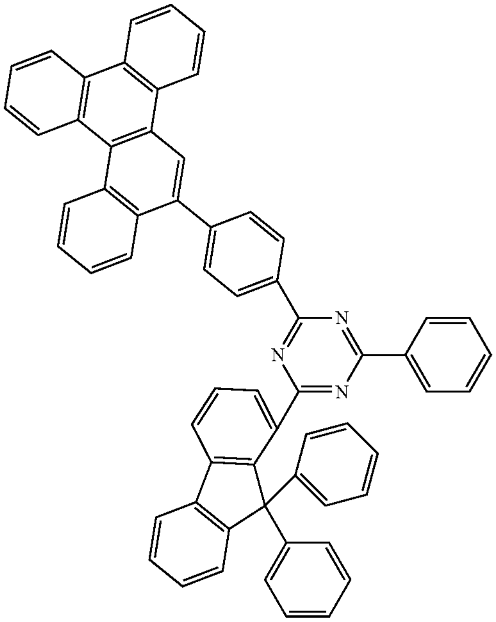
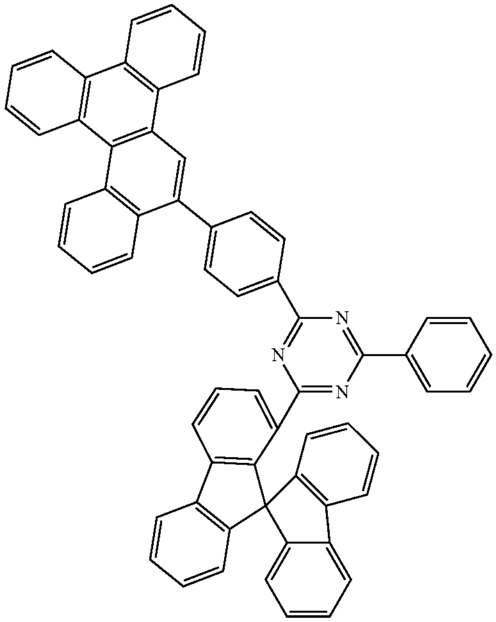
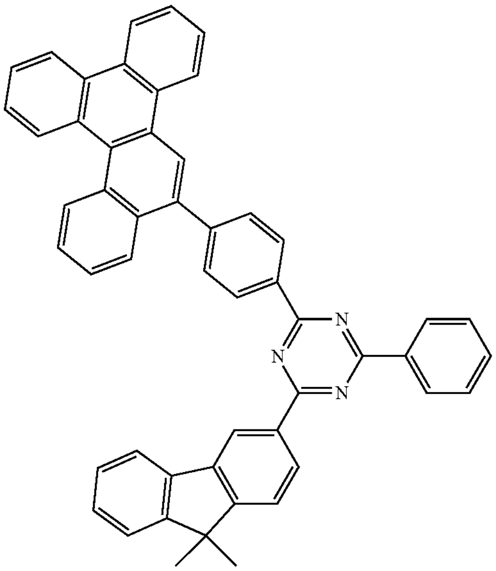
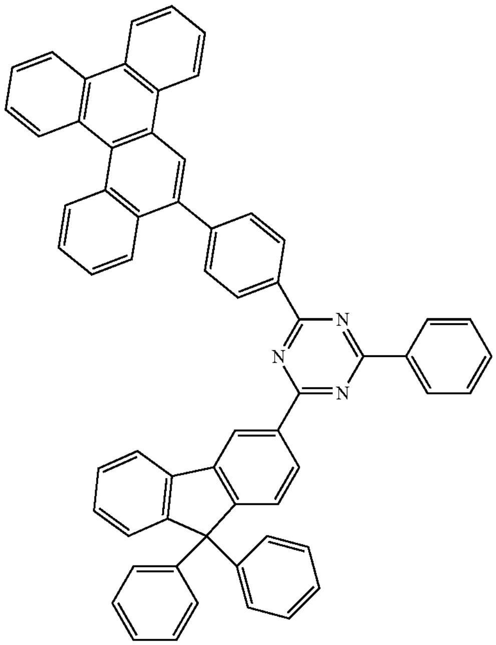

-continued
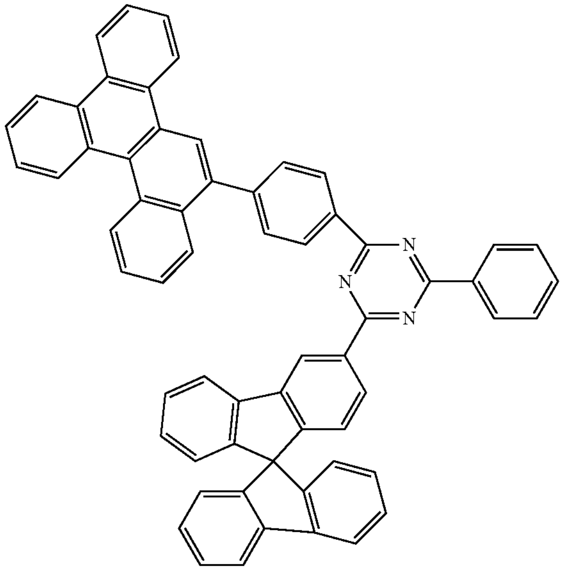
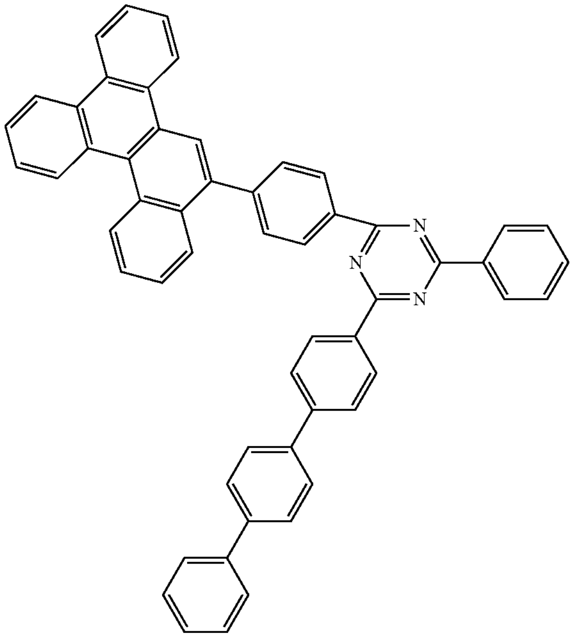
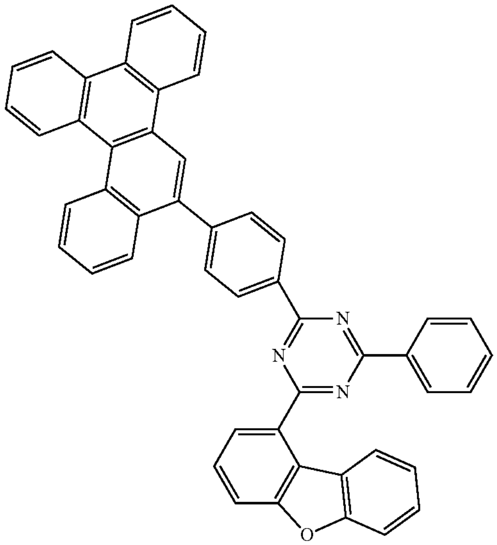
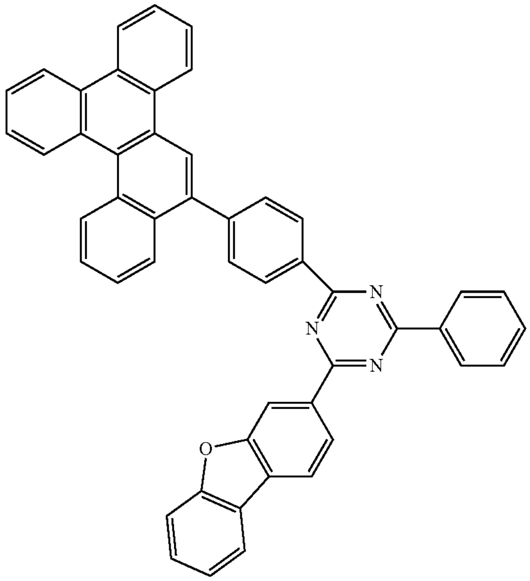

-continued
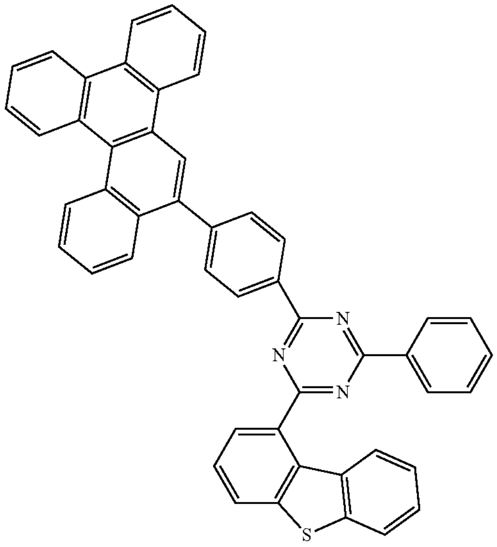
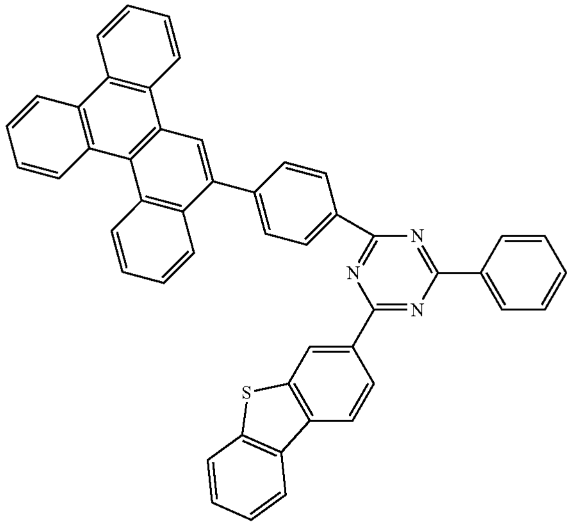
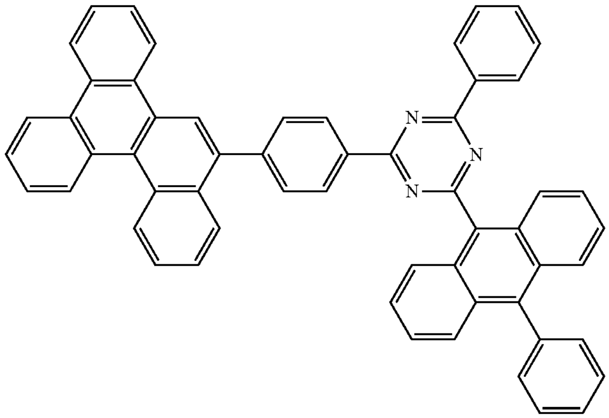
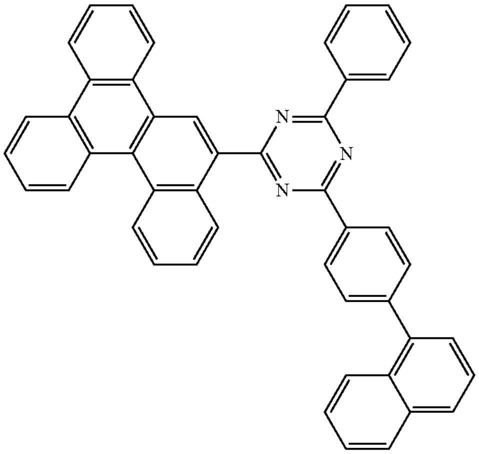
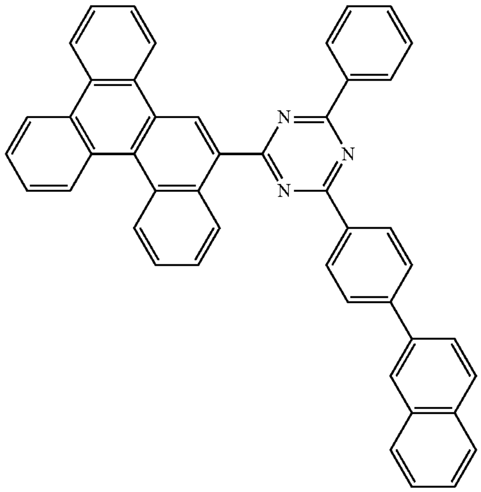
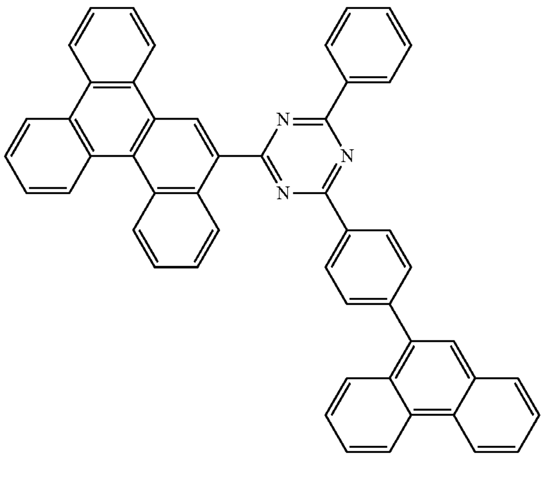

-continued
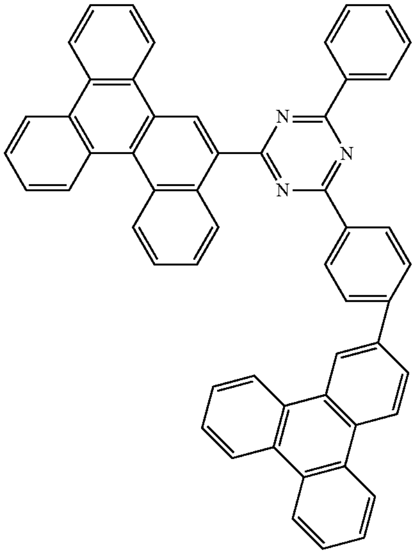
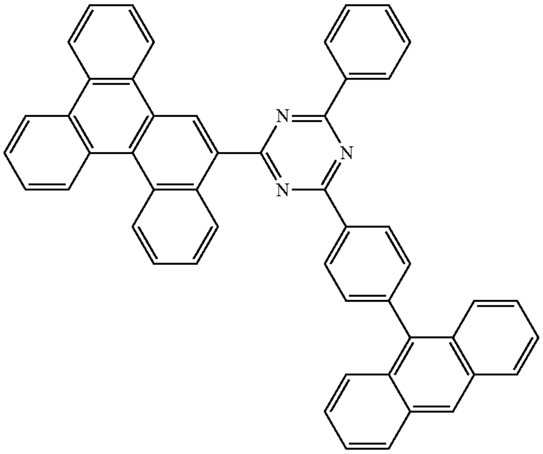
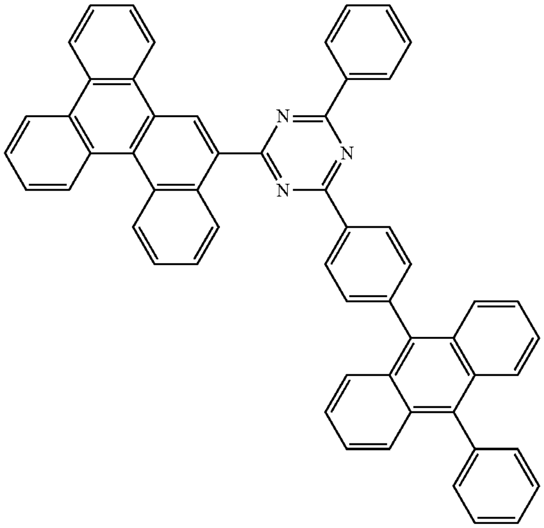
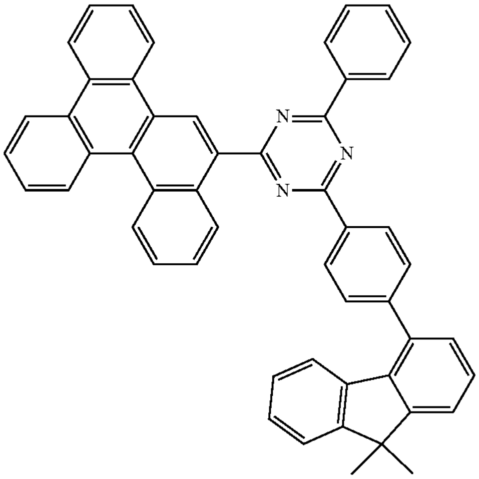
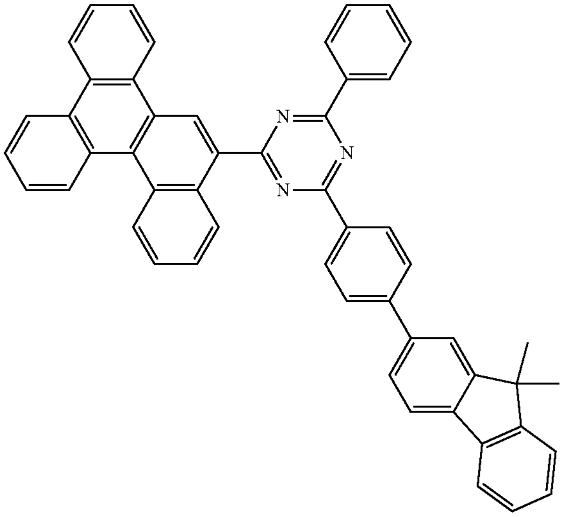

-continued
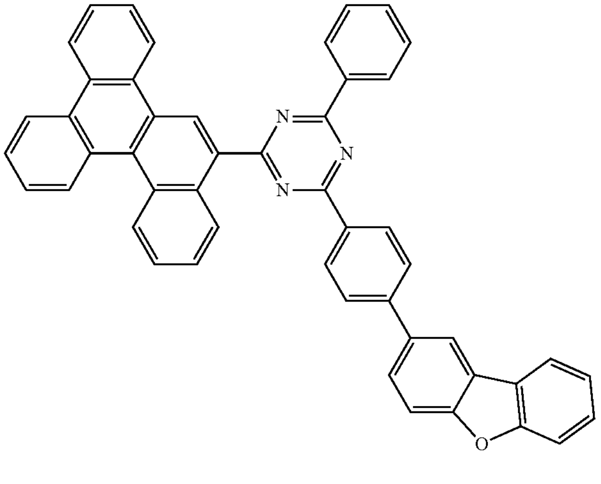
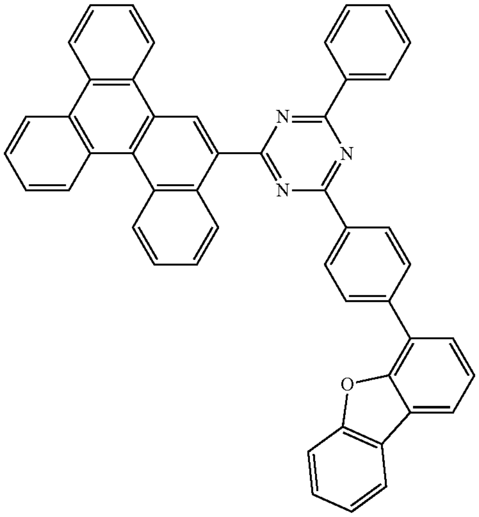
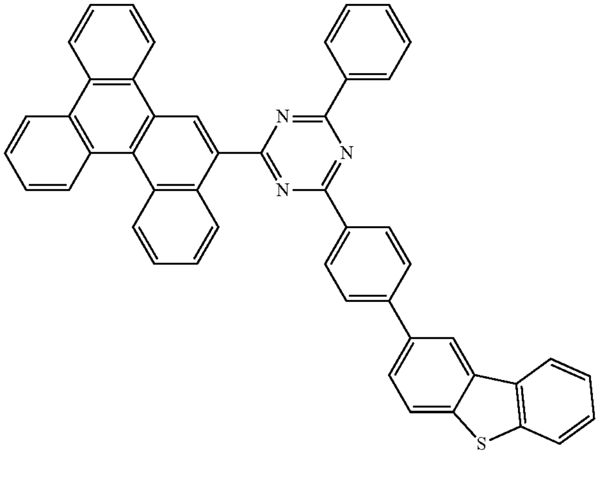
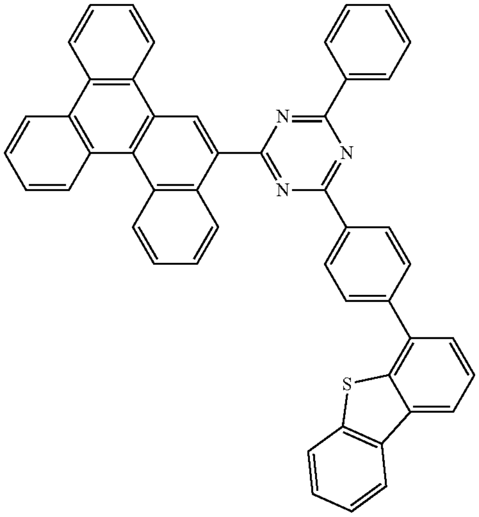
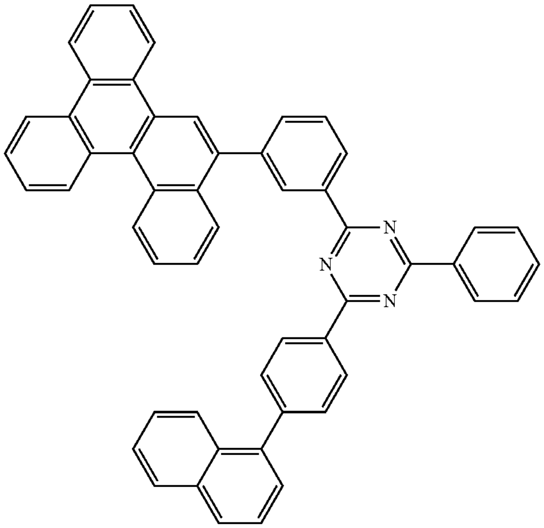
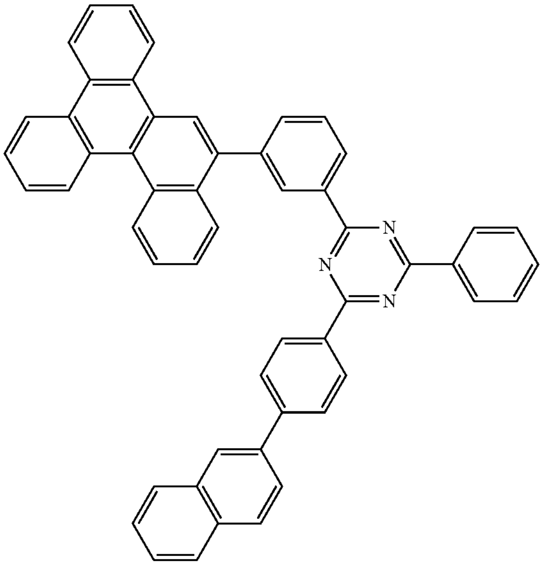

-continued
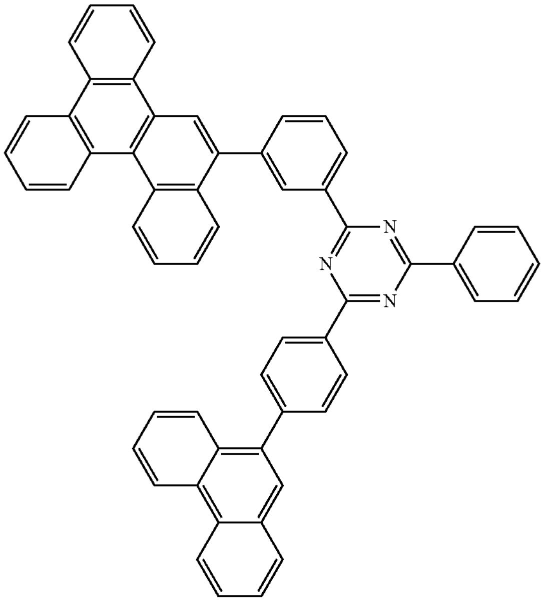
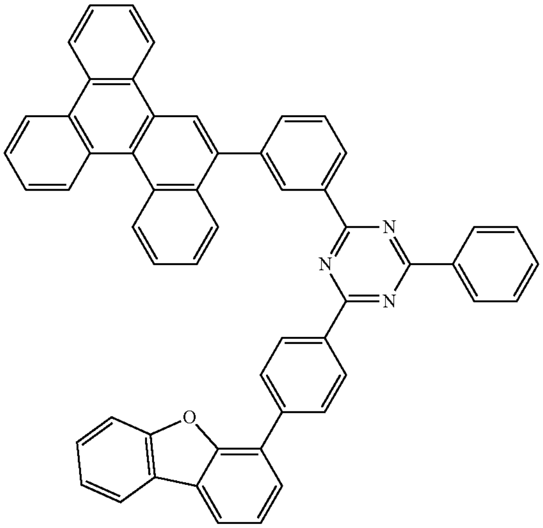
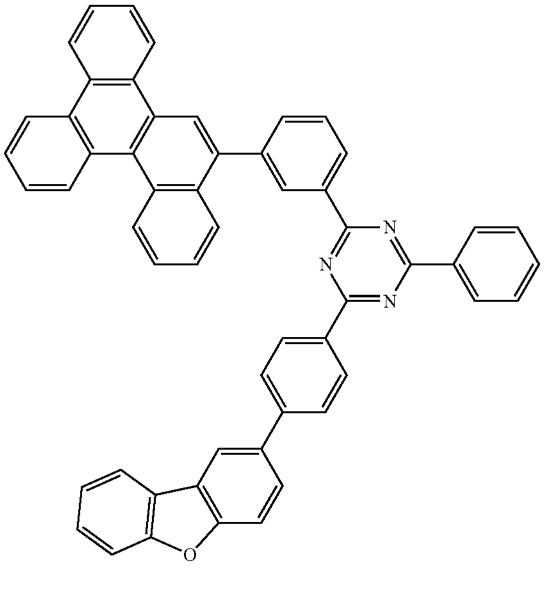
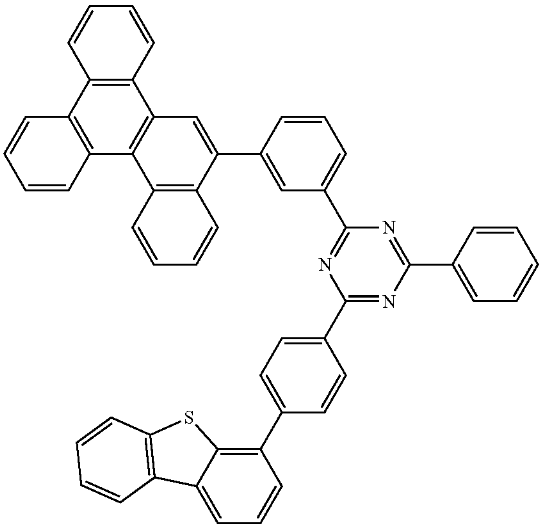

-continued
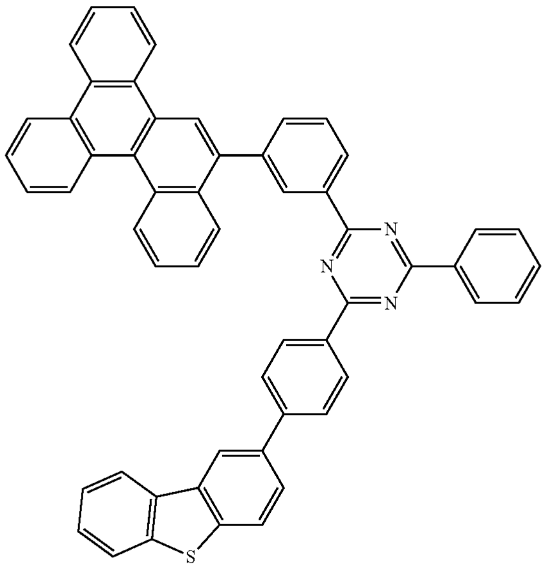
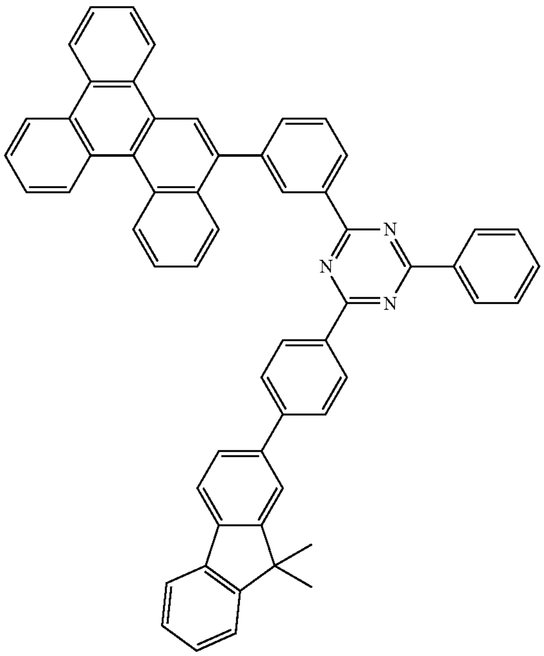
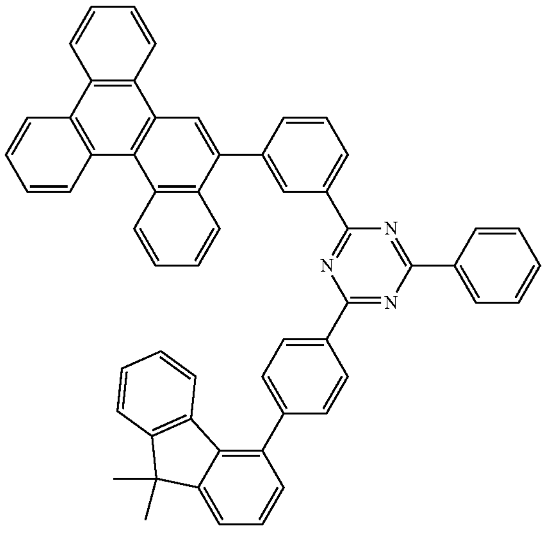
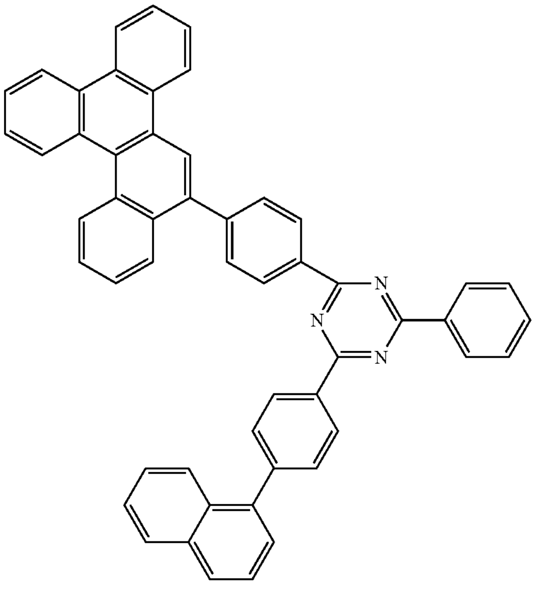

-continued
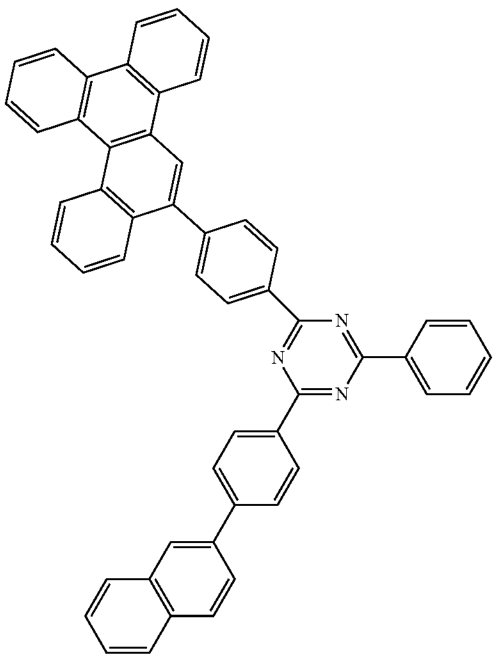
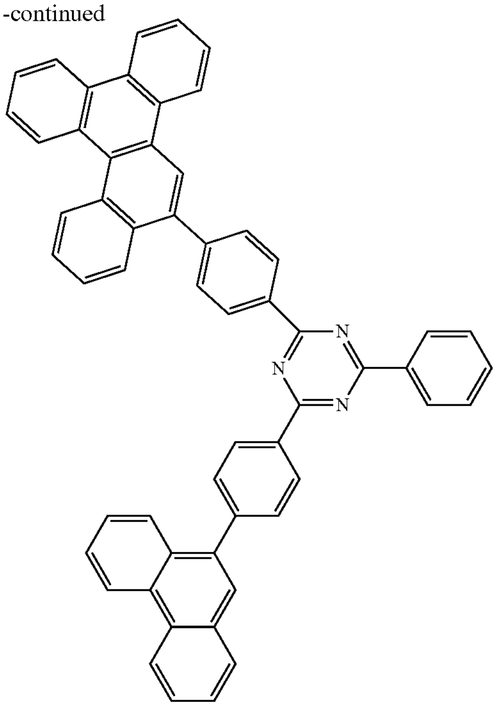
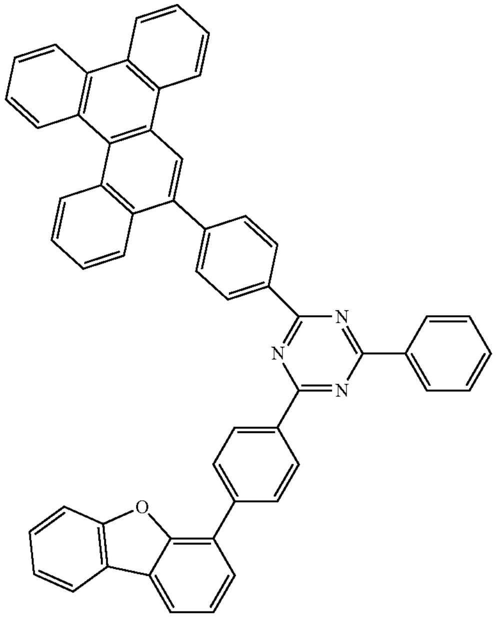
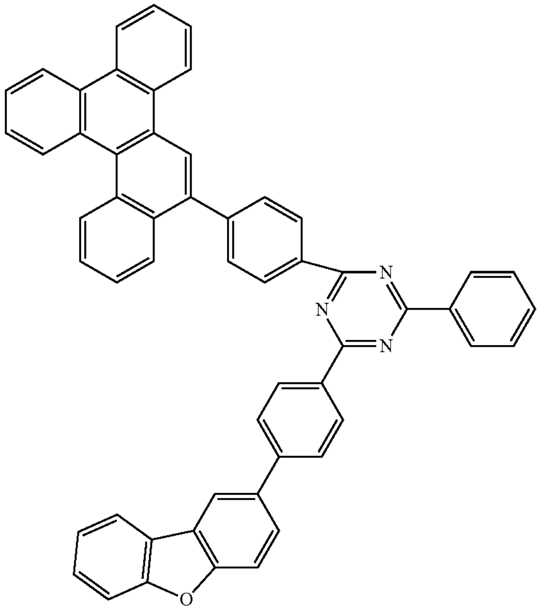

-continued
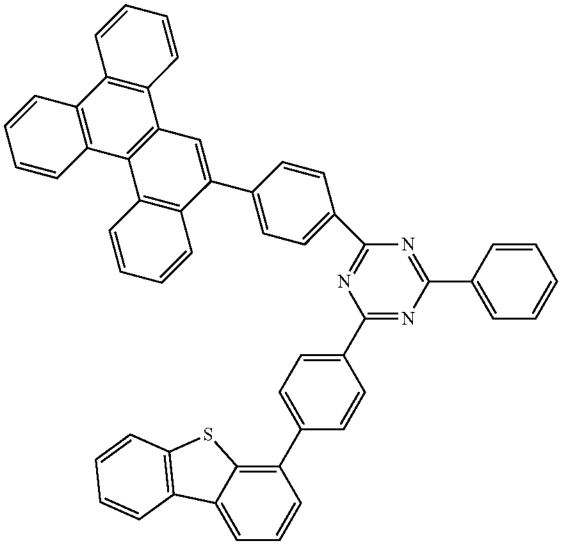
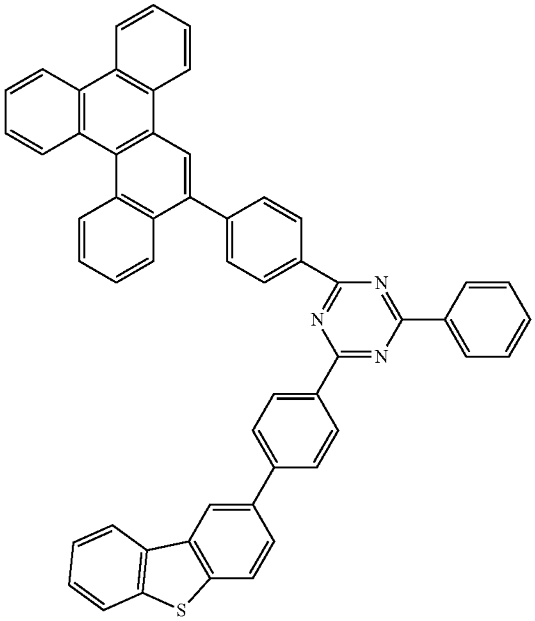
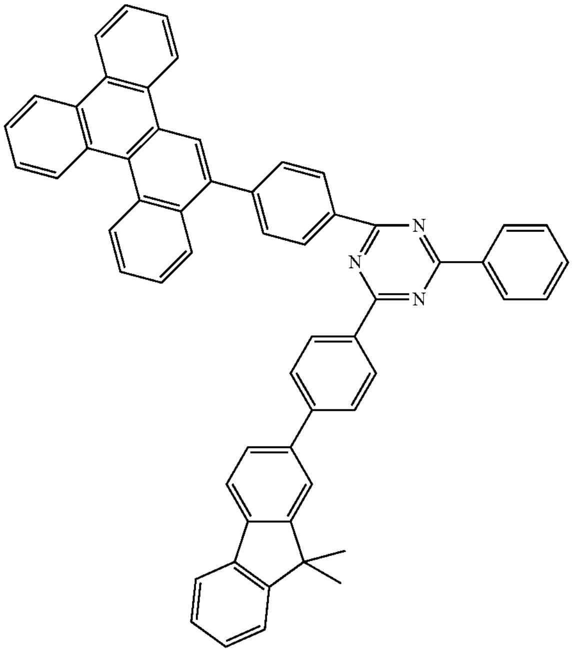
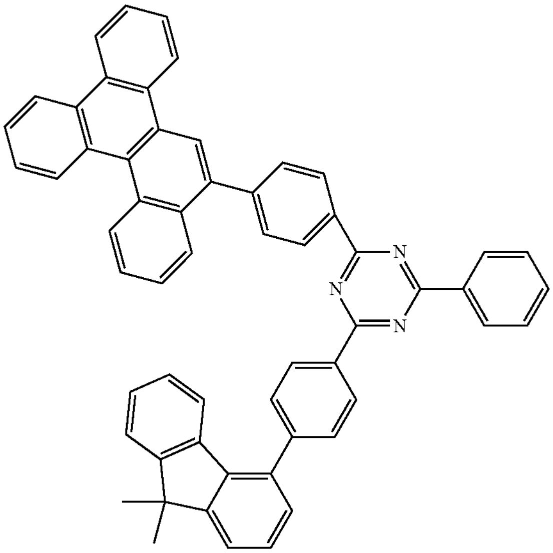
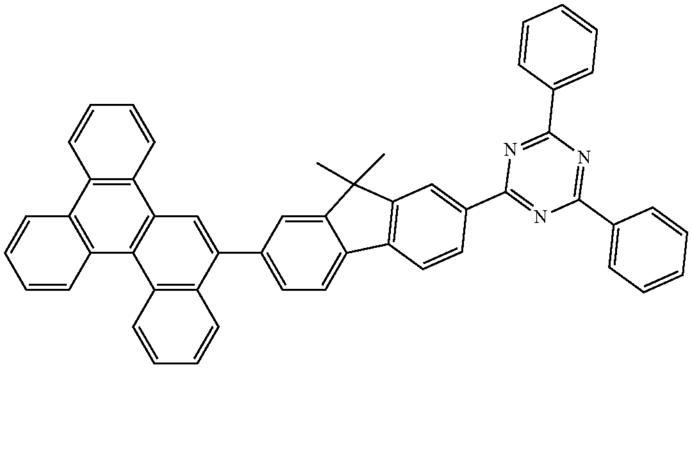

-continued
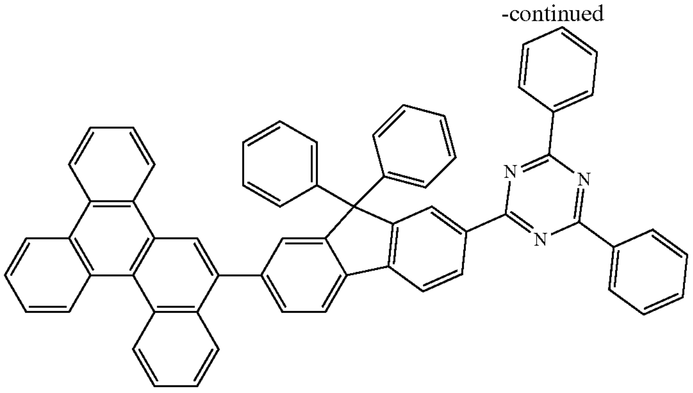
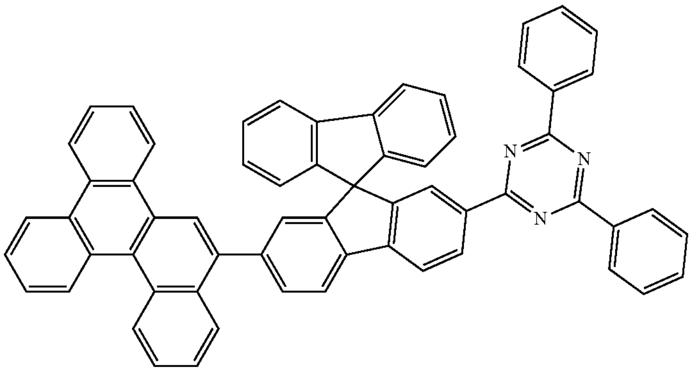
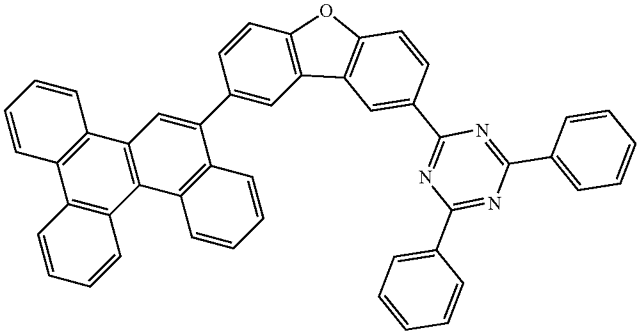
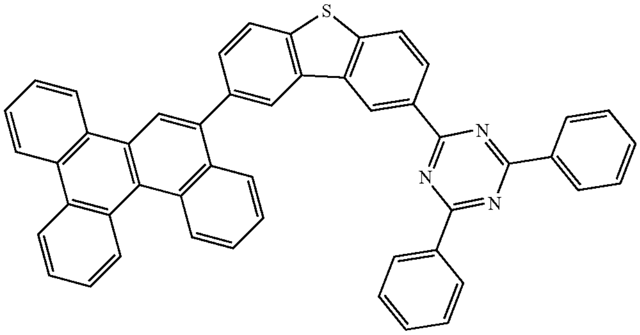
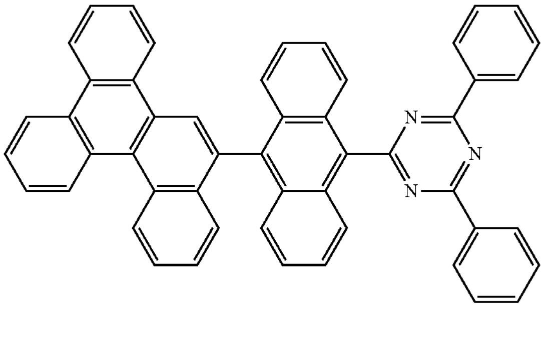
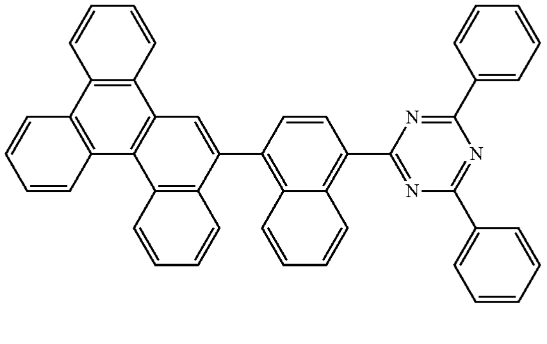

-continued
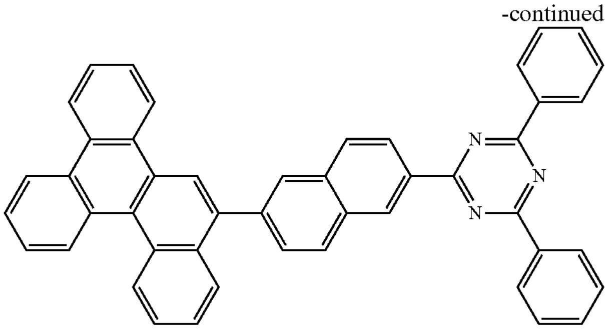
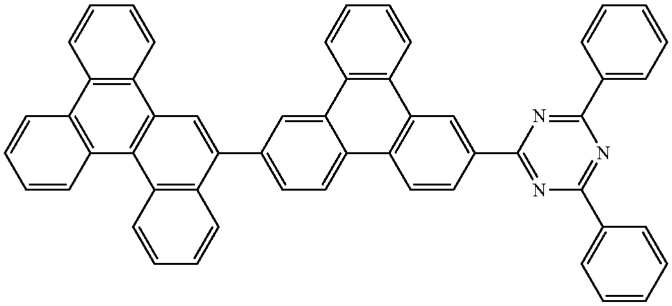
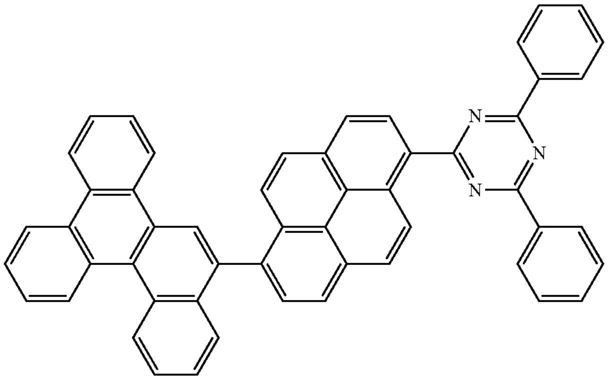
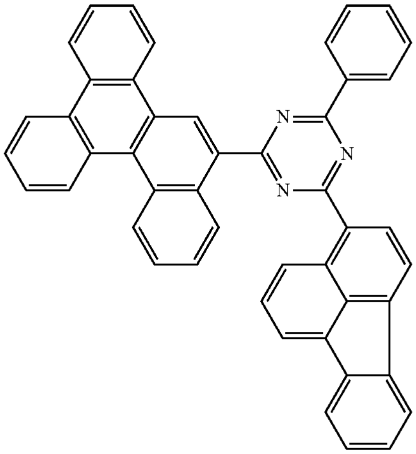
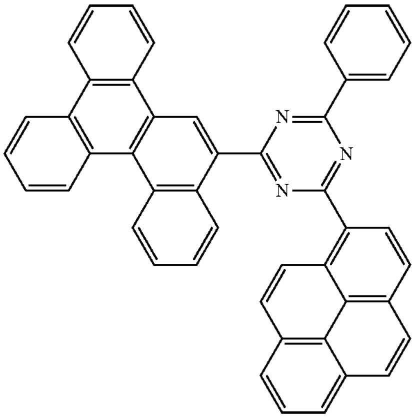

-continued
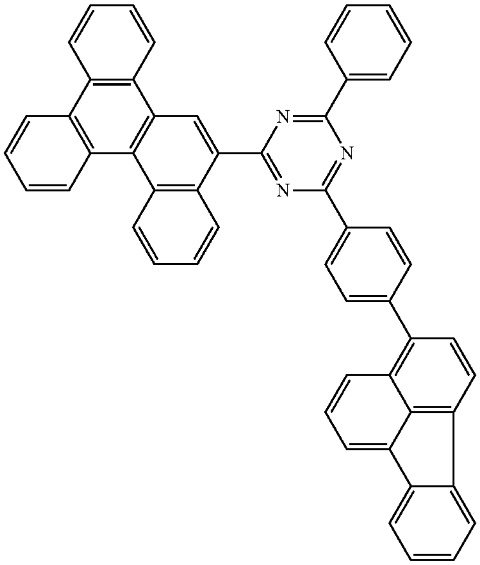
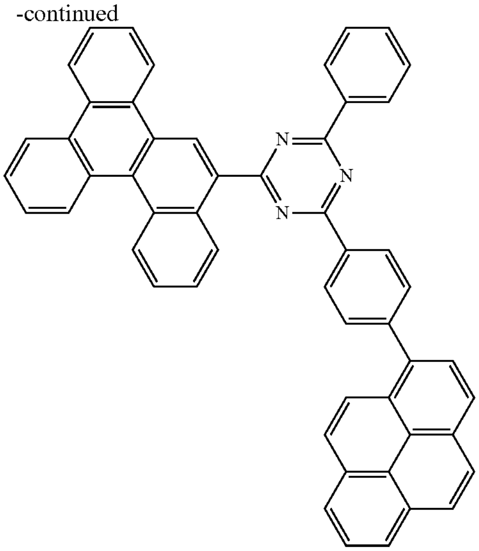
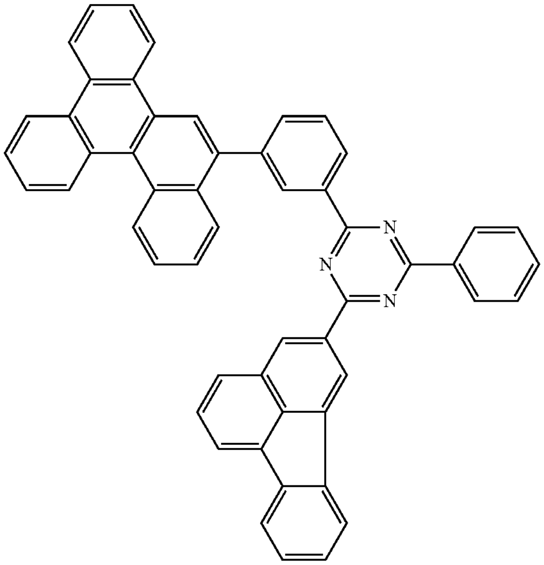
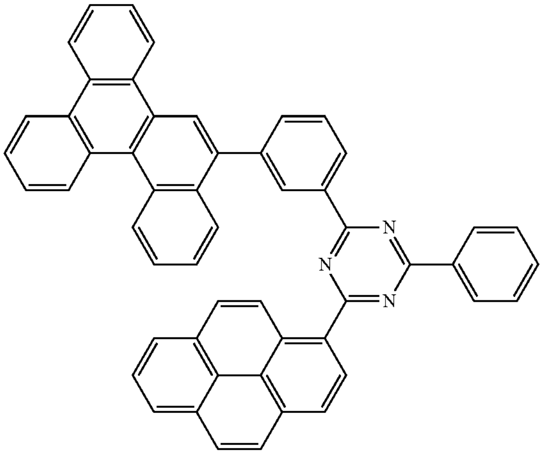
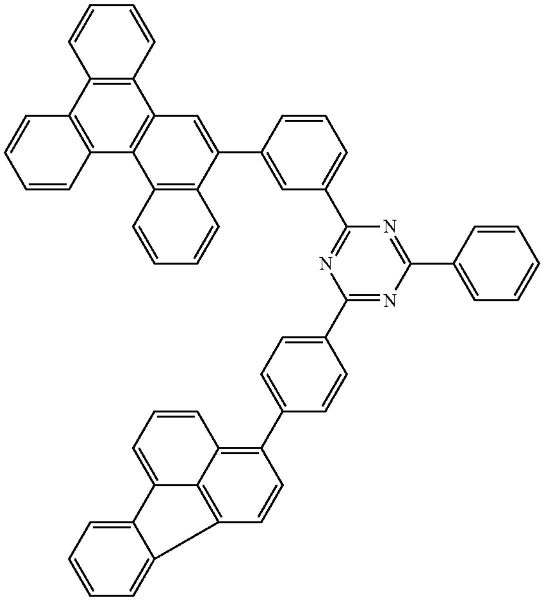
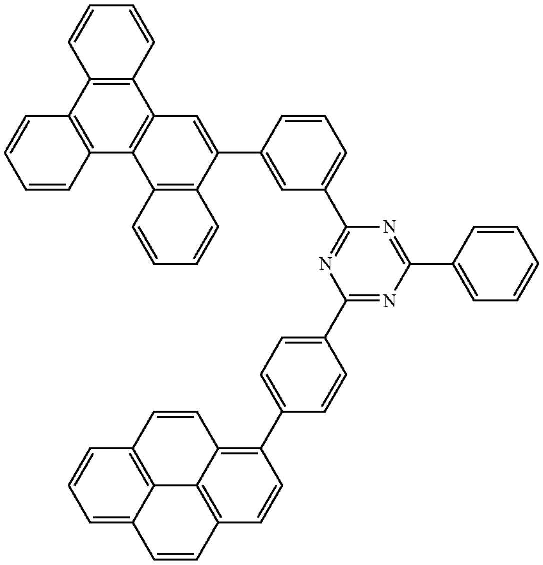

-continued
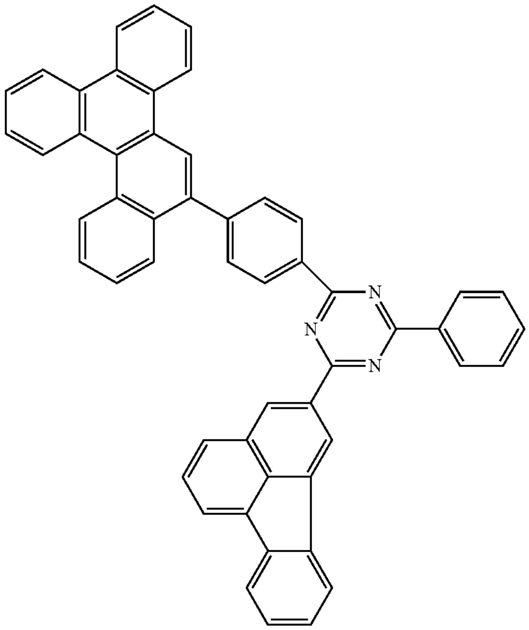
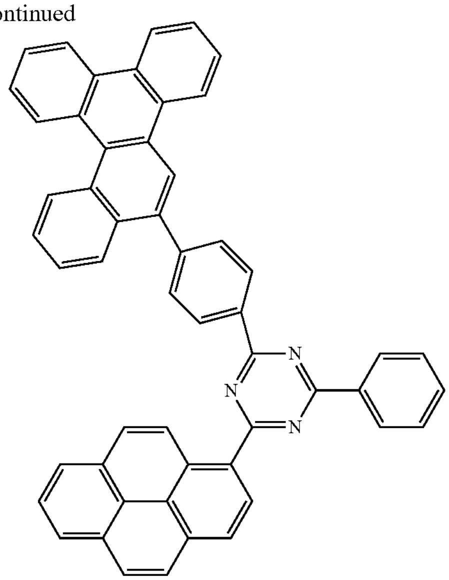
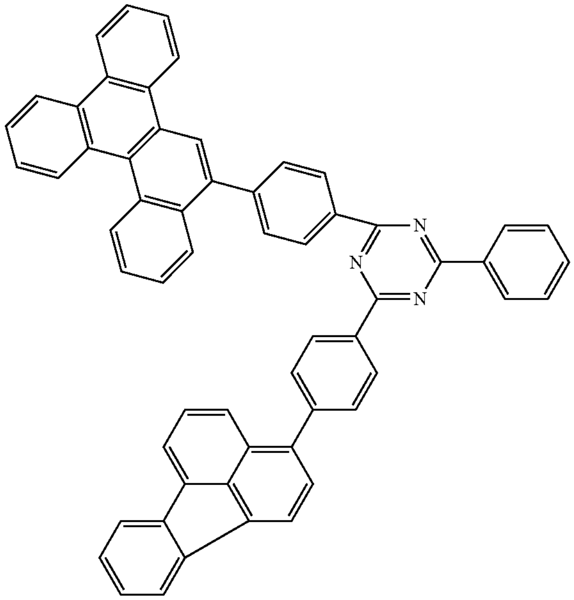
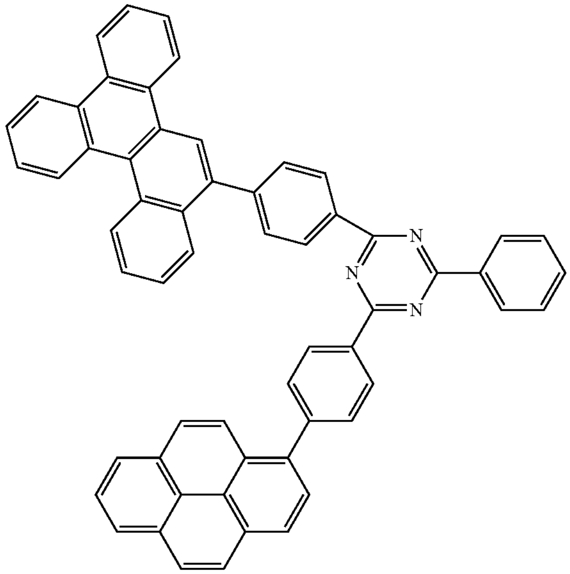

-continued
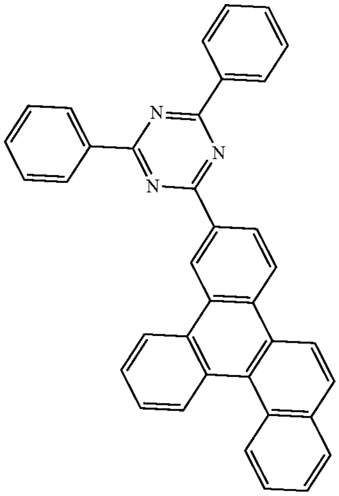
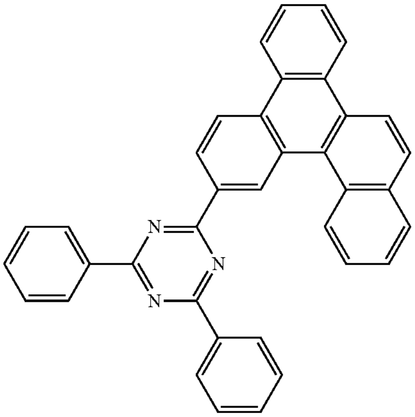
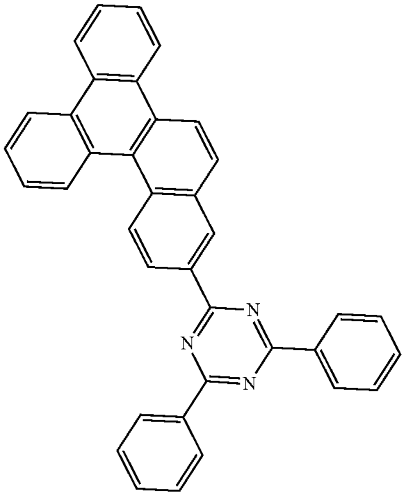
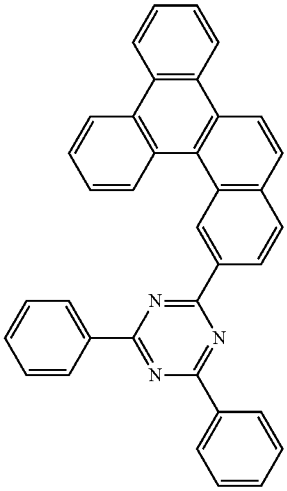
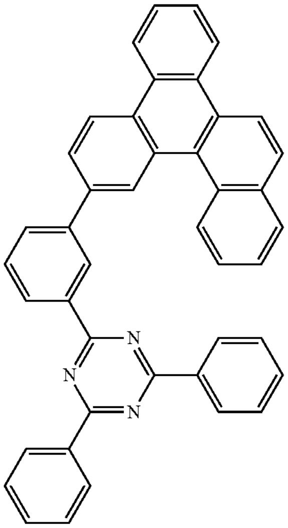
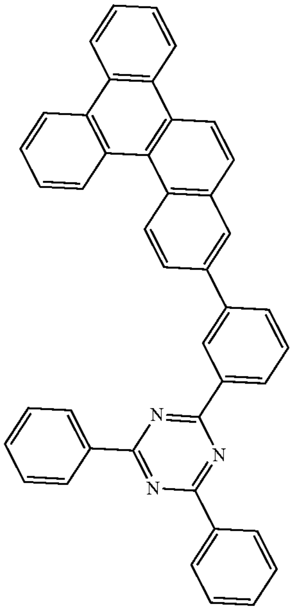
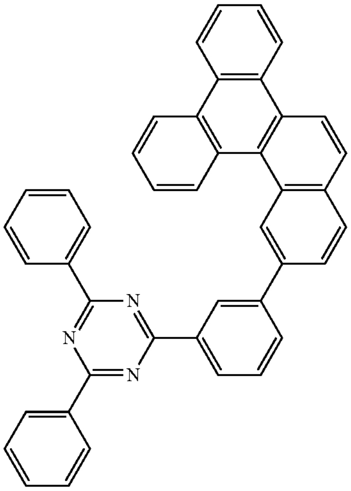
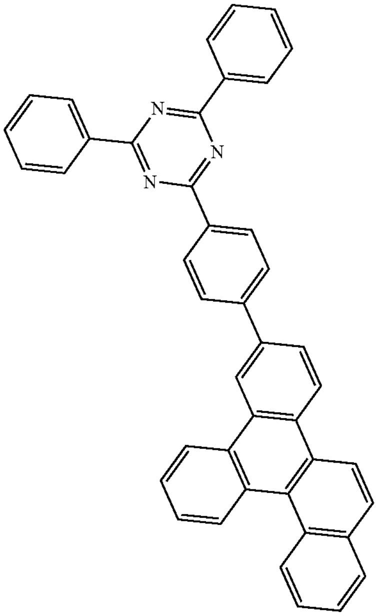

-continued
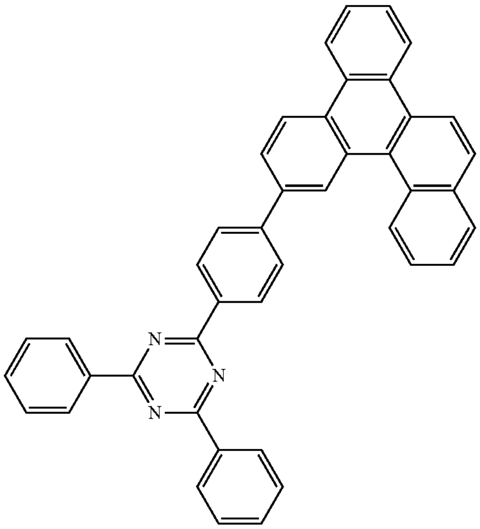
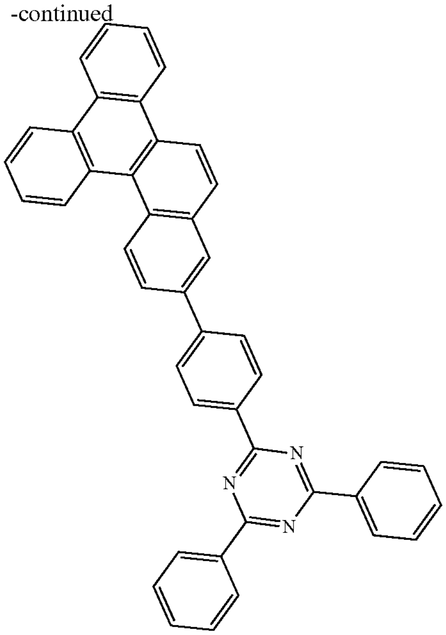
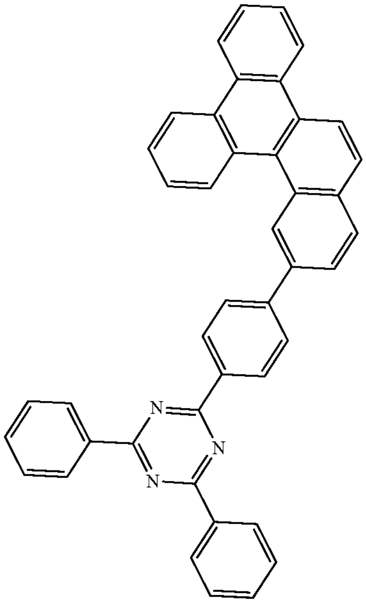
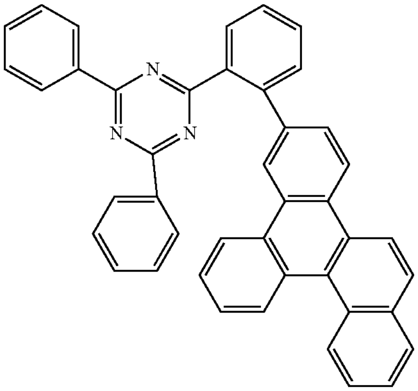

-continued
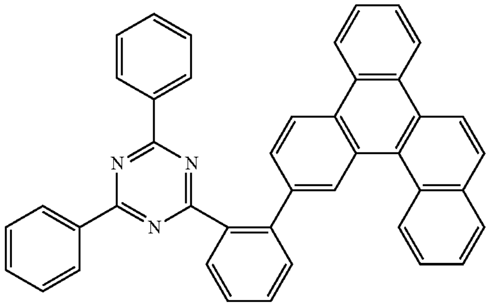
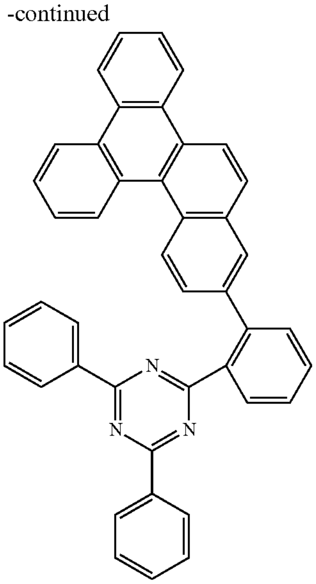
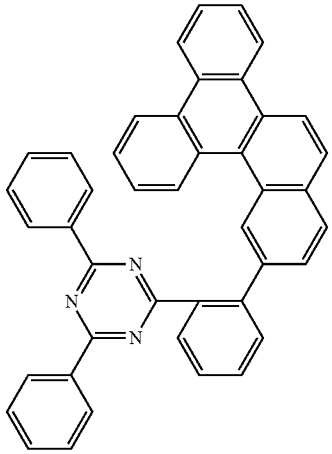
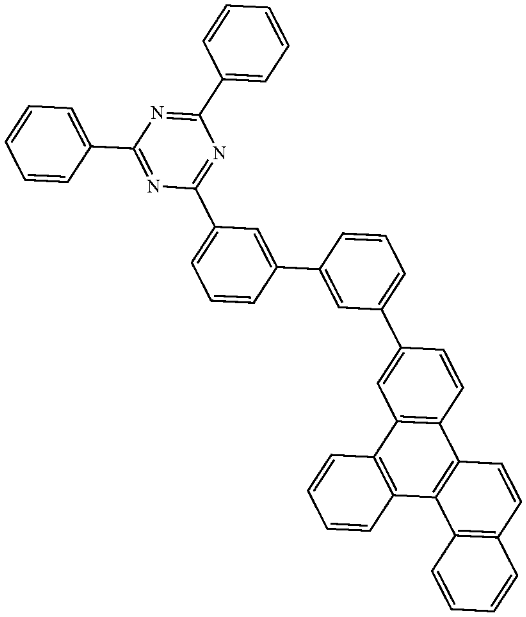
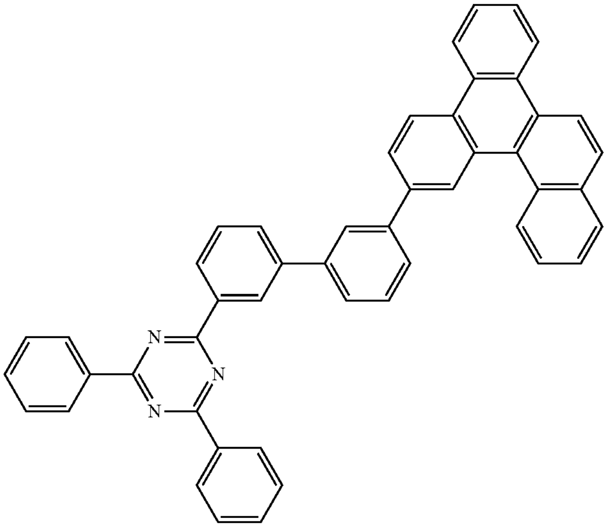

-continued
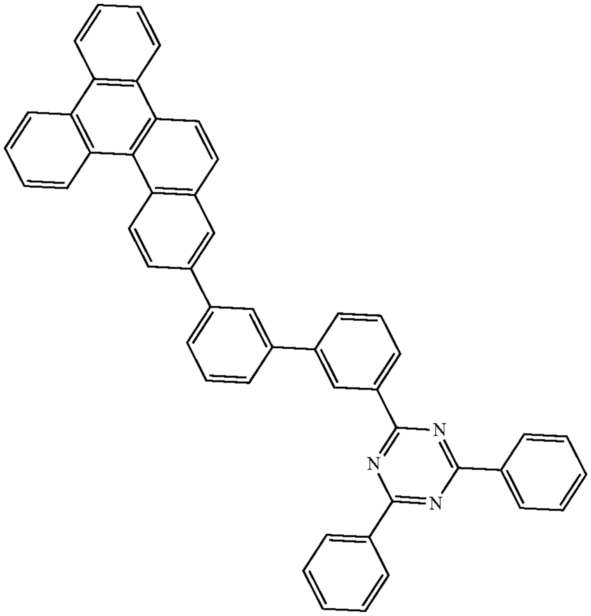
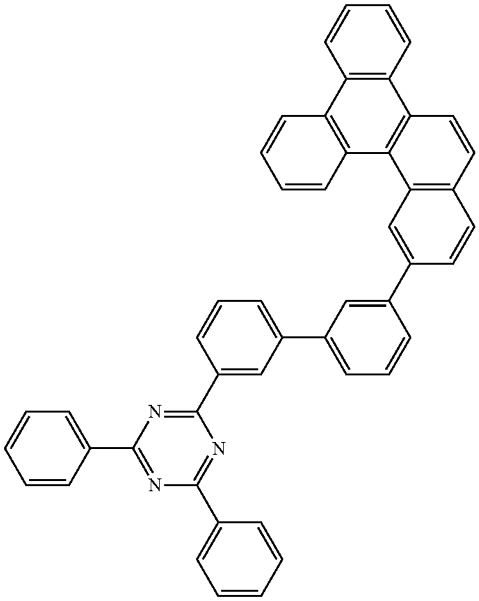
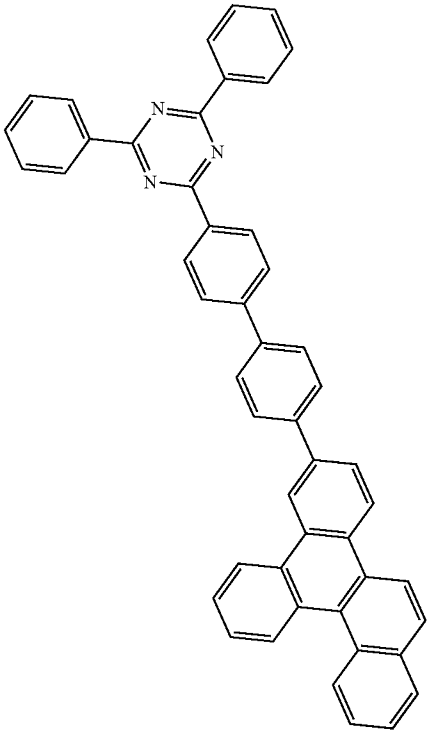
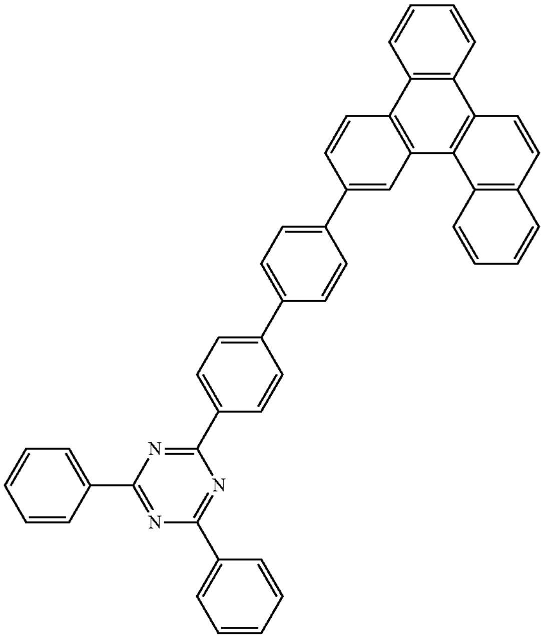

-continued
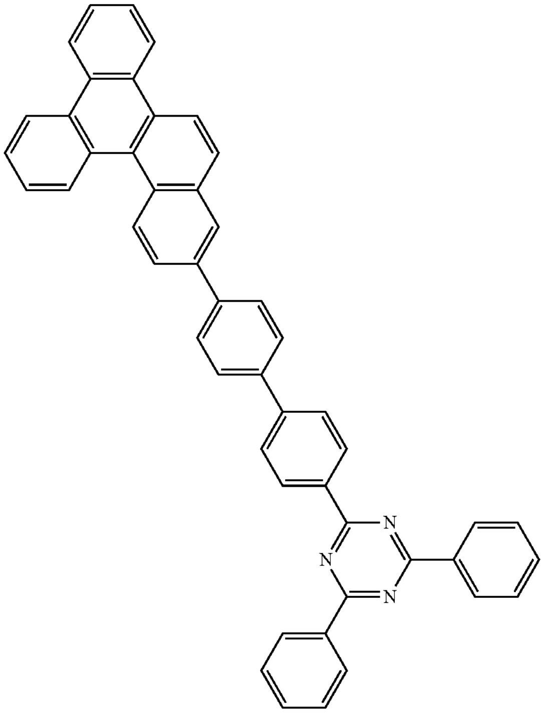
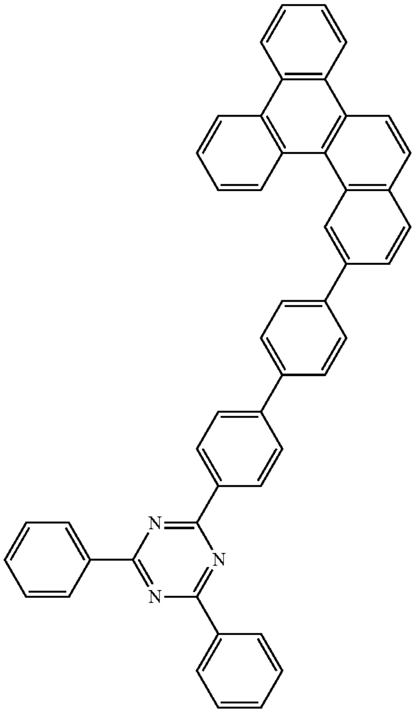
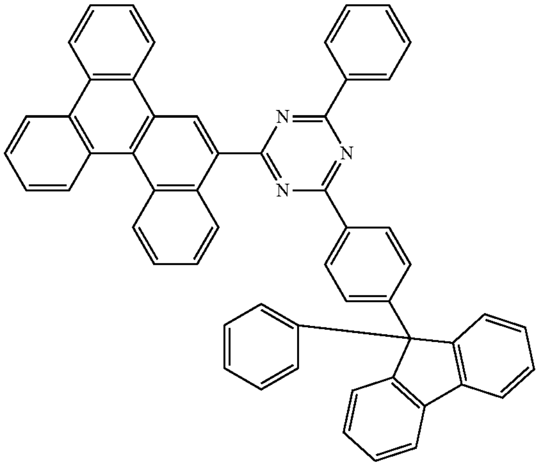
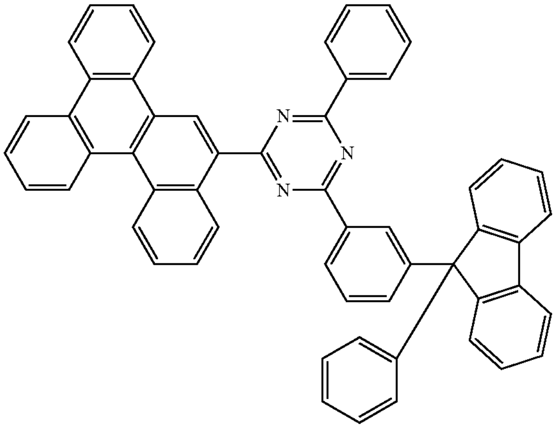
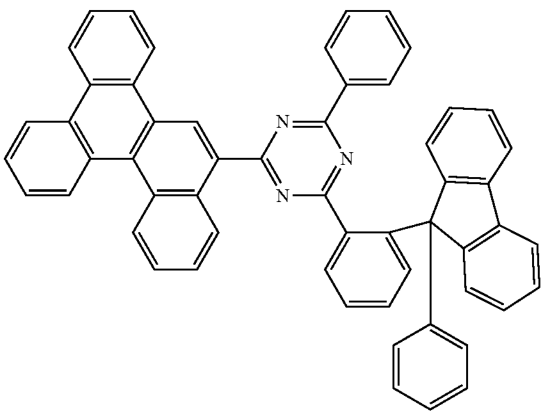
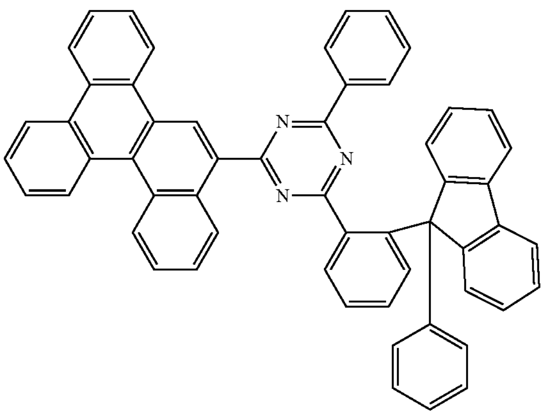

-continued
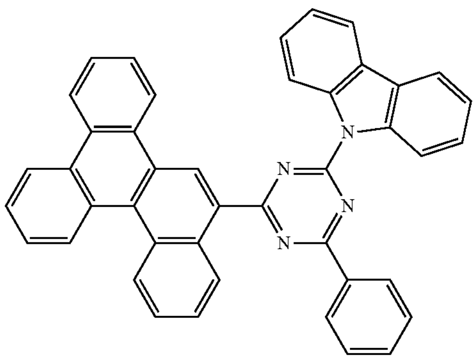
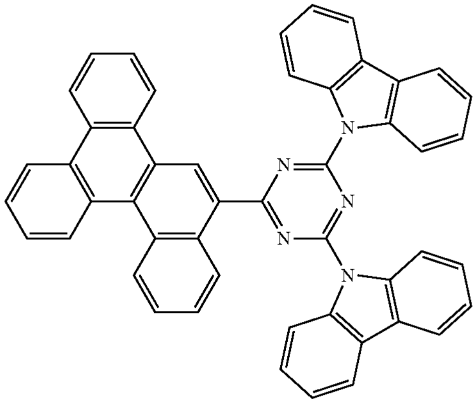
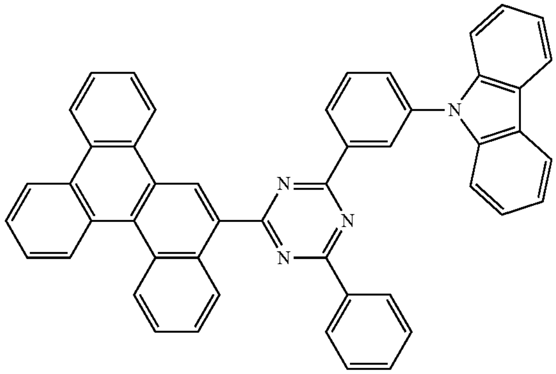
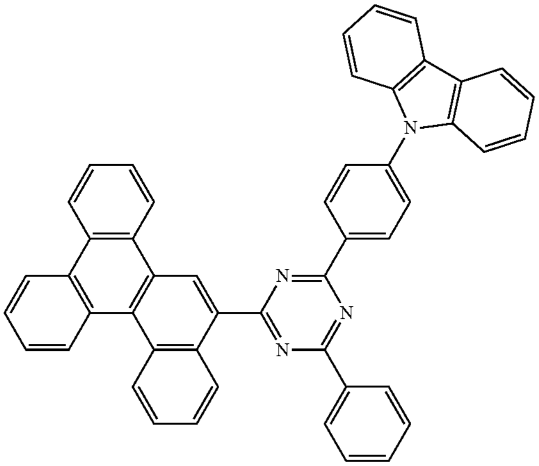
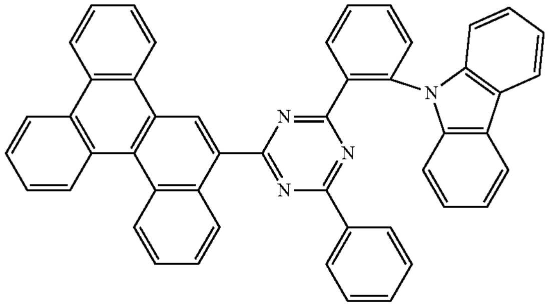
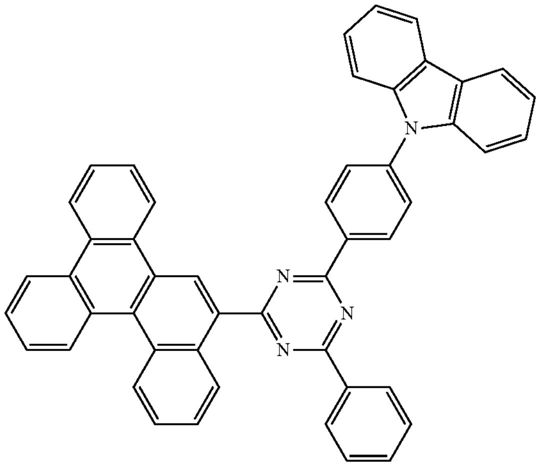

-continued
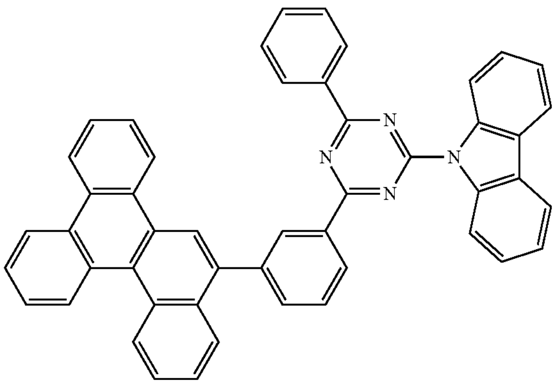
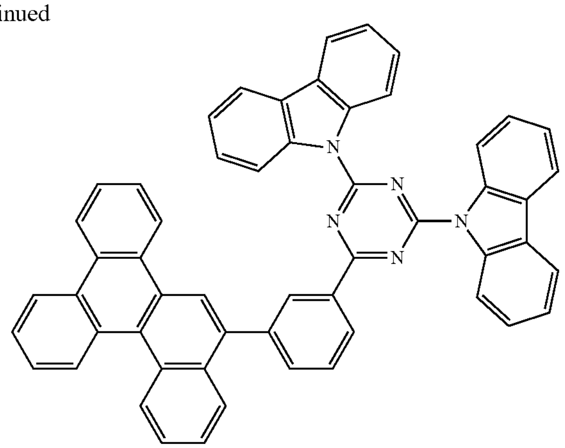
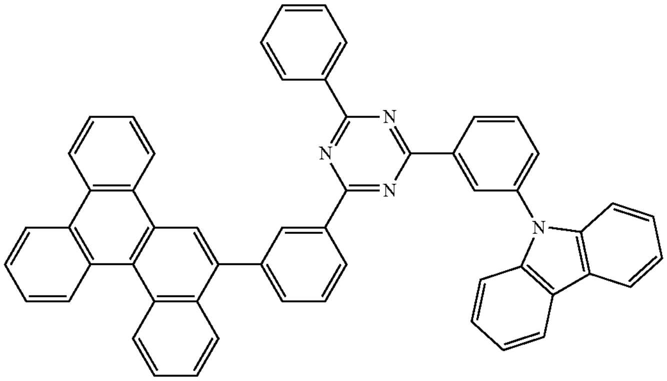
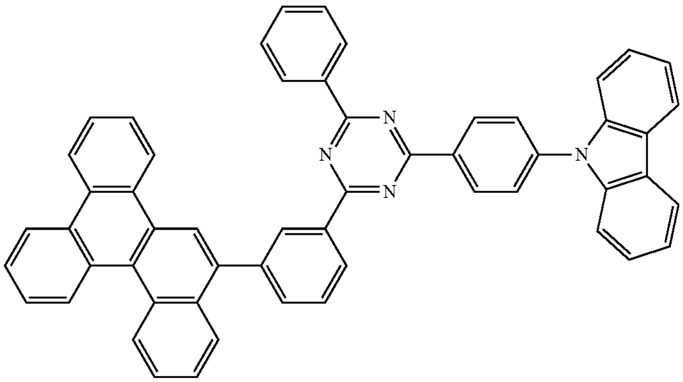
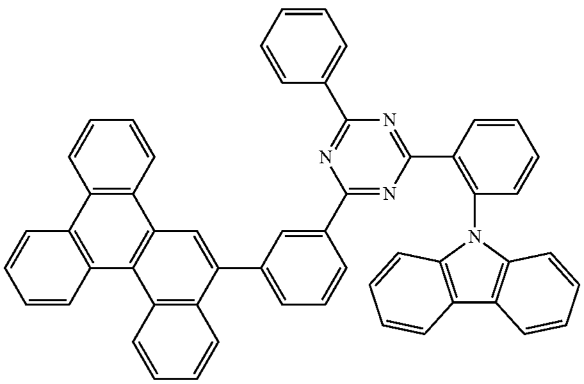

-continued
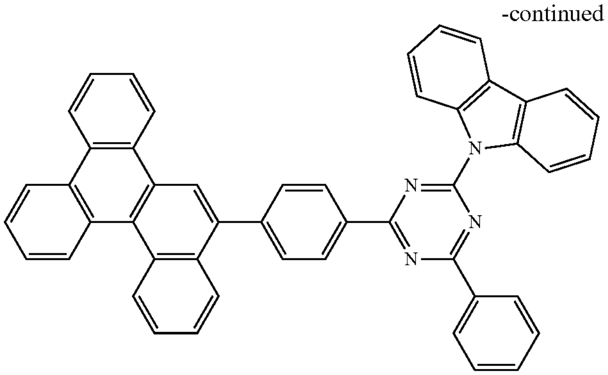
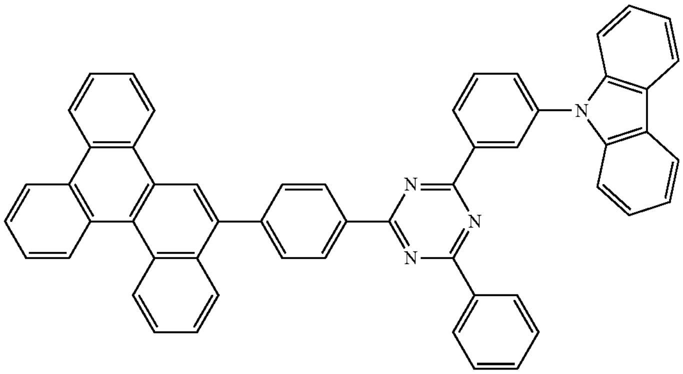
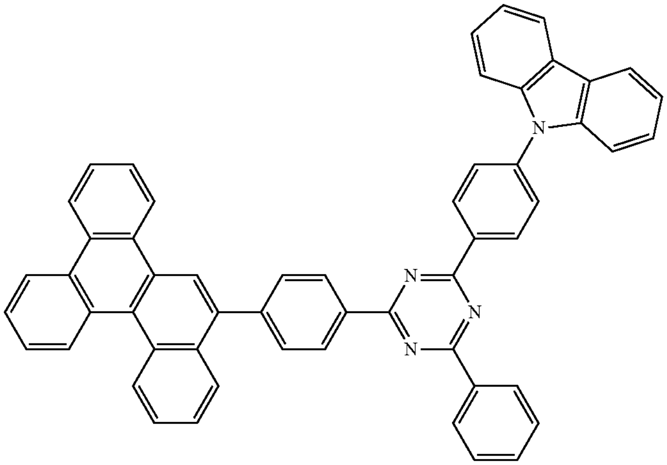
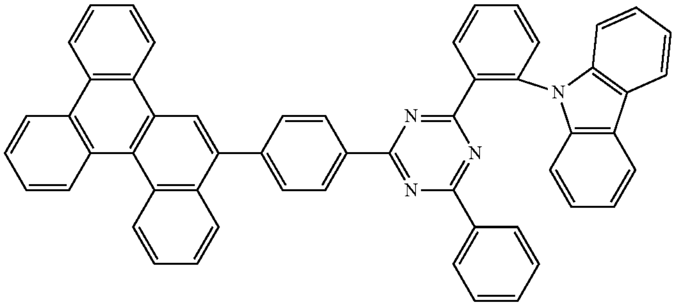

-continued
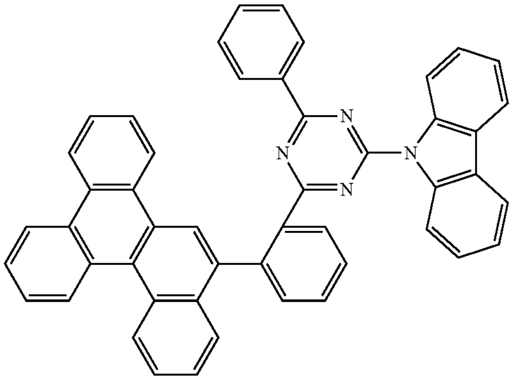
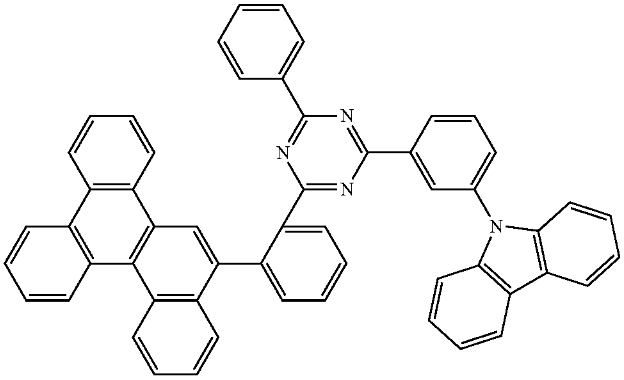
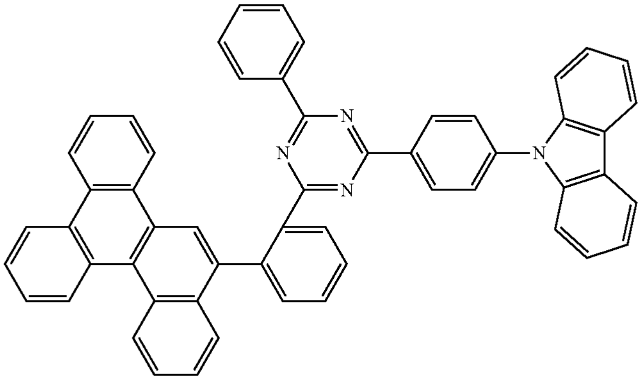
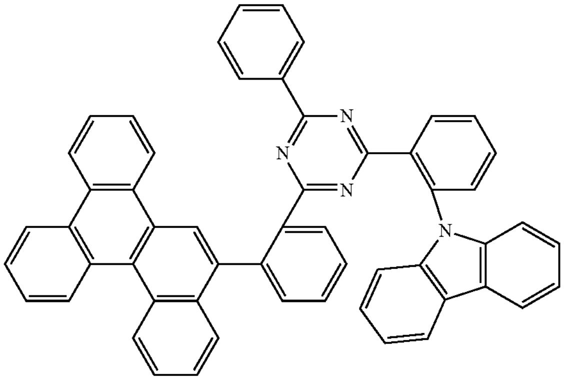
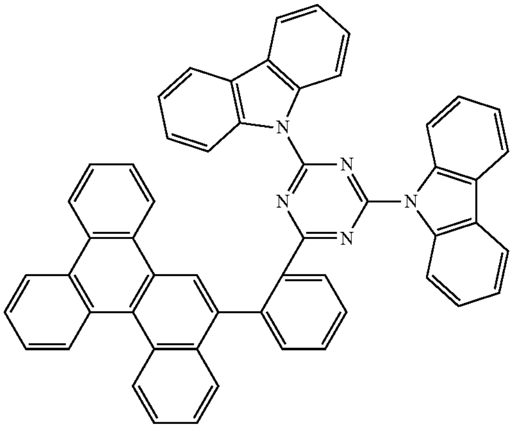
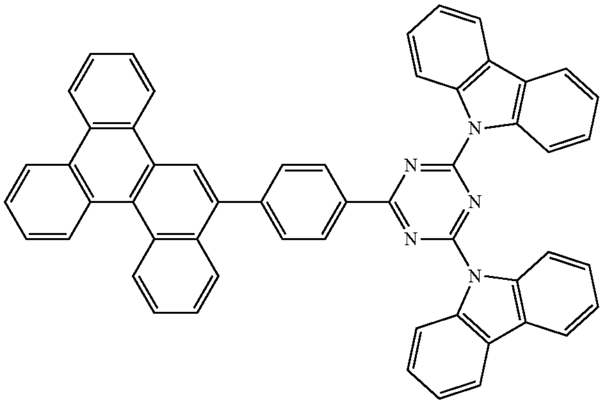

-continued
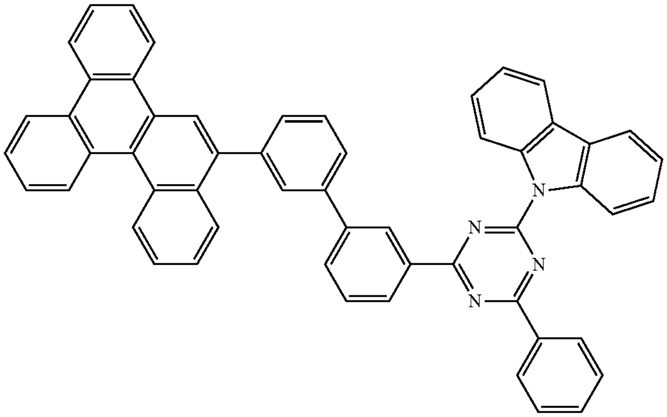
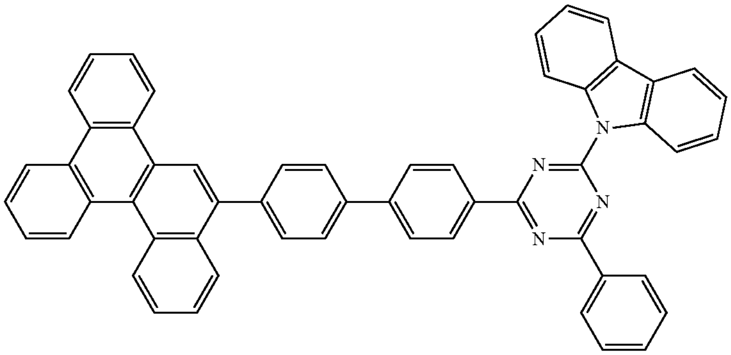
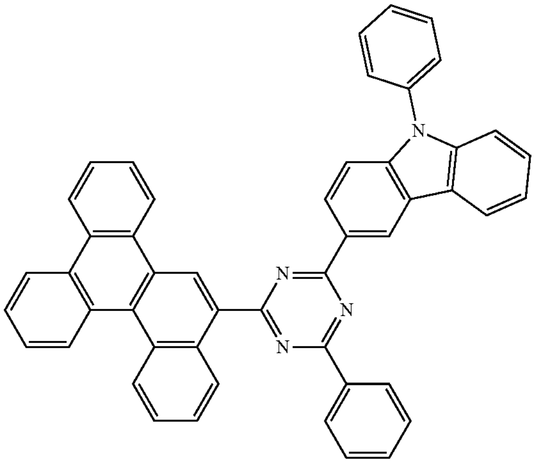
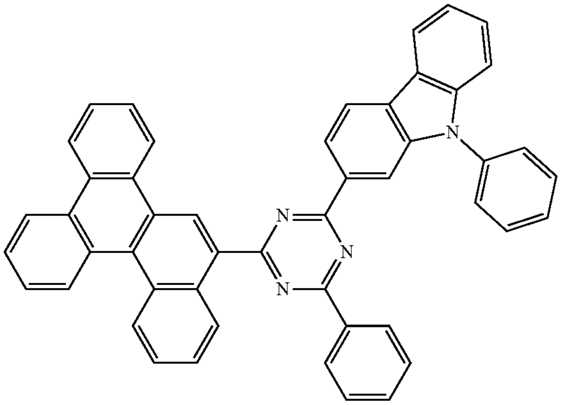
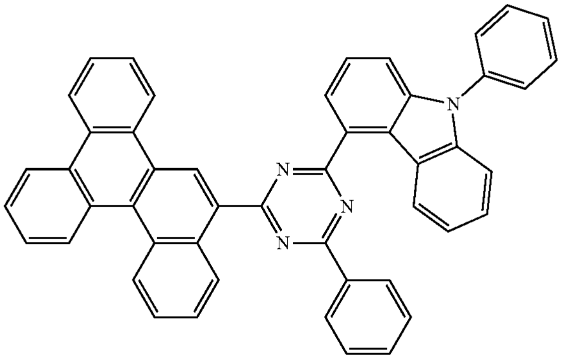
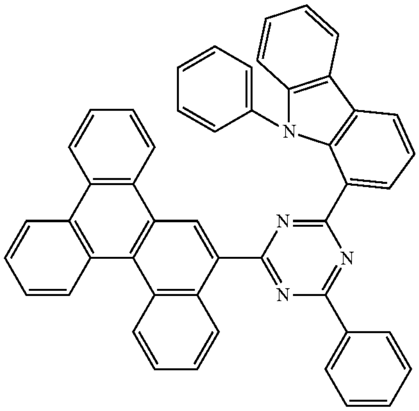

-continued
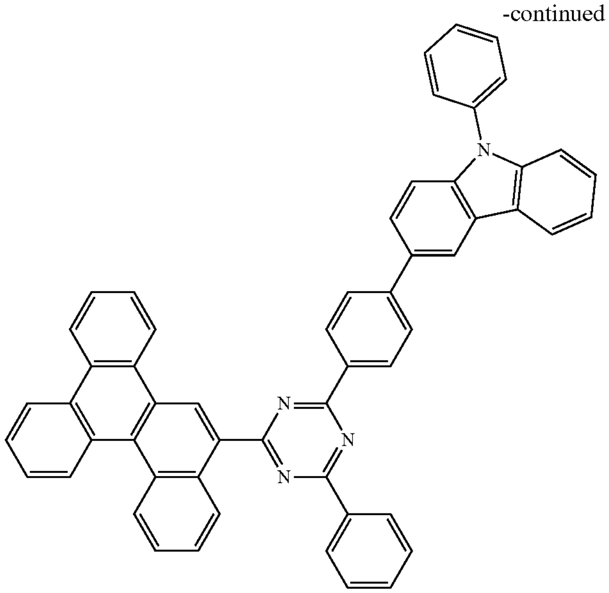
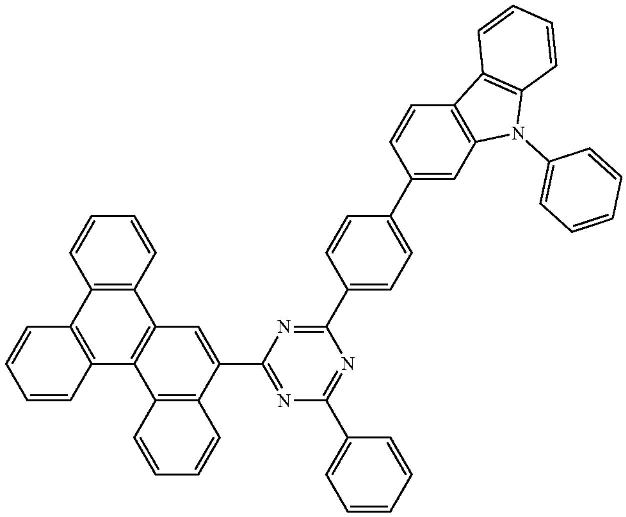
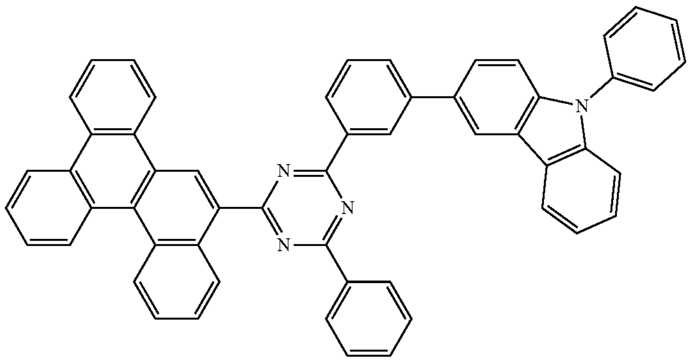

-continued
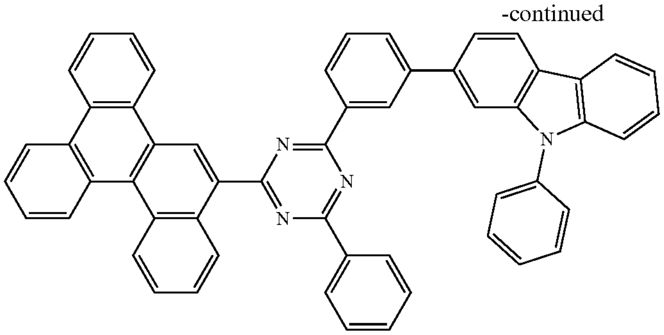
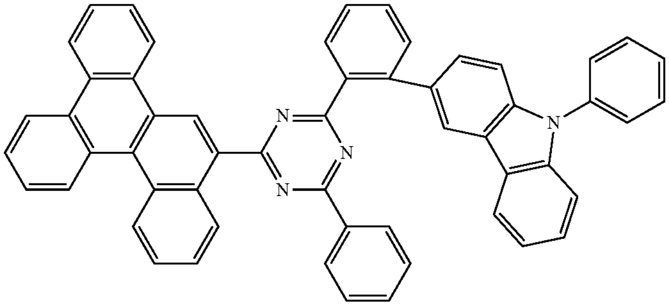
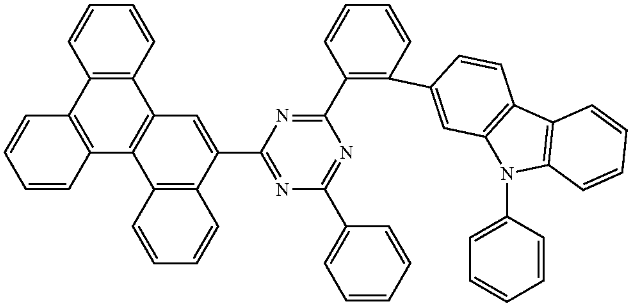
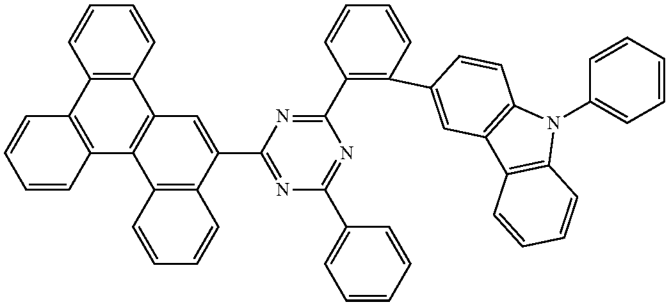
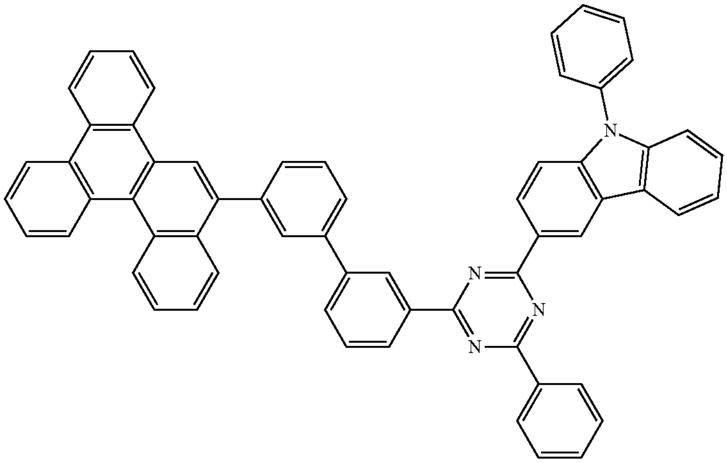

-continued
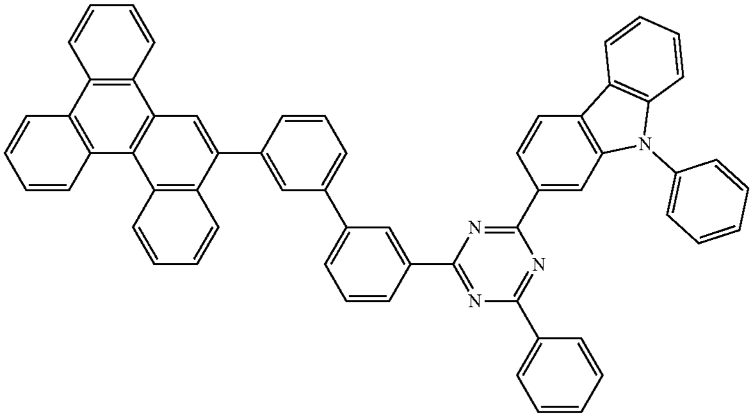
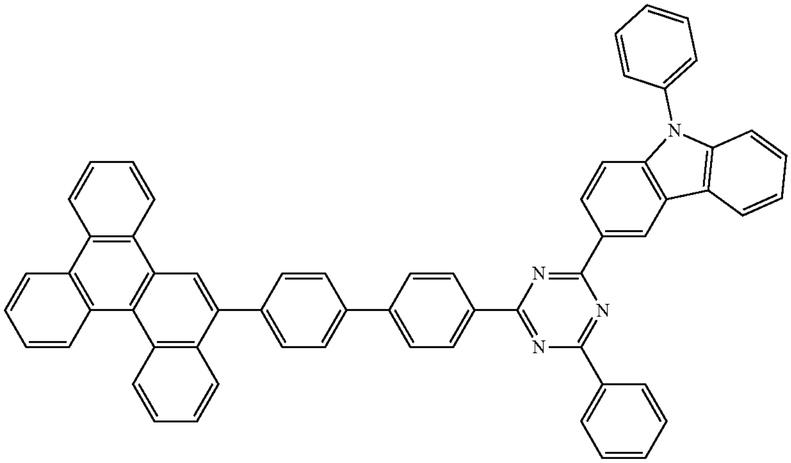
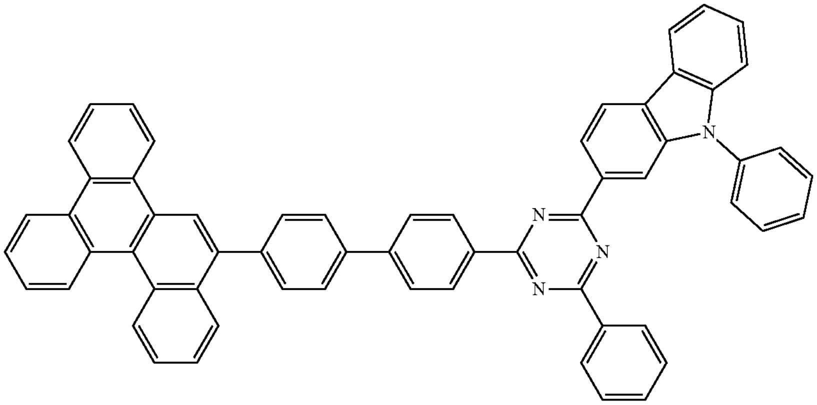
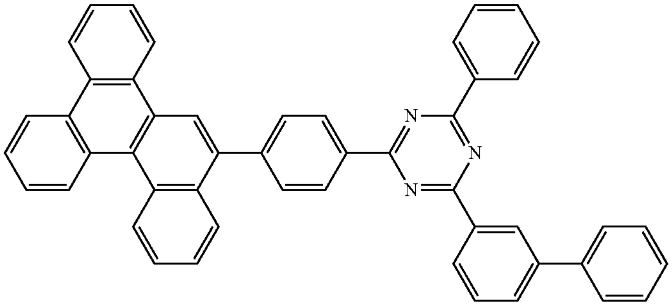

-continued
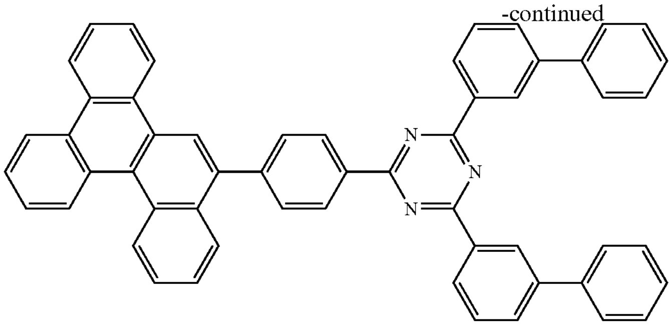
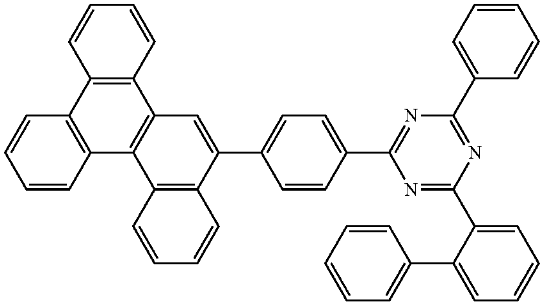
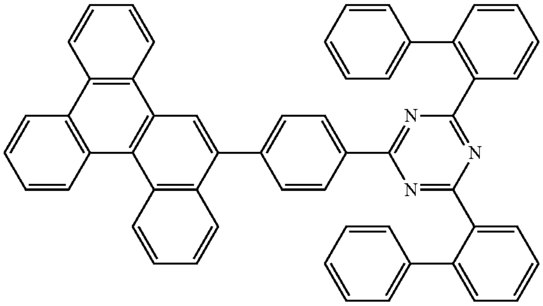
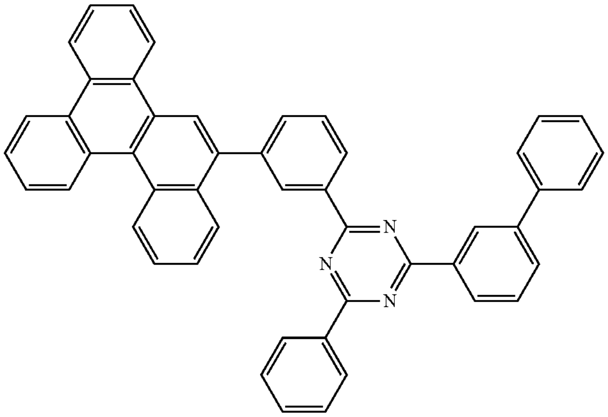
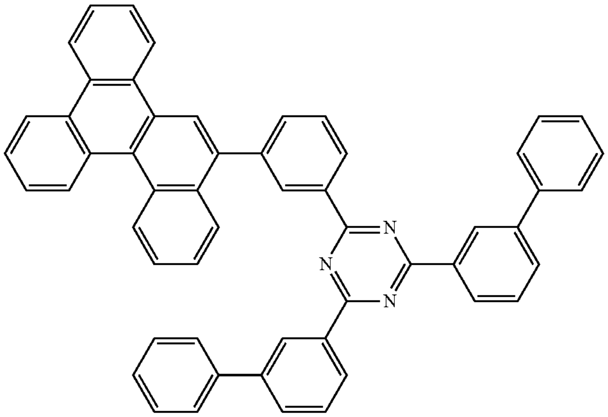
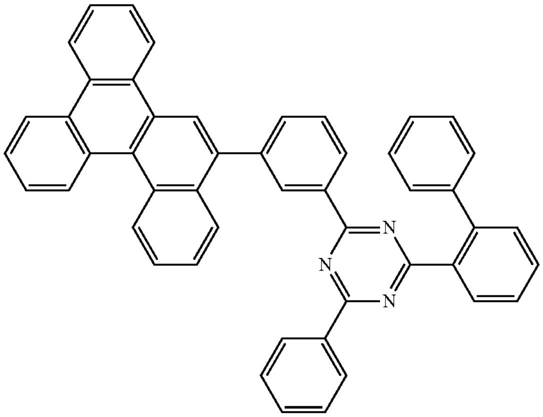

-continued
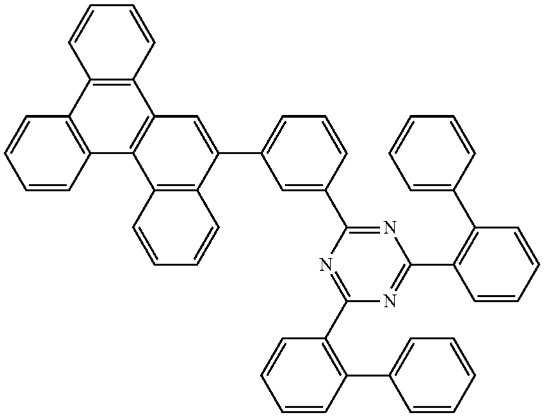
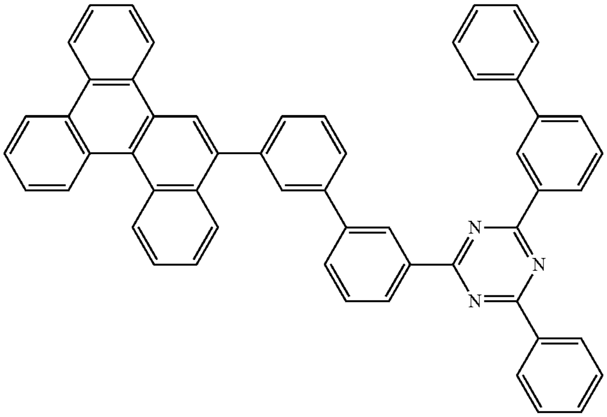
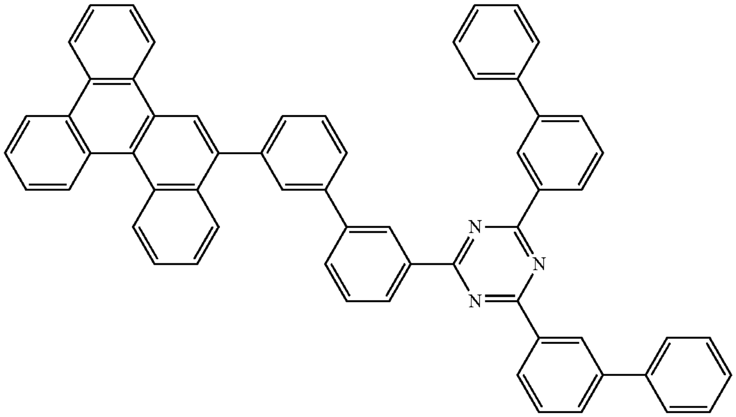
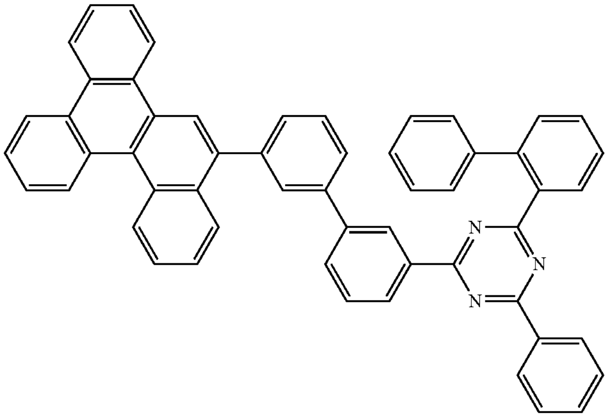
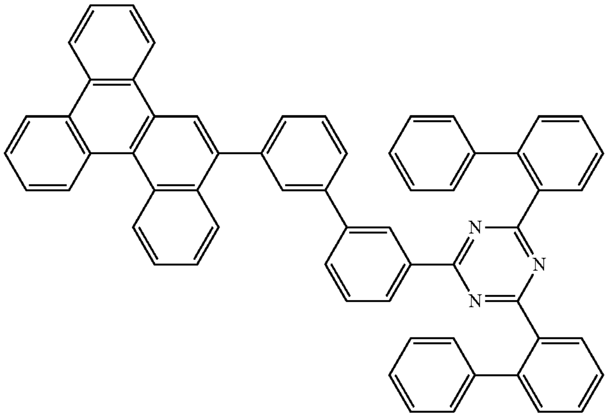

-continued
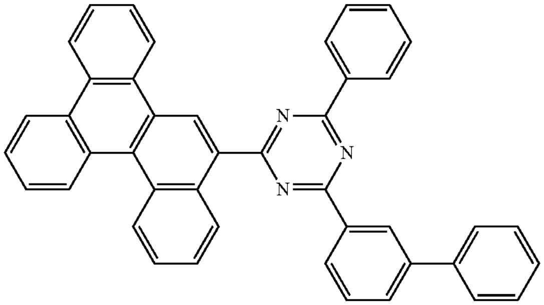
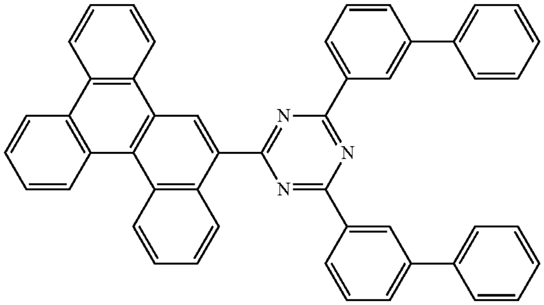
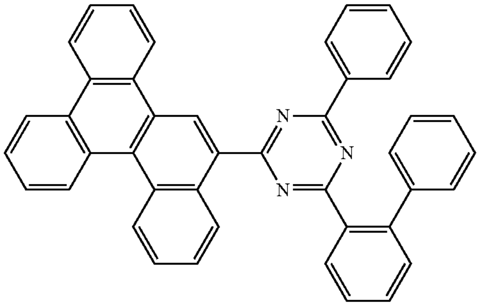
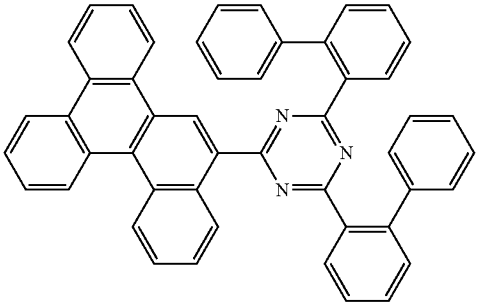
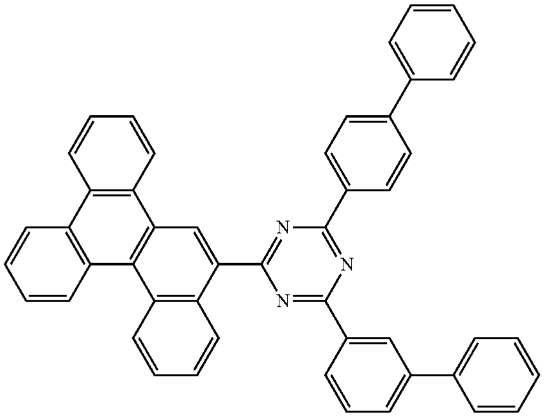
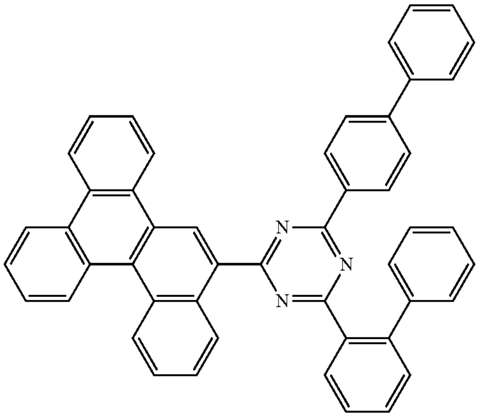
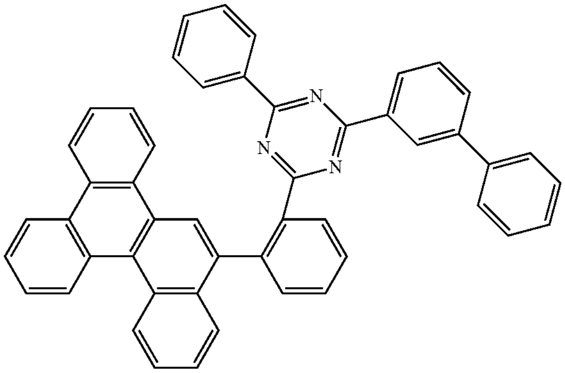
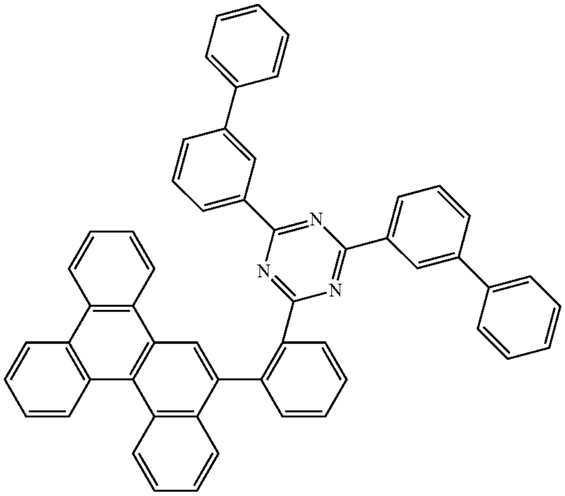

-continued
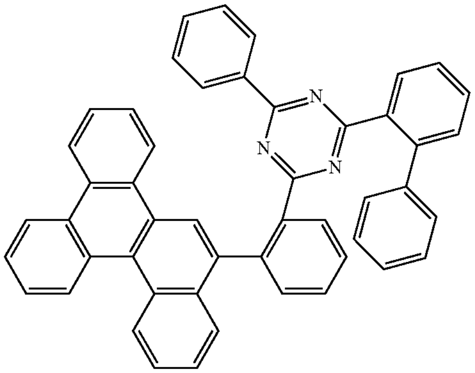
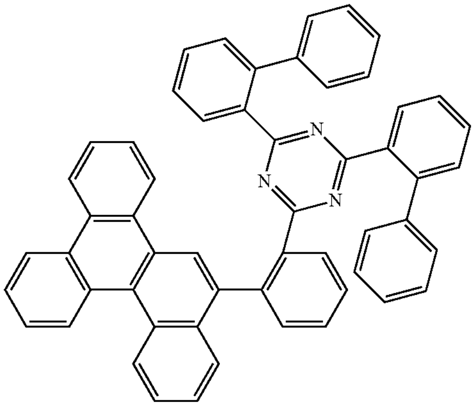
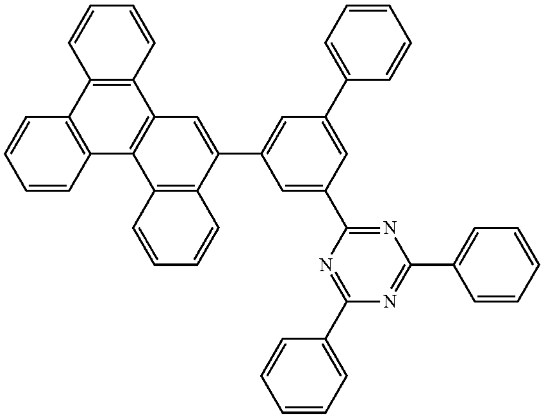
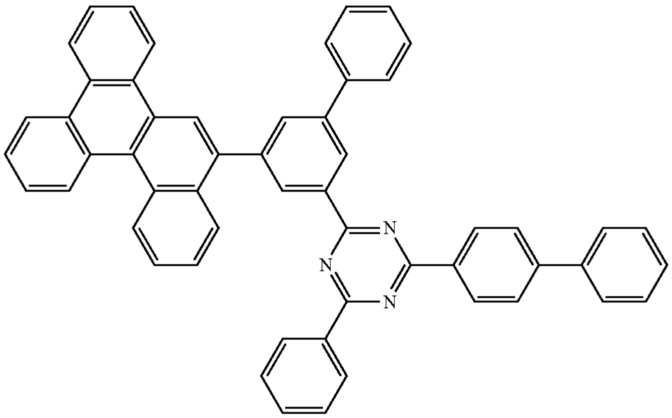
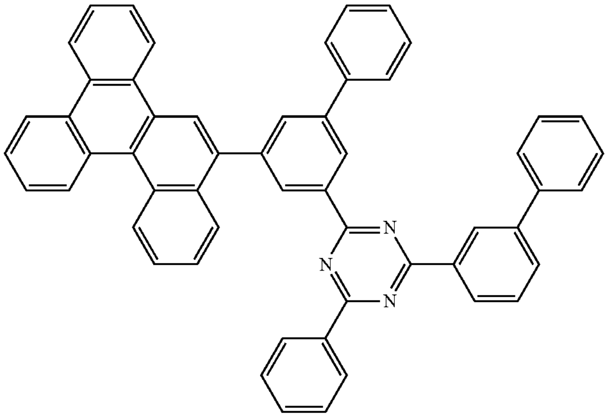
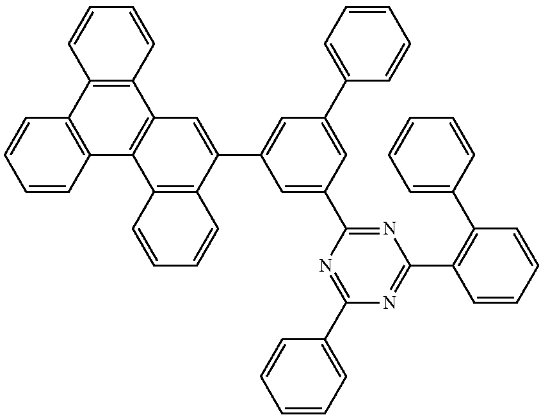

-continued
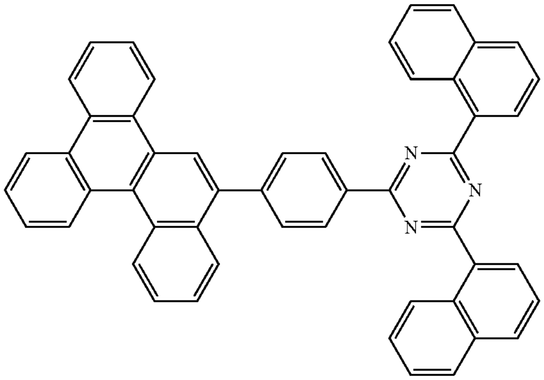
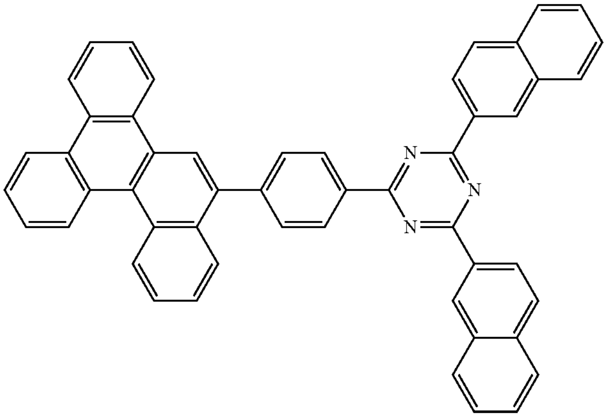
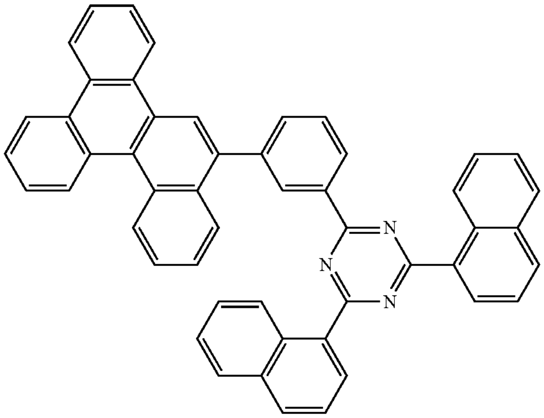
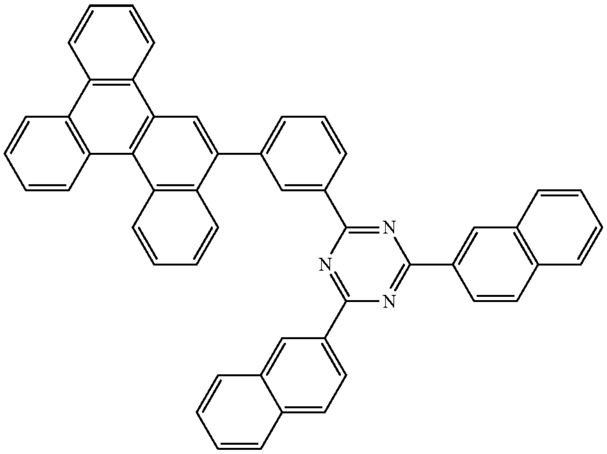
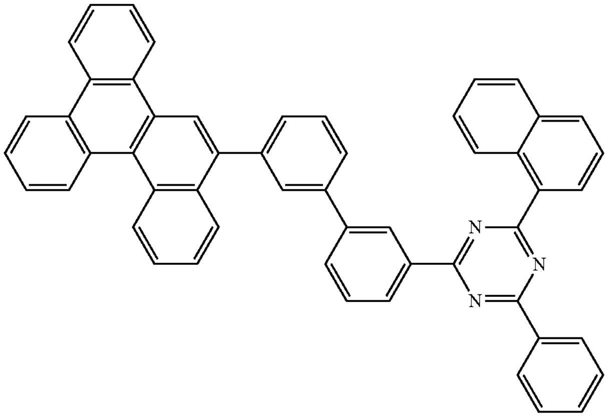
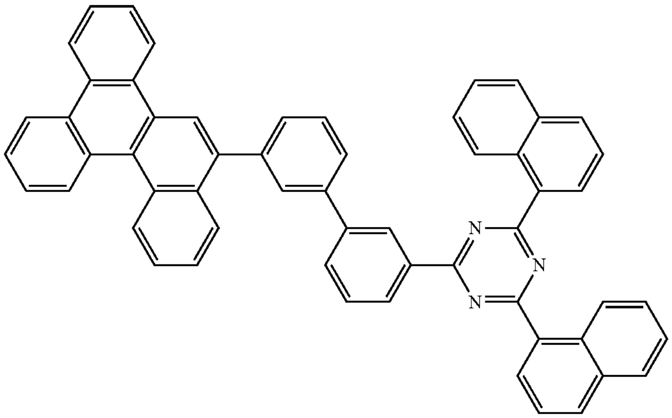

-continued
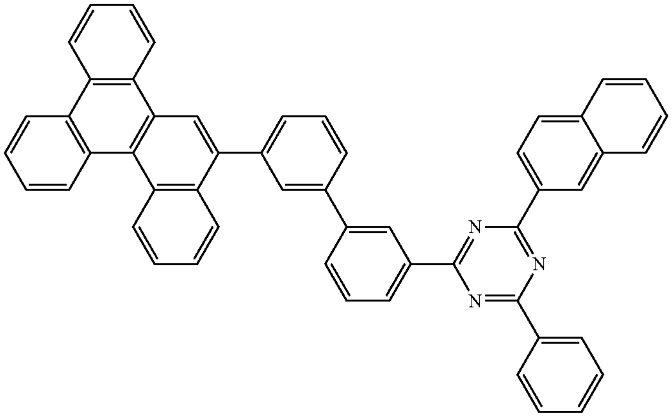
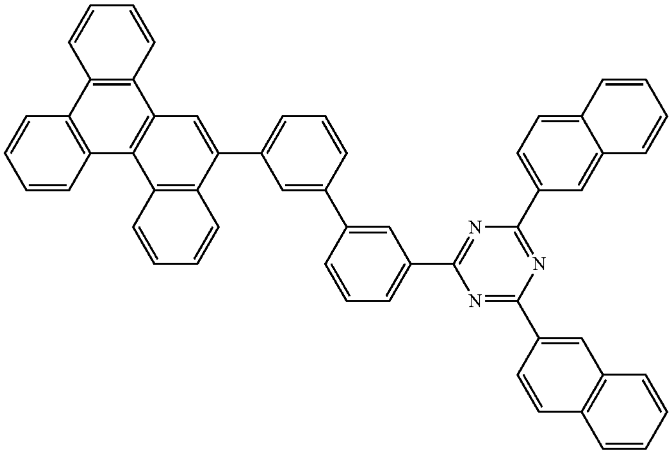
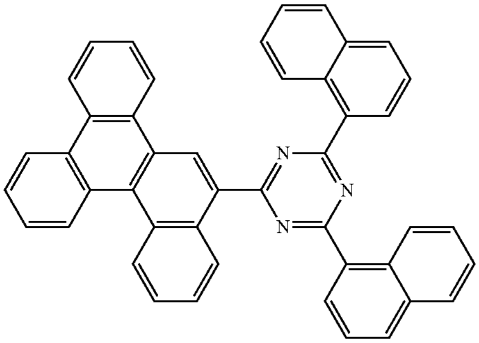
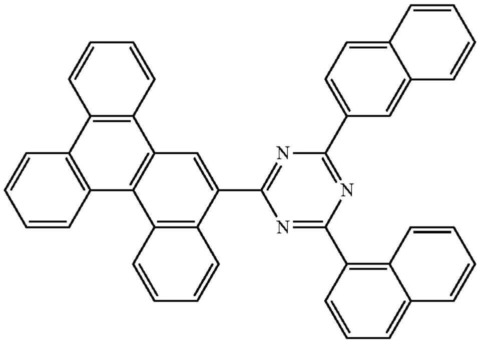
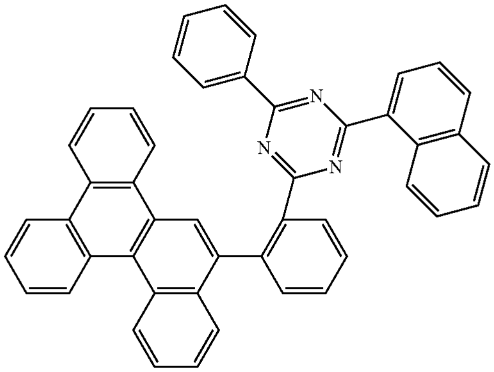
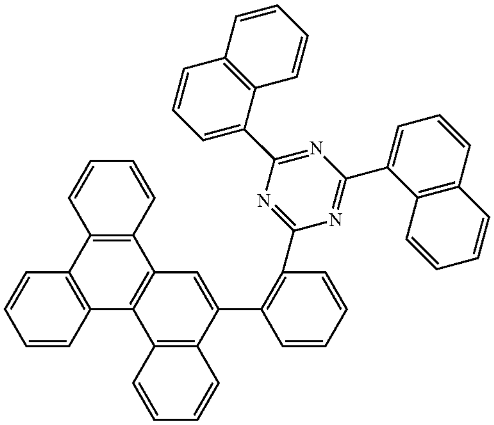
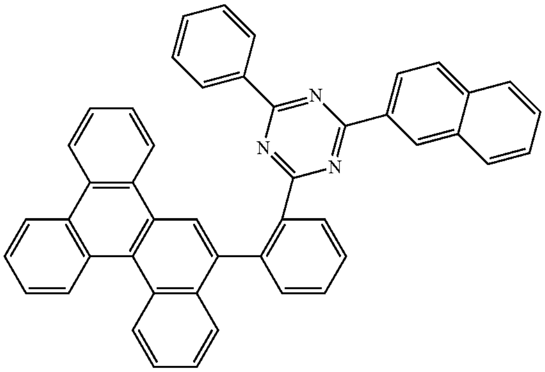

-continued
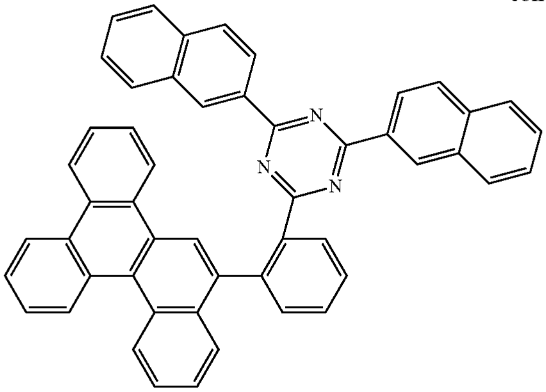
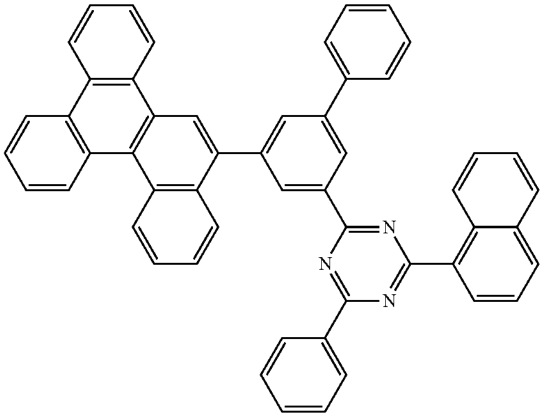
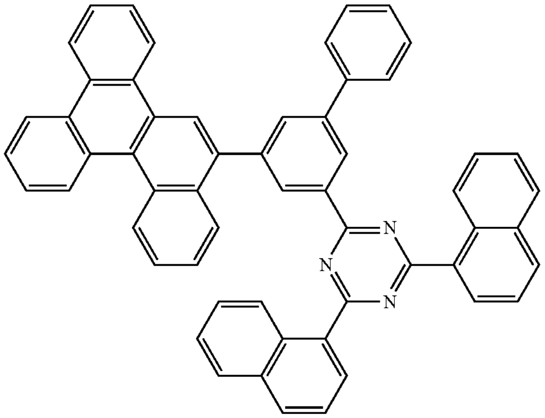
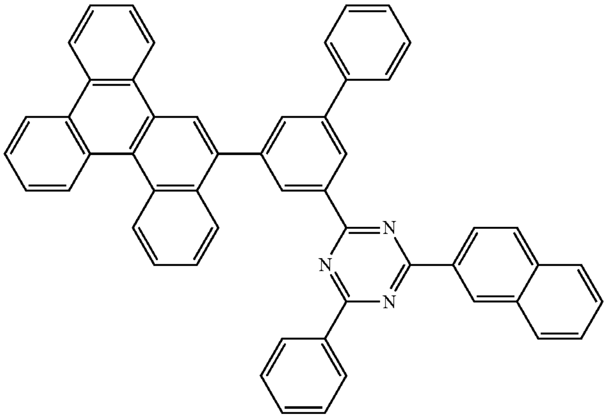
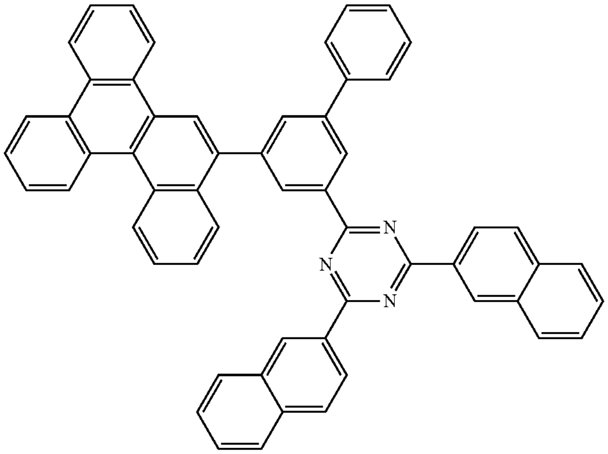
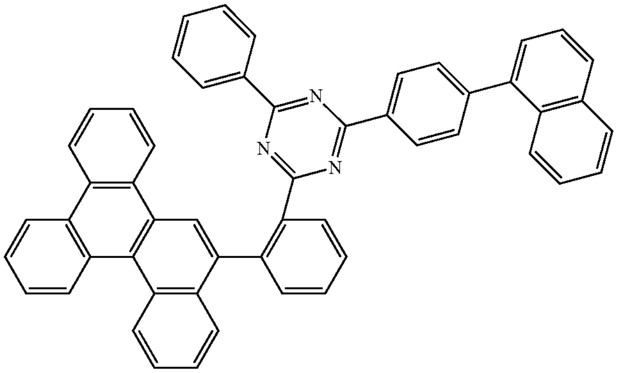

-continued
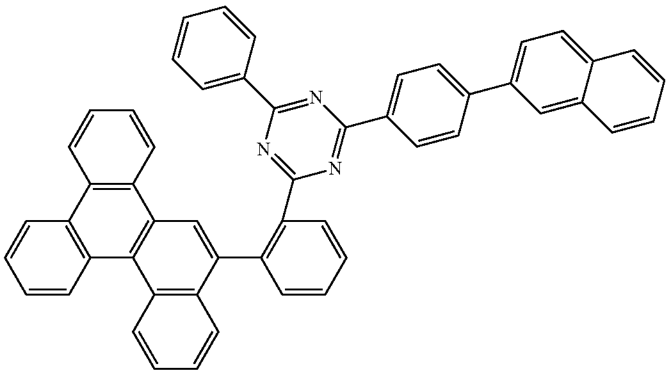
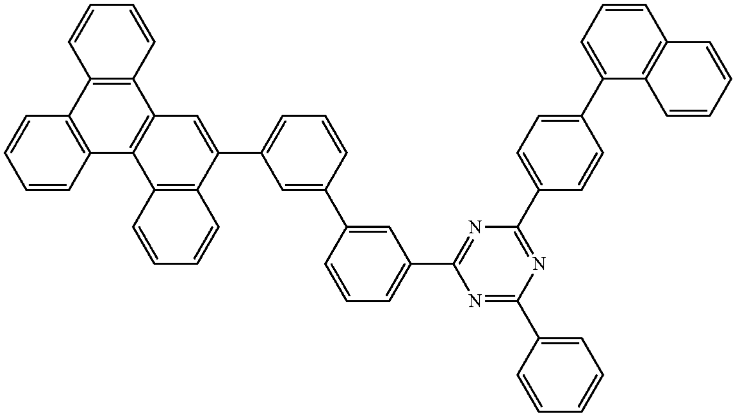
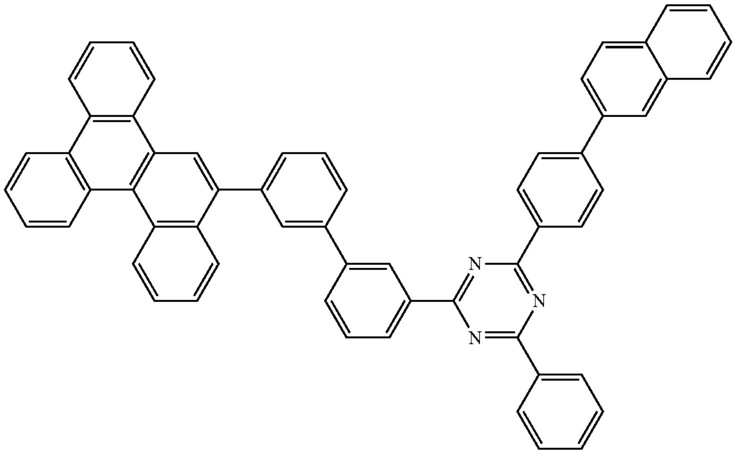
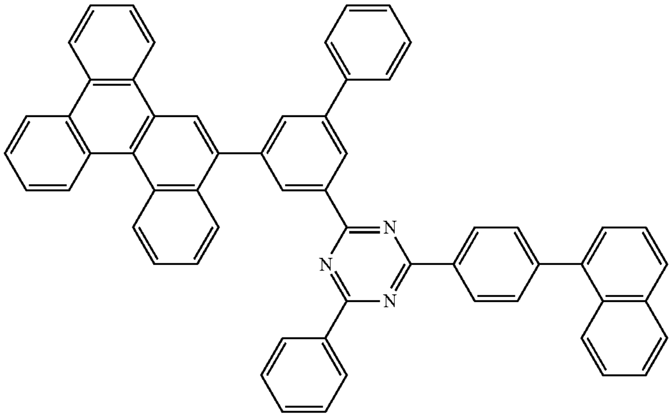

-continued
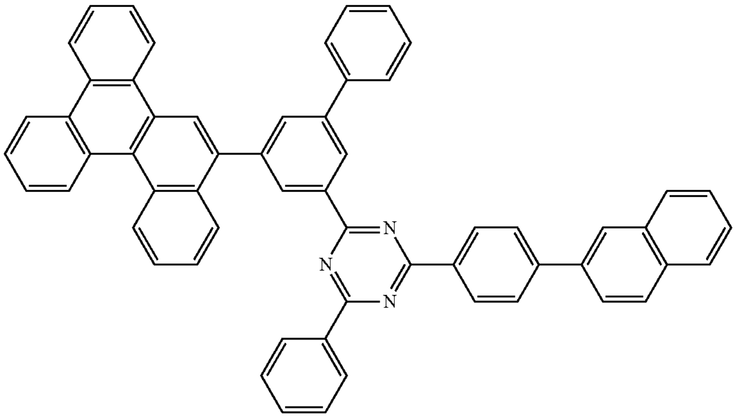
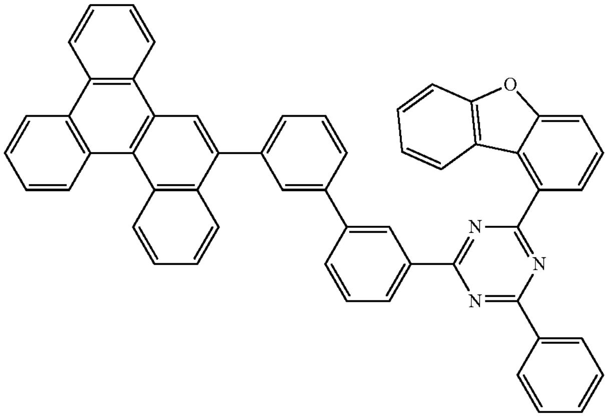
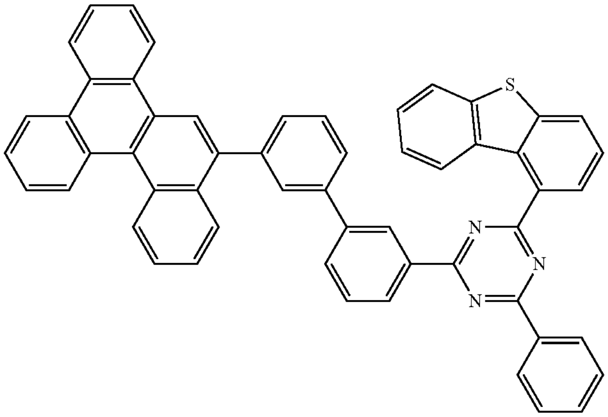
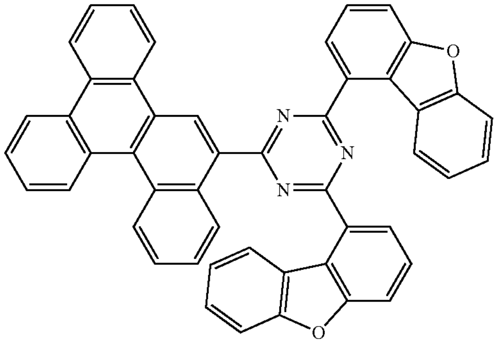
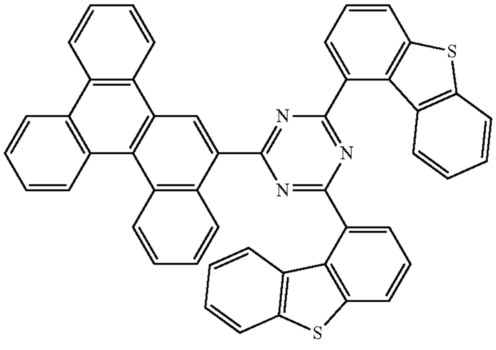
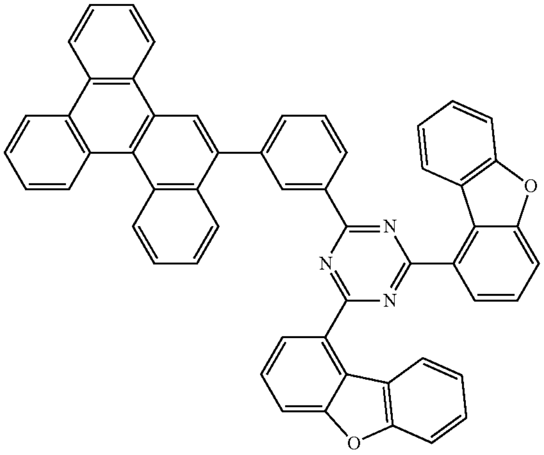

-continued
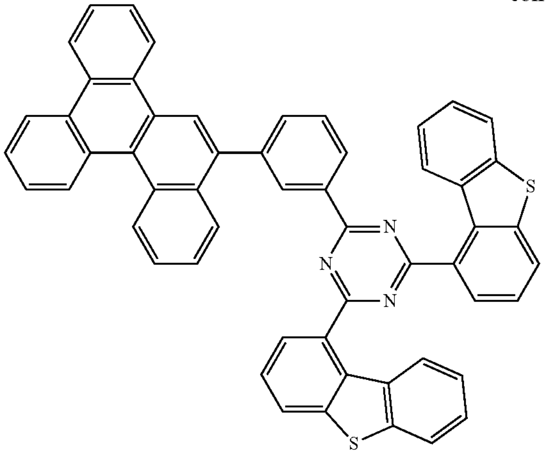
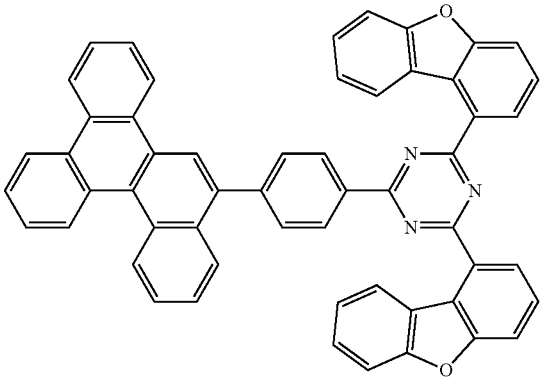
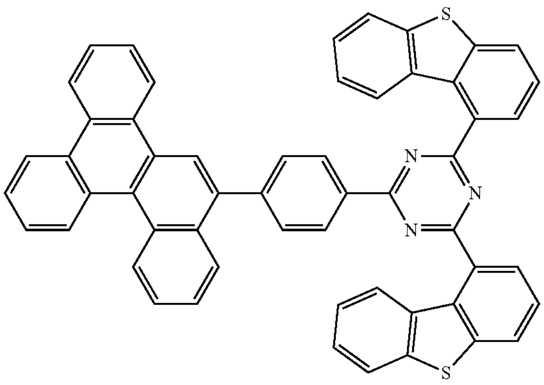
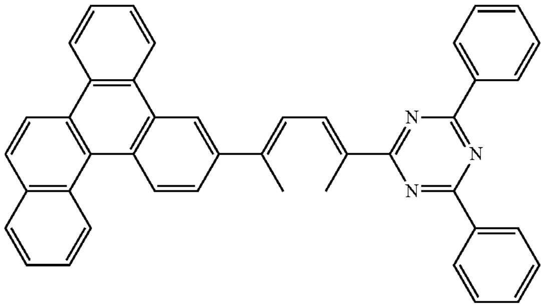
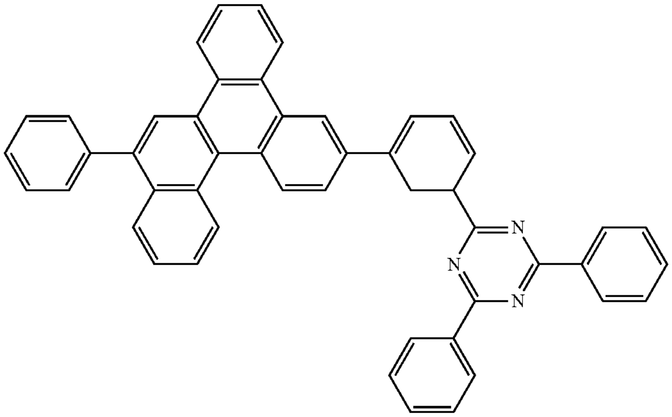
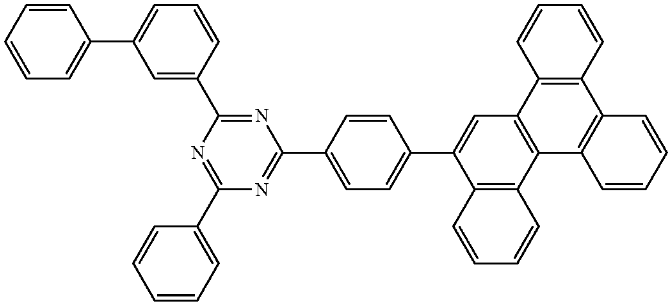

-continued
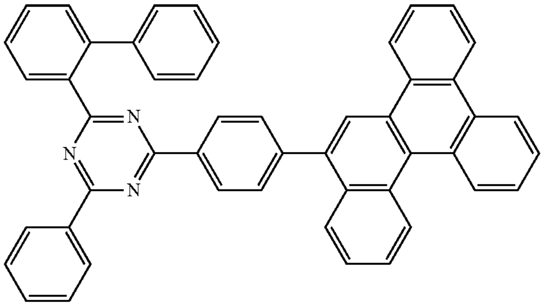
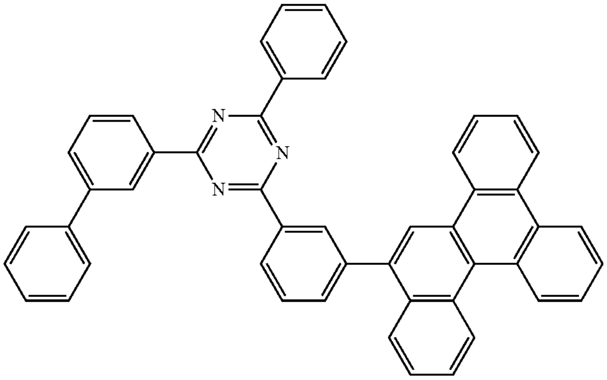
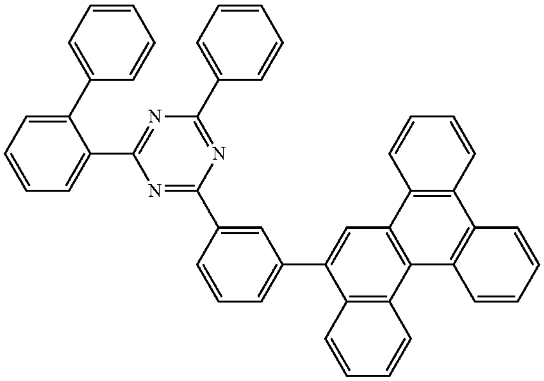
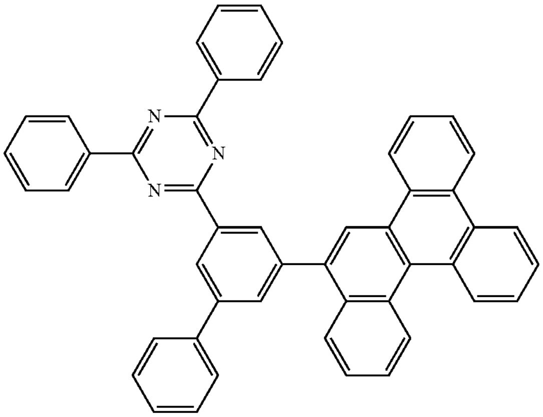
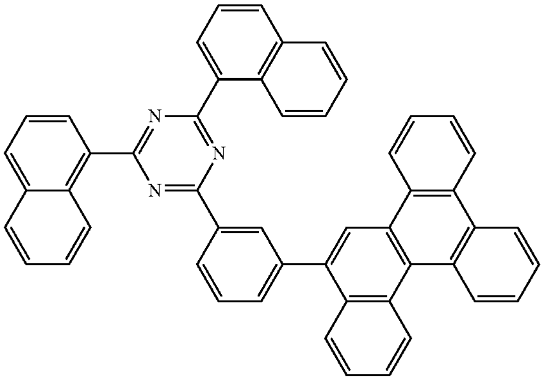
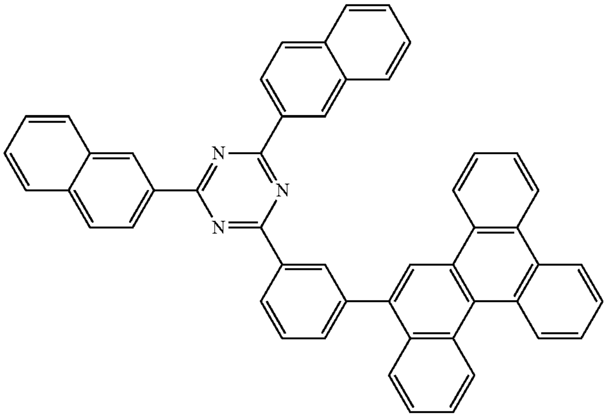
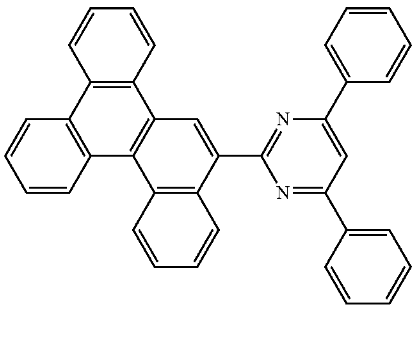
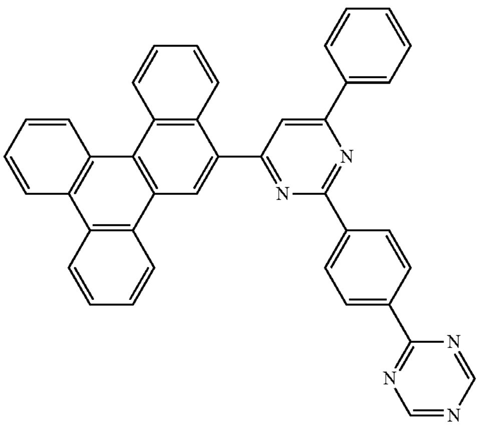

-continued
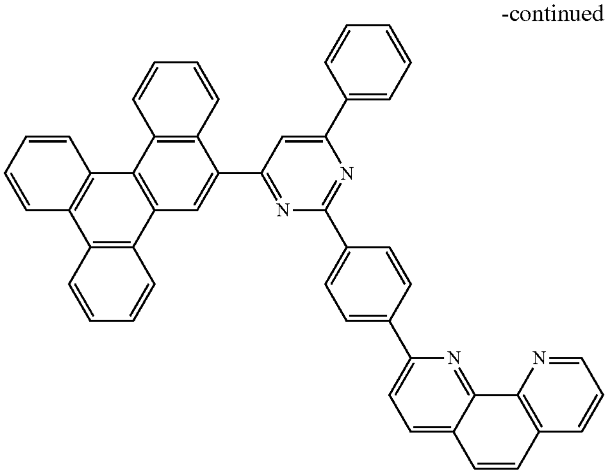
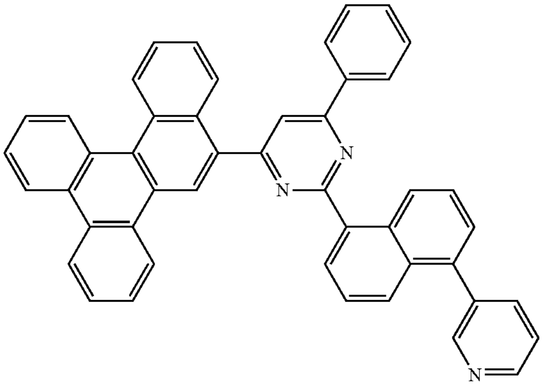
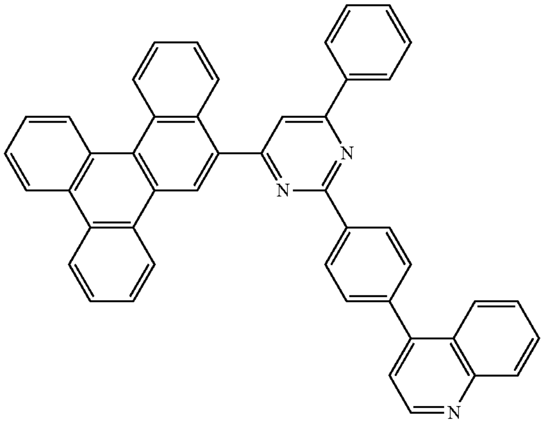
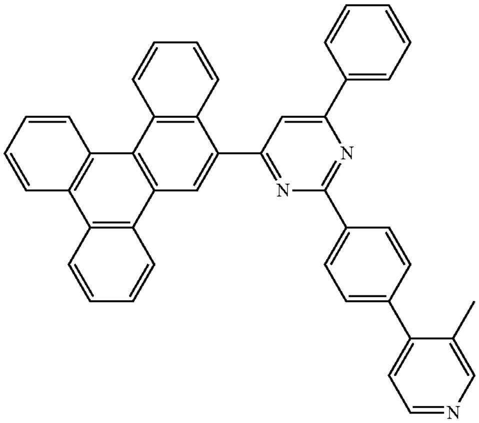
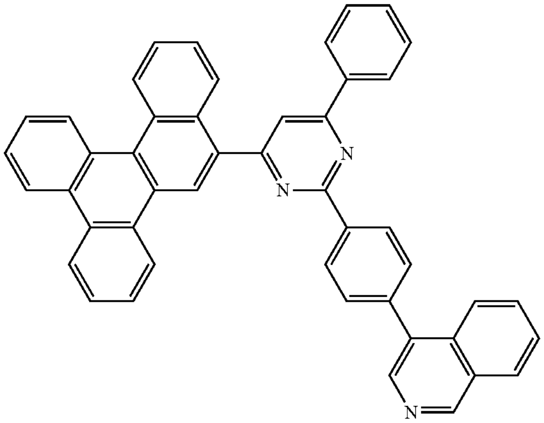
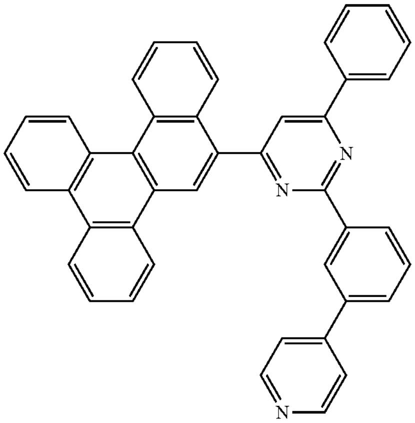
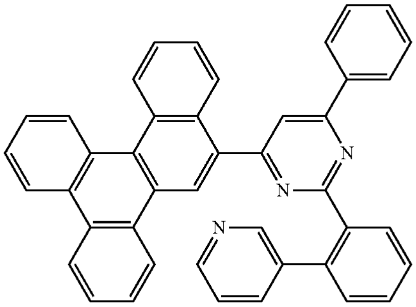
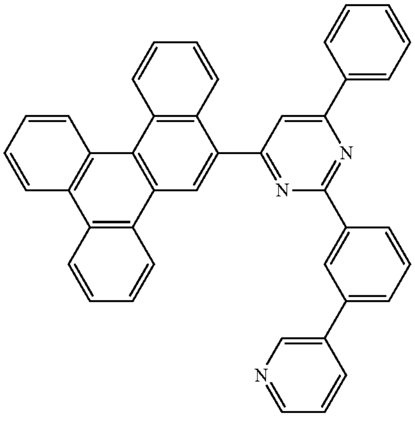

-continued
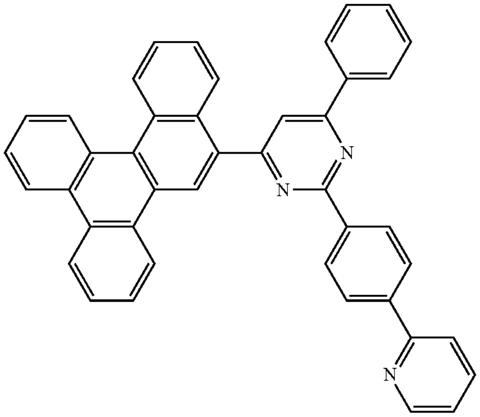
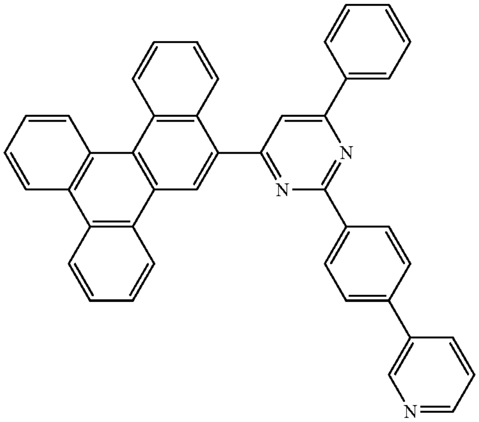
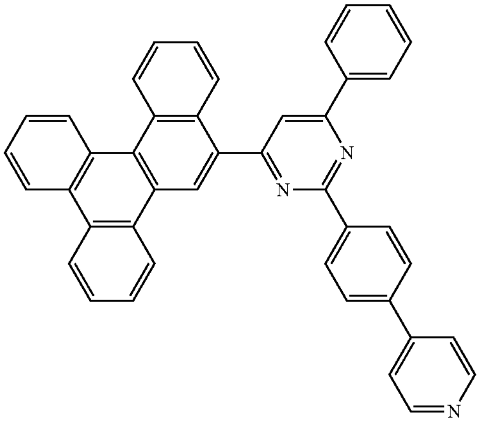
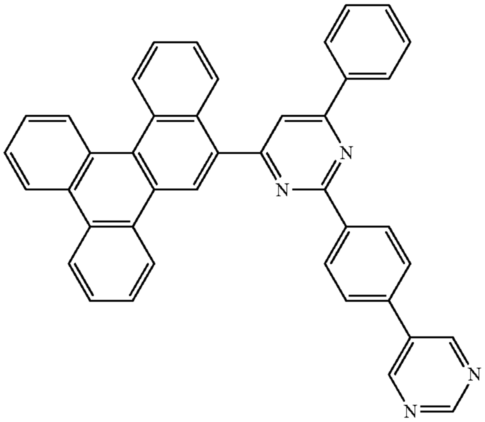
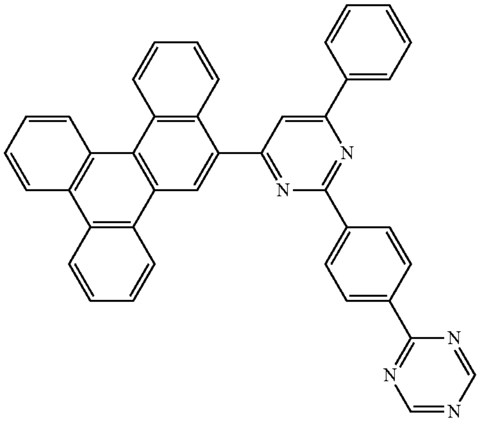
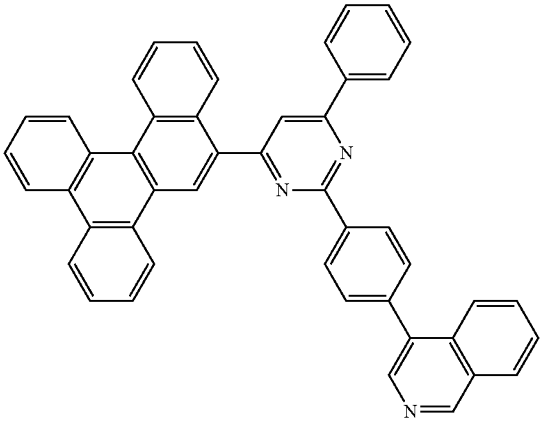
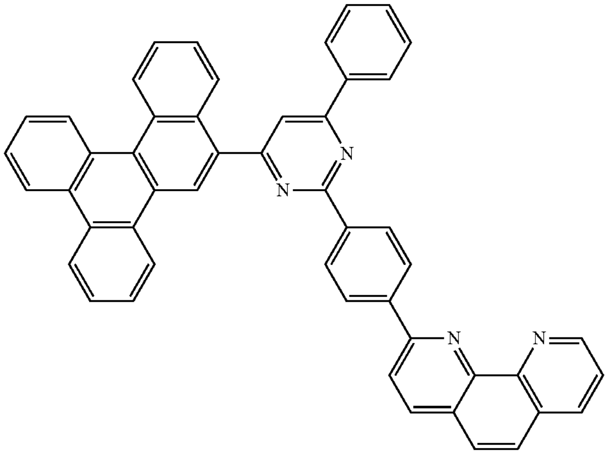
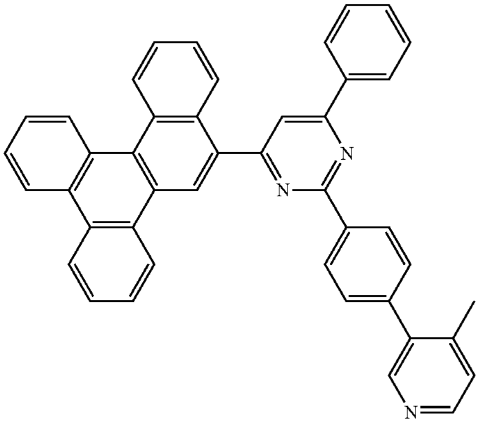

-continued
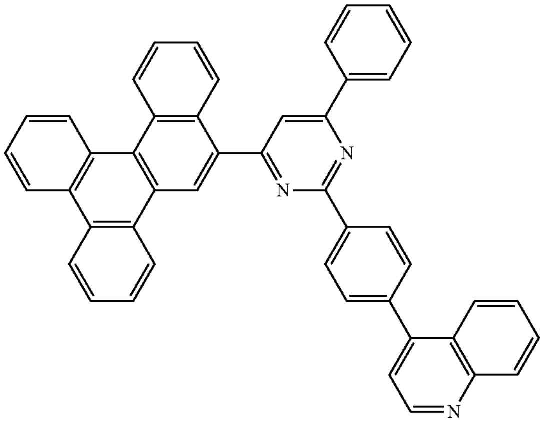
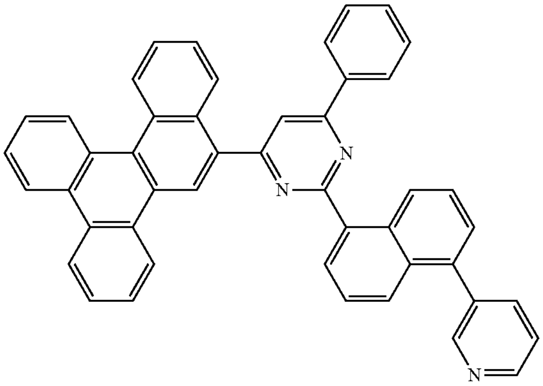
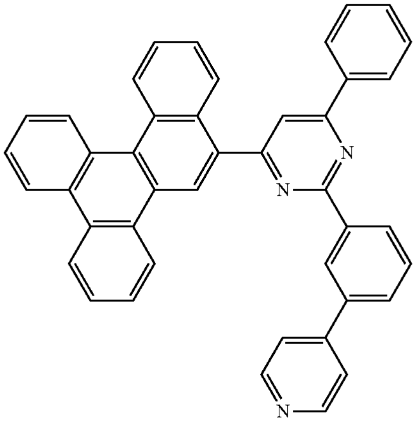
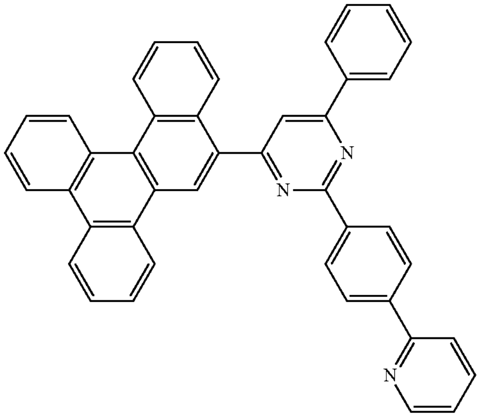
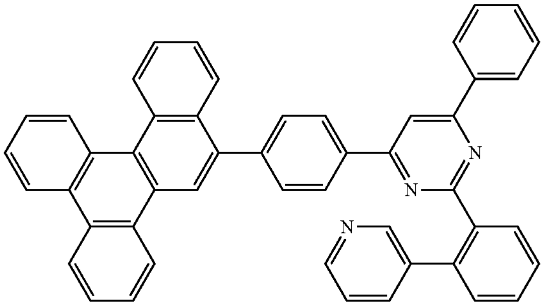
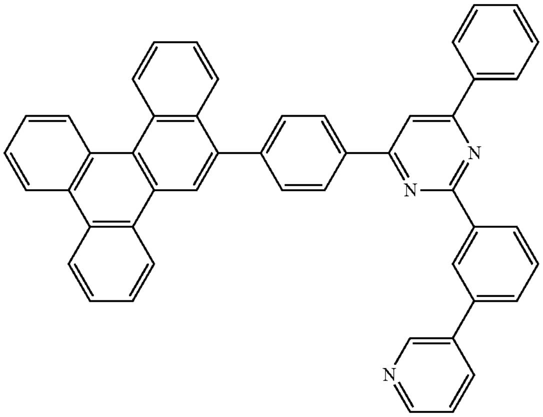
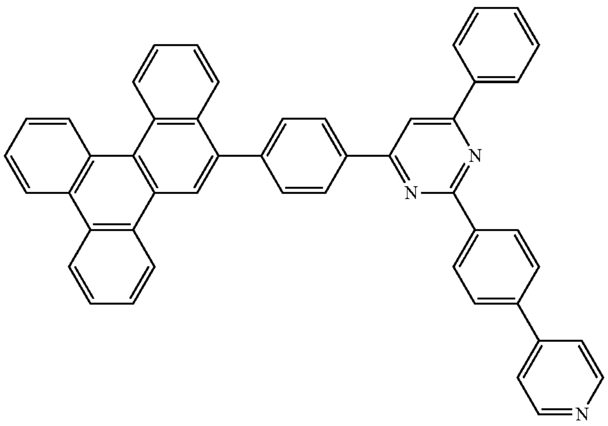

-continued
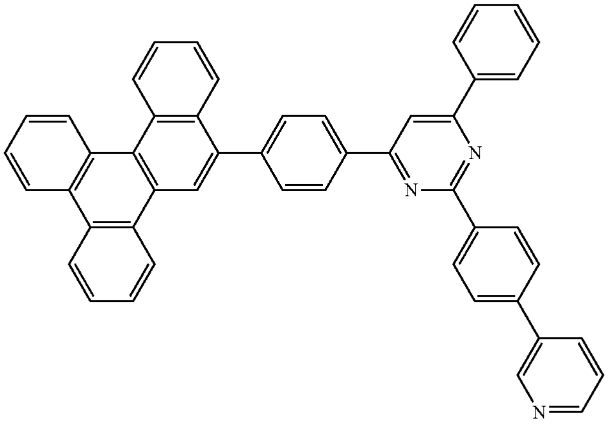
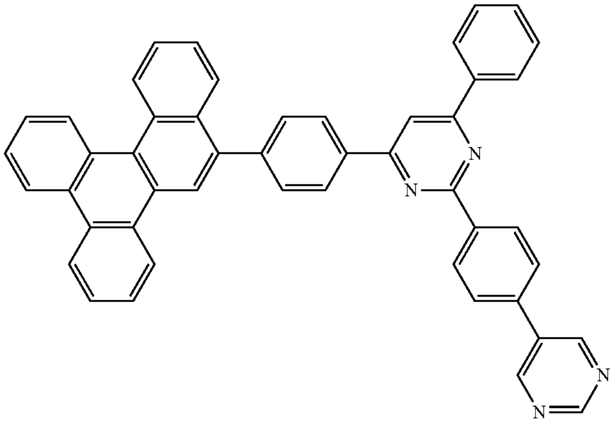
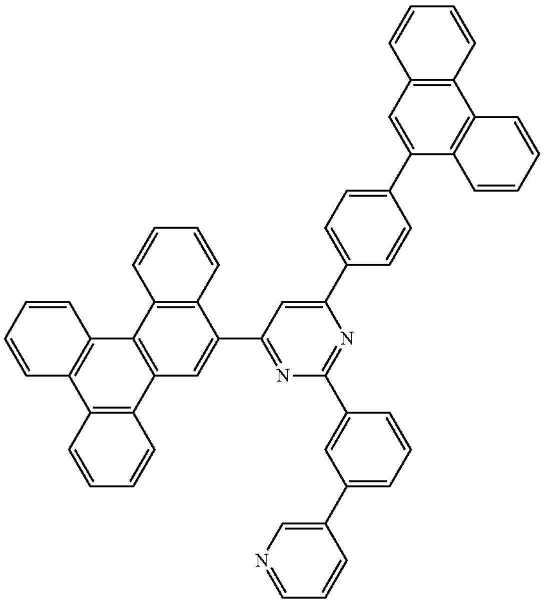
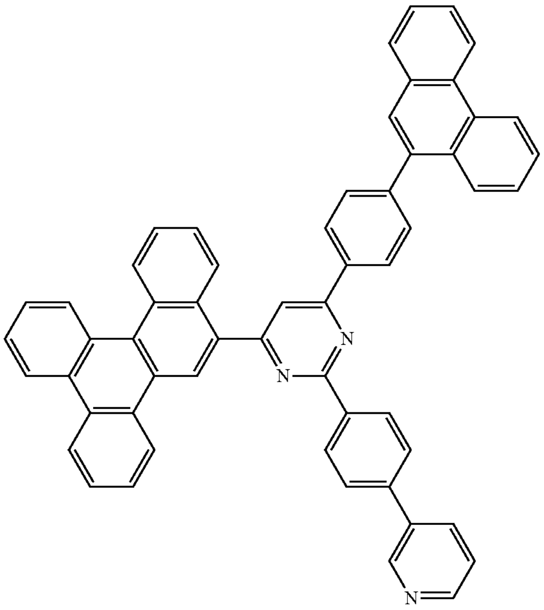

-continued
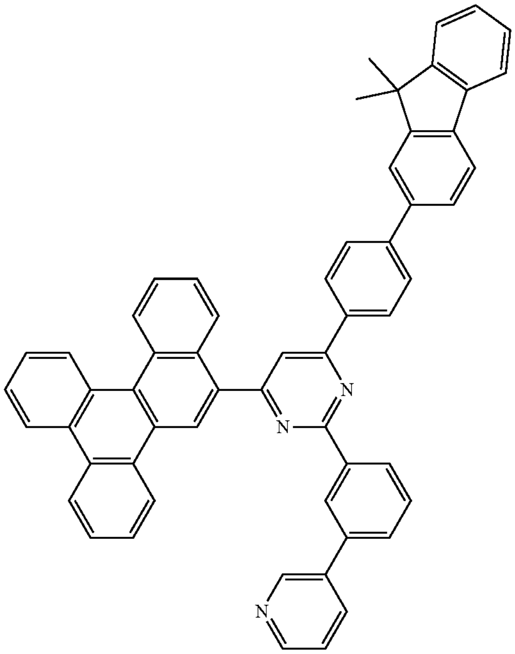
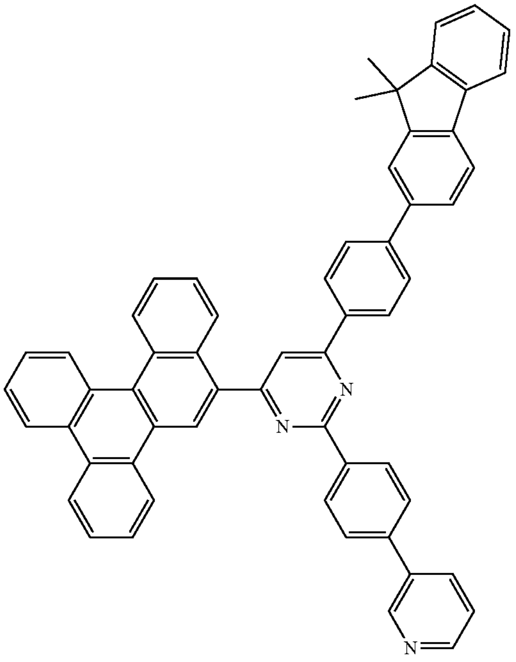
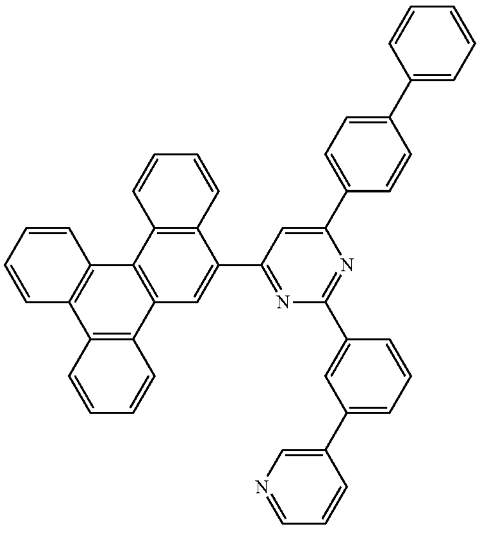
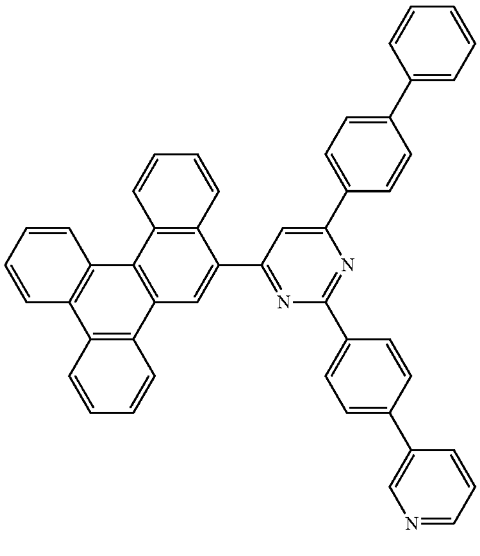

-continued
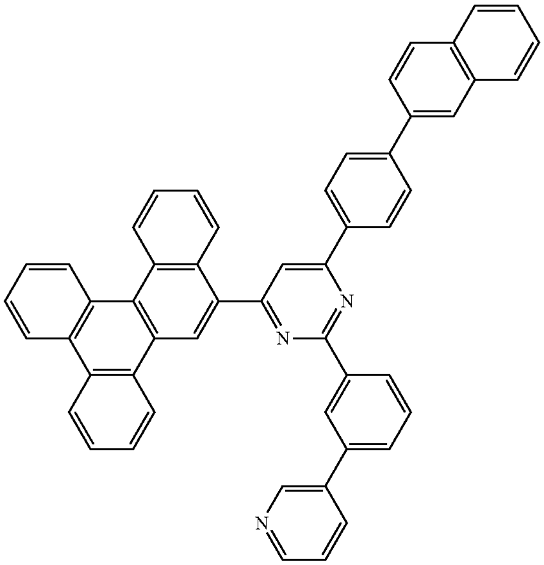
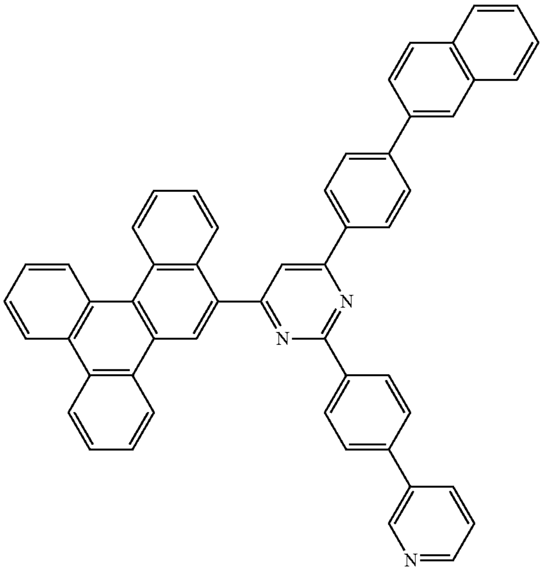
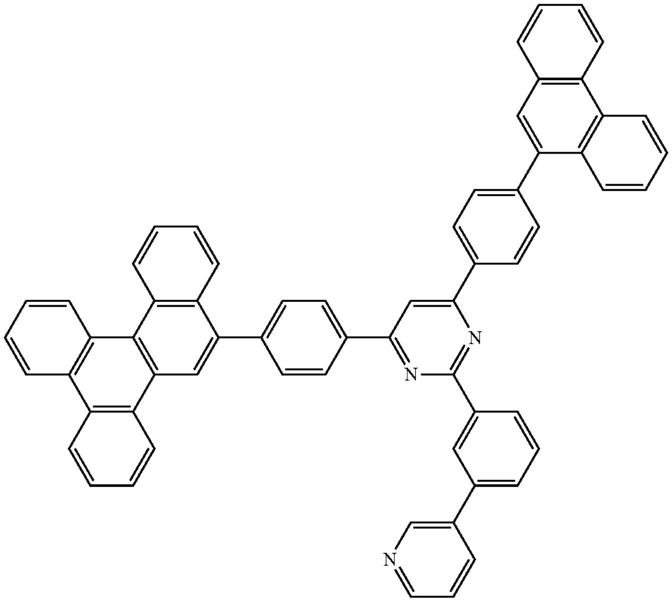

-continued
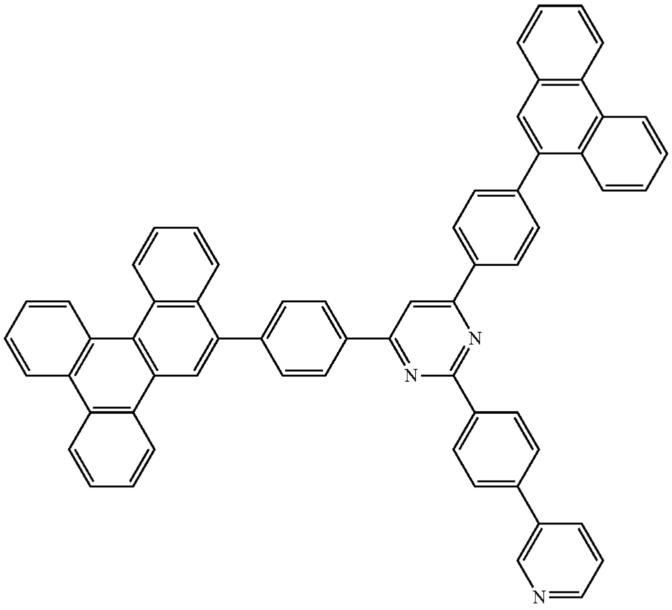
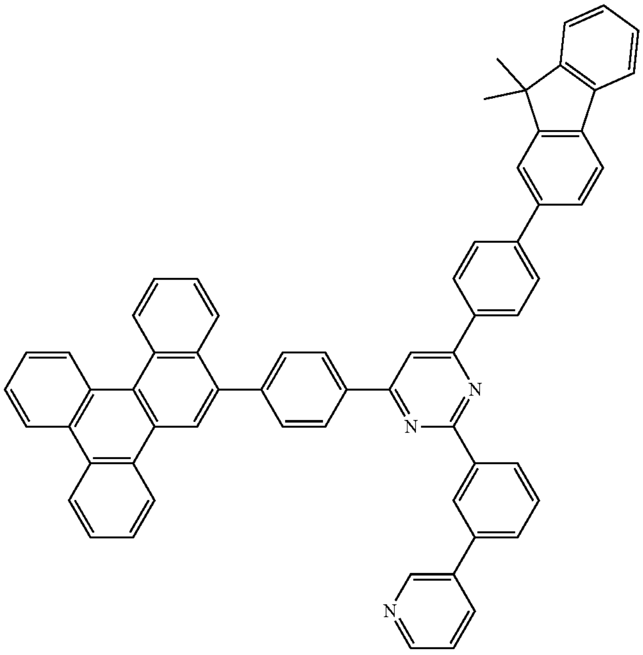

-continued
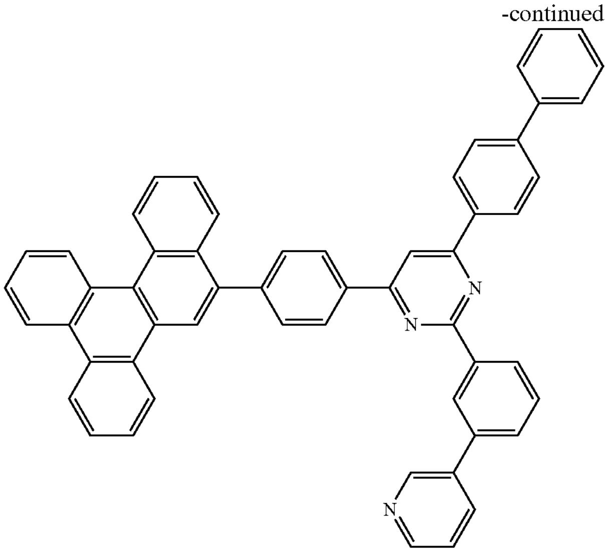
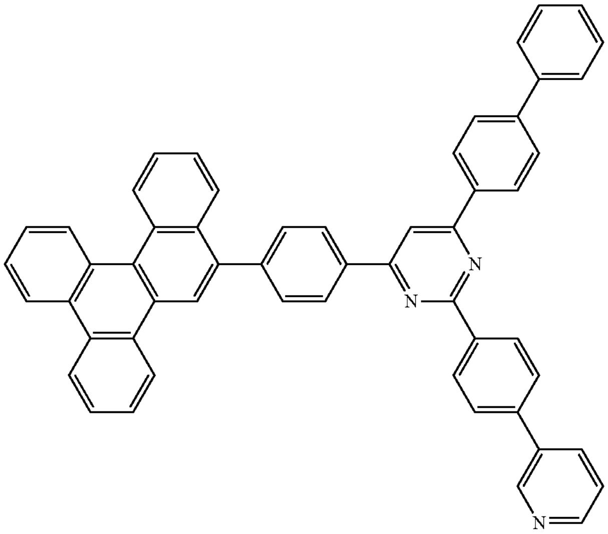
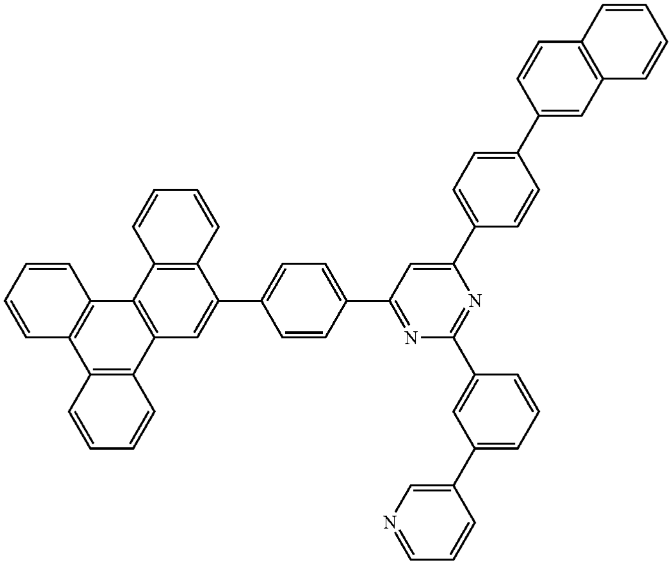

-continued
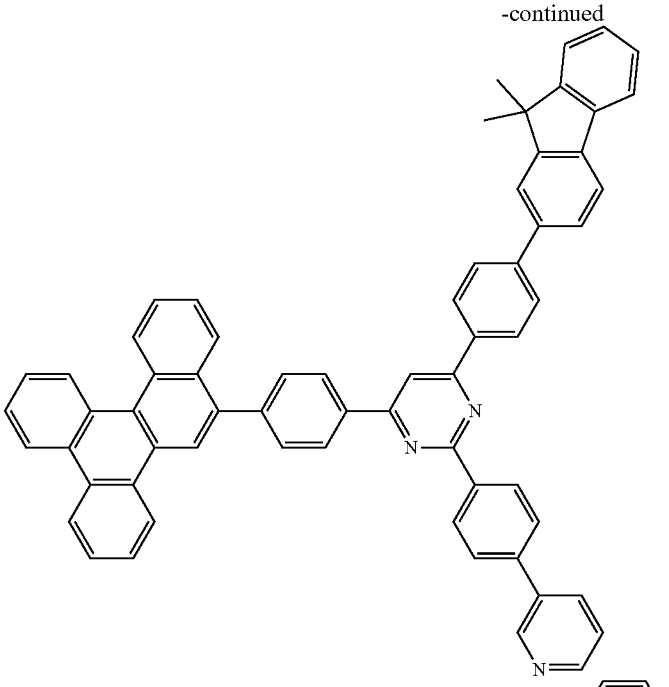
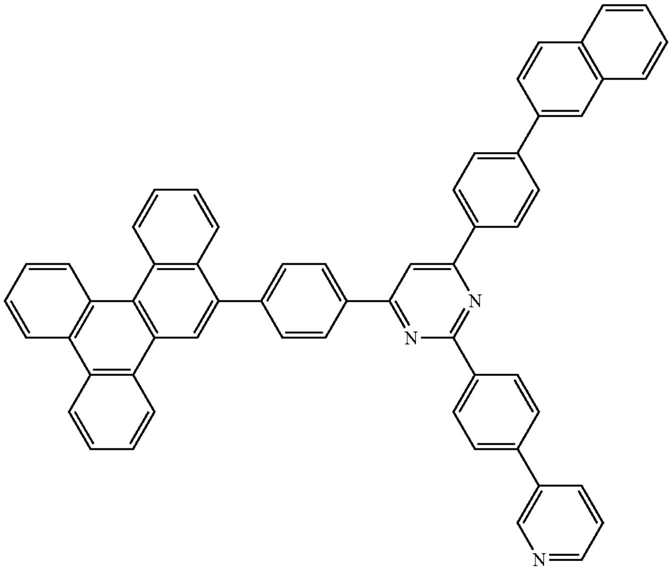
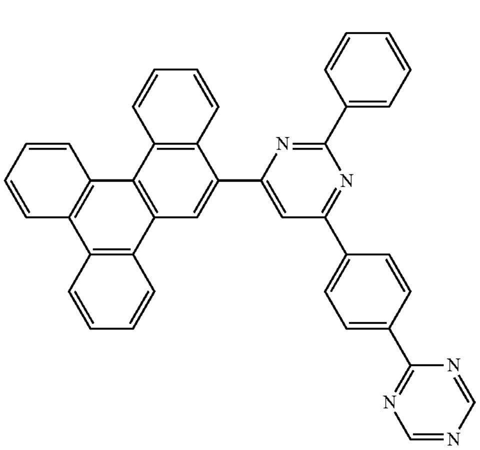
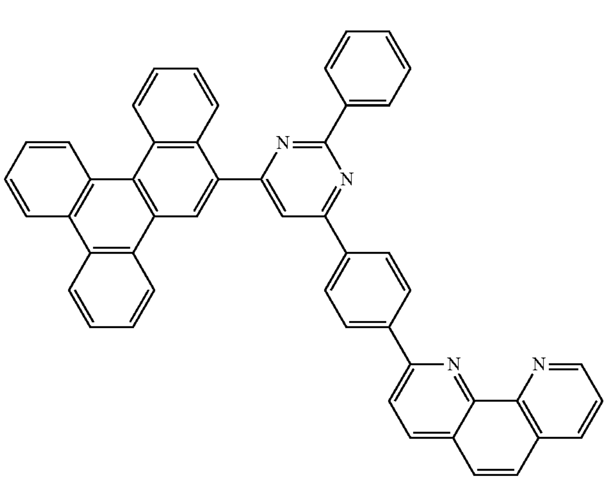

-continued
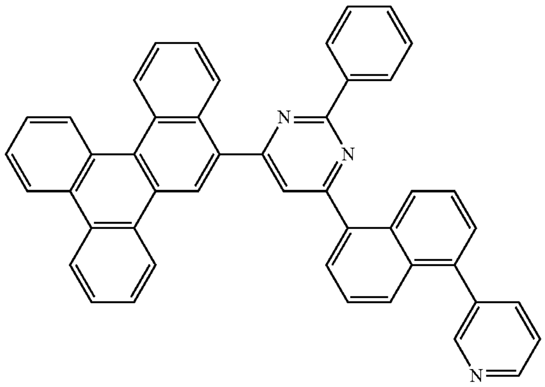
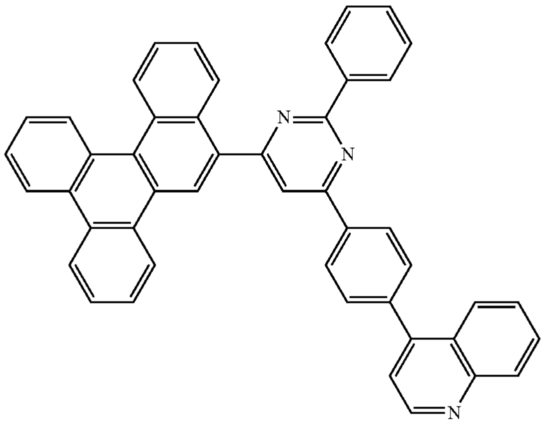
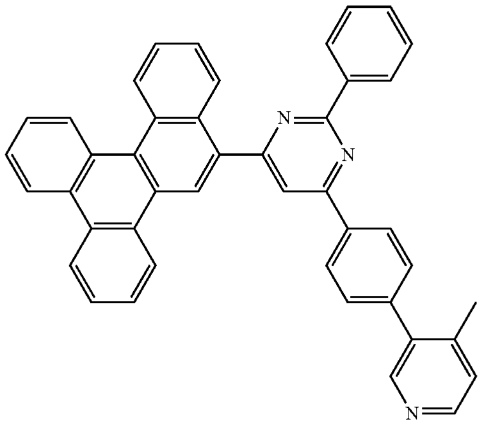
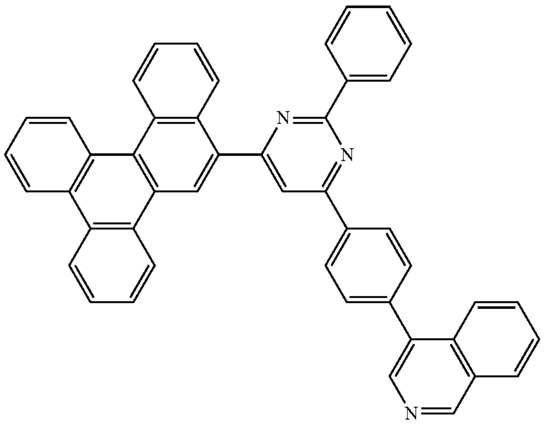
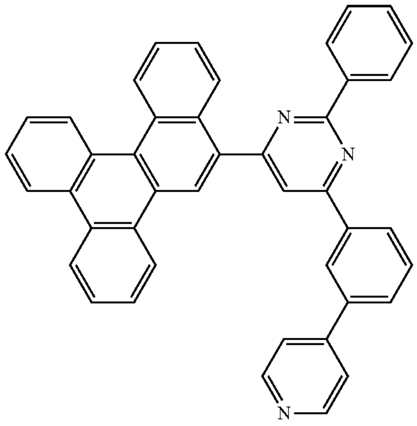
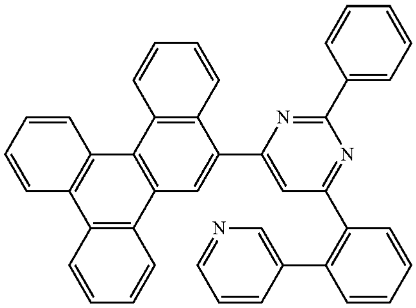
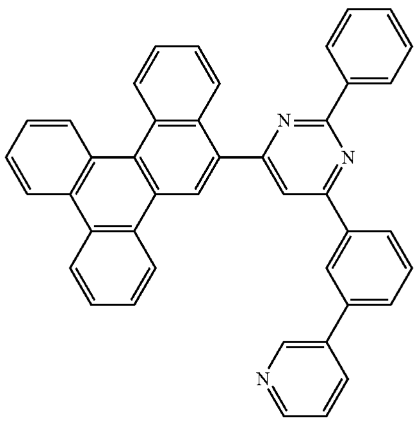
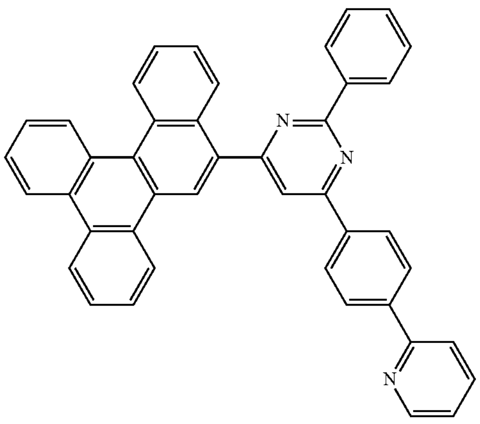

-continued
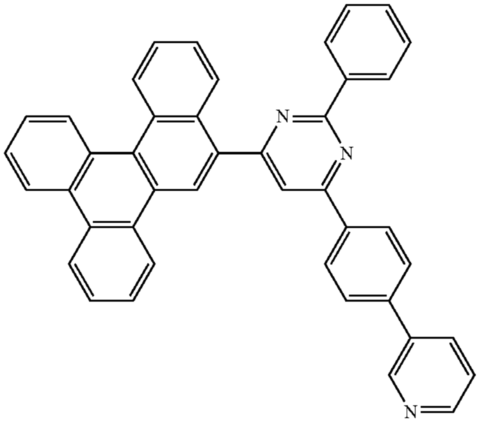
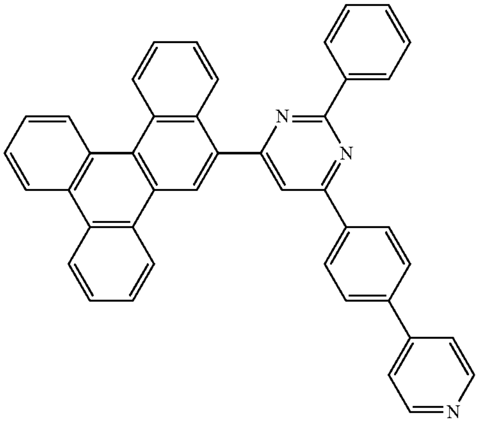
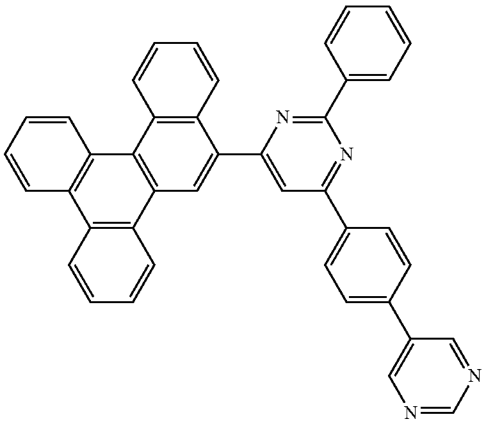
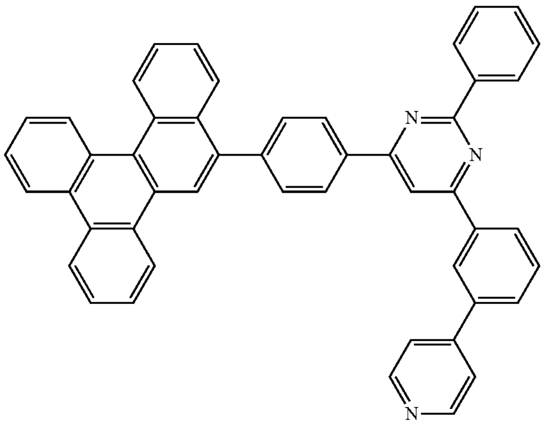
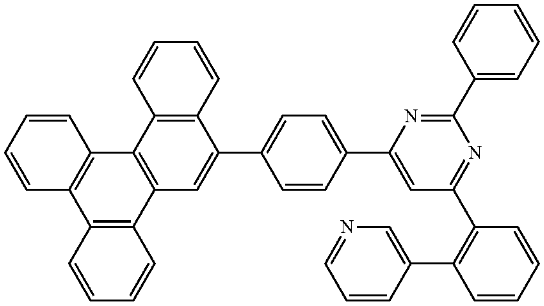
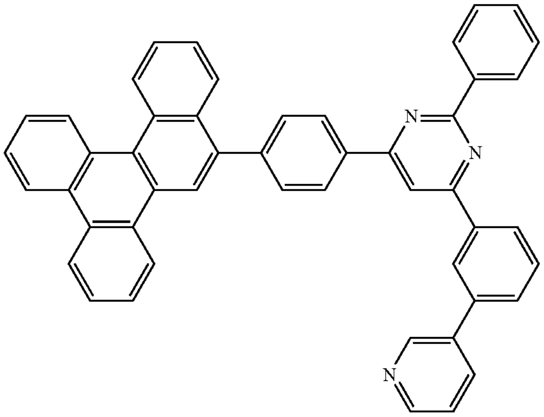
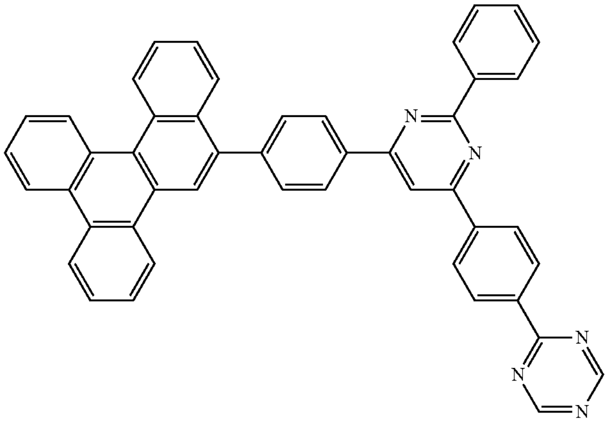

-continued
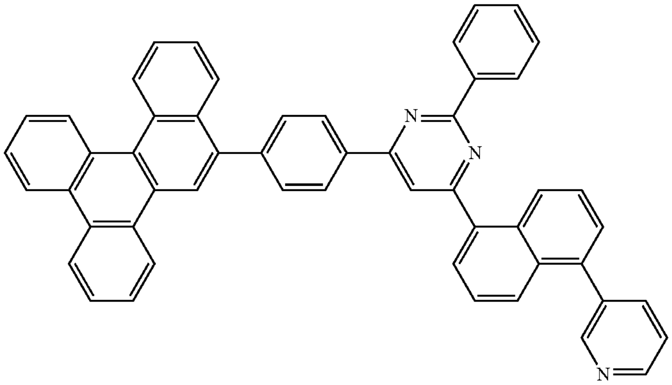
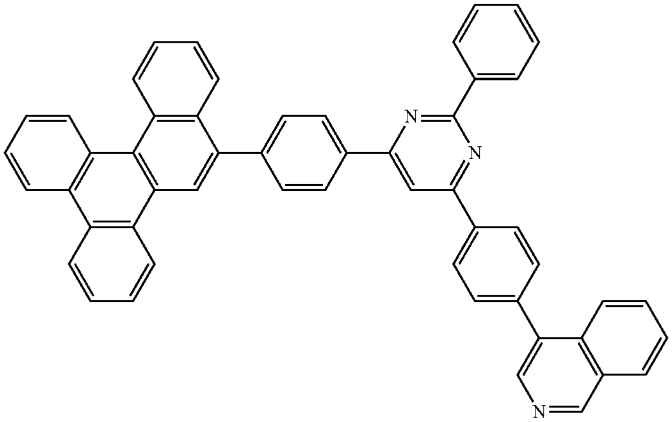
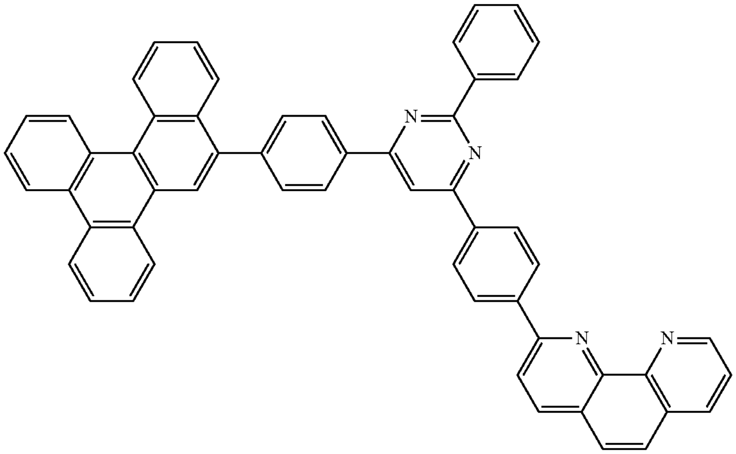
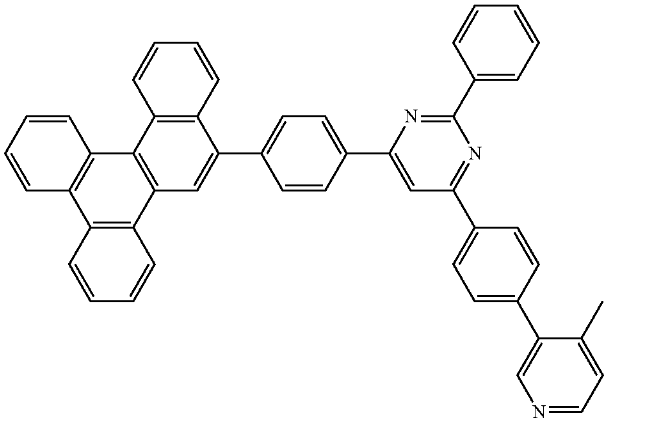

-continued
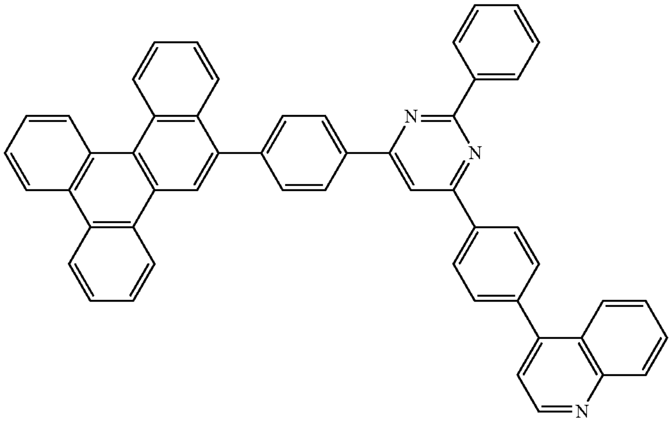
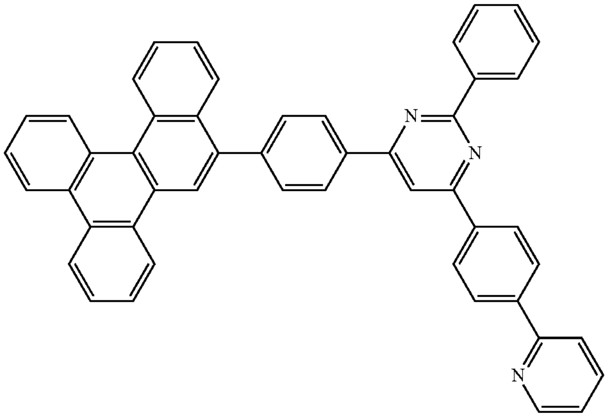
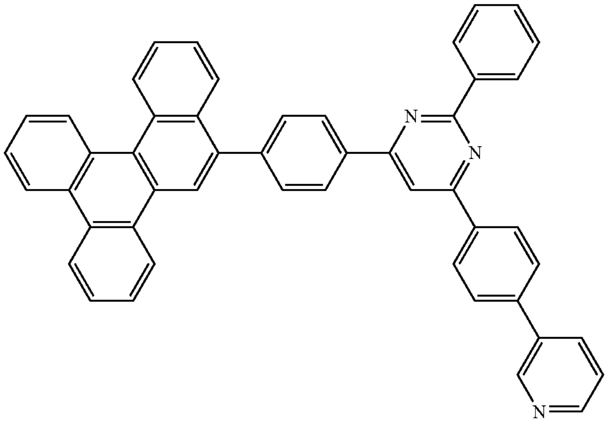
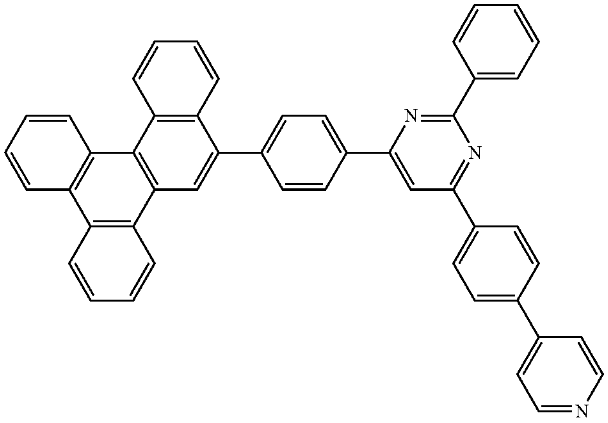

-continued
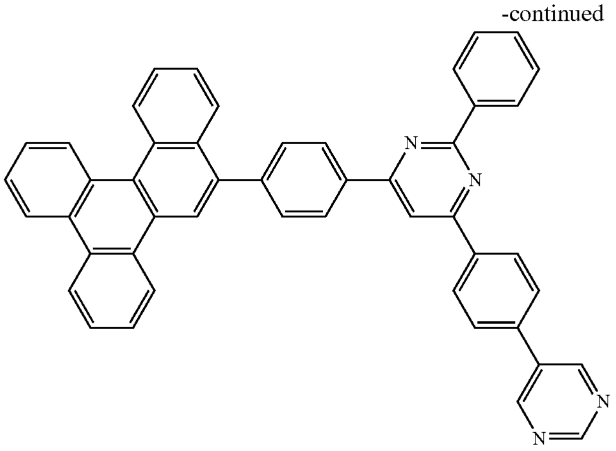
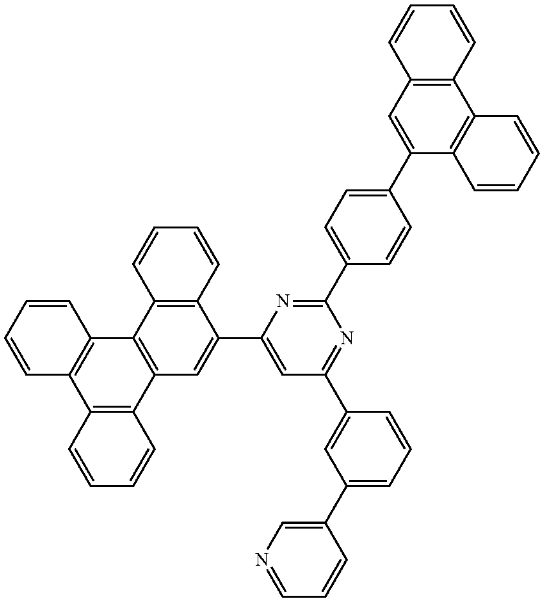
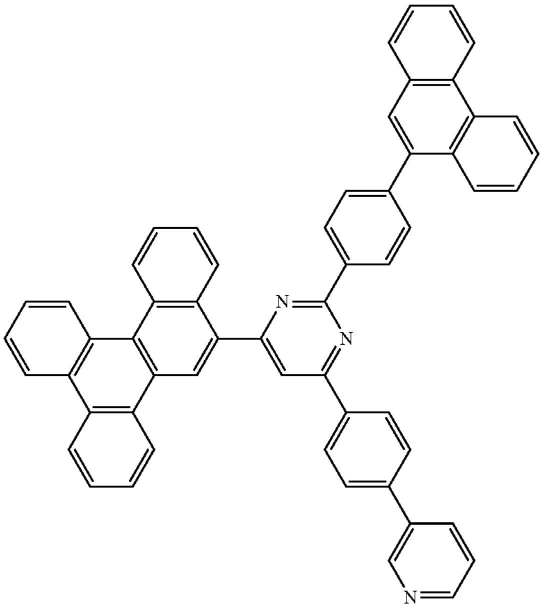
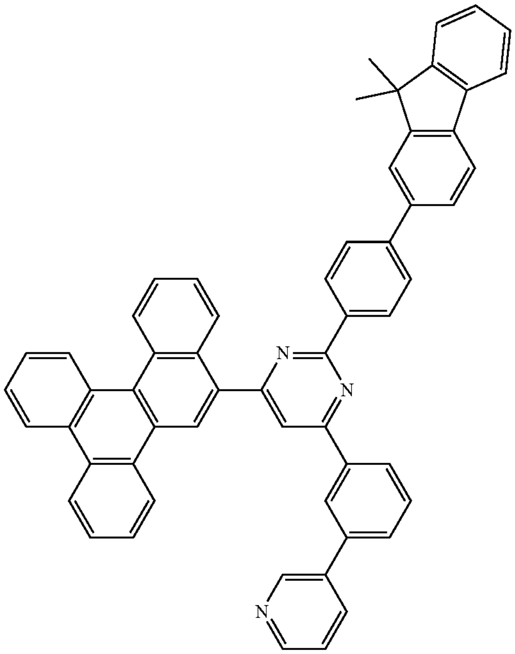
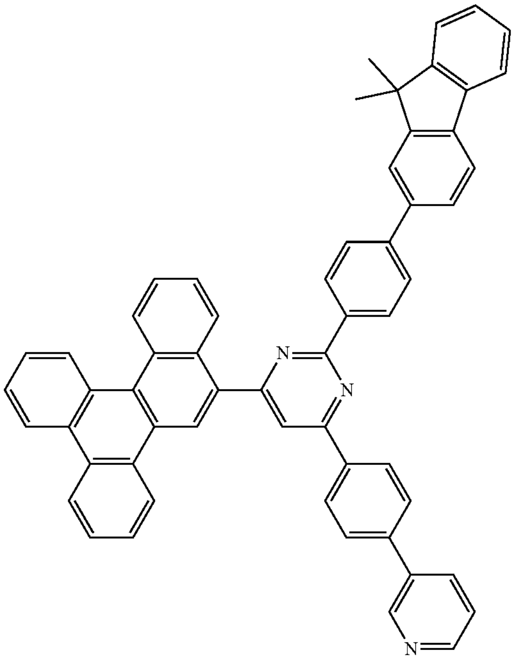

-continued
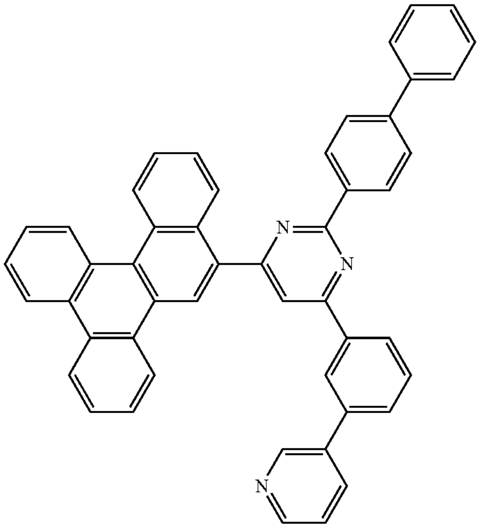
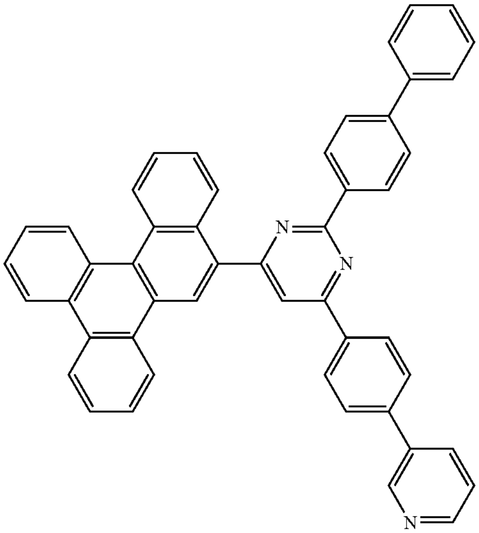
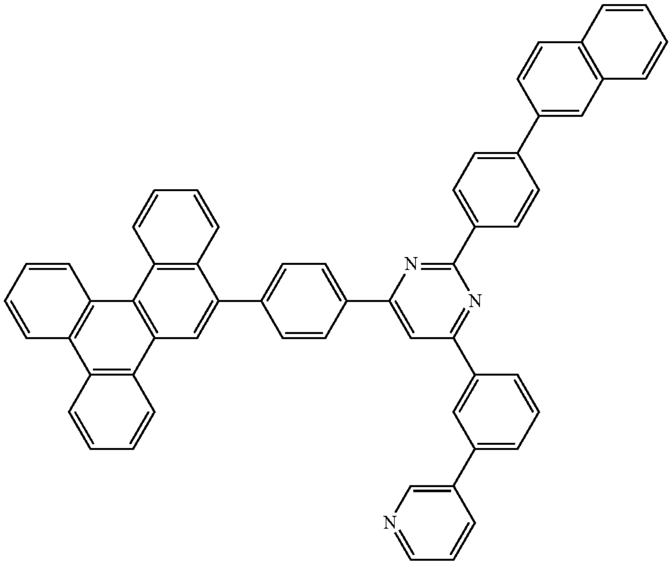
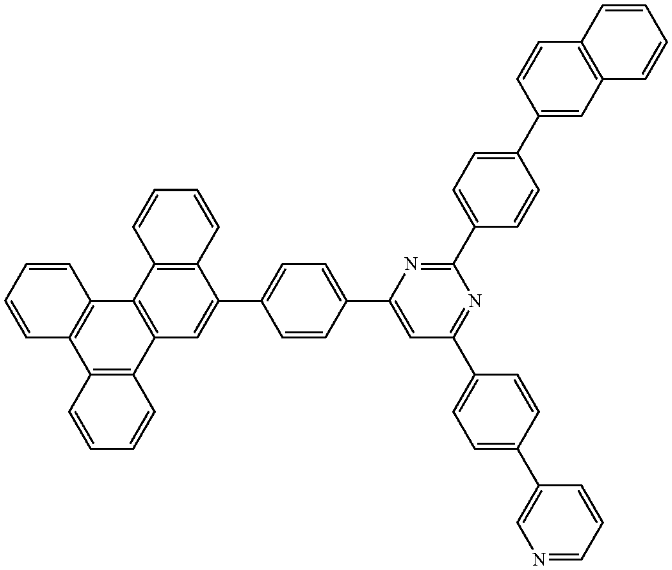

-continued
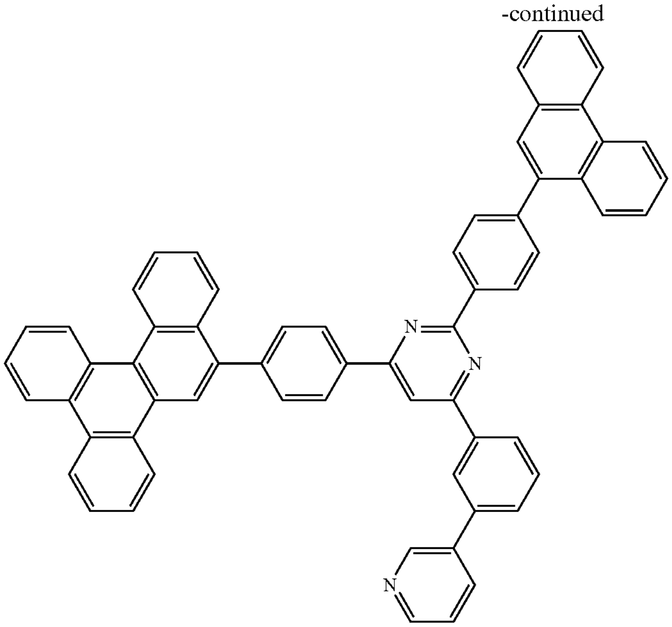
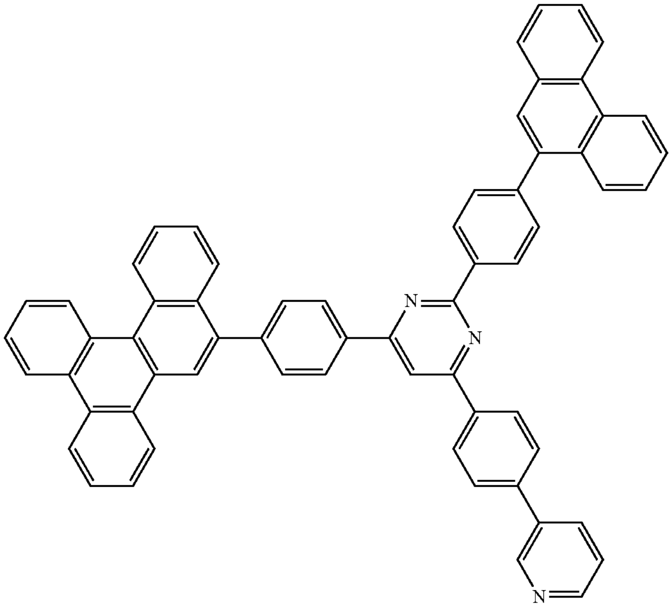

-continued
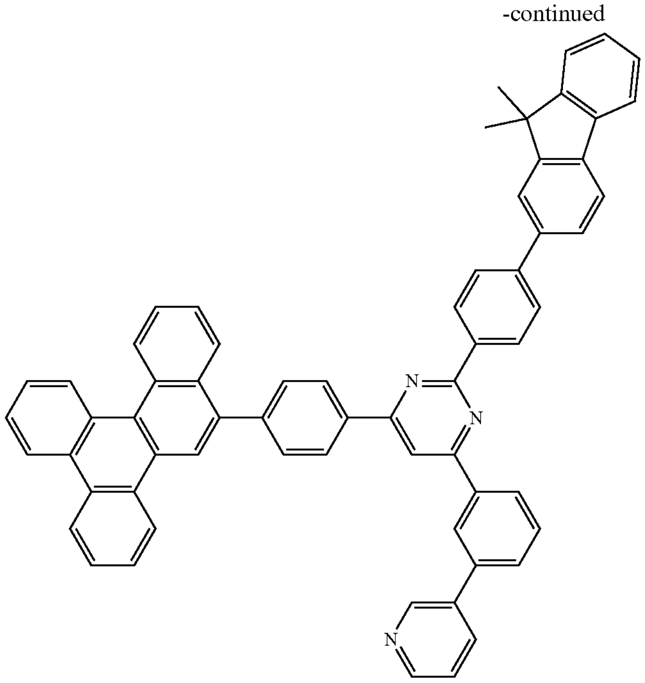
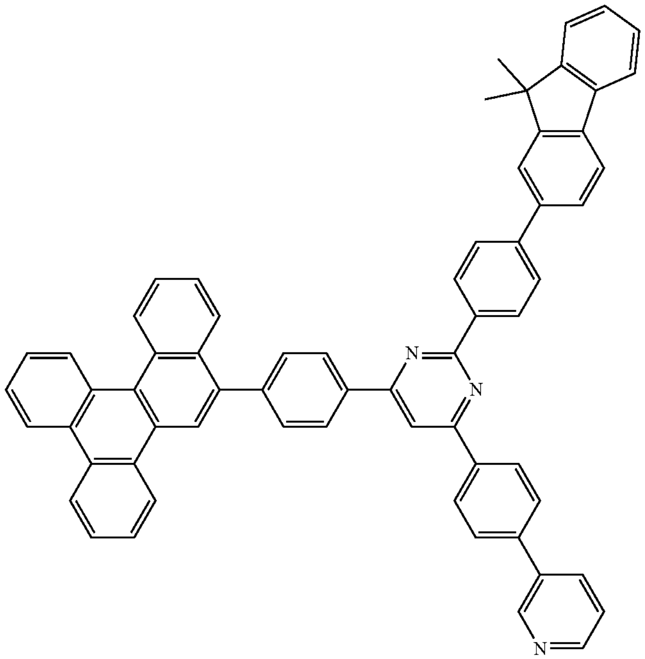

-continued
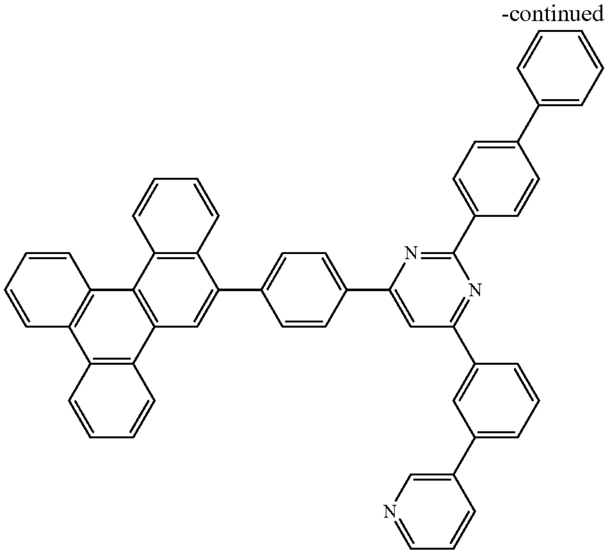
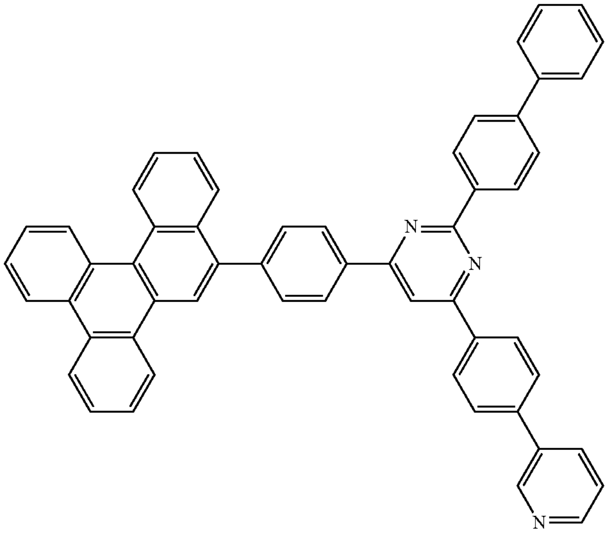
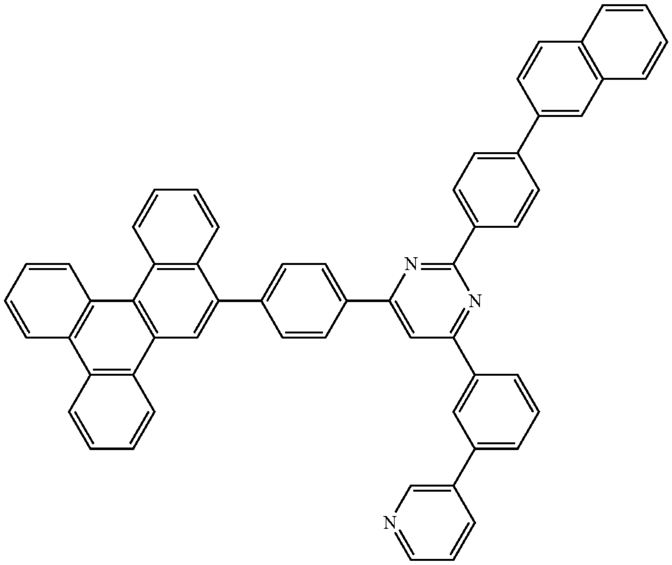

-continued
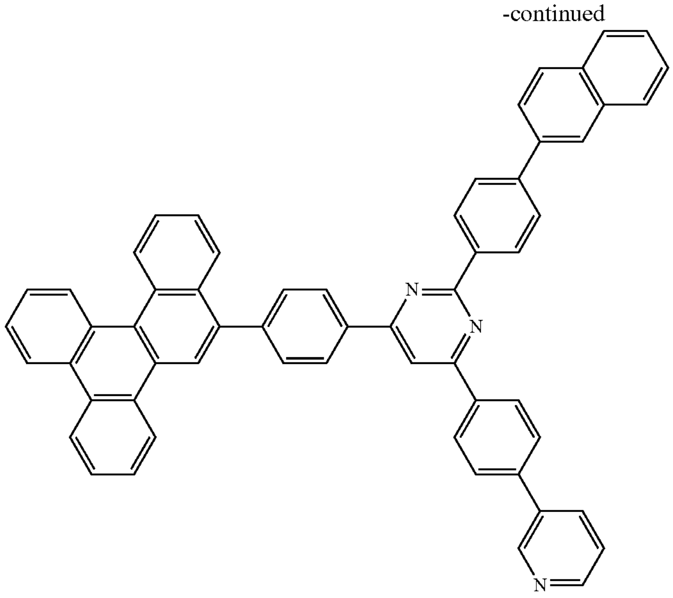
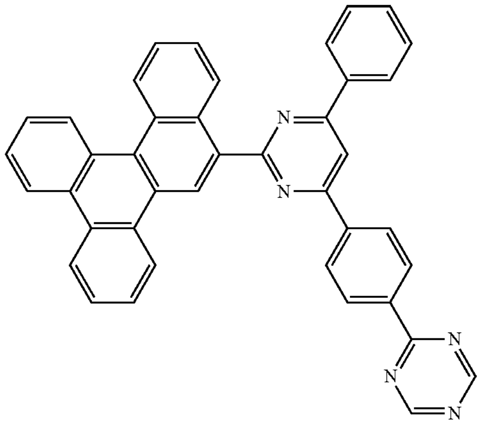
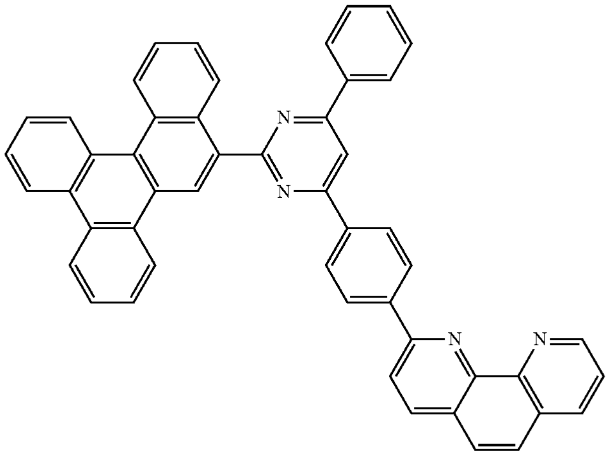
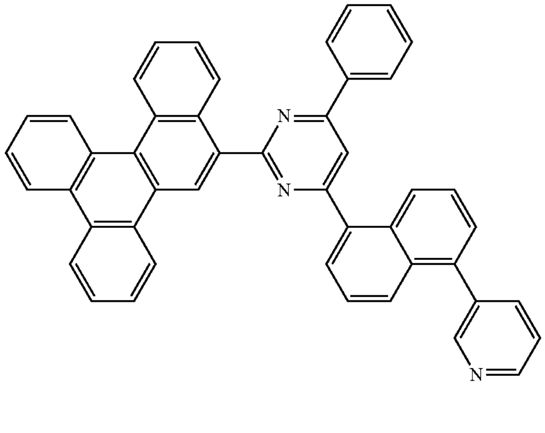
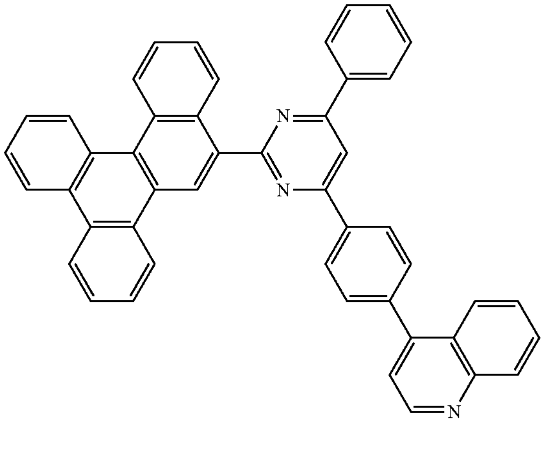

-continued
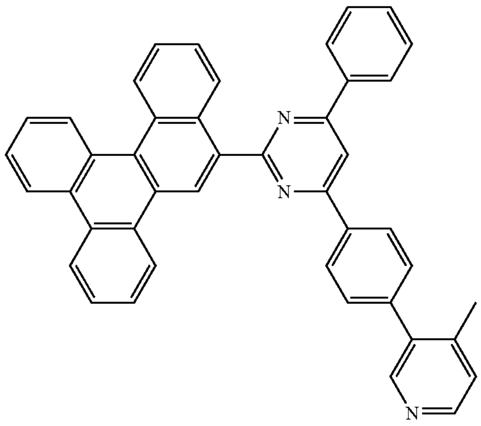
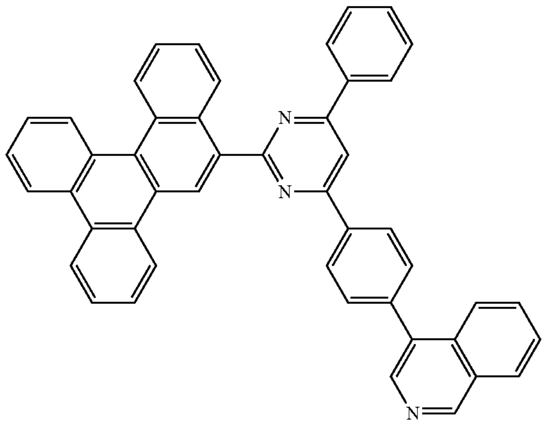
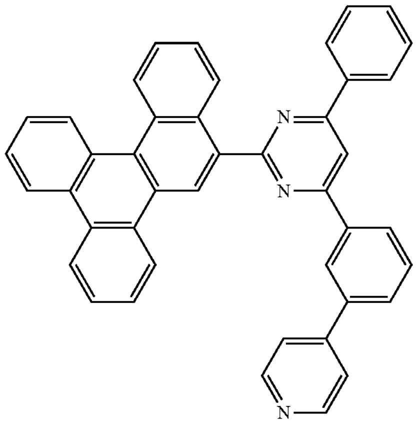
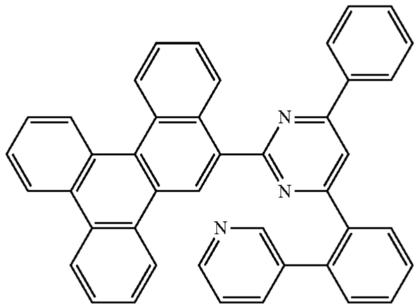
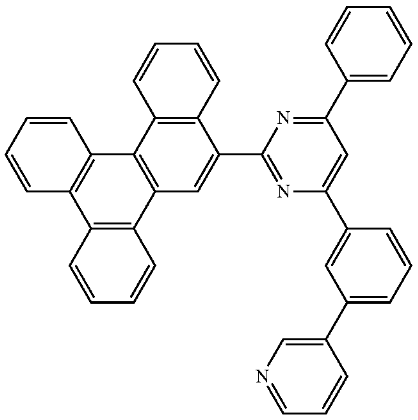
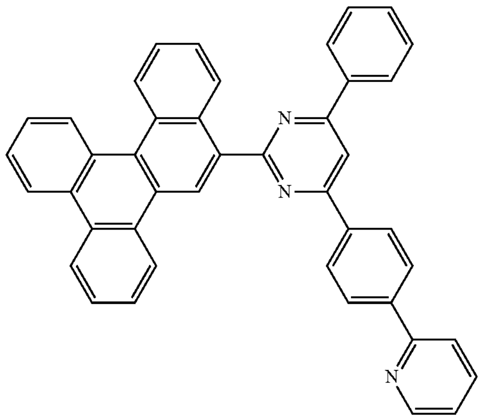
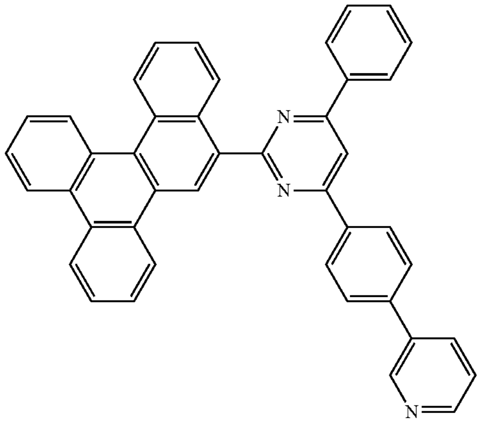
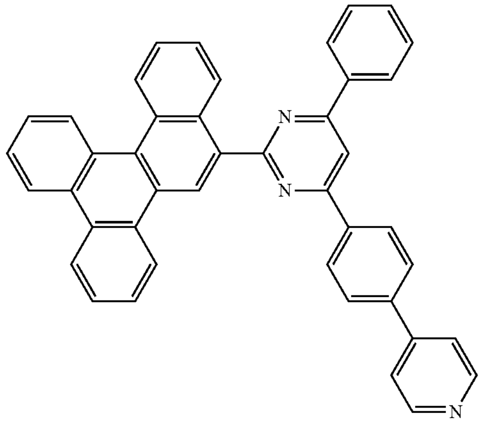

-continued
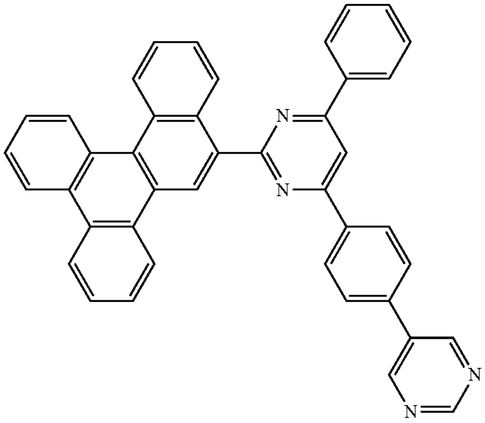
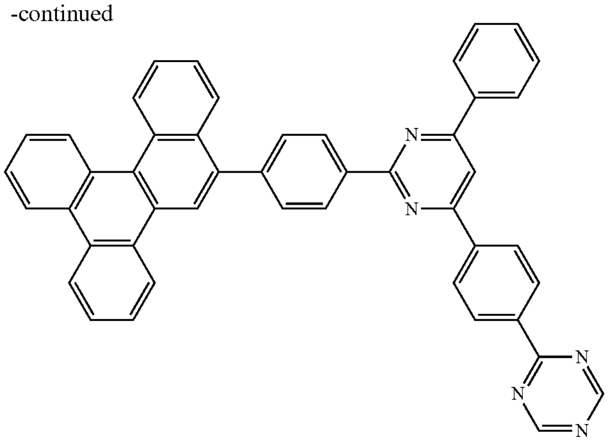
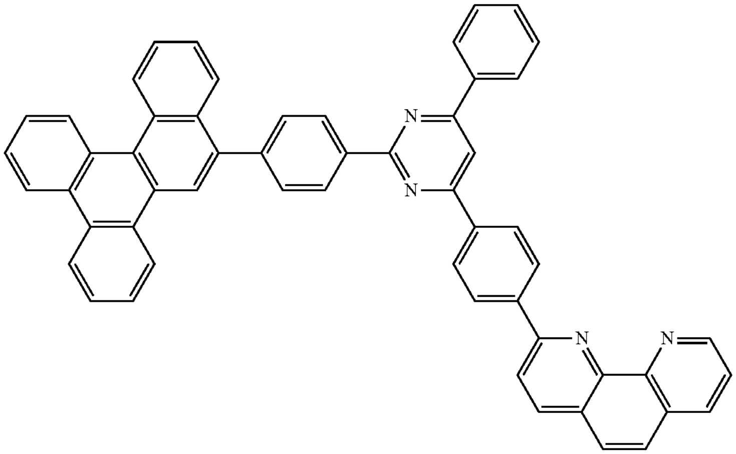
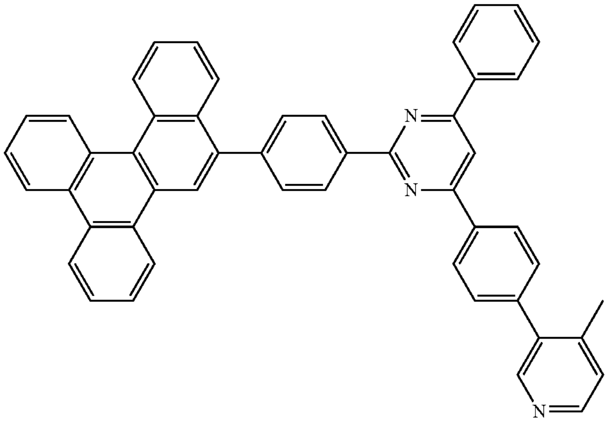
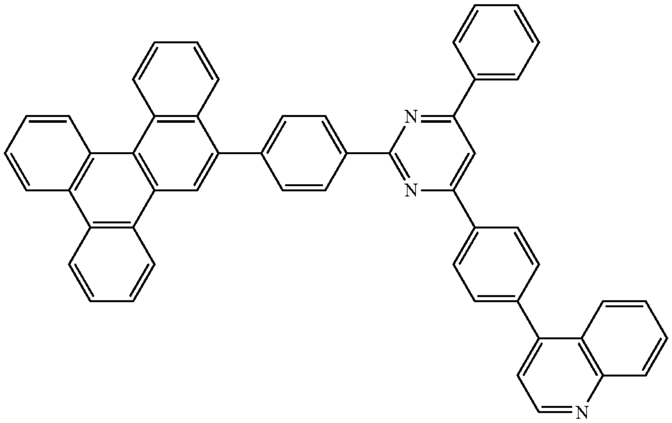

-continued
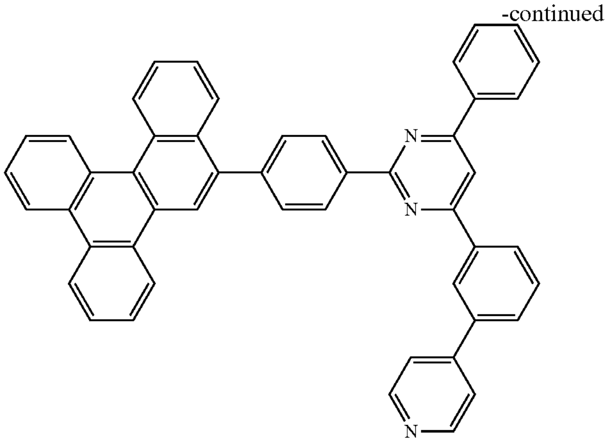
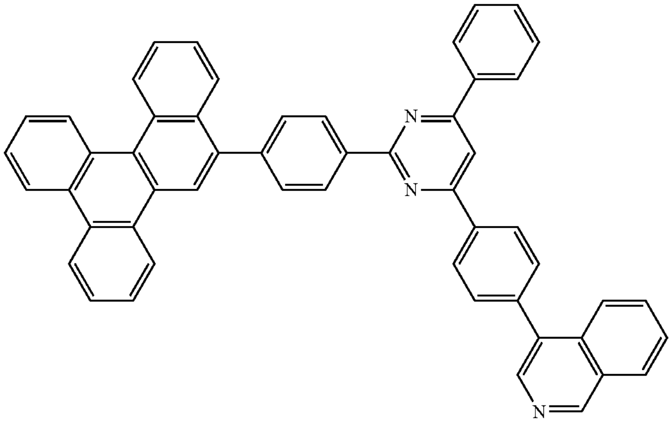
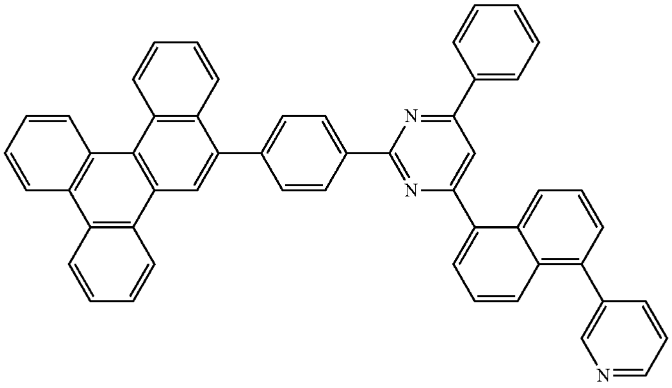
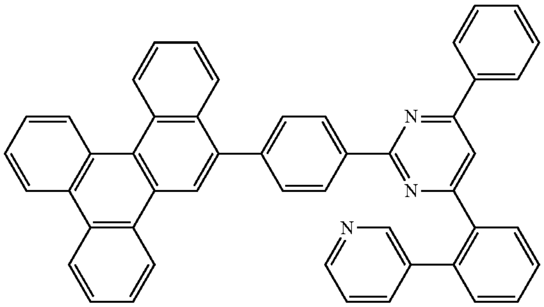
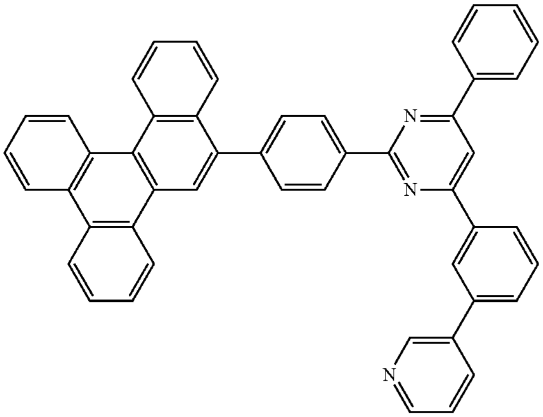

-continued
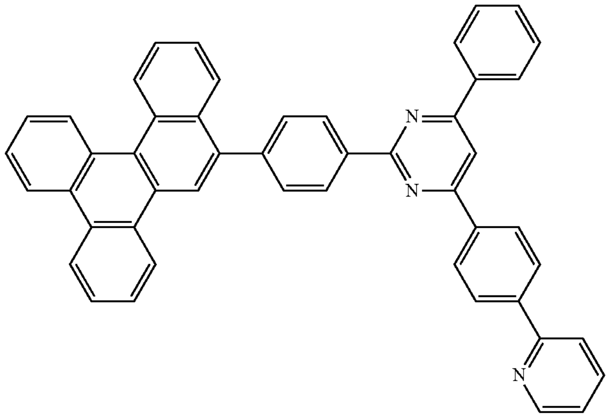
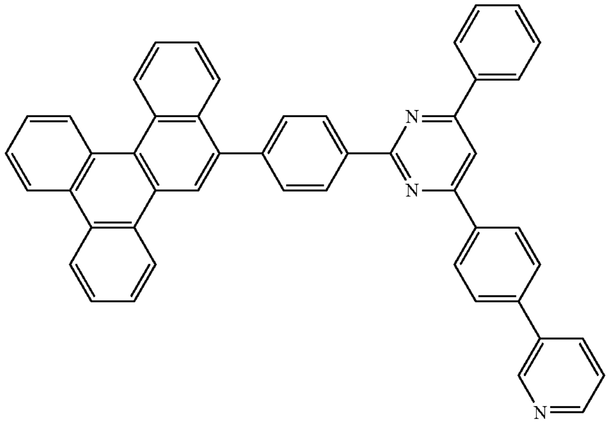
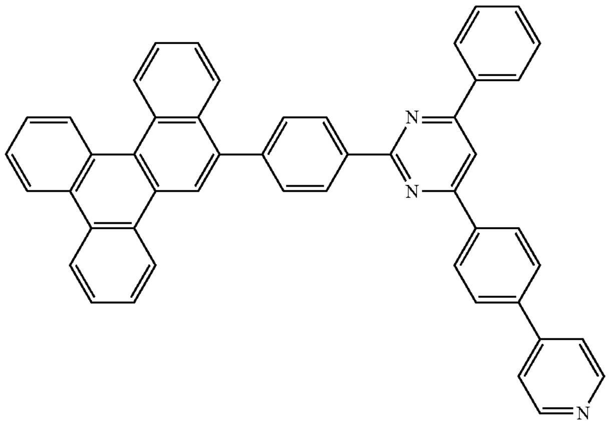

-continued
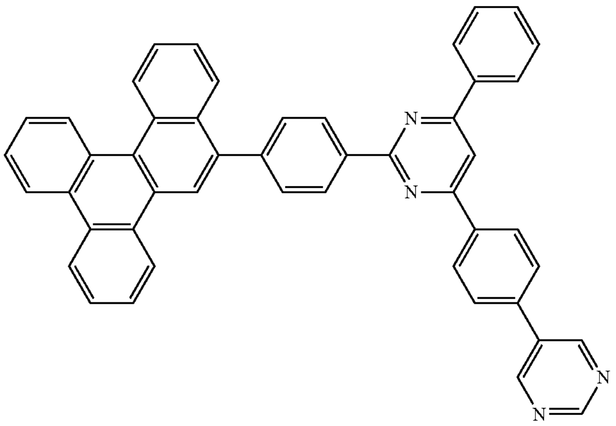
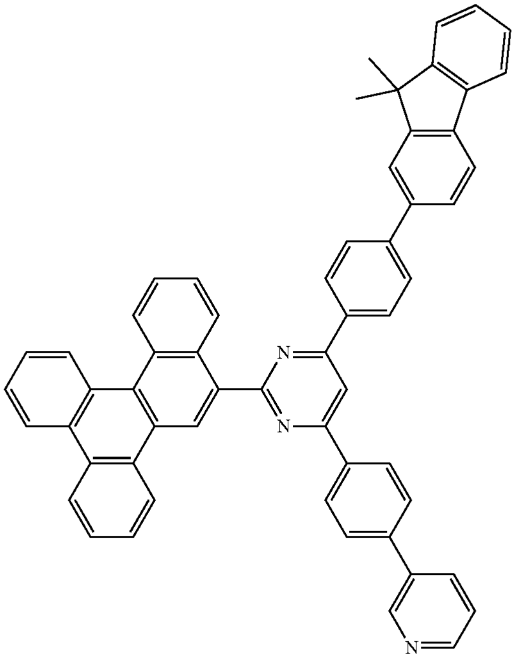
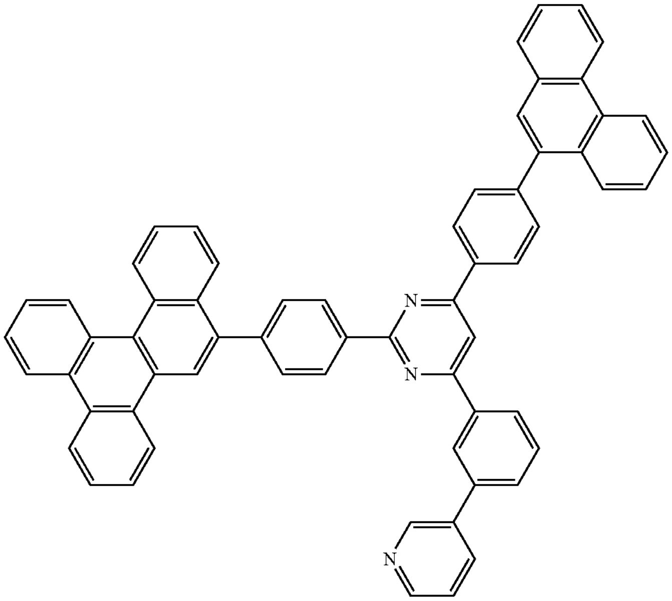

-continued
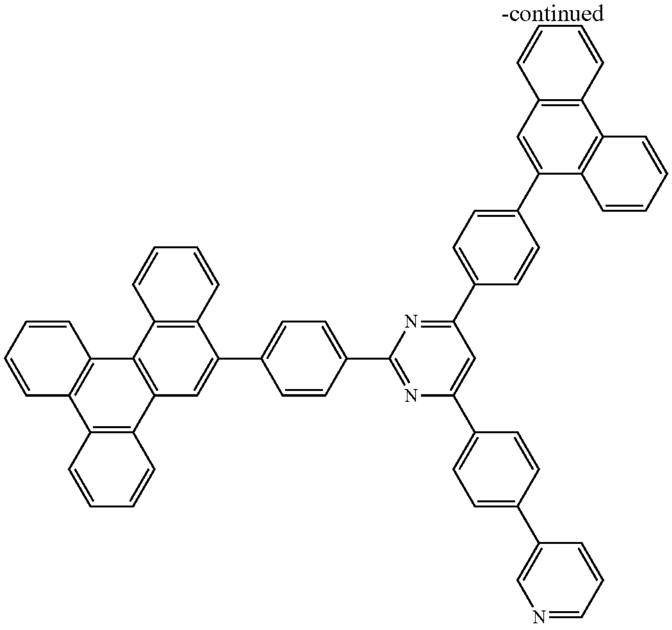
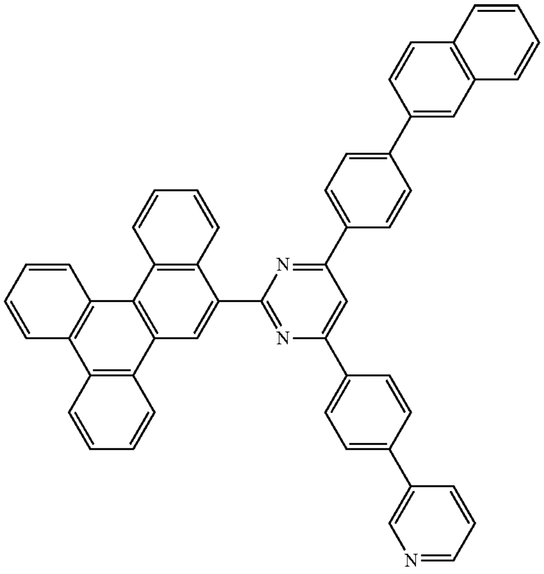
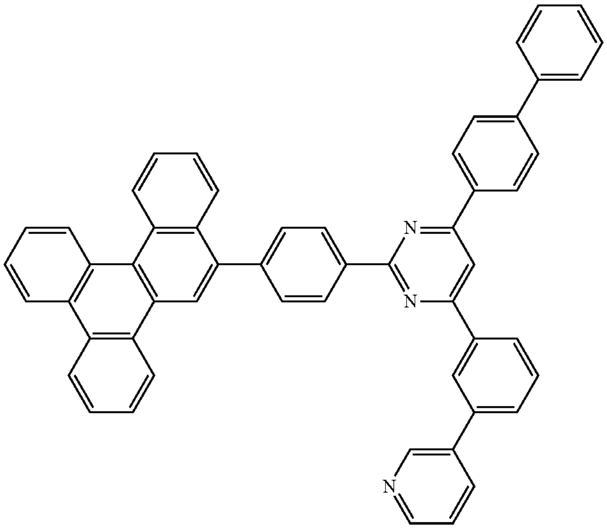
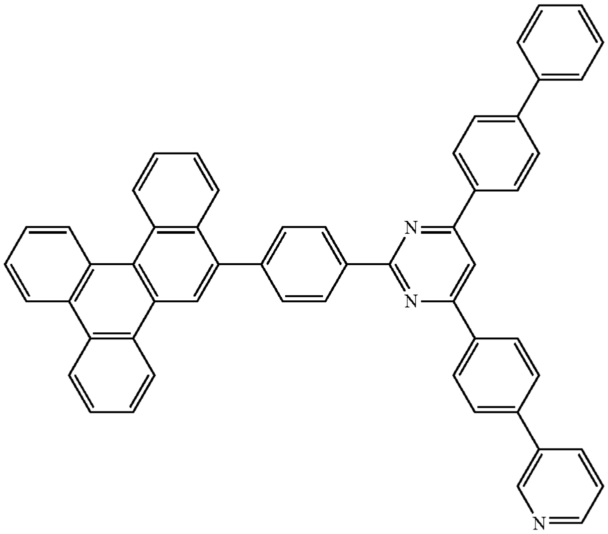

-continued
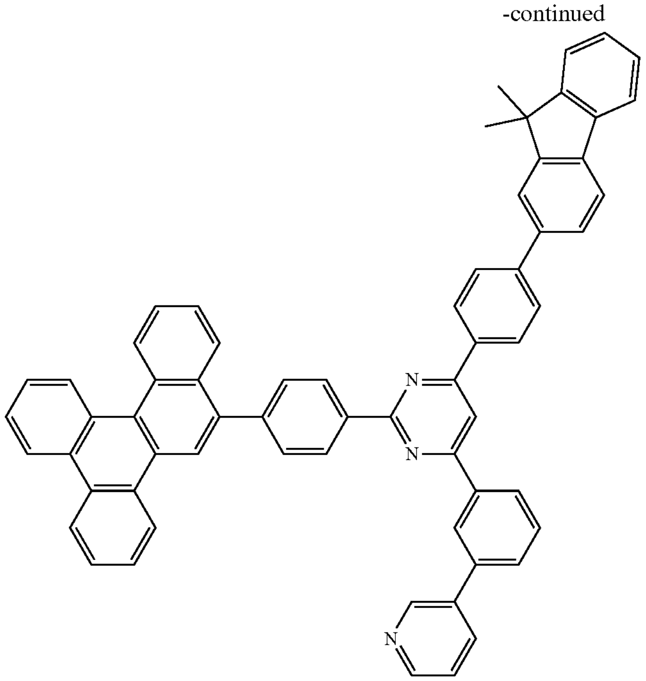
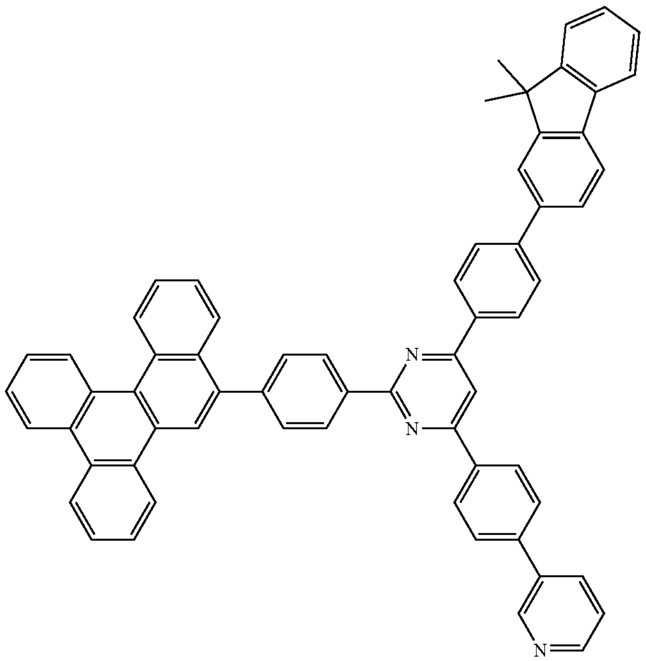

-continued
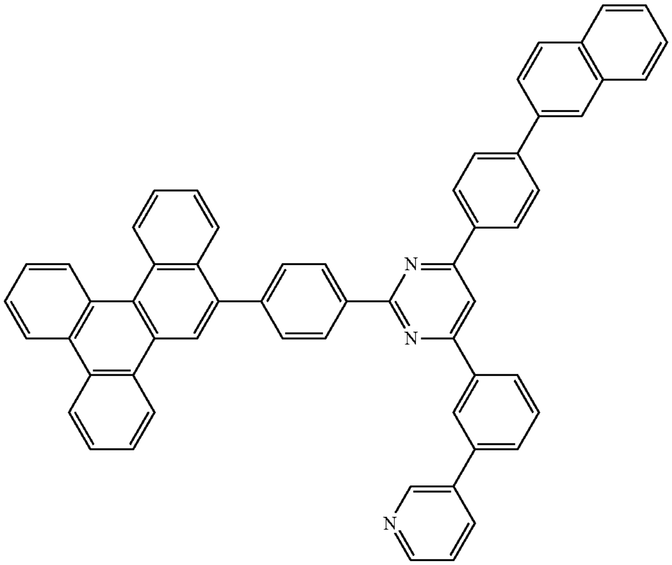
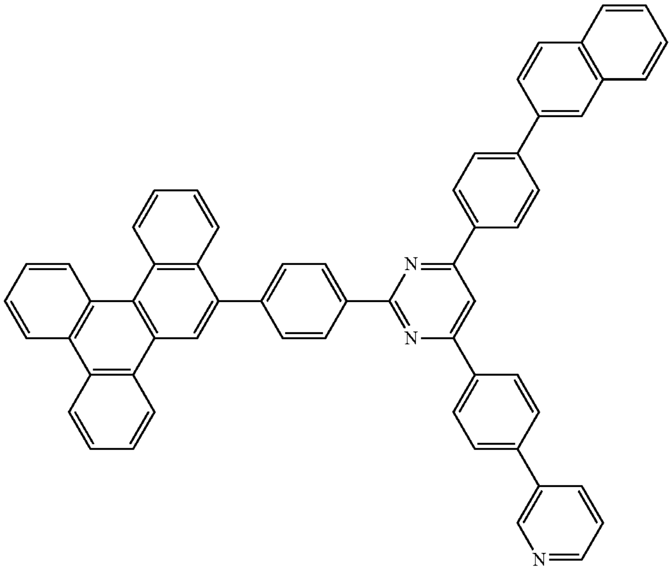
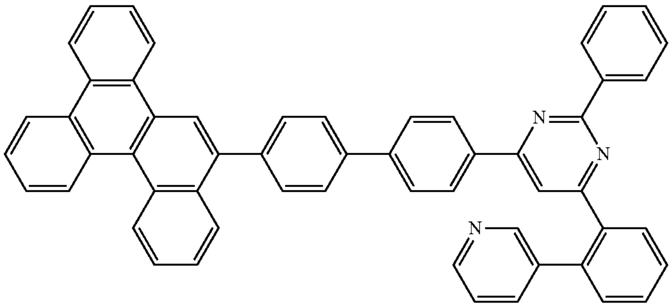

-continued
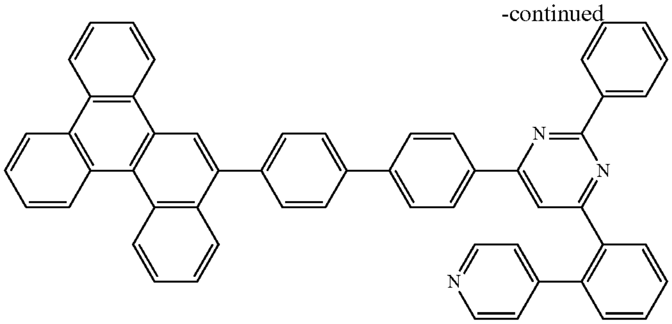
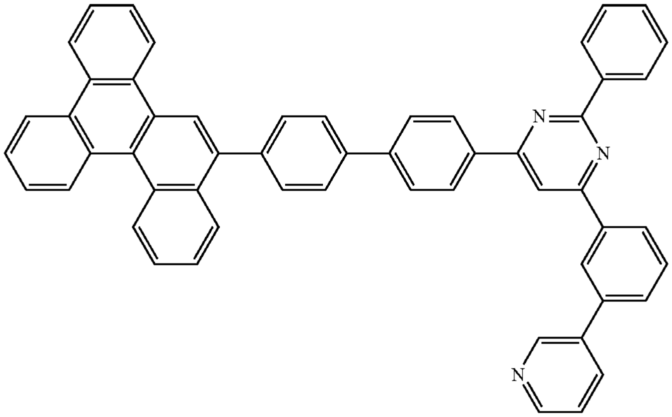
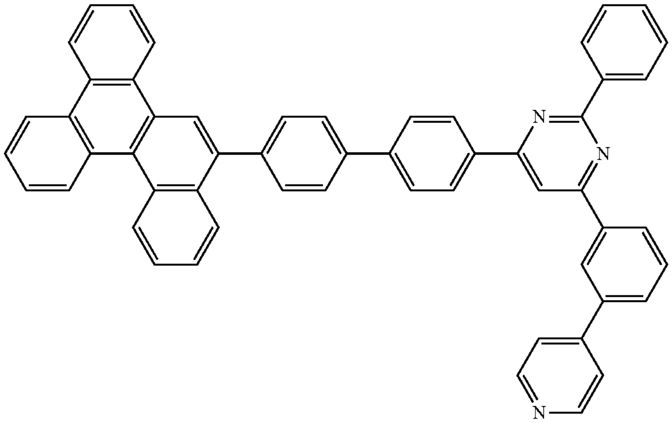
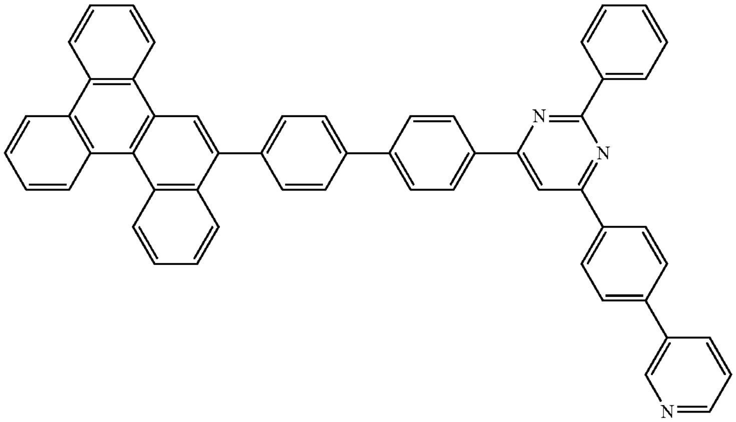

-continued
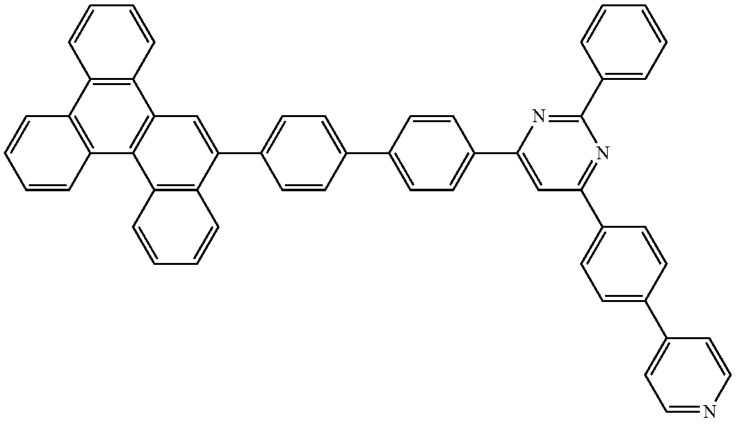
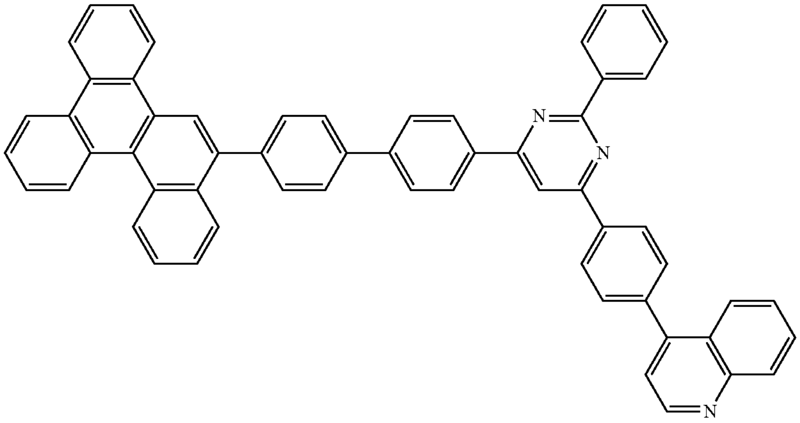
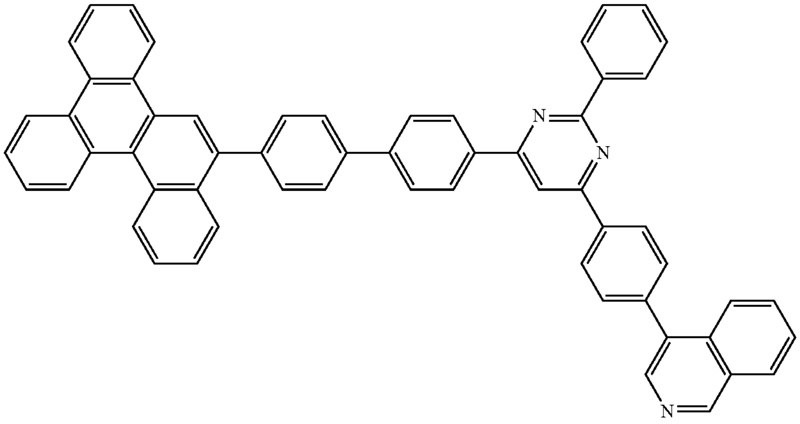
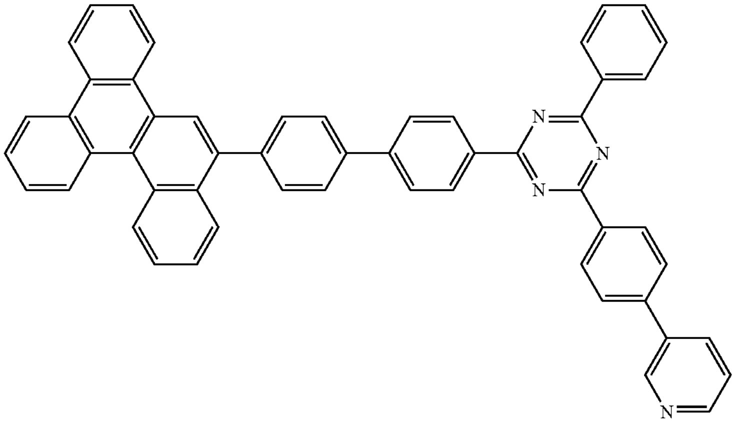

-continued
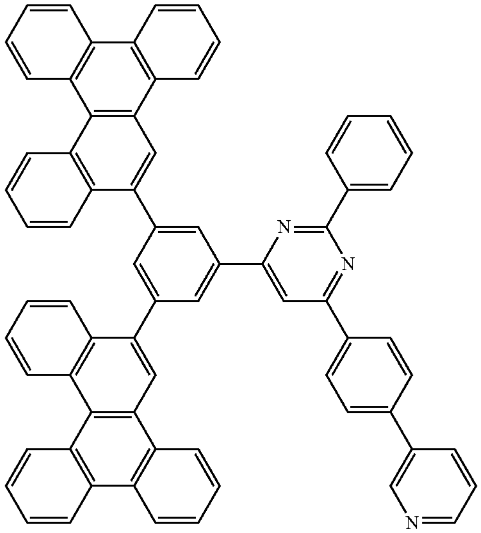
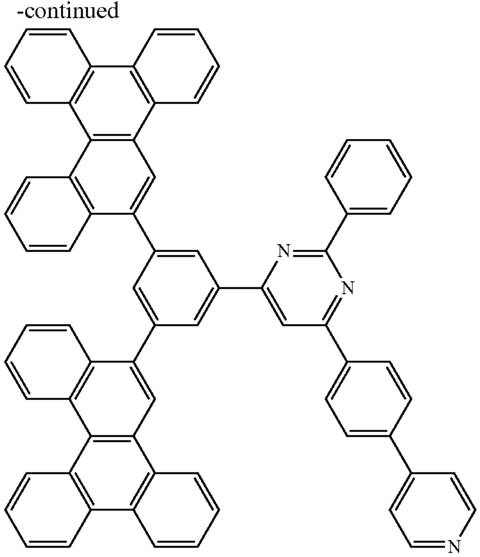
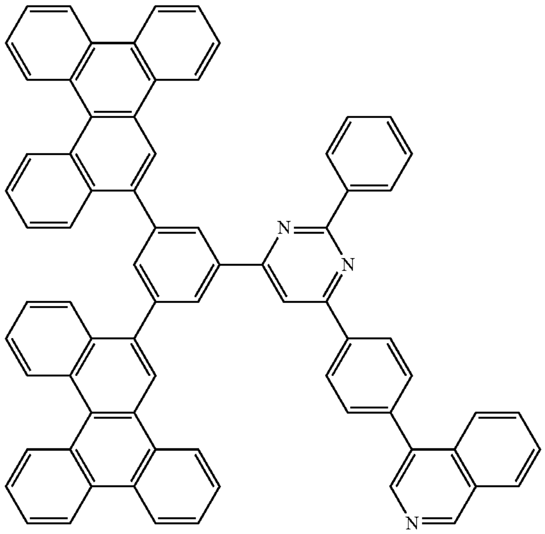
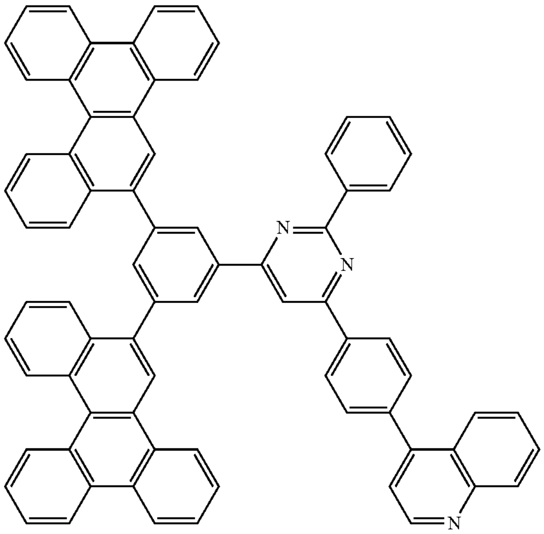
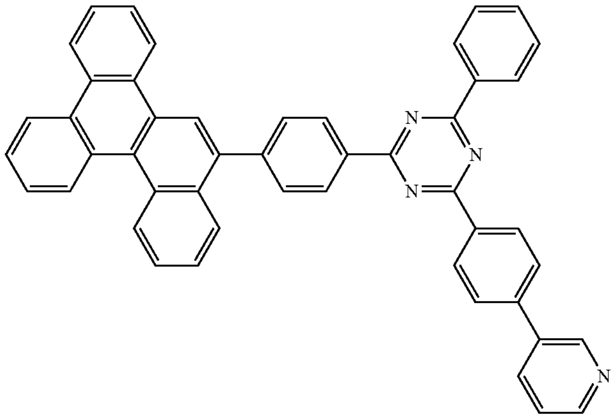

-continued
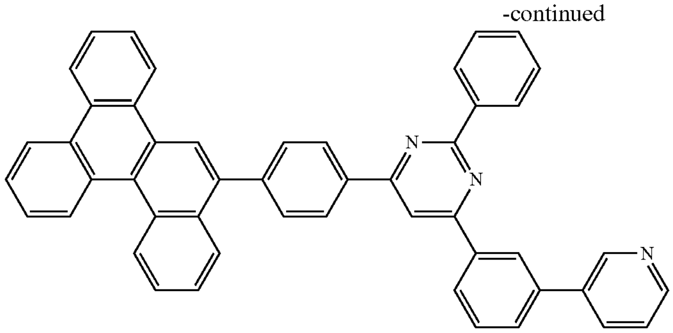
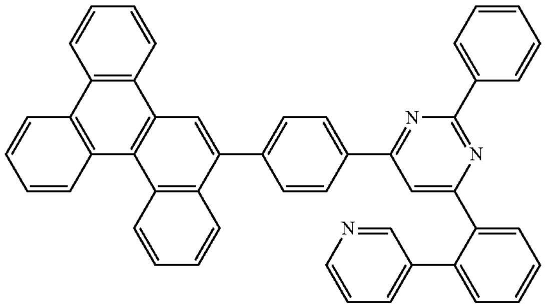
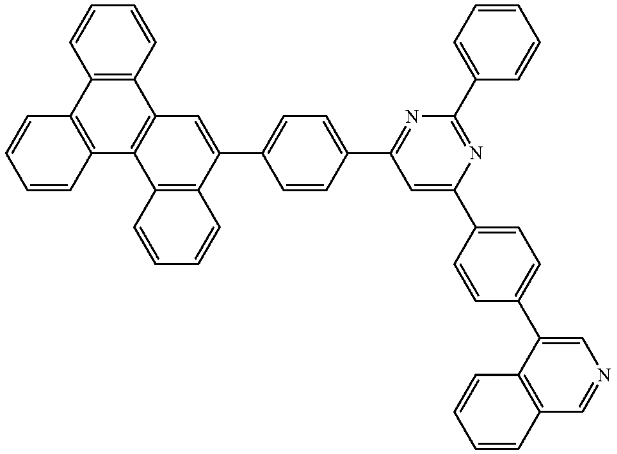
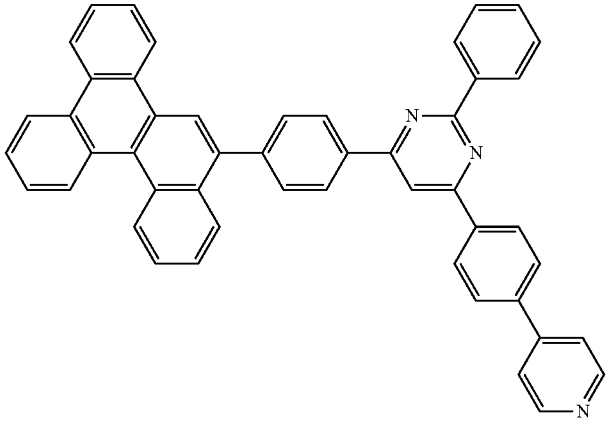

-continued
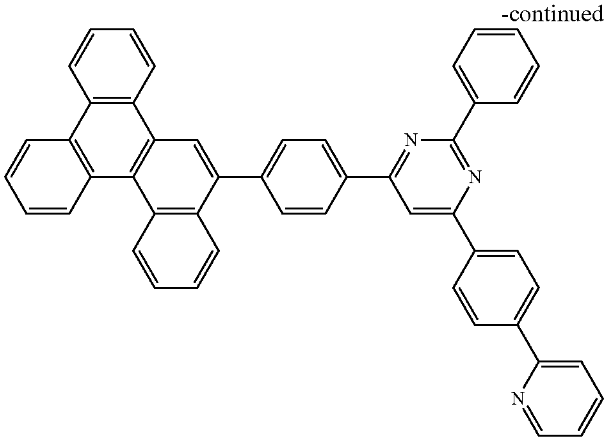
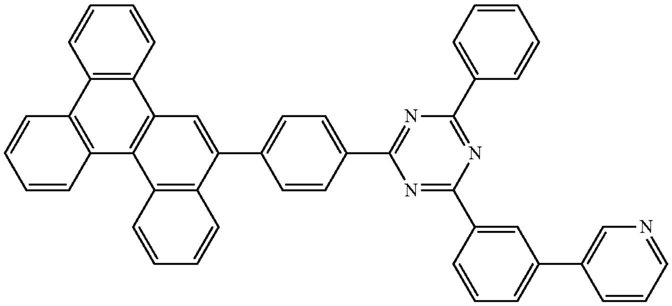
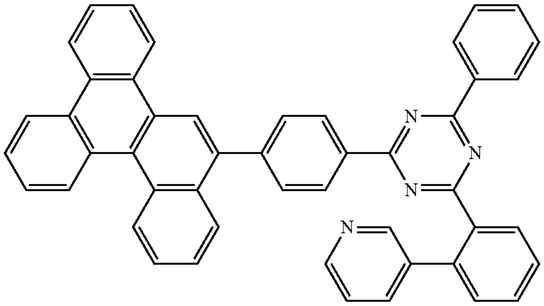
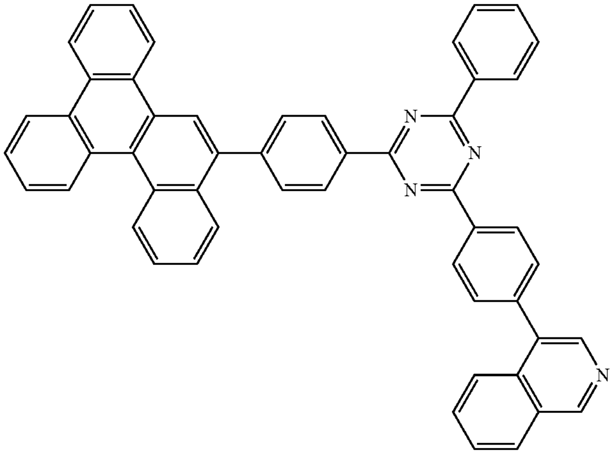

-continued
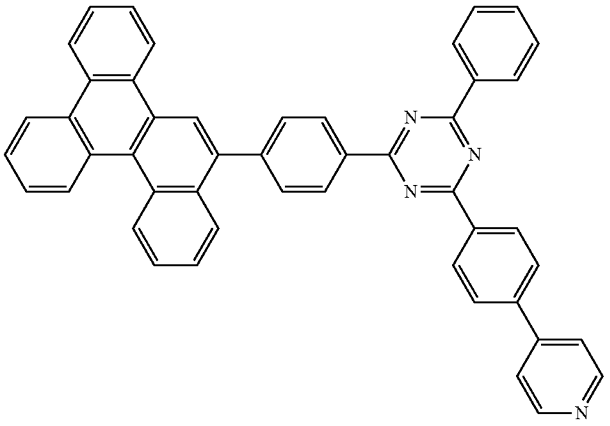
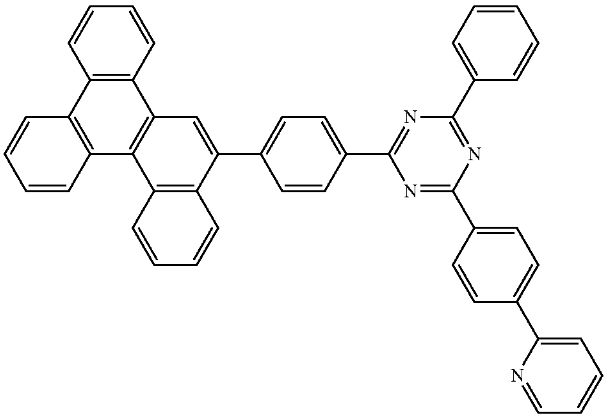
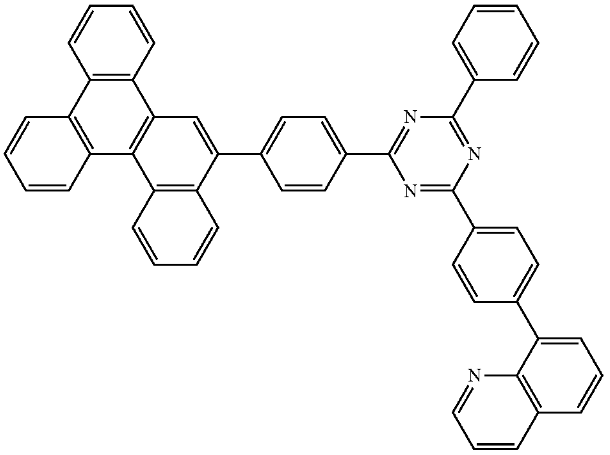

-continued

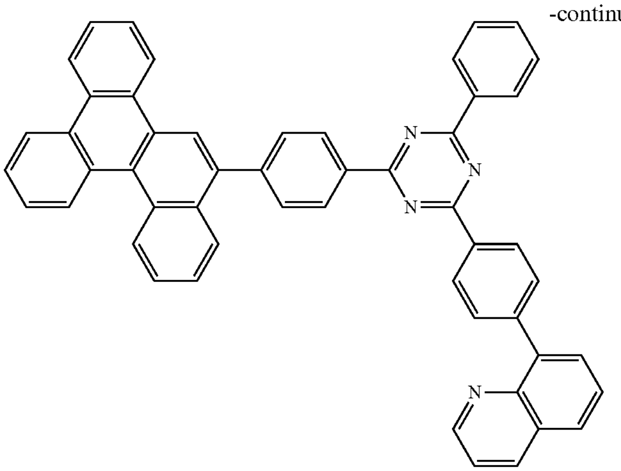

(Compound Represented by the formula (2))

The compound represented by the formula (2) is as follows.

(2)

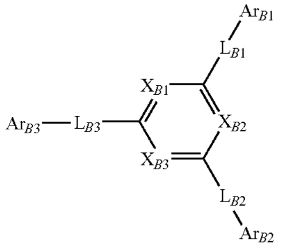

wherein in the formula (2), $X_{B1}$ to $X_{B3}$ are independently N or $CR_{B1}$; provided that at least one of $X_{B1}$ to $X_{B3}$ is N;

$R_{B1}$ is a hydrogen atom or a substituent R;

$Ar_{B1}$, $Ar_{B2}$, and $Ar_{33}$ are independently a substituted or unsubstituted aryl group including 6 to 50 ring carbon atoms, or a substituted or unsubstituted monovalent heterocyclic group including 5 to 50 ring atoms;

$L_{B1}$, $L_{B2}$, and $L_{B3}$ are independently a single bond, a substituted or unsubstituted arylene group including 6 to 50 ring carbon atoms, or a substituted or unsubstituted divalent heterocyclic group including 5 to 50 ring atoms;

the substituent R is as defined in the formula (1); and when two or more $R_{B1}$'s are present, the two or more $R_{B1}$'s may be the same as or different from each other.

In one embodiment, $Ar_{B3}$ is a substituted or unsubstituted monovalent heterocyclic group including 5 to 50 ring atoms (e.g., 5 to 30 ring atoms, or 5 to 18 ring atoms).

In one embodiment, $Ar_{B3}$ is a substituted monovalent heterocyclic group including 5 to 50 ring atoms.

In one embodiment, $Ar_{B3}$ is a monovalent heterocyclic group including two carbazole structures.

In one embodiment, $Ar_{B3}$ is a group represented by the following formula:

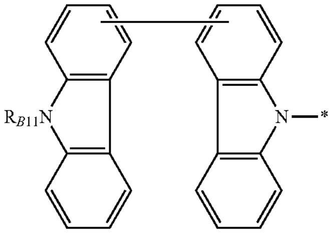

wherein in the formula, * is a bonding position with $L_{B3}$; $R_{B11}$ is a hydrogen atom or a substituent R; and the substituent R is as defined in the formula (1).

In one embodiment, $L_{B3}$ is a single bond or a substituted or unsubstituted arylene group including 6 to 50 ring carbon atoms.

In one embodiment, $L_{B3}$ is a substituted or unsubstituted phenylene group, or a substituted or unsubstituted biphenylyl group.

In one embodiment, $Ar_{B1}$ and $Ar_{B2}$ are independently a substituted or unsubstituted aryl group including 6 to 50 ring carbon atoms (e.g., 6 to 30 ring carbon atoms, or 6 to 18 ring carbon atoms).

In one embodiment, $Ar_{B1}$ and $Ar_{B2}$ are independently a substituted or unsubstituted phenyl group, or a substituted or unsubstituted biphenyl group.

In one embodiment, $L_{B1}$ and $L_{B2}$ are single bonds.

In one embodiment, at least two of $X_{B1}$ to $X_{B3}$ are N's; and all of $X_{B1}$ to $X_{B3}$ may be N's.

In one embodiment, the compound represented by the formula (2) is a compound represented by the following formula (2-1):

(2-1)

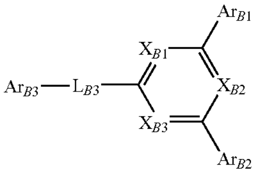

wherein in the formula (2-1), $X_{B1}$ to $X_{B3}$, $Ar_{B1}$ to $Ar_{B3}$, and $L_{B3}$ are as defined in the formula (2).

In one embodiment, the compound represented by the formula (2) is a compound represented by the following formula (2-2):

(2-2)

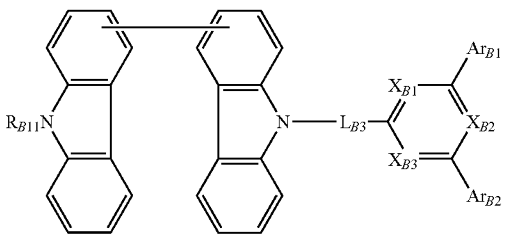

wherein in the formula (2-2), $X_{B1}$ to $X_{B3}$, $Ar_{B1}$, $Ar_{B2}$, and $L_{B3}$ are as defined in the formula (2); $R_{B11}$ is a hydrogen atom or a substituent R; and the substituent R is as defined in the formula (1).

In one embodiment, the compound represented by the formula (2) is a compound represented by the following formula (2-3):

(2-3)

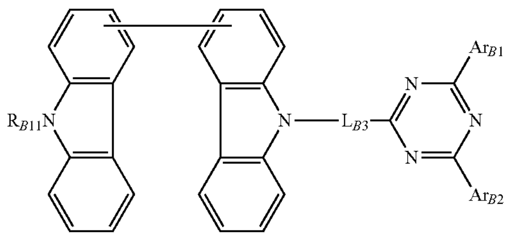

wherein in the formula (2-3), $Ar_{B1}$, $Ar_{B2}$, and $L_{B3}$ are as defined in the formula (2); $R_{B11}$ is a hydrogen atom or a substituent R; and the substituent R is as defined in the formula (1).

The compound represented by the formula (2) can be synthesized by using known alternative reactions or raw materials tailored to the target product.

Specific examples of the compound represented by the formula (2) will be described below, but these are merely examples, and the compound represented by the formula (2) is not limited to the following specific examples.

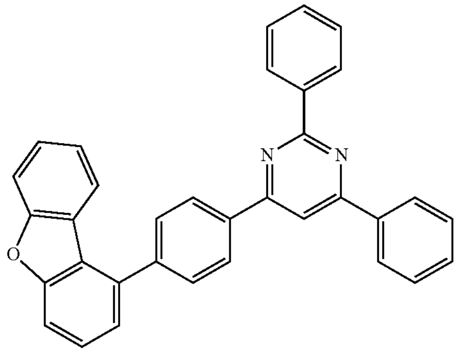

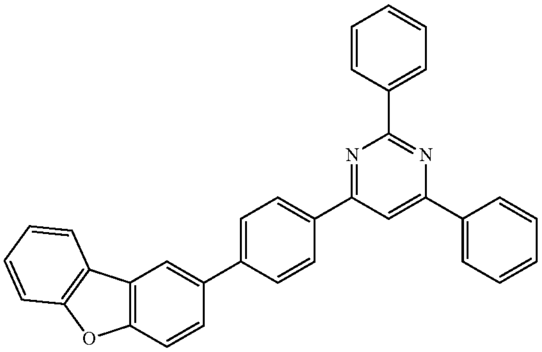

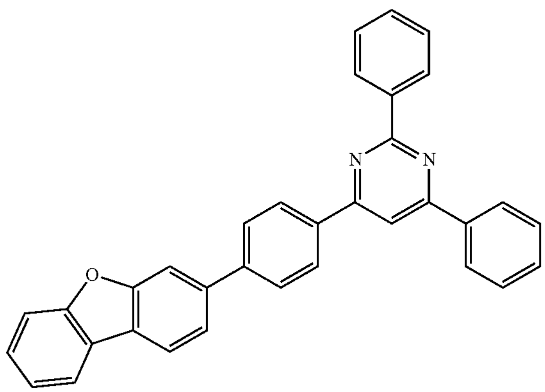

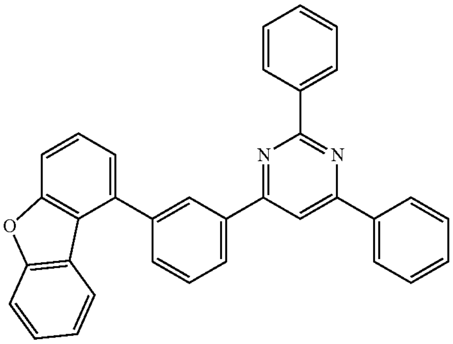

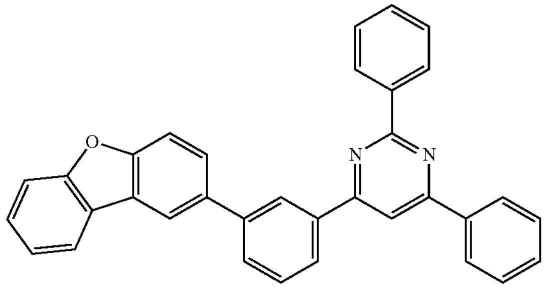

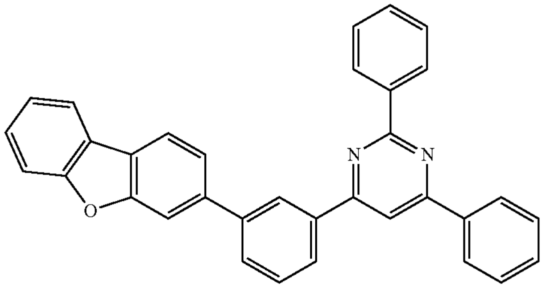

-continued
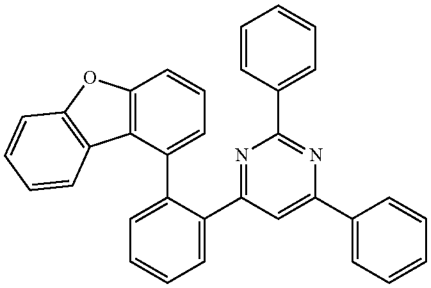
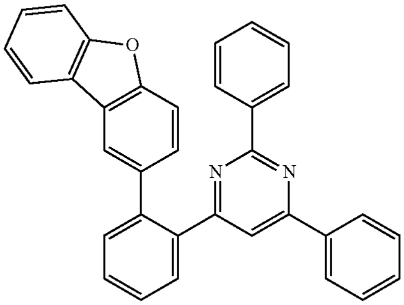
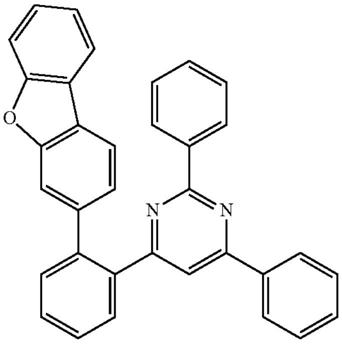
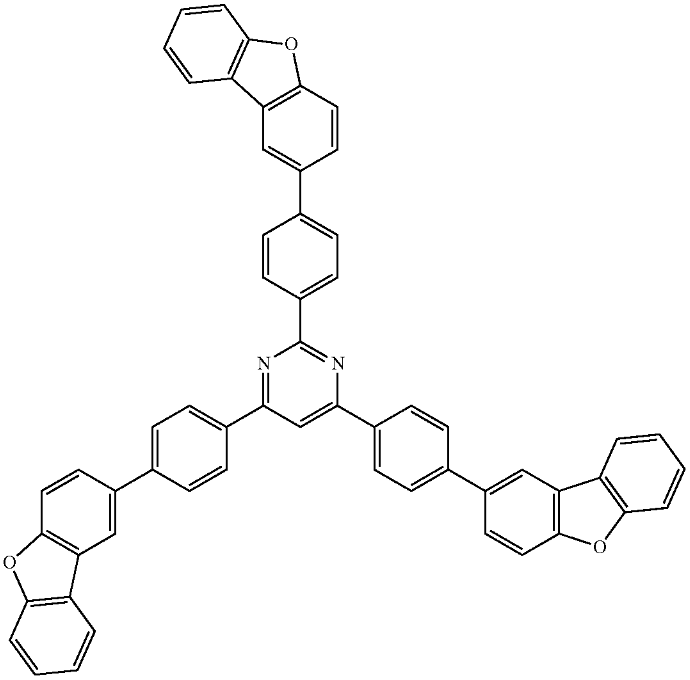
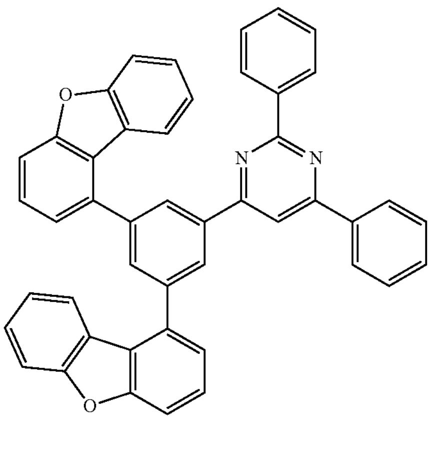
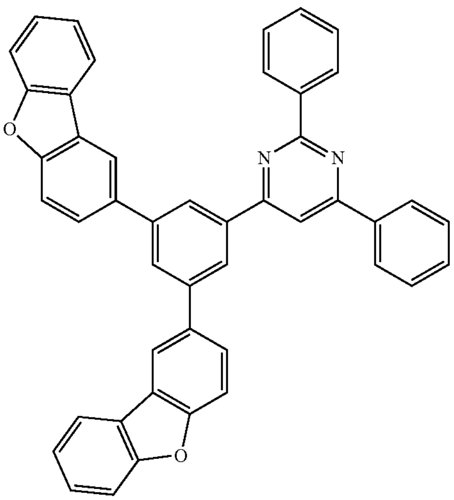

-continued
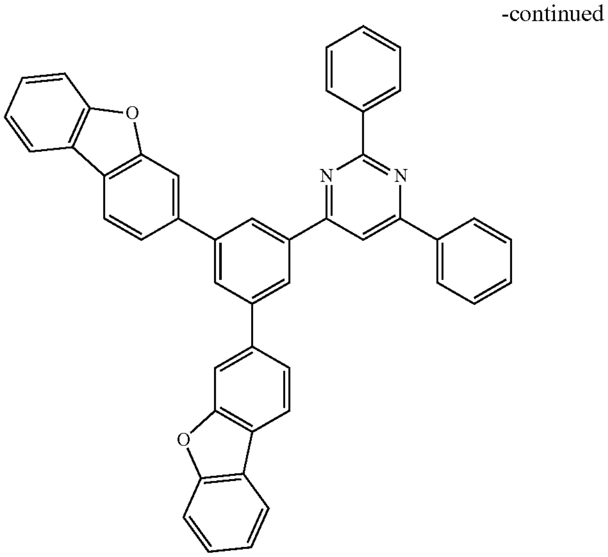
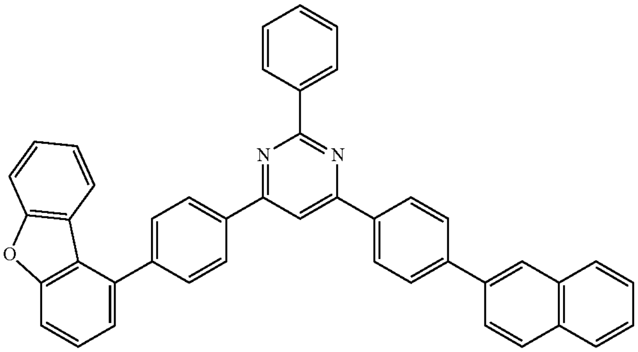
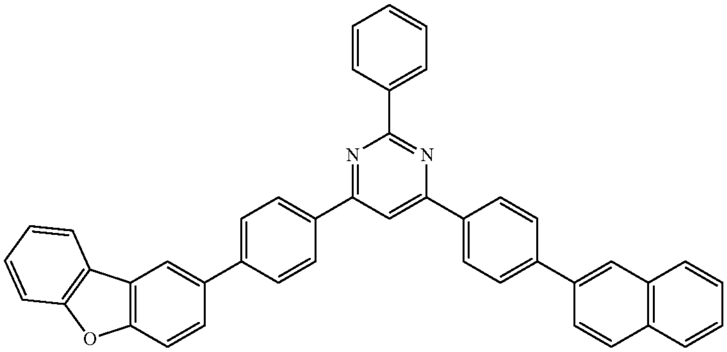
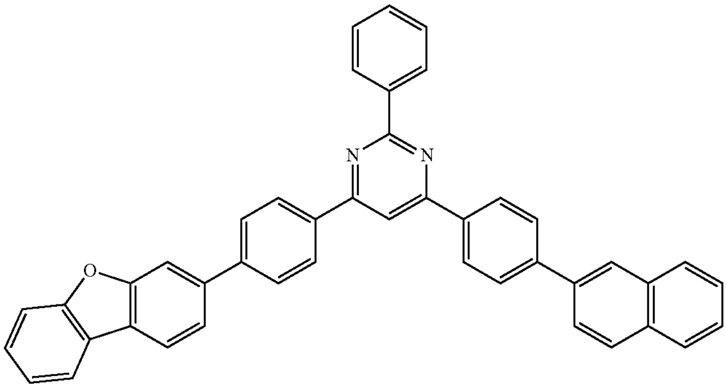

-continued
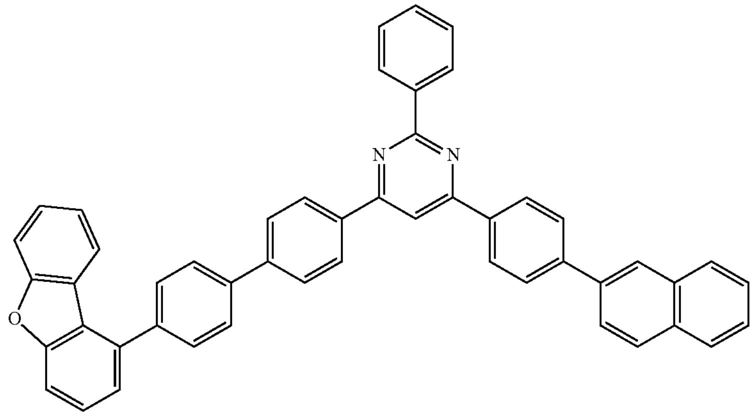
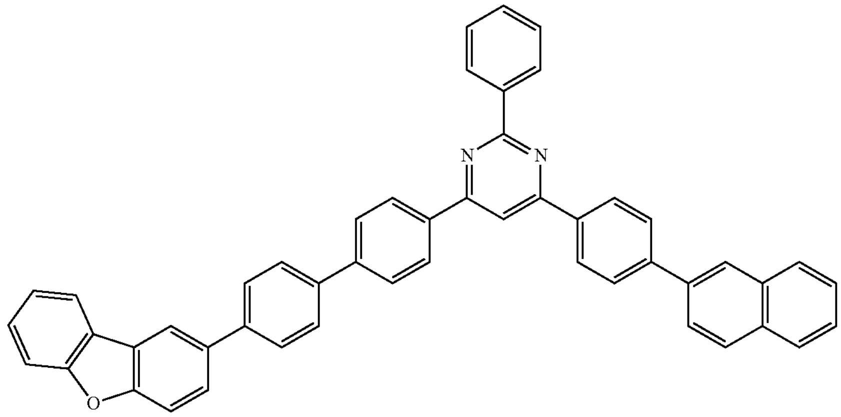
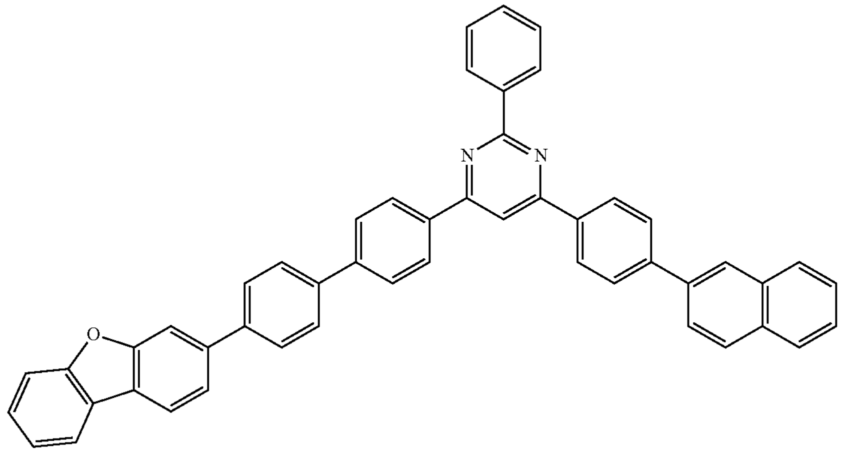
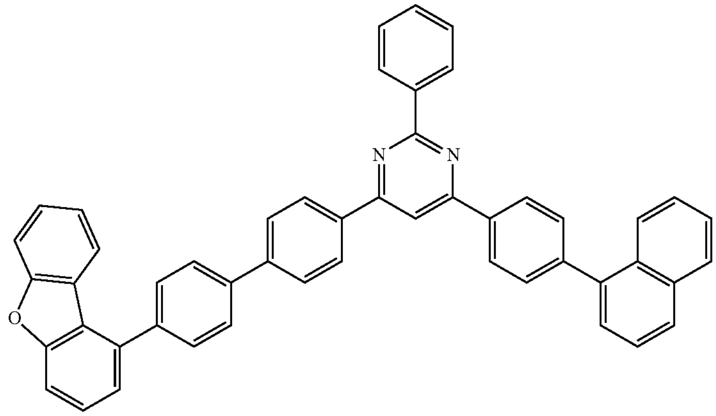

-continued
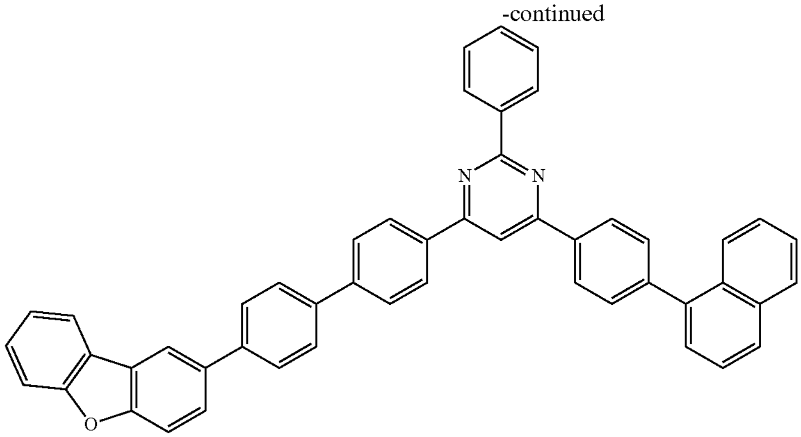
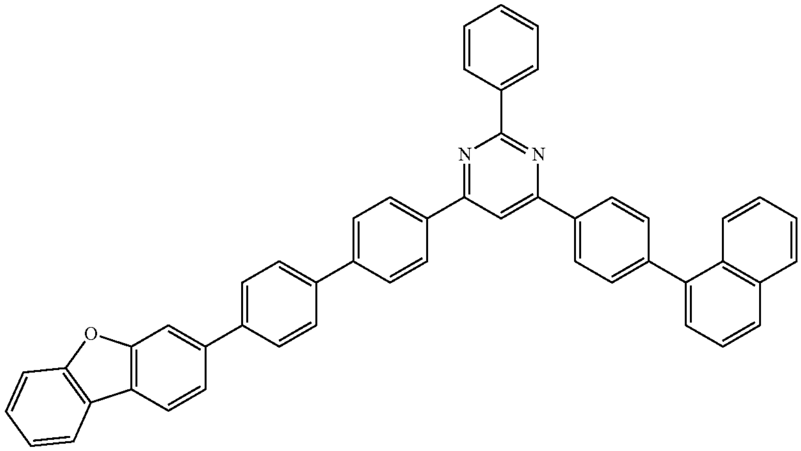
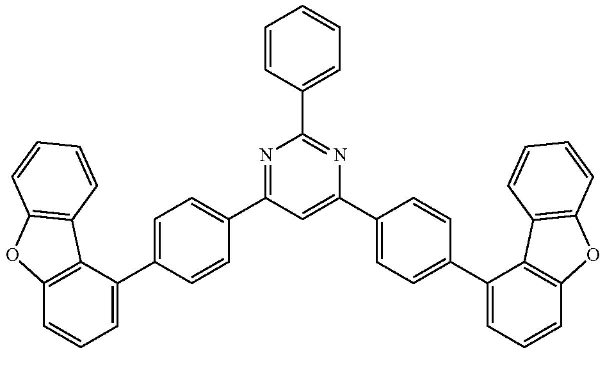
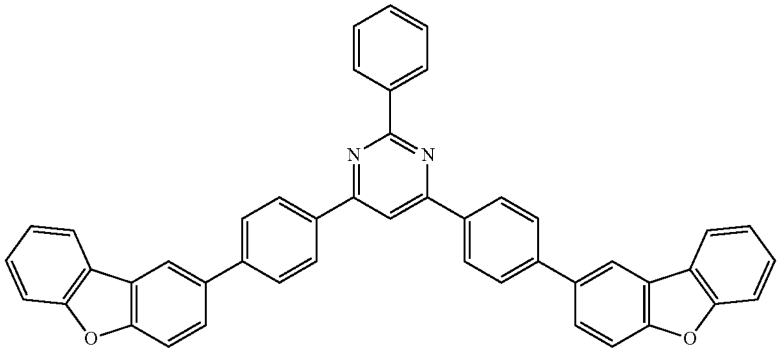

-continued
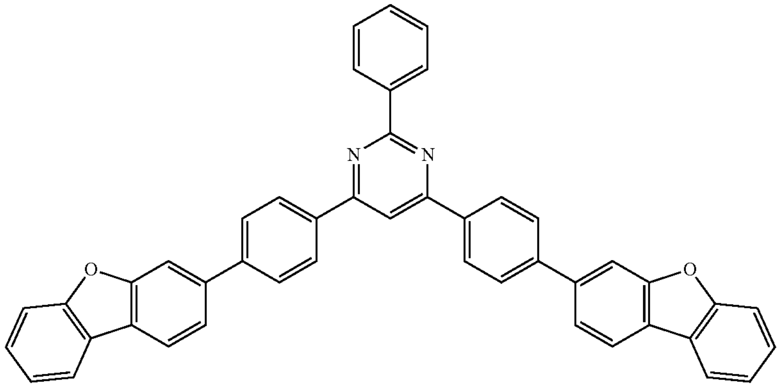
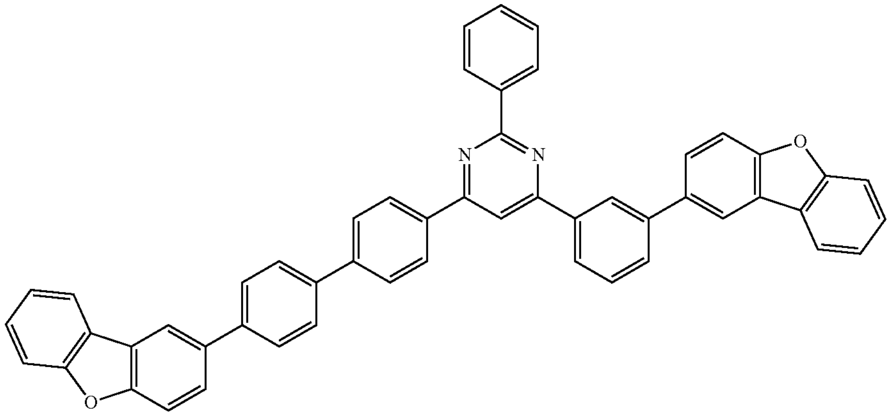
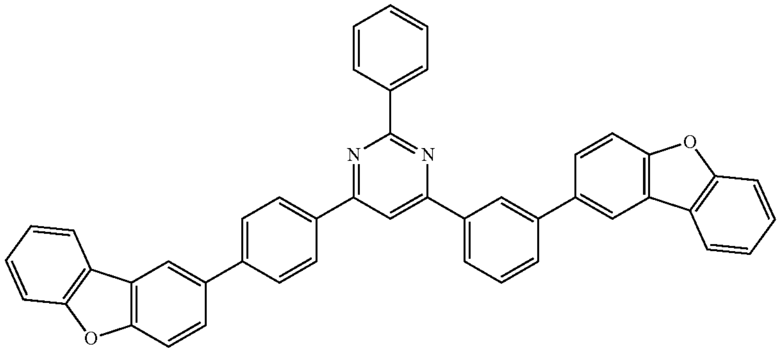
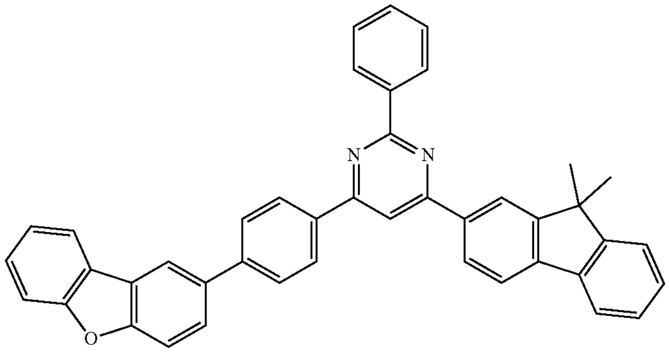

-continued
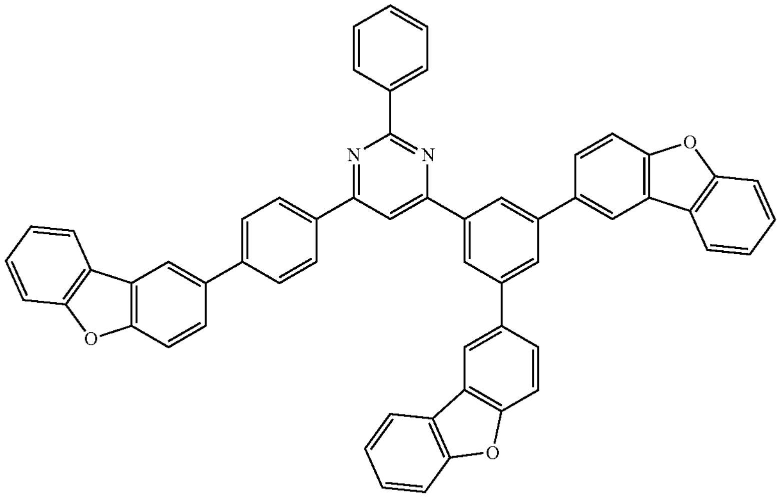
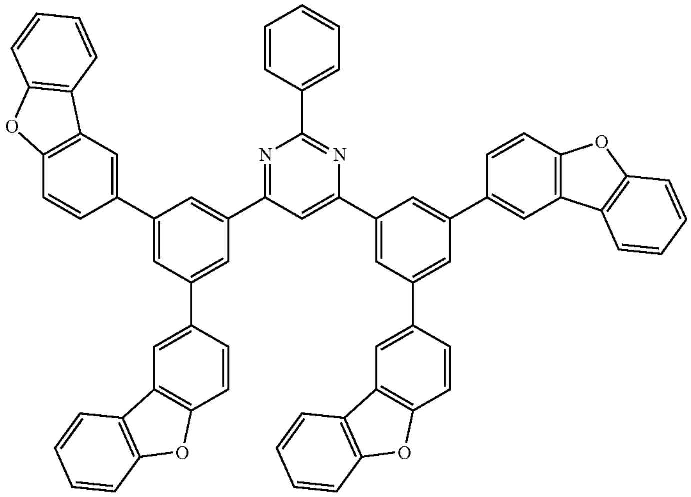
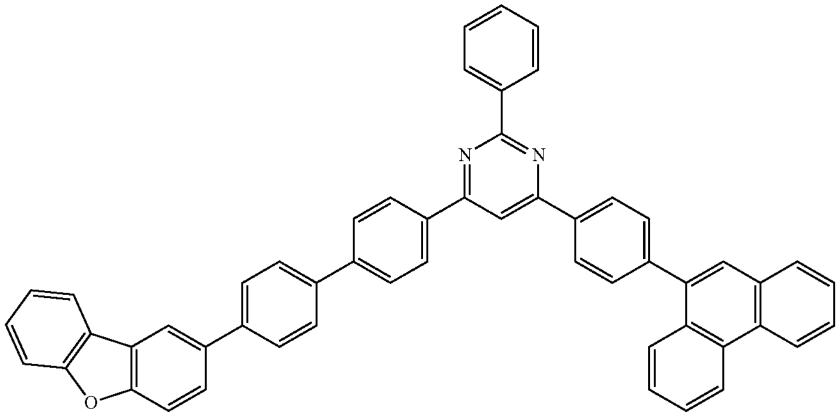

-continued
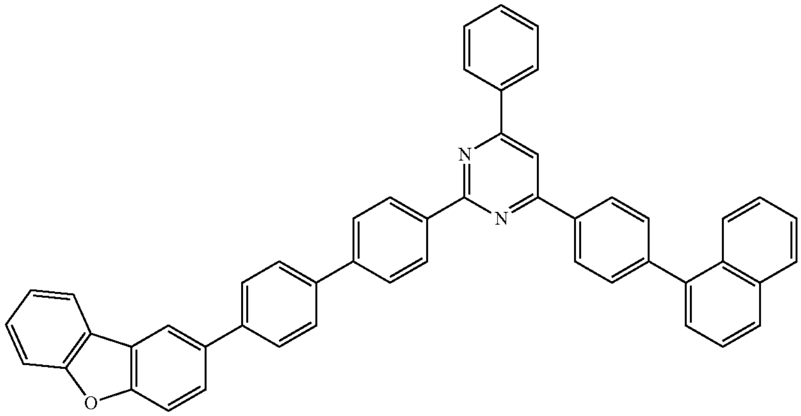
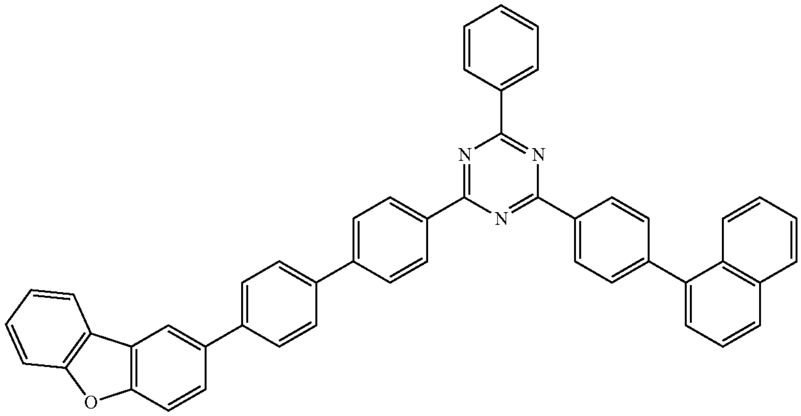
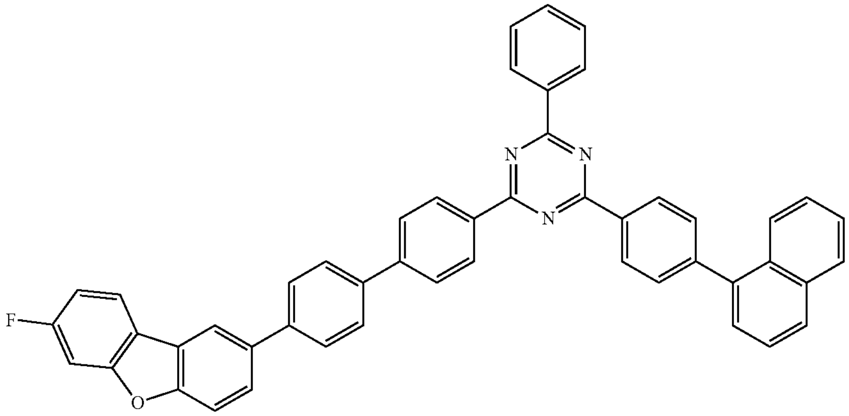
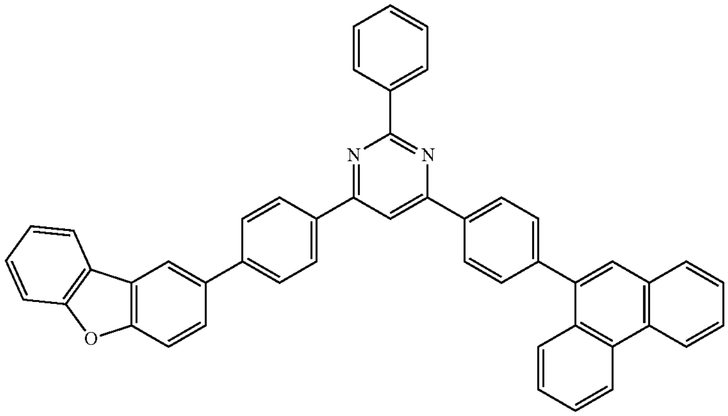

-continued
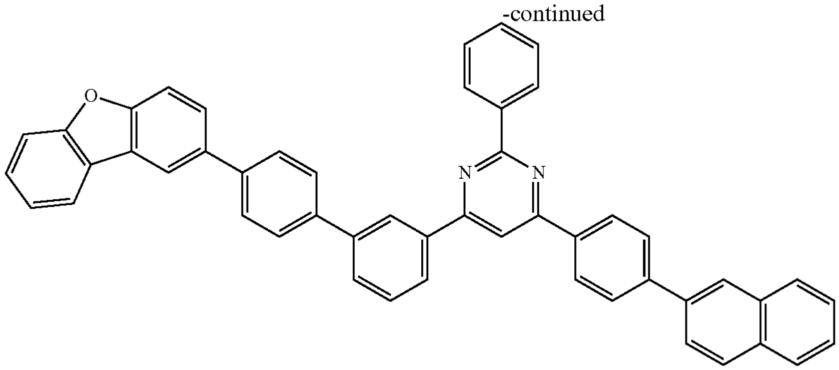
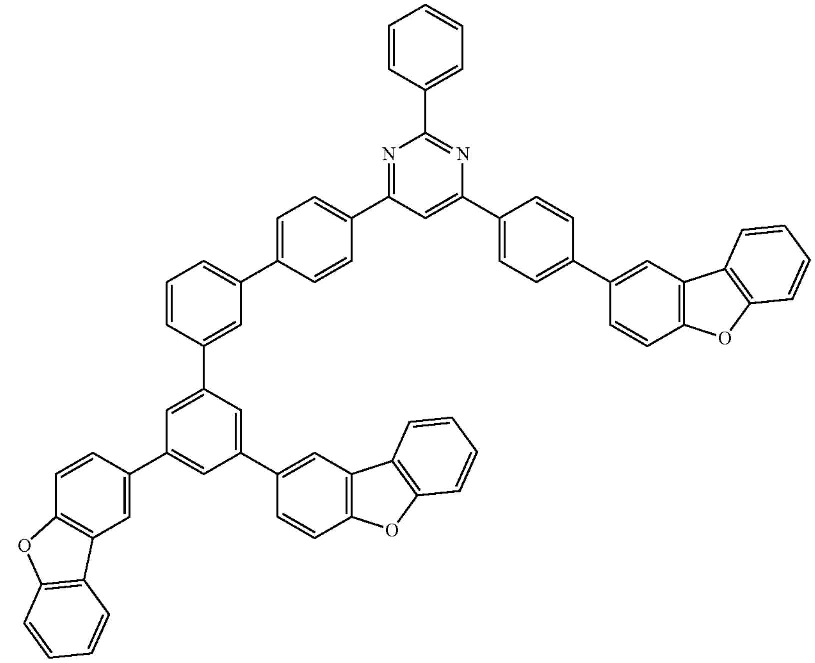
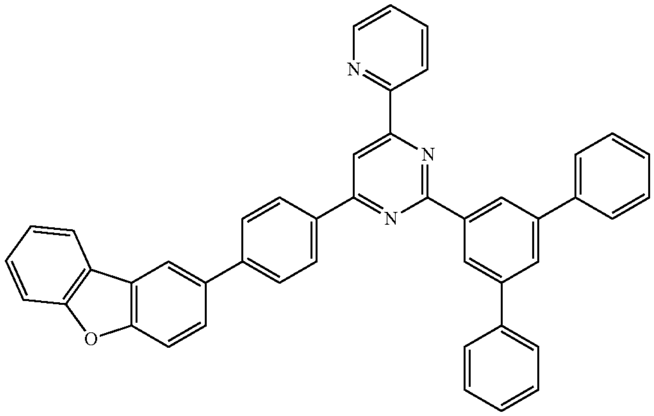

-continued
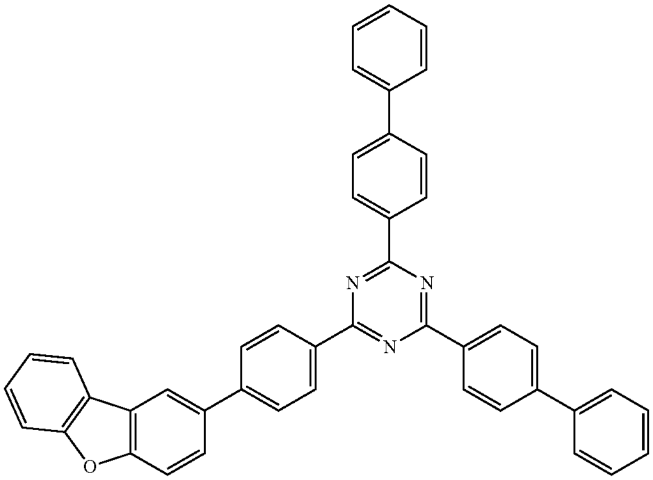
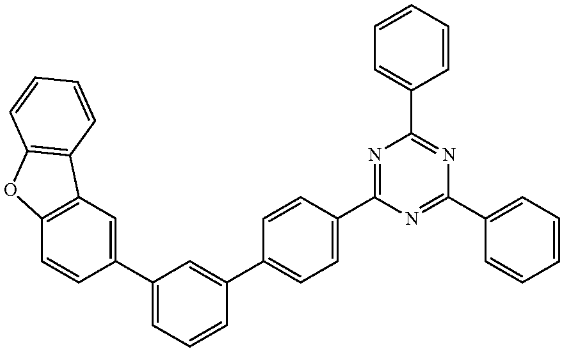
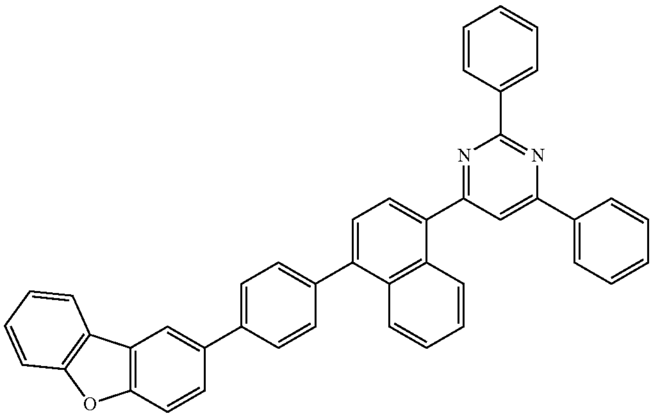
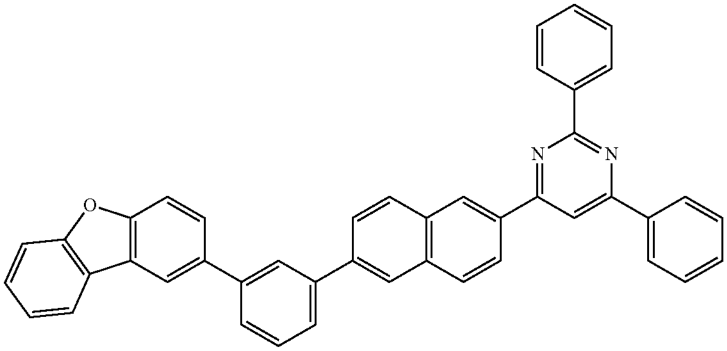

-continued
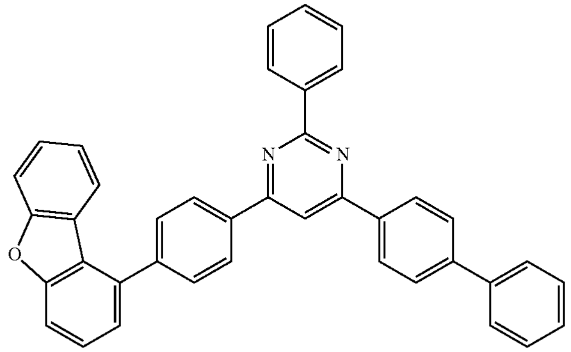
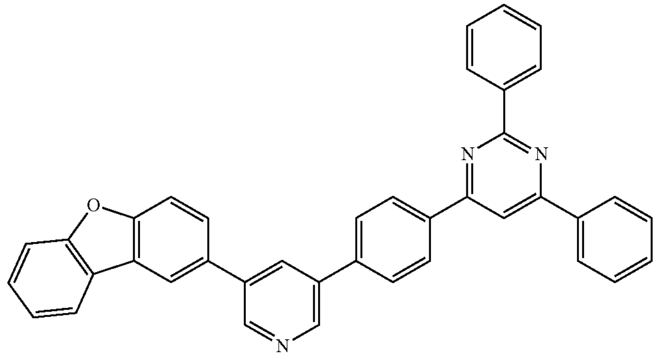
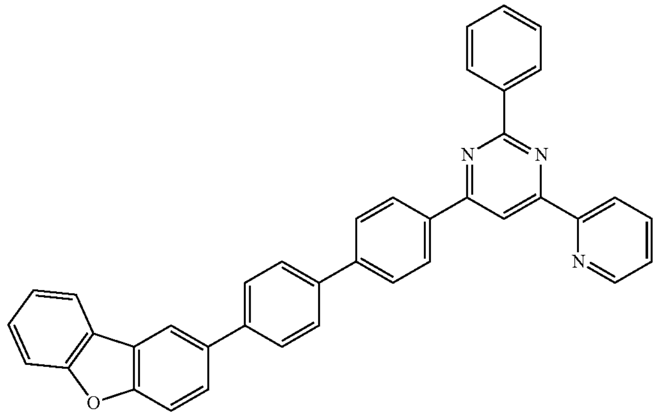
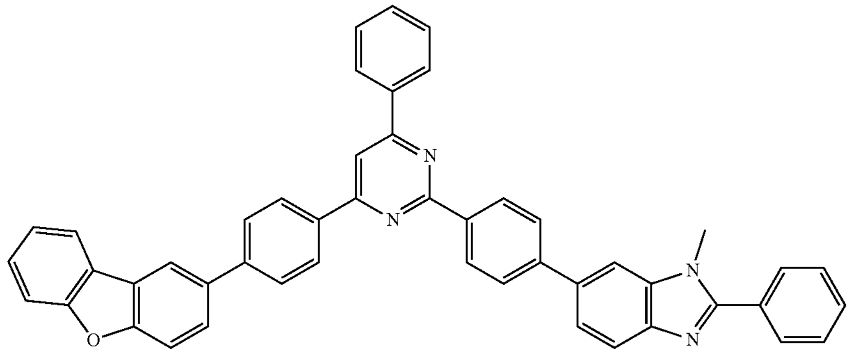

-continued
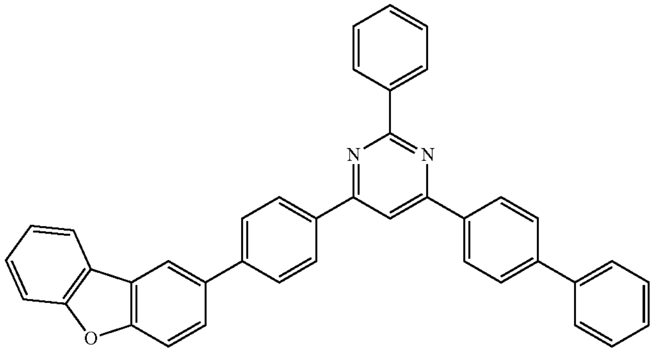
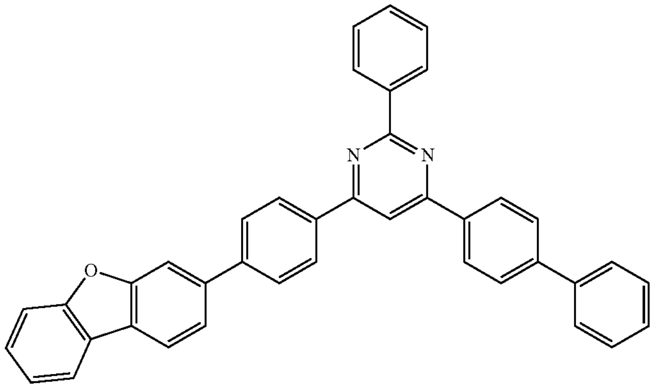
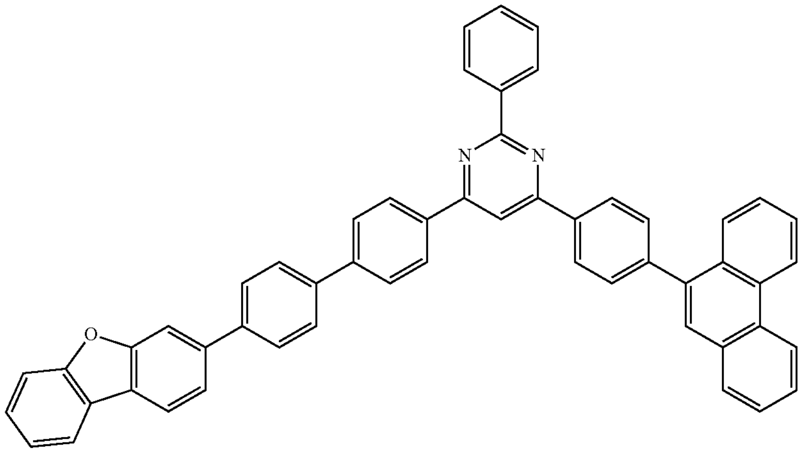
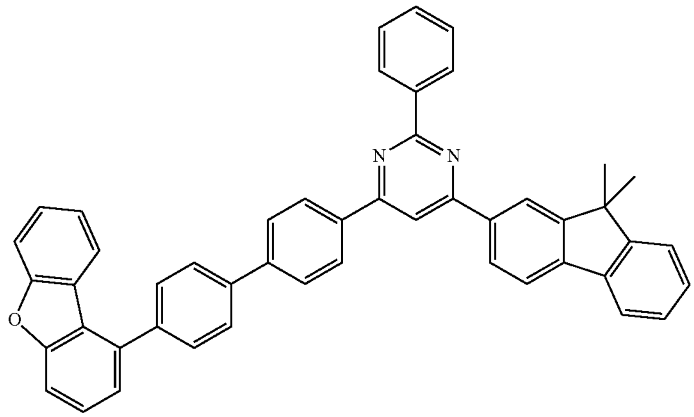

-continued
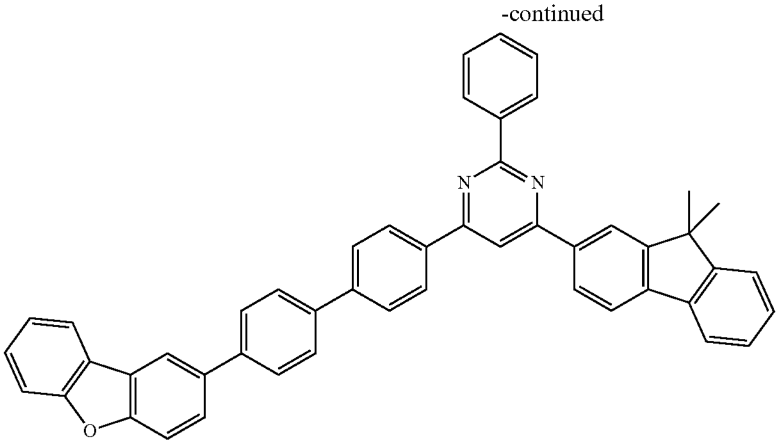
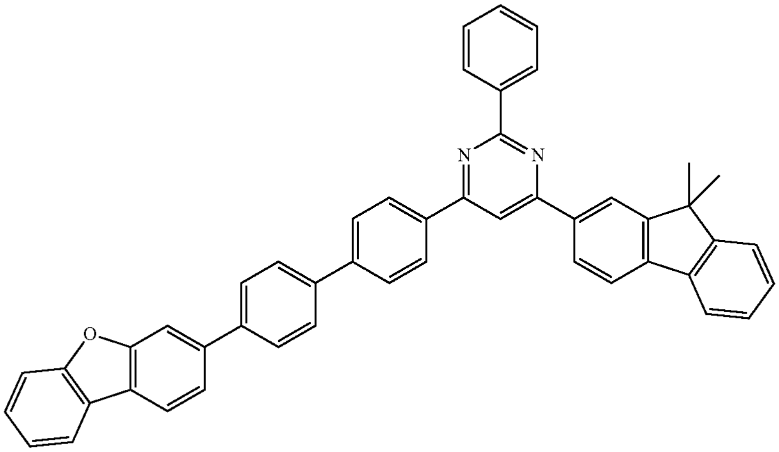
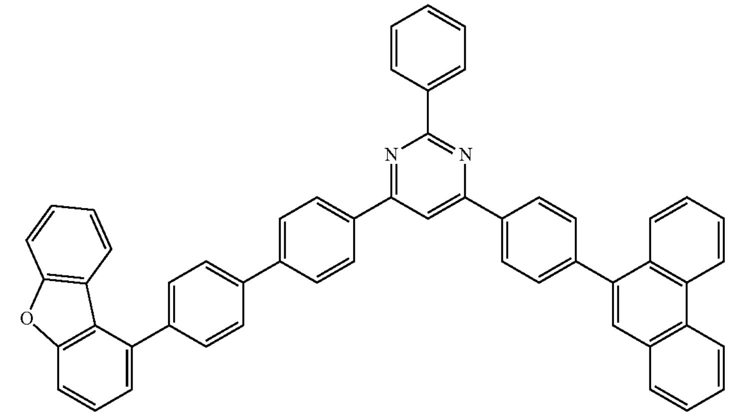
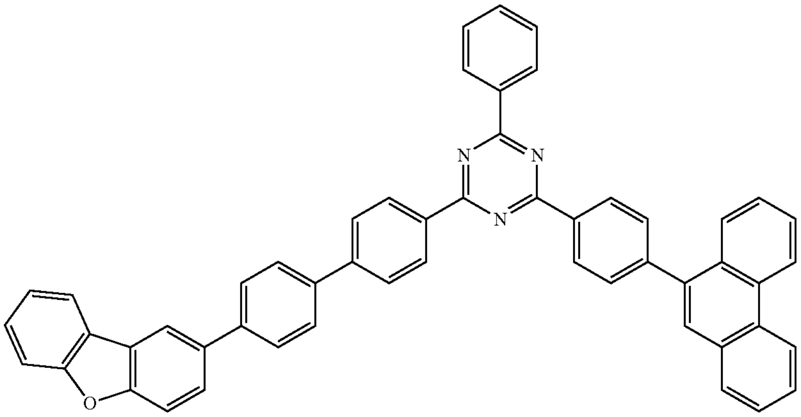

-continued
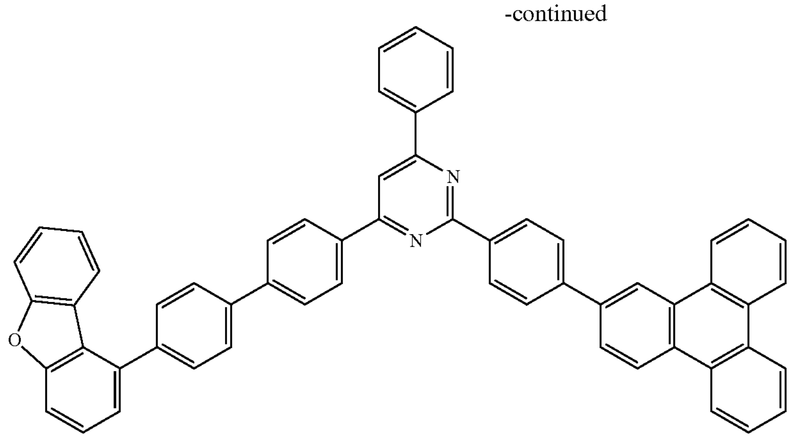
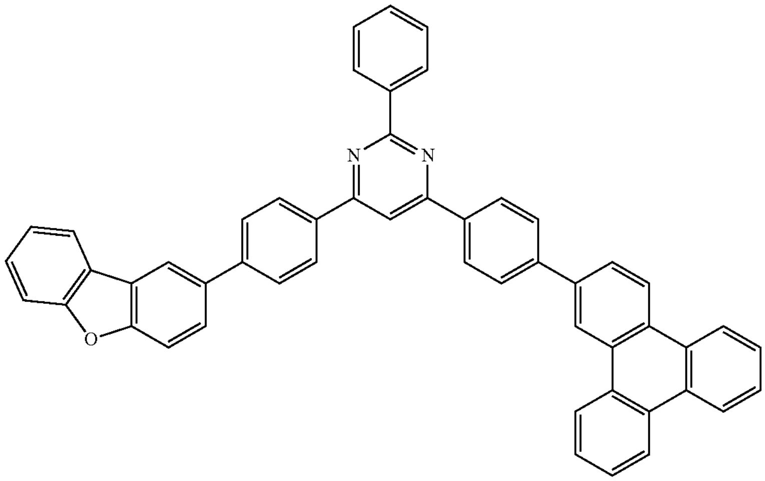
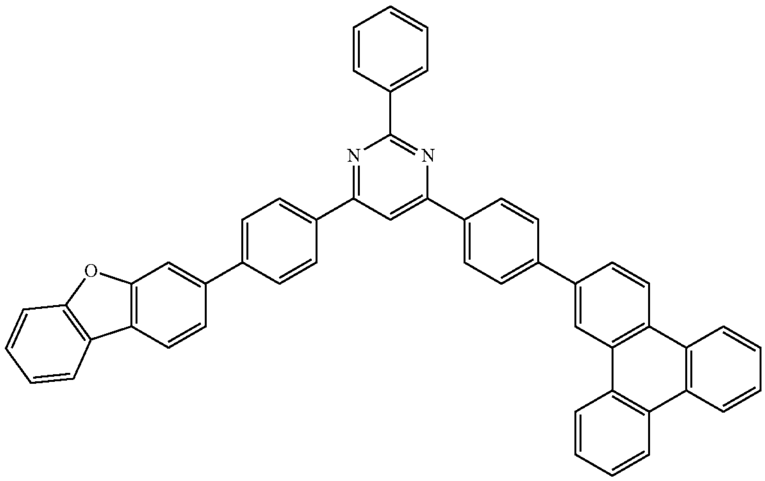

-continued
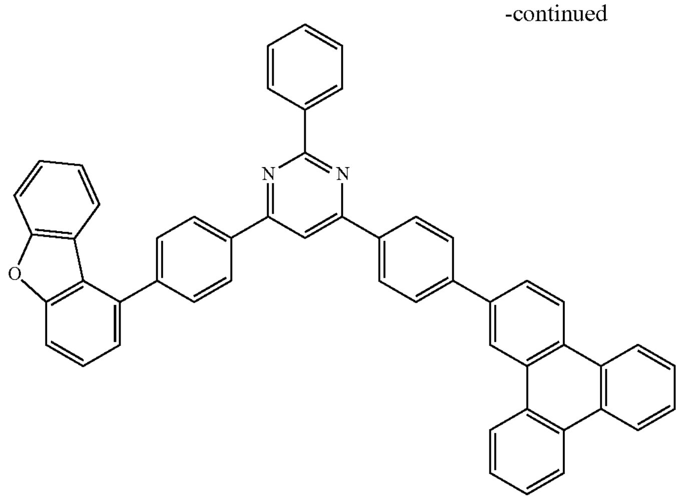
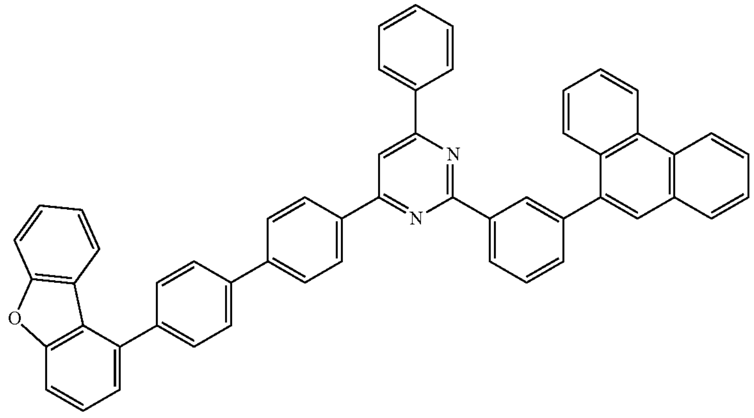
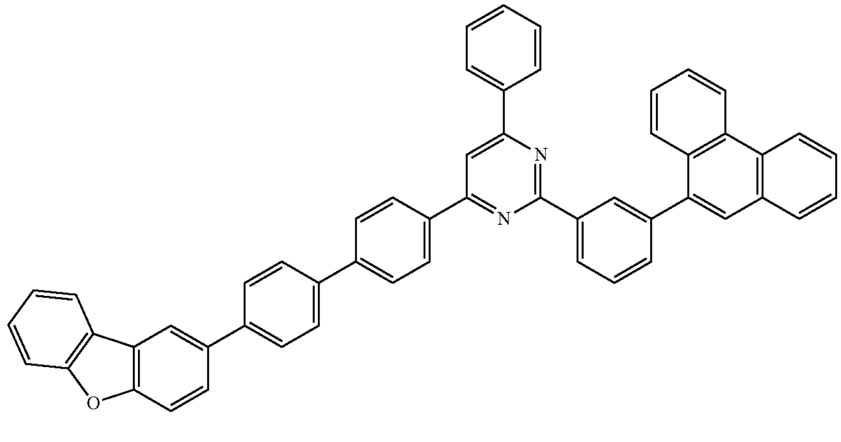

-continued
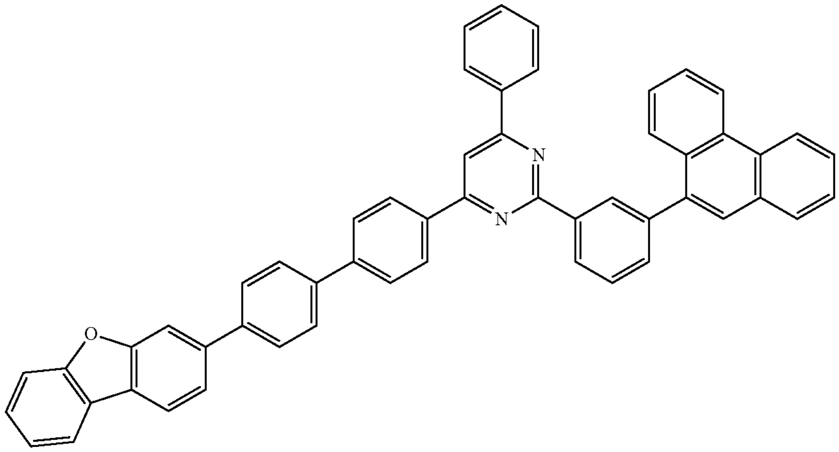
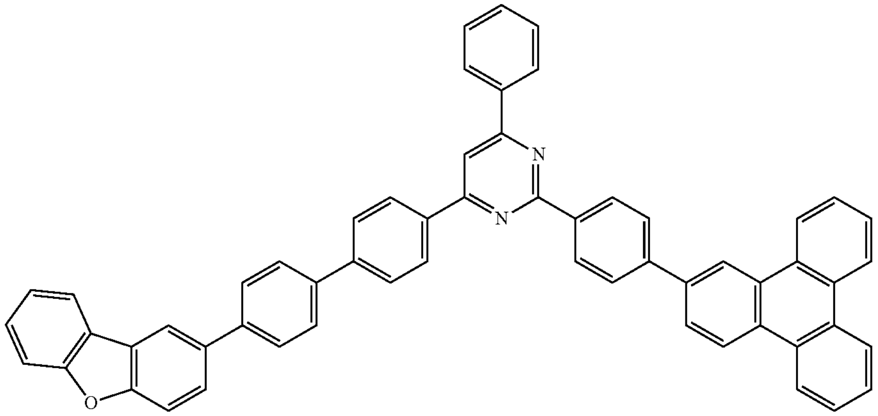
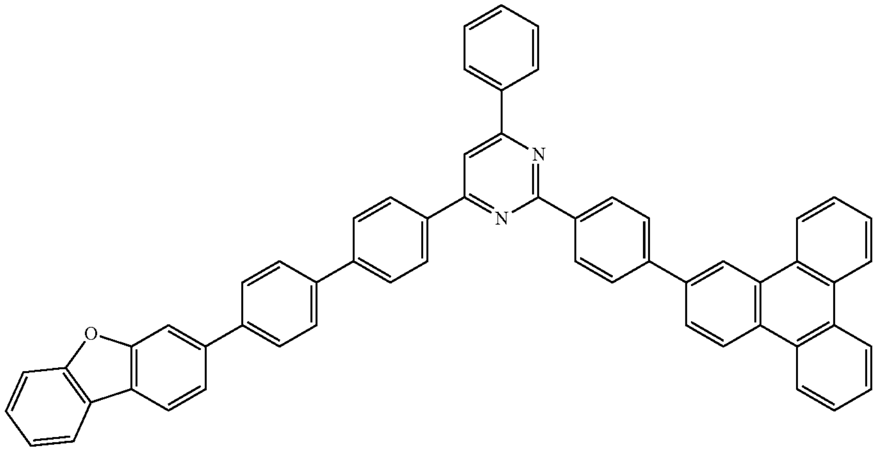
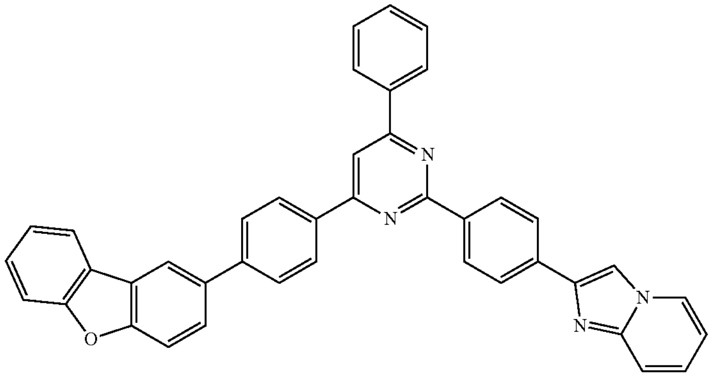

-continued
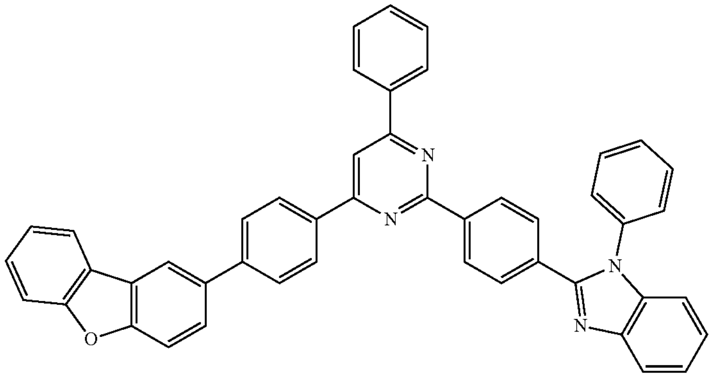
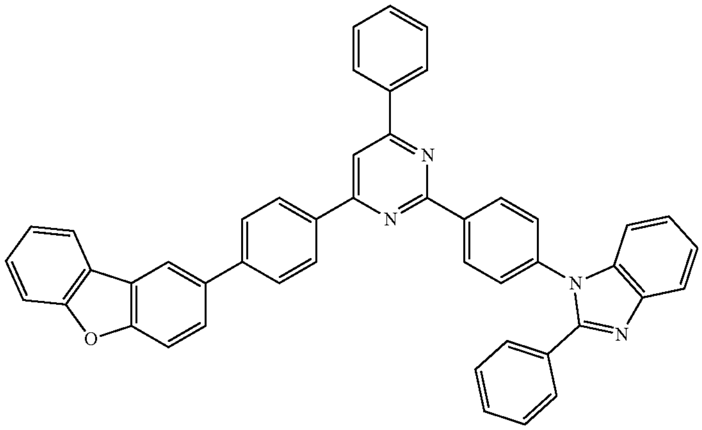
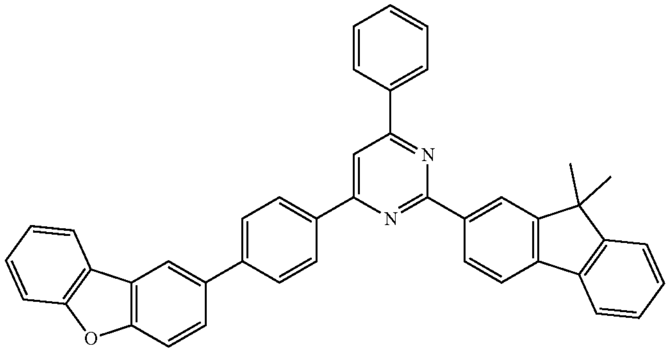
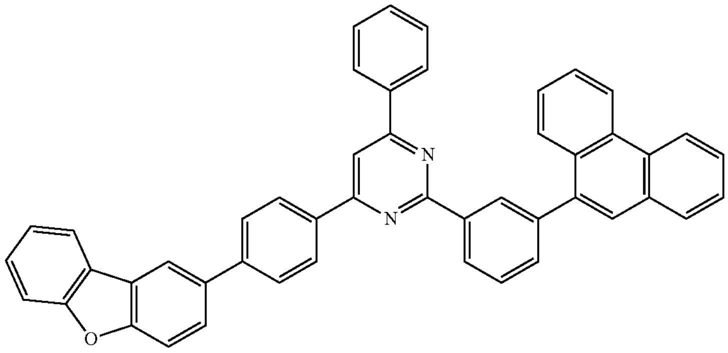

-continued
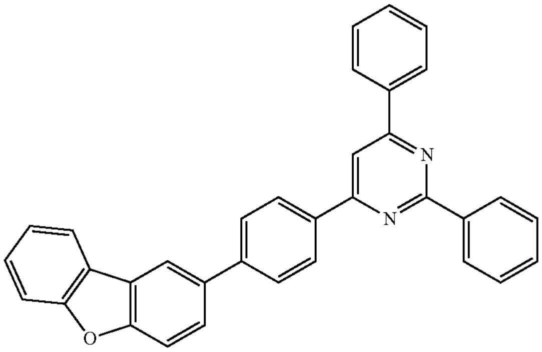
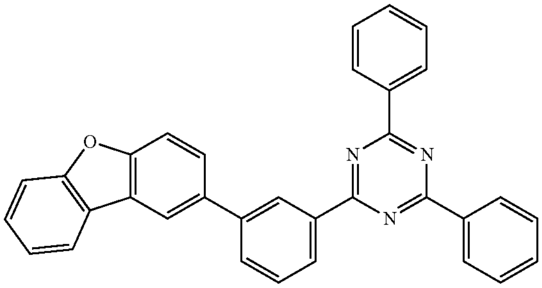
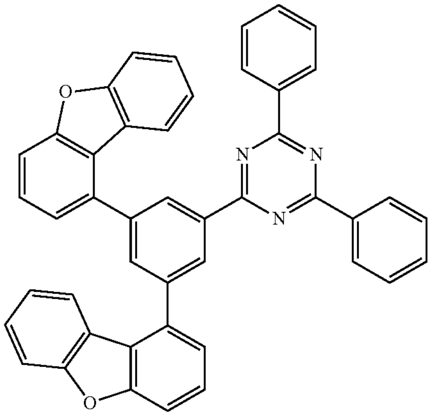
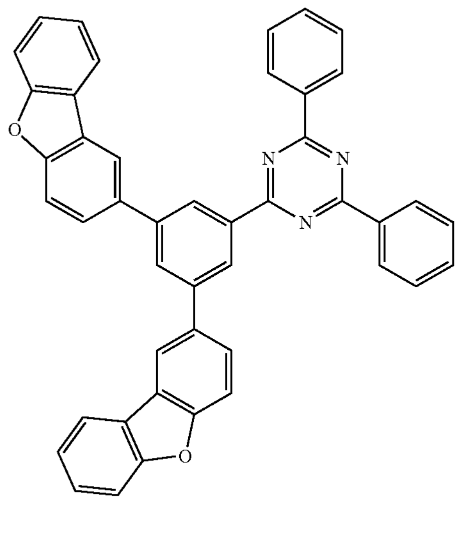
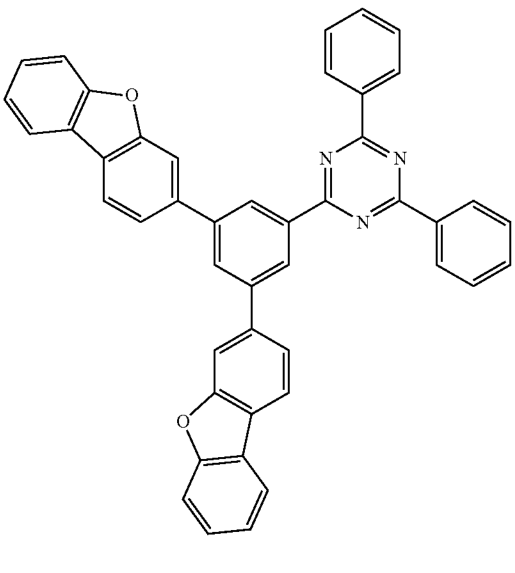

-continued
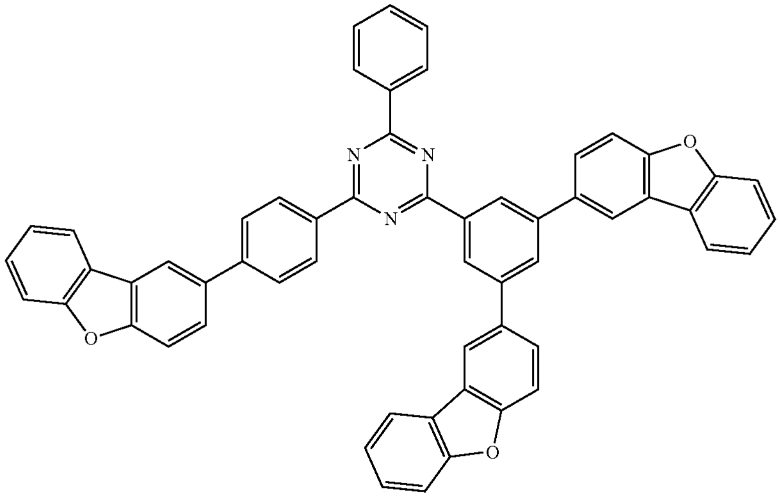
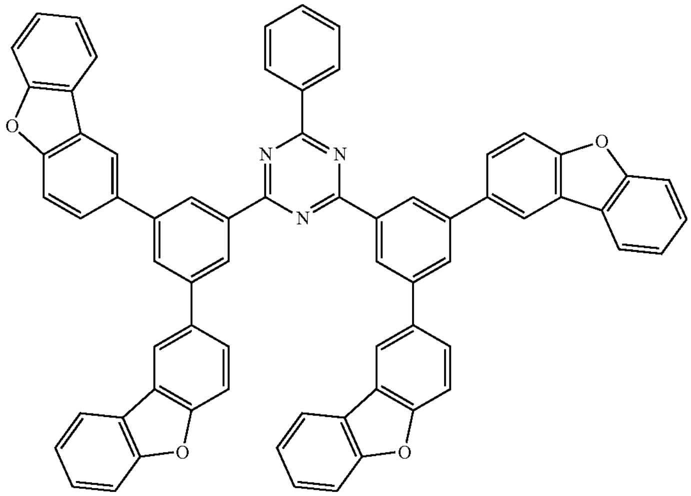
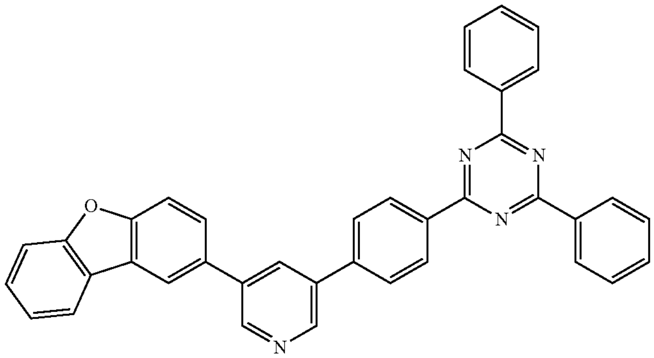

-continued
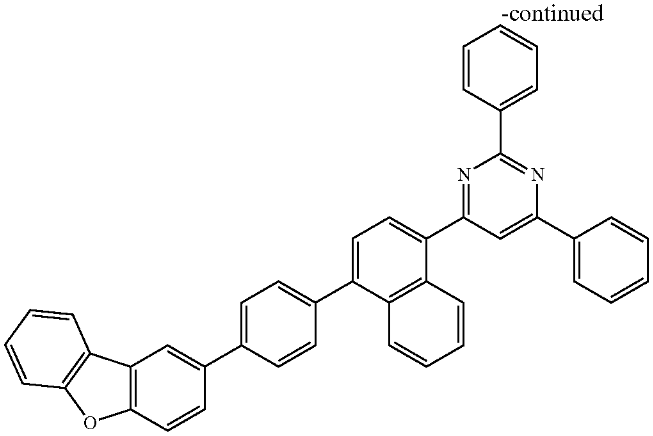
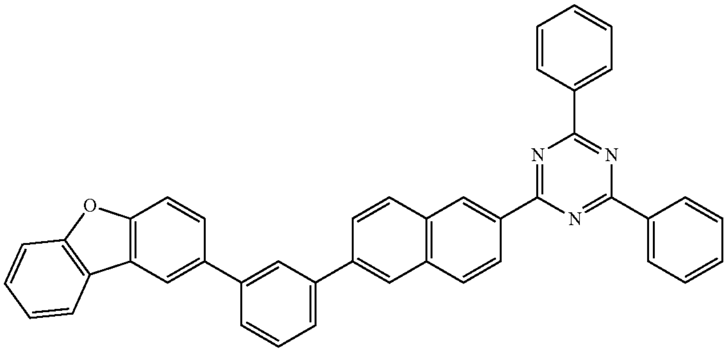
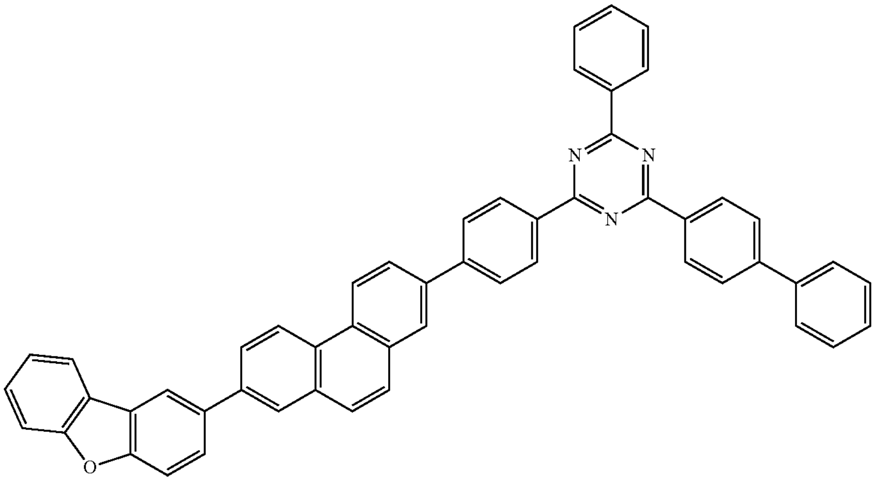
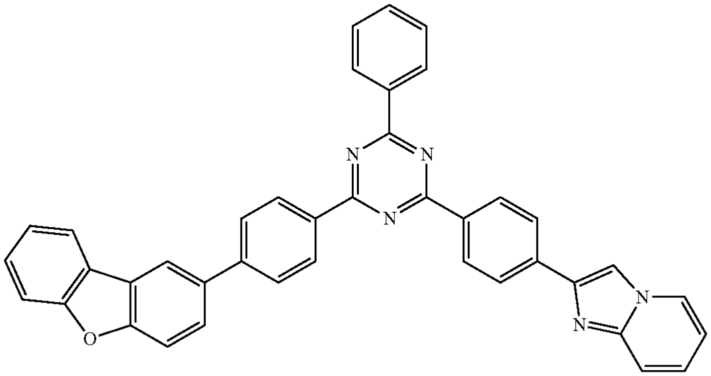

-continued
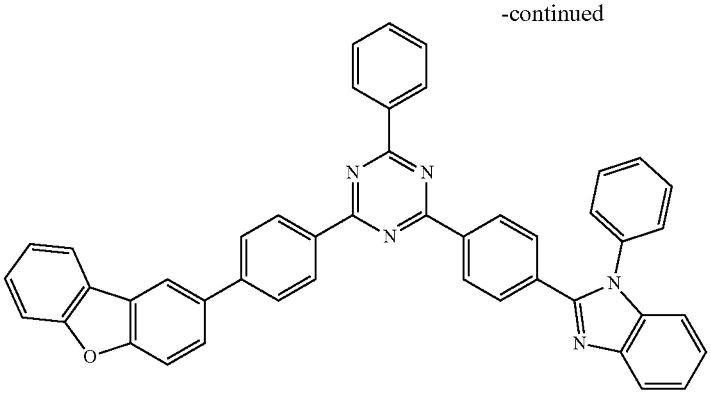
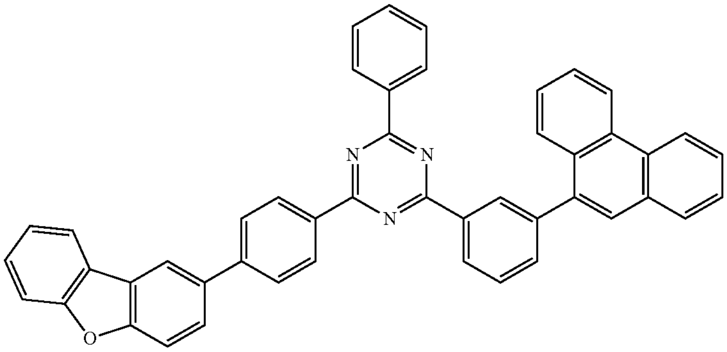
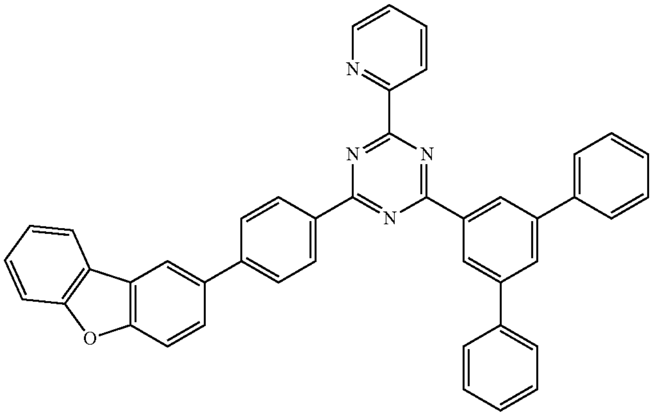
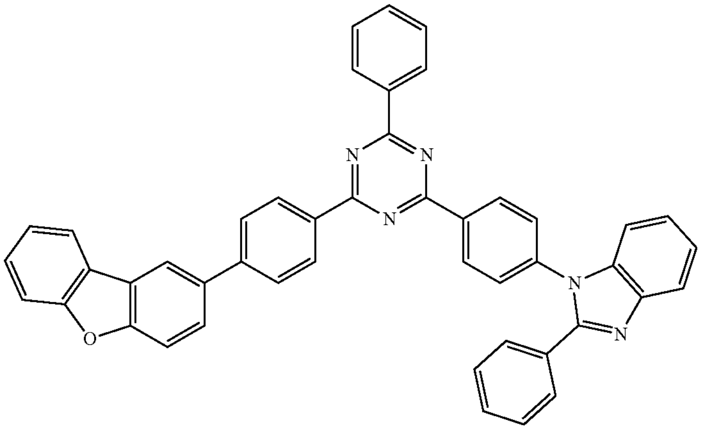

-continued
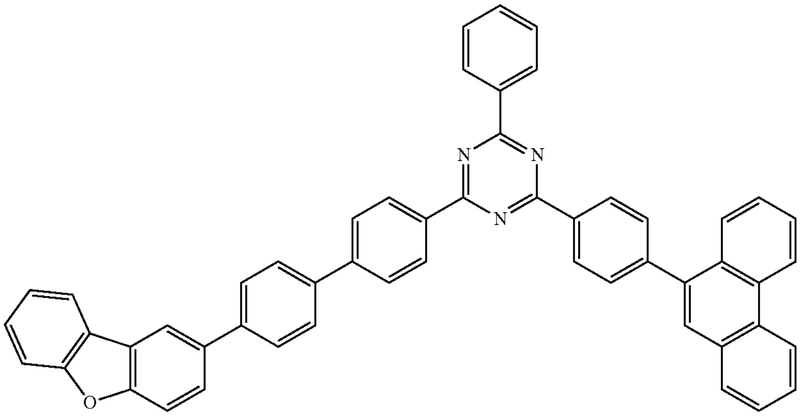
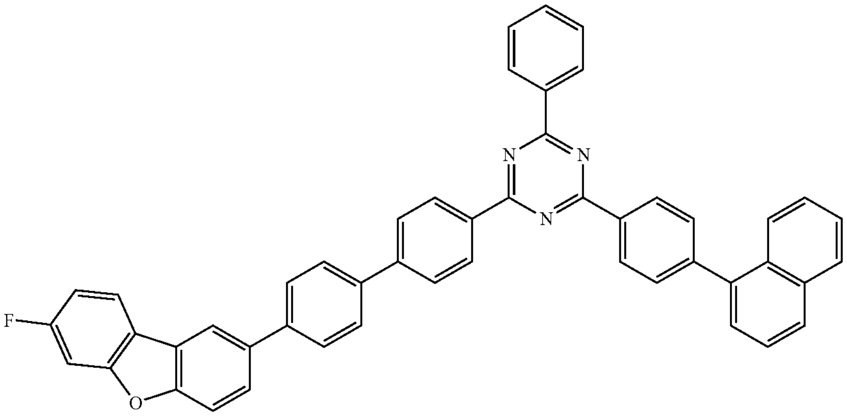
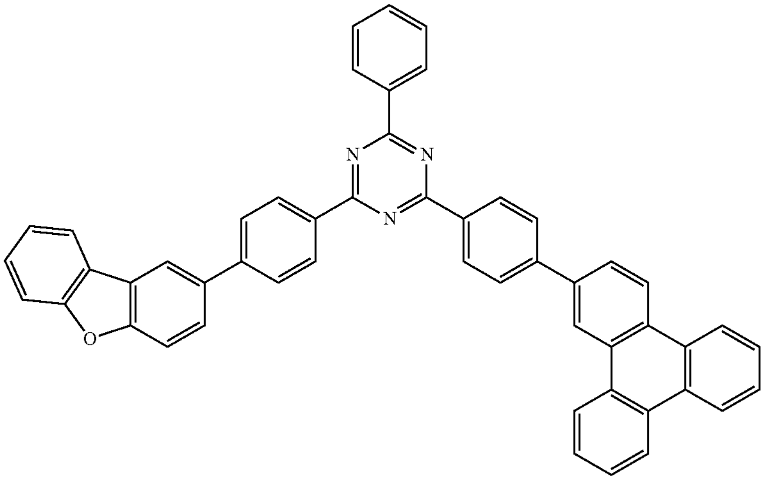
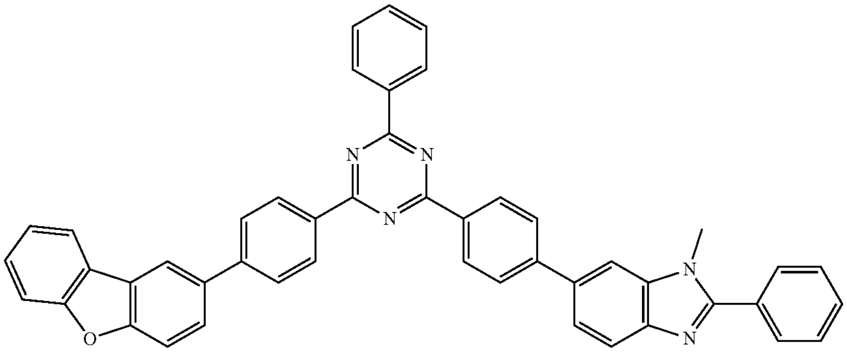

-continued
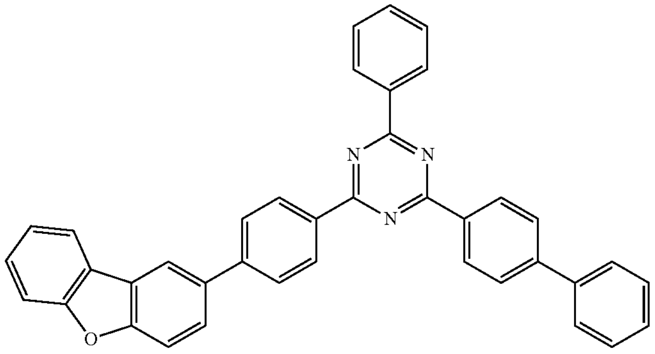
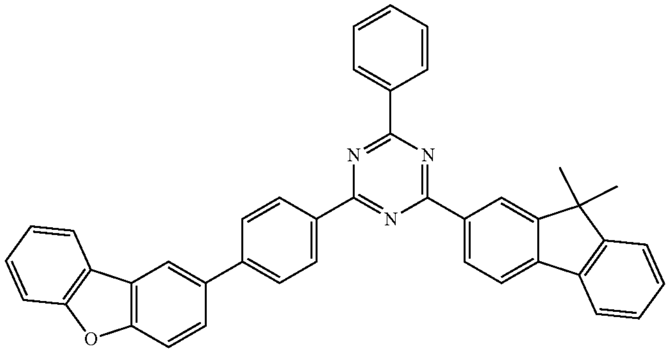
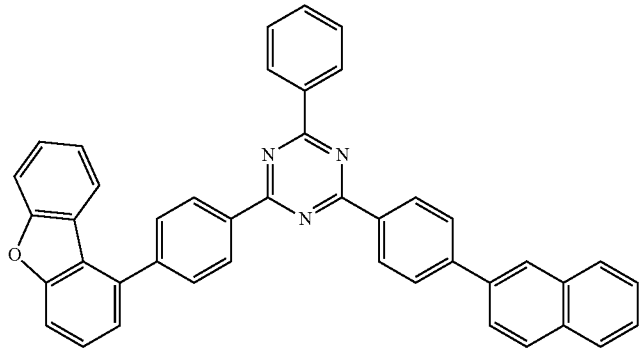
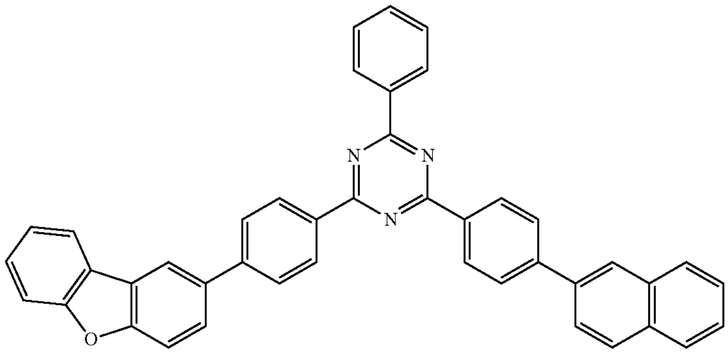

-continued
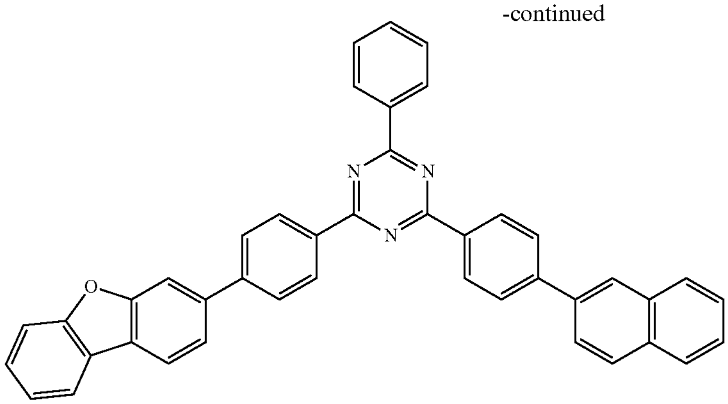
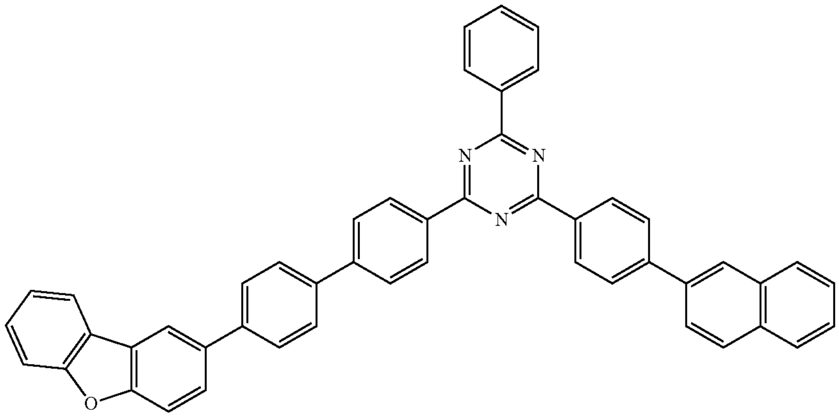
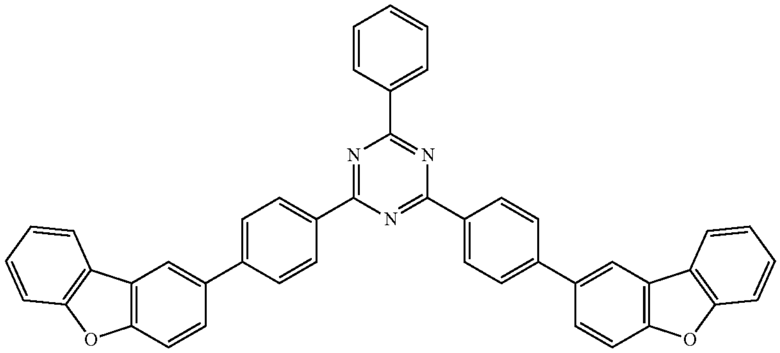
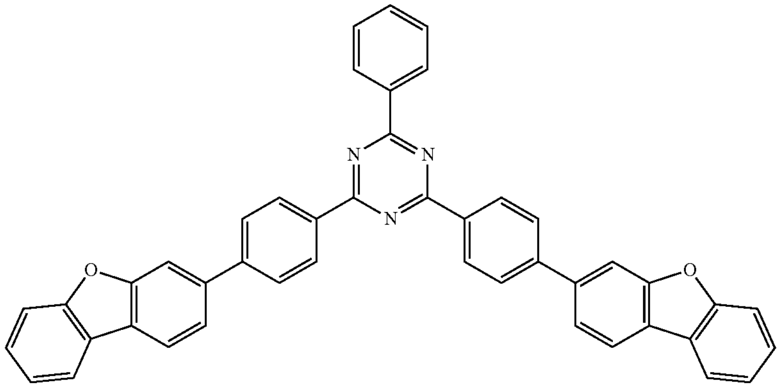

-continued
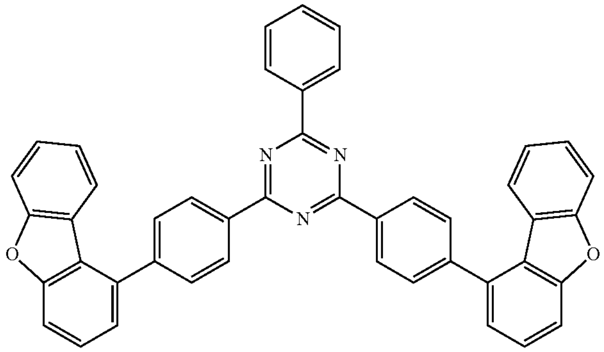
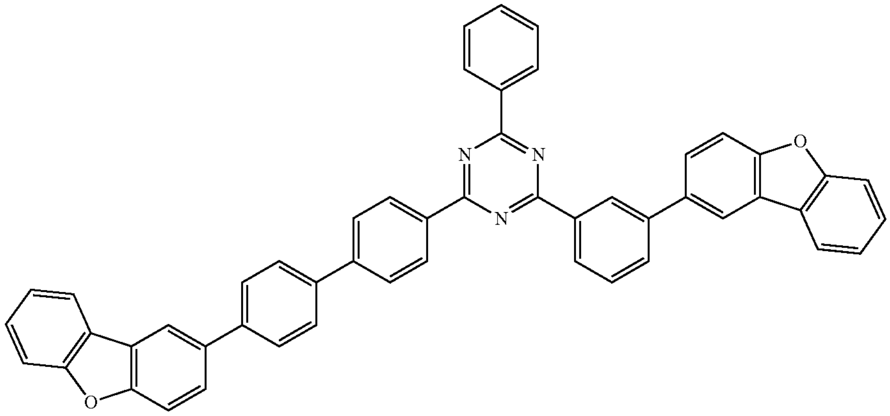
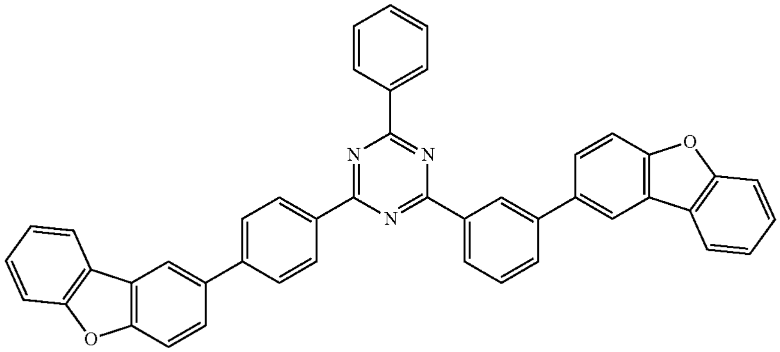

-continued
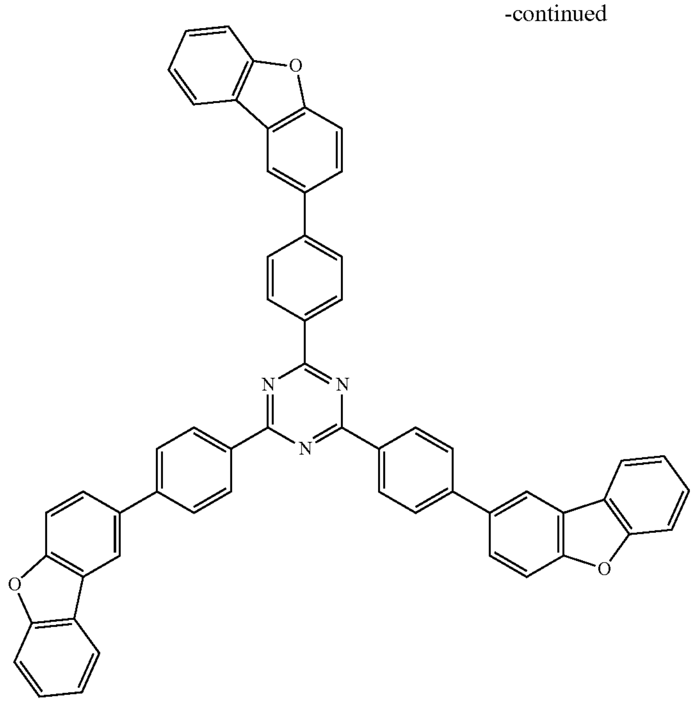
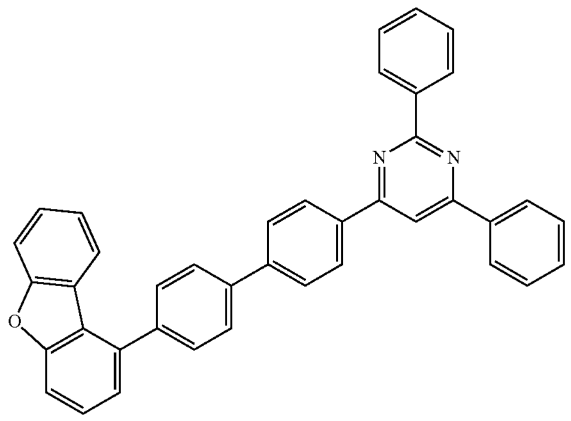
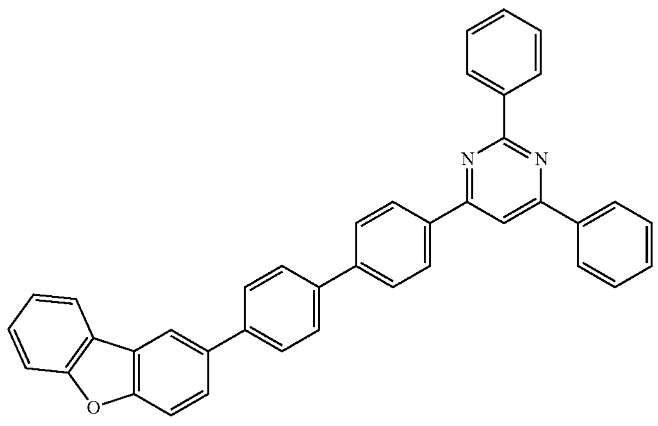

-continued
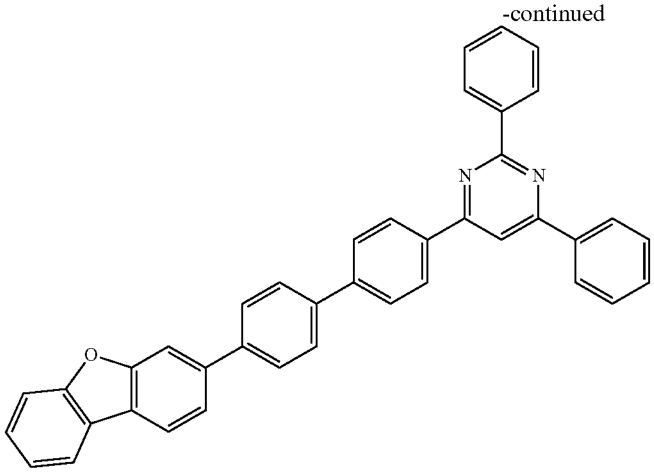
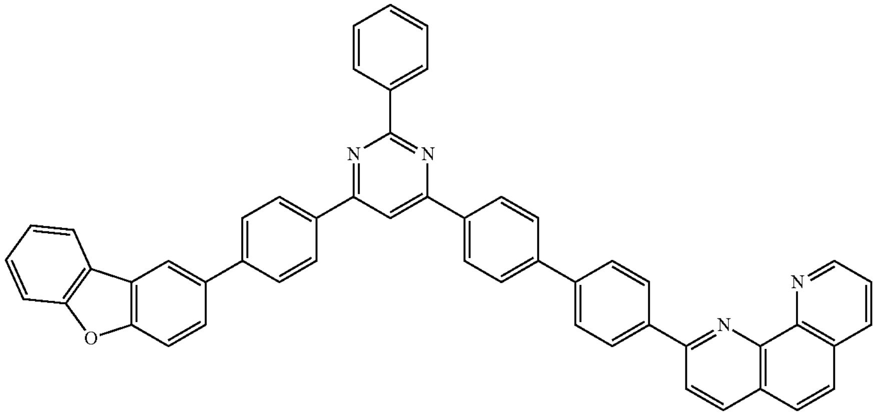
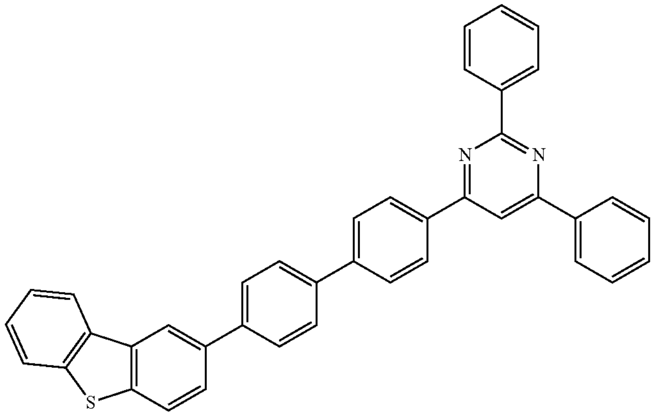
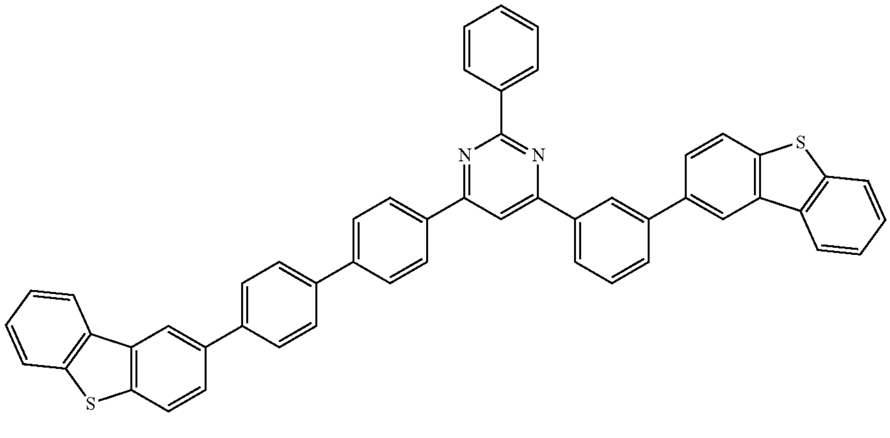

-continued
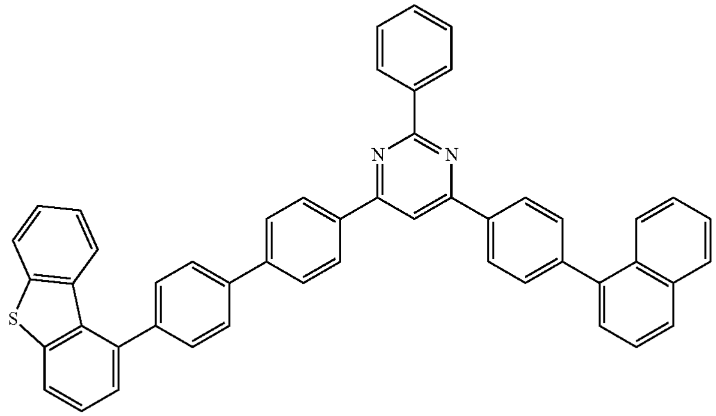
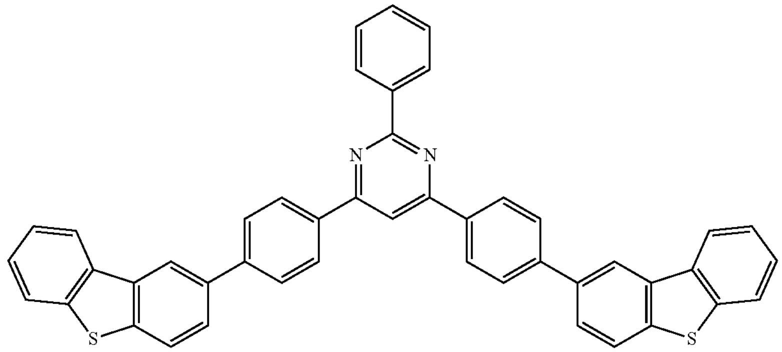
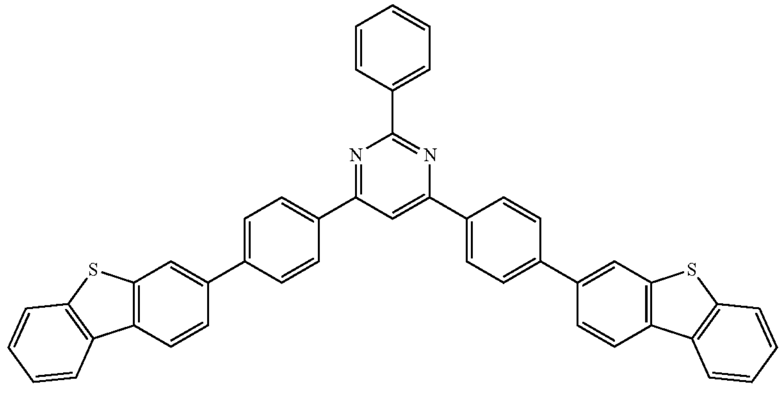
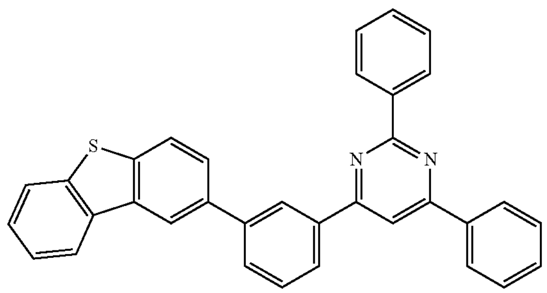

-continued
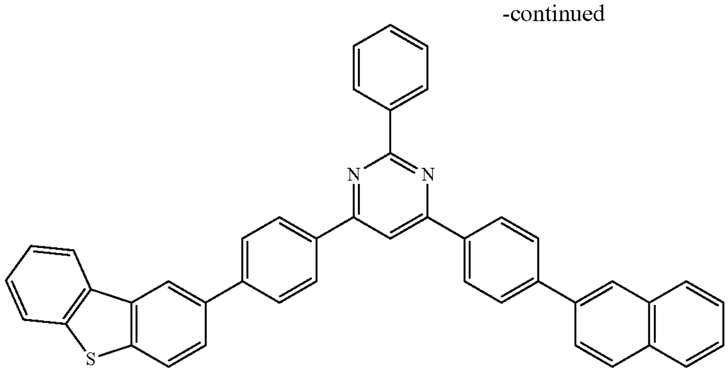
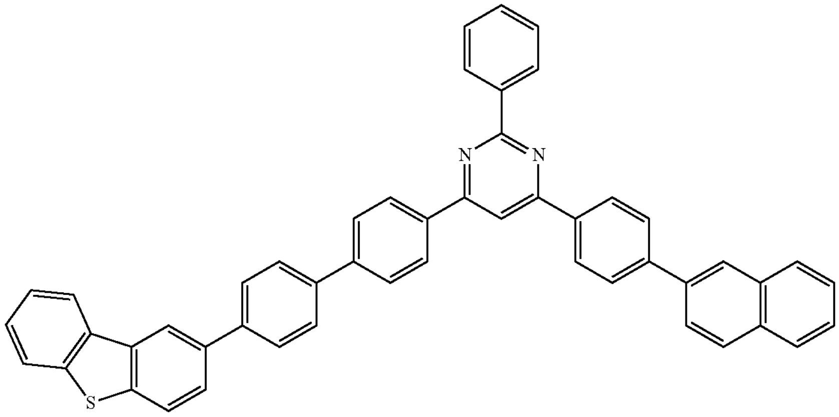
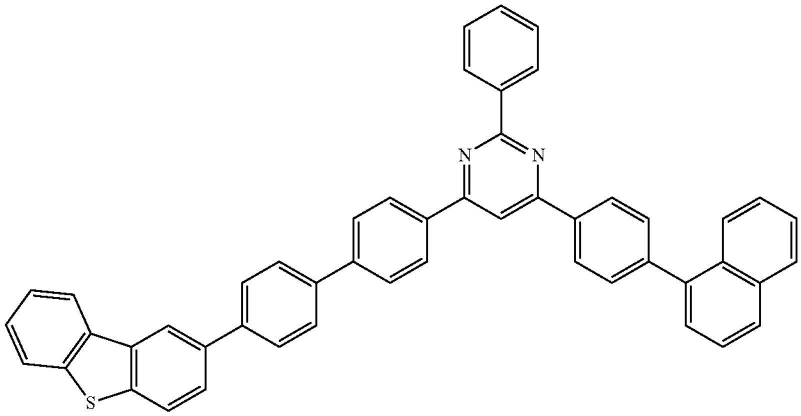
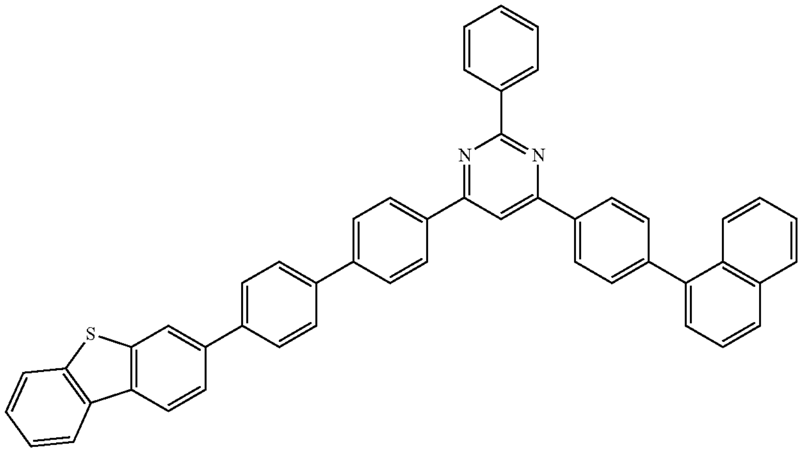

-continued
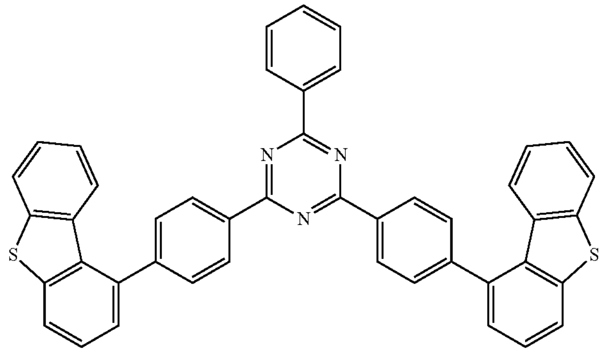
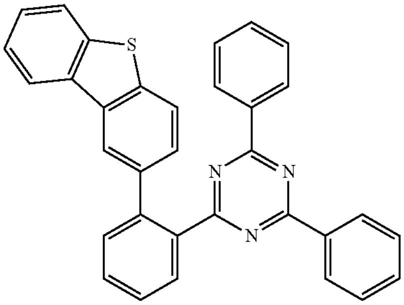
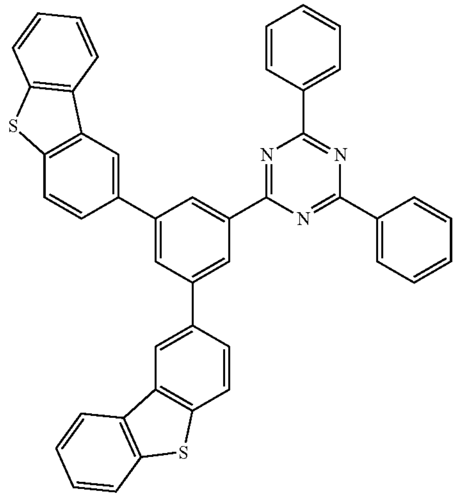
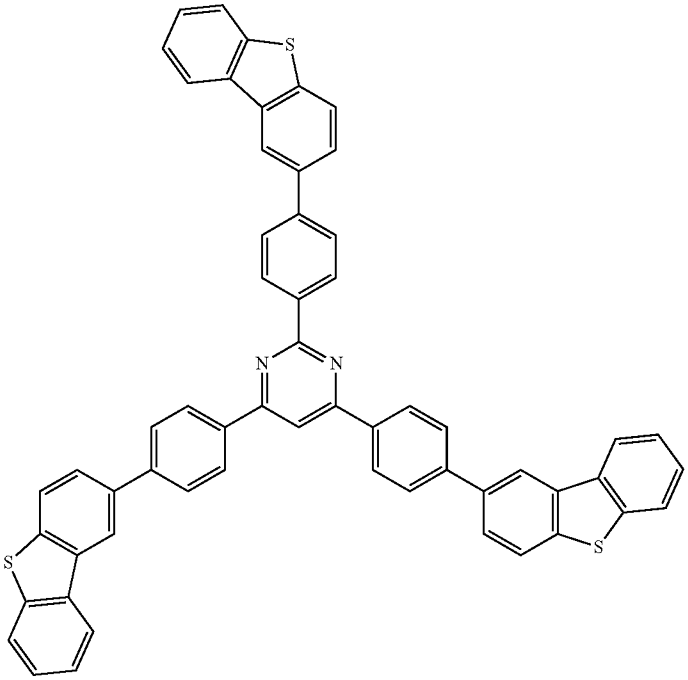
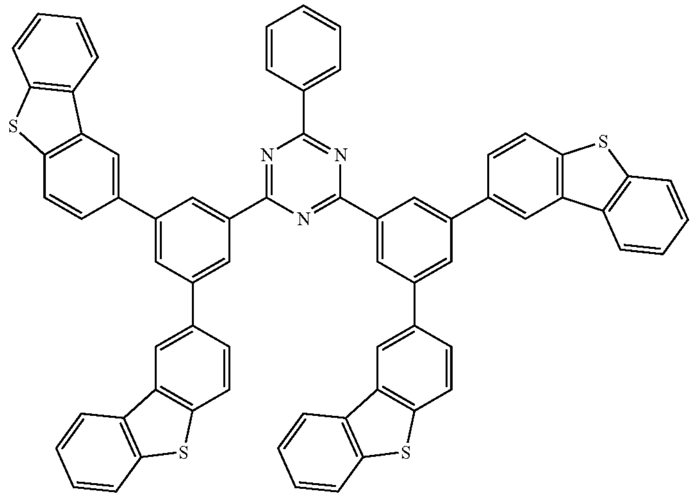

-continued
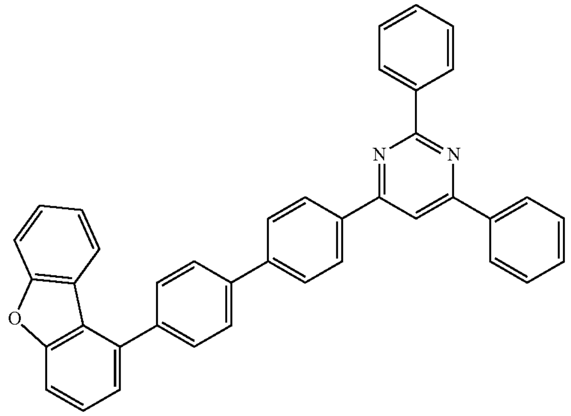
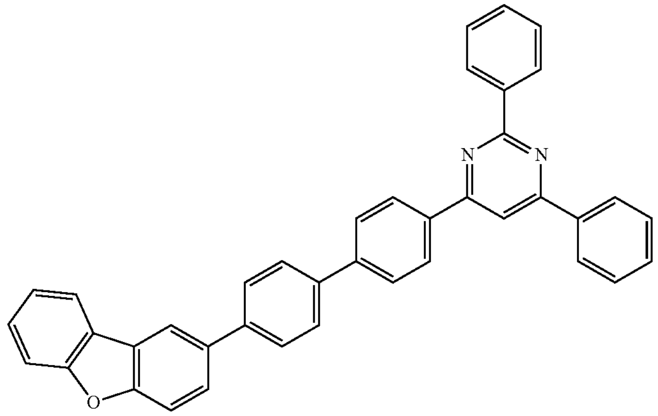
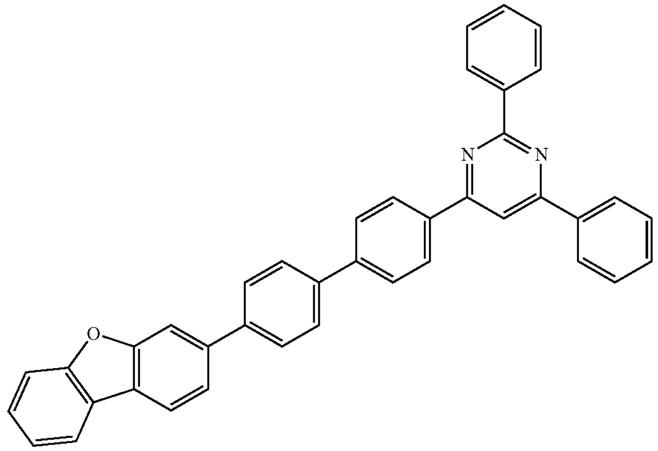
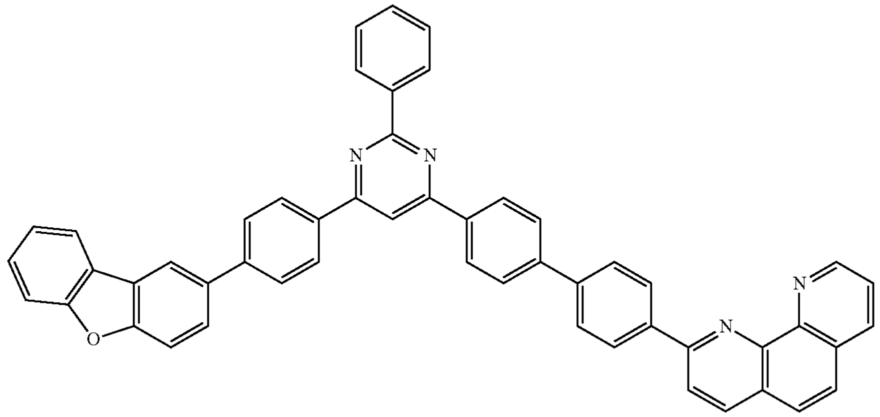

-continued
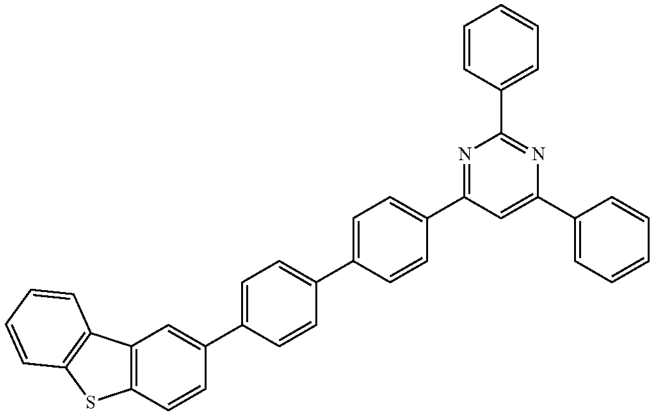
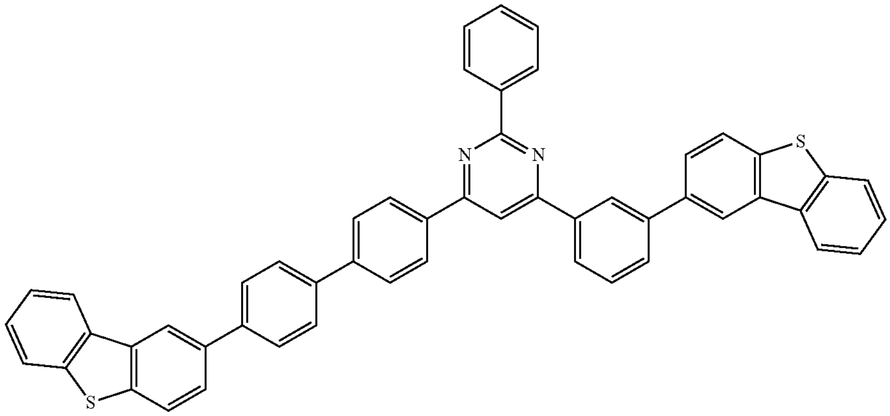
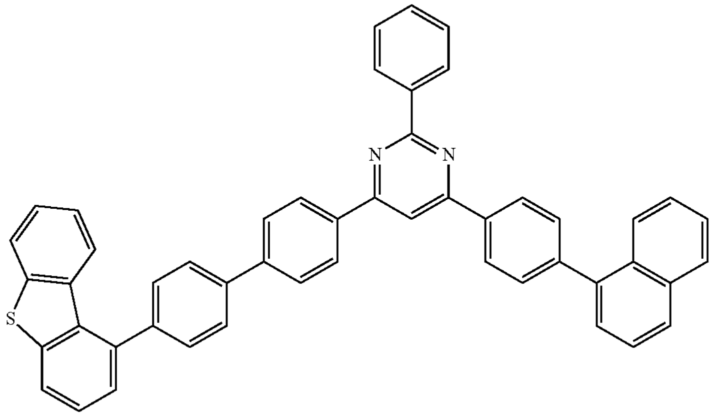
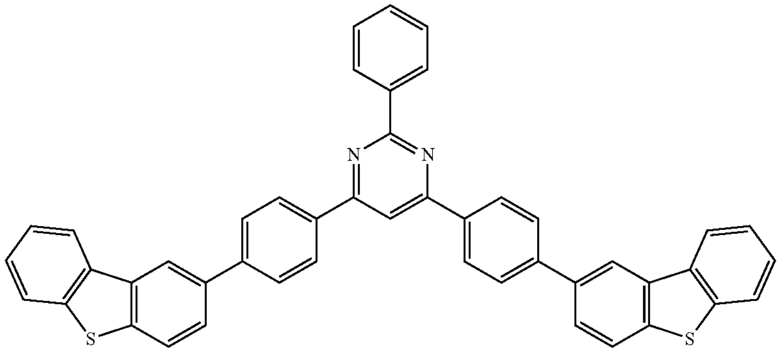

-continued
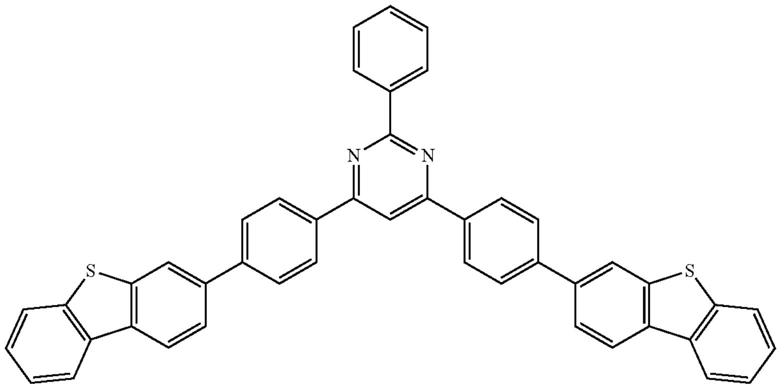
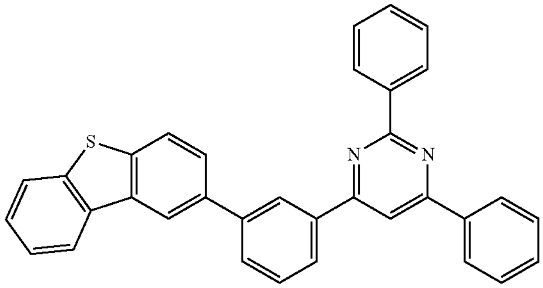
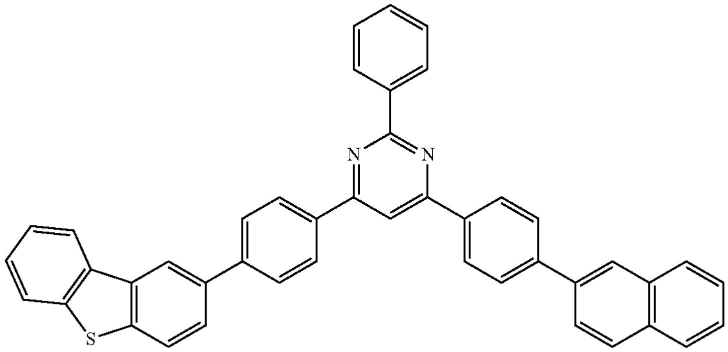
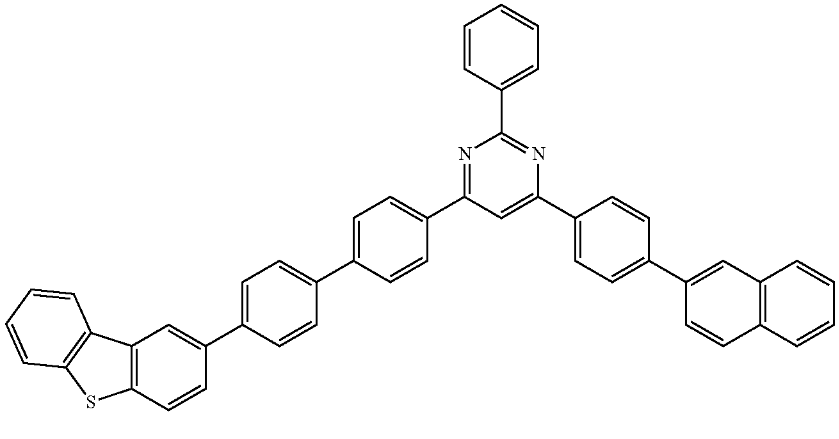

-continued
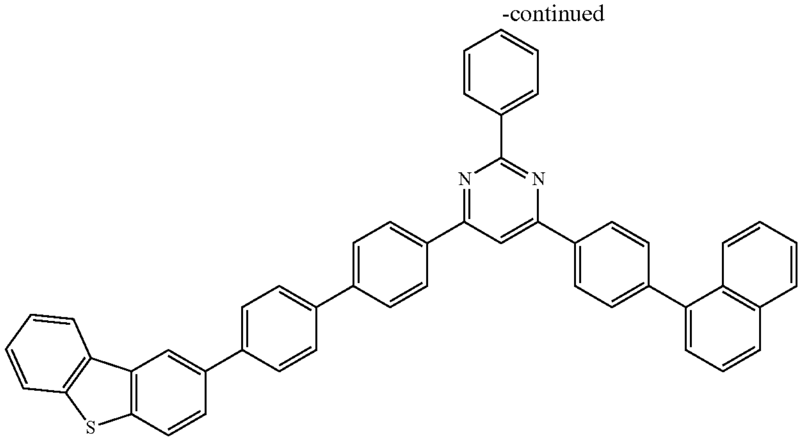
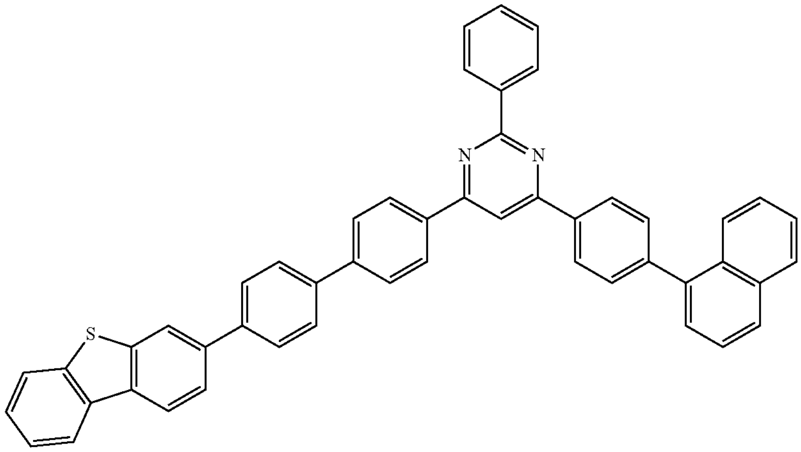
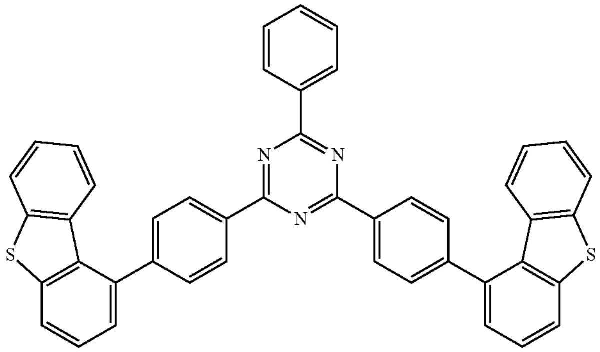
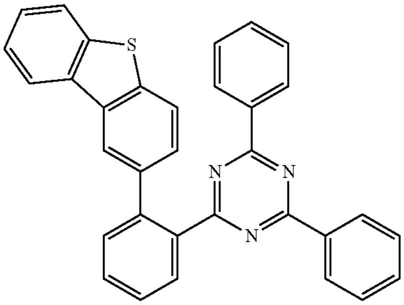

-continued
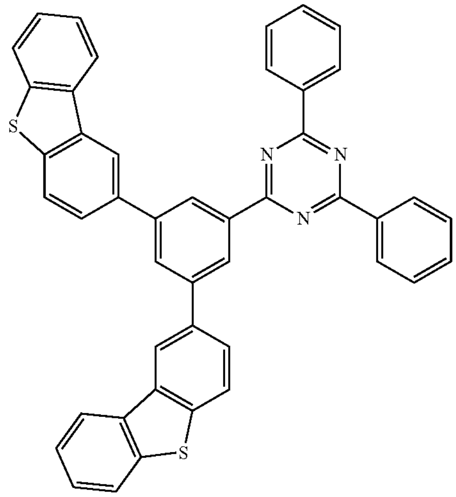
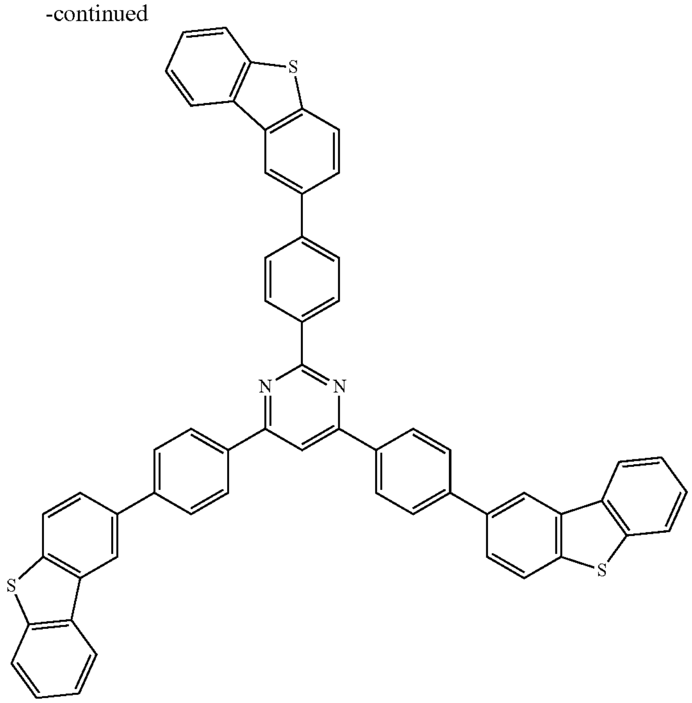
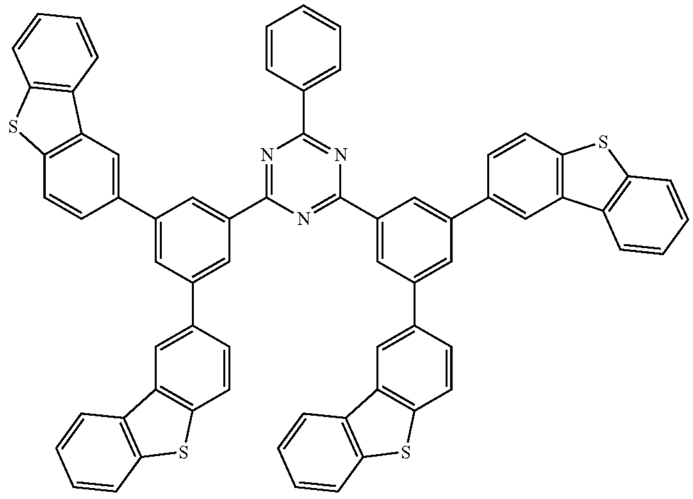
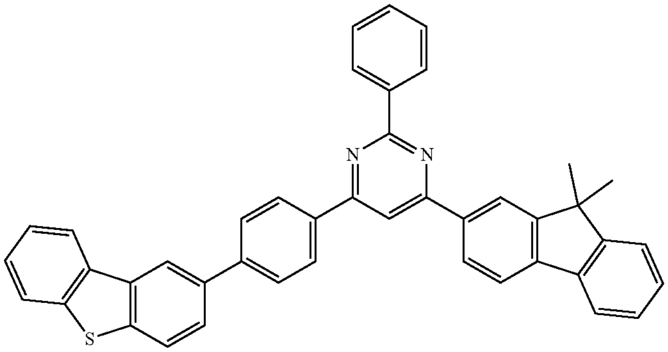

-continued
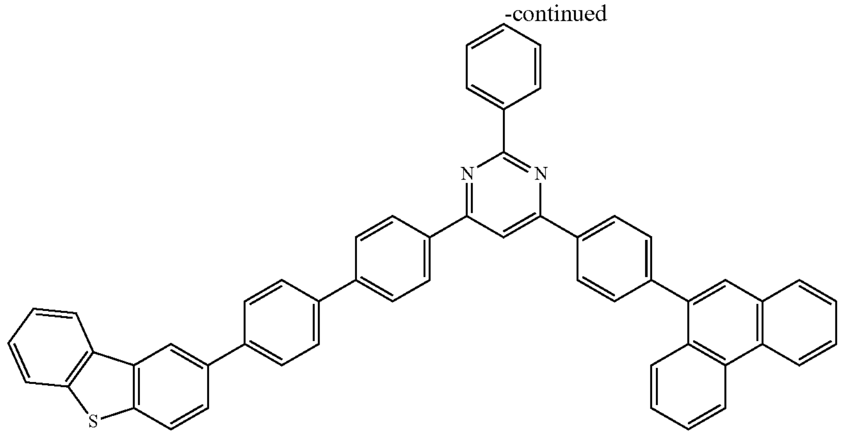
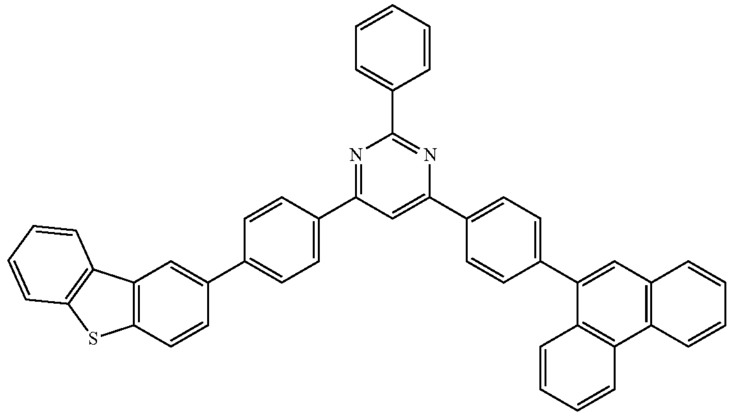
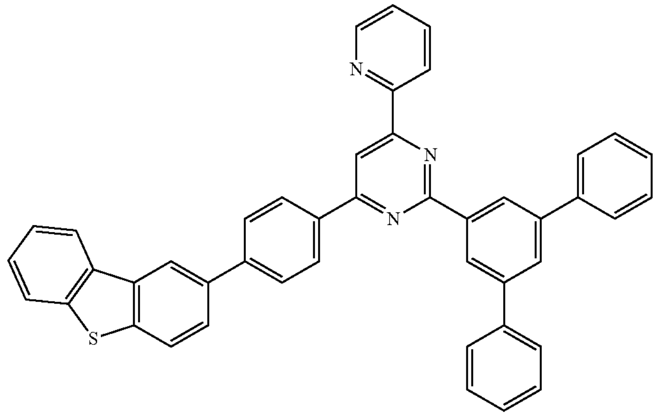
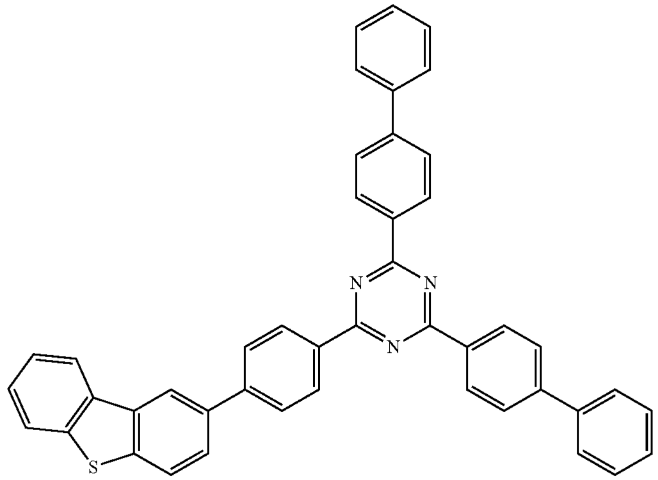

-continued
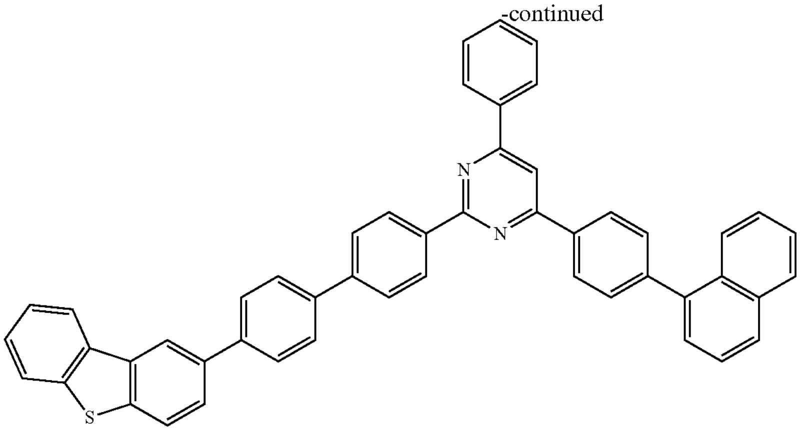
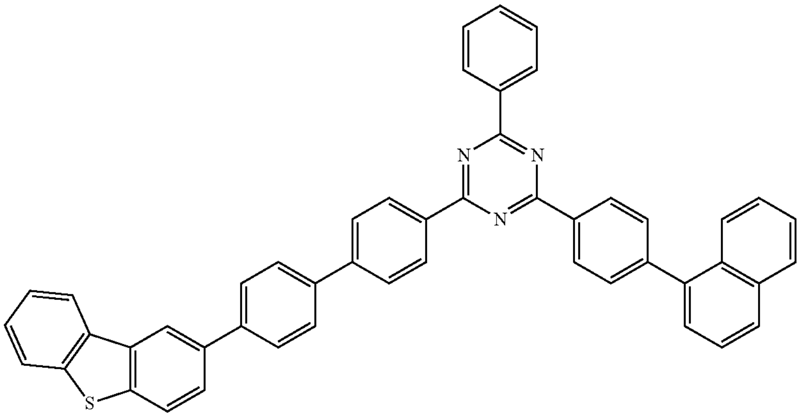
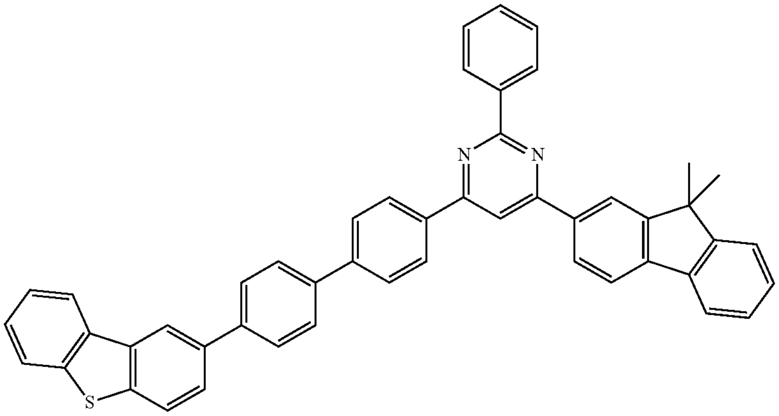
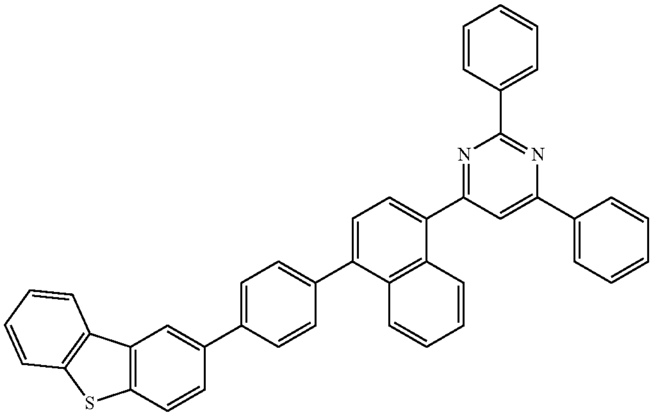

-continued
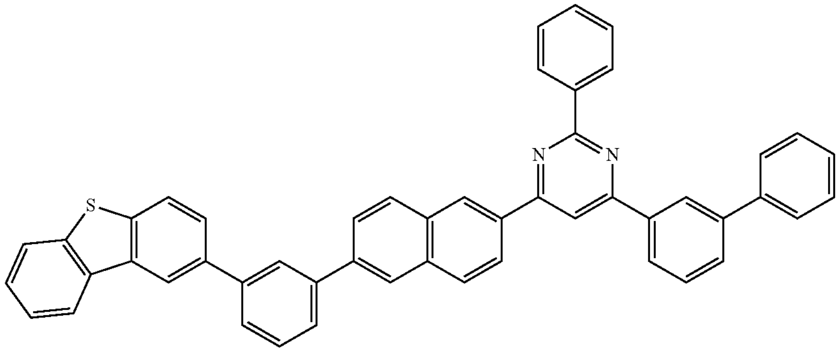
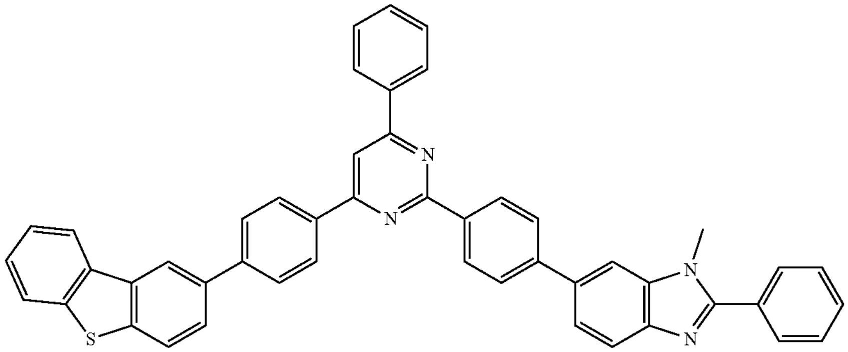
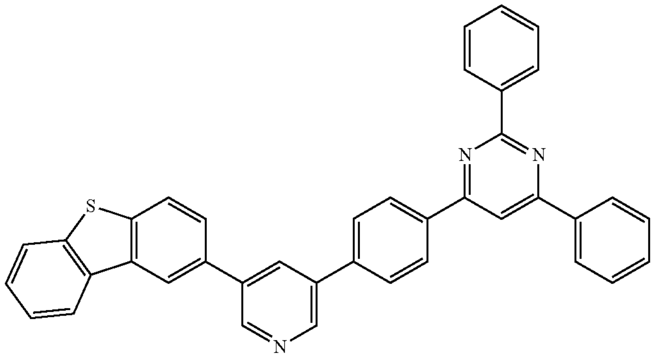
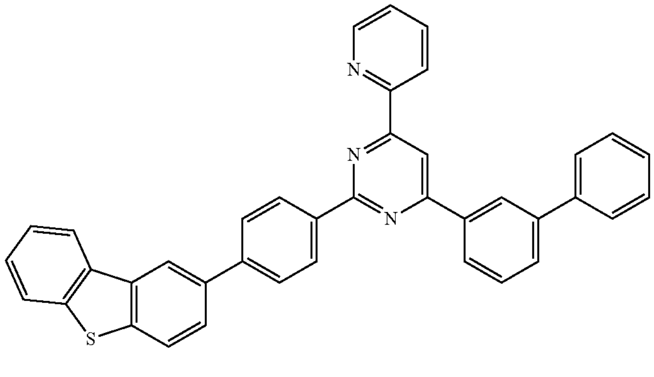

-continued
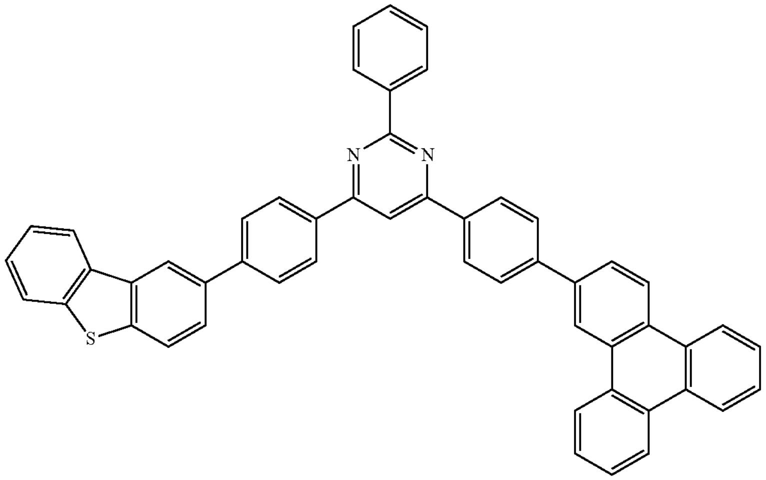
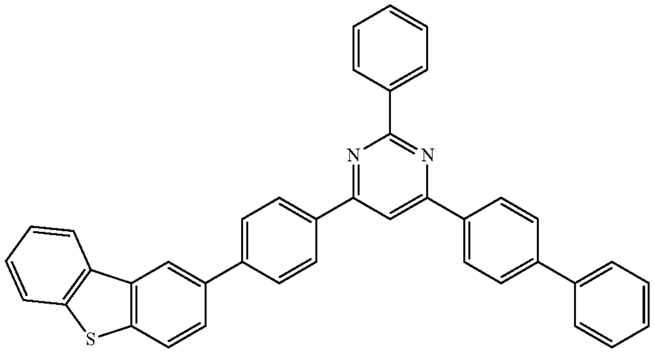
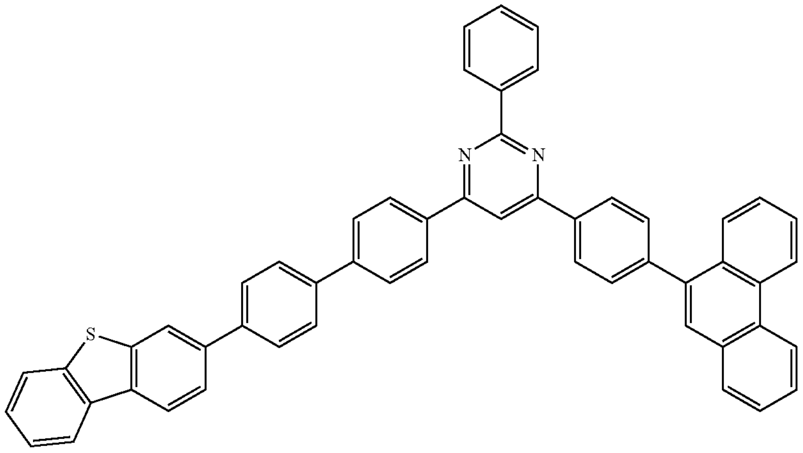

-continued
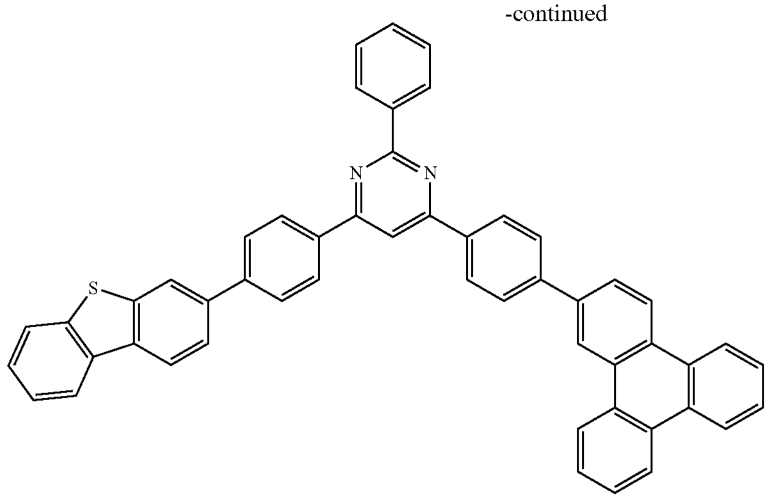
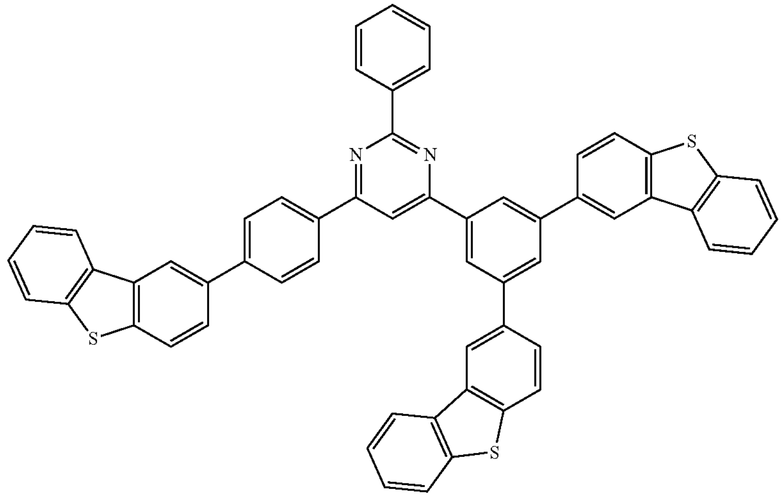
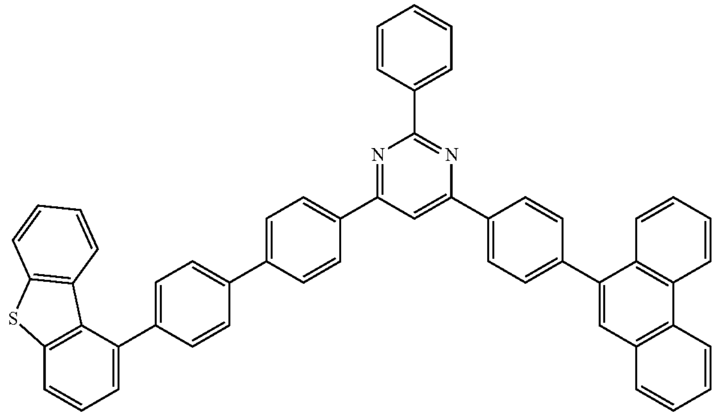

-continued
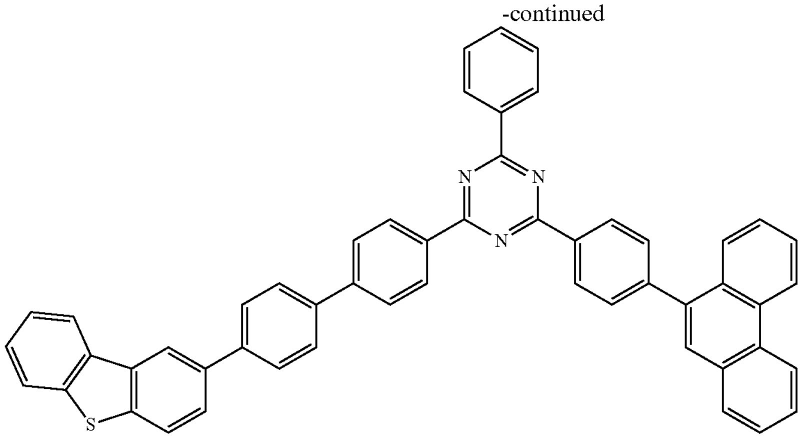
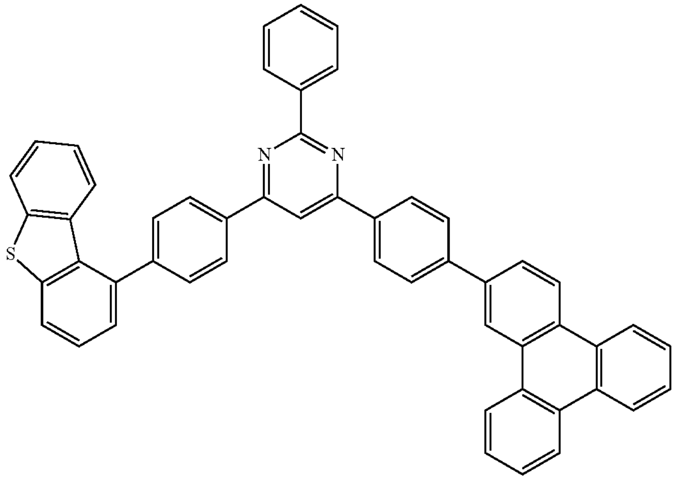
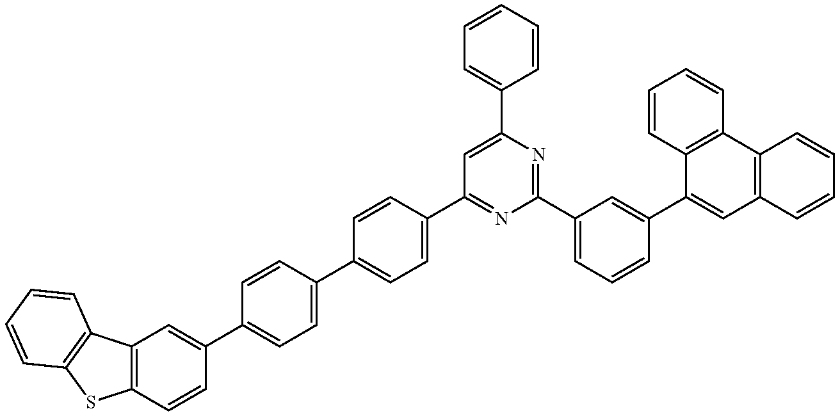
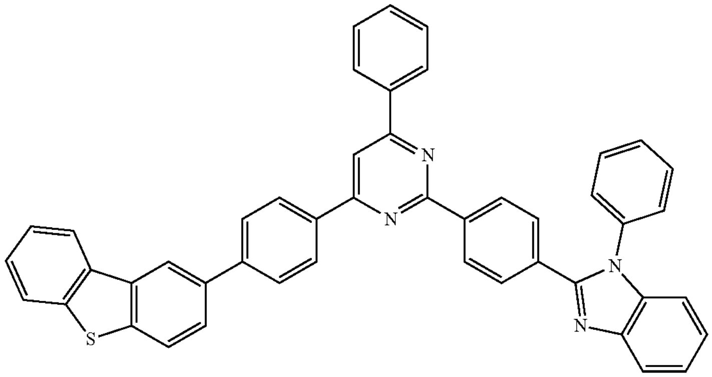

-continued
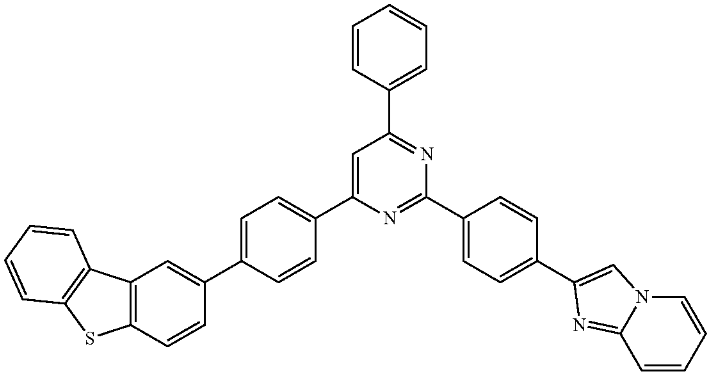
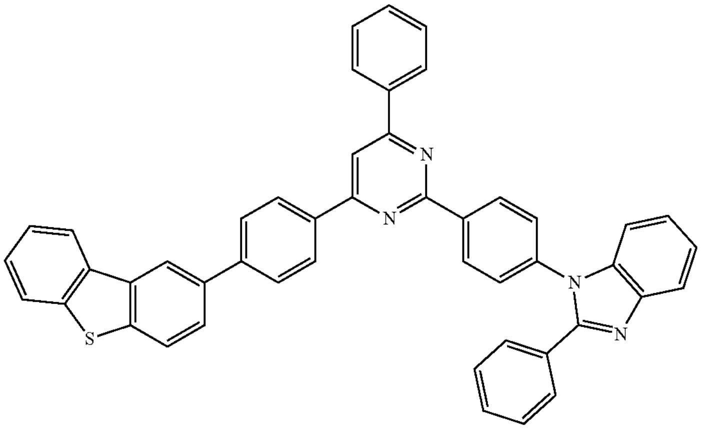
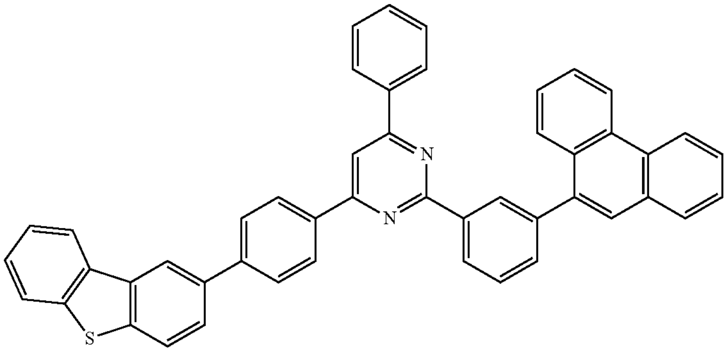
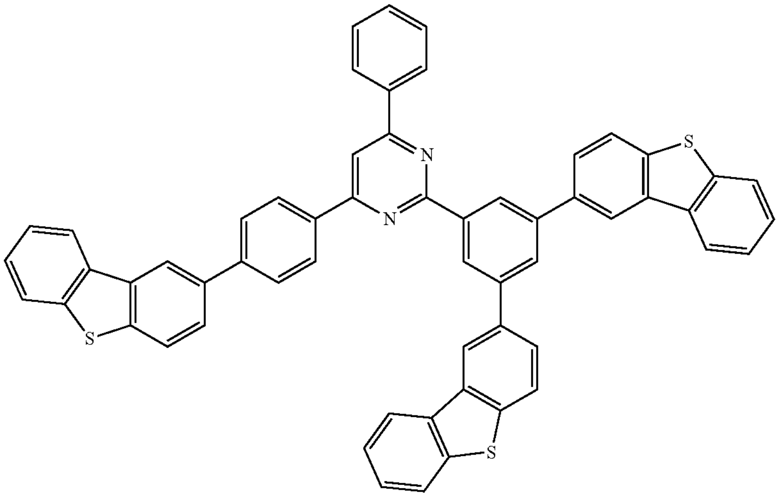

-continued
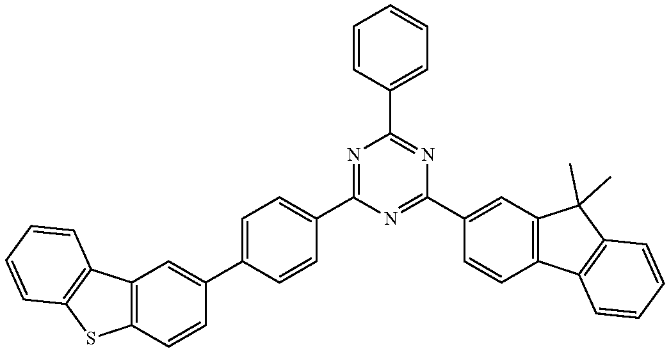
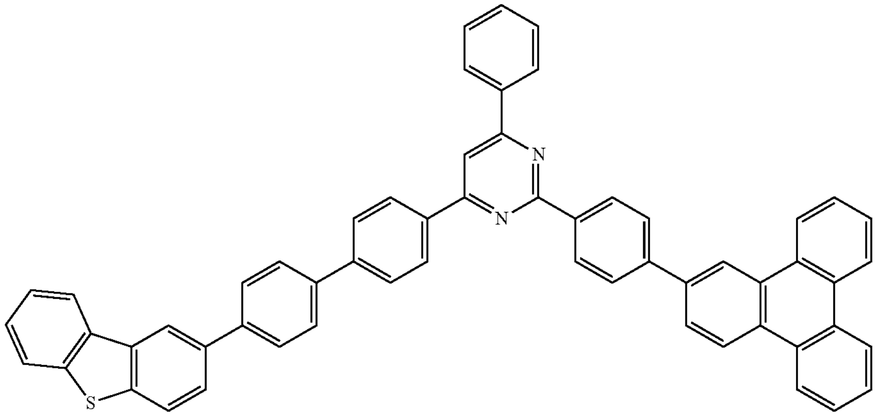
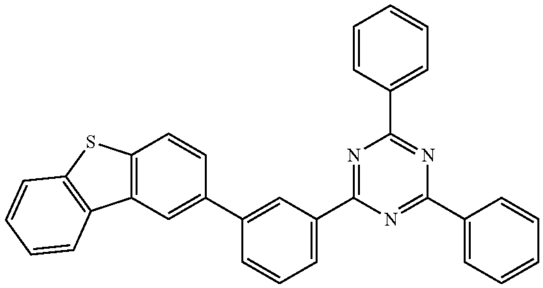
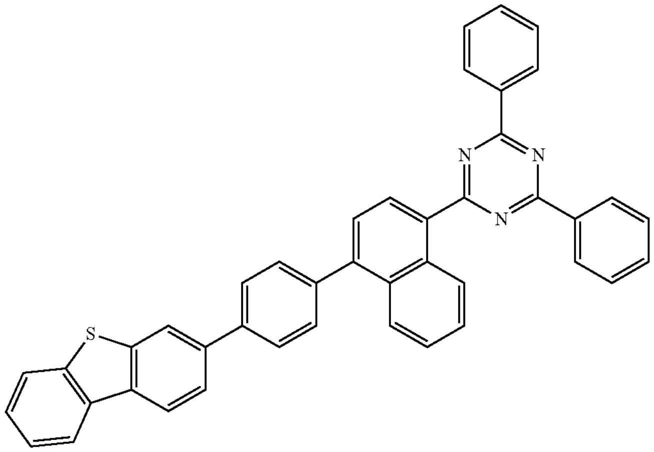

-continued
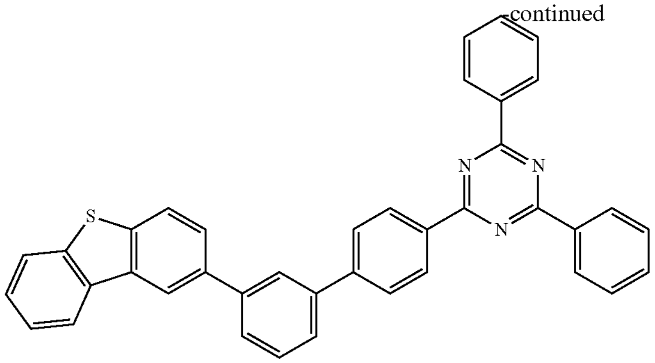
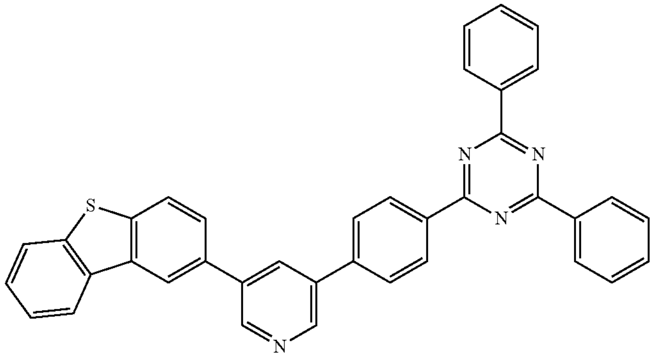
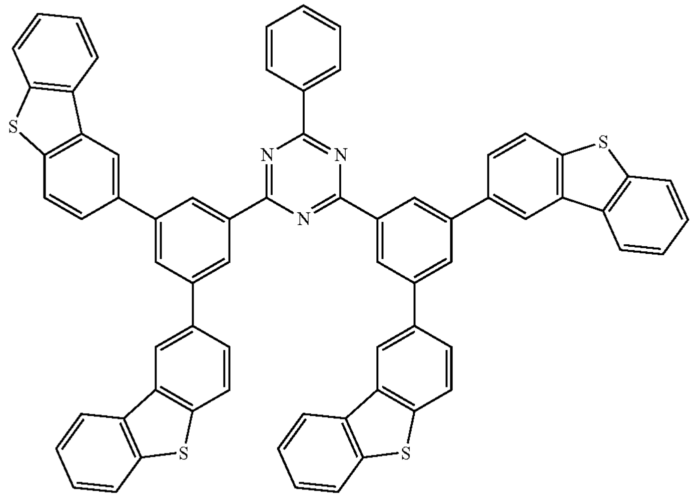
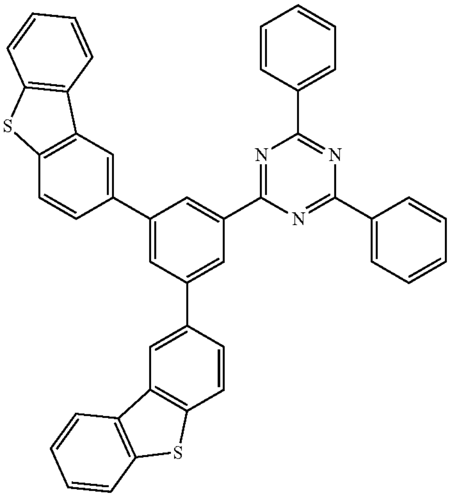
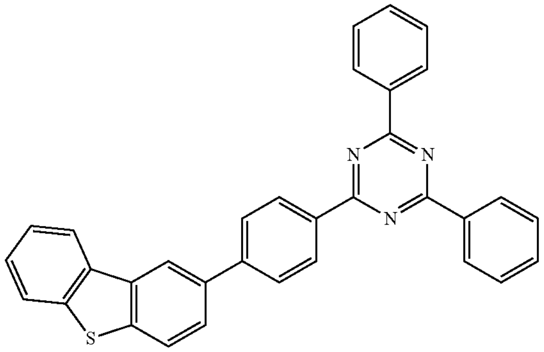

-continued
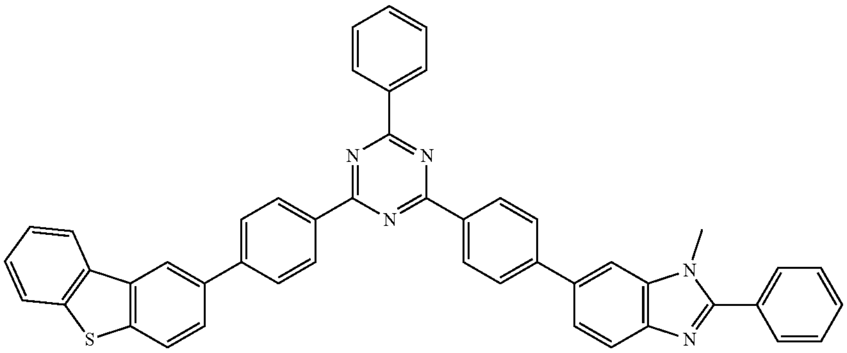
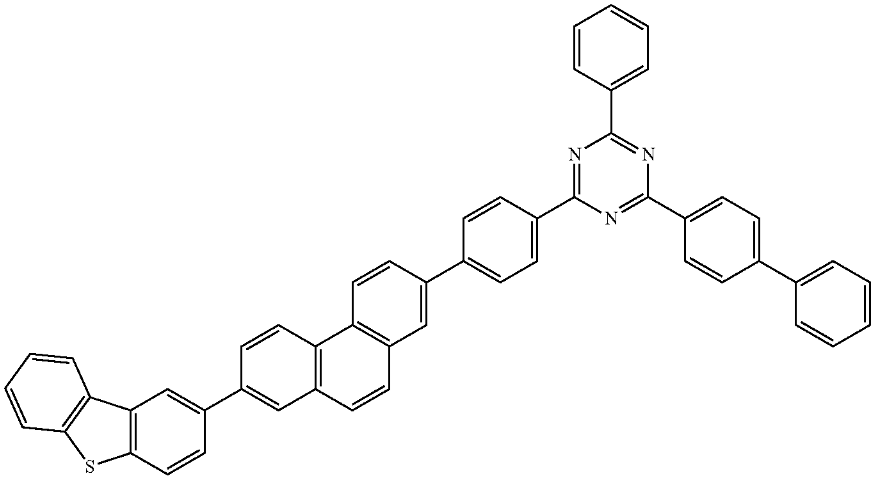
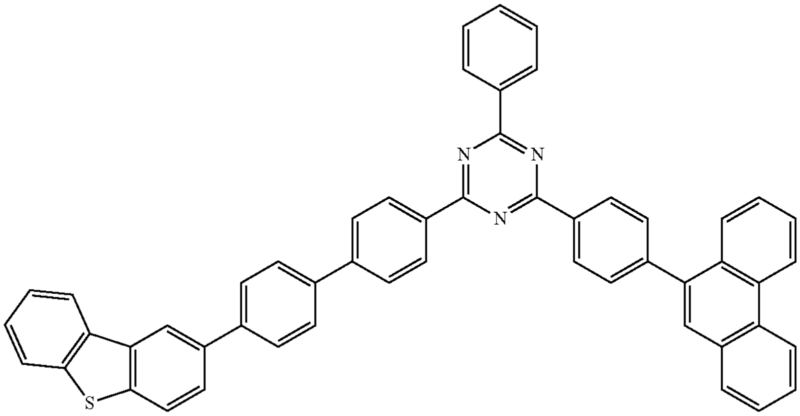
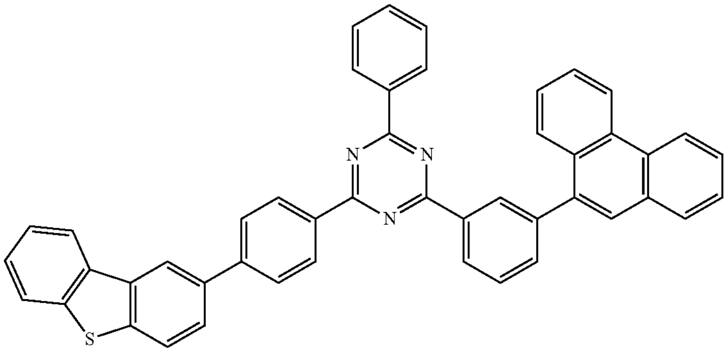

-continued
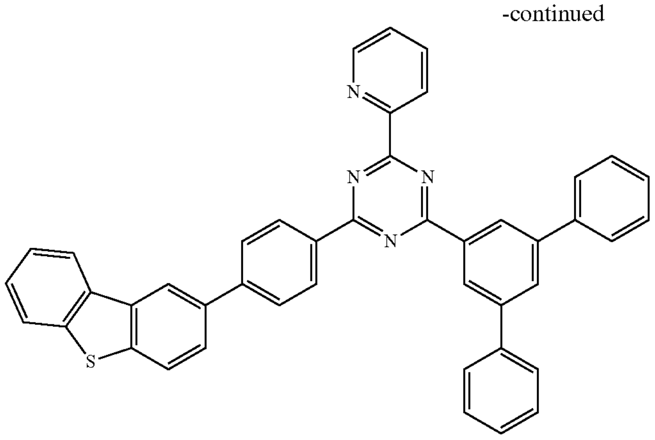
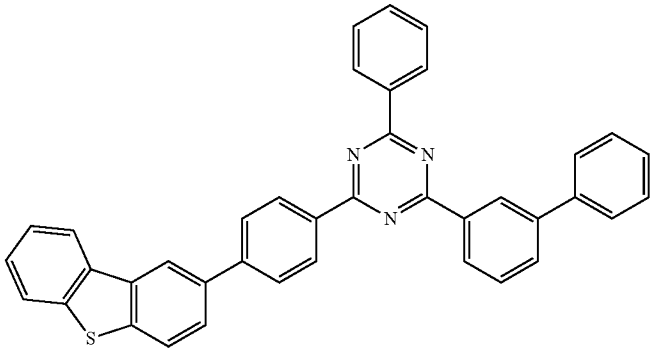
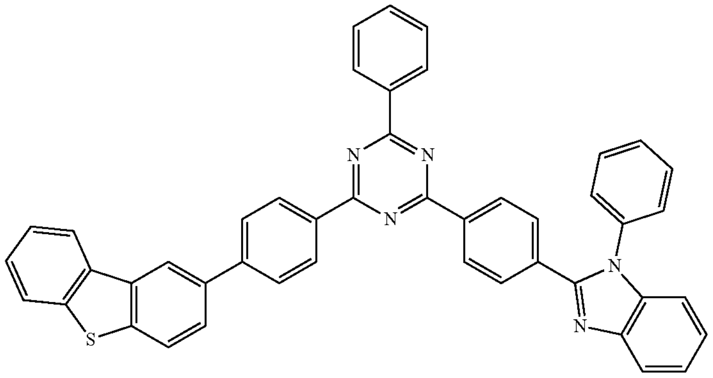
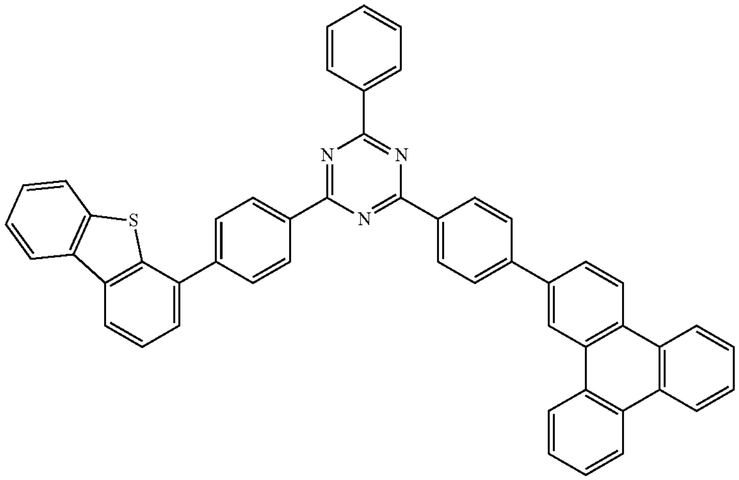

-continued
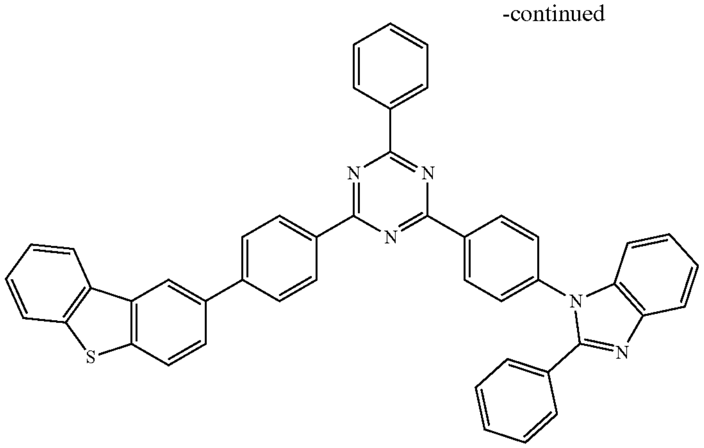
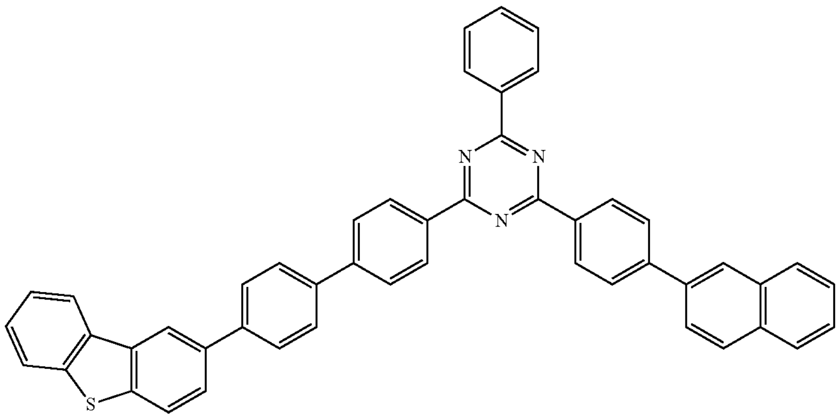
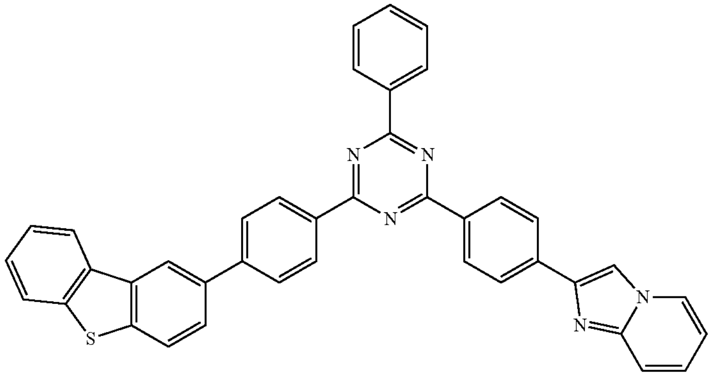
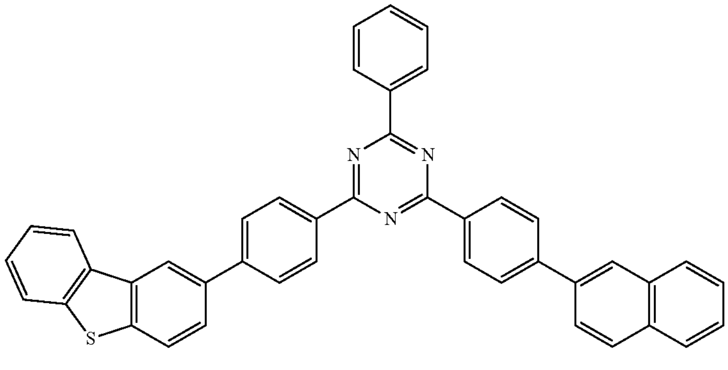

-continued
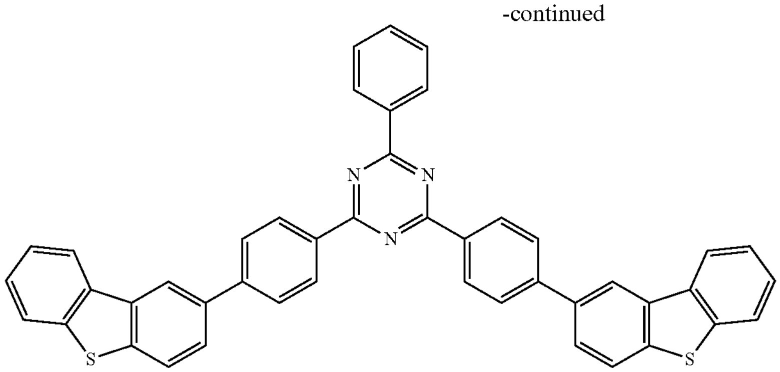
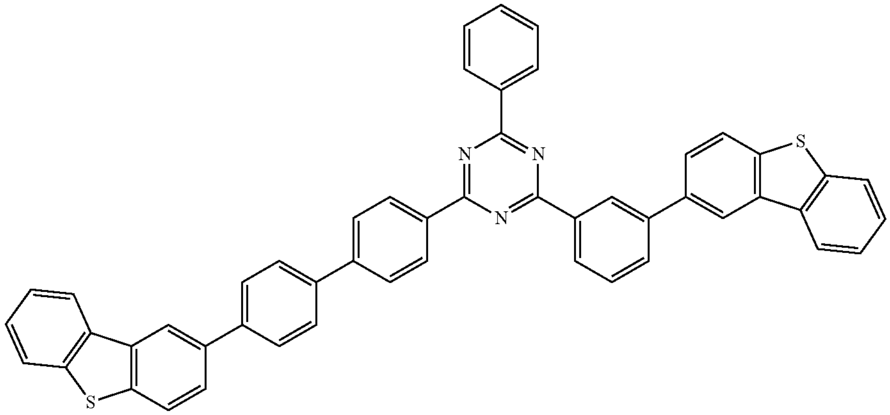
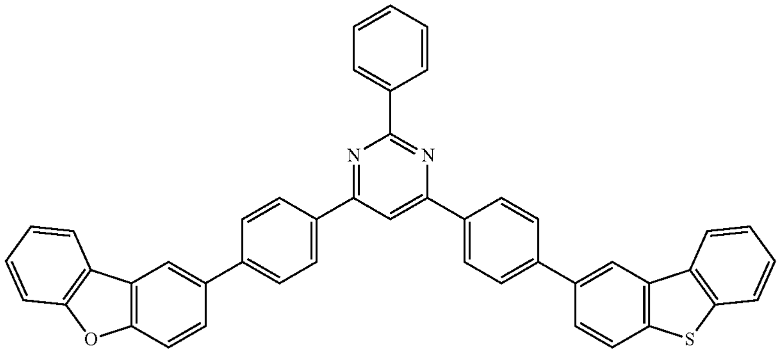
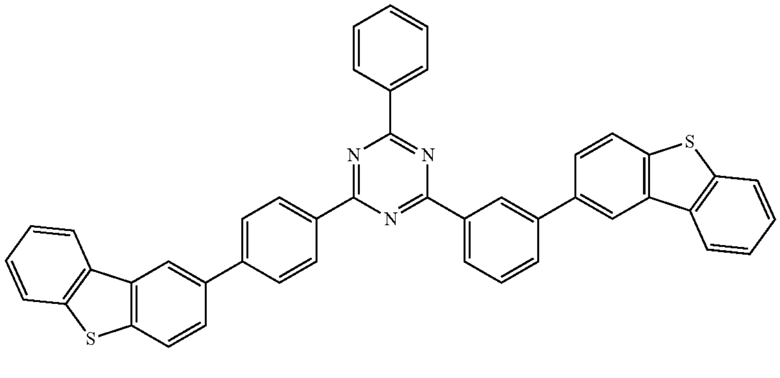

-continued
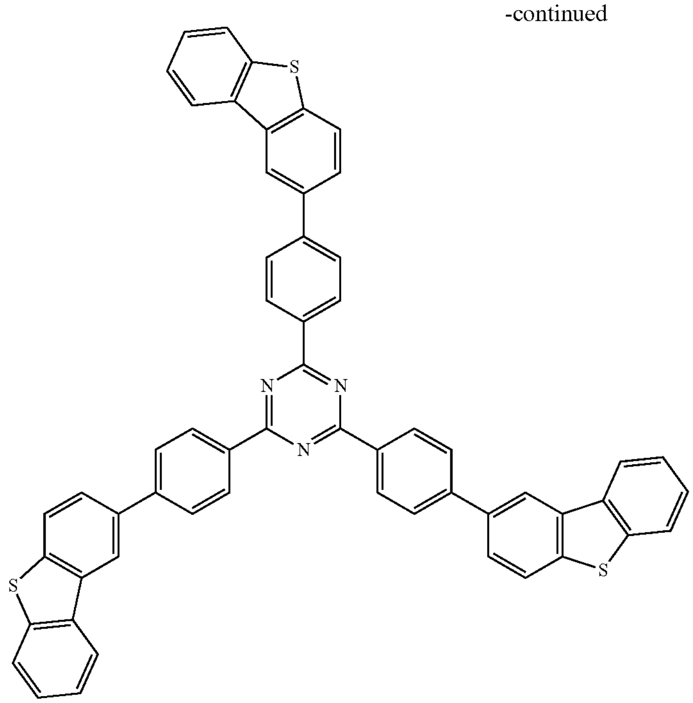
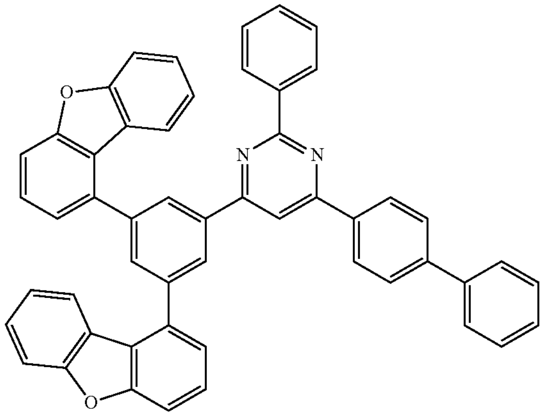
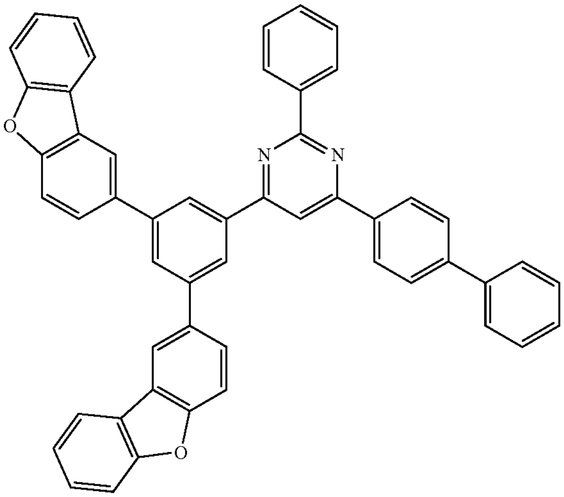
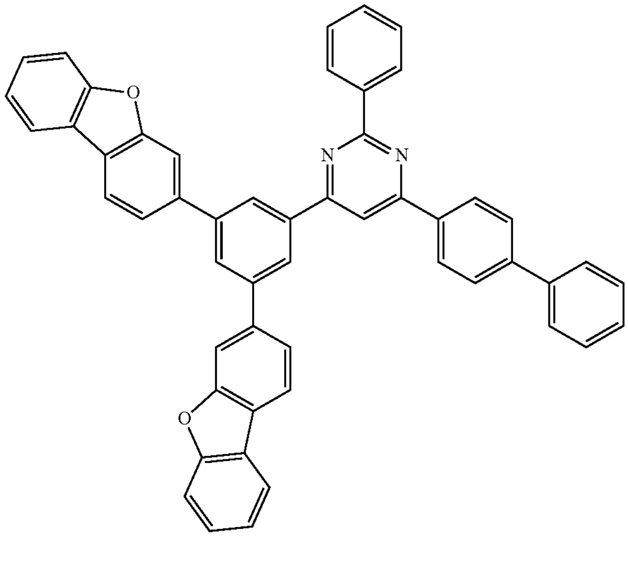
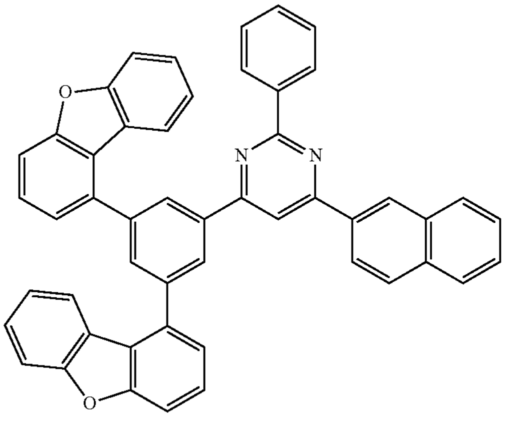

-continued
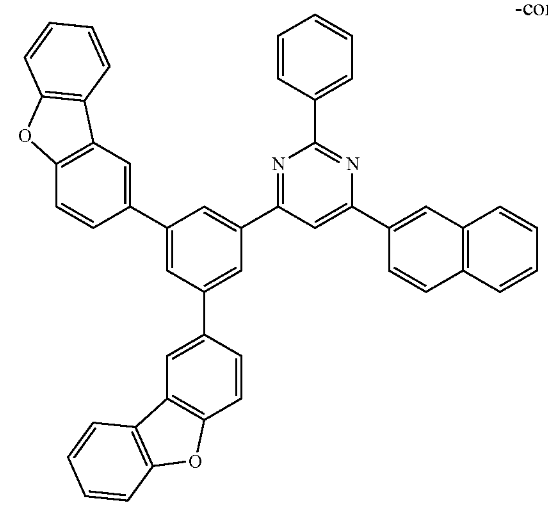
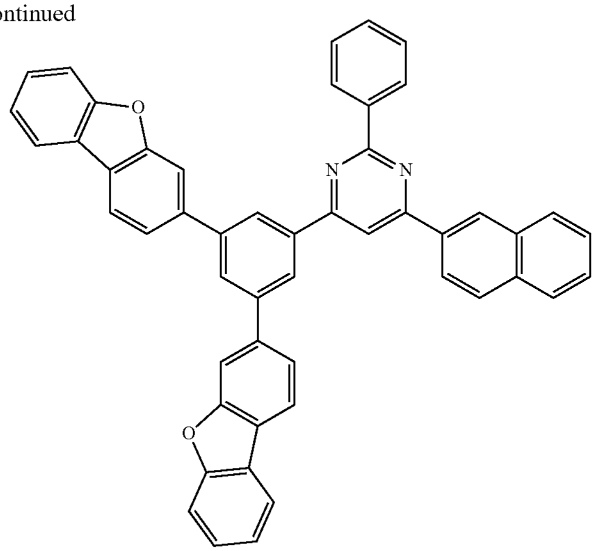
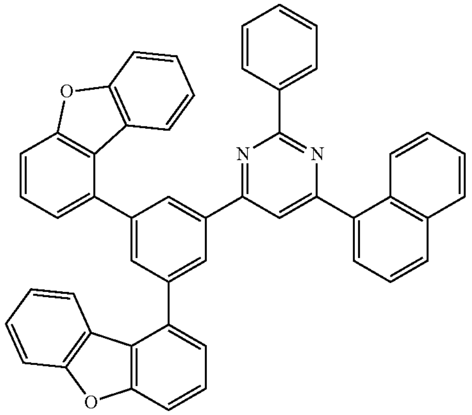
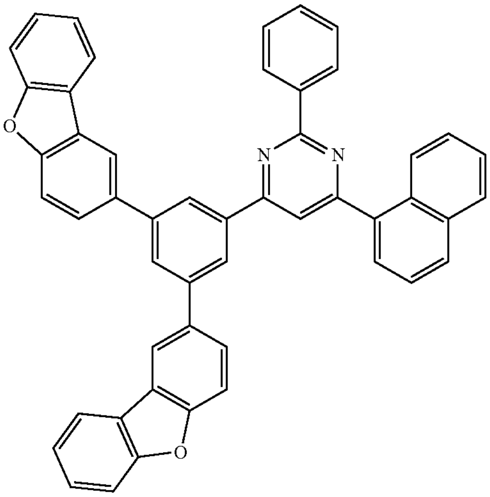
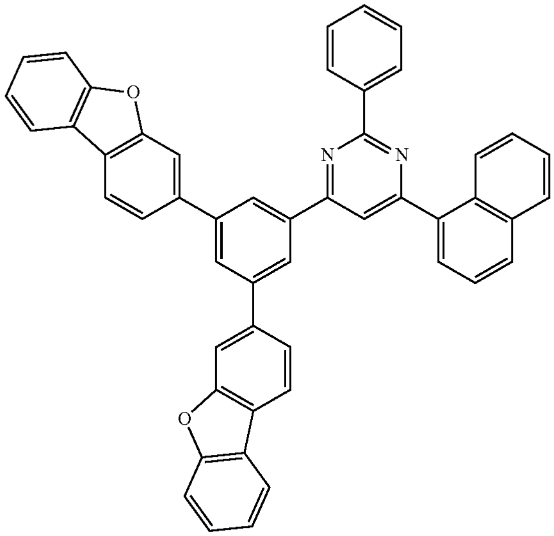

-continued
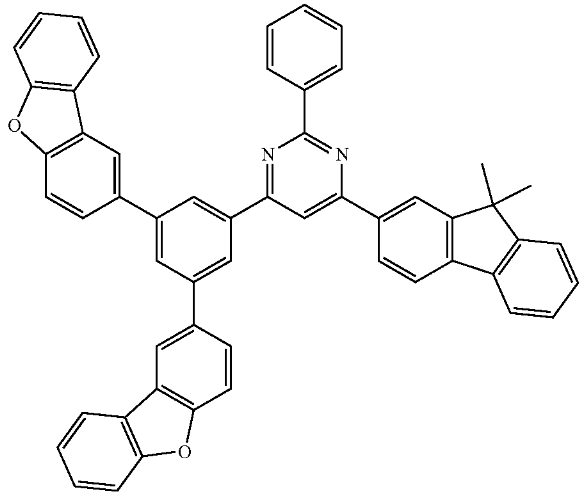
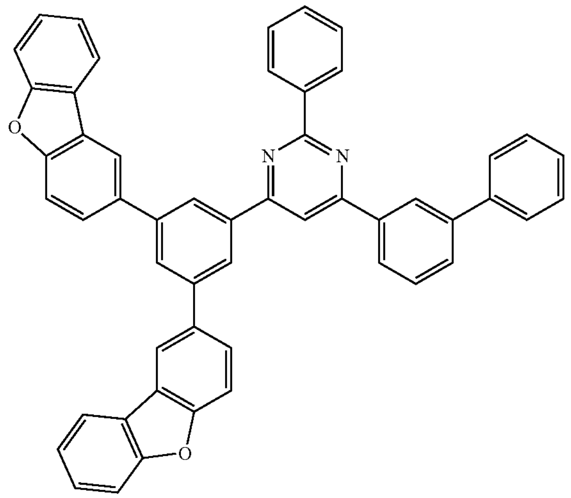
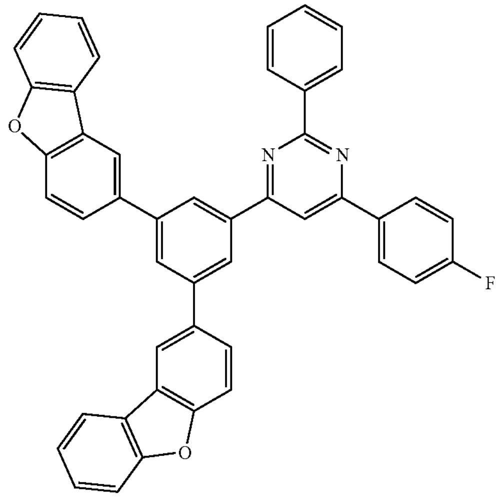
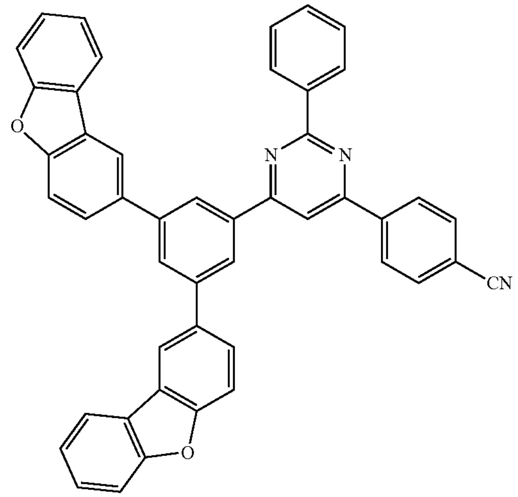
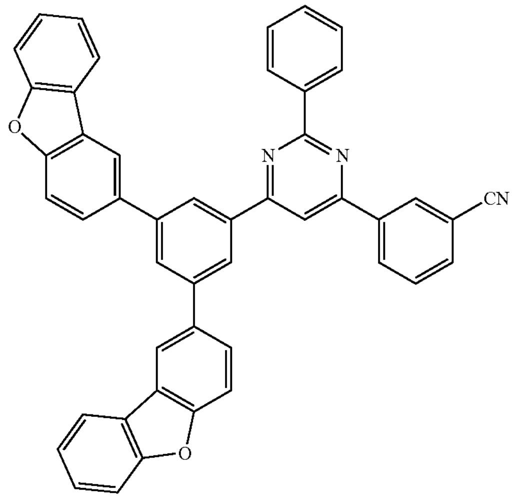
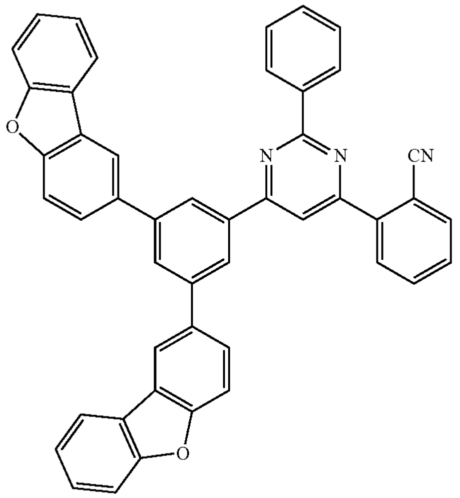

-continued
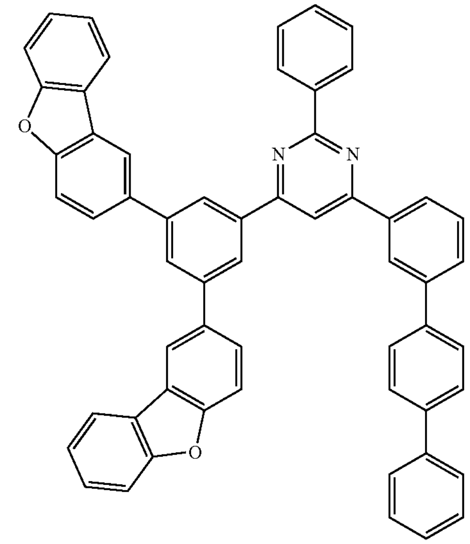
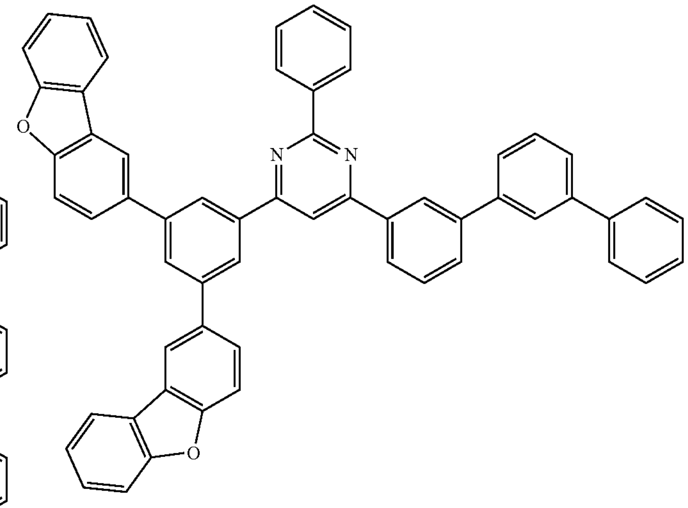
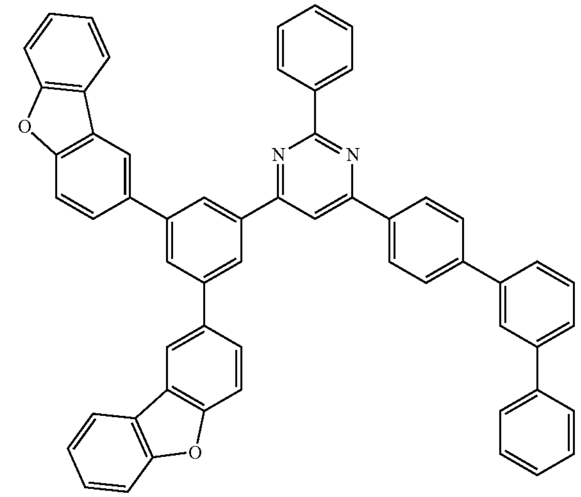
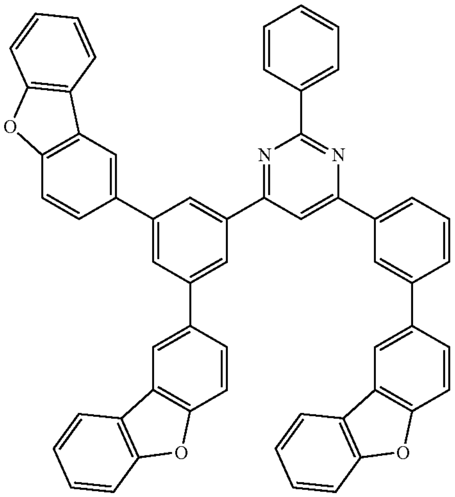
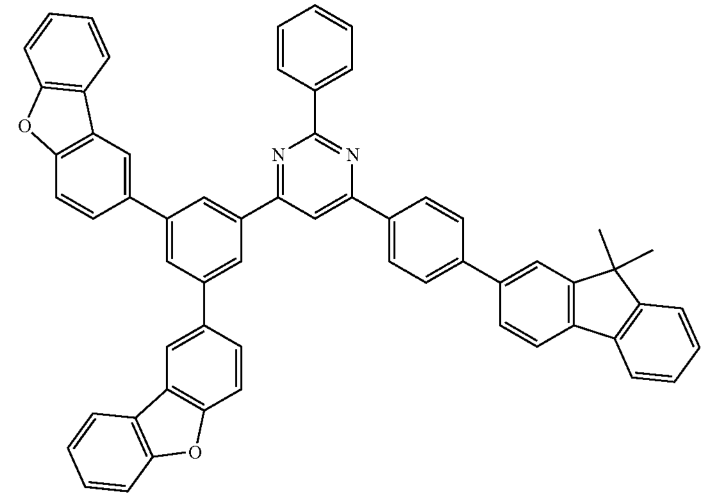

-continued
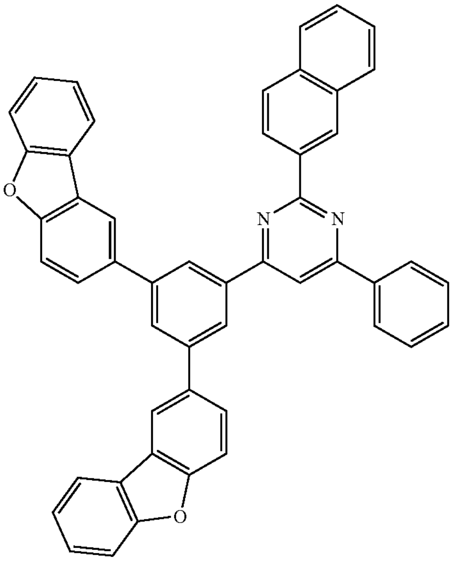
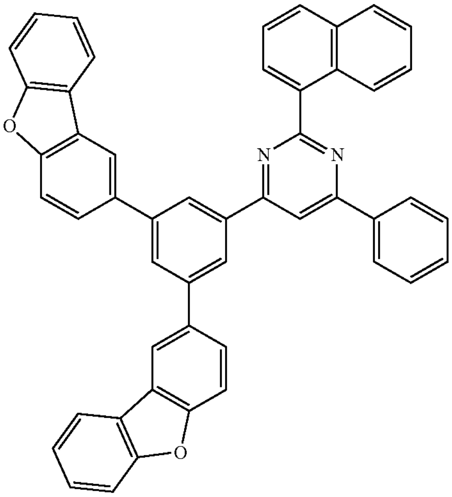
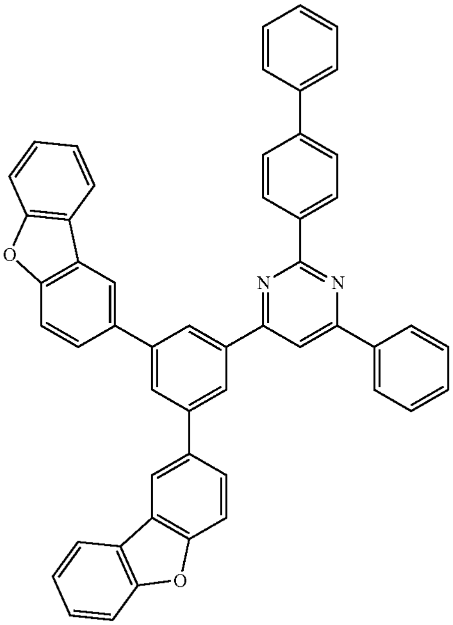
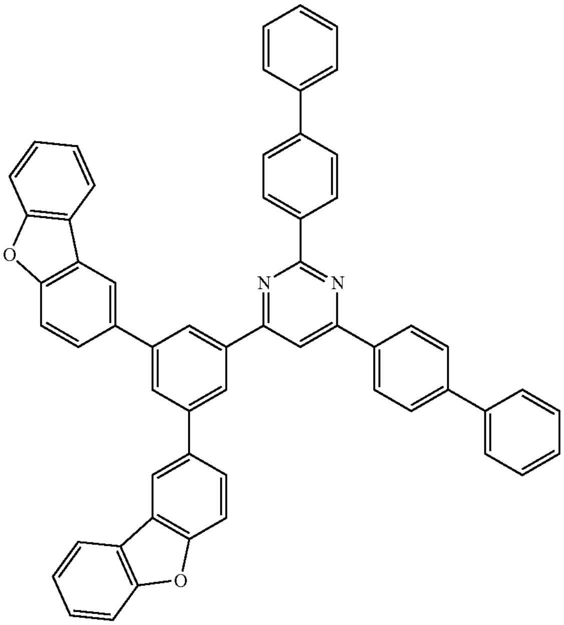
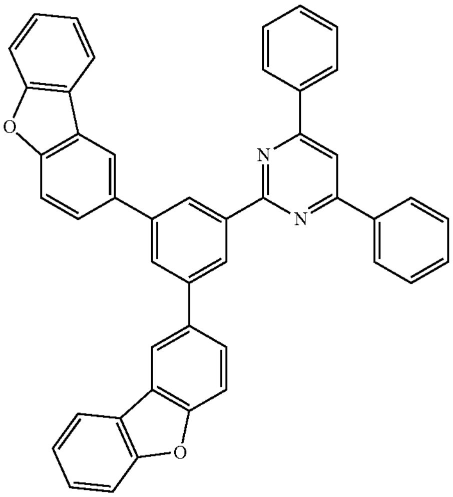
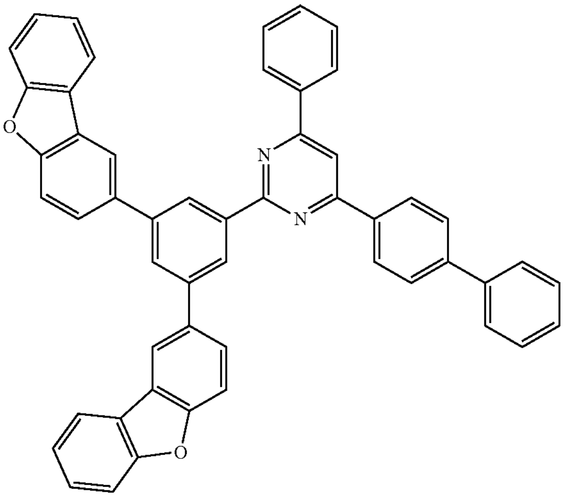

-continued
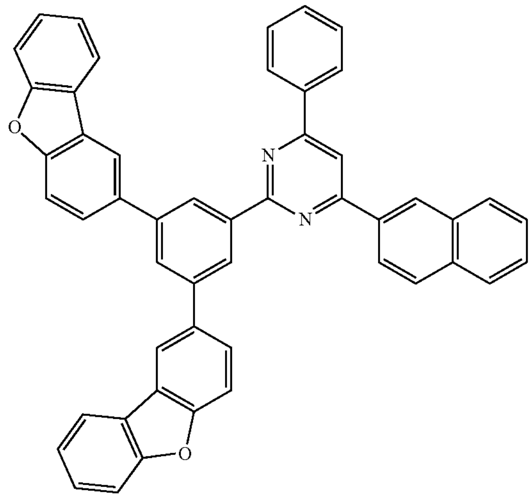
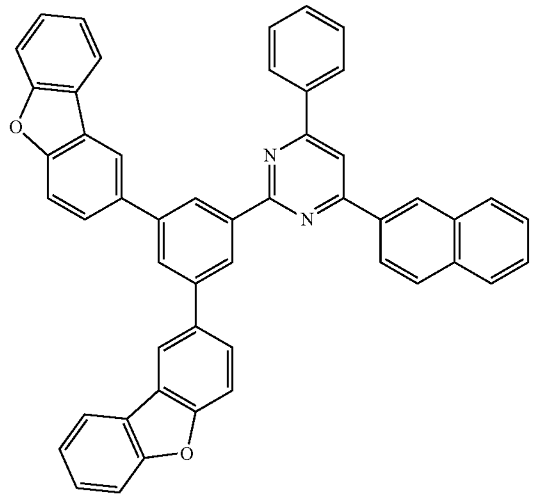
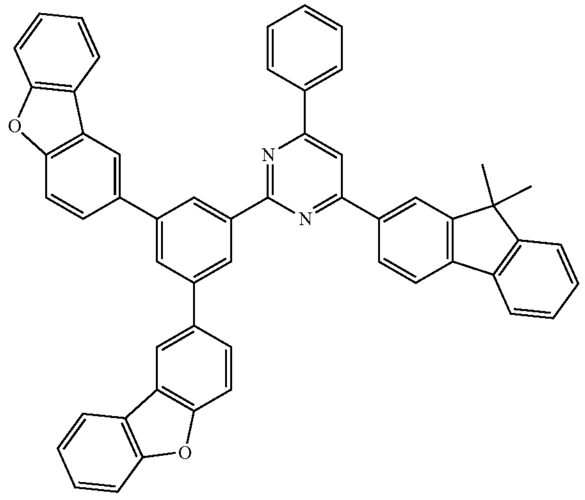
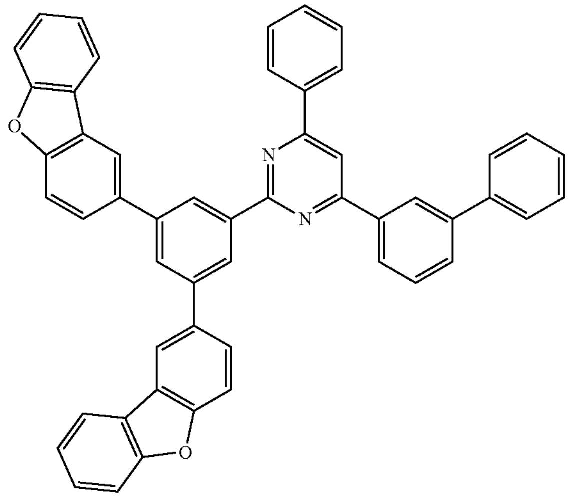
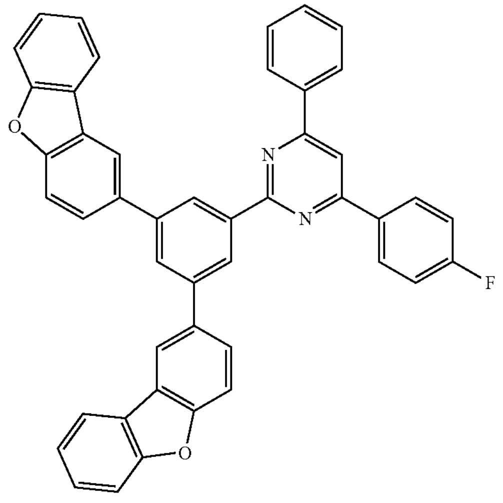
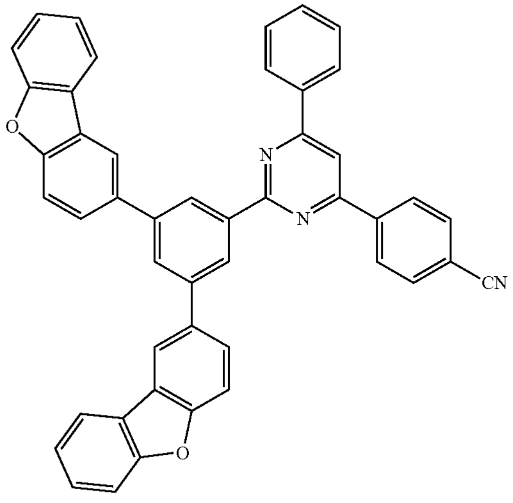

-continued
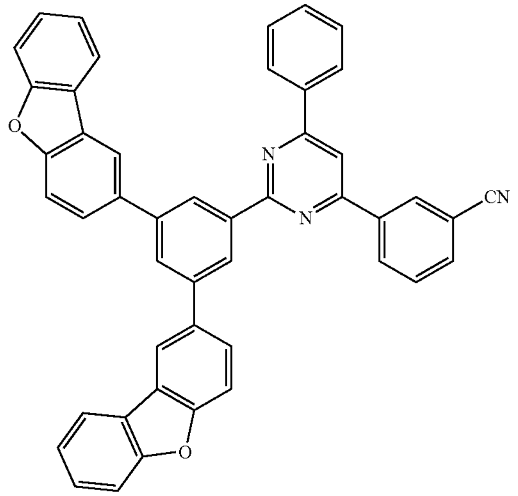
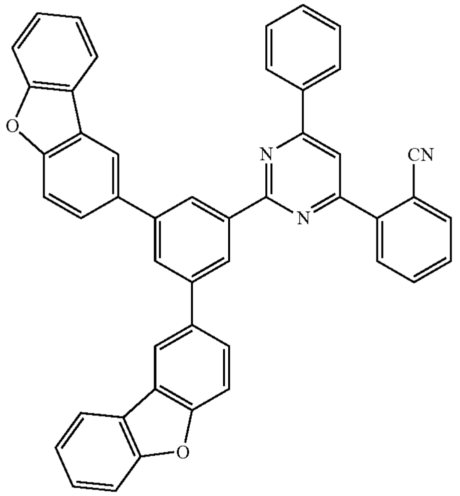
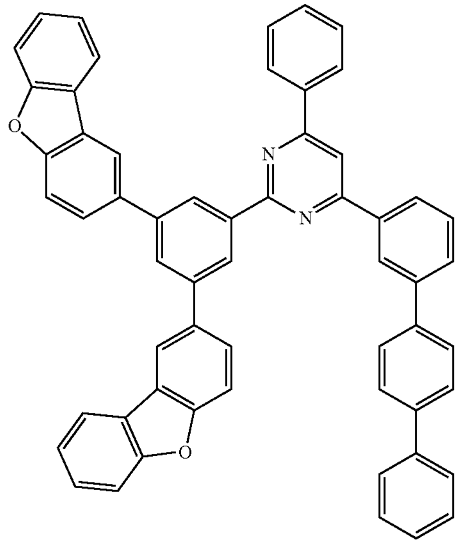
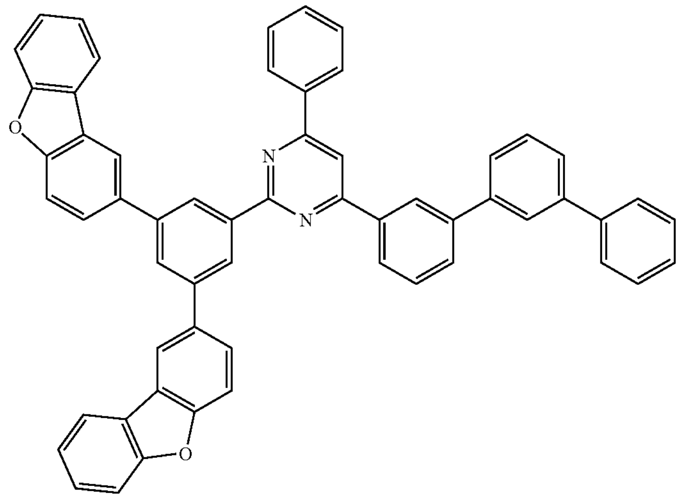
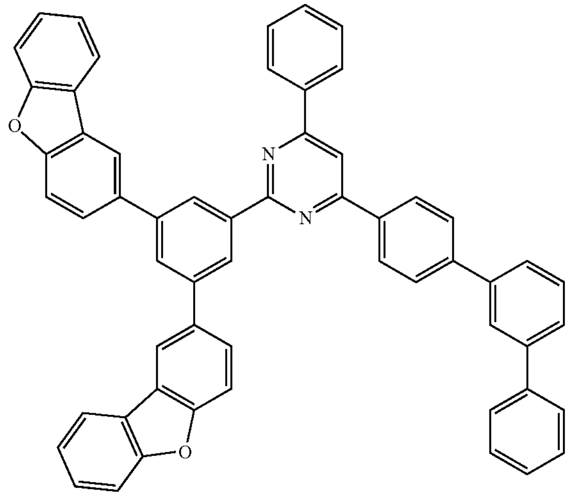

-continued
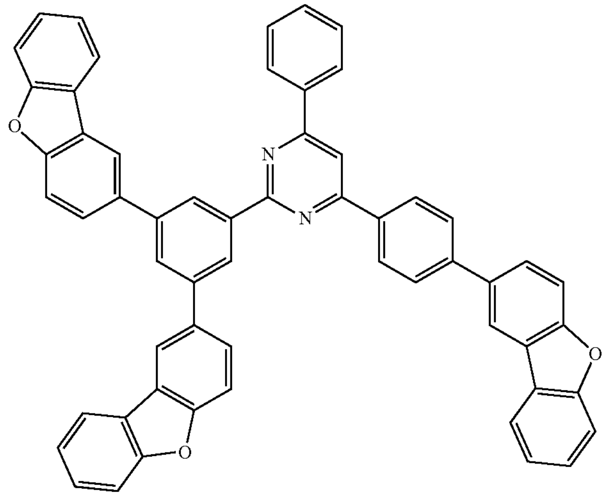
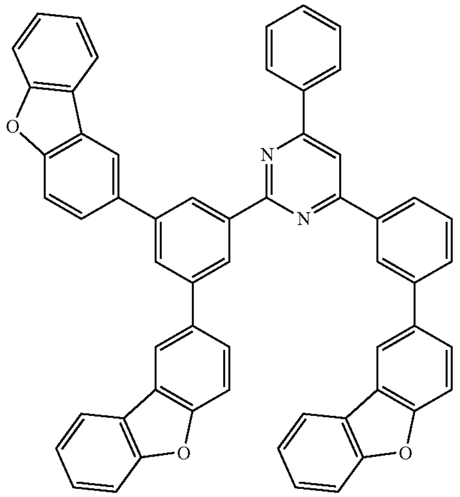
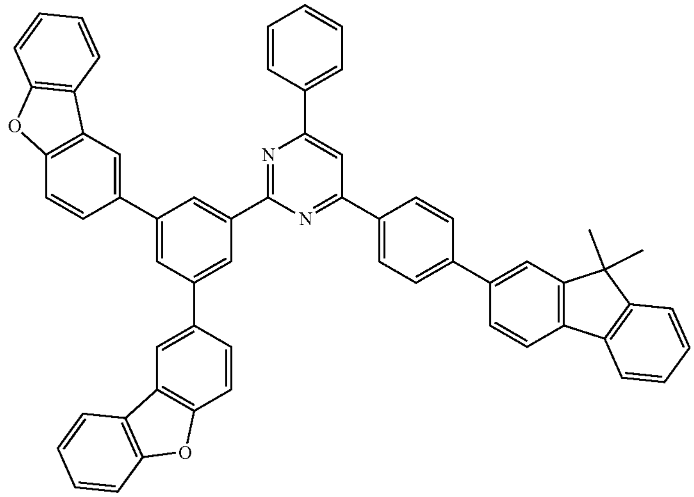
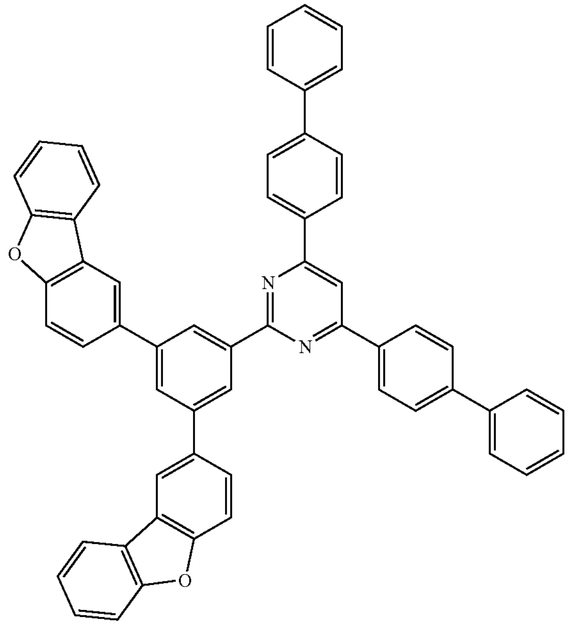
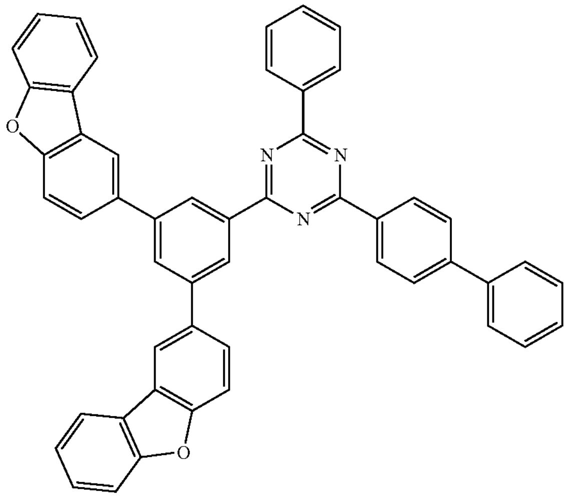

-continued
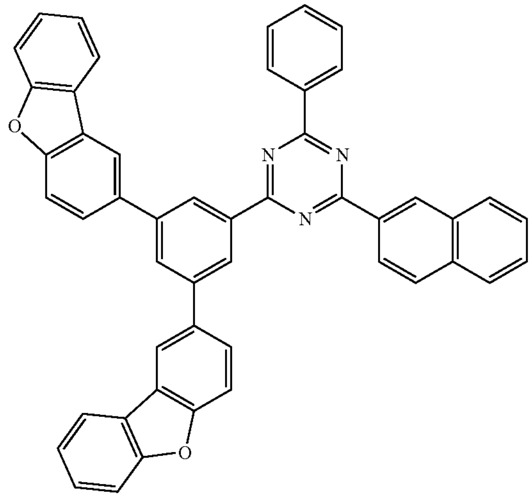
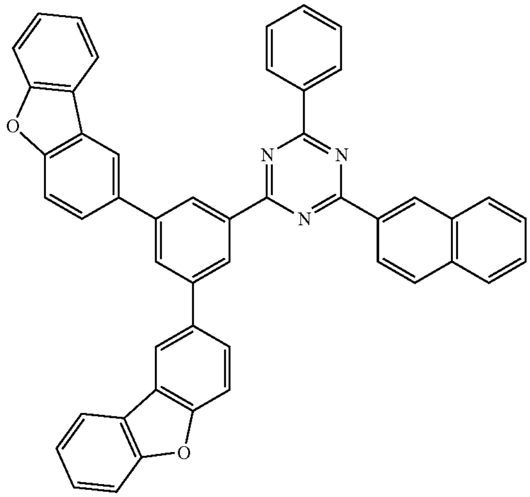
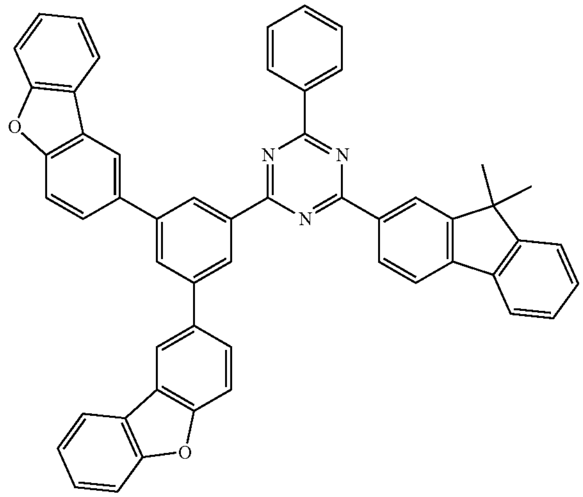
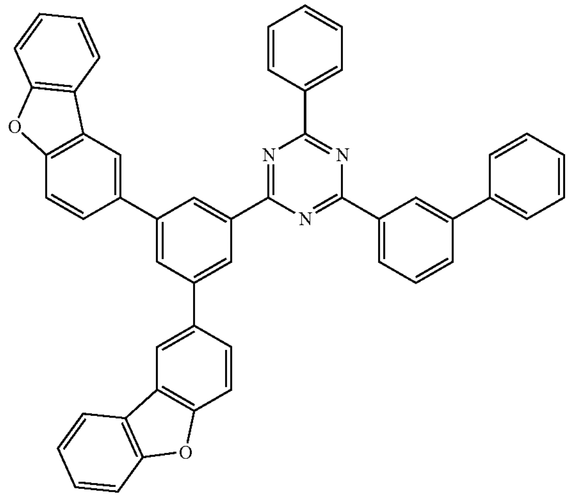
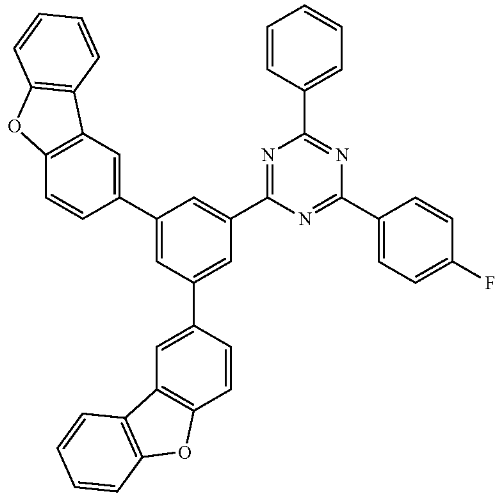
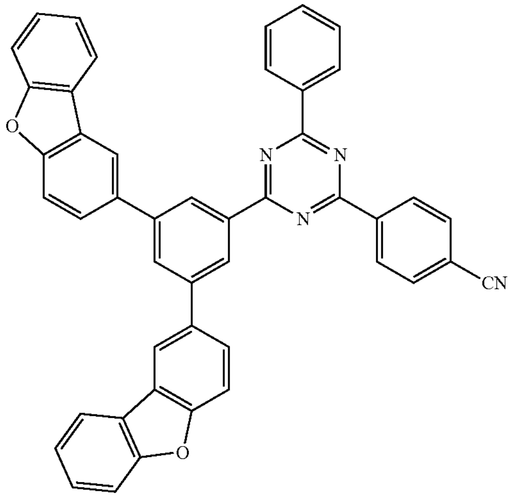

-continued
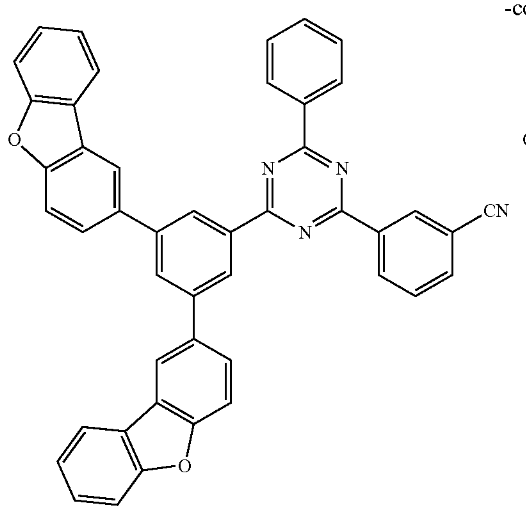
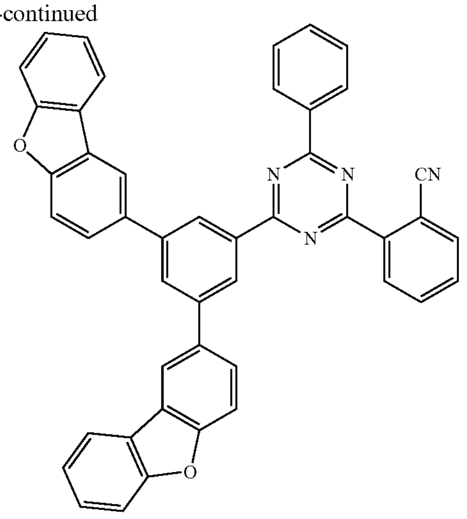
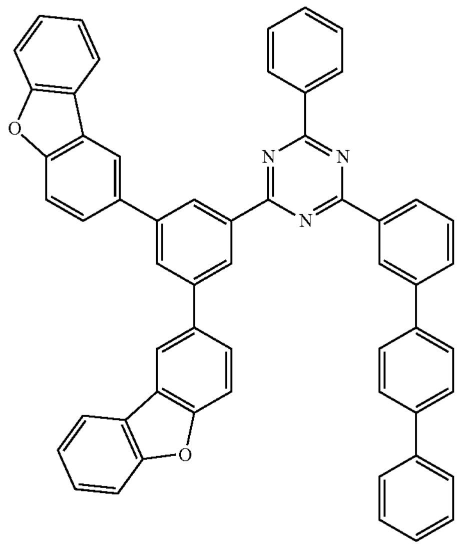
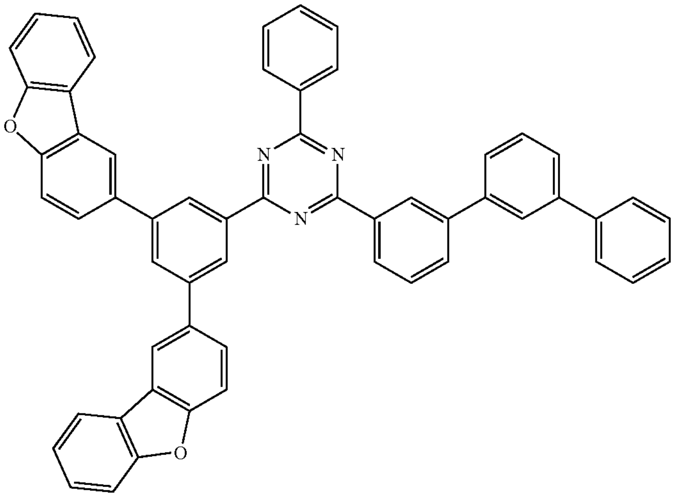
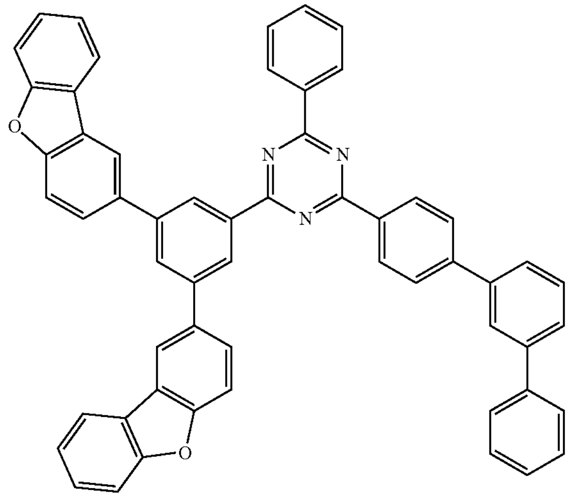
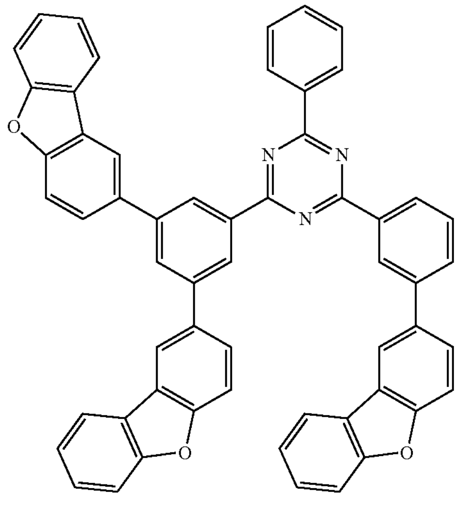

-continued
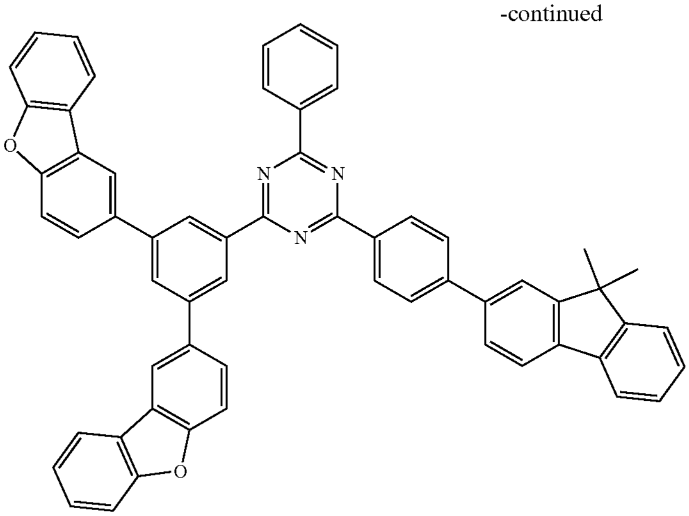
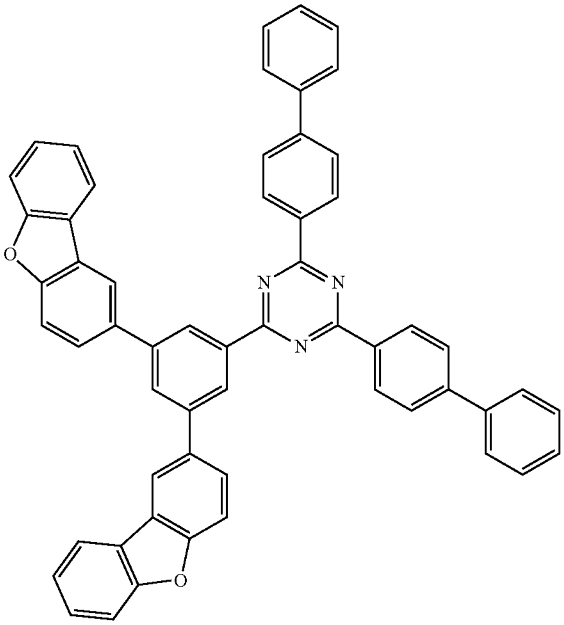
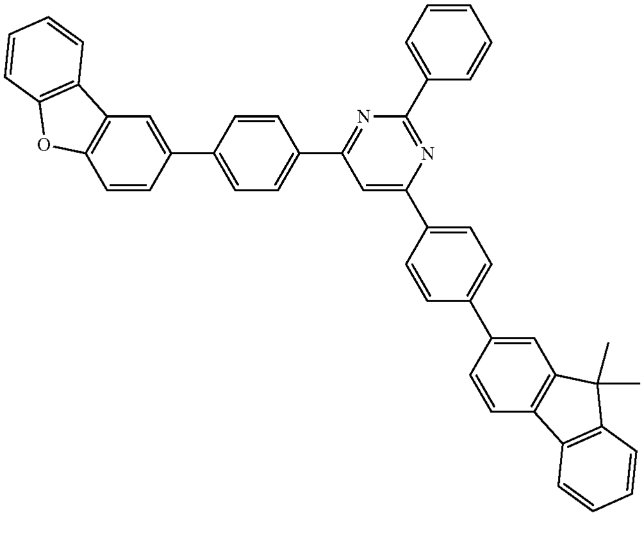

-continued
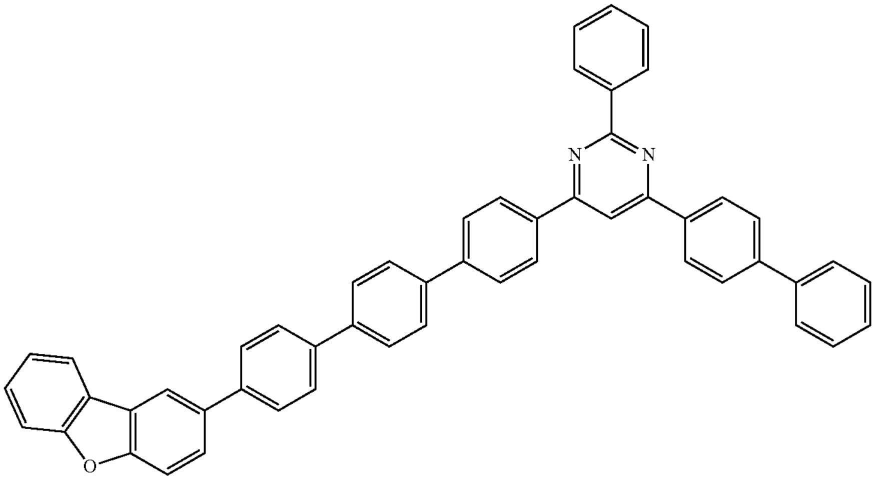
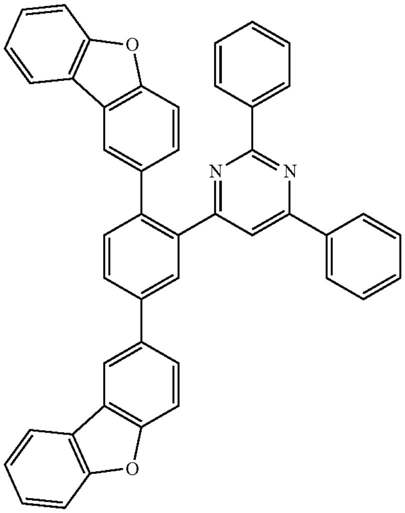
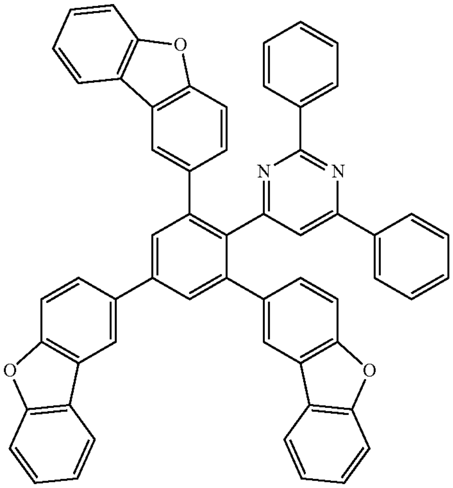
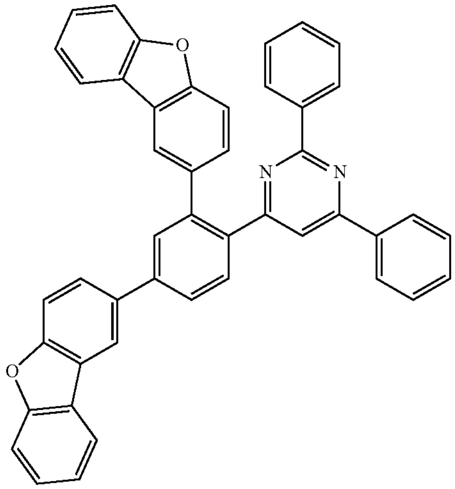
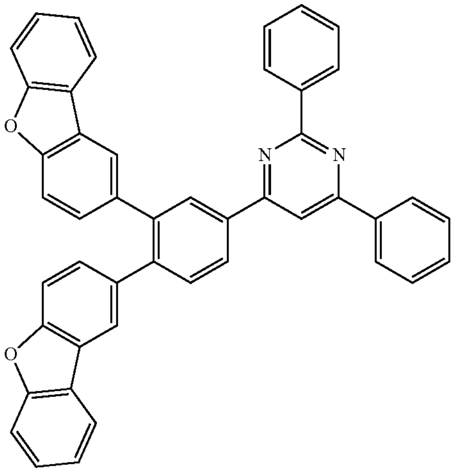

-continued
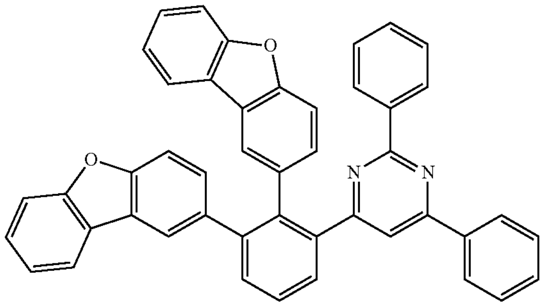
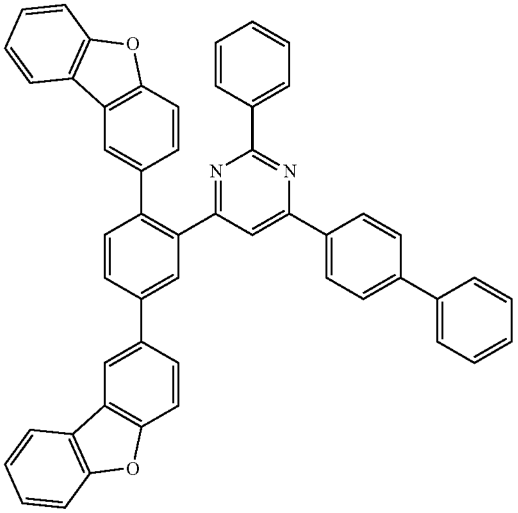
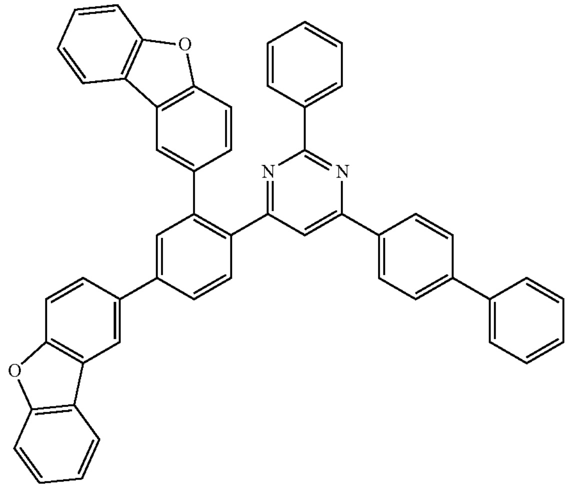
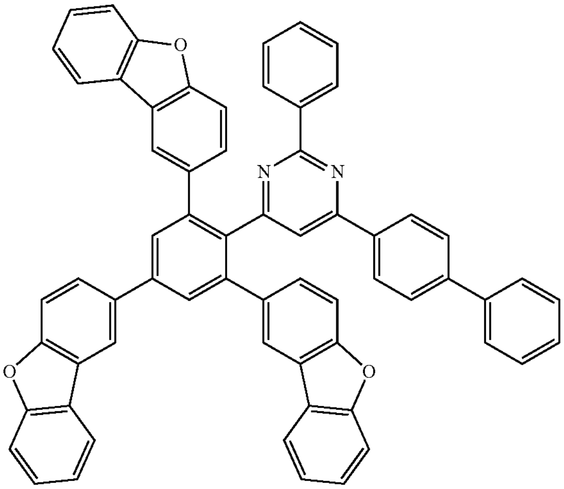
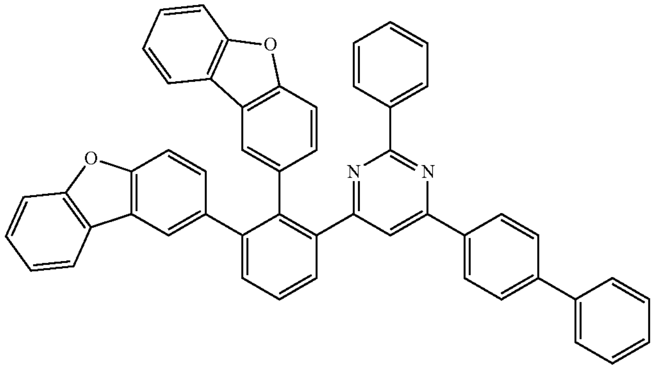

-continued
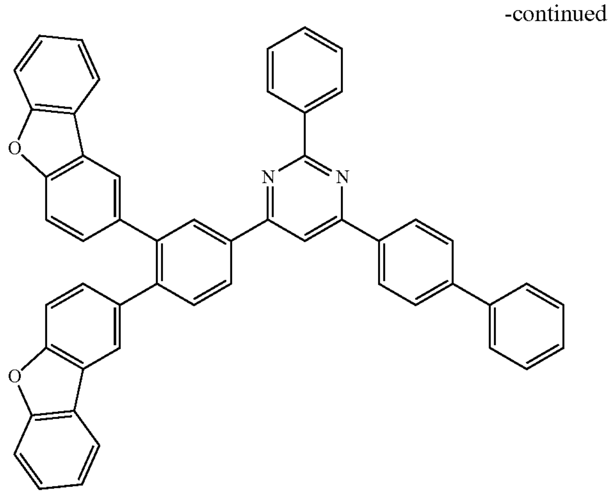
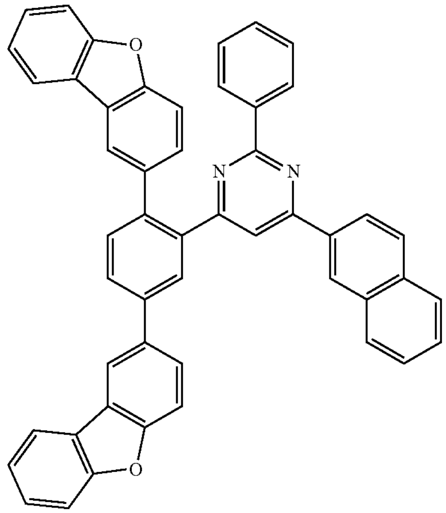
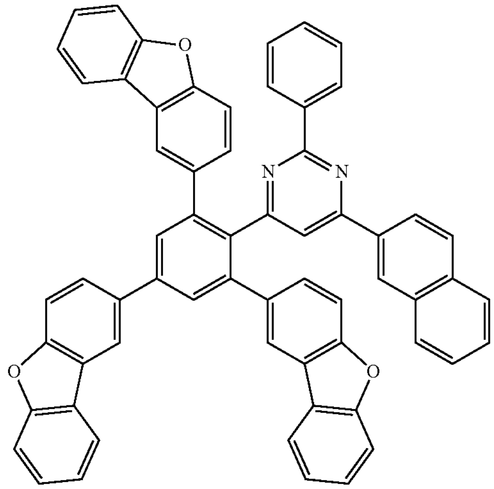
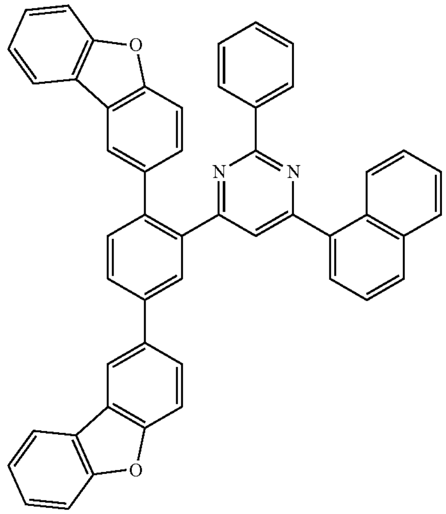
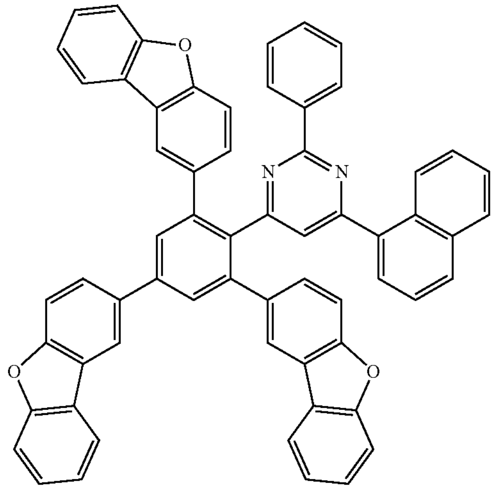

-continued
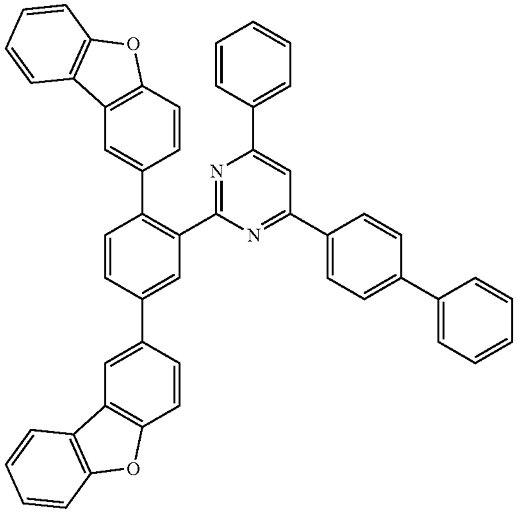
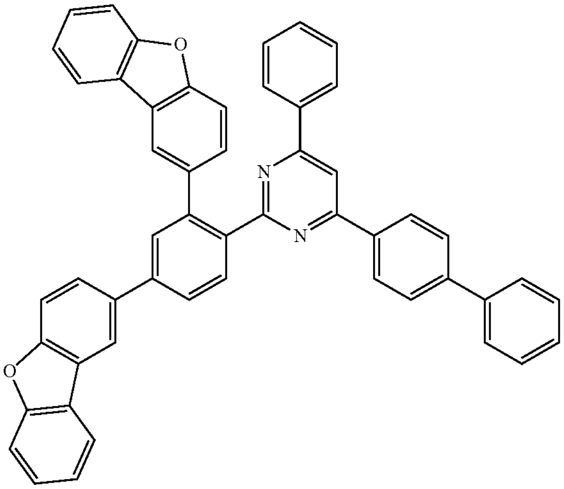
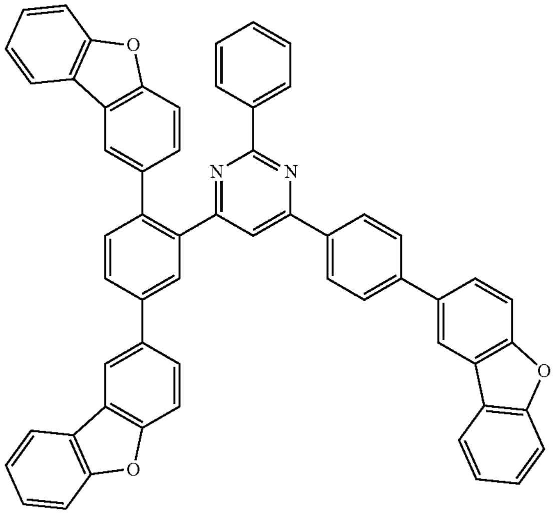
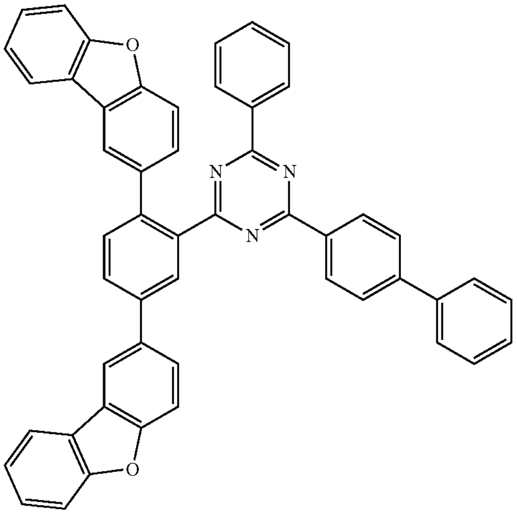
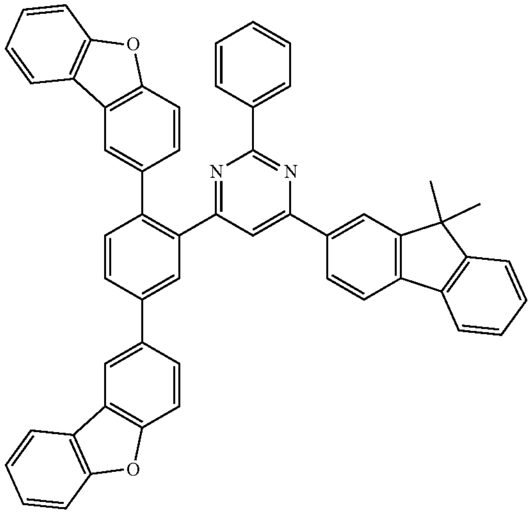
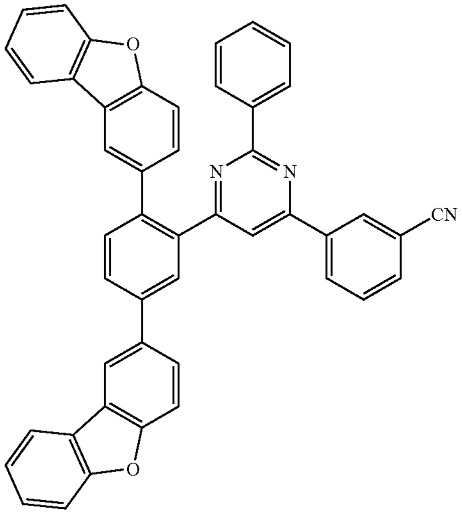

-continued
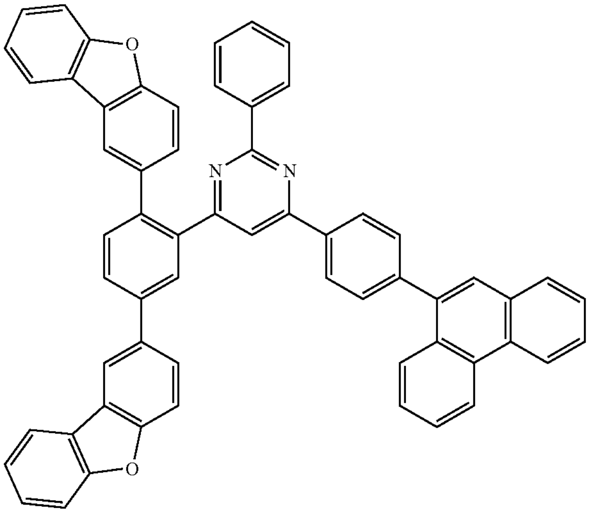
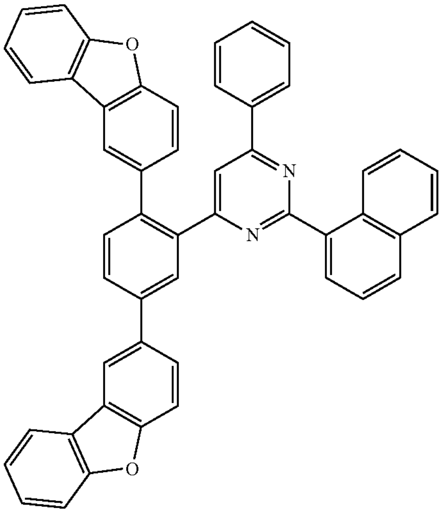
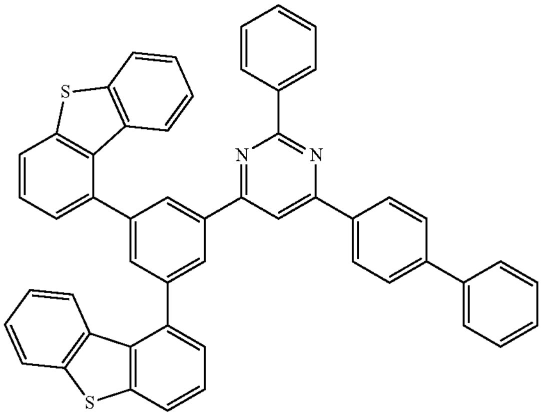
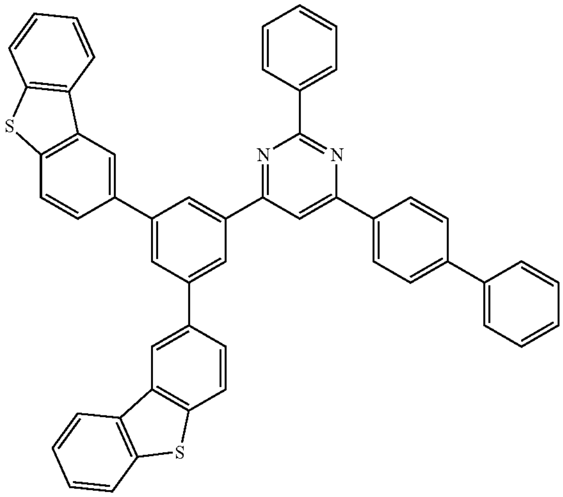
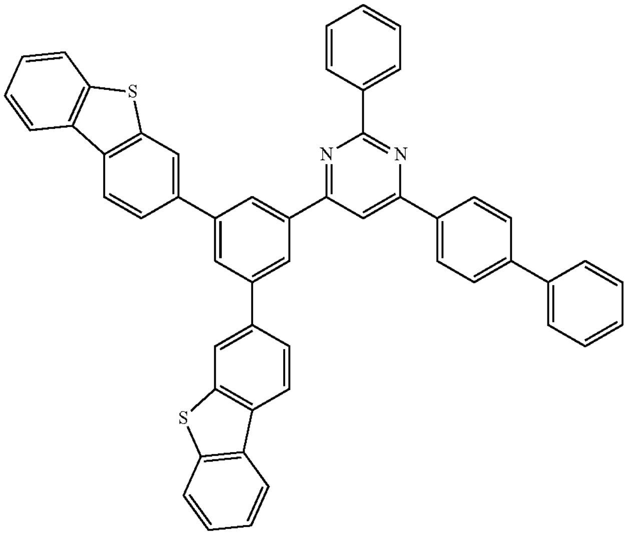
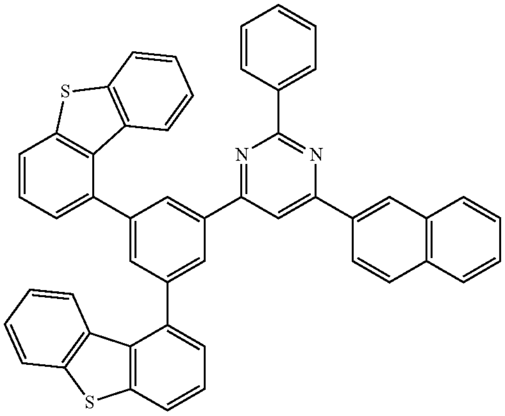

-continued
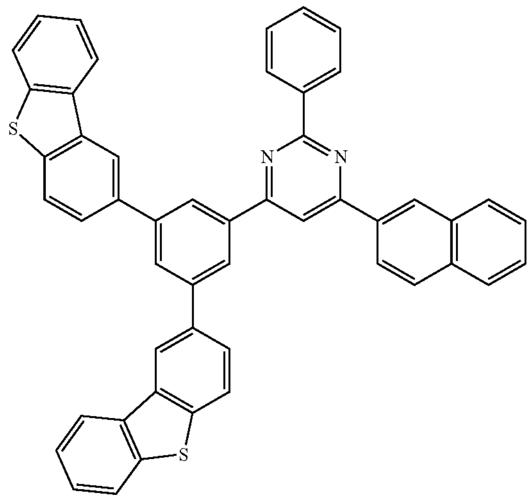
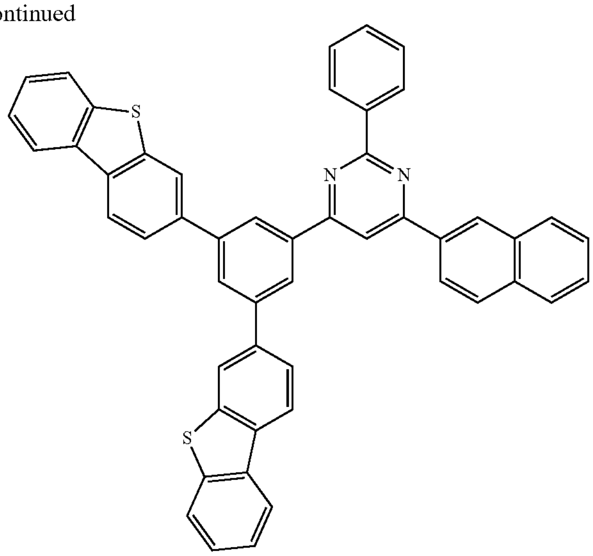
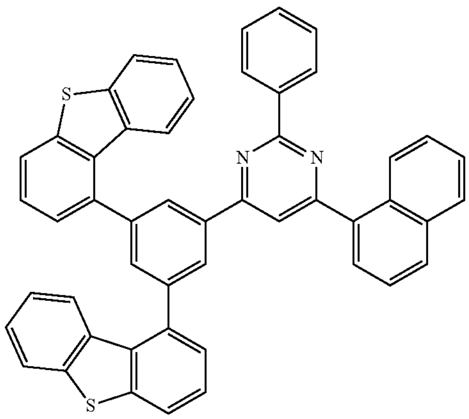
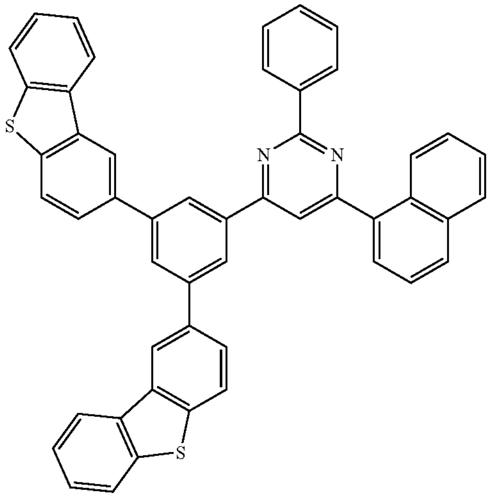
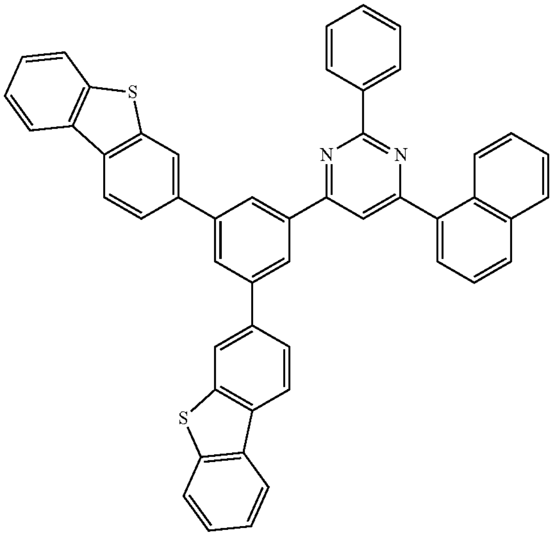
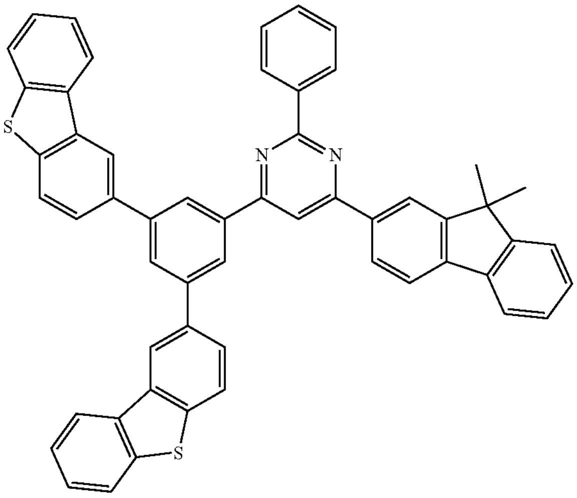

-continued
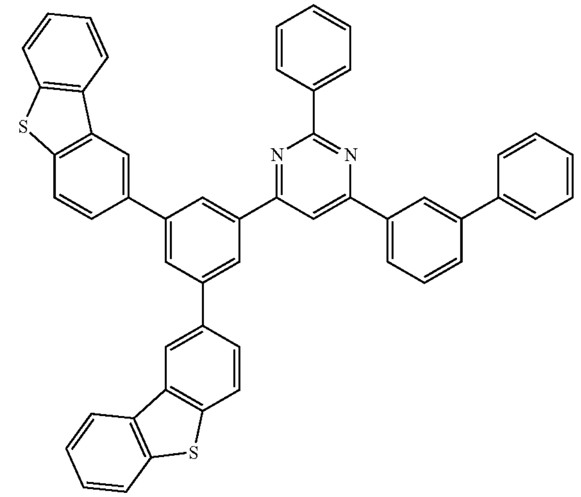
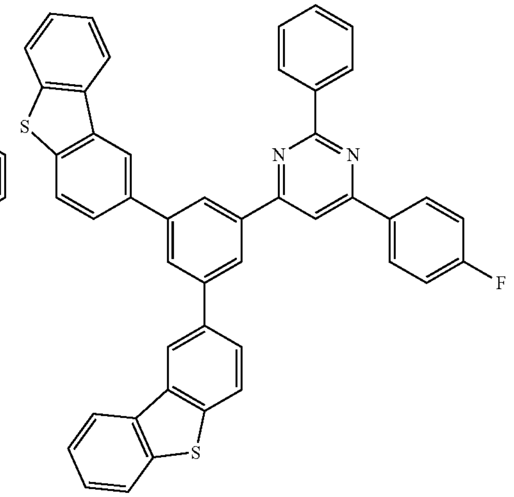
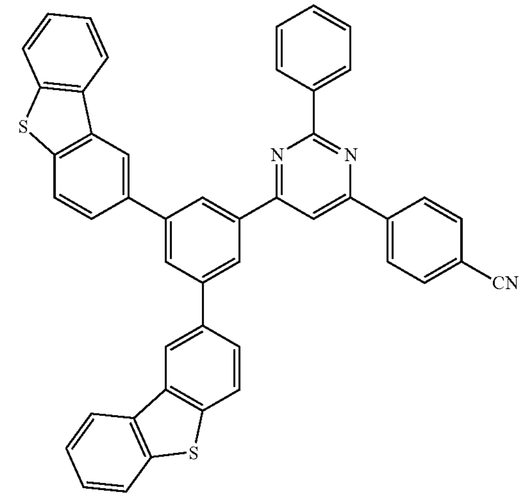
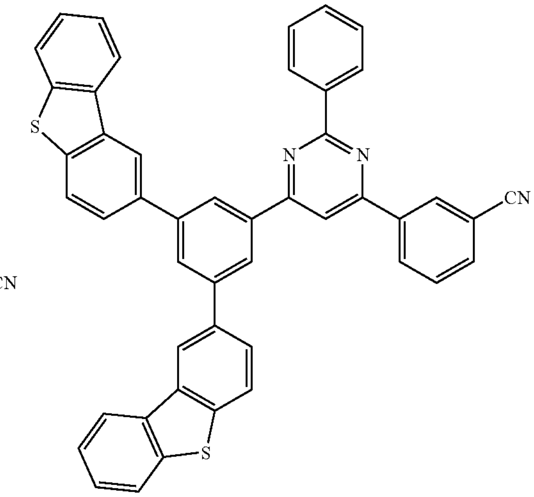
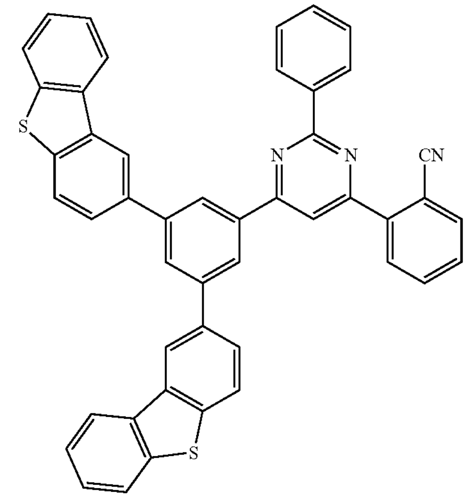
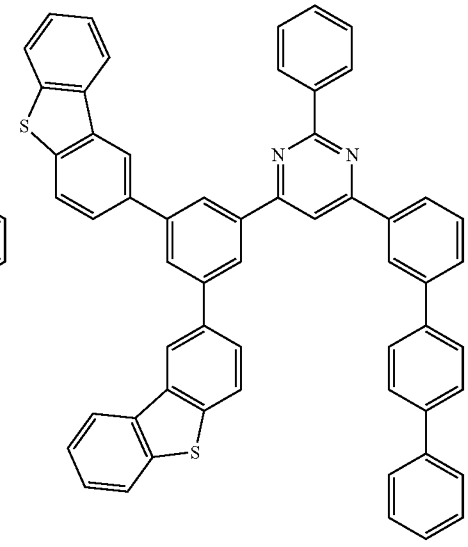

-continued
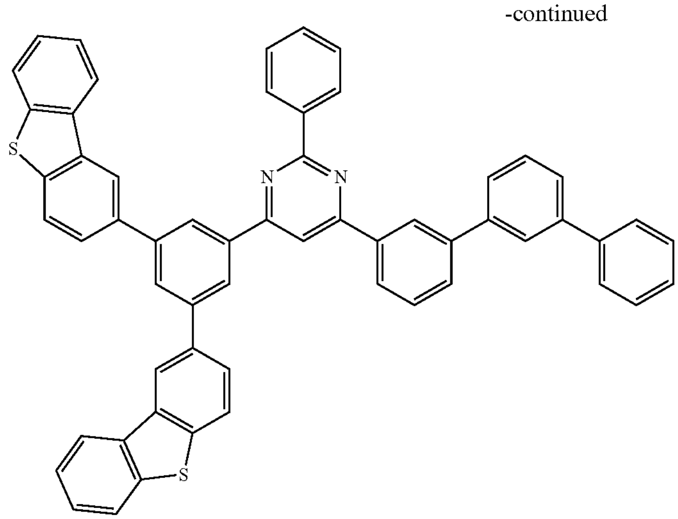
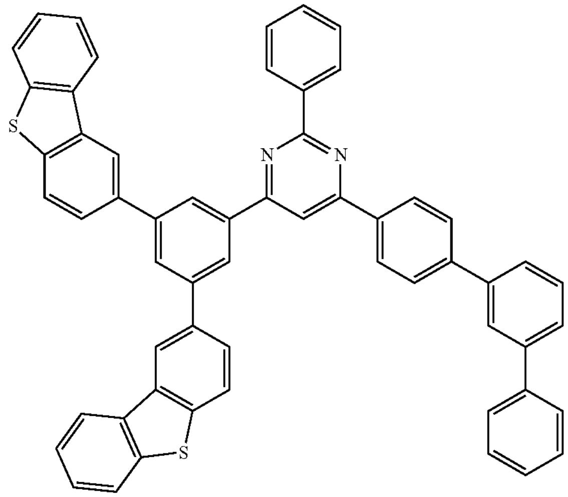
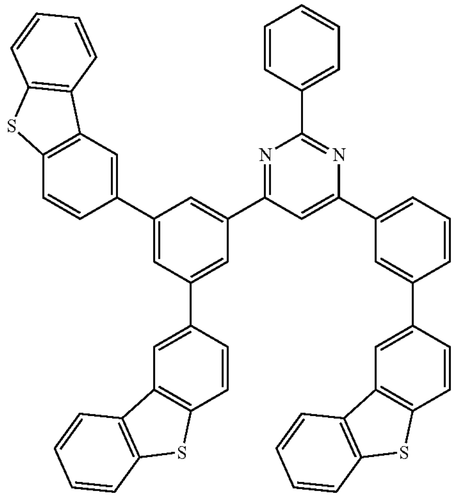
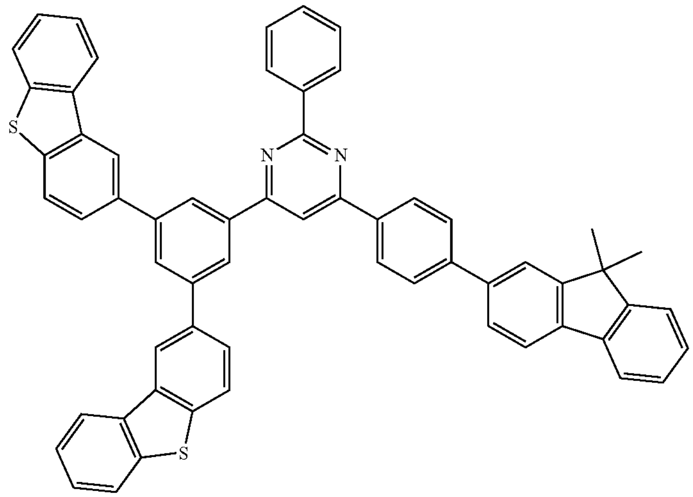
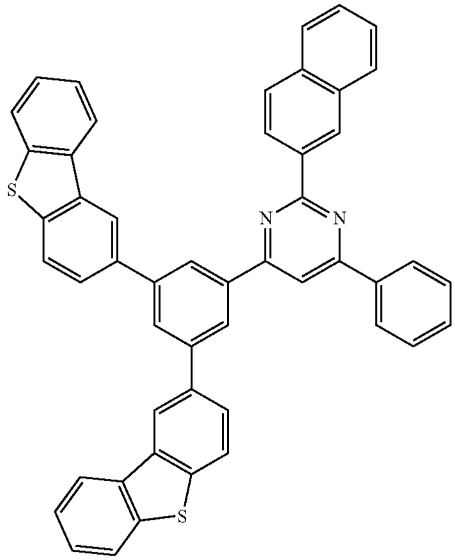

-continued
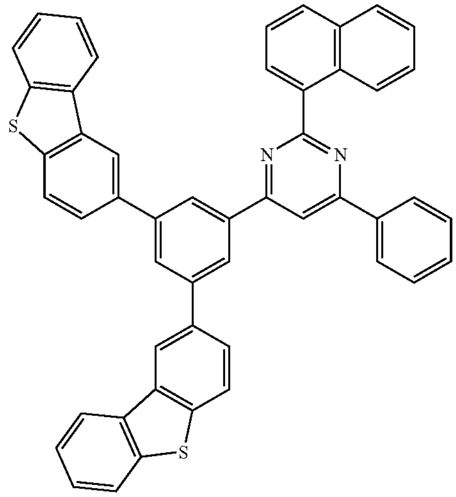
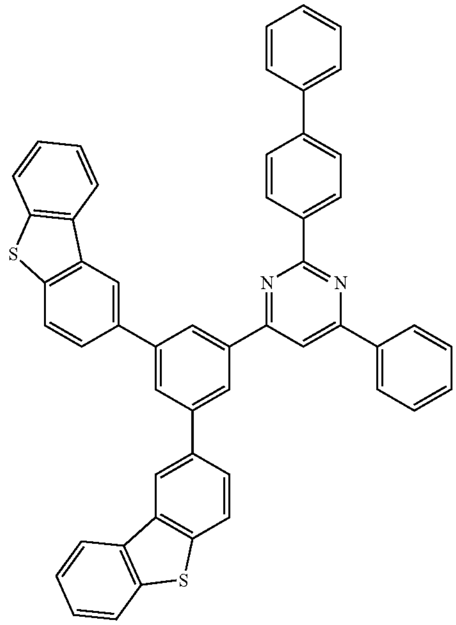
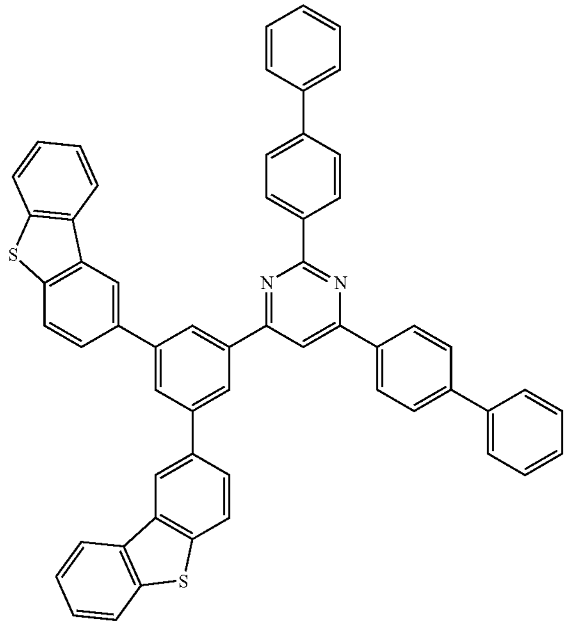
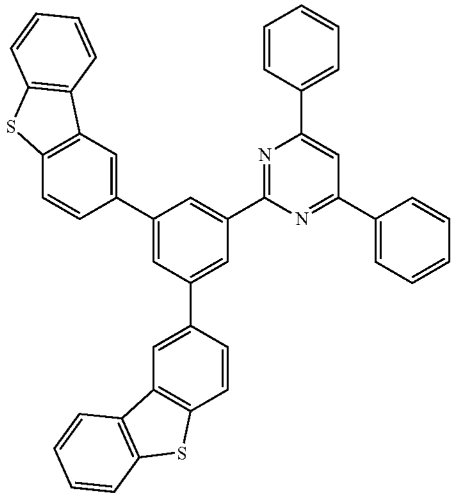

-continued
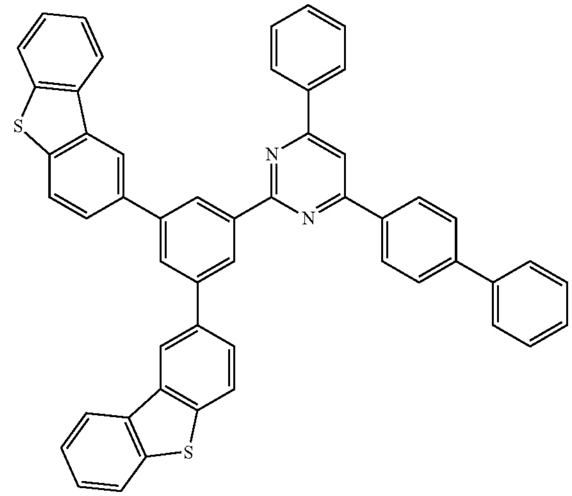
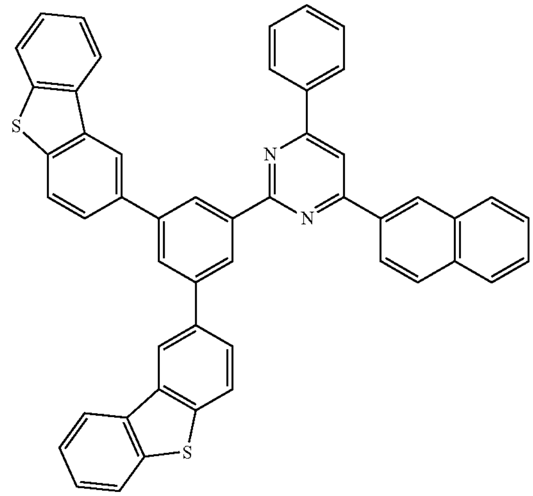
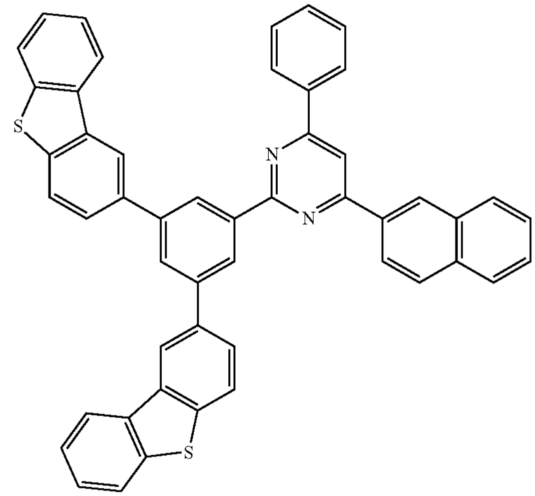
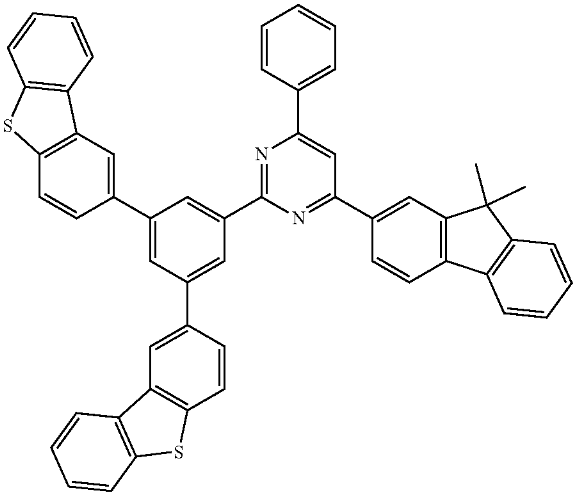
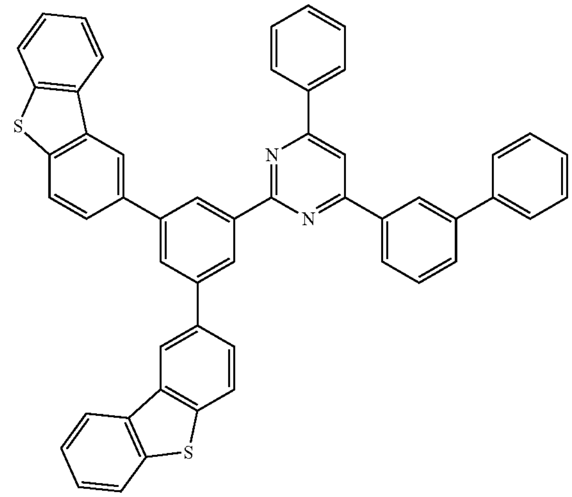
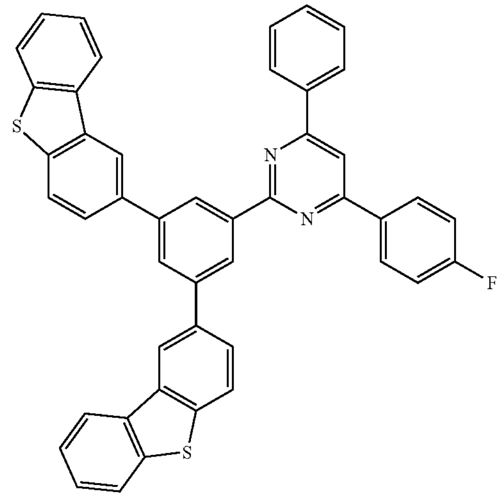

-continued
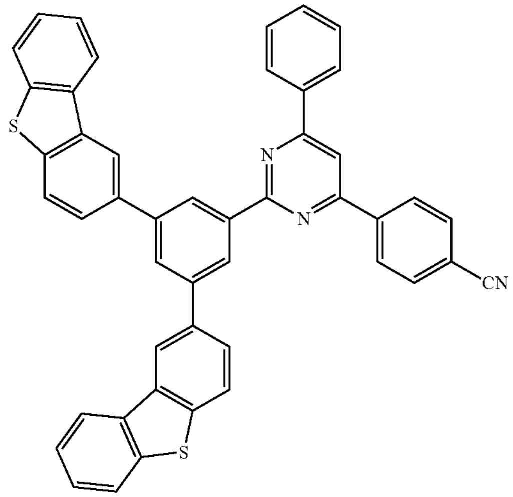
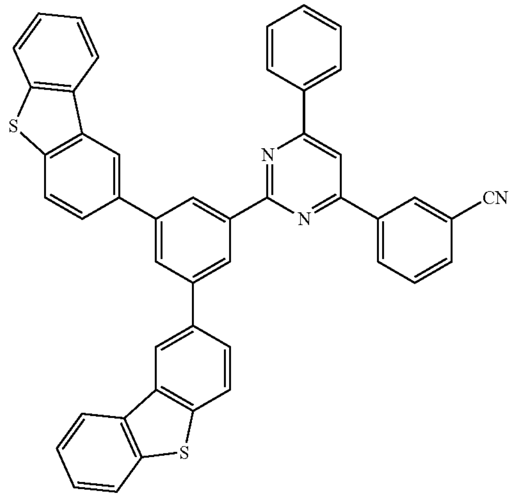
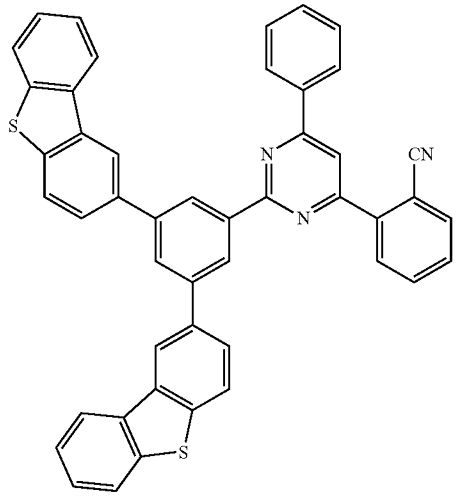
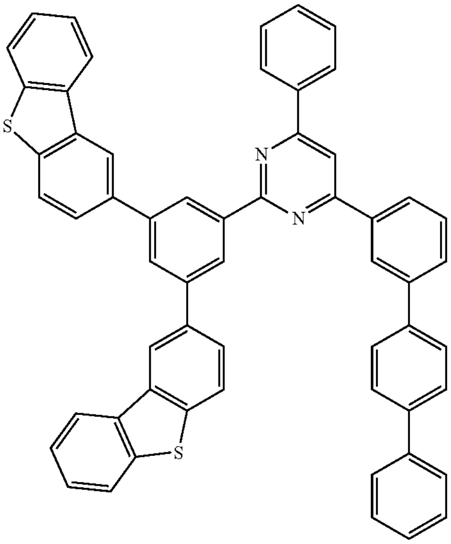
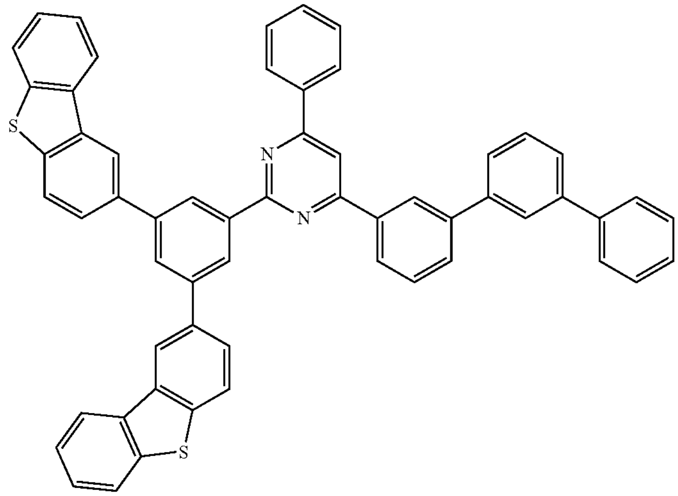

-continued
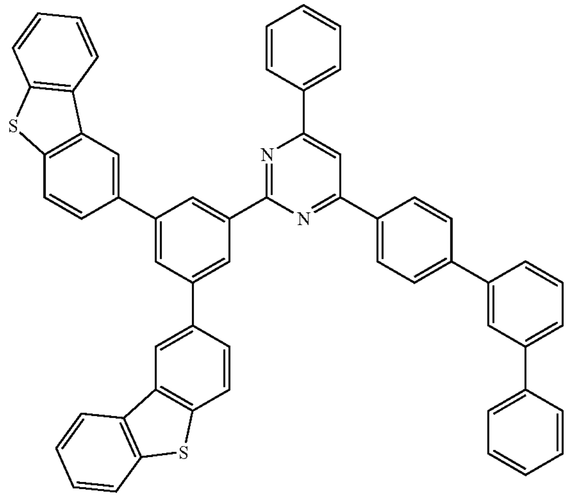
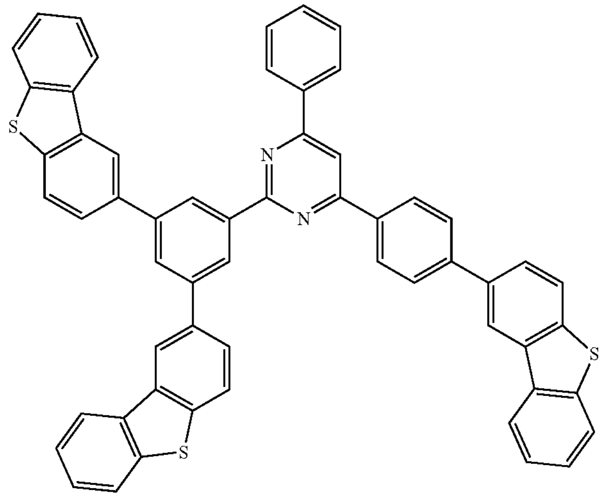
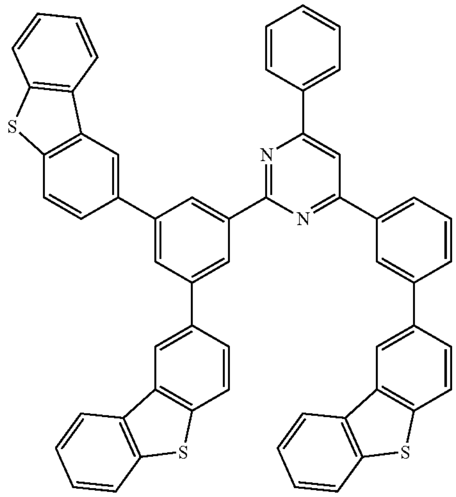
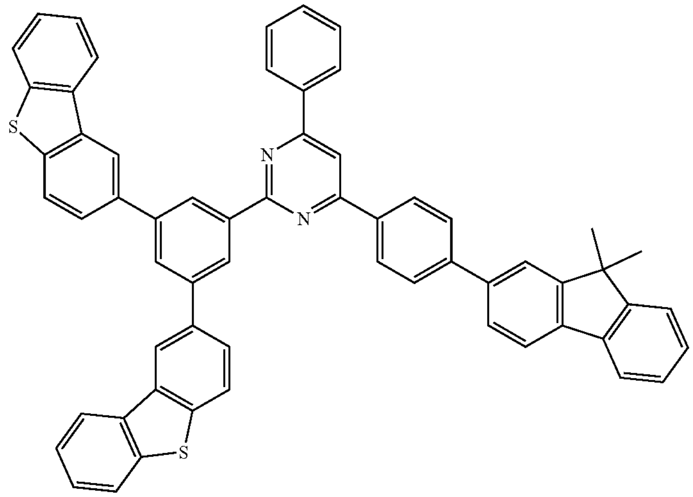

-continued
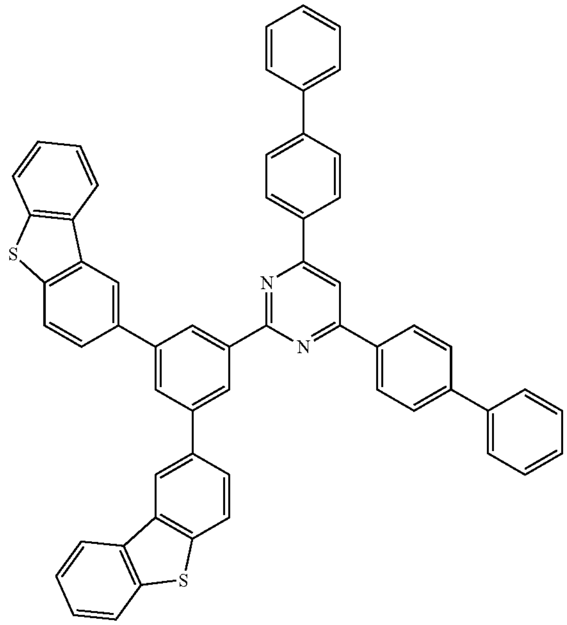
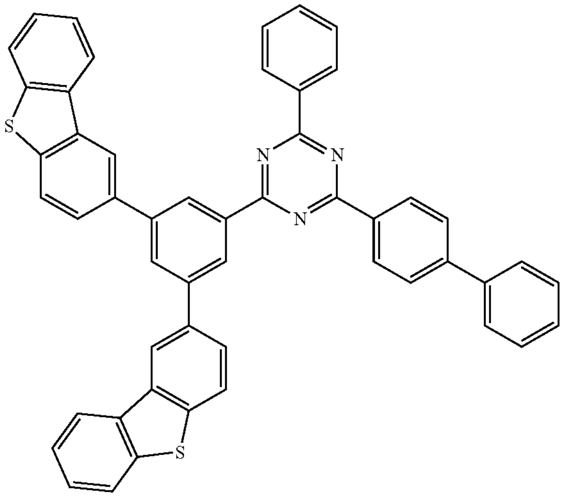
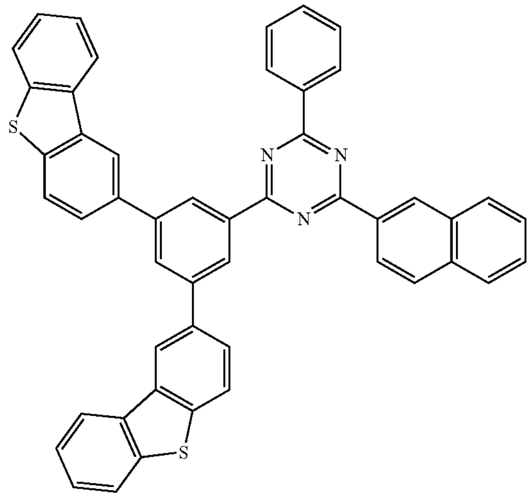
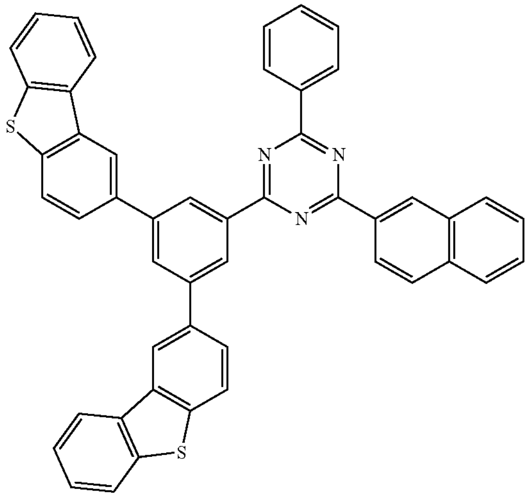
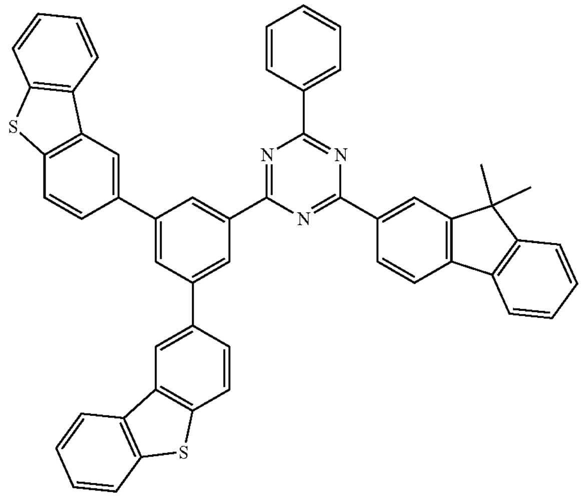
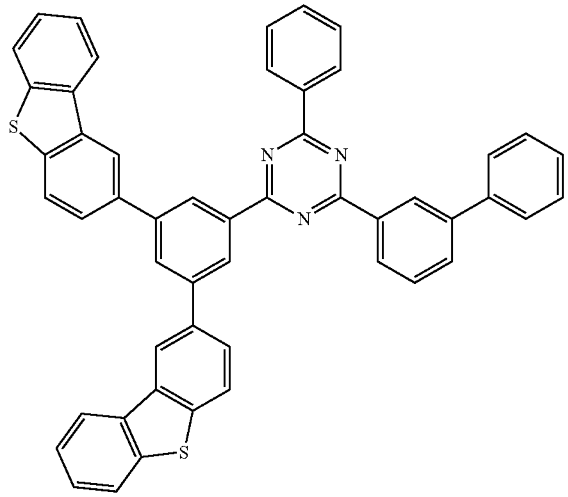

-continued
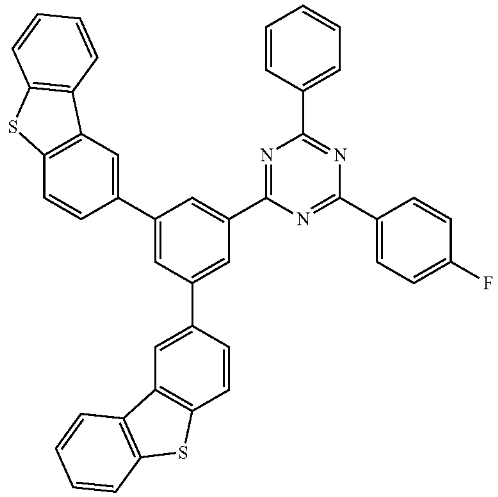
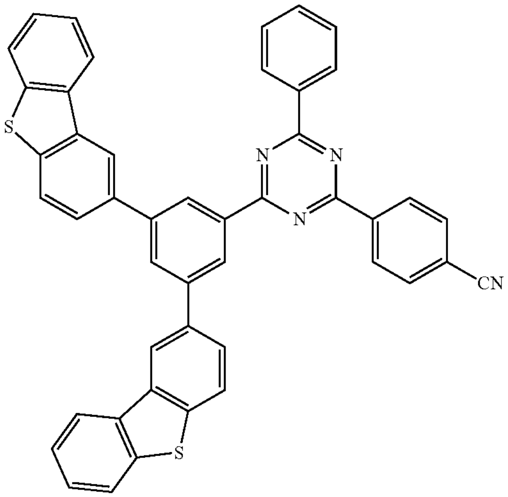
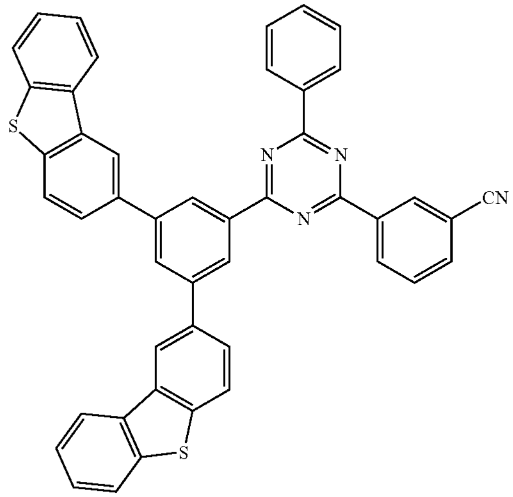
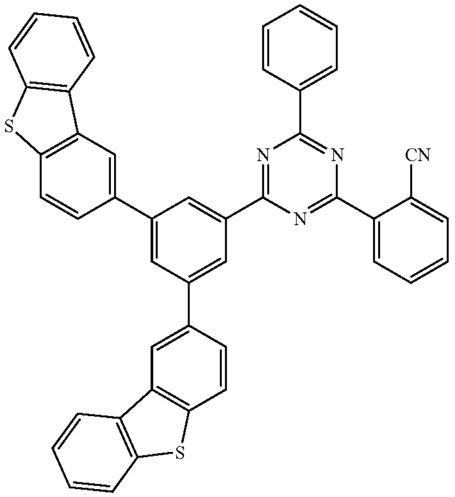
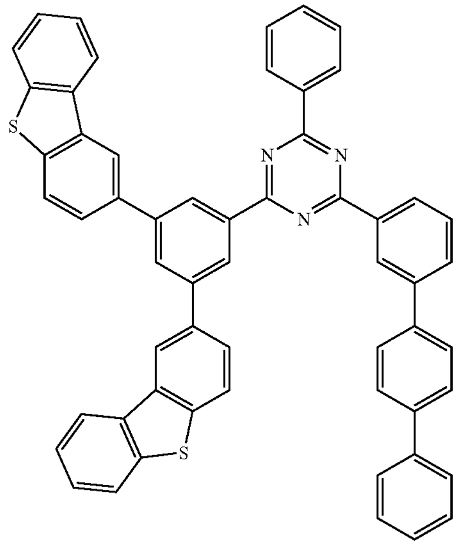
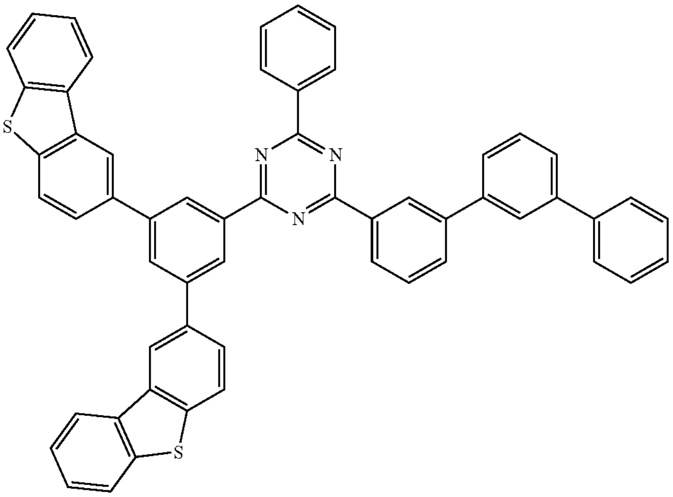

-continued
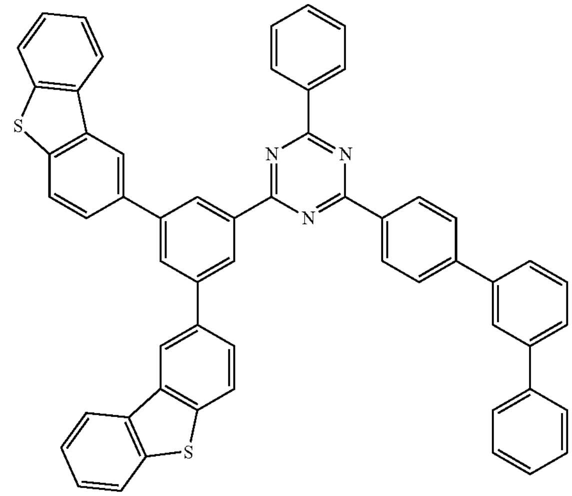
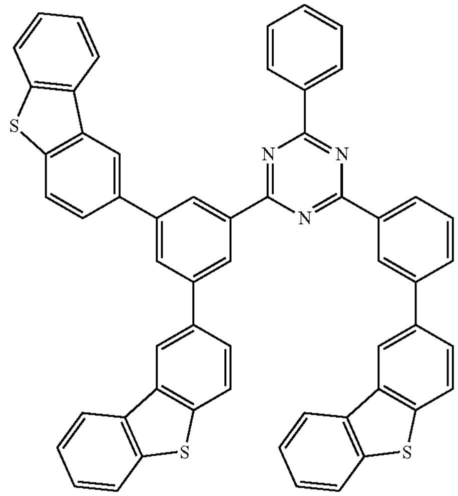
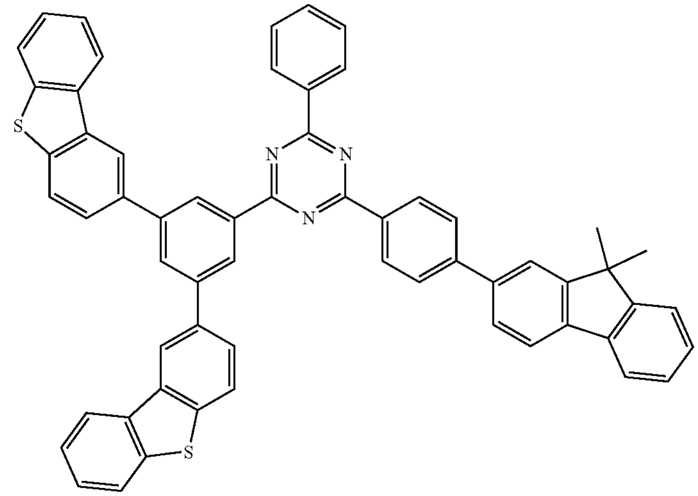
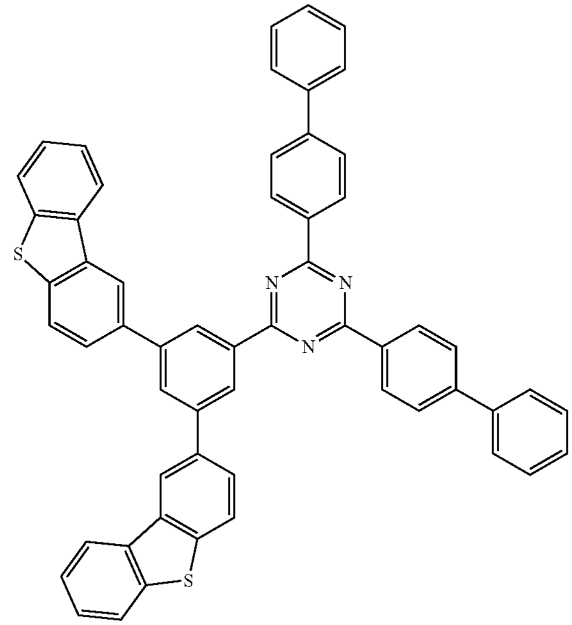

-continued
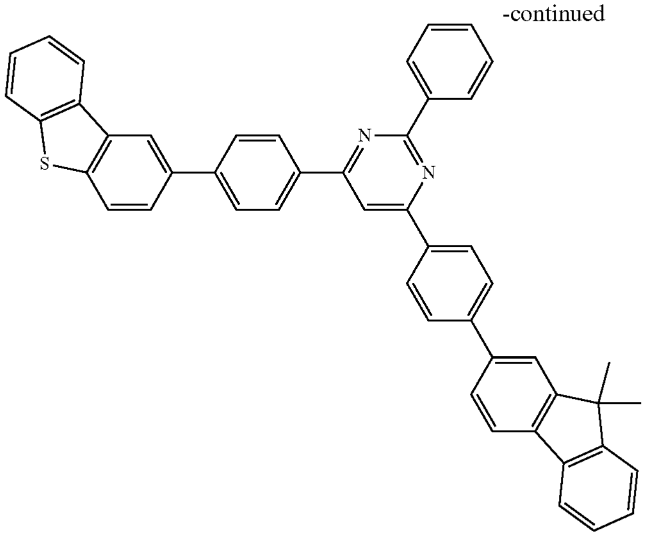
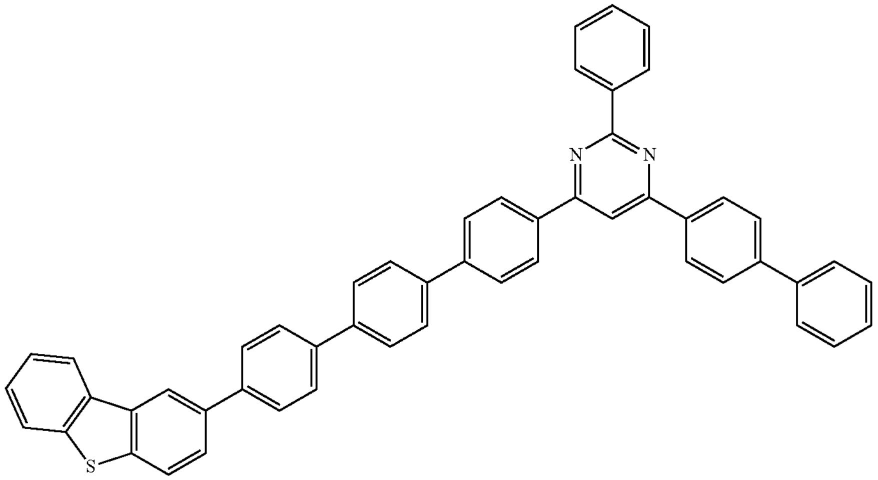
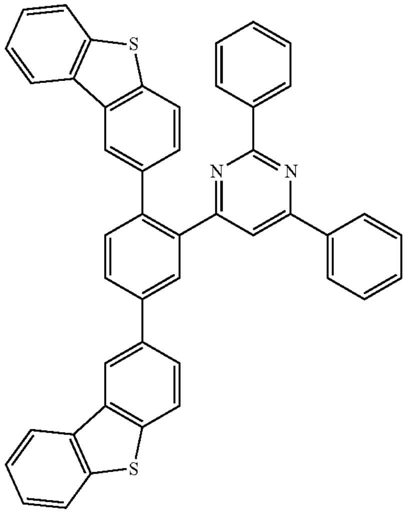
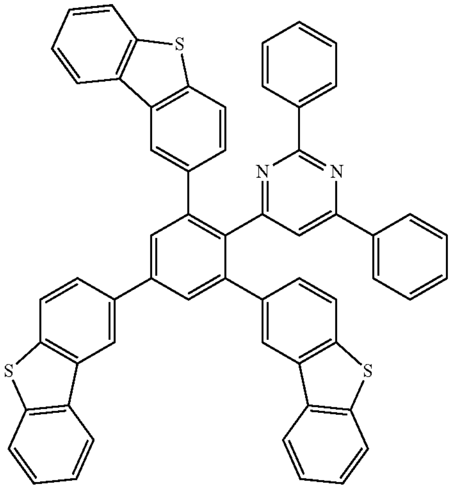

-continued
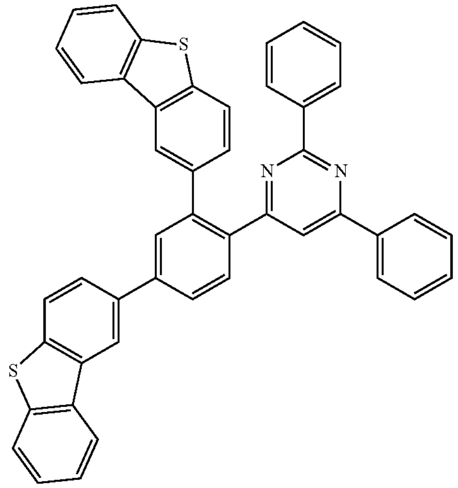
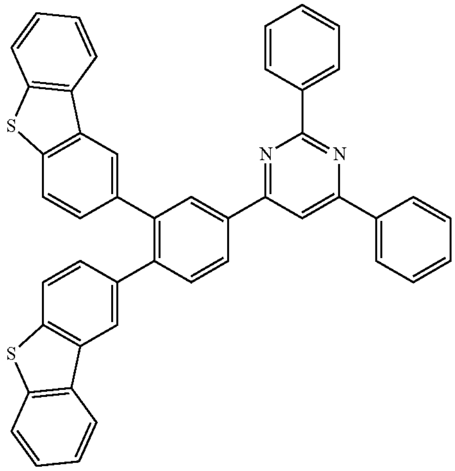
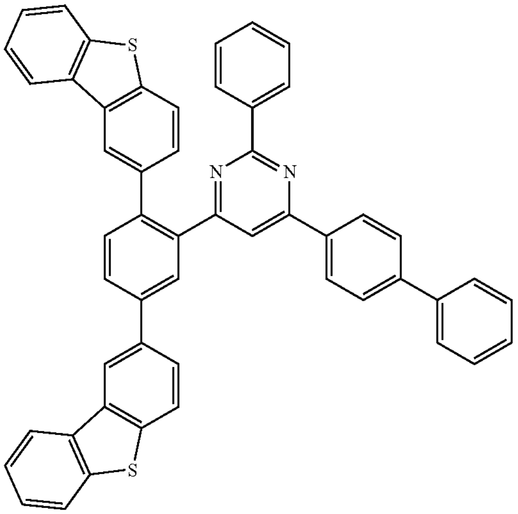
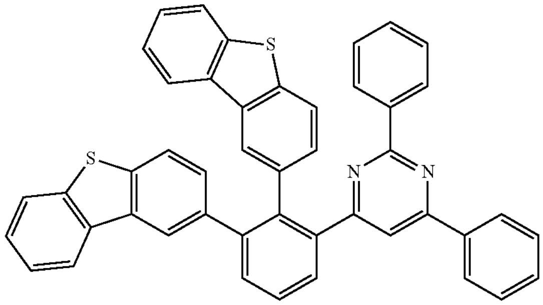
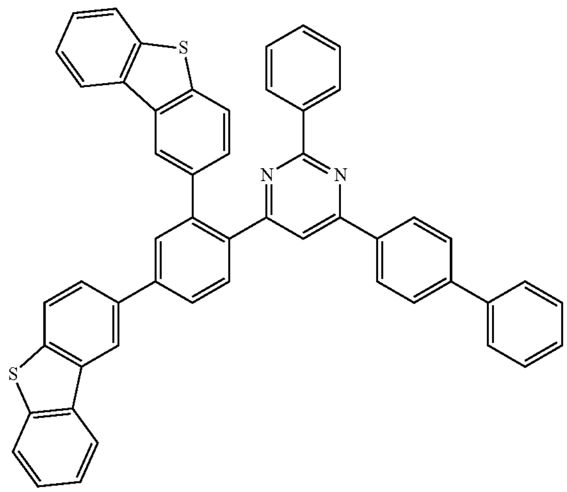
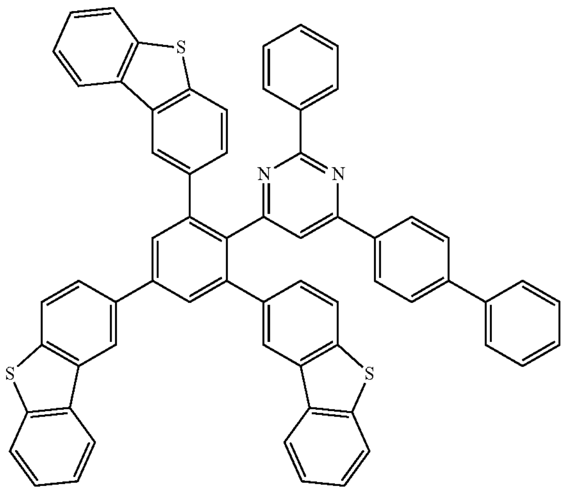

-continued
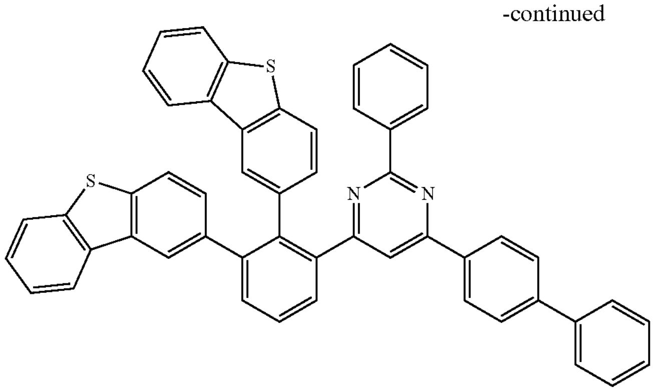
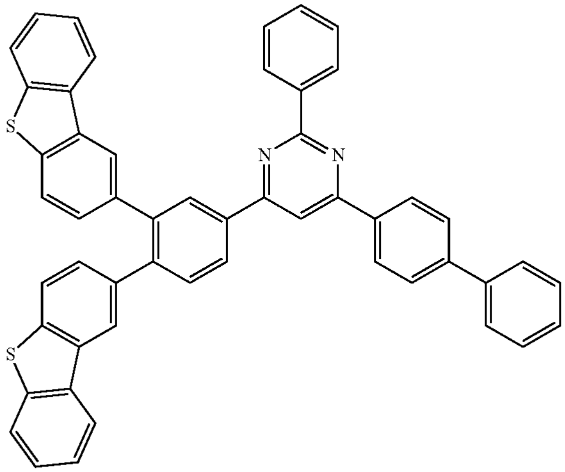
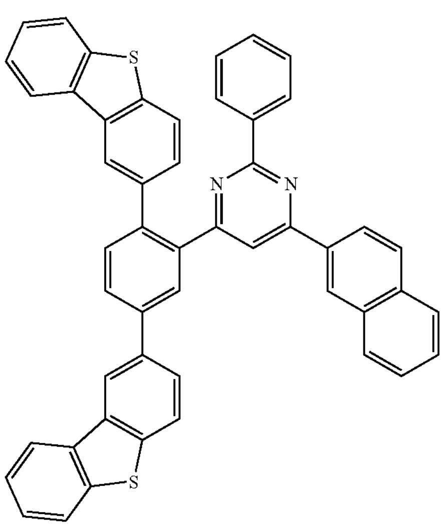
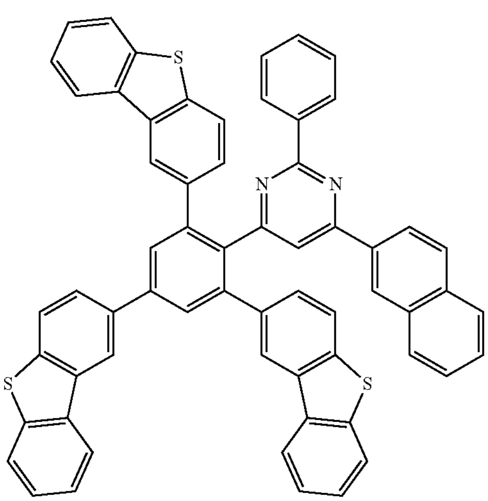

-continued
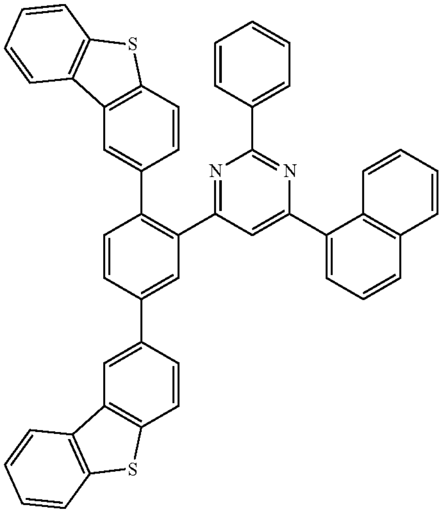
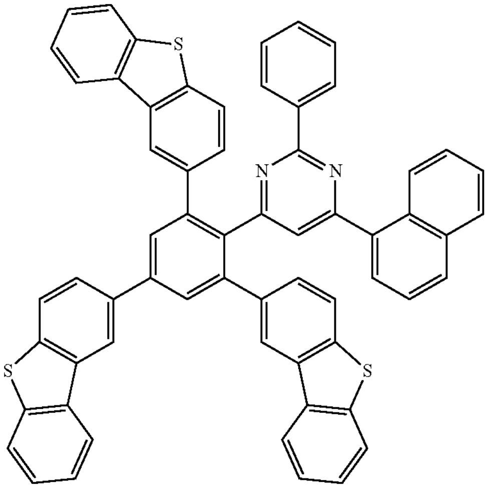
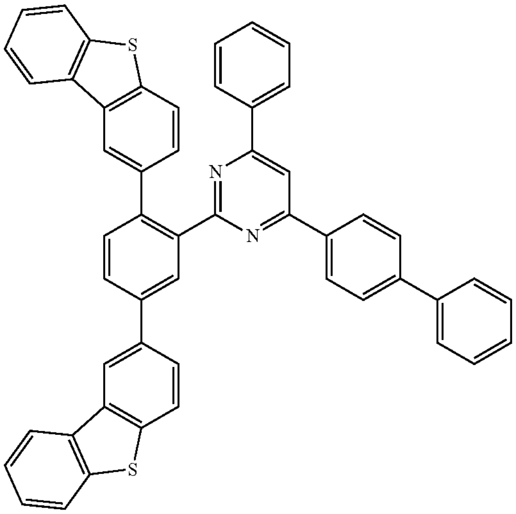
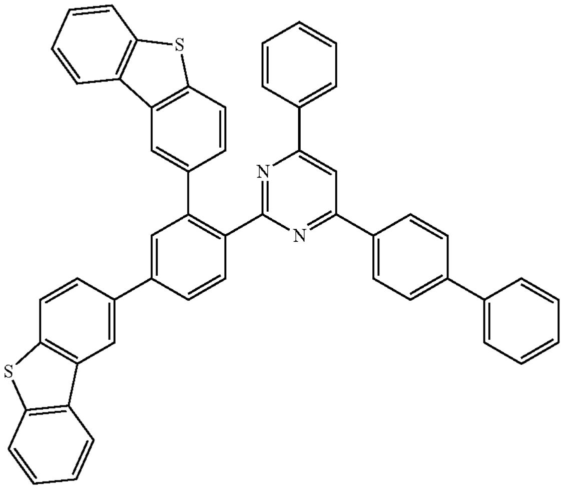
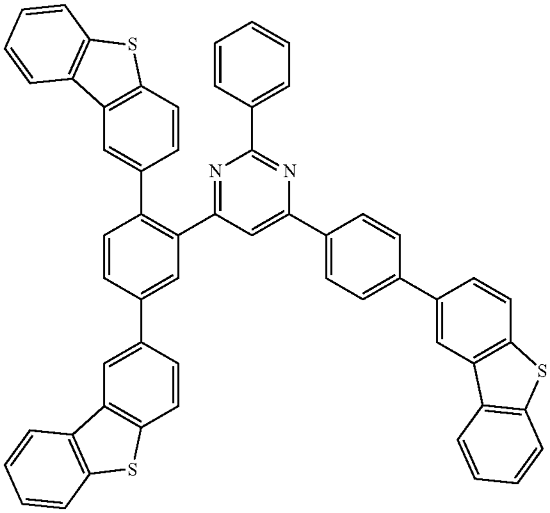
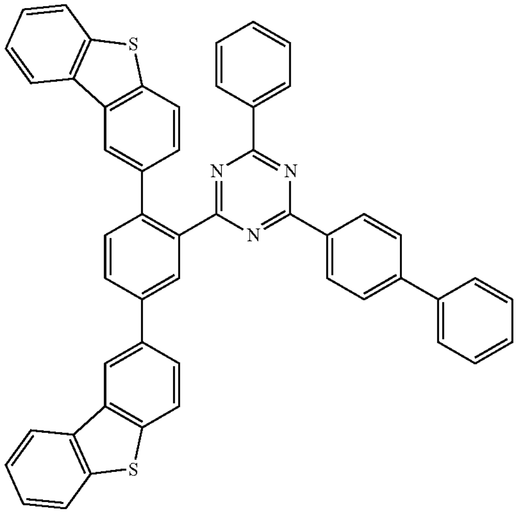

-continued
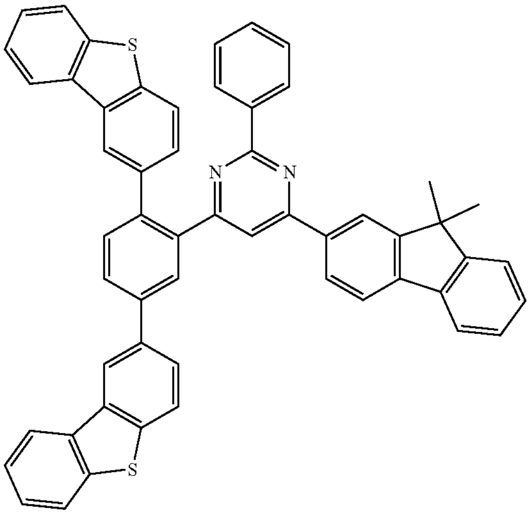
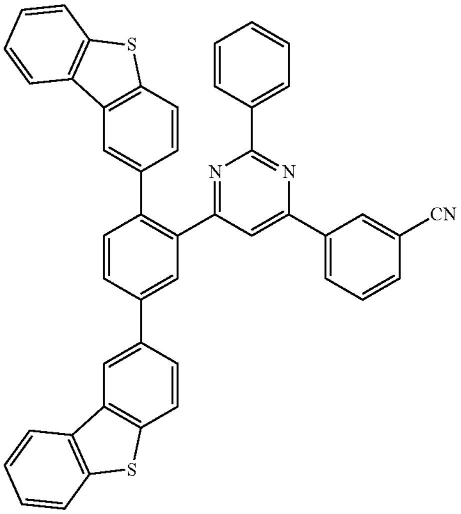
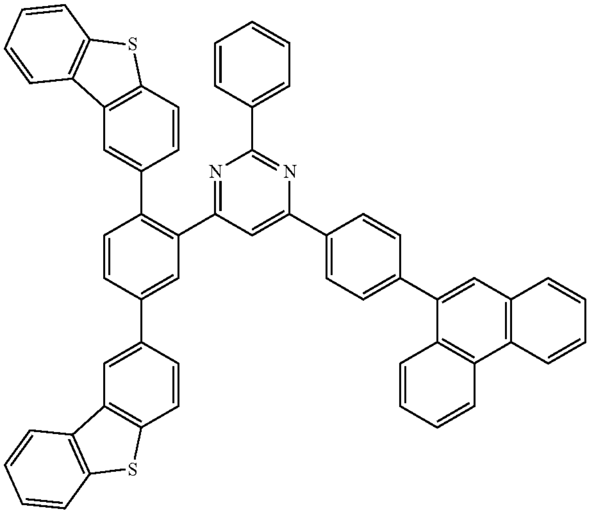
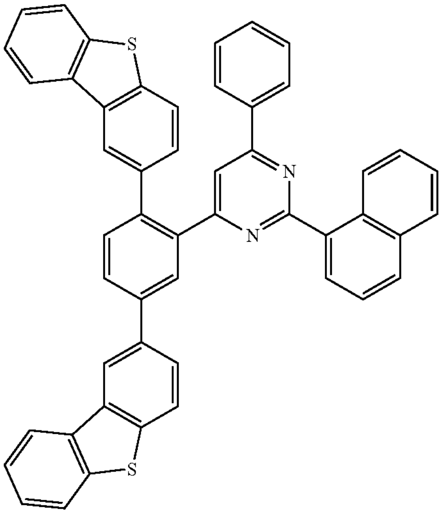
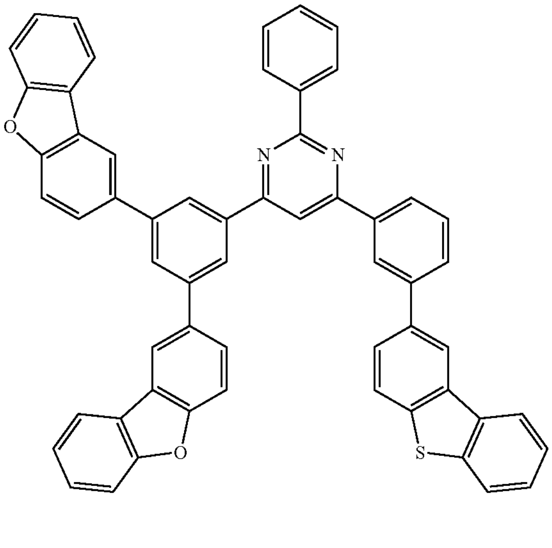

-continued
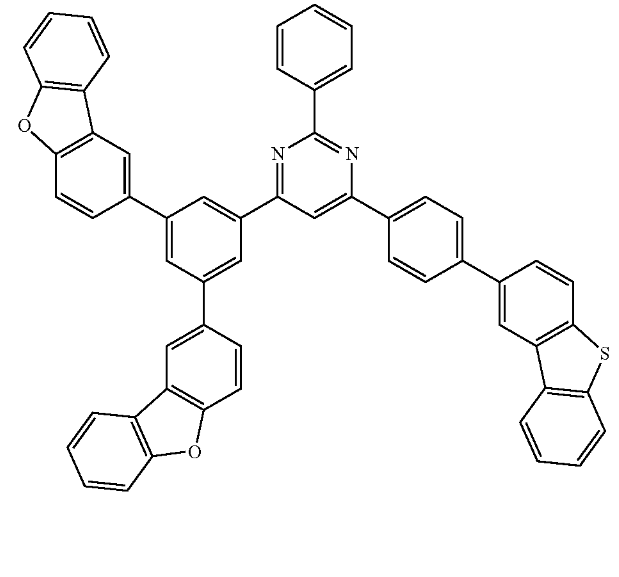
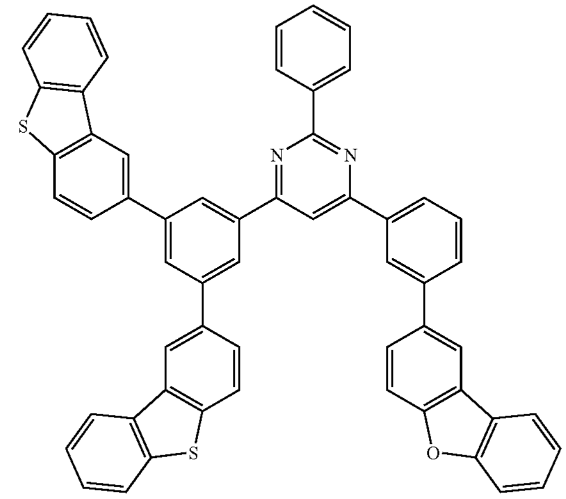
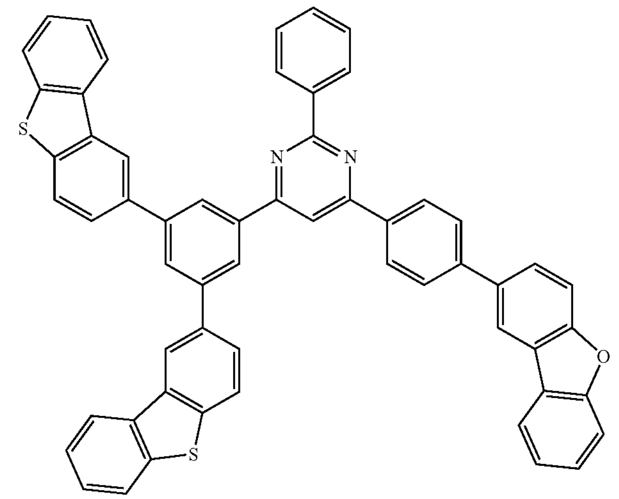

-continued
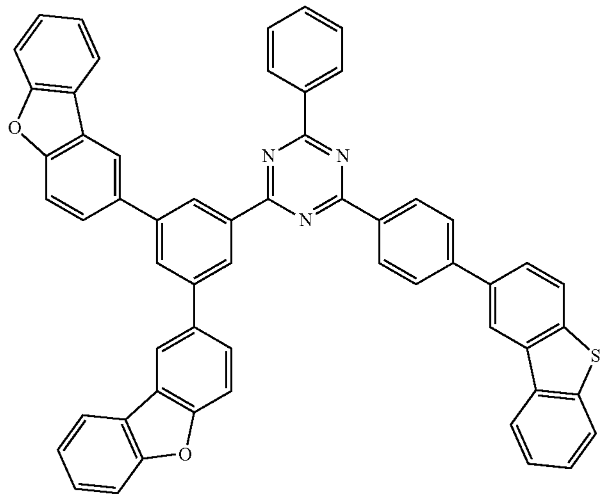
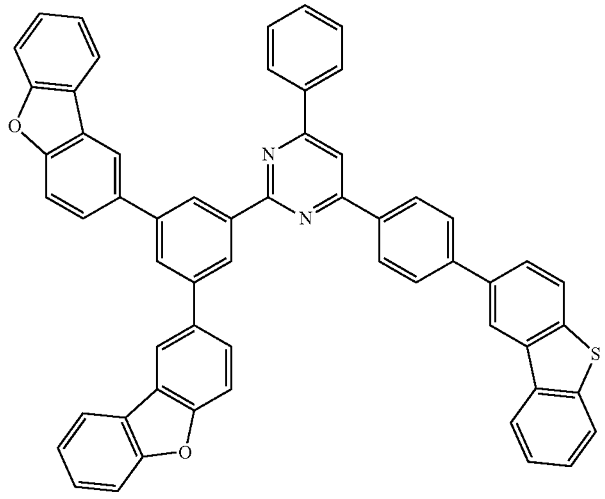
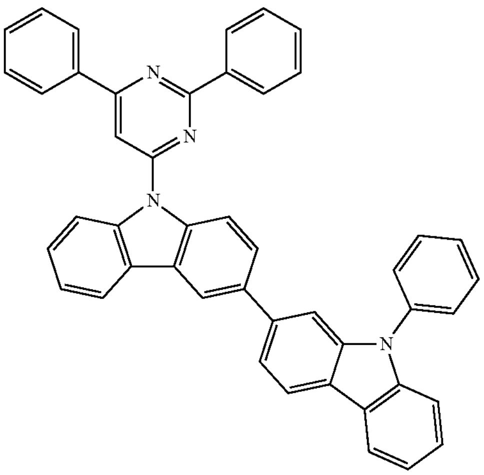
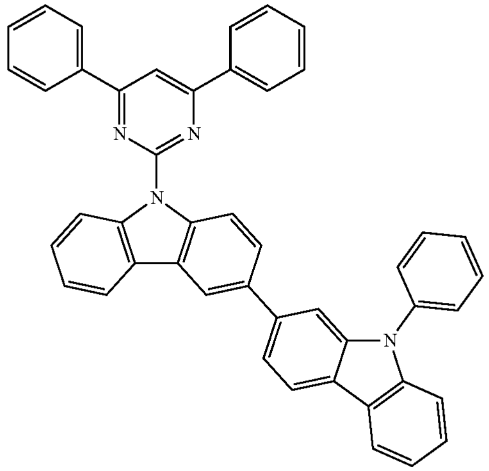
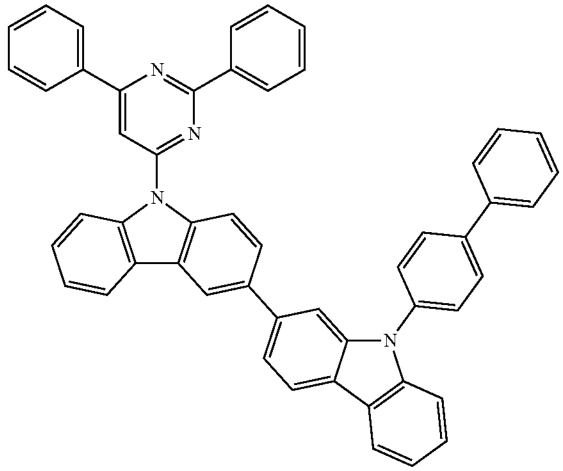

-continued
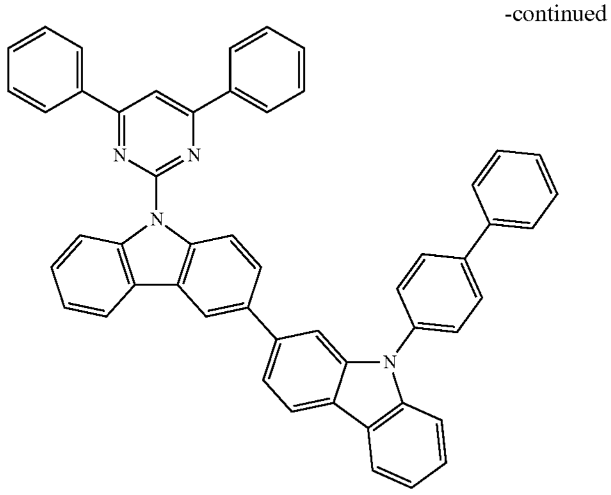
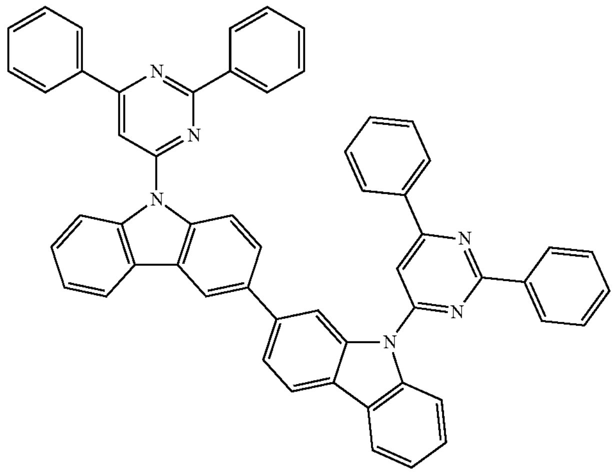
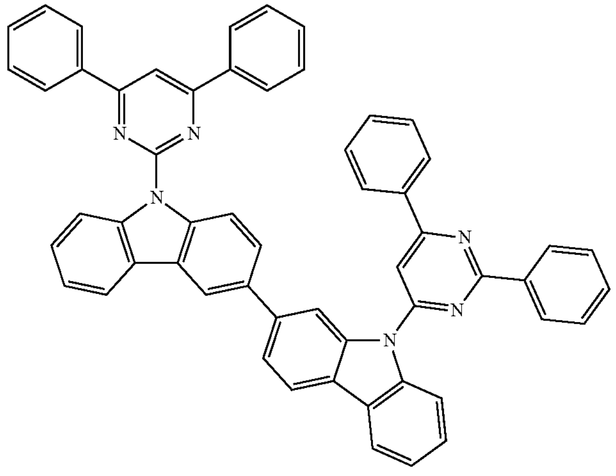

-continued
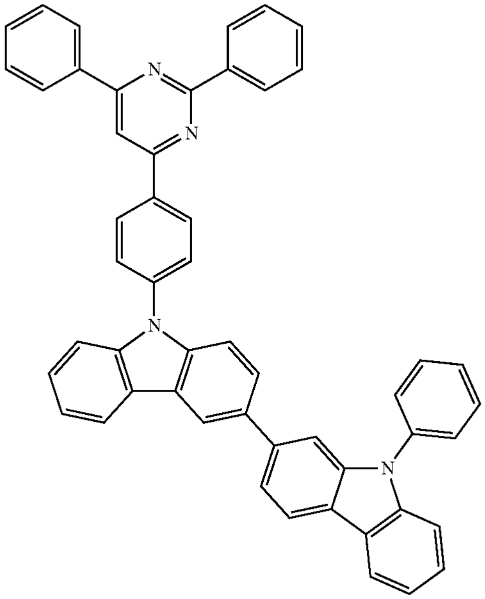
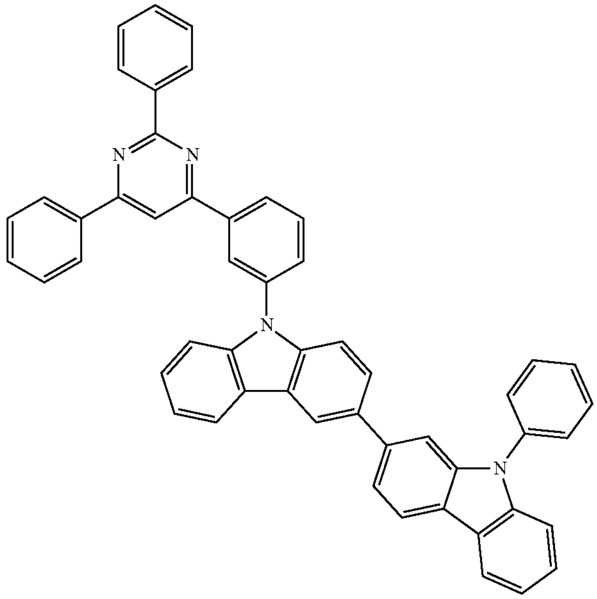
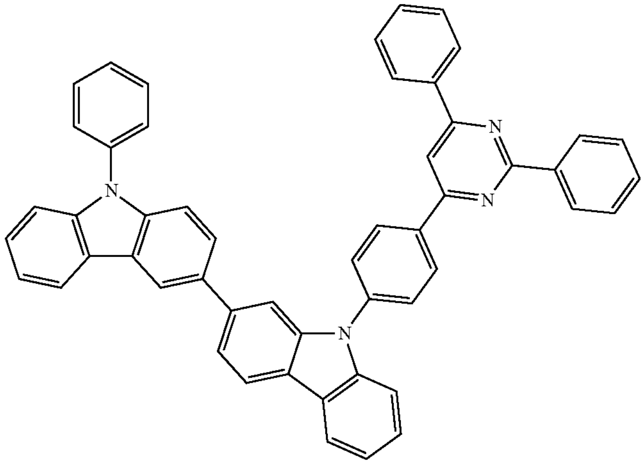
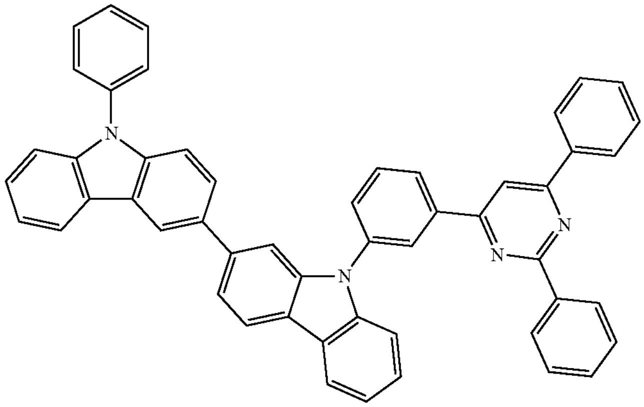

-continued
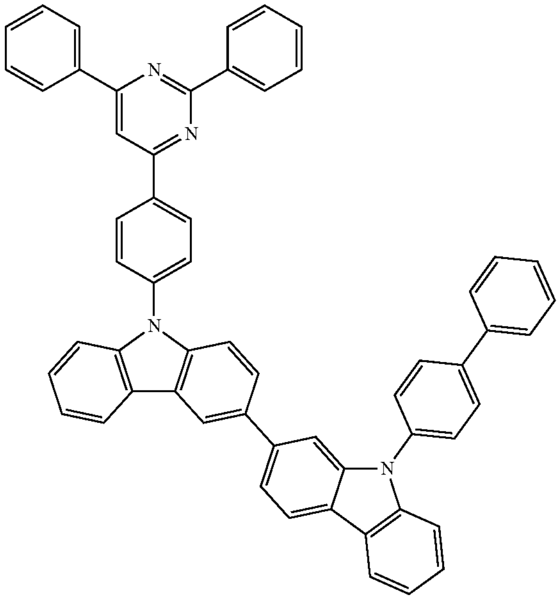
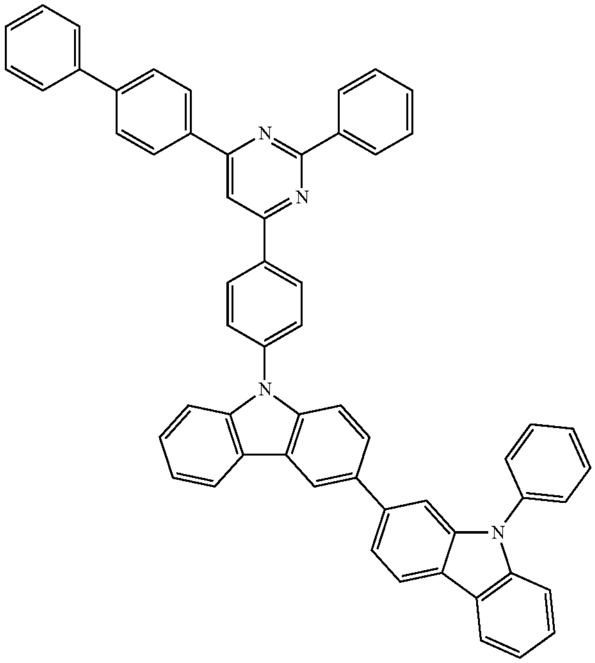

-continued
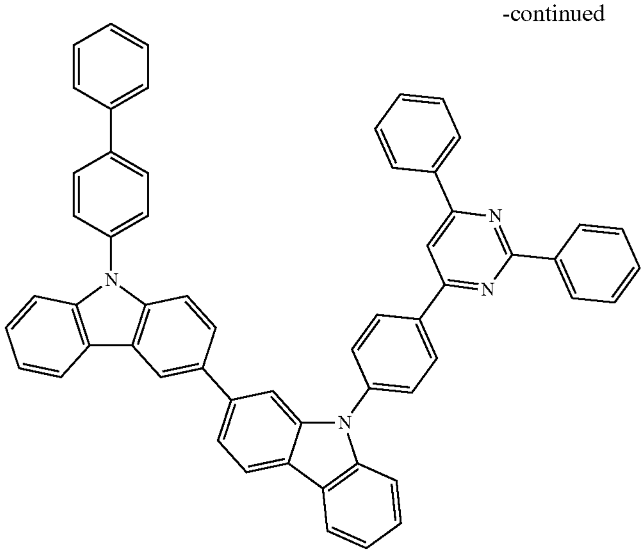
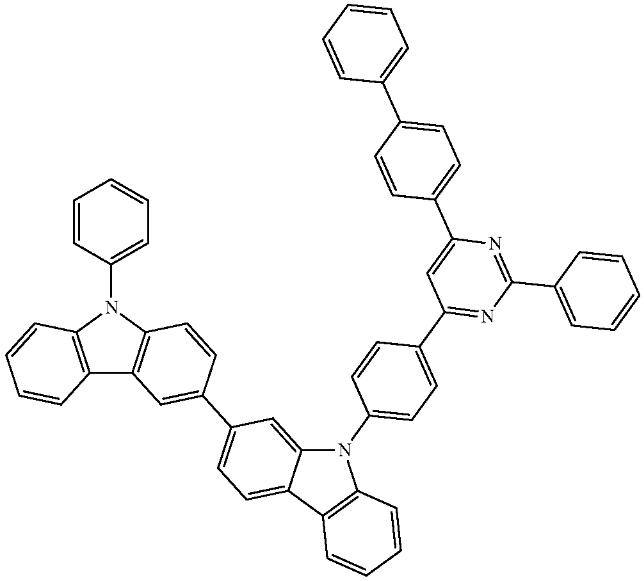
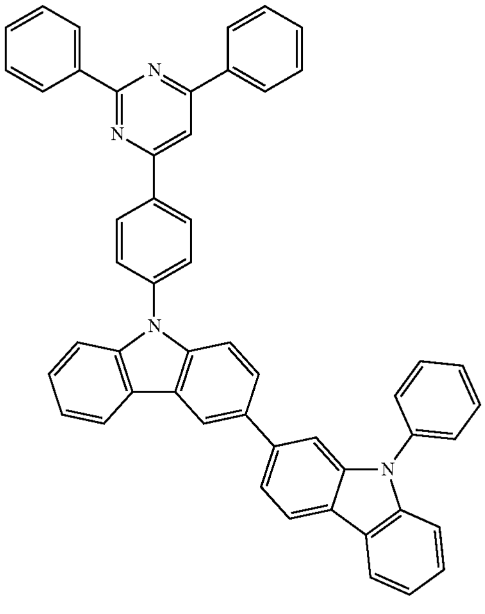
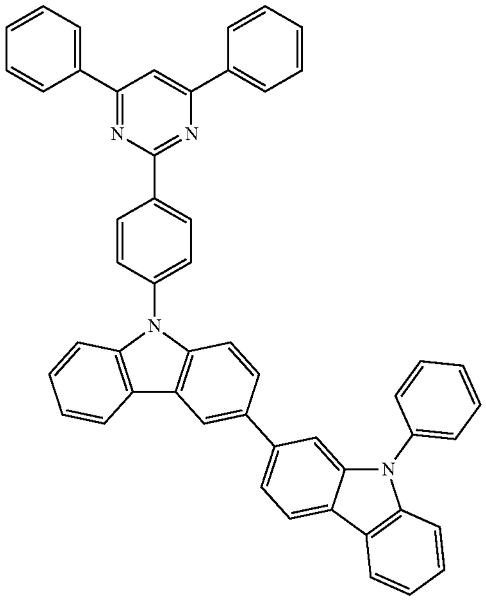

-continued
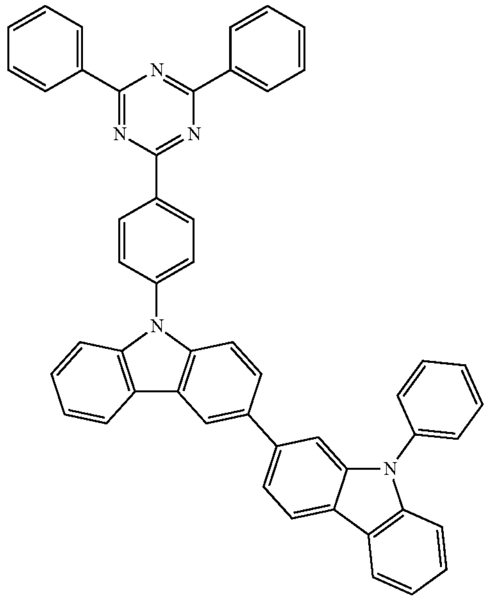
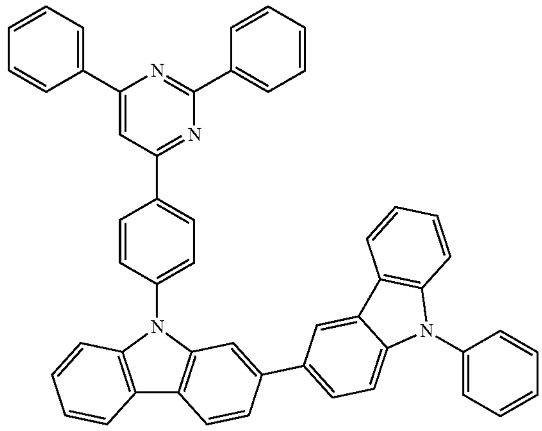
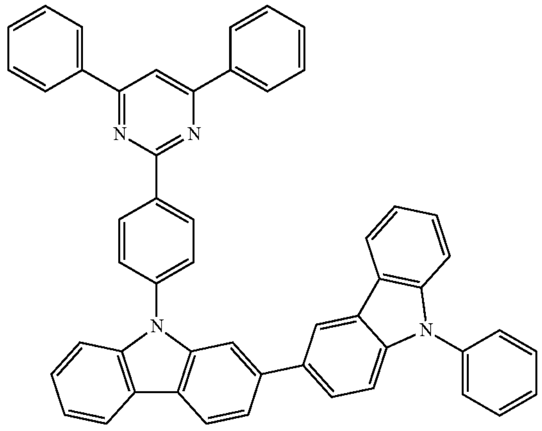
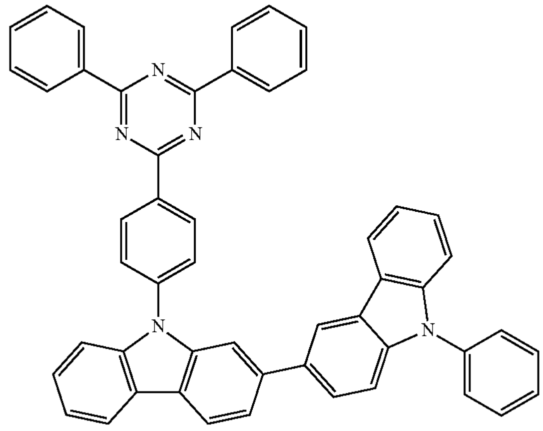
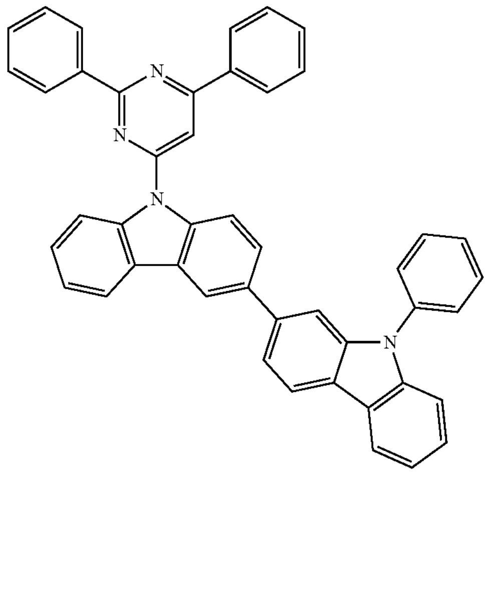
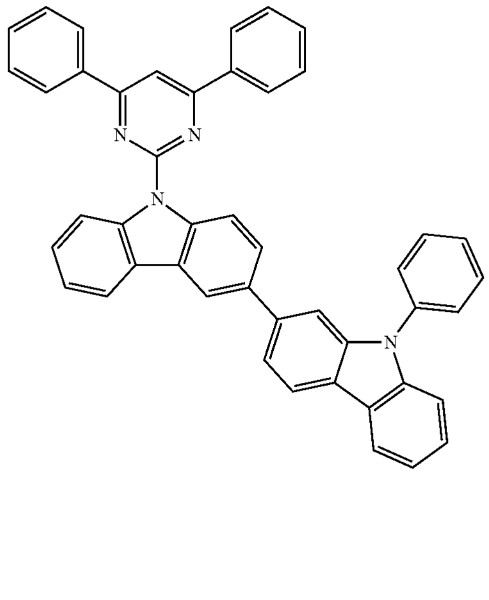

-continued
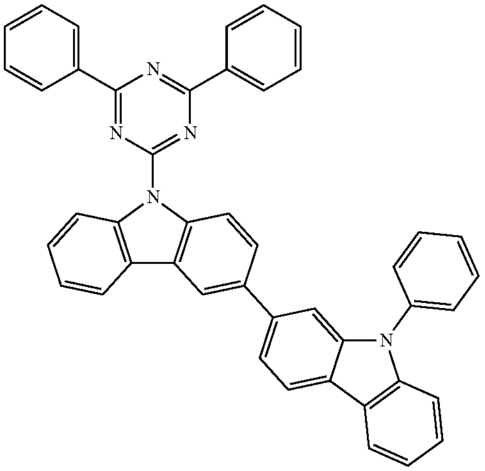
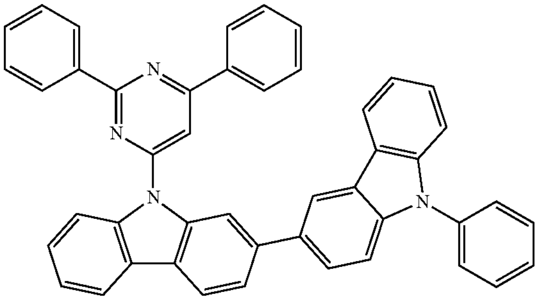
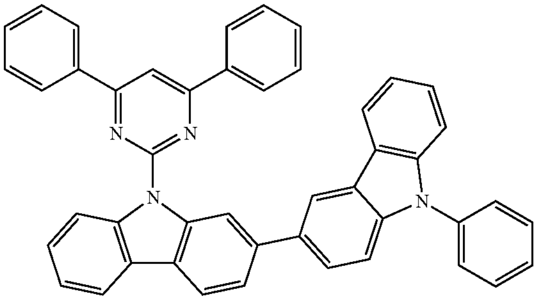
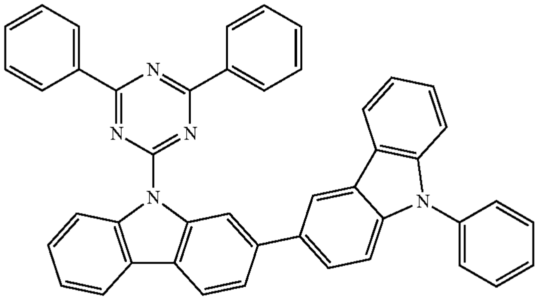
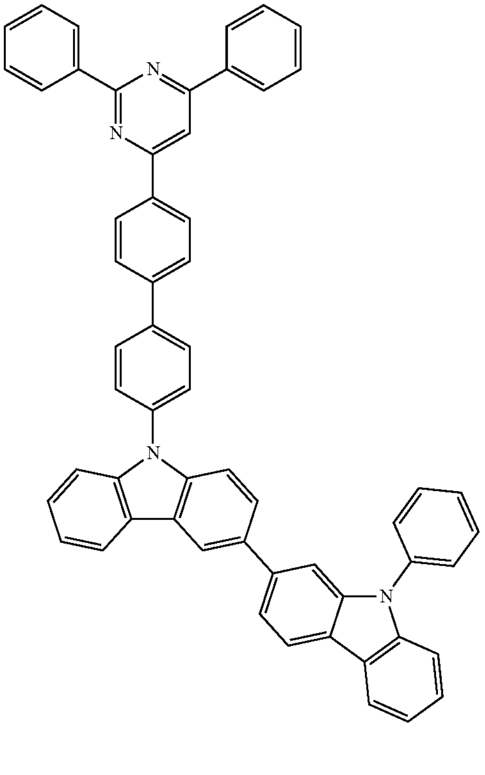
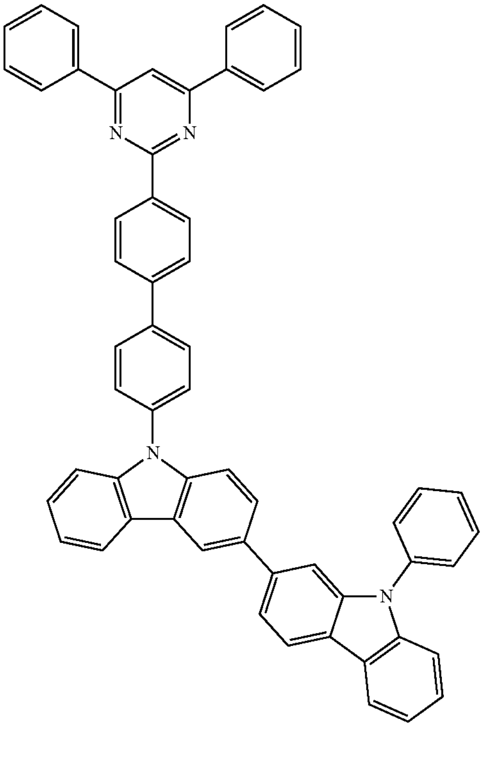

-continued
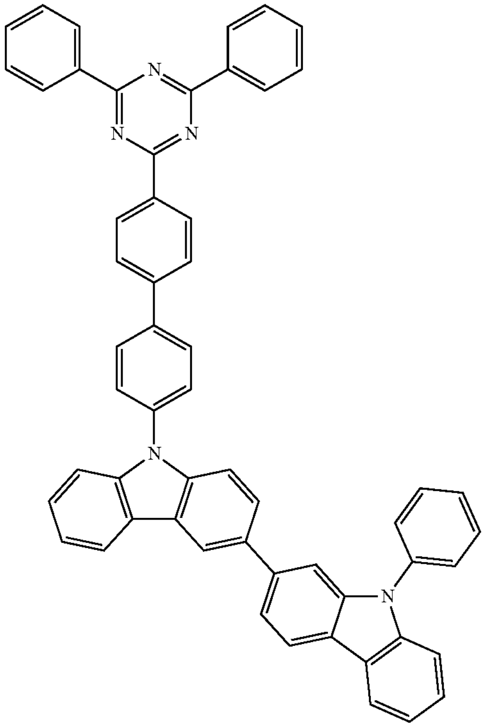
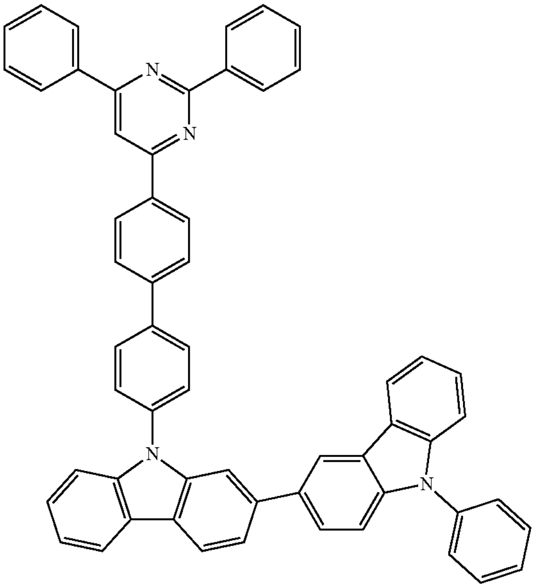
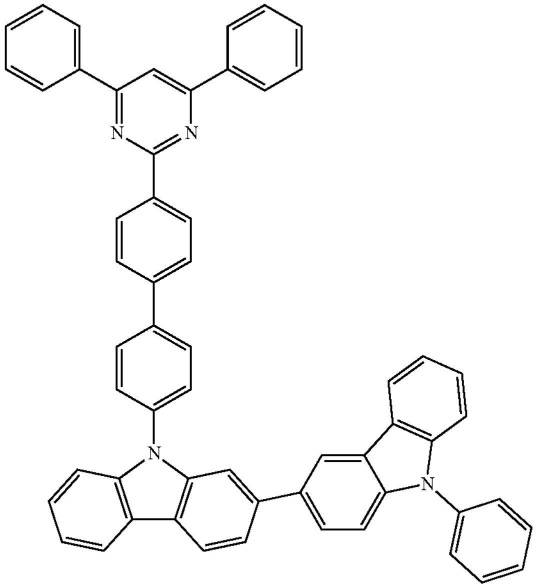
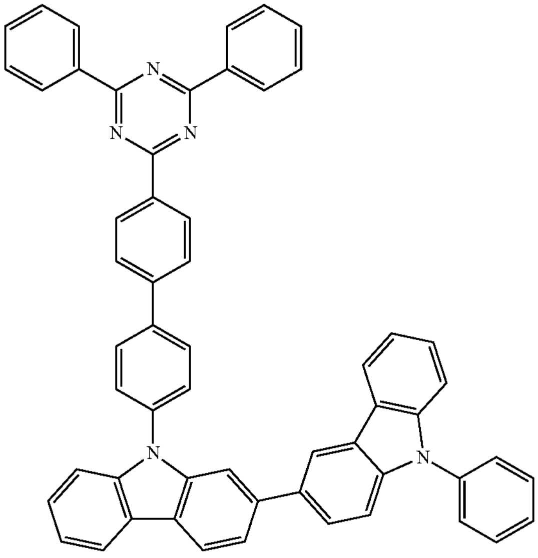

-continued
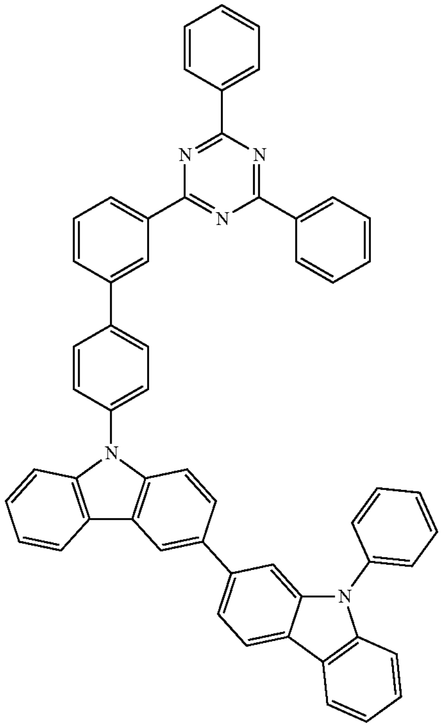
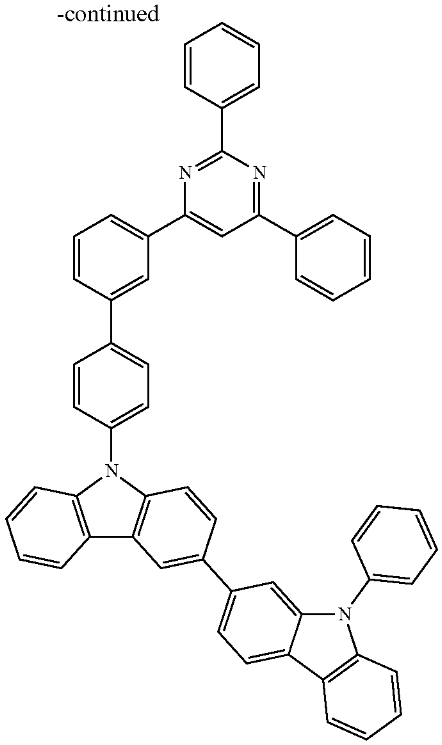
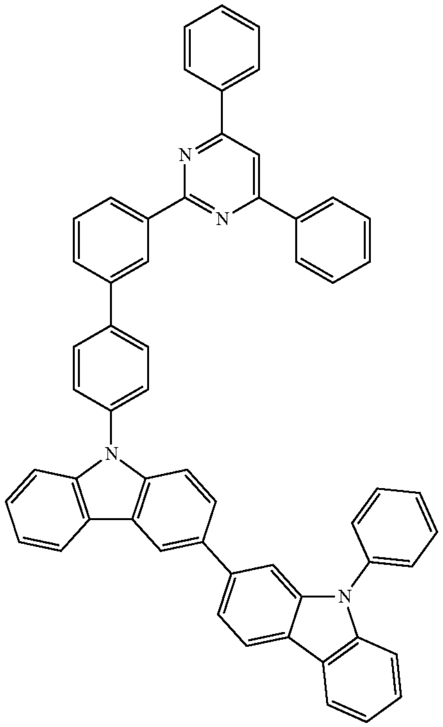
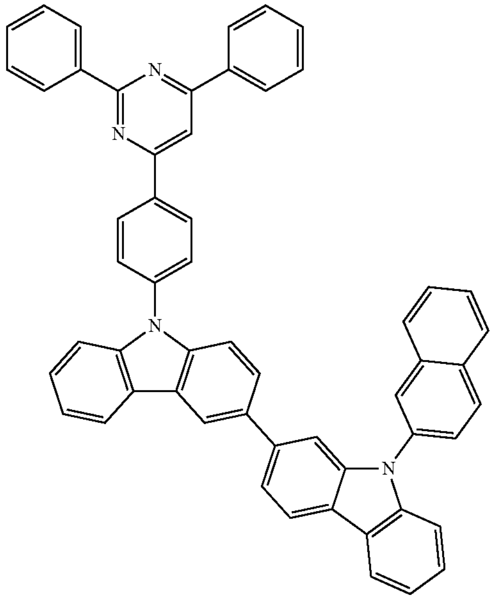

-continued
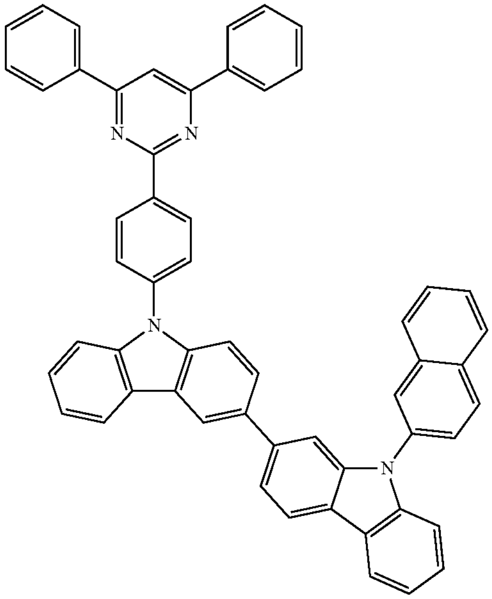
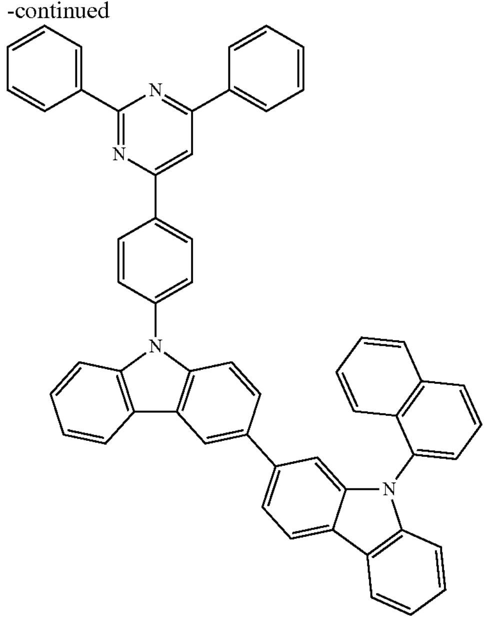
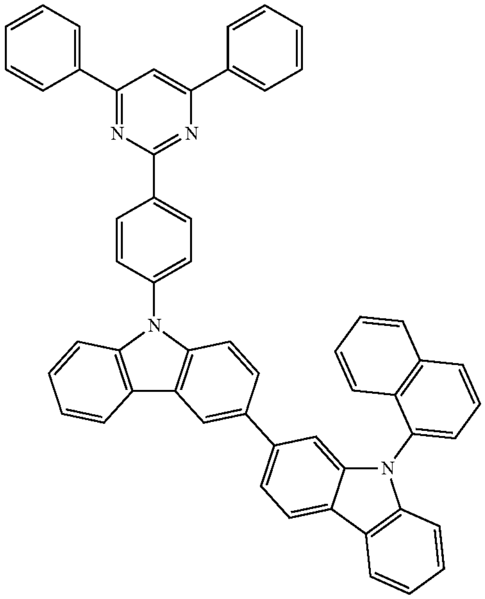
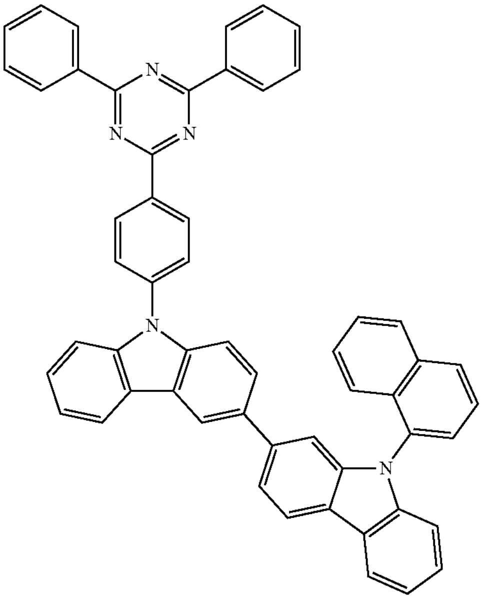

-continued
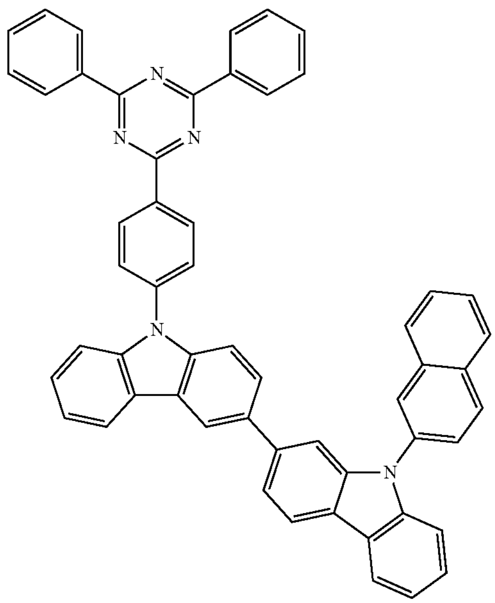
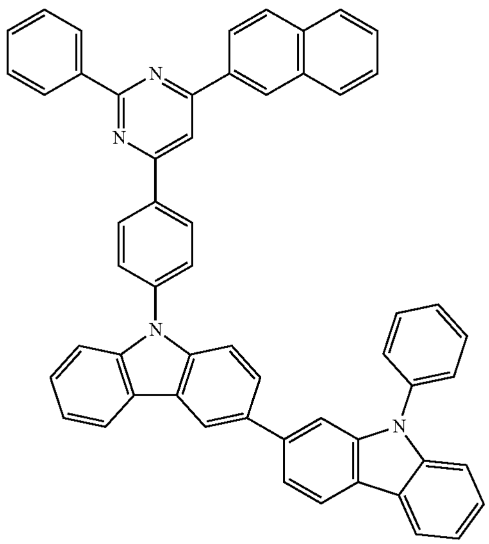
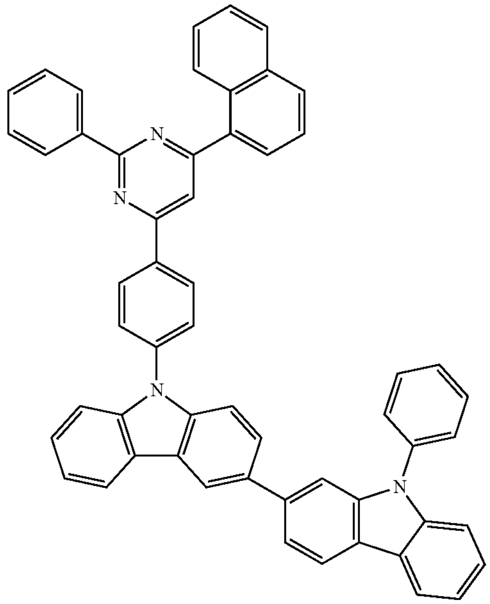
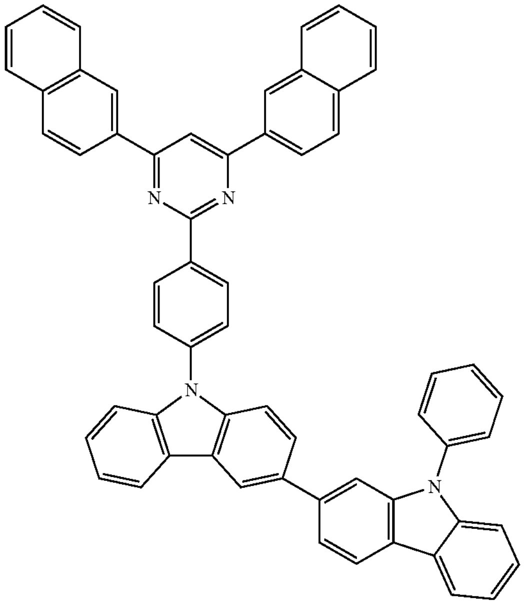

-continued
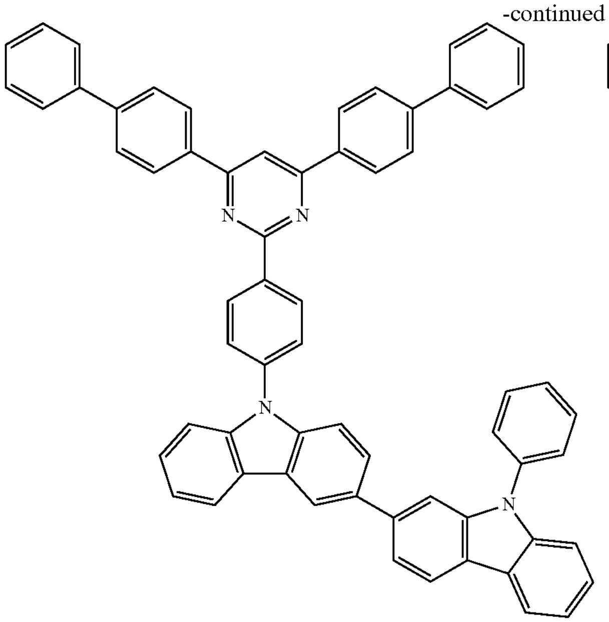
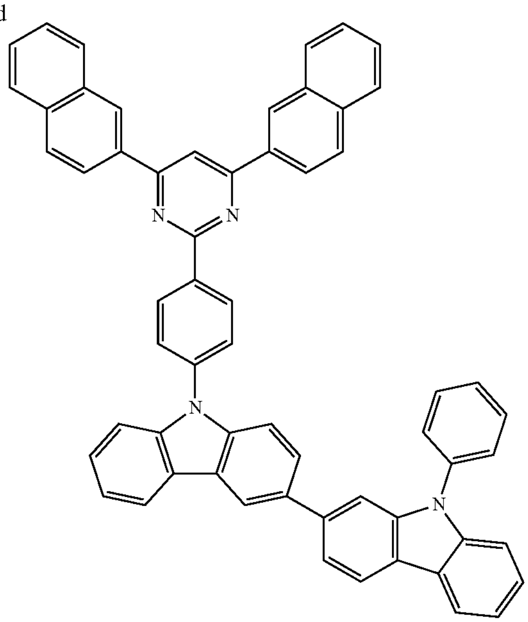
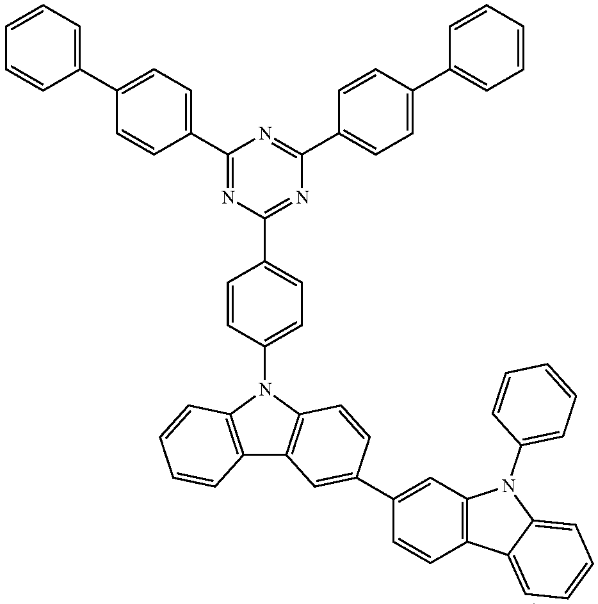
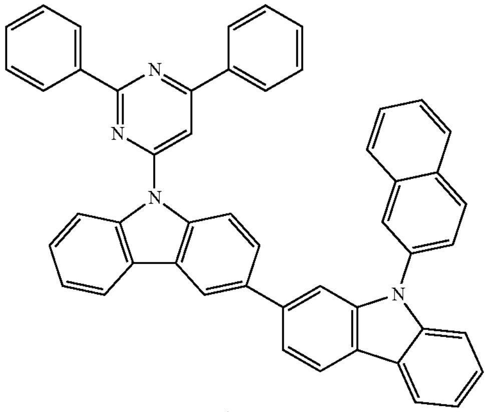
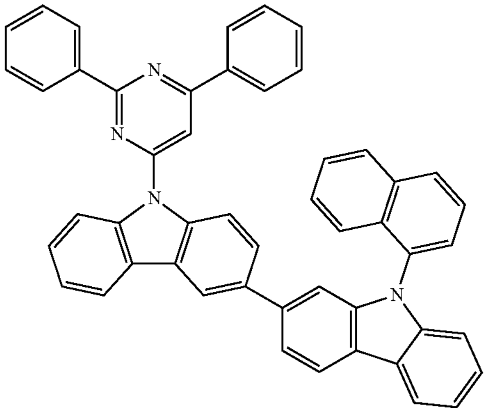
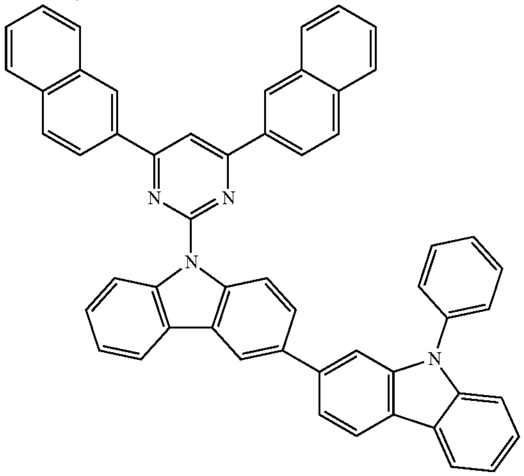

-continued
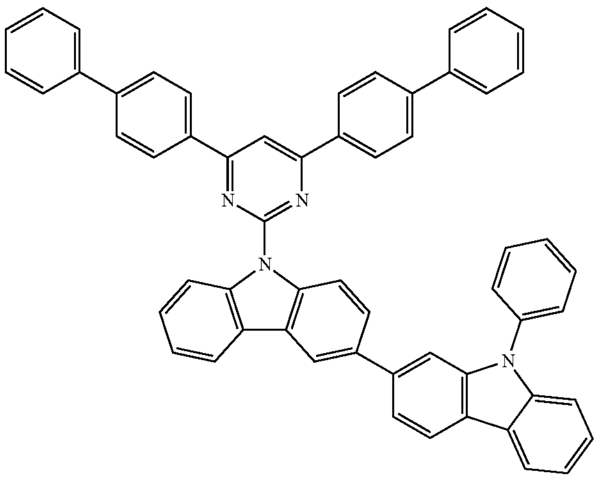
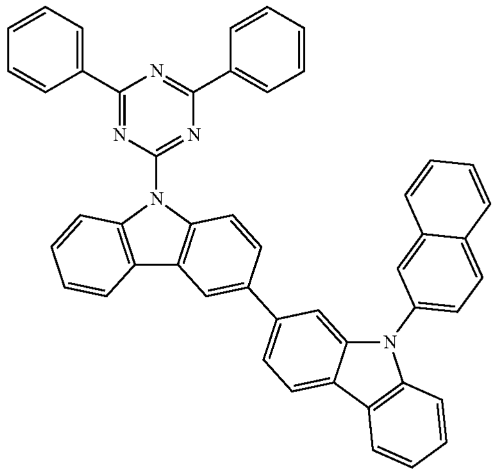
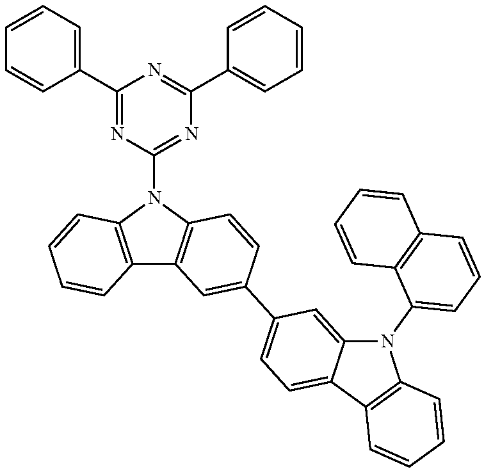
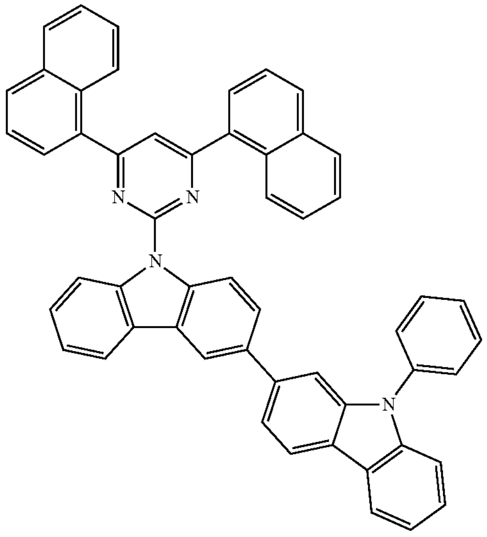
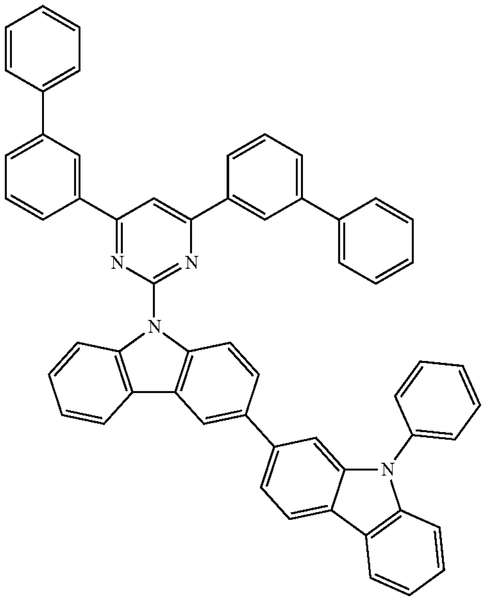
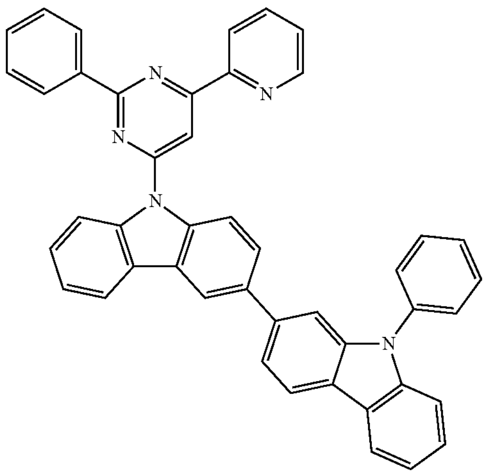

-continued
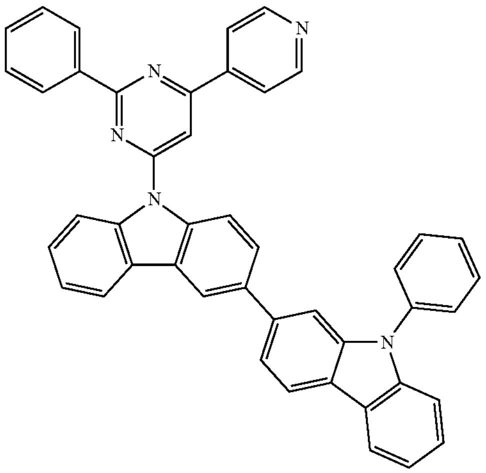
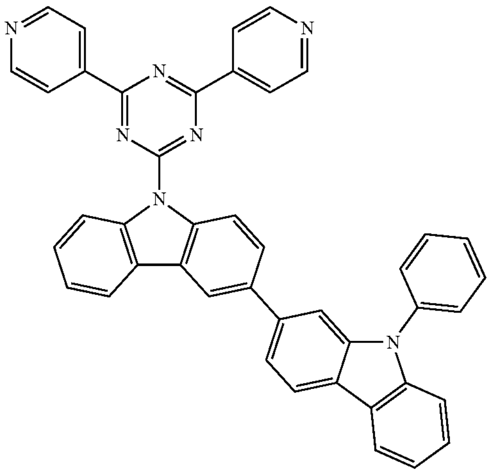
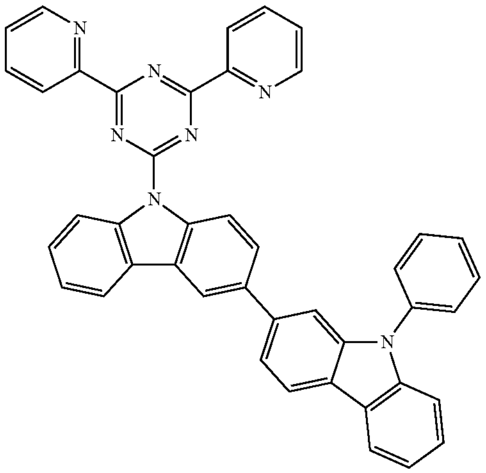
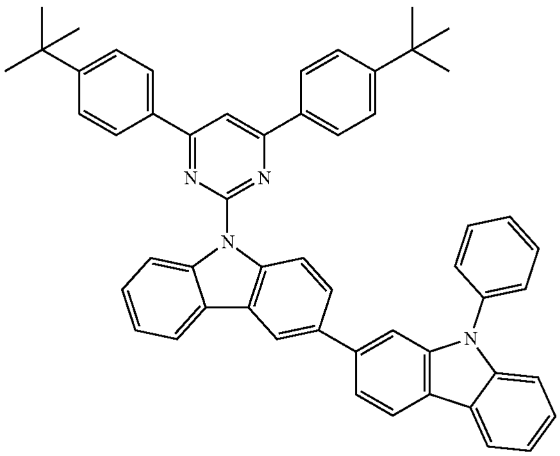
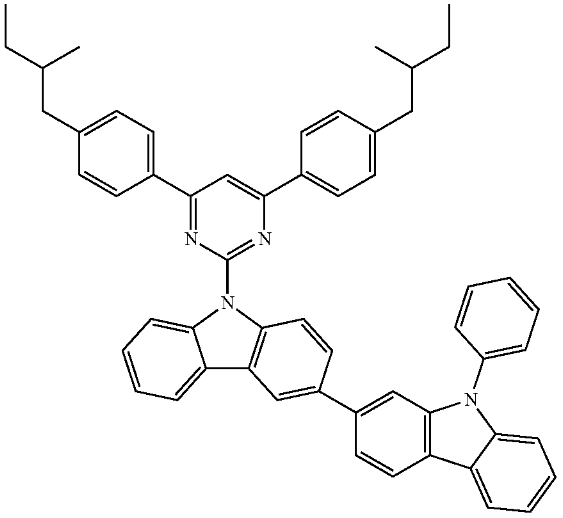
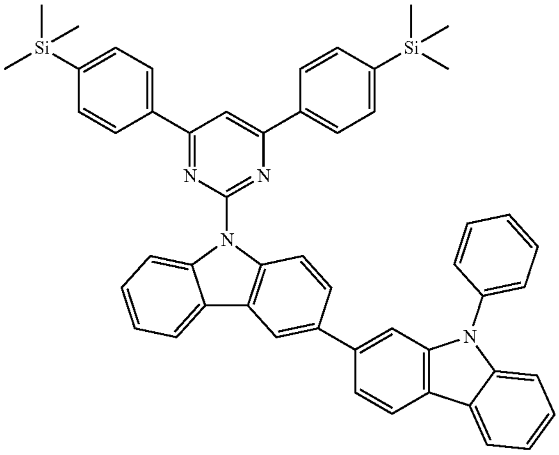

-continued
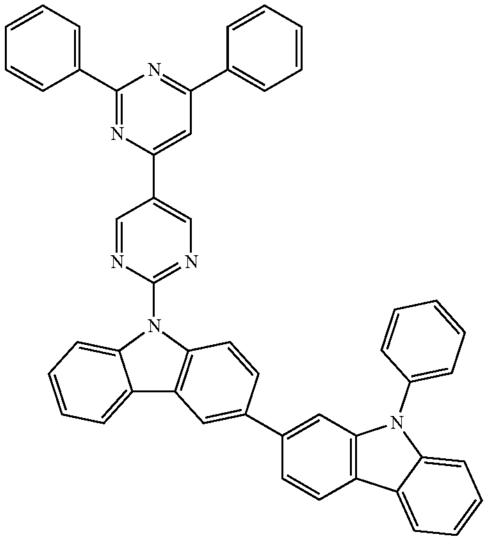
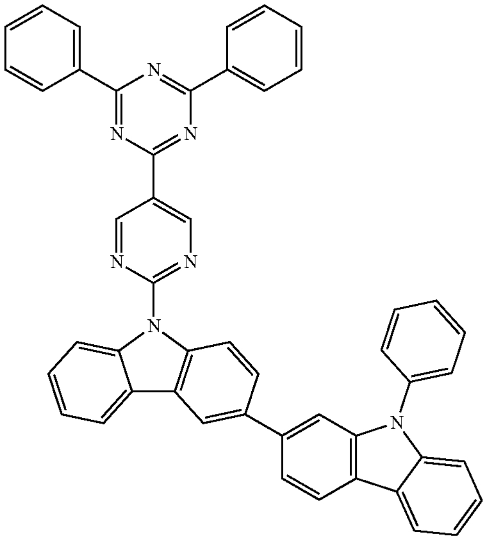
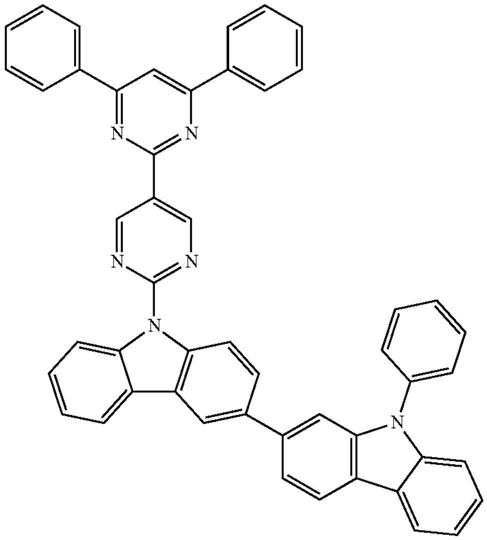
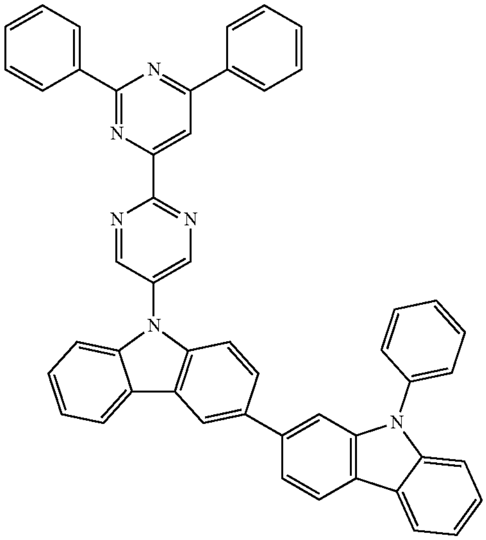
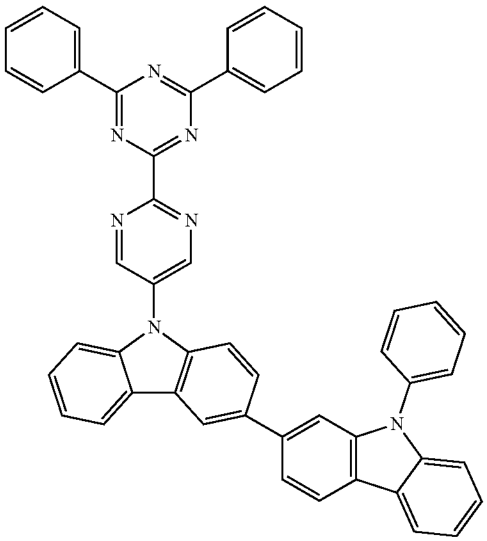
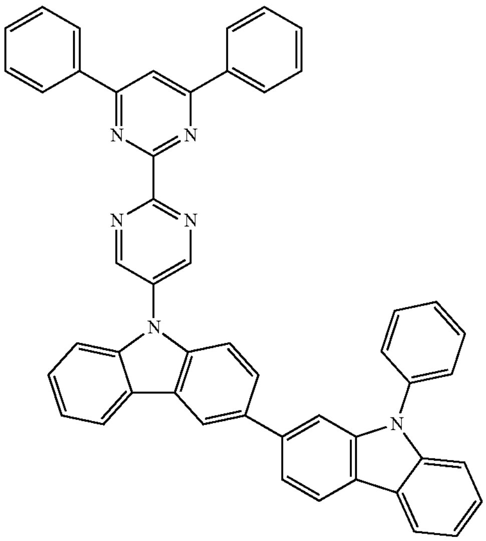

-continued
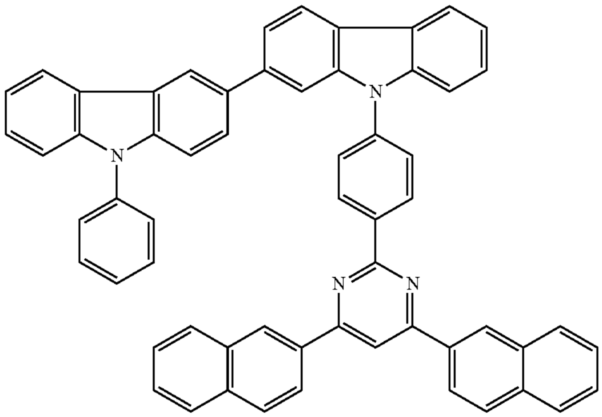
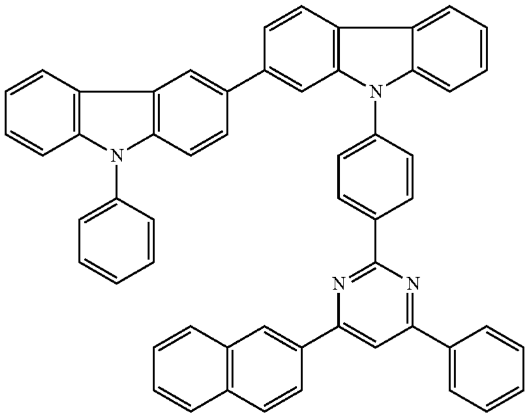
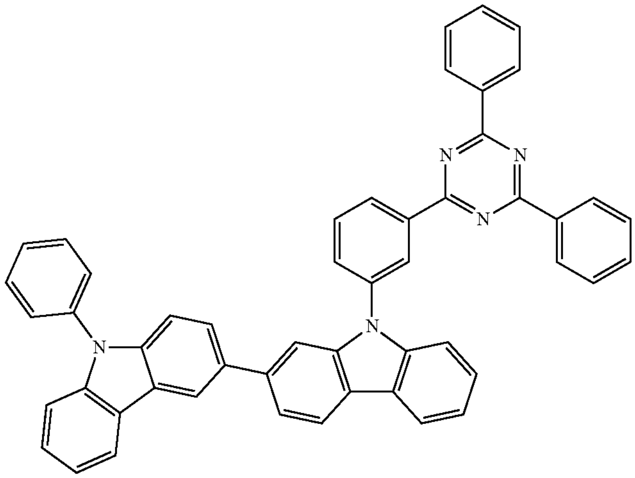
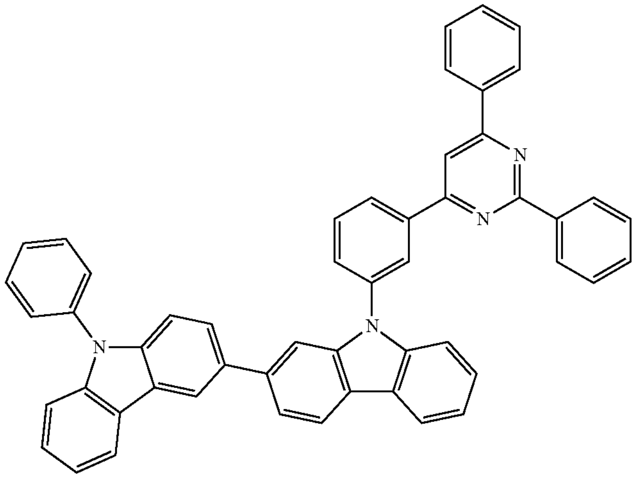

-continued
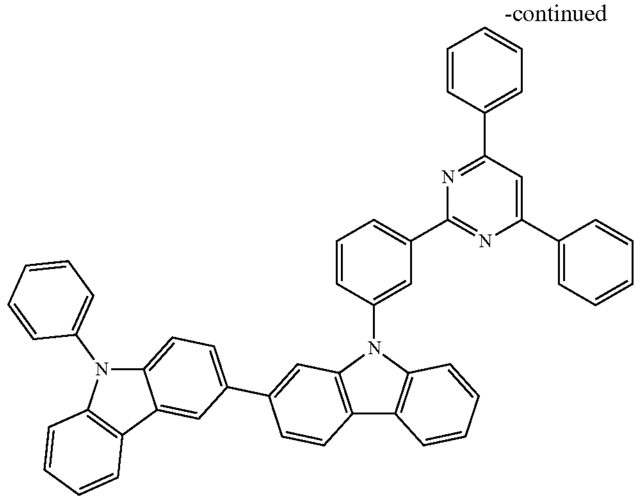
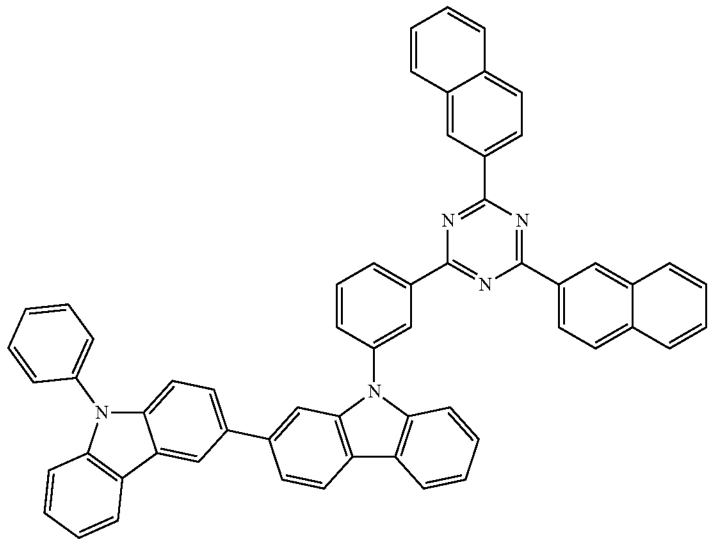
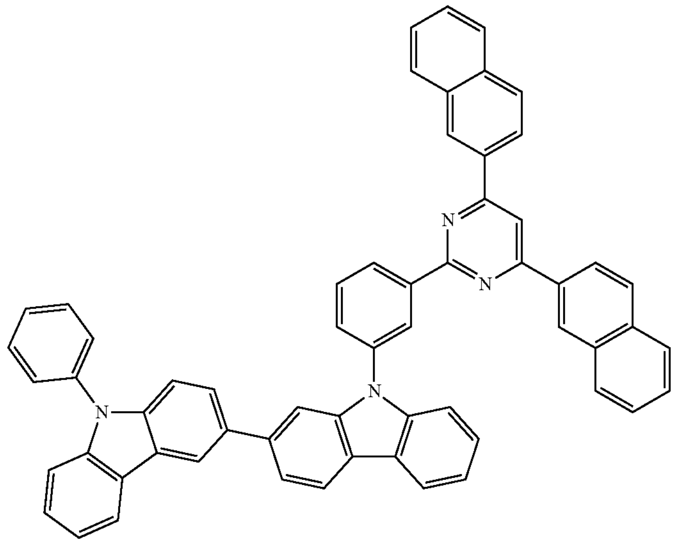

-continued
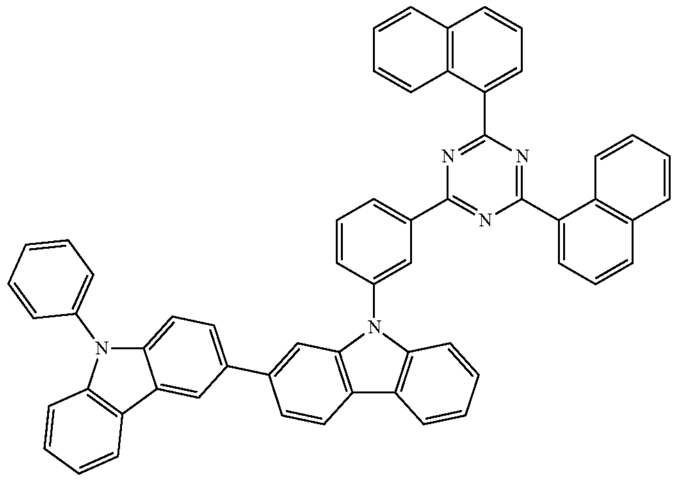
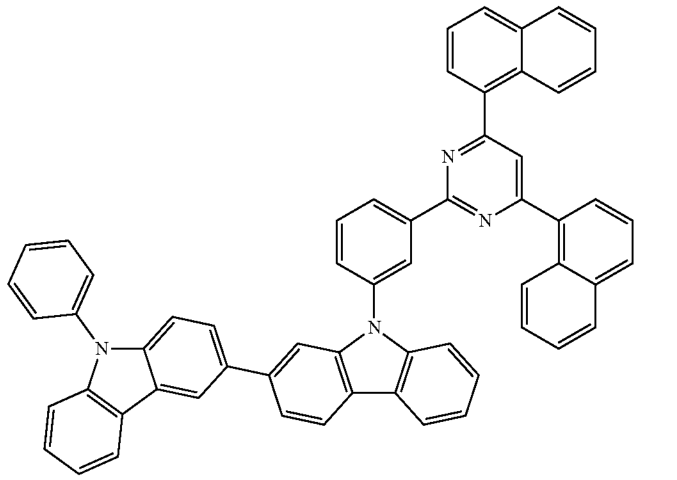
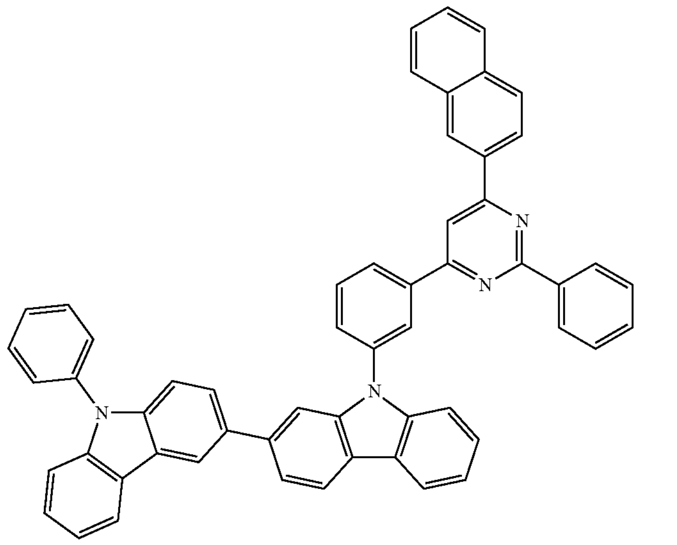

-continued
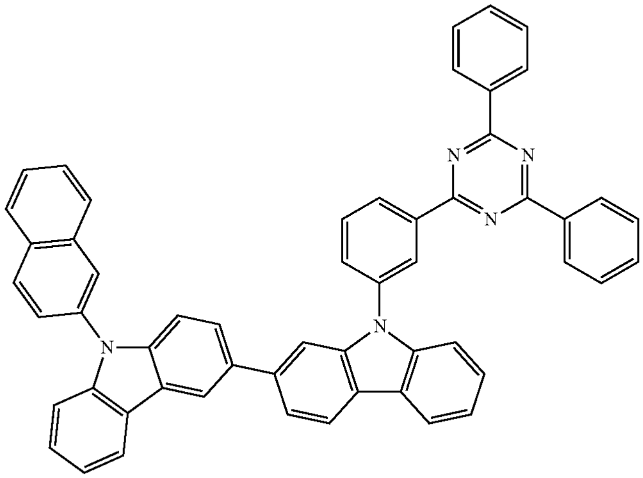
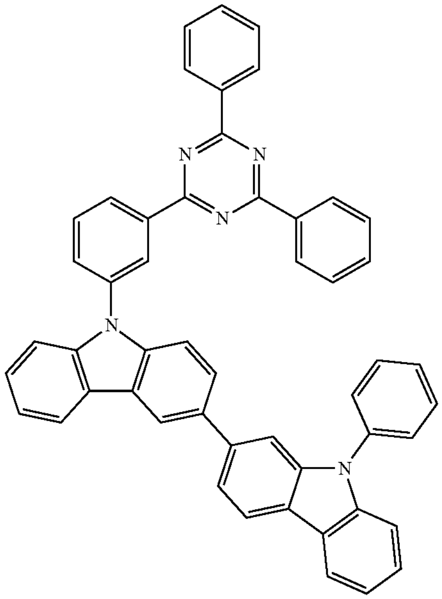
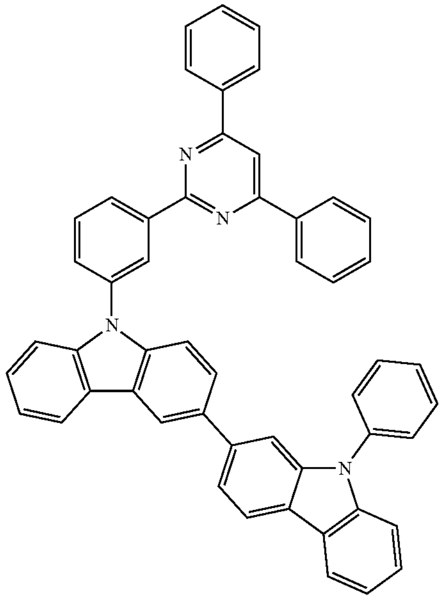
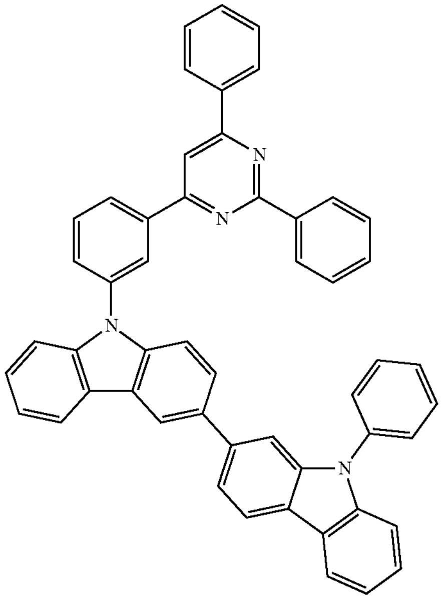
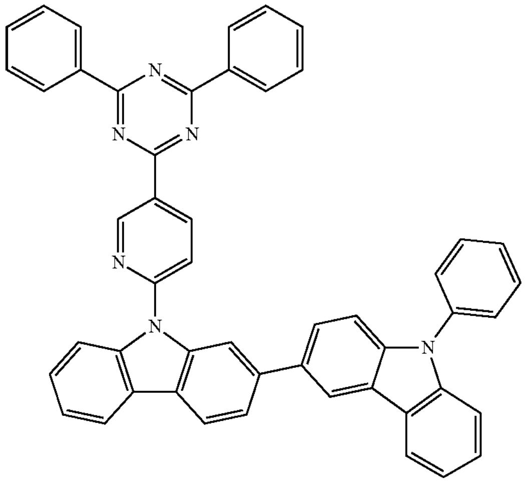

-continued
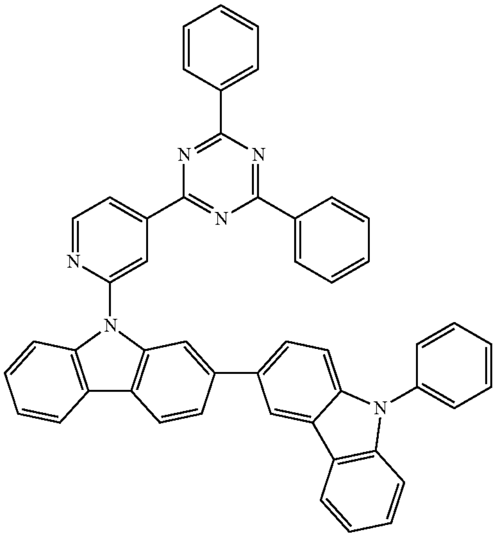
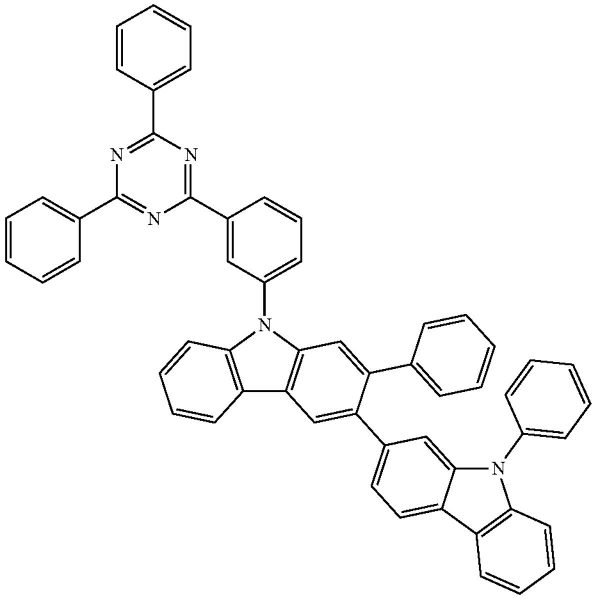
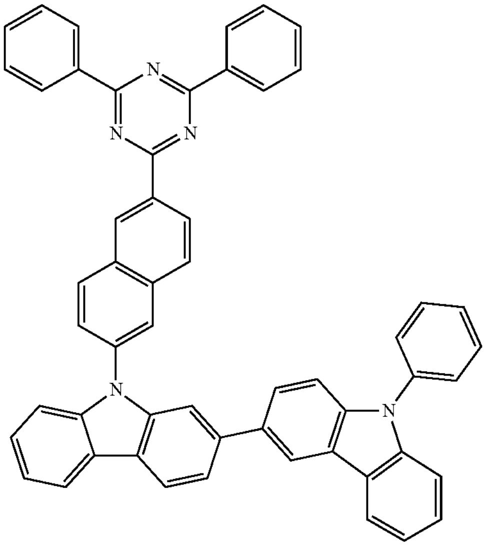
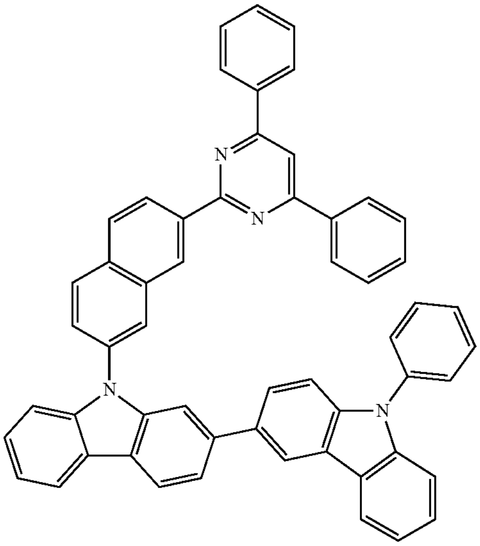
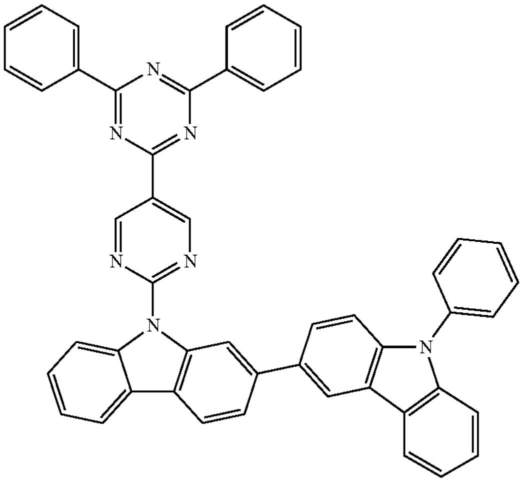
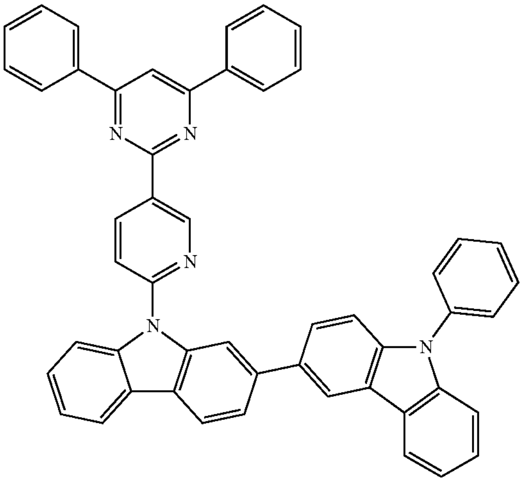

-continued
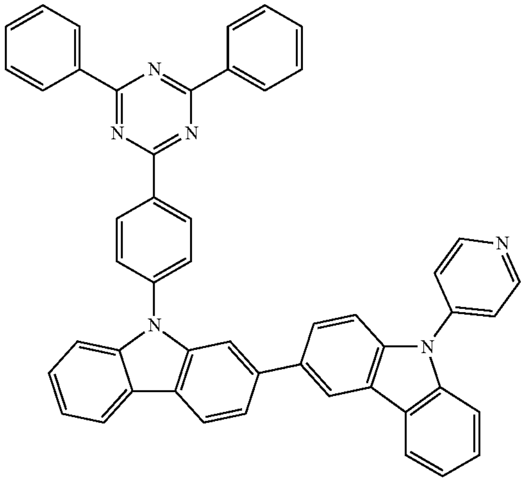
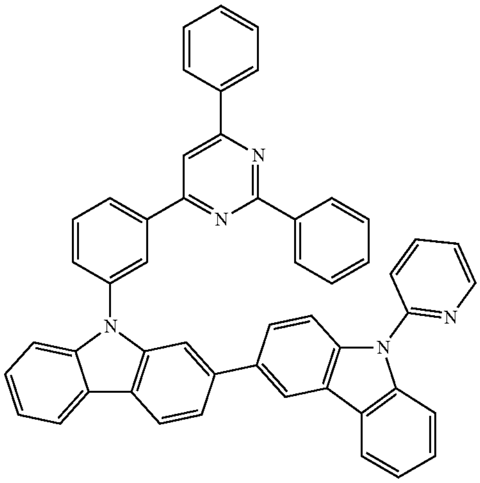
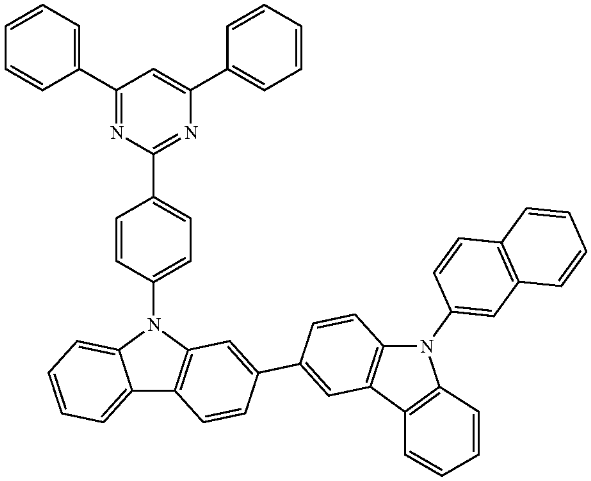
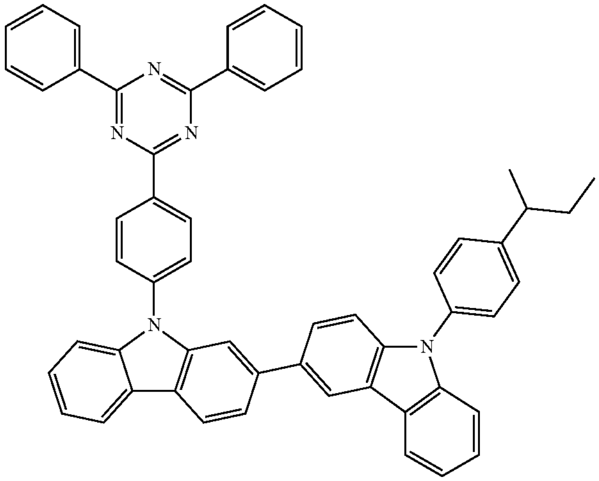

-continued
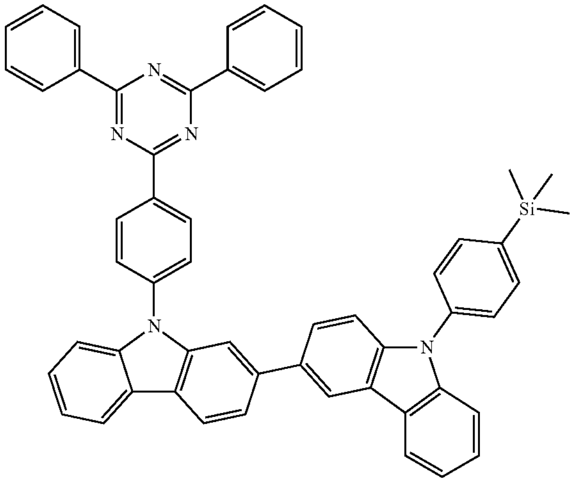
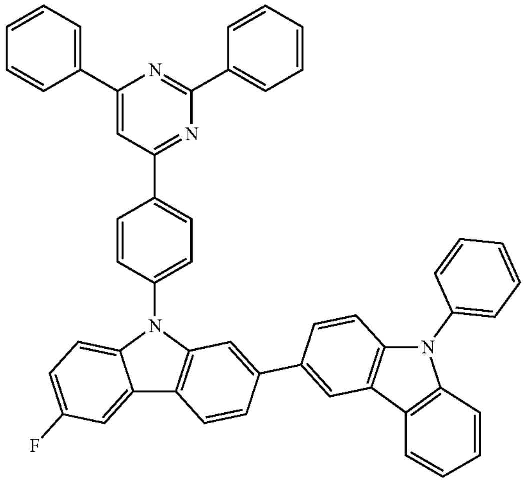
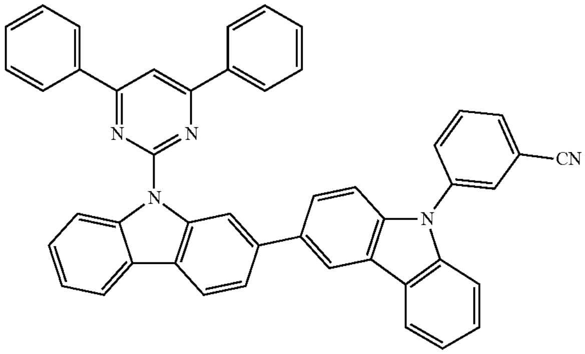
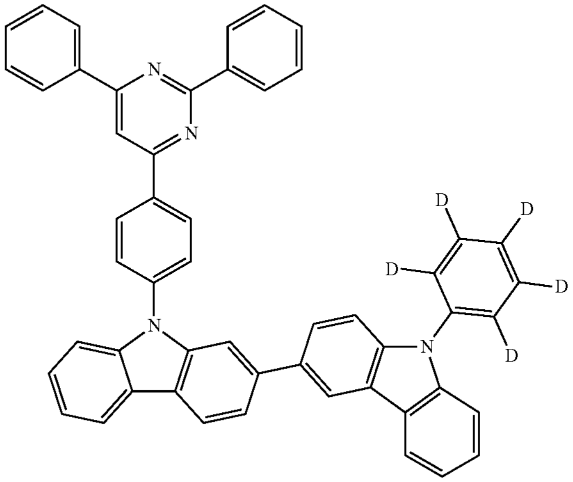
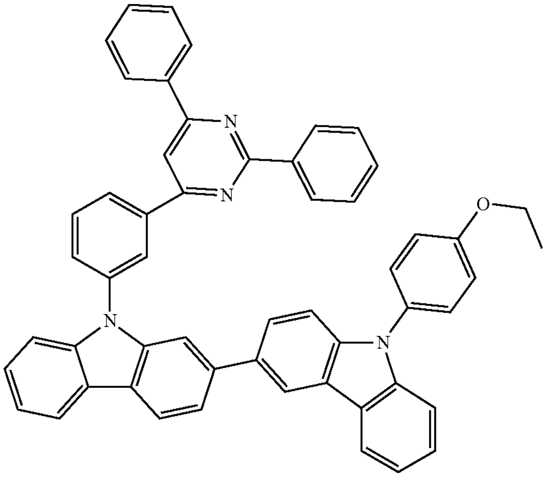
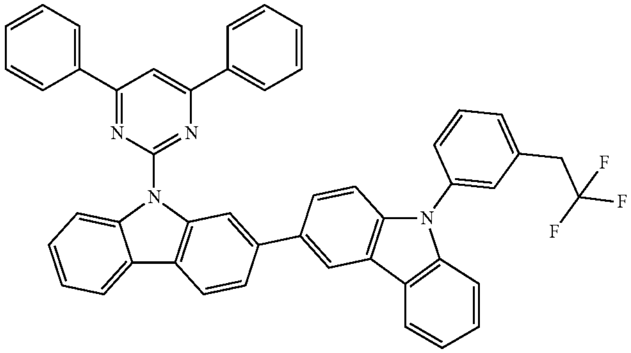

-continued
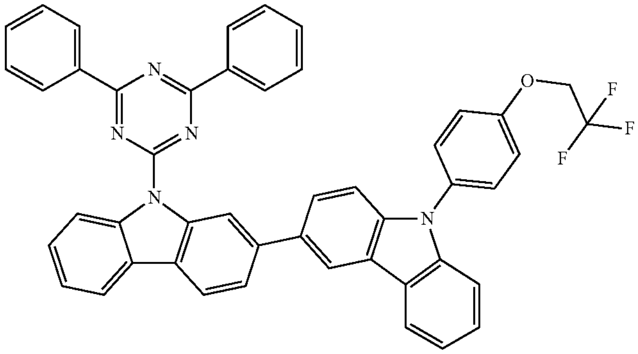
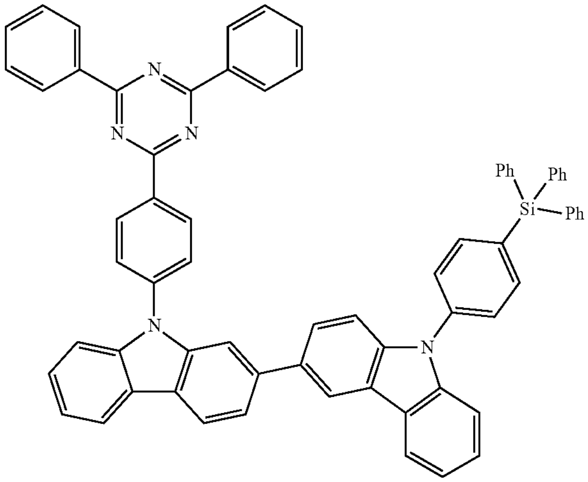
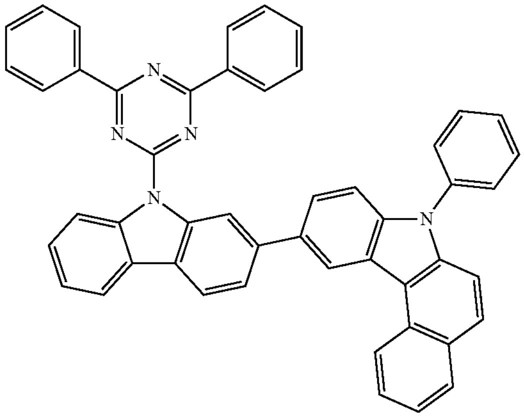
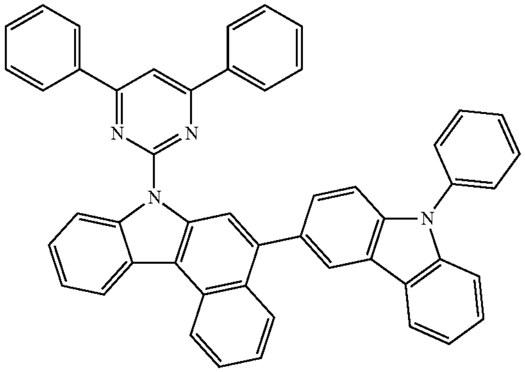
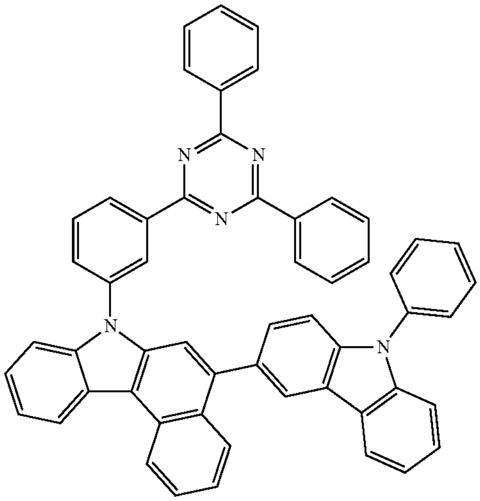
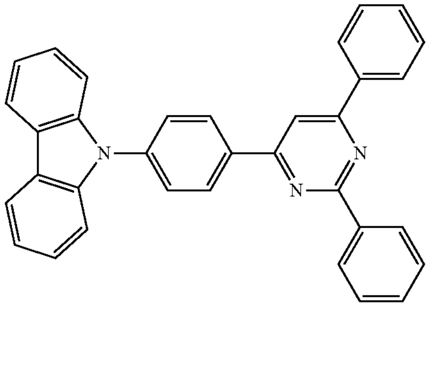
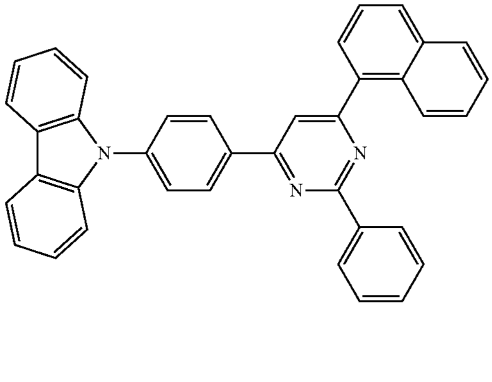

-continued
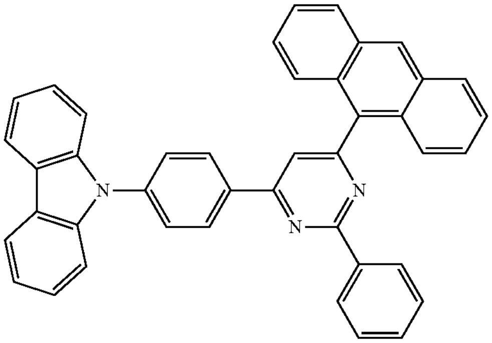
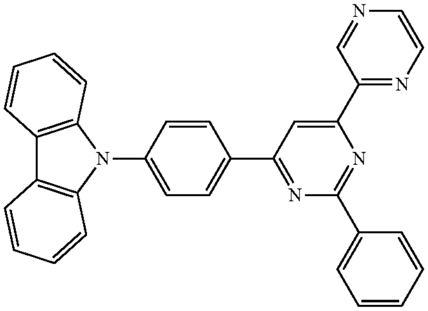
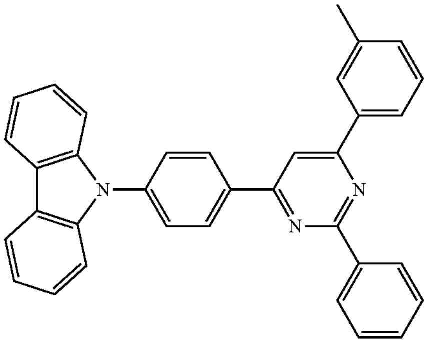
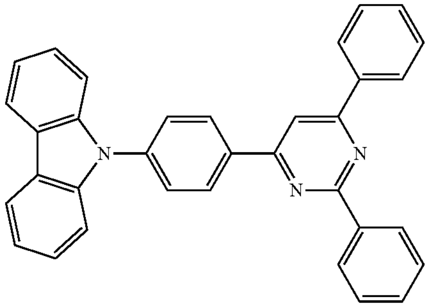
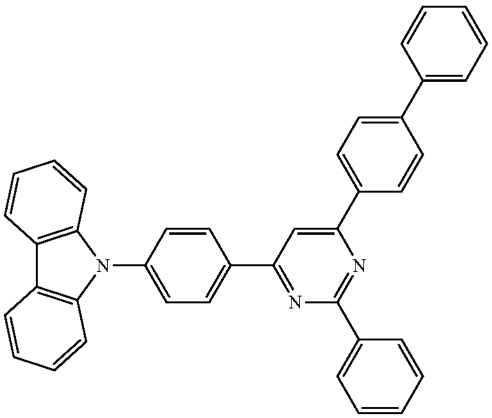
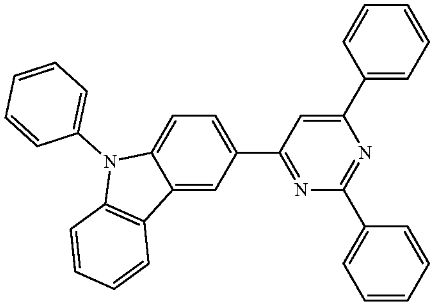
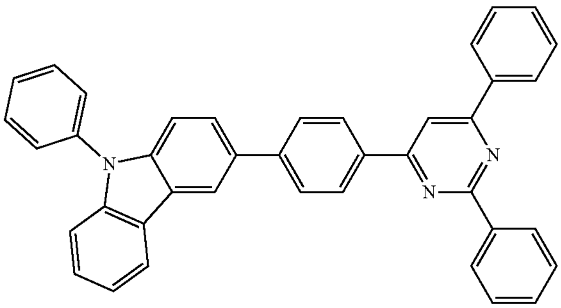
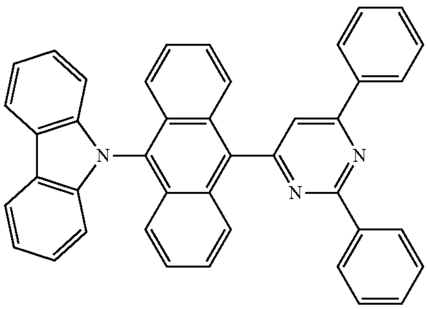

-continued
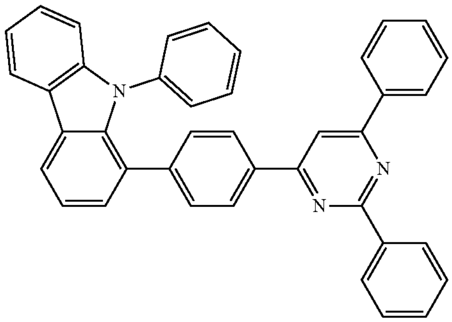
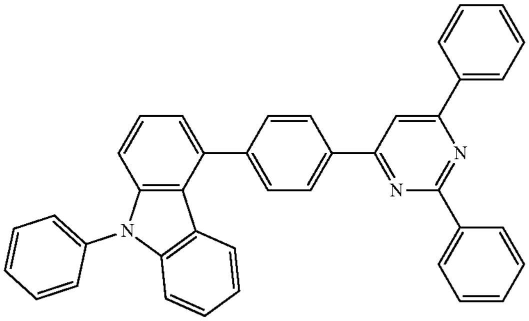
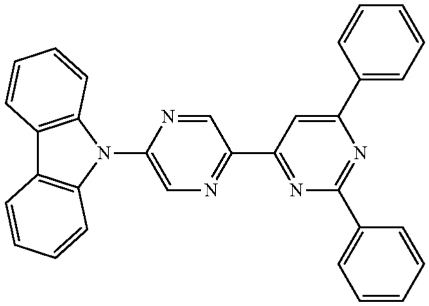
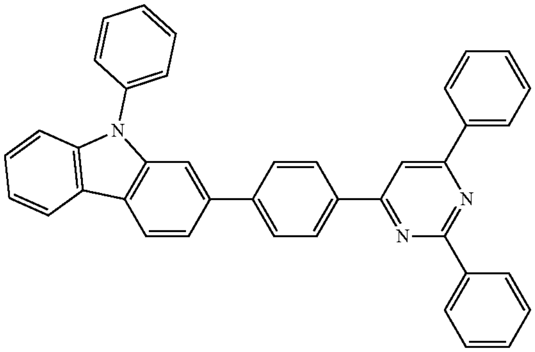
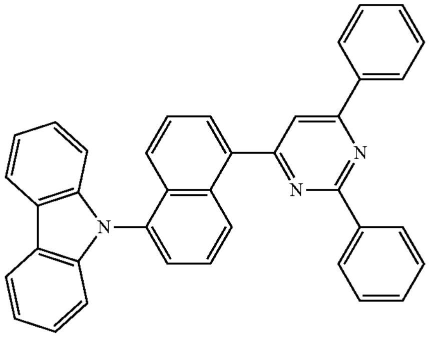
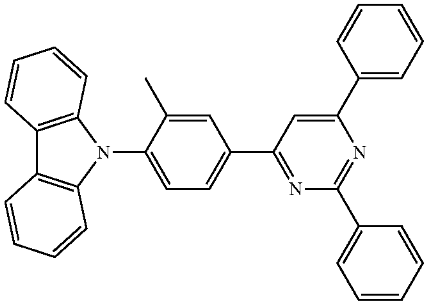
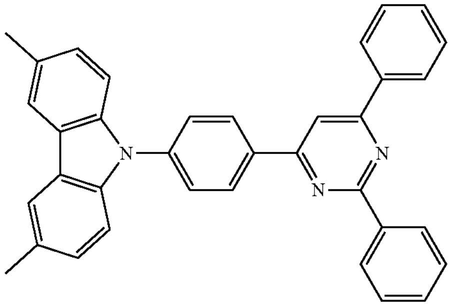
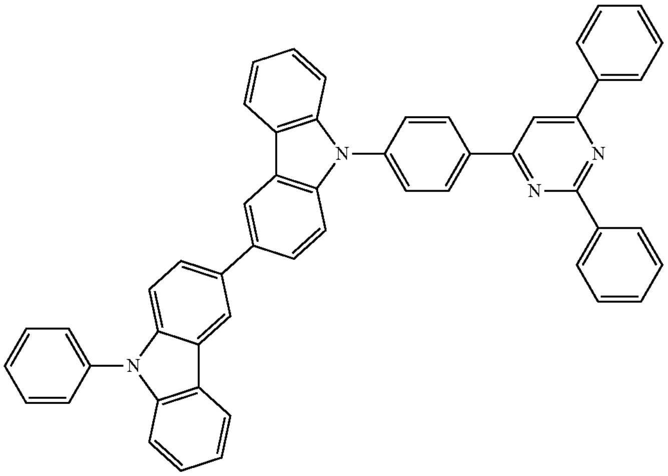

-continued
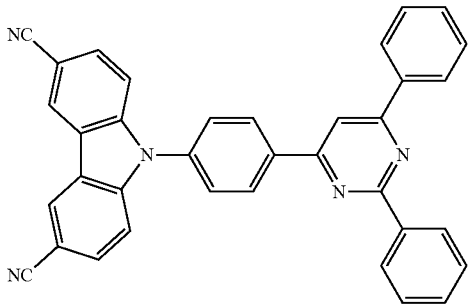
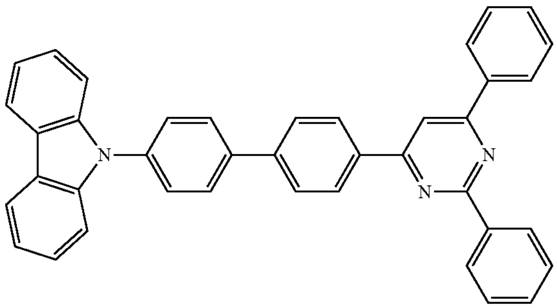
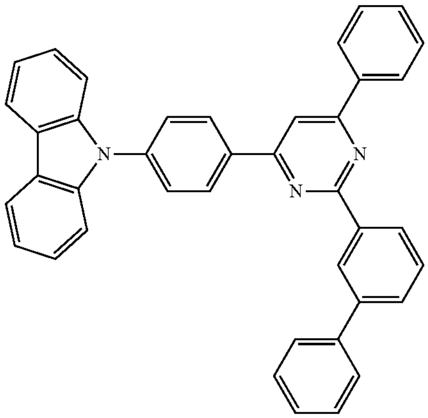
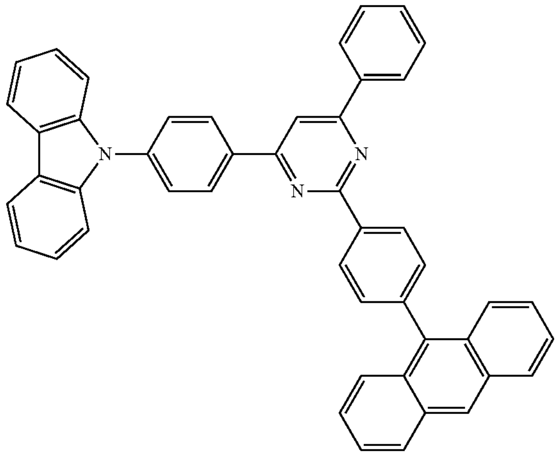
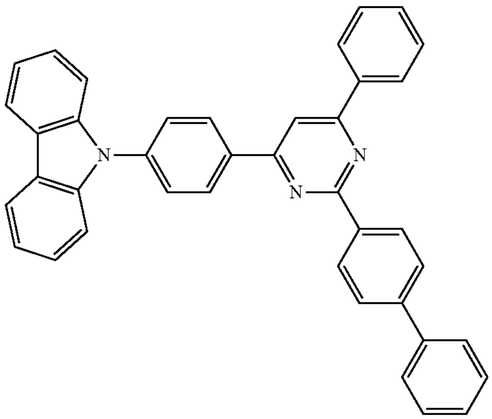
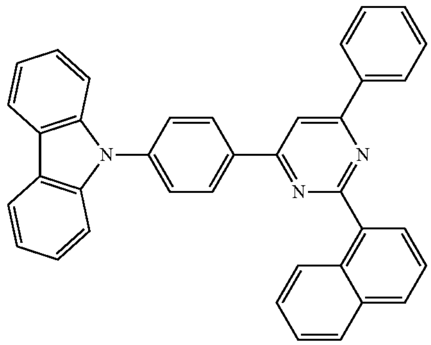
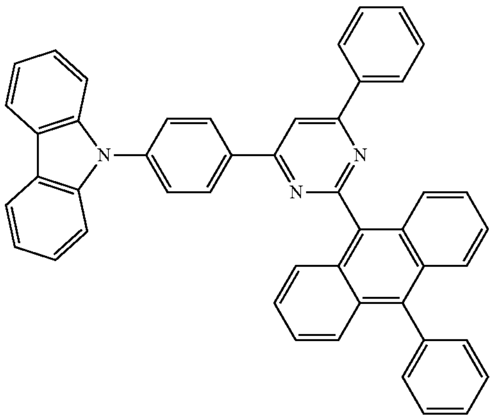
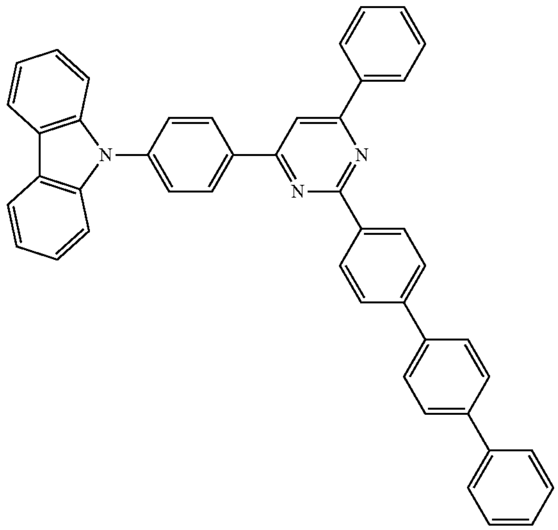

-continued
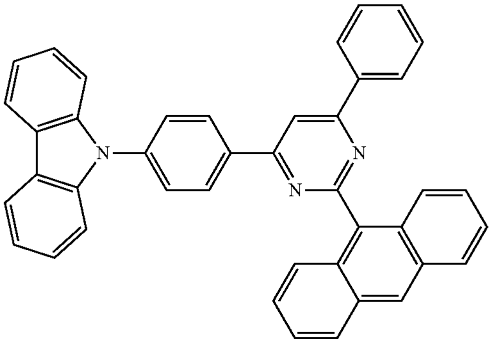
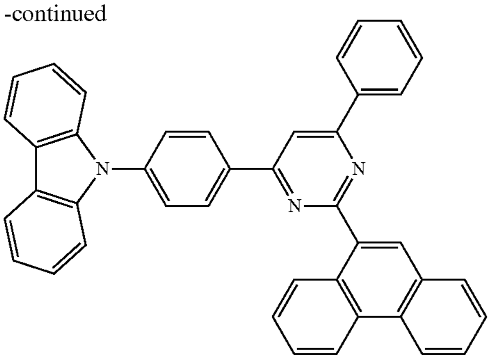
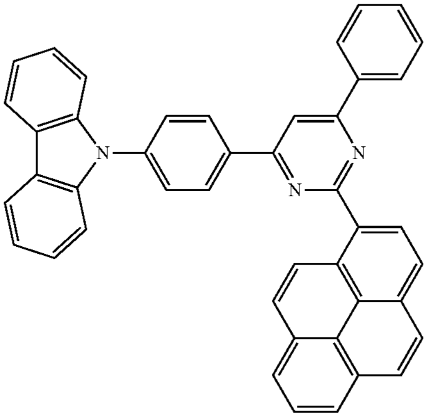
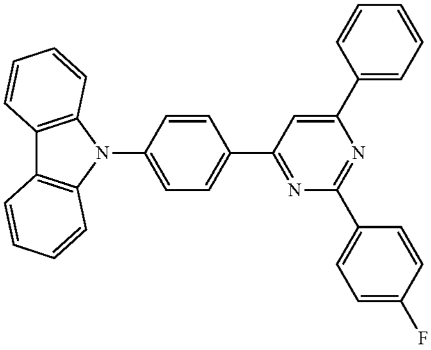
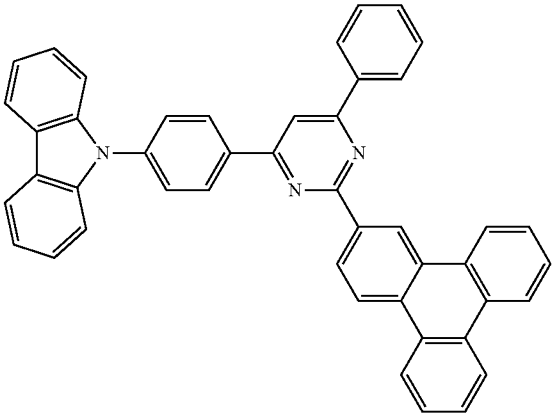
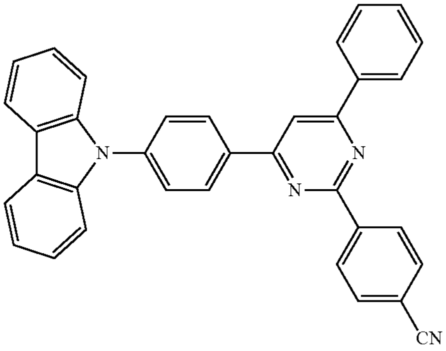
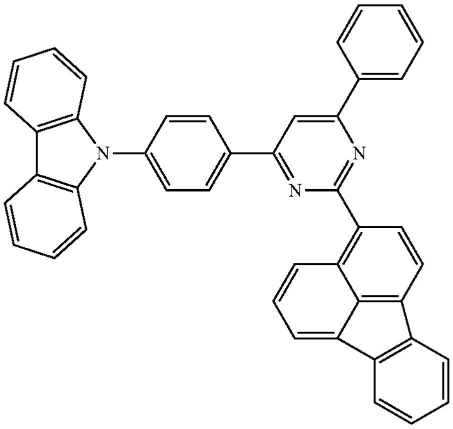

-continued
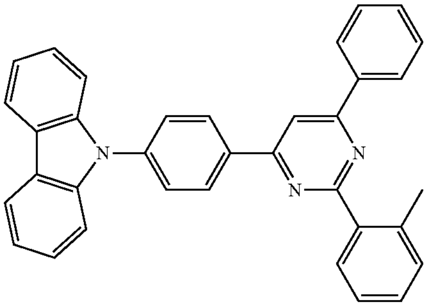
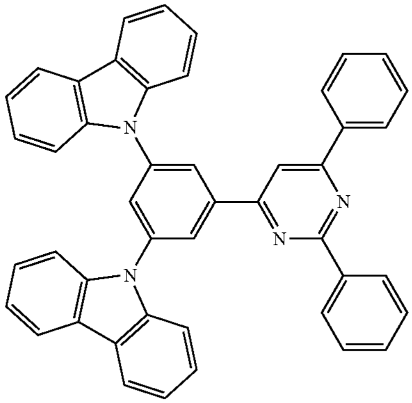
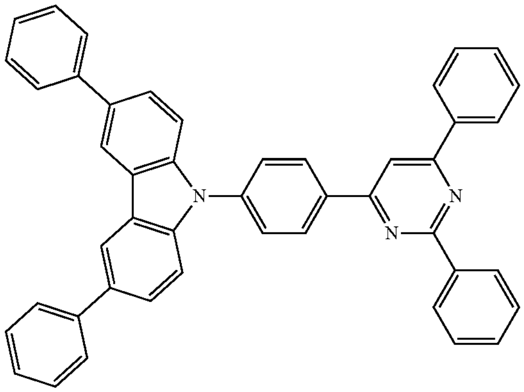
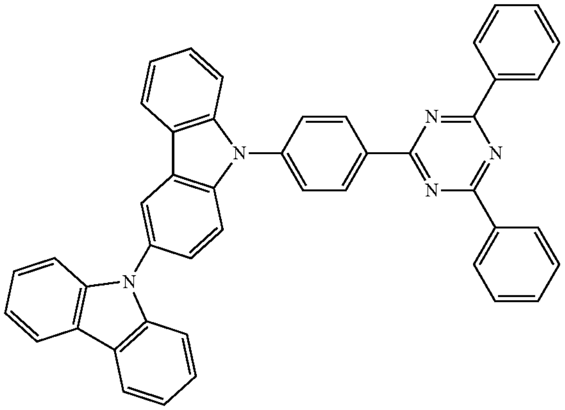
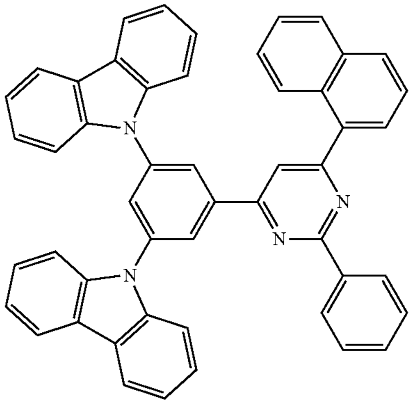
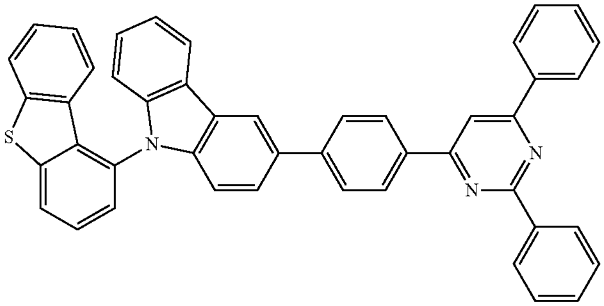
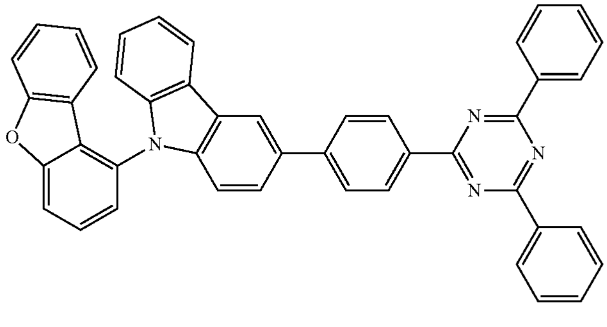
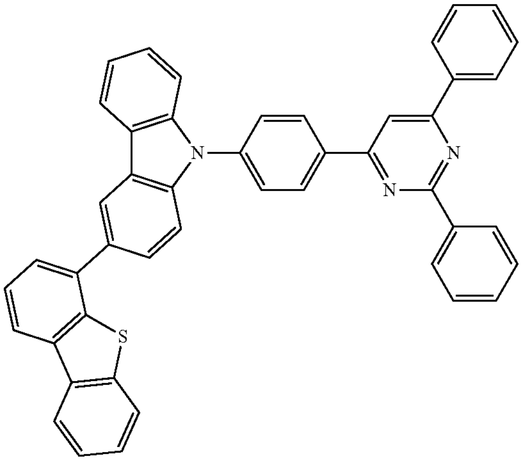

-continued
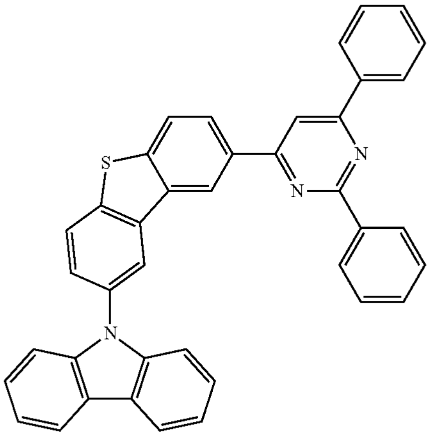
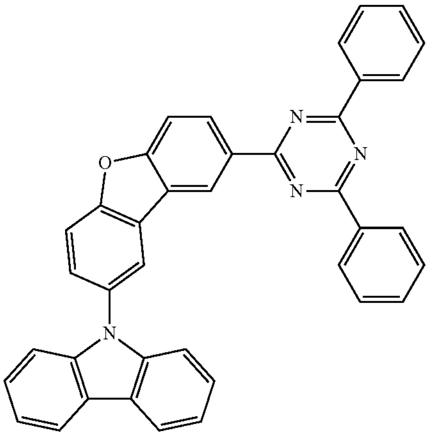
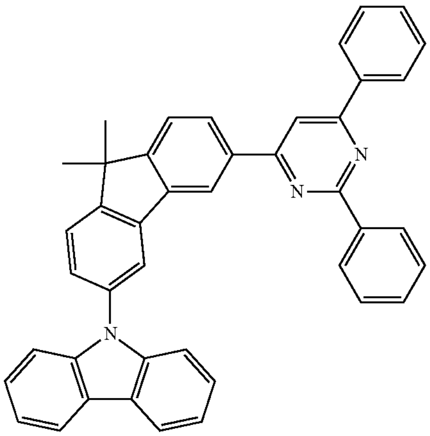
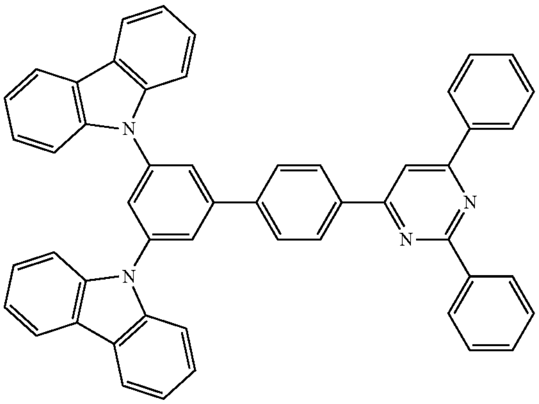
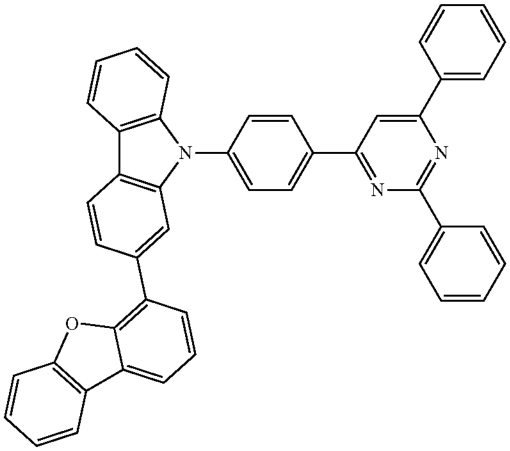
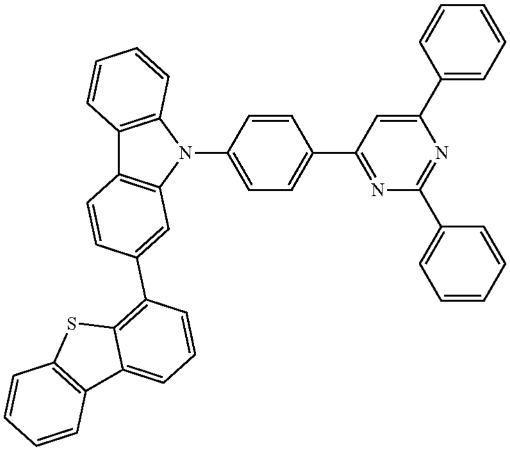

-continued
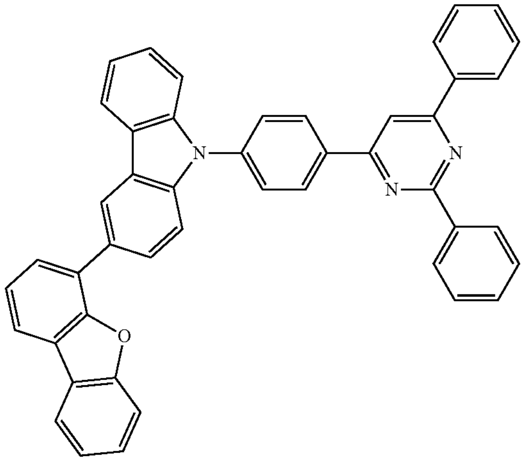
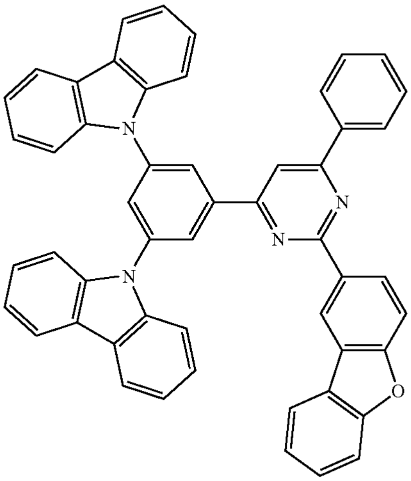
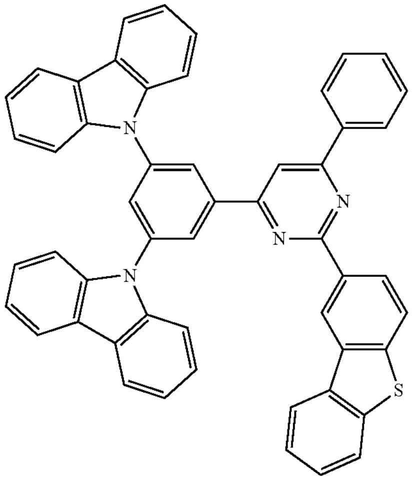
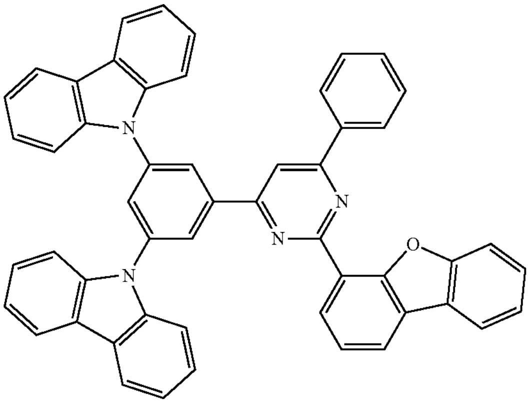
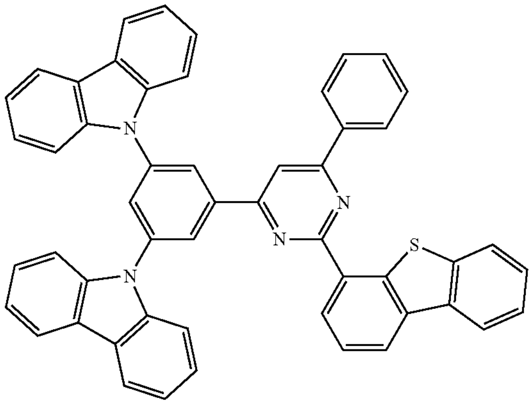
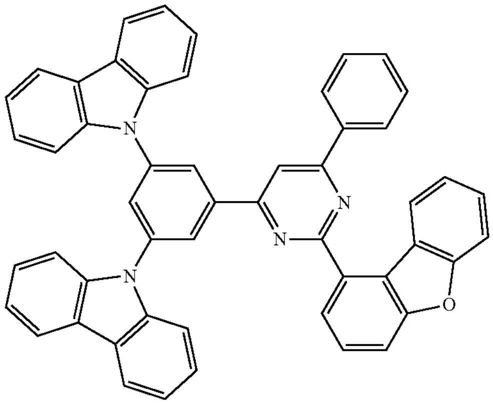

-continued
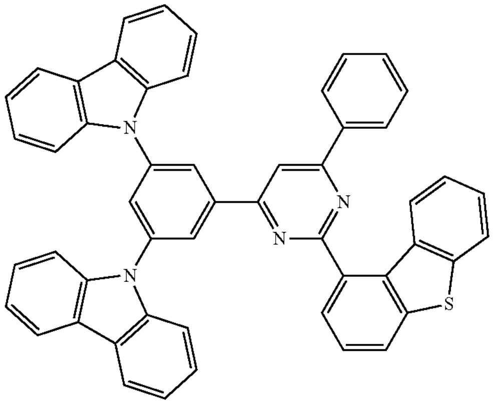
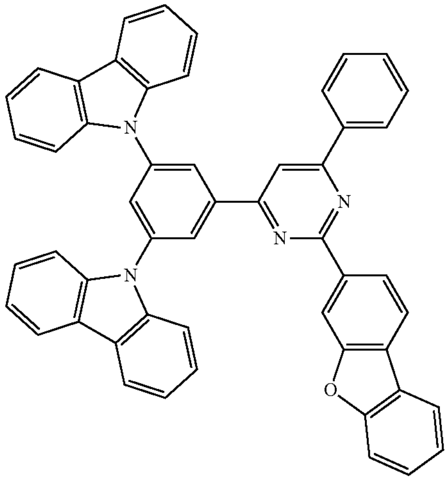
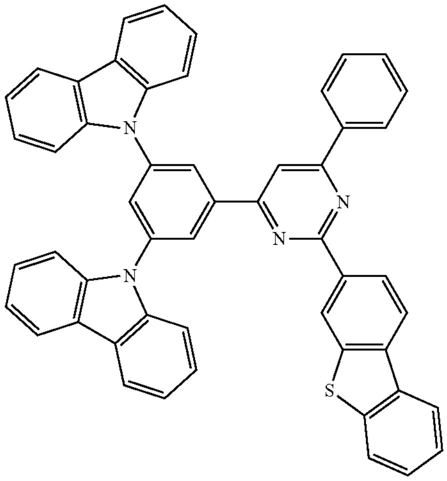
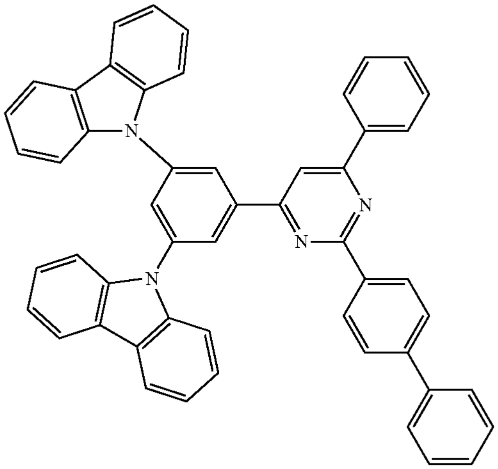
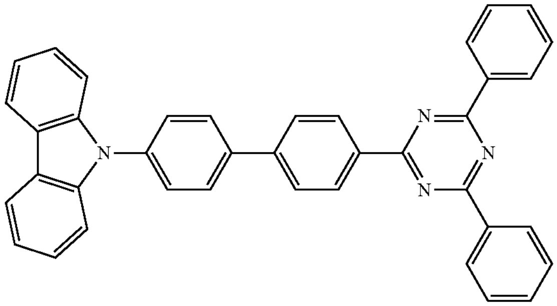
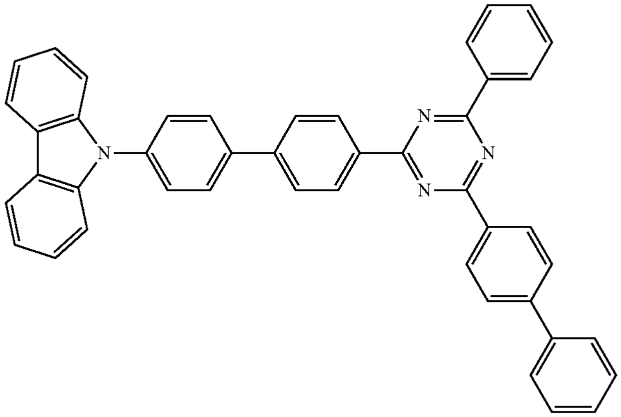

-continued
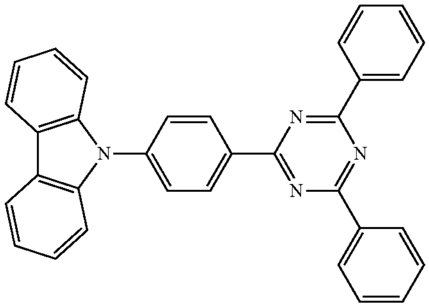
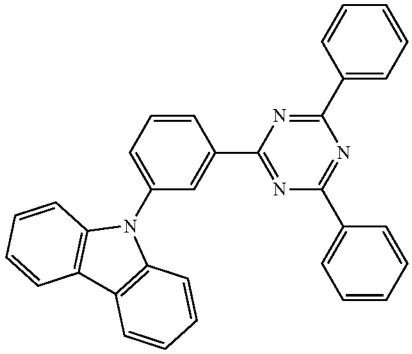
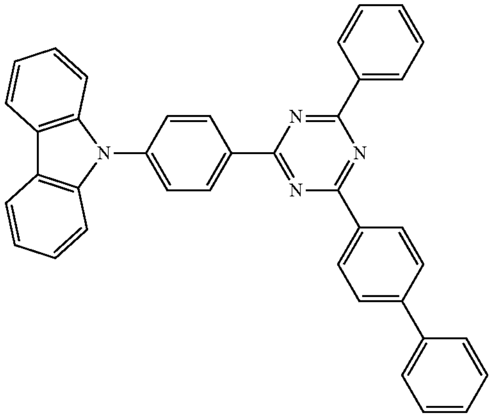
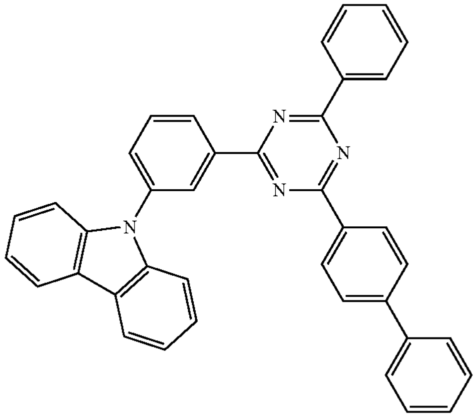
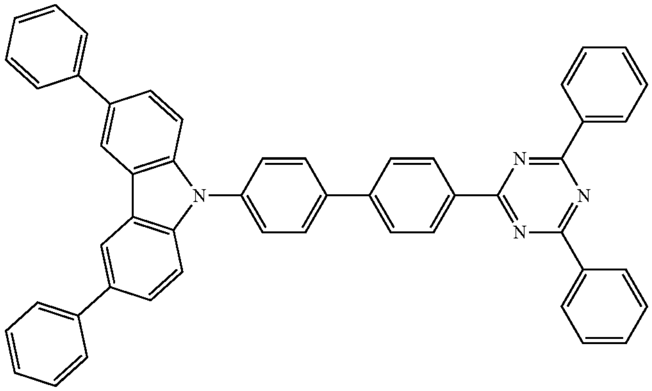
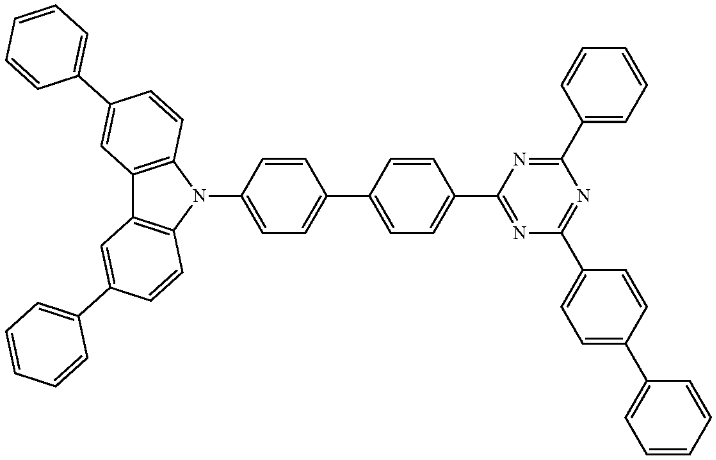

-continued
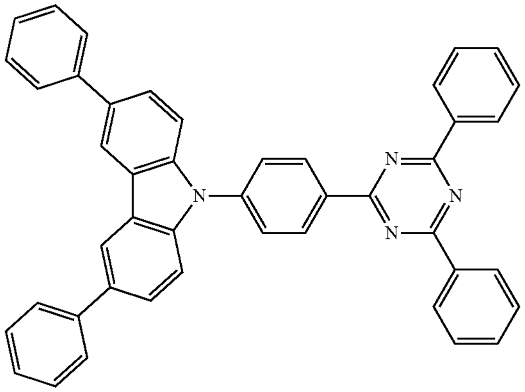
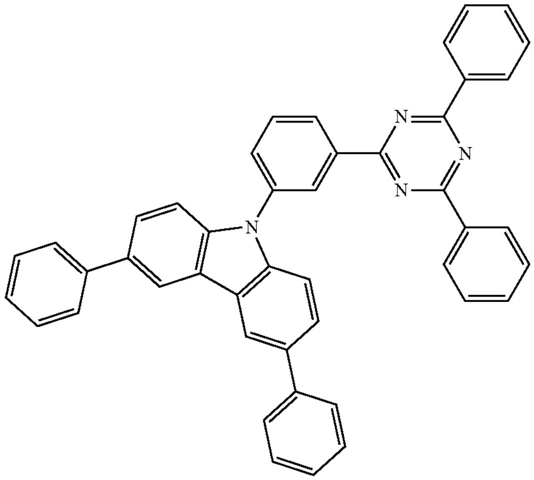
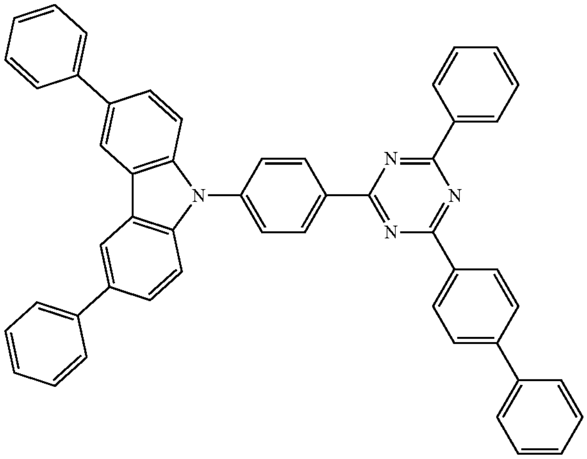
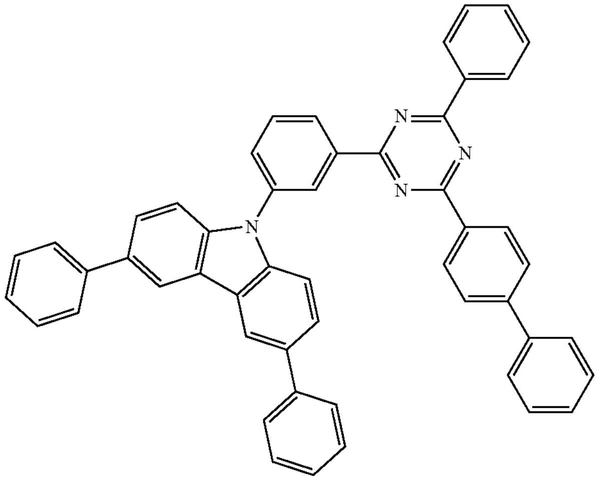
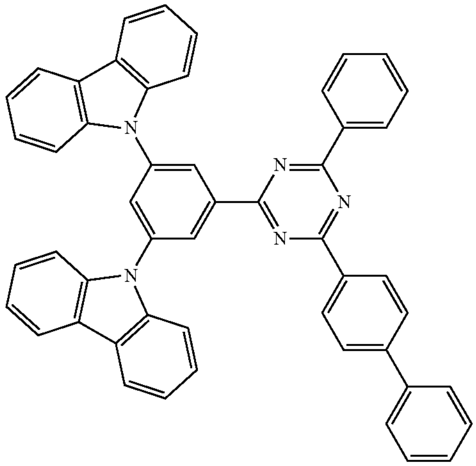

-continued
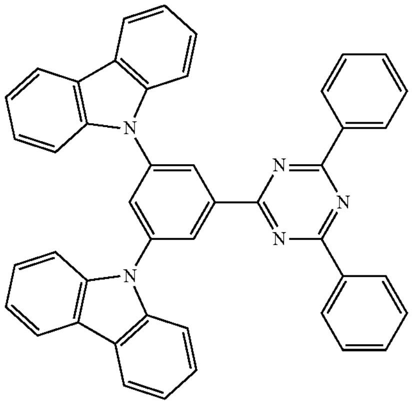
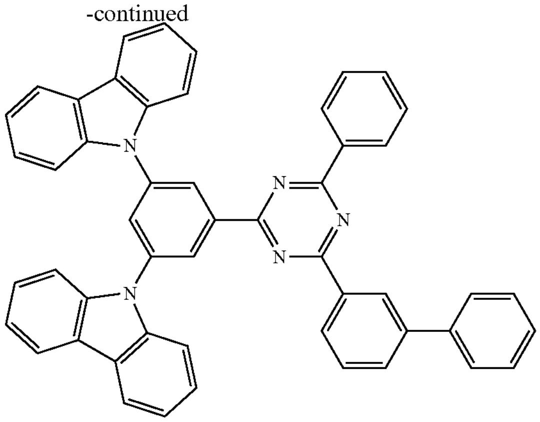
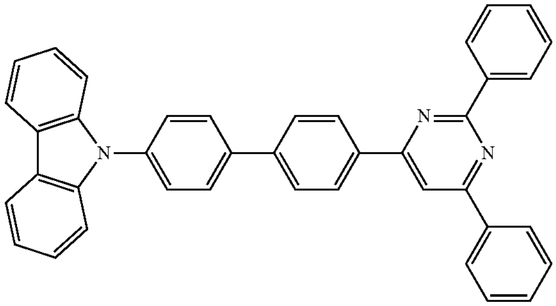
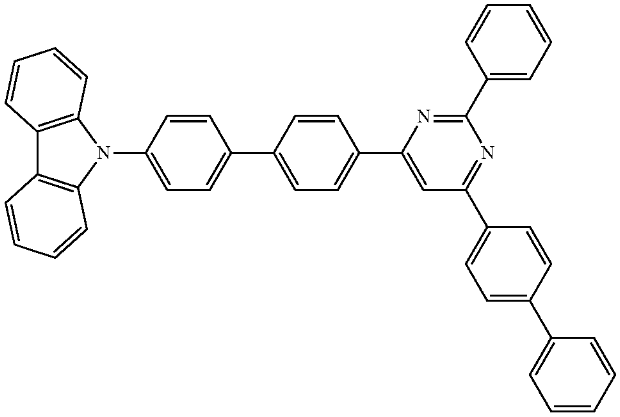
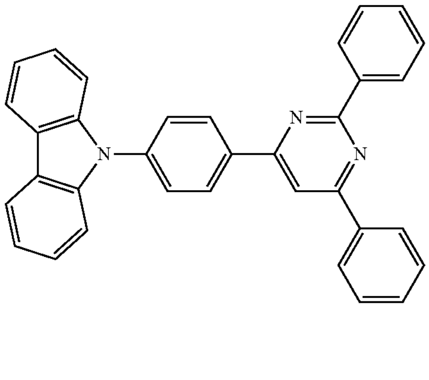
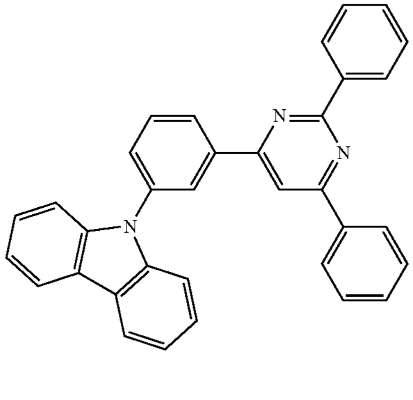

-continued
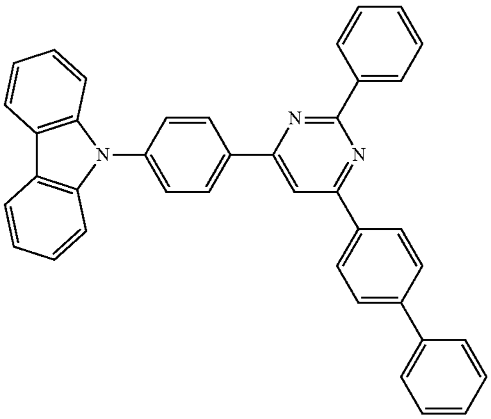
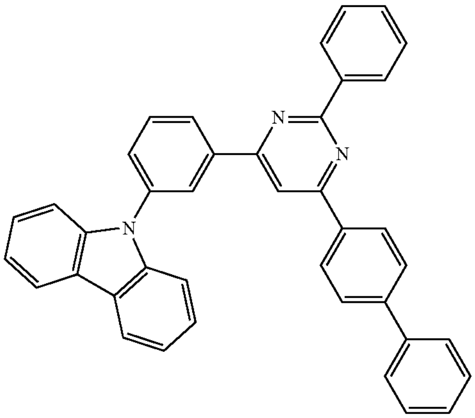
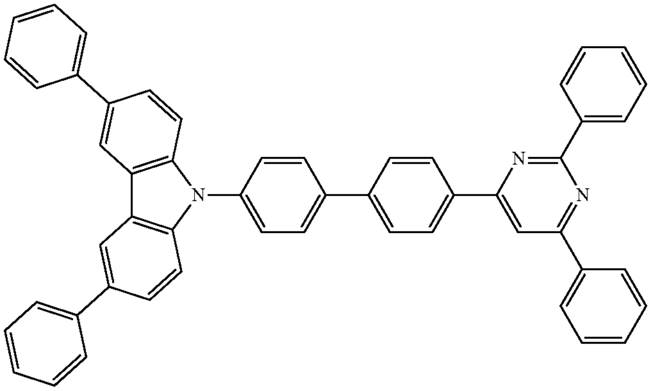
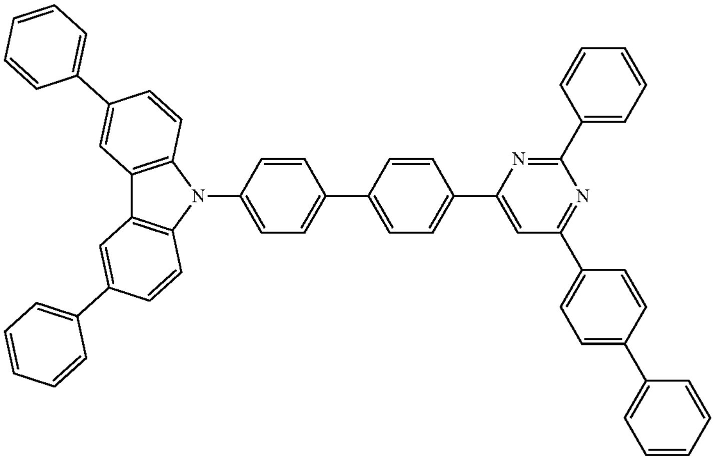

-continued
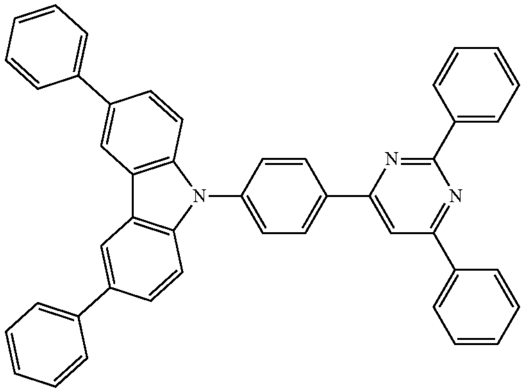
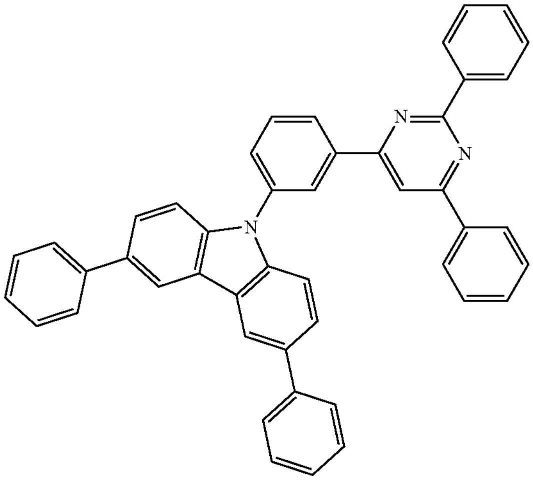
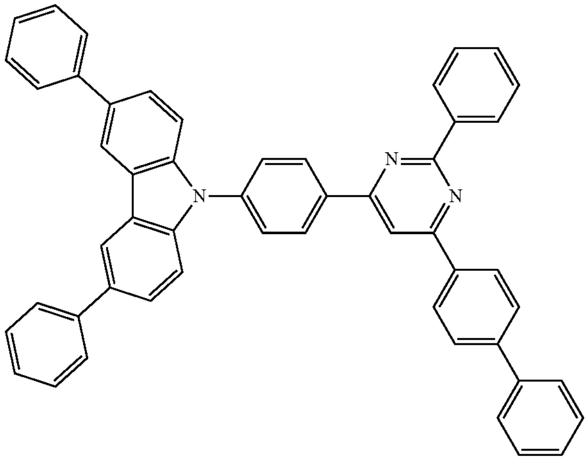
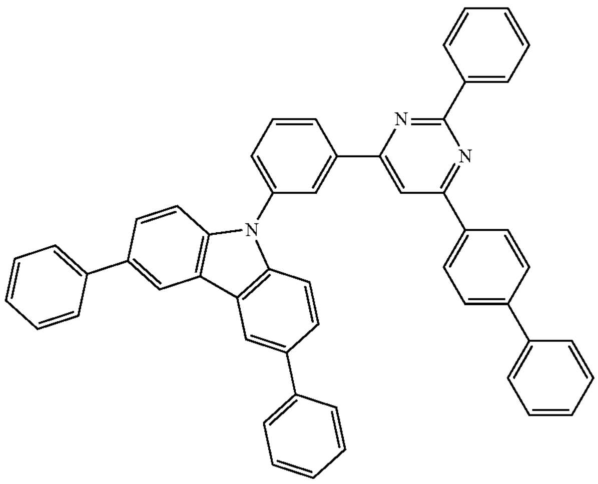
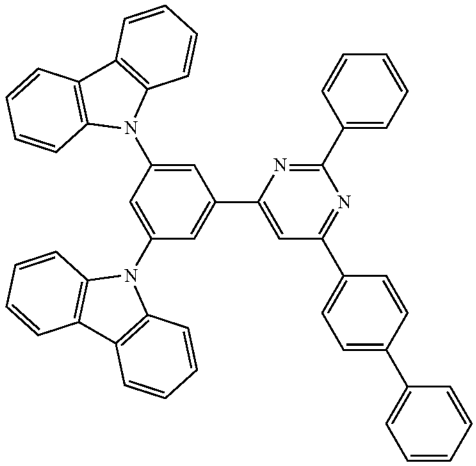

-continued
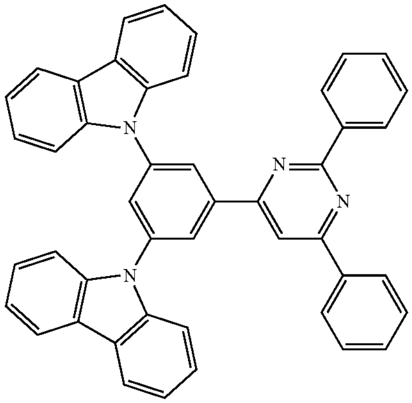
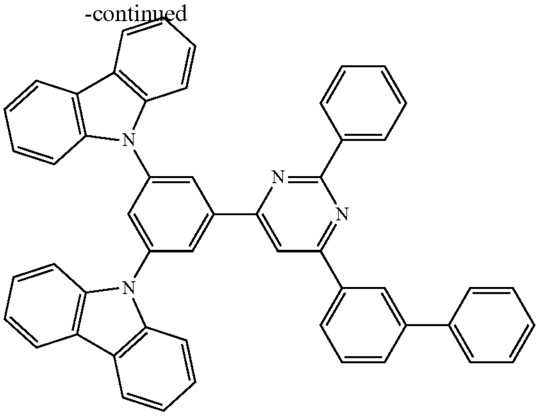
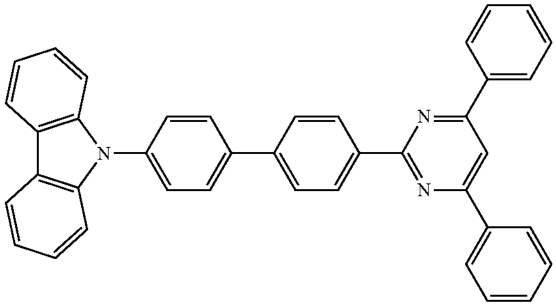
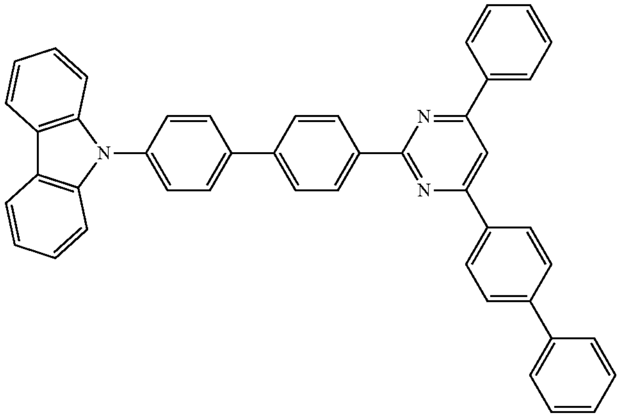
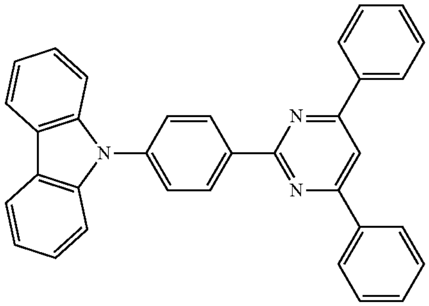
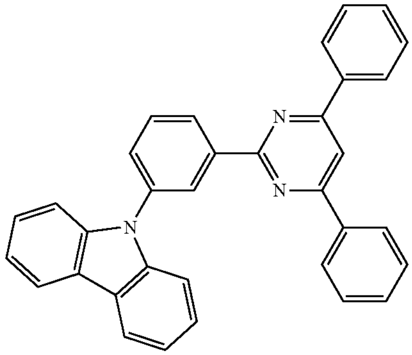

-continued
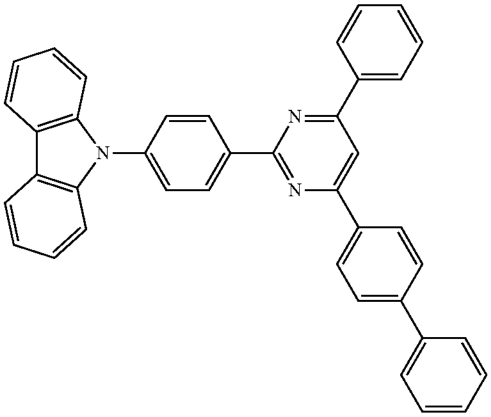
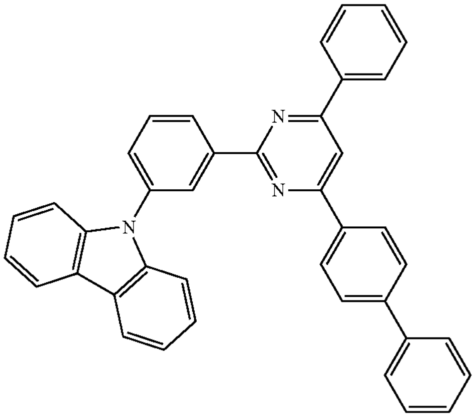
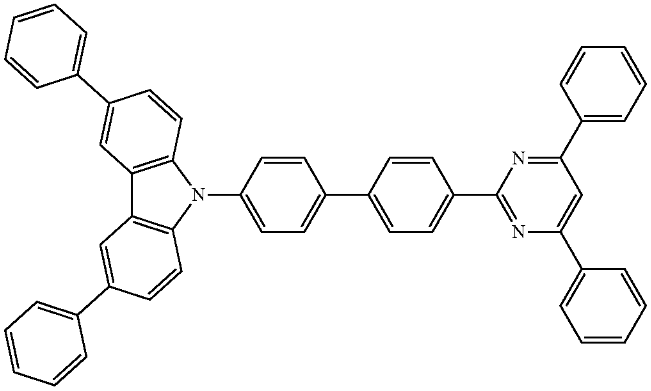
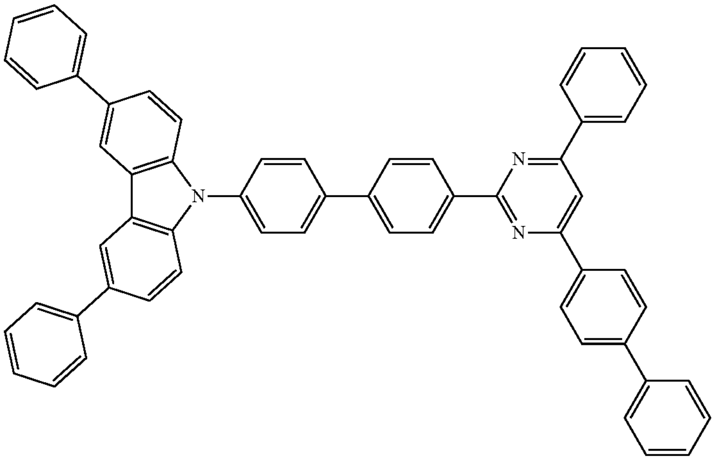

-continued
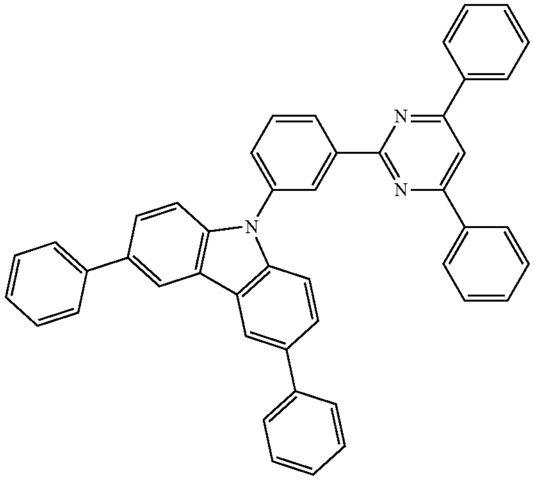
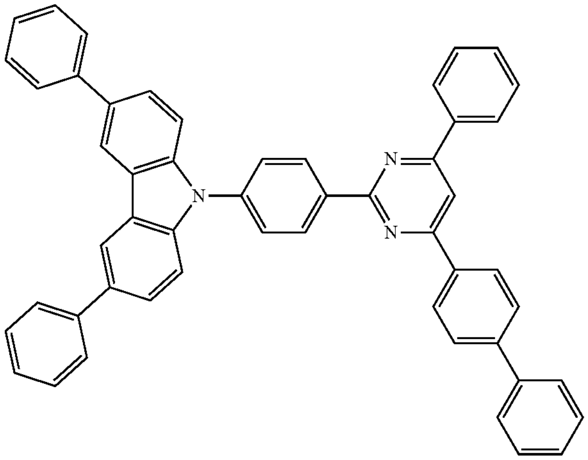
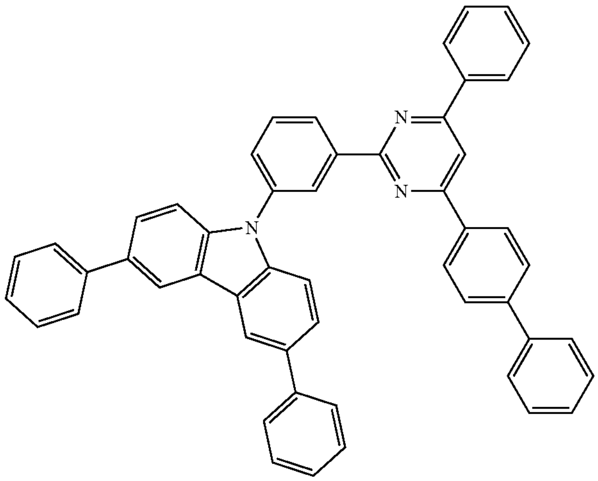
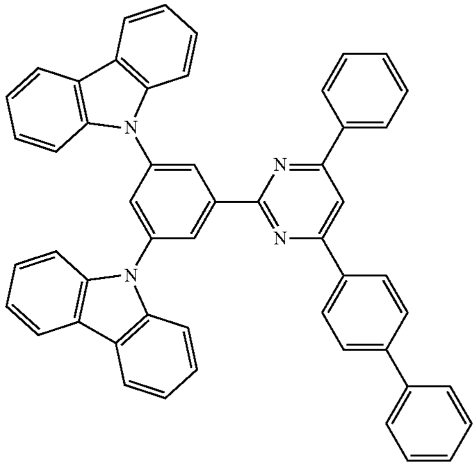
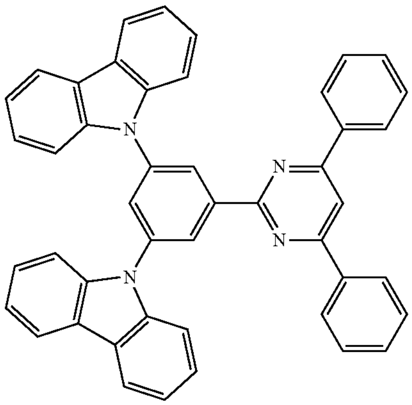
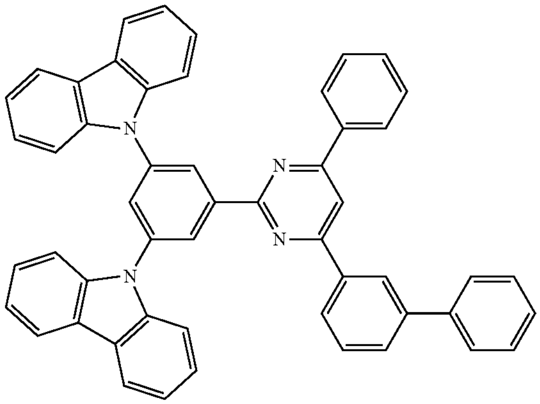

-continued
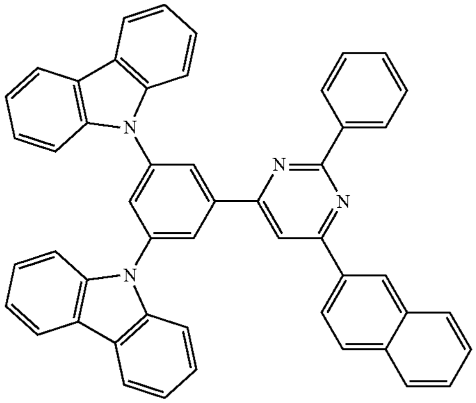
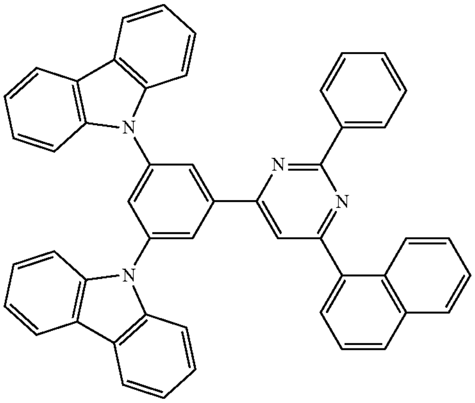
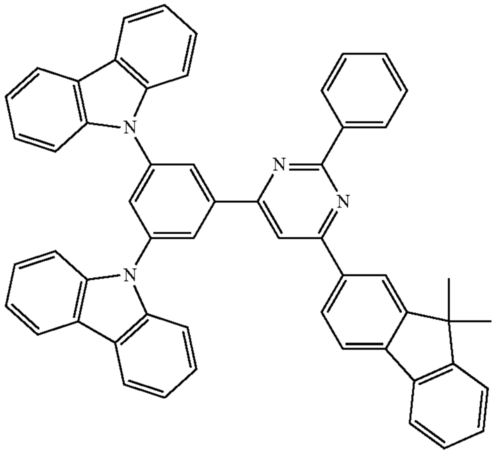
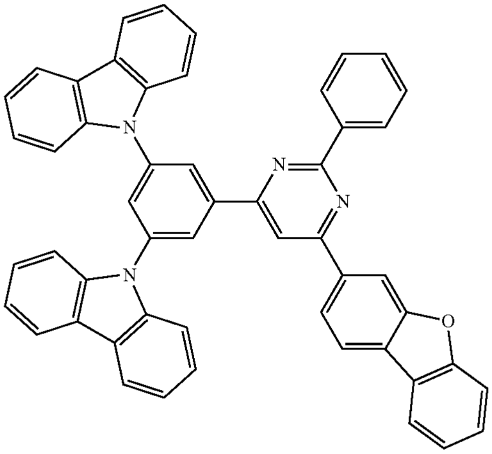
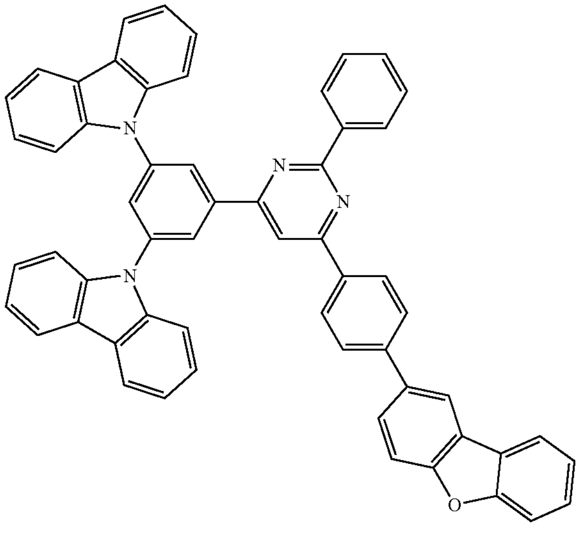
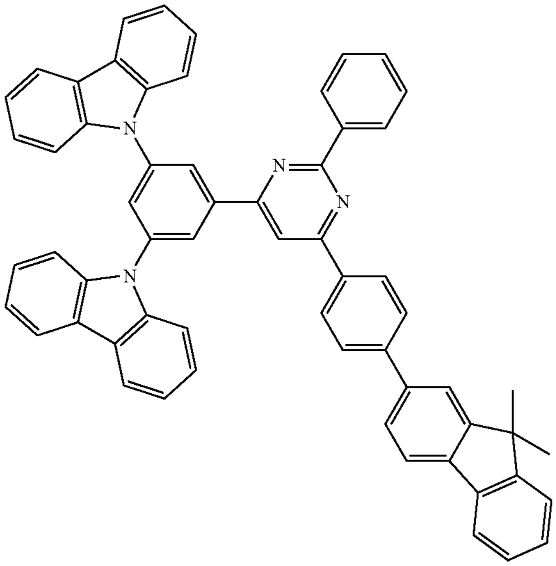

-continued
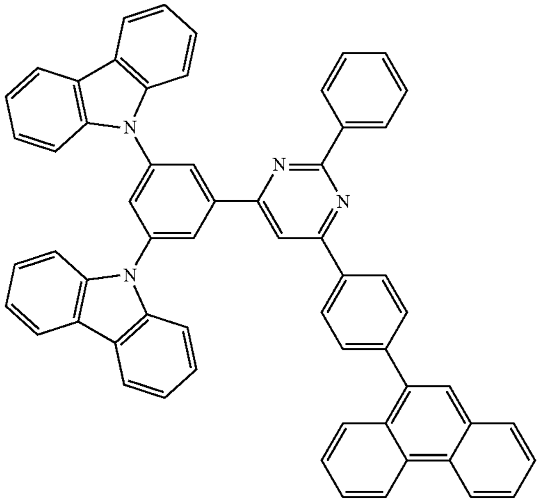
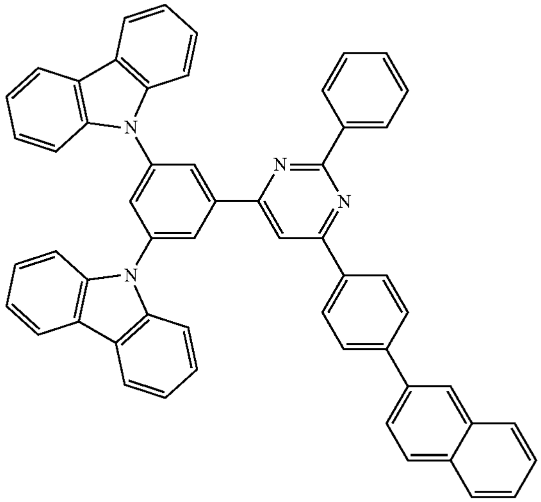
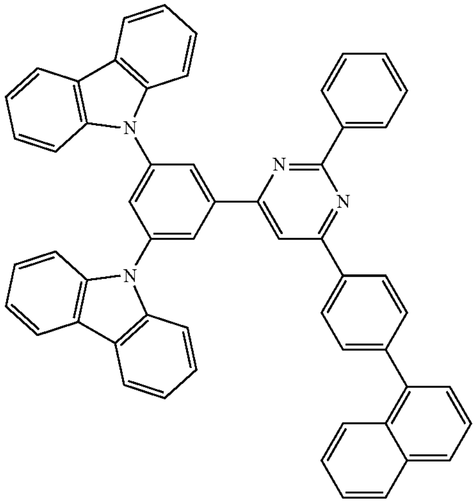
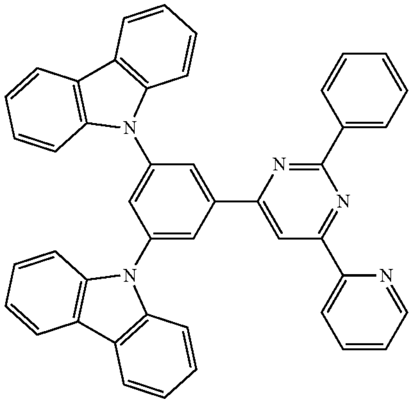
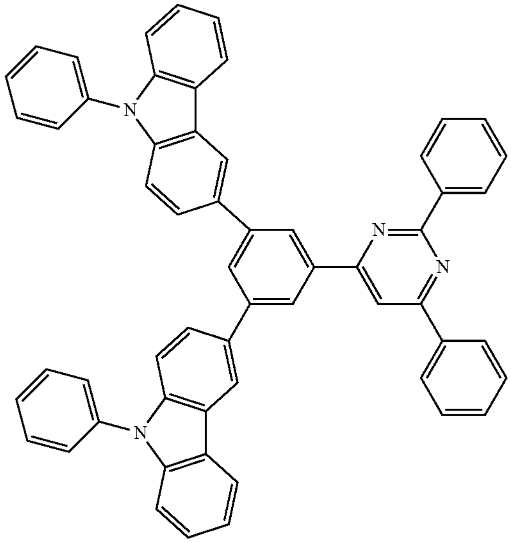
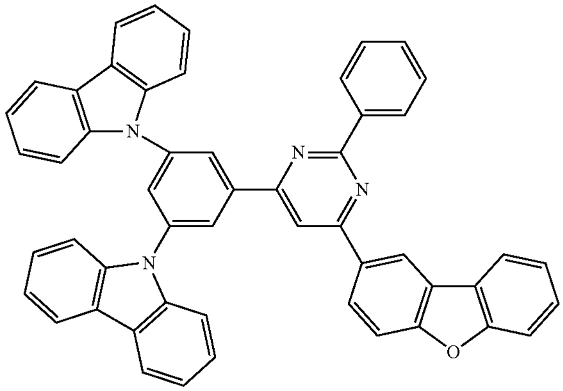

-continued
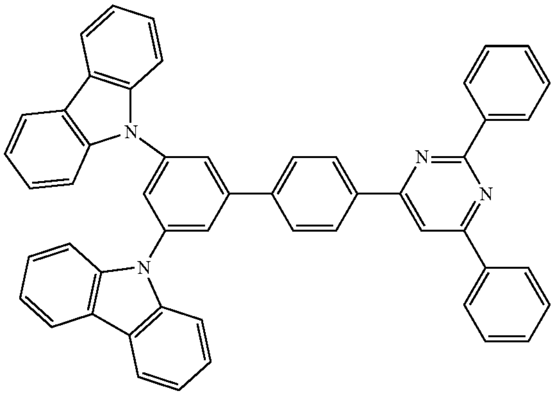
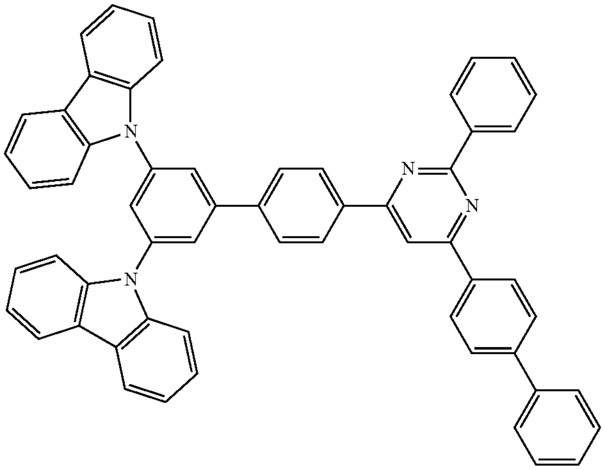
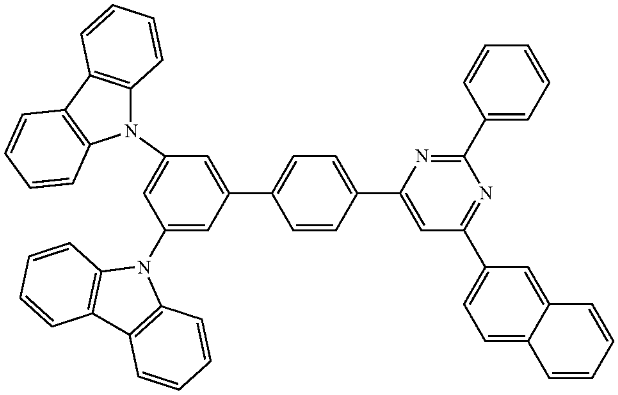
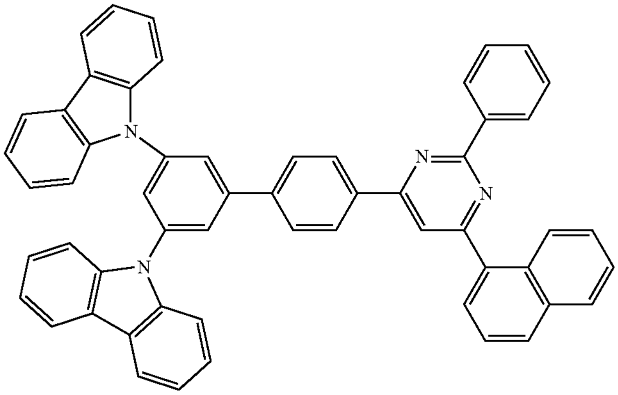

-continued
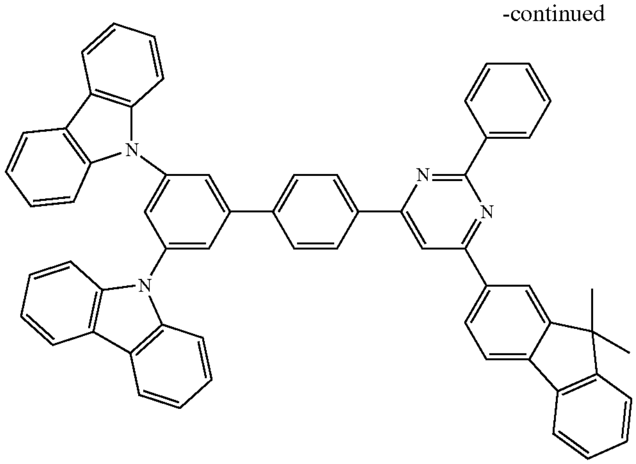
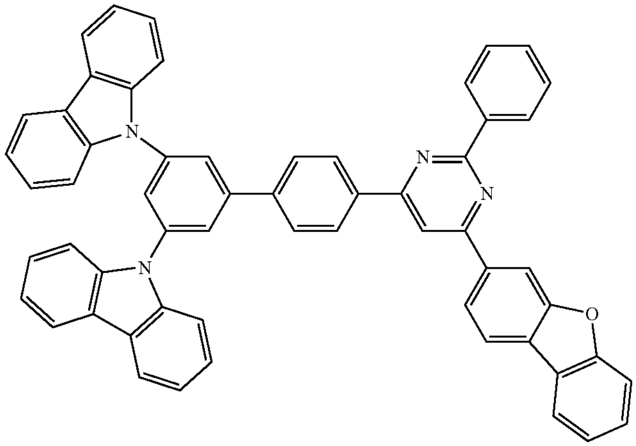
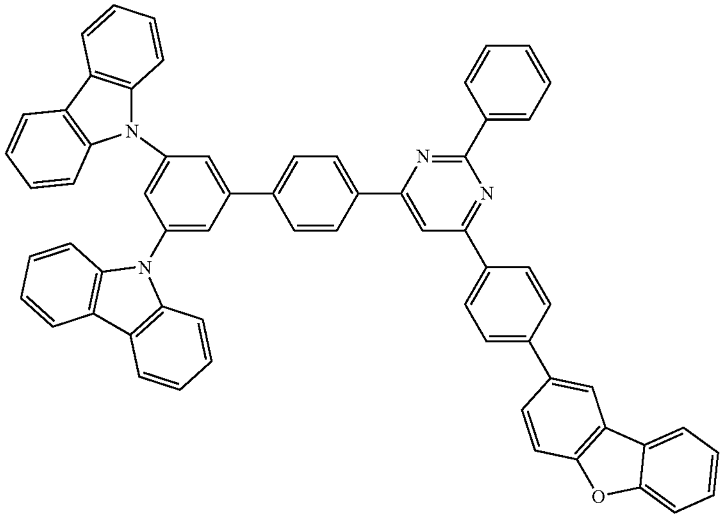

-continued
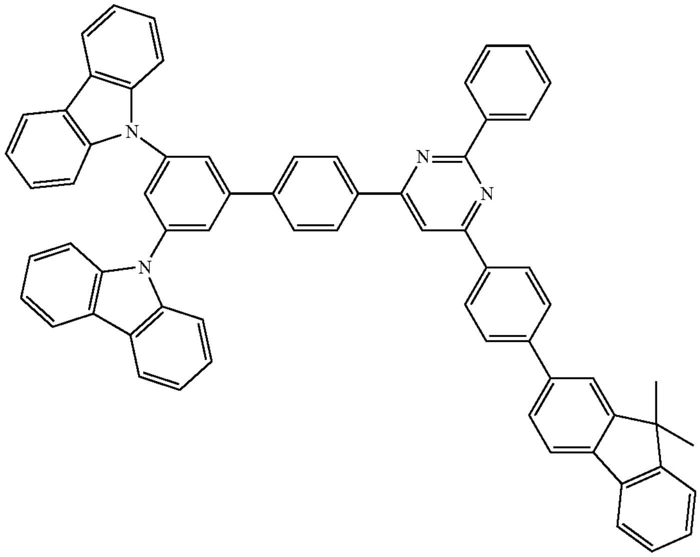
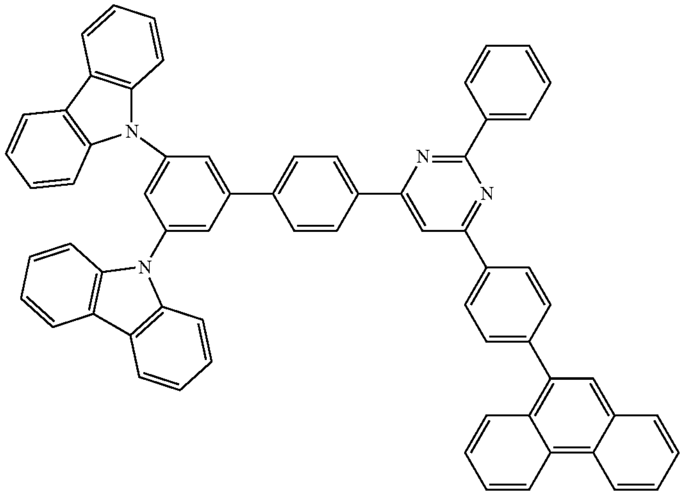
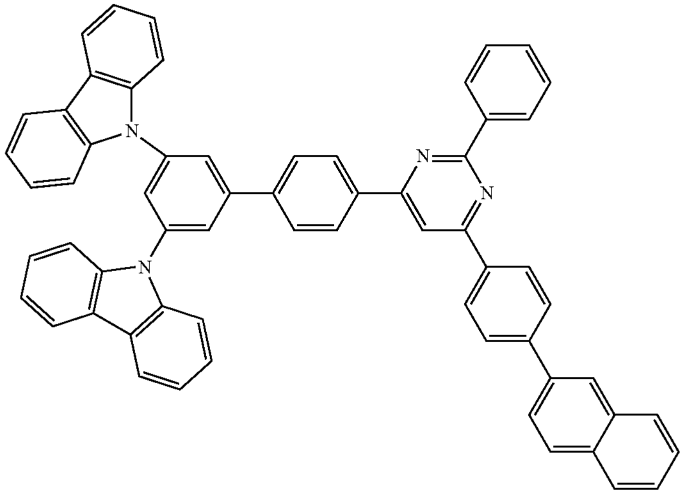

-continued
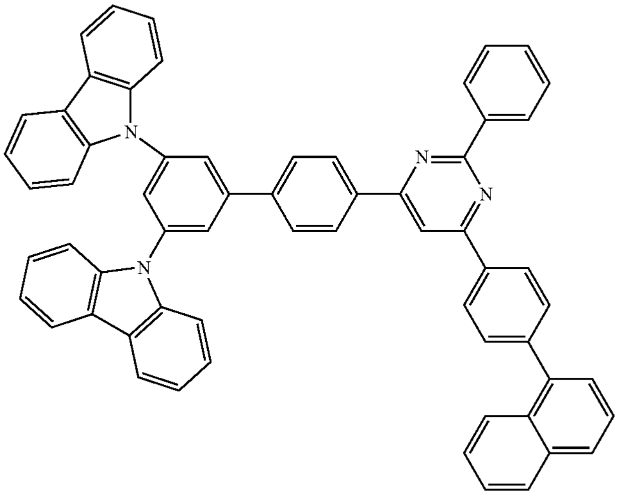
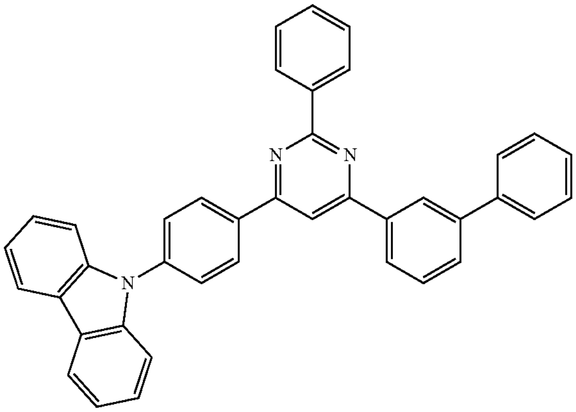
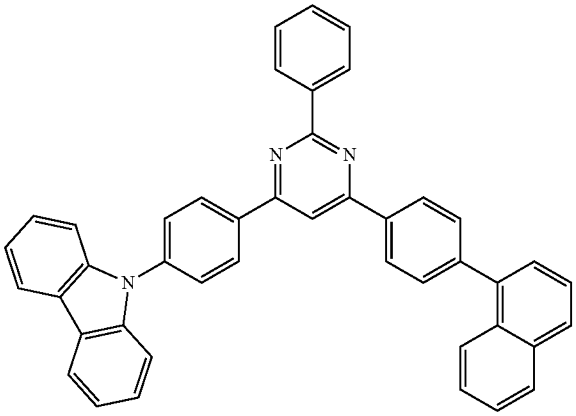
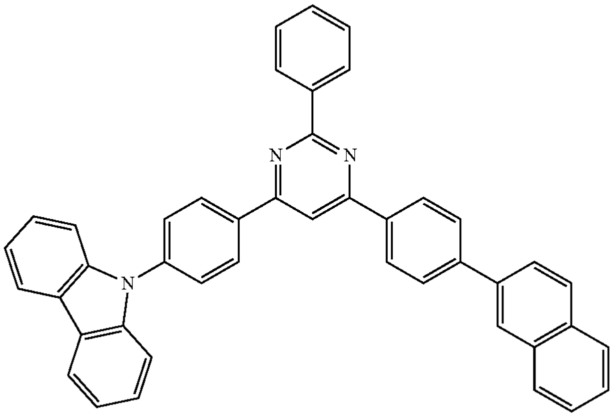
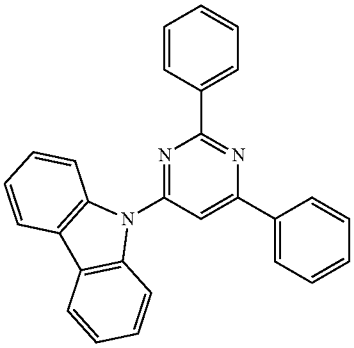
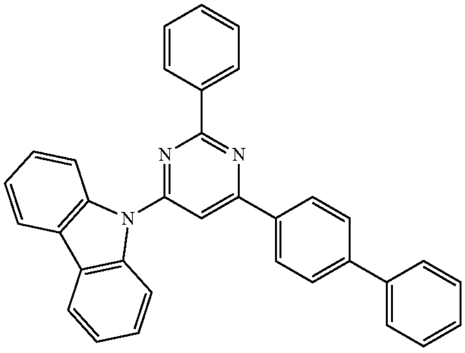
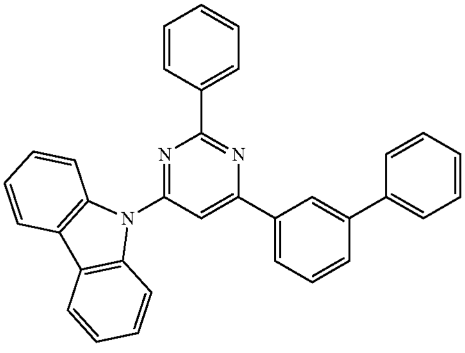

-continued
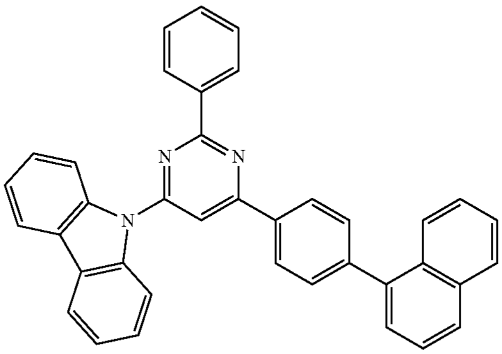
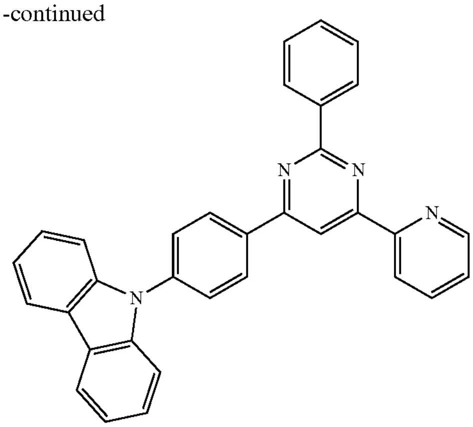
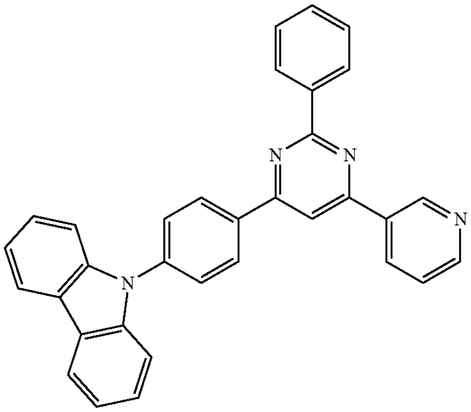
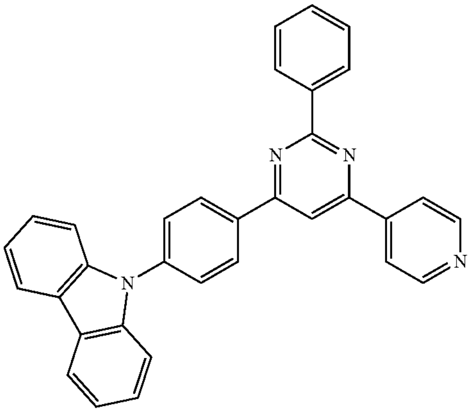
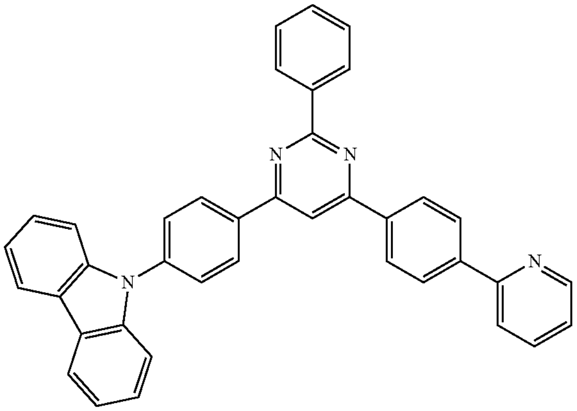
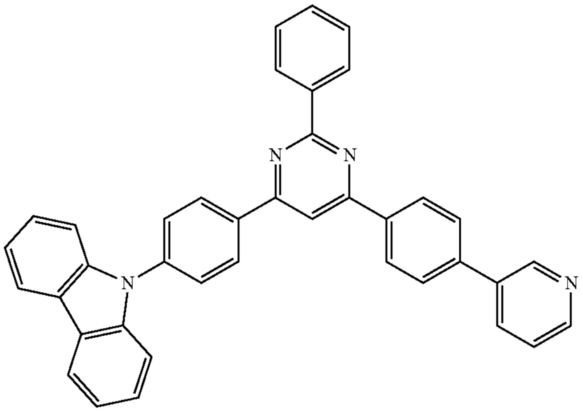

-continued
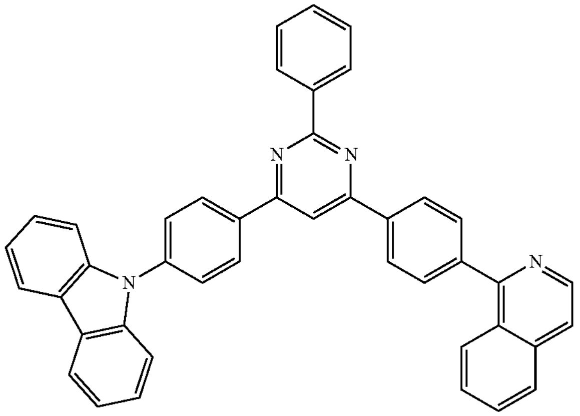
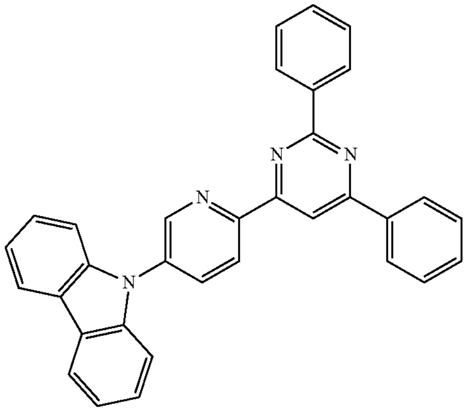
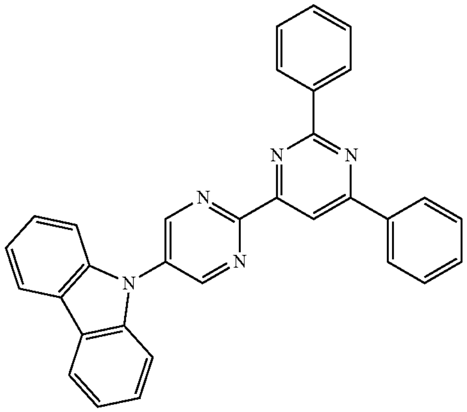
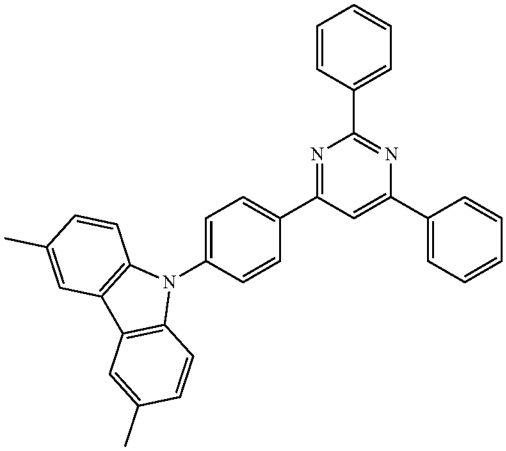
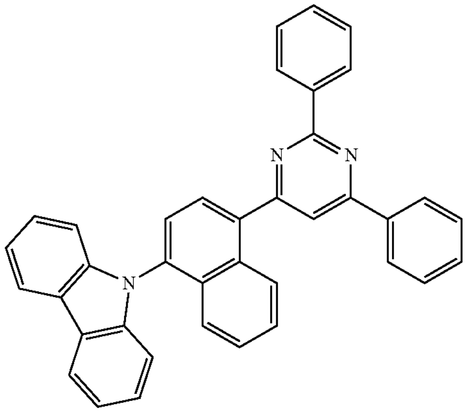
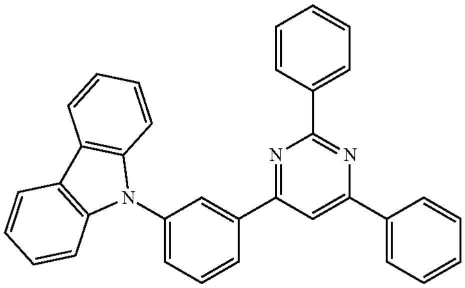
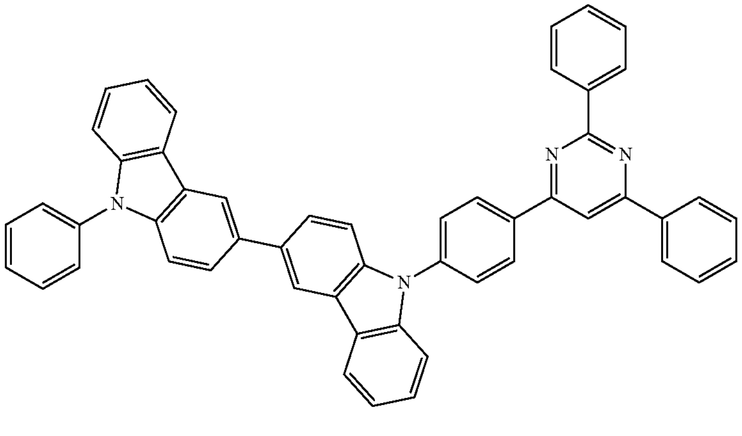

-continued
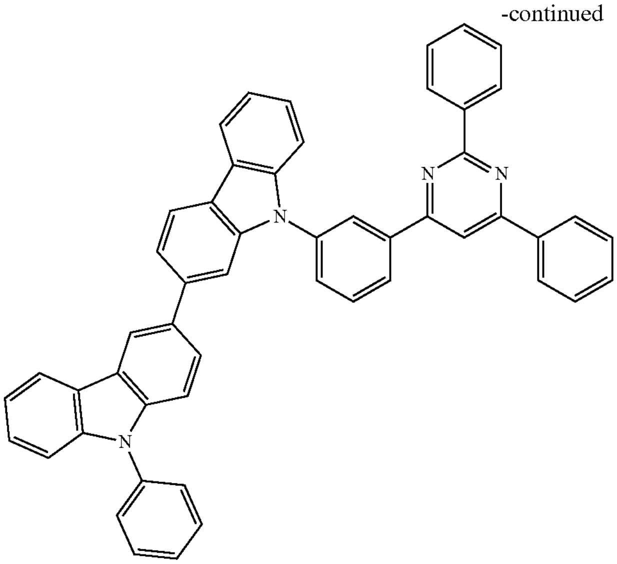
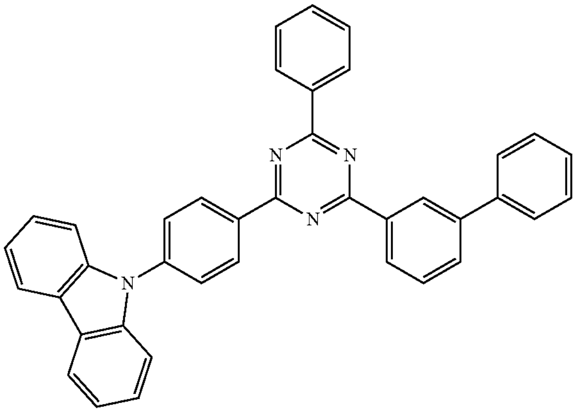
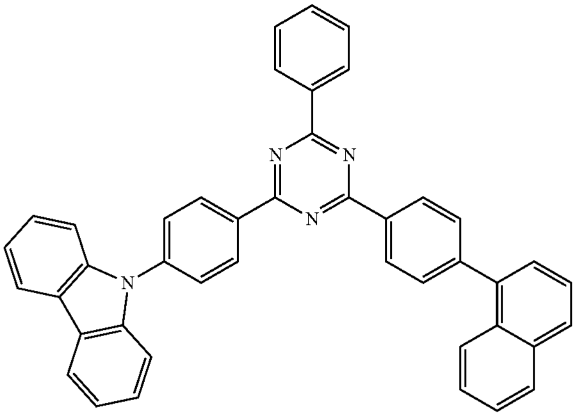
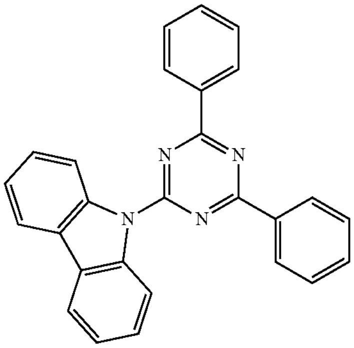
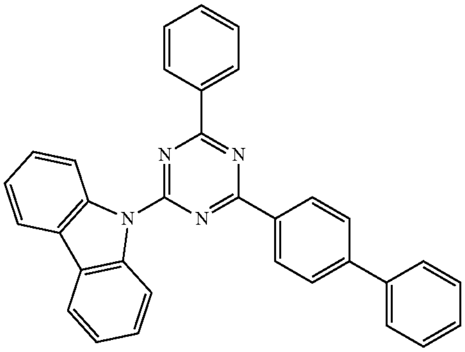
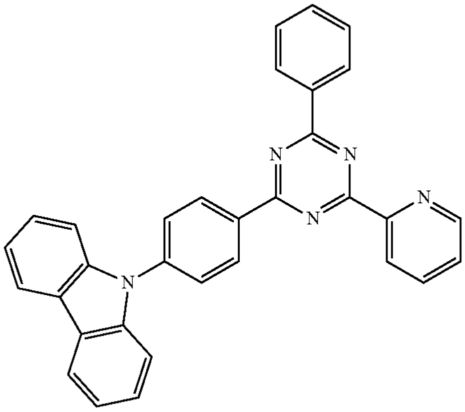
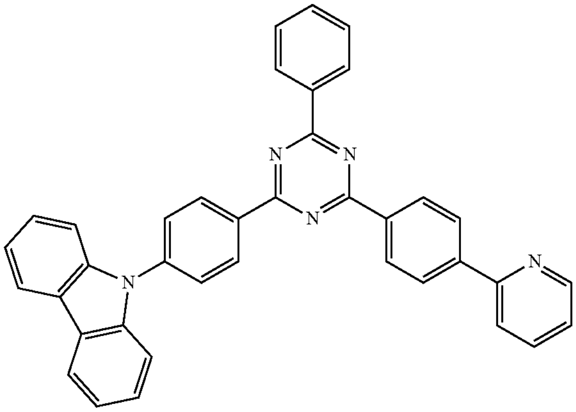

-continued
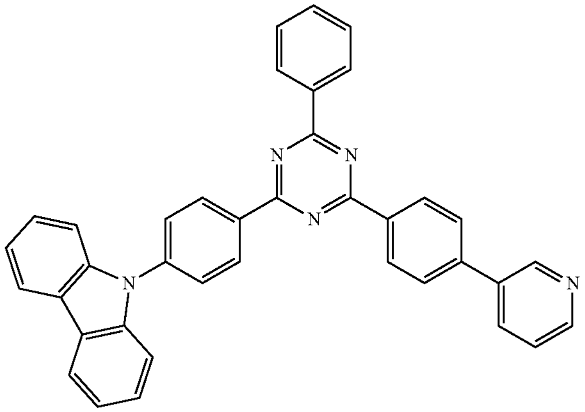
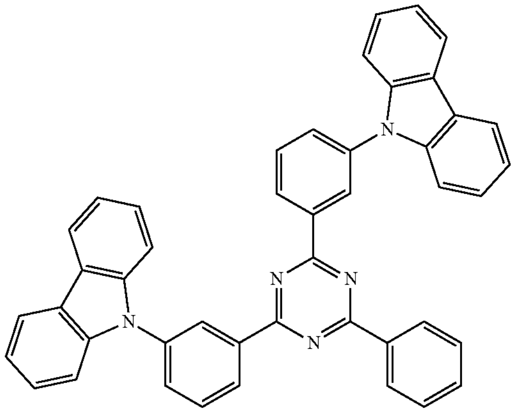
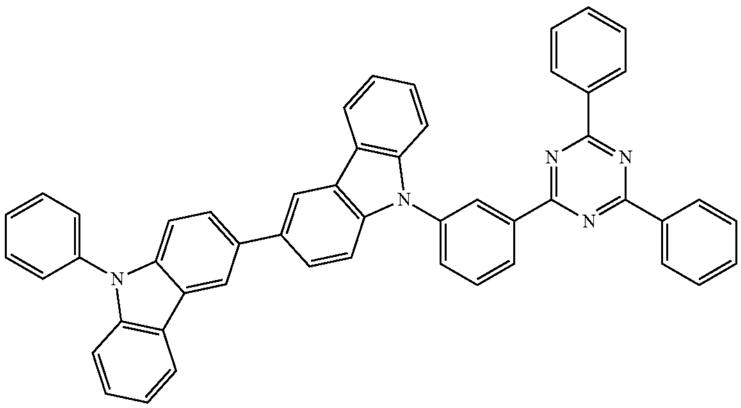
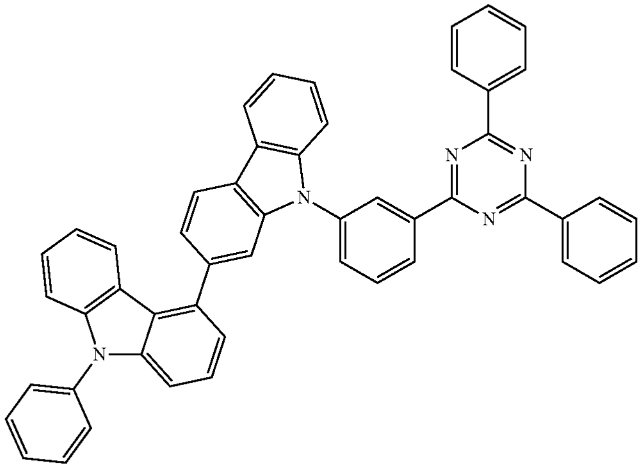

-continued
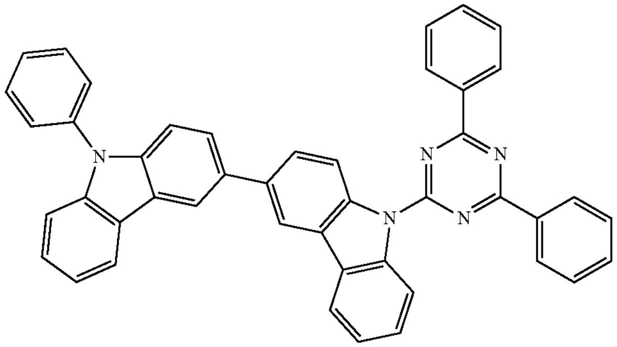
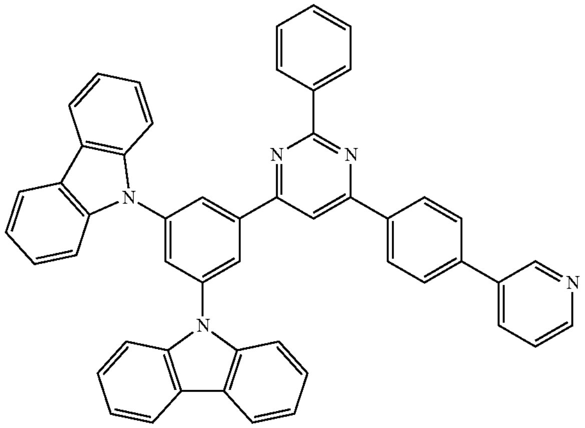
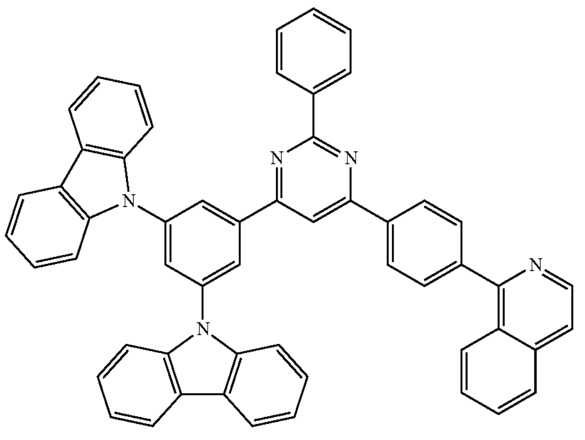
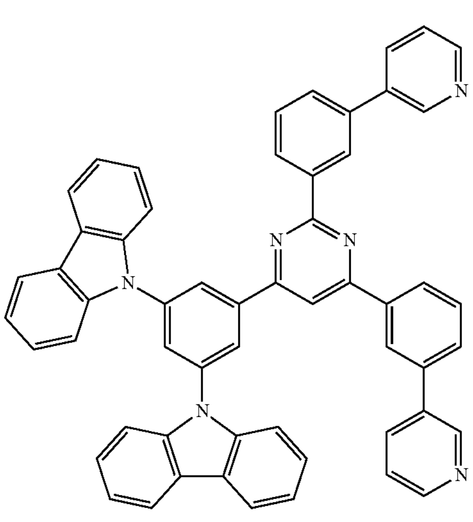

-continued

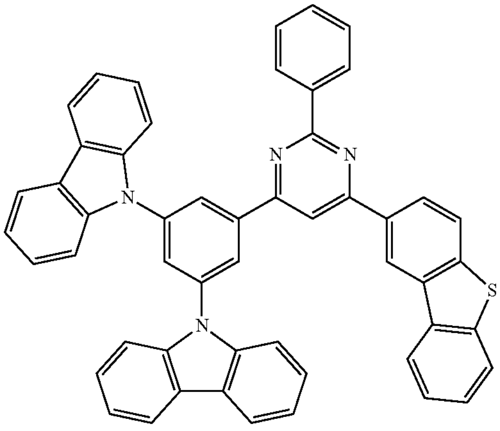

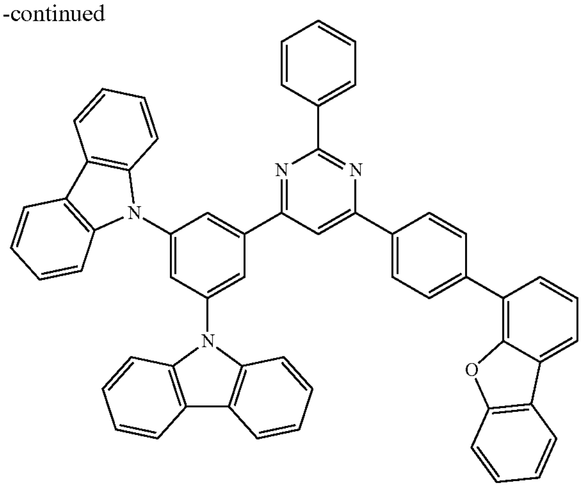

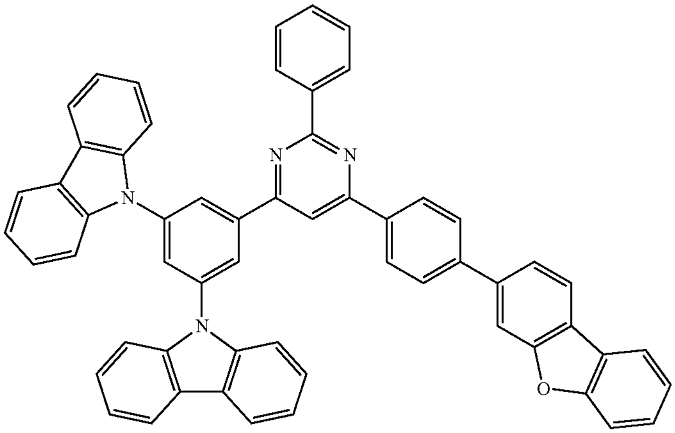

In the composition in an aspect of the invention, there are no particular limitations on the mode of combination of the compound represented by the formula (1) and the compound represented by the formula (2), and any combination may be employed as long as they are different compounds. Examples of the combination include, for example, the followings:

Combination of a compound represented by the formula (1-1) and a compound represented by the formula (2-1)

Combination of a compound represented by the formula (1-2) and a compound represented by the formula (2-2)

Combination of a compound represented by the formula (1-3) and a compound represented by the formula (2-3)

In the composition in an aspect of the invention, the blending ratio of the compound represented by the formula (1) and the compound represented by the formula (2) is not particularly limited.

In one embodiment, the content ratio of the compound represented by the formula (2) to the sum of the compound represented by the formula (1) and the compound represented by the formula (2) is typically 1% by mass or more and 60% by mass or less, preferably 1% by mass or more and 50% by mass or less, and more preferably 1% by mass or more and 40% by mass or less.

The composition in an aspect of the invention may contain a component other than the compound represented by the formula (1) and the compound represented by the formula (2). Examples of the other component include, but are not limited to, aryl compounds, azine compounds, azole compounds, oxide compounds, metal complexes, and the like, that have an electron-transporting or electron-injecting property.

The form of the composition in an aspect of the invention is not particularly limited, and examples thereof include a solid, powder, a solution, a film (layer), and the like. Examples of the film (layer) include, for example, an organic layer constituting an organic EL device (e.g., an electron-transporting layer). When the composition is a solid or powder, the composition may be molded into pellets.

[Organic EL Device]

An organic EL device containing a composition according to an aspect of the invention will be described.

The organic EL device according to an aspect of the invention has one or more organic thin film layers including at least an emitting layer, that are held between a cathode and an anode, wherein at least one layers of the organic thin film layer contains the composition according to an aspect of the invention.

The organic EL device according to an aspect of the invention preferably has an electron-transporting region between an emitting layer and a cathode, wherein the electron-transporting region includes one or more organic thin film layers, and at least one layer of the organic thin film layers contains the composition according to an aspect of the invention. Such at least one layer is preferably an electron-transporting layer.

The organic EL device according to an aspect of the invention can also be expressed as follows. That is, the organic EL device has a cathode, an anode, an emitting layer disposed between the cathode and the anode, and an electron-transporting region disposed between the emitting layer and the cathode, wherein the electron-transporting region contains the compound represented by the formula (1) and the compound represented by the formula (2), provided that the compound represented by the formula (1) and the compound represented by the formula (2) are different compounds. Specific embodiments of the compound represented by the formula (1) and the compound represented by the formula (2) are as described in the above-mentioned composition according to an aspect of the invention.

As a typical device configurations of the organic EL device, ones obtained by stacked the following structures (1) to (4) or the like on the substrate may be exemplified. (1) an anode/an emitting layer/a cathode, (2) an anode/a hole-transporting region/an emitting layer/a cathode (3) an anode/an emitting layer/an electron-transporting region/a cathode (4) an anode/a hole-transporting region/an emitting layer/an electron-transporting region/a cathode "/" indicates that respective layers are stacked directly adjacent to each other.

The electron-transporting region typically composed of one or more layers selected from an electron-injecting layer and an electron-transporting layer. The hole-transporting region typically composed of one or more layers selected from a hole-injecting layer and a hole-transporting layer.

A schematic configuration of an organic EL device according to an aspect of the invention will be described with reference to FIG. 1.

An organic EL device 1 according to an aspect of the invention has a substrate 2, an anode 3, an emitting layer 5, a cathode 10, a hole-transporting region 4 disposed between the anode 3 and the emitting layer 5, and an electron-transporting region 6 disposed between the emitting layer 5 and the cathode 10.

Parts which can be used in the organic EL device according to an aspect of the invention, materials for forming respective layers, other than the above-mentioned compounds, and the like, will be described later.

(Substrate)

A substrate is used as a support of an emitting device. As the substrate, glass, quartz, plastic or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on a substrate, metals, alloys, electrically conductive compounds, mixtures thereof, and the like, which have a large work function (specifically 4.0 eV or higher) are preferably used. Specific examples include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having high hole-injecting property. As such a substance having high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, and a polymer compound (oligomers, dendrimers, polymers, etc.) can be used.

(Hole-Transporting Layer)

The hole-transporting layer is a layer containing a substance having high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a substance other than the above-described substances may be used as long as the substance has higher hole-transporting property in comparison with electron-transporting property. It should be noted that the layer containing the substance having high hole-transporting property may be not only a single layer, but also a stacked layer of two or more layers formed of the above-described substances.

(Guest (Dopant) Material of Emitting Layer)

The emitting layer is a layer containing a substance having high emitting property, and various materials can be used for forming it. For example, as the substance having high emitting property, a fluorescent compound which emits fluorescence and a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be given. As a green fluorescent emitting material which can be used for an emitting layer, aromatic amine derivatives and the like can be given. As a red fluorescent emitting material which can be used for an emitting layer, tetracene derivatives, diamine derivatives and the like can be given.

As a blue phosphorescent emitting material which can be used for an emitting layer, metal complexes such as iridium complexes, osmium complexes, platinum complexes and the like can be given. As a green phosphorescent emitting material which can be used for an emitting layer, iridium complexes and the like can be given. As a red phosphorescent emitting material which can be used for an emitting layer, metal complexes such as iridium complexes, platinum complexes, terbium complexes, europium complexes and the like can be given.

(Host Material of Emitting Layer)

The emitting layer may have a constitution in which the above-mentioned substance having high emitting property (guest material) is dispersed in another substance (host material). As such another substance for dispersing the substance having high emitting property, a variety of substances can be used, and it is preferable to use a substance having a higher lowest unoccupied orbital level (LUMO level) and a lower highest occupied orbital level (HOMO level) than the substance having high emitting property.

As a material (host material) for dispersing a highly luminescent substance, 1) metal complexes such as an aluminum complex, a beryllium complex, and a zinc complex, 2) heterocyclic compounds such as an oxadiazole derivative, a benzimidazole derivative, and a phenanthroline derivative, 3) fused aromatic compounds such as a carbazole derivative, an anthracene derivative, a phenanthrene derivative, a pyrene derivative, and a chrysene derivative, and 4)

aromatic amine compounds such as a triarylamine derivative and a fused polycyclic aromatic amine derivative can be used.

(Electron-Transporting Layer)

The electron-transporting layer is a layer that contains a substance having high electron-transporting property. For the electron-transporting layer, 1) metal complexes such as aluminum complexes, beryllium complexes, zinc complexes, and the like; 2) heteroaromatic complexes such as imidazole derivatives, benzimidazole derivatives, azine derivatives, carbazole derivatives, phenanthroline derivatives, and the like; and 3) polymer compounds can be used.

In one embodiment of the invention, the electron-transporting layer may or may not include the other substances described above in addition to the compound represented by the formula (1) and the compound represented by the formula (2)

In the organic EL device according to one embodiment of the invention, the electron-transporting region includes a first layer (also referred to as a "first electron-transporting layer" or a "hole barrier layer") and a second layer (also referred to as a "second electron-transporting layer") in this order from the emitting layer side, and the first layer contains the compound represented by the formula (1) and the compound represented by the formula (2), and does not include another layer between the emitting layer and the first layer.

As the second layer, the above-described structure of the electron-transporting layer can be applied.

(Electron-Injecting Layer)

An electron-injecting layer is a layer containing a substance having high electron-injecting property. For the electron-injecting layer, lithium (Li), ytterbium (Yb), lithium fluoride (LiF), cesium fluoride (CsF), calcium fluoride ($CaF_2$), metal complex compounds such as 8-hydroxyquinolinolato-lithium (Liq), and alkali metals, alkaline earth metals and compounds thereof such as lithium oxide ($LiO_x$) can be used.

(Cathode)

For the cathode, metals, alloys, electrically conductive compounds, mixtures thereof, and the like having a small work function (specifically, 3.8 eV or lower) are preferably used. Specific examples of such cathode materials include elements belonging to Group 1 and Group 2 of the Periodic Table of the Elements, i.e., alkali metals such as lithium (Li) and cesium (Cs), alkaline earth metals such as magnesium (Mg), calcium (Ca) and strontium (Sr), and alloys containing the alkali metals or the alkaline earth metals (e.g., MgAg and AlLi), rare earth metals such as europium (Eu) and ytterbium (Yb), and alloys containing the rare metals, and the like.

The cathode is typically formed by a vacuum deposition or a sputtering method. Further, in the case of using a silver paste and the like, a coating method, an inkjet method, and the like can be employed.

In the case where the electron-injecting layer is provided, a cathode can be formed of a substance selected from various electrically conductive materials such as aluminum, silver, ITO, graphene, indium oxide-tin oxide containing silicon or silicon oxide, regardless of the work function value.

In the organic EL device according to an aspect of the invention, the thickness of each layer is not particularly limited, but is typically preferable that the thickness be in the range of several nm to 1 μm in order to suppress defects such as pinholes, to suppress applied voltage to be low, and to increase luminous efficiency.

[Method of Fabricating Organic EL Device]

In the organic EL device according to an aspect of the invention, the methods for forming respective layers are not particularly limited. A conventionally-known method for forming each layer such as a vacuum deposition process, a spin coating process and the like can be used. Each layer such as an emitting layer can be formed by a known method such as a vacuum deposition process, a molecular beam deposition process (MBE process), or an application process such as a dipping process, a spin coating process, a casting process, a bar coating process, or a roll coating process, using a solution prepared by dissolving a material in a solvent.

In one embodiment, as a method for forming an electron-transporting layer, a method may be used in which the compound represented by the formula (1) and the compound represented by the formula (2) are simultaneously deposited (co-deposited) from different deposition sources to form an electron-transporting layer, or a method may be used in which these compounds are mixed in advance and then deposited from a single deposition source to form an electron-transporting layer. One embodiment of the latter method includes a method of forming an electron-transporting layer by depositing from a single deposition source using a powder according to an aspect of the invention, which will be described later.

The latter method has an advantage that the fabrication apparatus and the fabricating process can be simplified.

[Powder]

As described above, the composition in an aspect of the invention may be in a powder form. The powder may contain the compound represented by the formula (1) and the compound represented by the formula (2) in one particle, or may be a mixture of particles composed of the compound represented by the formula (1) and particles composed of the compound represented by the formula (2).

The blending ratio of the compound represented by the formula (1) and the compound represented by the formula (2) is not particularly limited, and is as described above for the composition.

As a method of producing the powder, a conventionally known method can be used. For example, the compound represented by the formula (1) and the compound represented by the formula (2) may be mixed and pulverized using a mortar or the like, or the compound represented by the formula (1) and the compound represented by the formula (2) may be placed in a container or the like, heated in a chemically inert environment, and then cooled to an ambient temperature, and the obtained mixture may be pulverized by a mixer or the like to obtain a powder.

[Electronic Apparatus]

The electronic apparatus according to an aspect of the invention is characterized in that the organic EL device according to an aspect of the invention is equipped with.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Hereinafter, Examples according to the invention will be described. The invention is not limited in any way by these Examples.

<Compounds>

Compounds represented by the formula (1), which are used for fabricating the organic EL device of Examples and Comparative Examples, are shown below.

ETA1

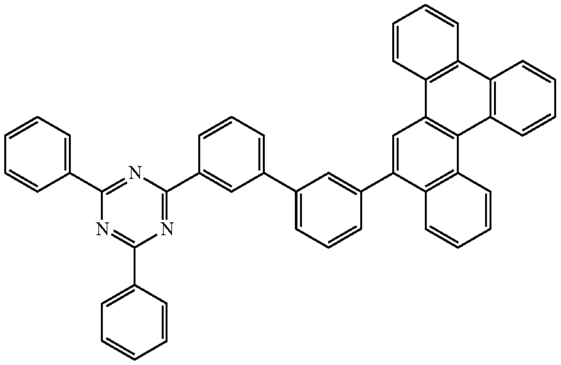

ETA2

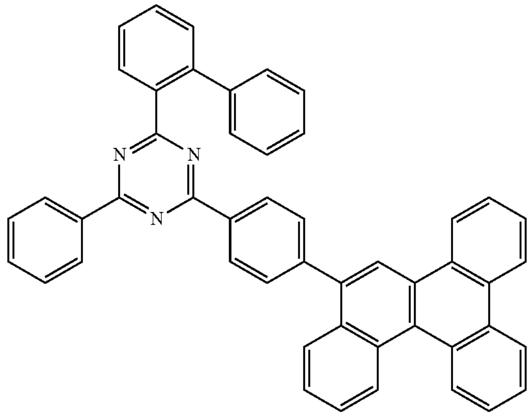

A compound represented by the formula (2), which are used for fabricating the organic EL device of Examples and Comparative Examples, are shown below.

ETB1

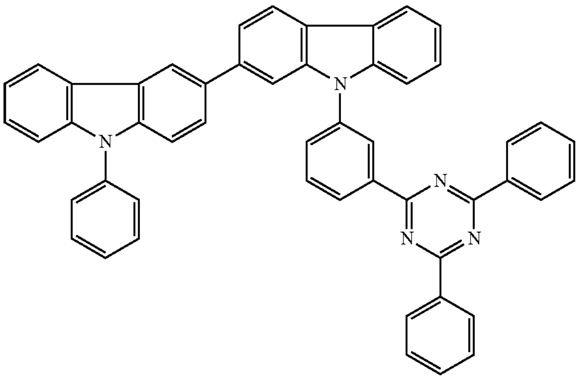

The structures of the other compounds, which are used for fabricating the organic EL device of Examples and Comparative Examples, are shown below.

HI

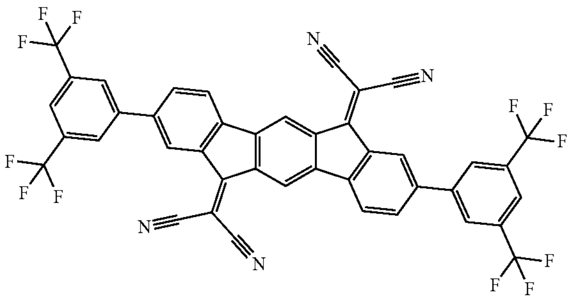

HT1

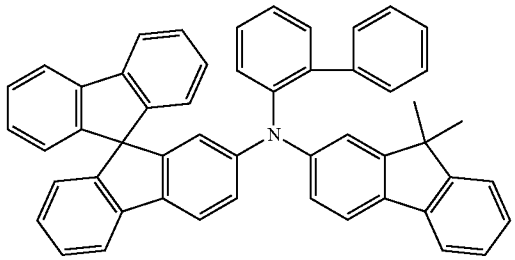

HT2

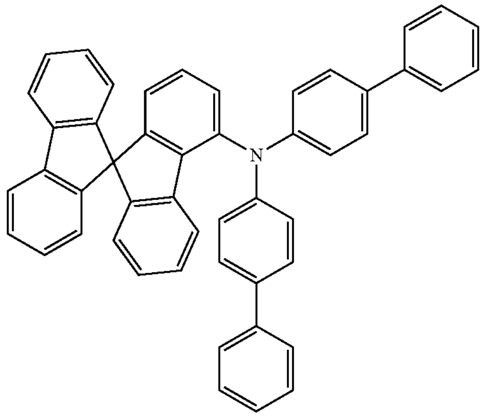

BH

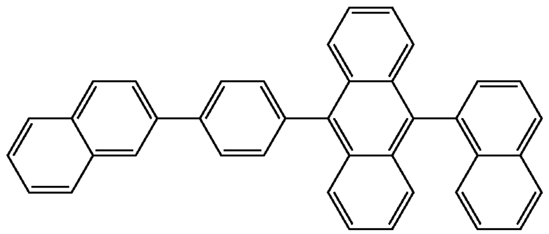

-continued

BD

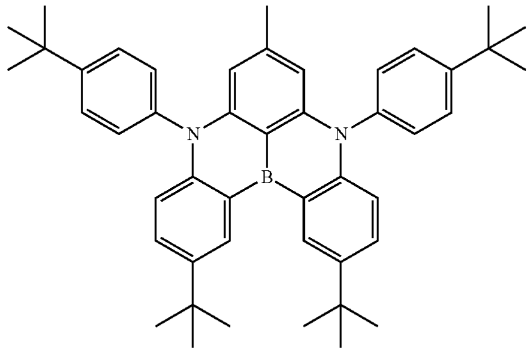

NET

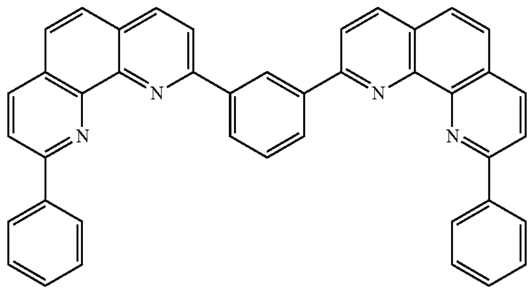

<Fabrication of Organic EL Device>

Organic EL device was fabricated as follows.

Example 1

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum deposition apparatus. First, a compound HI was deposited on a surface on the side on which the transparent electrode was formed so as to cover the transparent electrode to form a hole-injecting film having a thickness of 5 nm.

A compound HT1 was vapor-deposited on the hole-injecting layer to form a first hole-transporting layer having a thickness of 80 nm.

On the first hole-transporting layer, a compound HT2 was deposited to form a second hole-transporting layer having a thickness of 10 nm.

A compound BH (host material) and a compound BD (dopant material) were co-deposited on the second hole-transporting layer to be 4% by mass in a proportion of the compound BD to form an emitting layer having a thickness of 25 nm.

A compound ETA1 and a compound ETB1 were co-deposited on the emitting layer to be 5% by mass in a proportion of the compound ETB1 to form a first electron-transporting layer (hole barrier layer) having a thickness of 10 nm.

A compound NET and metal lithium (Li) were co-deposited on the first electron-transporting layer to be 4% by mass in a proportion of the metal Li to form a second electron-transporting layer having a thickness of 15 nm.

Metal aluminum (Al) was deposited on the second electron-transporting layer to form a cathode having a thickness of 50 nm.

The device configuration of the organic EL device of Example 1 is shown in a simplified style as follows.

ITO(130)/HI(5)/HT1(80)/HT2(10)BH:BD(25:4%)/ETA1:ETB1(10:5%)/NET:Li(15:4%)/Al(50)

Numerical values in parentheses indicate a film thickness (unit: nm). In addition, numerical values expressed in percentage in parentheses indicate the proportion of the latter compound in the layer (% by mass).

Examples 2 to 8

Organic EL devices were fabricated in the same manner as in Example 1 except that the first electron-transporting layer was formed with a configuration described in Table 1. Numerical values expressed in percentage in parentheses indicate the proportion of the latter compound in the layer (% by mass).

Comparative Example 1

An organic EL device was fabricated in the same manner as in Example 1, except that the first electron-transporting layer was formed by using the compound ETB1 alone.

<Evaluation of Organic EL Device>

The organic EL devices thus fabricated were evaluated as follows. Evaluation results are shown in Table 1.

Driving Voltage

Initial characteristics of the organic EL devices were measured by DC-constant current of 10 mA/cm$^2$ at room temperature.

External Quantum Efficiency

Voltage was applied to the organic EL device to be 10 mA/cm$^2$ in current density, and an EL emission spectrum was measured by using Spectroradiometer CS-2000 (manufactured by Konica Minolta, Inc.). External quantum efficiency, EQE, (%) was calculated from the obtained spectral radiance spectrum. Numerical values in the table are relative values when the external quantum efficiency of Comparative Example 1 is 100%.

TABLE 1

| | First electron-transporting layer | Voltage (V) | Efficiency (%) |
|---|---|---|---|
| Example 1 | ETA1:ETB1 (5% by mass) | −0.09 | 115.5 |
| Example 2 | ETA1:ETB1 (10% by mass) | −0.05 | 124.2 |
| Example 3 | ETA1:ETB1 (20% by mass) | 0.06 | 125.7 |
| Example 4 | ETA1:ETB1 (30% by mass) | 0.09 | 124.8 |
| Example 5 | ETA2:ETB1 (5% by mass) | −0.12 | 115.9 |
| Example 6 | ETA2:ETB1 (10% by mass) | −0.15 | 121.6 |
| Example 7 | ETA2:ETB1 (20% by mass) | 0.06 | 124.7 |
| Example 8 | ETA2:ETB1 (30% by mass) | −0.04 | 124.1 |
| Comp. Ex. 1 | ETB1 | 0.47 | 100 |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A composition comprising a compound represented by the following formula (1) and a compound represented by the following formula (2), provided that the compound represented by the formula (1) and the compound represented by the formula (2) are different compounds:

(1)

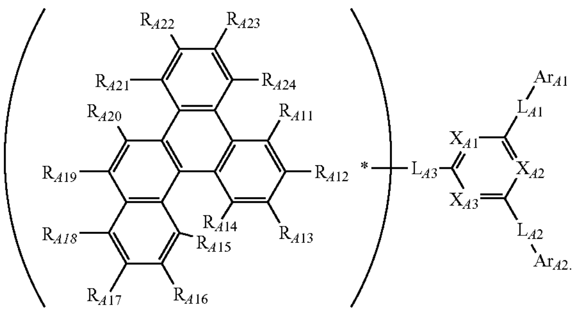

wherein in the formula (1), $X_{A1}$ to $X_{A3}$ are independently N or $CR_{A1}$, provided that at least two of $X_{A1}$ to $X_{A3}$ are N's;

$R_{A1}$ is a hydrogen atom or a substituent R;

$Ar_{A1}$ and $Ar_{A2}$ are independently a substituted or unsubstituted aryl group including 6 to 50 ring carbon atoms, or a substituted or unsubstituted monovalent heterocyclic group including 5 to 50 ring atoms;

$L_{A1}$ and $L_{A2}$ are independently a single bond, a substituted or unsubstituted arylene group including 6 to 50 ring carbon atoms, or a substituted or unsubstituted divalent heterocyclic group including 5 to 50 ring atoms;

$L_{A3}$ is a substituted or unsubstituted arylene group including 6 to 50 ring carbon atoms, one of $R_{A11}$ to $R_{A24}$ is a single bond bonded with $L_{A3}$;

$R_{A11}$ to $R_{A24}$ which are not the single bond bonded with $L_{A3}$ are independently a hydrogen atom or a substituent R;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, wherein $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms and when two or more of each of $R_{901}$ to $R_{907}$ are present, the two or more of each of $R_{901}$ to $R_{907}$ may be the same as or different from each other, a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more of the substituent R's are present, the two or more of the substituent R's may be the same as or different from each other; and (2)

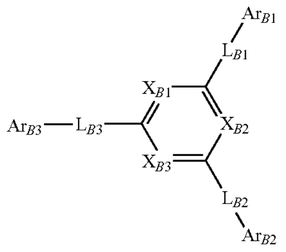

wherein in the formula (2), $X_{B1}$ to $X_{B3}$ are independently N or $CR_{B1}$; provided that at least one of $X_{B1}$ to $X_{B3}$ is N;

$R_{B1}$ is a hydrogen atom or a substituent R;

$Ar_{B1}$, $Ar_{B2}$, and $Ar_{B3}$ are independently a substituted or unsubstituted aryl group including 6 to 50 ring carbon atoms, or a substituted or unsubstituted monovalent heterocyclic group including 5 to 50 ring atoms;

$L_{B1}$, $L_{B2}$, and $L_{B3}$ are independently a single bond, a substituted or unsubstituted arylene group including 6 to 50 ring carbon atoms, or a substituted or unsubstituted divalent heterocyclic group including 5 to 50 ring atoms;

the substituent R is as defined in the formula (1); and when two or more $R_{B1}$'s are present, the two or more $R_{B1}$'s may be the same as or different from each other.

2. The composition according to claim 1, wherein in the formula (1), $Ar_{A1}$ and $Ar_{A2}$ are independently a substituted or unsubstituted aryl group including 6 to 50 ring carbon atoms.

3. The composition according to claim 1, wherein in the formula (1), $L_{A1}$ and $L_{A2}$ are single bonds.

4. The composition according to claim 1, wherein in the formula (1), all of $X_{A1}$ to $X_{A3}$ are N's.

5. The composition according to claim 1, wherein the compound represented by the formula (1) is a compound represented by the following formula (1-1):

(1-1)

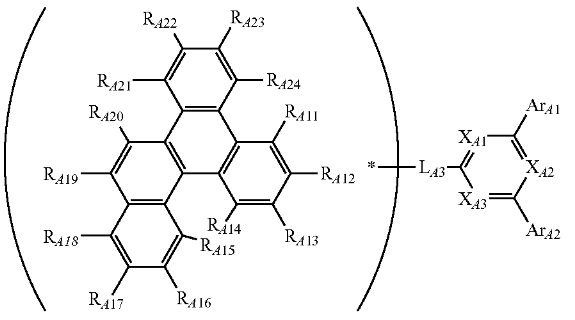

wherein in the formula (1-1), $X_{A1}$ to $X_{A3}$, $Ar_{A1}$, $Ar_{A2}$, $L_{A3}$, and $R_{A11}$ to $R_{A24}$ are as defined in the formula (1).

6. The composition according to claim 1, wherein the compound represented by the formula (1) is a compound represented by the following formula (1-2):

(1-2)

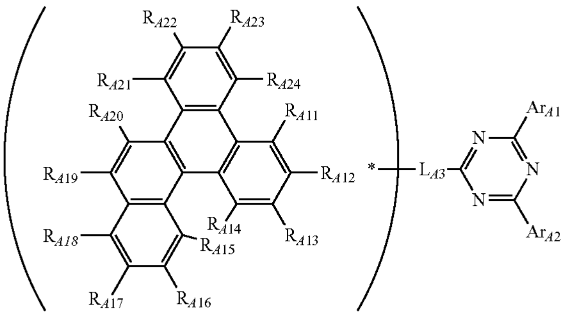

wherein in the formula (1-2), $Ar_{A1}$, $Ar_{A2}$, $L_{A3}$, and $R_{A11}$ to $R_{A24}$ are as defined in the formula (1).

7. The composition according to claim 1, wherein the compound represented by the formula (1) is a compound represented by the following formula (1-3):

(1-3)

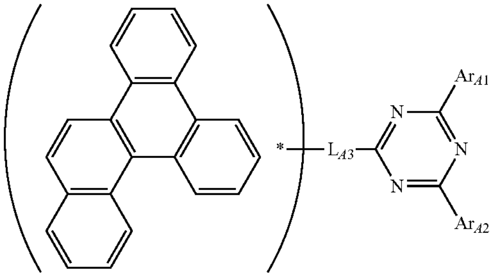

wherein in the formula (1-3), $Ar_{A1}$, $Ar_{A2}$, and $L_{A3}$ are as defined in the formula (1); and $L_{A3}$ is bonded with one of the carbon atoms constituting the benzotriphenylene structure by a single bond.

8. The composition according to claim 1, wherein in the formula (2), $Ar_{B3}$ is a substituted or unsubstituted monovalent heterocyclic group including 5 to 50 ring atoms.

9. The composition according to claim 1, wherein in the formula (2), $Ar_{B3}$ is a substituted monovalent heterocyclic group including 5 to 50 ring atoms.

10. The composition according to claim 1, wherein in the formula (2), $Ar_{B3}$ is a monovalent heterocyclic group comprising two carbazole structures.

11. The composition according to claim 1, wherein in the formula (2), $Ar_{B3}$ is a group represented by the following formula:

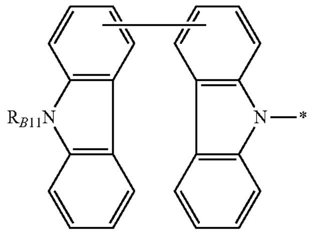

wherein in the formula, * is a bonding position with $L_{B3}$; $R_{B11}$ is a hydrogen atom or a substituent R; and the substituent R is as defined in the formula (1).

12. The composition according to claim 1, wherein in the formula (2), $L_{B3}$ is a single bond or a substituted or unsubstituted arylene group including 6 to 50 ring carbon atoms.

13. The composition according to claim 1, wherein in the formula (2), $L_{B3}$ is a substituted or unsubstituted arylene group including 6 to 50 ring carbon atoms.

14. The composition according to claim 1, wherein in the formula (2), $Ar_{B1}$ and $Ar_{B2}$ are independently a substituted or unsubstituted aryl group including 6 to 50 ring carbon atoms.

15. The composition according to claim 1, wherein in the formula (2), $L_{B1}$ and $L_{B2}$ are single bonds.

16. The composition according to claim 1 wherein in the formula (2), at least two of $X_{B1}$ to $X_{B3}$ are N's.

17. The composition according to claim 1, wherein in the formula (2), all of $X_{B1}$ to $X_{B3}$ are N's.

18. The composition according to claim 1, wherein the compound represented by the formula (2) is a compound represented by the following formula (2-1):

(2-1)

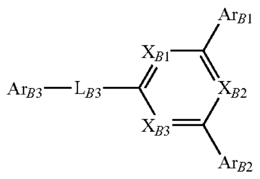

wherein in the formula (2-1), $X_{B1}$ to $X_{B3}$, $Ar_{B1}$ to $Ar_{B3}$, and $L_{B3}$ are as defined in the formula (2).

19. The composition according to claim 1, wherein the compound represented by the formula (2) is a compound represented by the following formula (2-2):

(2-2)

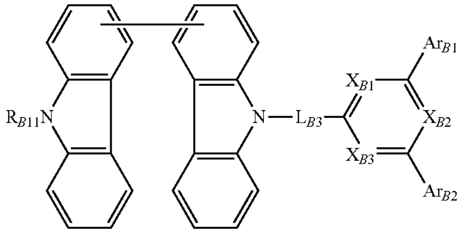

wherein in the formula (2-2), $X_{B1}$ to $X_{B3}$, $Ar_{B1}$, $Ar_{B2}$, and $L_{B3}$ are as defined in the formula (2); $R_{B11}$ is a hydrogen atom or a substituent R; and the substituent R is as defined in the formula (1).

20. The composition according to claim 1, wherein the compound represented by the formula (2) is a compound represented by the following formula (2-3):

(2-3)

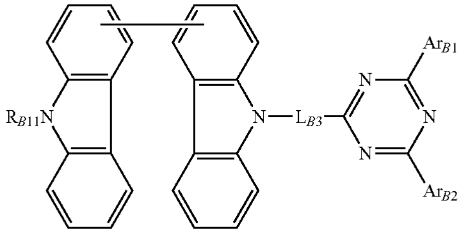

wherein in the formula (2-3), $Ar_{B1}$, $Ar_{B2}$, and $L_{B3}$ are as defined in the formula (2); $R_{B11}$ is a hydrogen atom or a substituent R; and the substituent R is as defined in the formula (1).

21. An organic electroluminescence device, comprising the composition according to claim 1.

22. A powder, composed of the composition according to claim 1.

23. A method of fabricating an organic electroluminescence device, comprising a step of forming an organic layer by depositing the powder according to claim 22 from a single deposition source.

24. An organic electroluminescence device, comprising a cathode;

an anode;

an emitting layer disposed between the cathode and the anode; and an electron-transporting region disposed between the emitting layer and the cathode;

wherein the electron-transporting region comprises a compound represented by the following formula (1) and a compound represented by the following formula (2), provided that the compound represented by the formula (1) and the compound represented by the formula (2) are different compounds:

(1)

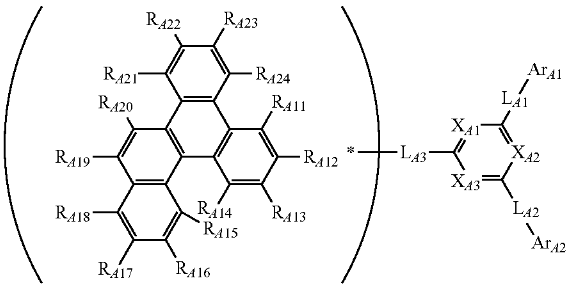

wherein in the formula (1), $X_{A1}$ to $X_{A3}$ are independently N or $CR_{A1}$, provide that at least two of $X_{A1}$ to $X_{A3}$ are N's; $R_{A1}$ is a hydrogen atom or a substituent R;

$Ar_{A1}$ and $Ar_{A2}$ are independently a substituted or unsubstituted aryl group including 6 to 50 ring carbon atoms, or a substituted or unsubstituted monovalent heterocyclic group including 5 to 50 ring atoms;

$L_{A1}$, $L_{A2}$, and $L_{A3}$ are independently a single bond, a substituted or unsubstituted arylene group including 6 to 50 ring carbon atoms, or a substituted or unsubstituted divalent heterocyclic group including 5 to 50 ring atoms;

one of $R_{A11}$ to $R_{A24}$ is a single bond bonded with $L_{A3}$;

$R_{A11}$ to $R_{A24}$ which are not the single bond bonded with $L_{A3}$ are independently a hydrogen atom or a substituent R;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, wherein $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other, a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more of the substituent R's are present, the two or more of the substituent R's may be the same as or different from each other; and (2)

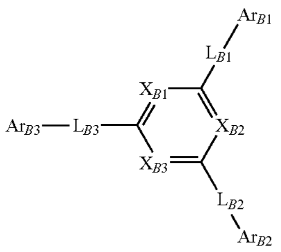

wherein in the formula (2), $X_{B1}$ to $X_{B3}$ are independently N or $CR_{B1}$; provided that at least one of $X_{B1}$ to $X_{B3}$ is N; $R_{B1}$ is a hydrogen atom or a substituent R;

$Ar_{B1}$, $Ar_{B2}$, and $Ar_{B3}$ are independently a substituted or unsubstituted aryl group including 6 to 50 ring carbon atoms, or a substituted or unsubstituted monovalent heterocyclic group including 5 to 50 ring atoms;

$L_{B1}$, $L_{B2}$, and $L_{B3}$ are independently a single bond, a substituted or unsubstituted arylene group including 6 to 50 ring carbon atoms, or a substituted or unsubstituted divalent heterocyclic group including 5 to 50 ring atoms;

the substituent R is as defined in the formula (1); and when two or more $R_{B1}$'s are present, the two or more $R_{B1}$'s may be the same as or different from each other.

25. The organic electroluminescence device according to claim 24, wherein in the formula (1), $Ar_{A1}$ and $Ar_{A2}$ are independently a substituted or unsubstituted aryl group including 6 to 50 ring carbon atoms.

26. The organic electroluminescence device according to claim 24, wherein in the formula (1), $L_{A1}$ and $L_{A2}$ are single bonds.

27. The organic electroluminescence device according to claim 24, wherein in the formula (1), $L_{A3}$ is a single bond or a substituted or unsubstituted arylene group including 6 to 50 ring carbon atoms.

28. The organic electroluminescence device according to claim 24, wherein in the formula (1), $L_{A3}$ is a substituted or unsubstituted arylene group including 6 to 50 ring carbon atoms.

29. The organic electroluminescence device according to claim 24, wherein in the formula (1), all of $X_{A1}$ to $X_{A3}$ are N's.

30. The organic electroluminescence device according to claim 24, wherein the compound represented by the formula (1) is a compound represented by the following formula (1-1):

(1-1)

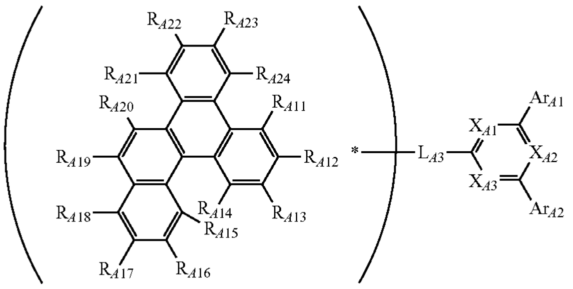

wherein in the formula (1-1), $X_{A1}$ to $X_{A3}$, $Ar_{A1}$, $Ar_{A2}$, $L_{A3}$, and $R_{A11}$ to $R_{A24}$ are as defined in the formula (1).

31. The organic electroluminescence device according to claim 24, wherein the compound represented by the formula (1) is a compound represented by the following formula (1-2):

(1-2)

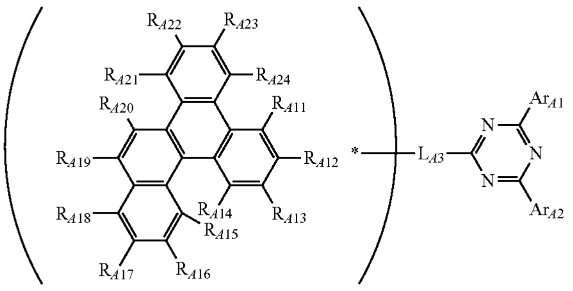

wherein in the formula (1-2), $Ar_{A1}$, $Ar_{A2}$, $L_{A3}$, and $R_{A11}$ to $R_{A24}$ are as defined in the formula (1).

32. The organic electroluminescence device according to claim 24, wherein the compound represented by the formula (1) is a compound represented by the following formula (1-3):

(1-3)

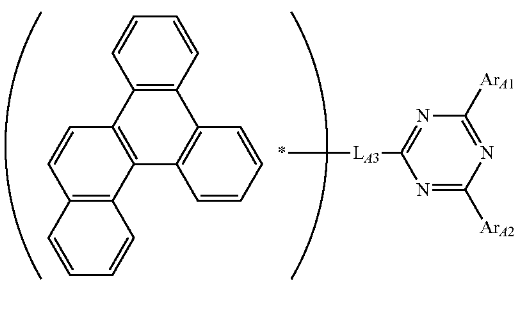

wherein in the formula (1-3), $Ar_{A1}$, $Ar_{A2}$, and $L_{A3}$ are as defined in the formula (1); and $L_{A3}$ is bonded with one of the carbon atoms on the benzotriphenylene structure.

33. The organic electroluminescence device according to claim 24, wherein in the formula (2), $Ar_{B3}$ is a substituted or unsubstituted monovalent heterocyclic group including 5 to 50 ring atoms.

34. The organic electroluminescence device according to claim 24, wherein in the formula (2), $Ar_{B3}$ is a substituted monovalent heterocyclic group including 5 to 50 ring atoms.

35. The organic electroluminescence device according to claim 24, wherein in the formula (2), $Ar_{B3}$ is a monovalent heterocyclic group comprising two carbazole structures.

36. The organic electroluminescence device according to claim 24, wherein in the formula (2), $Ar_{B3}$ is a group represented by the following formula:

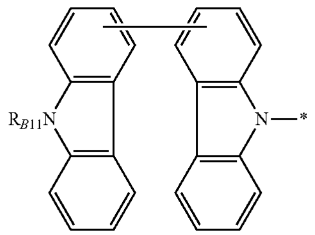

wherein in the formula, * is a bonding position with $L_{B3}$; $R_{B11}$ is a hydrogen atom or a substituent R; and the substituent R is as defined in the formula (1).

37. The organic electroluminescence device according to claim 24, wherein in the formula (2), $L_{B3}$ is a single bond or a substituted or unsubstituted arylene group including 6 to 50 ring carbon atoms.

38. The organic electroluminescence device according to claim 24, wherein in the formula (2), $L_{B3}$ is a substituted or unsubstituted arylene group including 6 to 50 ring carbon atoms.

39. The organic electroluminescence device according to claim 24, wherein in the formula (2), $Ar_{B1}$ and $Ar_{B2}$ are independently a substituted or unsubstituted aryl group including 6 to 50 ring carbon atoms.

40. The organic electroluminescence device according to claim 24, wherein in the formula (2), $L_{B1}$ and $L_{B2}$ are single bonds.

41. The organic electroluminescence device according to claim 24, wherein in the formula (2), at least two of $X_{B1}$ to $X_{B3}$ are N's.

42. The organic electroluminescence device according to claim 24, wherein in the formula (2), all of $X_{B1}$ to $X_{B3}$ are N's.

43. The organic electroluminescence device according to claim 24, wherein the compound represented by the formula (2) is a compound represented by the following formula (2-1):

(2-1)

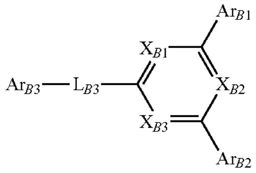

wherein in the formula (2-1), $X_{B1}$ to $X_{B3}$, $Ar_{B1}$ to $Ar_{B3}$, and $L_{B3}$ are as defined in the formula (2).

44. The organic electroluminescence device according to claim 24, wherein the compound represented by the formula (2) is a compound represented by the following formula (2-2):

(2-2)

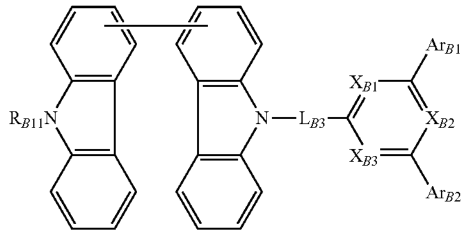

wherein in the formula (2-2), $X_{B1}$ to $X_{B3}$, $Ar_{B1}$, $Ar_{B2}$, and $L_{B3}$ are as defined in the formula (2); $R_{B11}$ is a hydrogen atom or a substituent R; and the substituent R is as defined in the formula (1).

45. The organic electroluminescence device according to claim 24, wherein the compound represented by the formula (2) is a compound represented by the following formula (2-3):

(2-3)

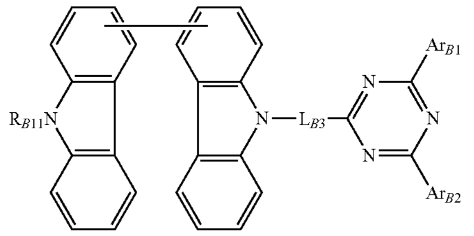

wherein in the formula (2-3), $Ar_{B1}$, $Ar_{B2}$, and $L_{B3}$ are as defined in the formula (2); $R_{B11}$ is a hydrogen atom or a substituent R; and the substituent R is as defined in the formula (1).

46. The organic electroluminescence device according to claim 24, wherein the electron-transporting region comprises a first layer and a second layer in this order from the emitting layer side, the first layer comprises the compound represented by the formula (1) and the compound represented by the formula (2), and no other layer is disposed between the emitting layer and the first layer.

47. An electronic apparatus, equipped with the organic electroluminescence device according to claim 24.

48. A powder comprising a compound represented by the following formula (1) and a compound represented by the following formula (2), provided that the compound represented by the formula (1) and the compound represented by the formula (2) are different compounds:

(1)

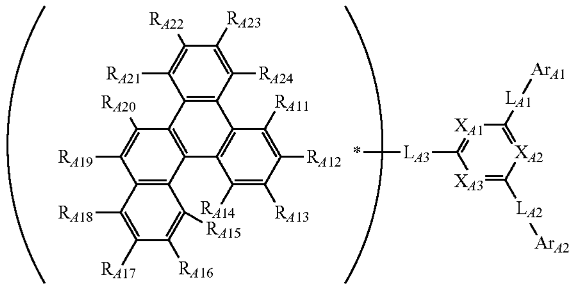

wherein in the formula (1), $X_{A1}$ to $X_{A3}$ are independently N or $CR_{A1}$, provided that at least two of $X_{A1}$ to $X_{A3}$ are N's;

$R_{A1}$ is a hydrogen atom or a substituent R;

$Ar_{A1}$ and $Ar_{A2}$ are independently a substituted or unsubstituted aryl group including 6 to 50 ring carbon atoms, or a substituted or unsubstituted monovalent heterocyclic group including 5 to 50 ring atoms;

$L_{A1}$, $L_{A2}$, and $L_{A3}$ are independently a single bond, a substituted or unsubstituted arylene group including 6 to 50 ring carbon atoms, or a substituted or unsubstituted divalent heterocyclic group including 5 to 50 ring atoms;

one of $R_{A11}$ to $R_{A24}$ is a single bond bonded with $L_{A3}$;

$R_{A11}$ to $R_{A24}$ which are not the single bond bonded with $L_{A3}$ are independently a hydrogen atom or a substituent R;

the substituent R is selected from the group consisting of a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, wherein $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other, a halogen atom, a cyano group, a nitro group, a substituted or unsubstituted aryl group including 6 to 50 ring carbon atoms, and a substituted or unsubstituted monovalent heterocyclic group including 5 to 50 ring atoms; and when two or more of the substituent R's are present, the two or more the substituent R's may be the same as or different from each other; and (2)

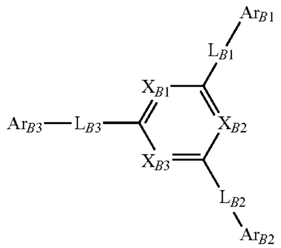

wherein in the formula (2), $X_{B1}$ to $X_{B3}$ are independently N or $CR_{B1}$; provided that at least one of $X_{B1}$ to $X_{B3}$ is N;

$R_{B1}$ is a hydrogen atom or a substituent R;

$Ar_{B1}$, $Ar_{B2}$, and $Ar_{B3}$ are independently a substituted or unsubstituted aryl group including 6 to 50 ring carbon atoms, or a substituted or unsubstituted monovalent heterocyclic group including 5 to 50 ring atoms;

$L_{B1}$, $L_{B2}$, and $L_{B3}$ are independently a single bond, a substituted or unsubstituted arylene group including 6 to 50 ring carbon atoms, or a substituted or unsubstituted divalent heterocyclic group including 5 to 50 ring atoms;

the substituent R is as defined in the formula (1); and when two or more $R_{B1}$'s are present, the two or more $R_{B1}$'s may be the same as or different from each other.

49. A method of fabricating an organic electroluminescence device, comprising a step of forming an organic layer by depositing a powder according to claim 48 from a single deposition source.

50. The powder according to claim 48, wherein in the formula (1), $Ar_{A1}$ and $Ar_{A2}$ are independently a substituted or unsubstituted aryl group including 6 to 50 ring carbon atoms.

51. The powder according to claim 48, wherein in the formula (1), $L_{A1}$ and $L_{A2}$ are single bonds.

52. The powder according to claim 48, wherein in the formula (1), $L_{A3}$ is a single bond or a substituted or unsubstituted arylene group including 6 to 50 ring carbon atoms.

53. The powder according to claim 48, wherein in the formula (1), $L_{A3}$ is a substituted or unsubstituted arylene group including 6 to 50 ring carbon atoms.

54. The powder according to claim 48, wherein in the formula (1), all of $X_{A1}$ to $X_{A3}$ are N's.

55. The powder according to claim 48, wherein the compound represented by the formula (1) is a compound represented by the following formula (1-1):

(1-1)

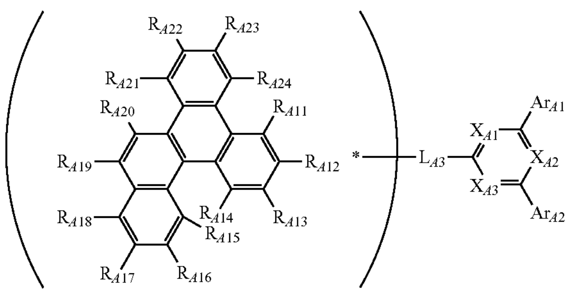

wherein in the formula (1-1), $X_{A1}$ to $X_{A3}$, $Ar_{A1}$, $Ar_{A2}$, $L_{A3}$, and $R_{A11}$ to $R_{A24}$ are as defined in the formula (1).

56. The powder according to claim 48, wherein the compound represented by the formula (1) is a compound represented by the following formula (1-2):

(1-2)

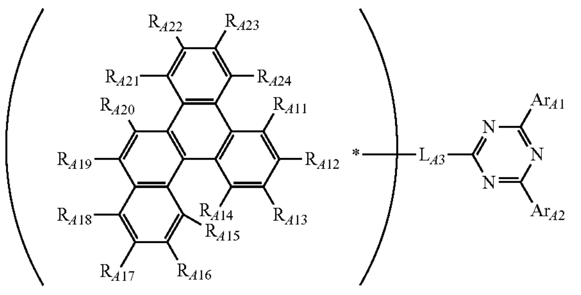

wherein in the formula (1-2), $Ar_{A1}$, $Ar_{A2}$, $L_{A3}$, and $R_{A11}$ to $R_{A24}$ are as defined in the formula (1).

57. The powder according to claim 48, wherein the compound represented by the formula (1) is a compound represented by the following formula (1-3):

(1-3)

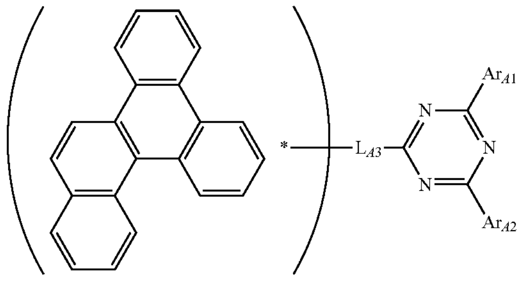

wherein in the formula (1-3), $Ar_{A1}$, $Ar_{A2}$, and $L_{A3}$ are as defined in the formula (1); and $L_{A3}$ is bonded with one of the carbon atoms constituting the benzotriphenylene structure by a single bond.

* * * * *